(12) United States Patent
Tanaka et al.

(10) Patent No.: US 7,602,456 B2
(45) Date of Patent: Oct. 13, 2009

(54) METHOD OF MANUFACTURING LCD APPARATUS BY USING HALFTONE EXPOSURE METHOD

(75) Inventors: Sakae Tanaka, Mito (JP); Toshiyuki Samejima, Kodaira (JP)

(73) Assignee: Mikuni Electoron Co. Ltd (JP)

( * ) Notice: Subject to any disclaimer, the term of this patent is extended or adjusted under 35 U.S.C. 154(b) by 296 days.

(21) Appl. No.: 11/749,190

(22) Filed: May 16, 2007

(65) Prior Publication Data

US 2007/0269936 A1 Nov. 22, 2007

(30) Foreign Application Priority Data

May 19, 2006 (JP) ............. 2006-166674

(51) Int. Cl.
*G02F 1/136* (2006.01)
(52) U.S. Cl. .................. 349/43; 349/42
(58) Field of Classification Search ........ 349/42–43
See application file for complete search history.

(56) References Cited

U.S. PATENT DOCUMENTS 7,315,344 B2 * 1/2008 Lim ............... 349/187

FOREIGN PATENT DOCUMENTS

| JP | 61-181130 | 8/1986 |
|---|---|---|
| JP | 07-230097 | 8/1995 |
| JP | 10-163174 | 6/1998 |
| JP | 11-109393 | 4/1999 |
| JP | 2000-066240 | 3/2000 |
| JP | 2000-206571 | 7/2000 |
| JP | 2001-042347 | 2/2001 |
| JP | 2001-174848 | 6/2001 |
| JP | 2001-201756 | 7/2001 |
| JP | 2001-221992 | 8/2001 |
| JP | 2001-228493 | 8/2001 |
| JP | 2001-235763 | 8/2001 |
| JP | 2001-311965 | 11/2001 |
| JP | 2002-107762 | 4/2002 |
| JP | 2002-141512 | 5/2002 |
| JP | 2003-057673 | 2/2003 |
| JP | 2004-038130 | 2/2004 |
| JP | 2004-281687 | 10/2004 |
| JP | 2004-319655 | 11/2004 |

* cited by examiner

*Primary Examiner*—David Nelms
*Assistant Examiner*—Phu Vu
(74) *Attorney, Agent, or Firm*—Schmeiser, Olsen & Watts

(57) ABSTRACT

The present invention discloses a method of manufacturing a super large wide-angle super high-speed response LCD apparatus by using a photolithographic process for three times. The invention adopts a halftone exposure technology and a nitrogen ion doped technology to form a gate electrode, a common electrode, a pixel electrode and a contact pad, and then uses the halftone exposure technology to form a silicon (Si) island and a contact hole, and a general exposure technology to form a source electrode, a drain electrode and an alignment control electrode. A P-CVD apparatus is provided for forming a passivation layer into a film by using a masking deposition method, or an ink-jet coating method is used to coat a protective layer at a partial area, and a photolithographic process is performed for three times to manufacture a TFT matrix substrate of the super large wide-angle super high-speed response LCD.

111 Claims, 176 Drawing Sheets

Fig. 4
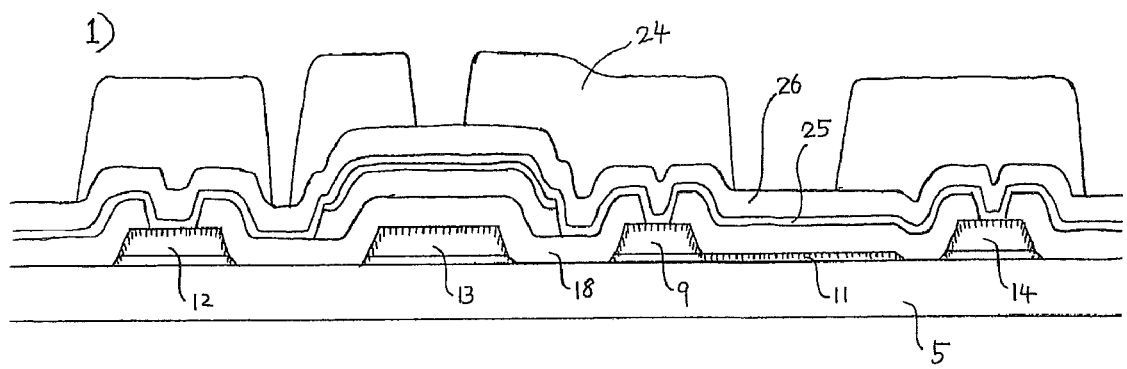
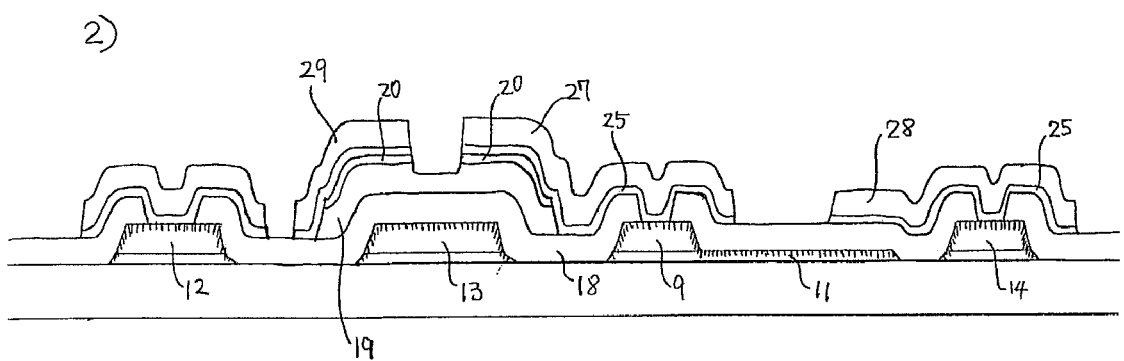
Fig. 5
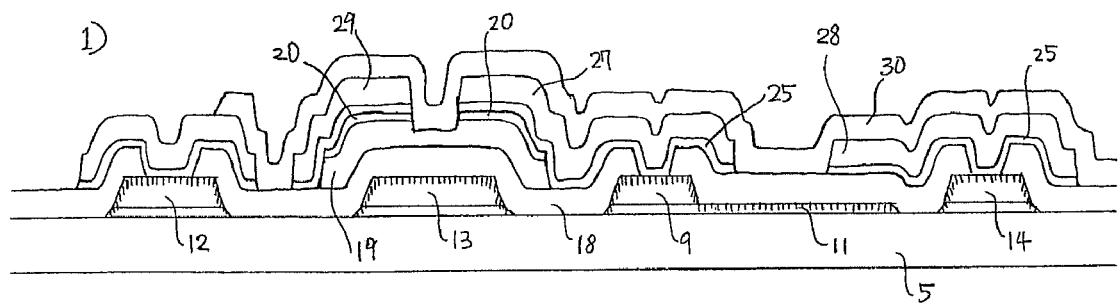
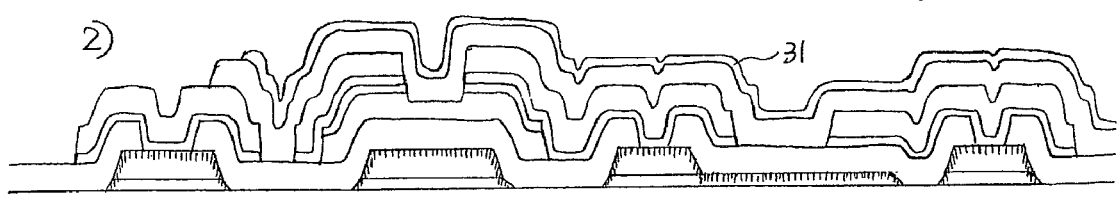

MVA Mode Gate Terminal Portion

MVA Mode Source Terminal Portion

IPS Mode Gate Terminal Portion

MVA Mode Source Terminal Portion

Fig. 37

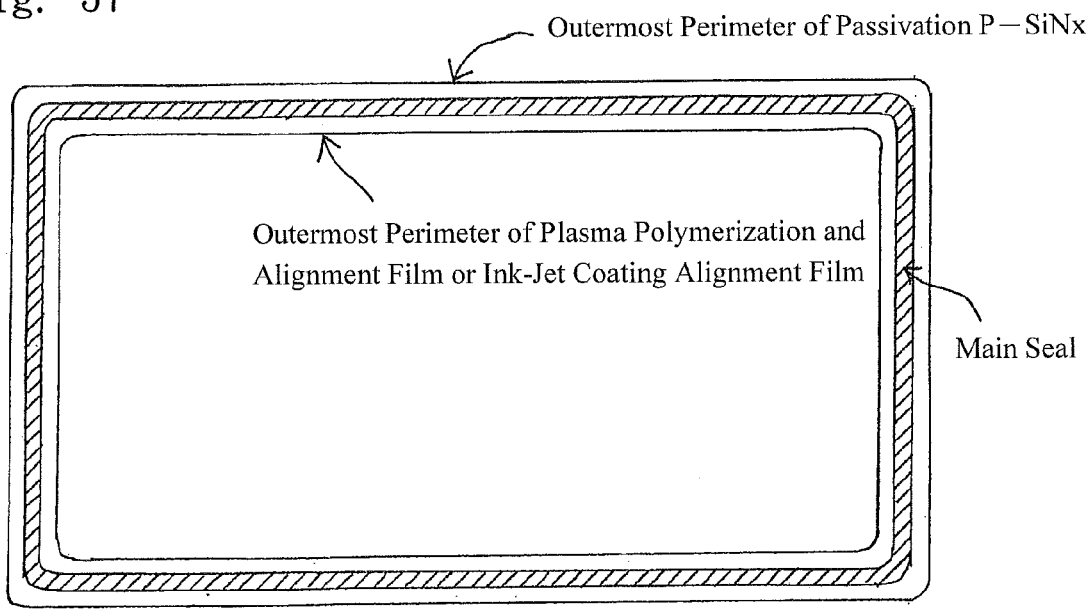

Outermost Perimeter of Passivation P—SiNx

Outermost Perimeter of Plasma Polymerization and Alignment Film or Ink-Jet Coating Alignment Film Main Seal

Fig. 38

Type A Manufacturing Process (TN, MVA or IPS Mode) Three Times of Mask Manufacturing Process

[1] Gate Electrode & Pixel Electrode & Common Electrode

& Contact Pad in Pixel Electrode ··· <u>Halftone Exposure Method</u> (Using a halftone mask)

[2] a—Si Island & Contact Hole ······ <u>Halftone Exposure Method</u> (Using a halftone mask)

[3] Source Electrode & Drain Electrode & Electrode formed by Cst (Holdup Capacitor)

·············· <u>General Exposure Method</u> (Using a general mask)

n⁺ a—Si of Dry Etching Channel Portion $\begin{cases} \text{P—SiNx Passivation Film} \cdots\cdots \underline{\text{Mask Deposition Method}} \\ \text{or} \\ \text{BCB, Silazane, } T_8\text{—Diene } T_8\text{—Diene Passivation Film} \end{cases}$ ········· <u>Ink-Jet Coating Method</u>

Fig. 39

Type B Manufacturing Process (MVA Mode) Three Times of 3 Mask Manufacturing Process

[1] Gate Electrode & Pixel Electrode & Common Electrode
& Contact Pad in Pixel Electrode ··· Halftone Exposure Method (Using a halftone mask)

[2] a—Si Island & Contact Hole ······ Halftone Exposure Method (Using a halftone mask)

[3] Source Electrode & Drain Electrode & Alignment Control Electrode

····················  General Exposure Method (Using a general mask)

$n^+$ a — Si of Dry Etching Channel Portion $\left\{\begin{array}{l} \text{P—SiNx Passivation Film········ Mask Deposition Method} \\ \text{or} \\ \text{BCB, Silazane, } T_8\text{—Diene } T_8\text{—Diene Passivation Film} \end{array}\right.$ ··········  Ink-Jet Coating Method

Fig. 40

Type C Manufacturing Process (FFS Mode) Three Times of 3 Mask Manufacturing Process

[1] Gate Electrode & Pixel Electrode & Common Electrode
& Contact Pad in Pixel Electrode ··· Halftone Exposure Method (Using a halftone mask)

[2] a—Si Island & Contact Hole ······ Halftone Exposure Method (Using a halftone mask)

[3] Source Electrode & Drain Electrode & Comb Common Electrode

····················  General Exposure Method (Using a general mask)

$n^+$ a — Si of Dry Etching Channel Portion $\left\{\begin{array}{l} \text{P—SiNx Passivation Film········ Mask Deposition Method} \\ \text{or} \\ \text{BCB, Silazane, } T_8\text{—Diene } T_8\text{—Diene Passivation Film} \end{array}\right.$ 1) Deposit titanium or zirconium thin film by a sputtering device (Backside Coating)

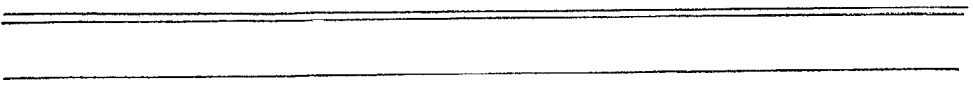

2) Use an ion shower doping device to inject nitrogen ions (Transparency Treatment)

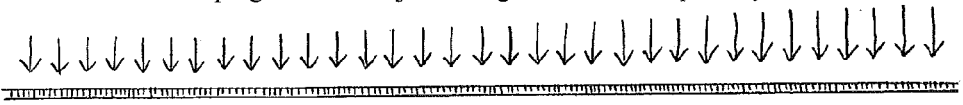

3) Use a DMD non-masking direct exposure method to form a light shielding film (BM).

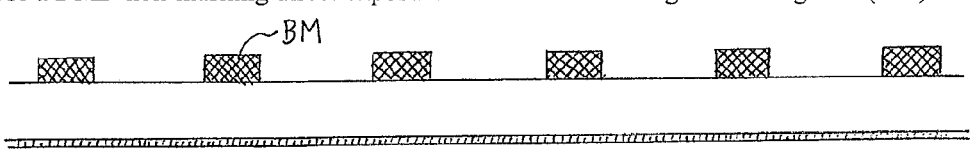

4) Use an ink-jet coating method to form a R, G, B color filter layer or use a DMD device to form a color filter layer by a non-masking direct exposure method.

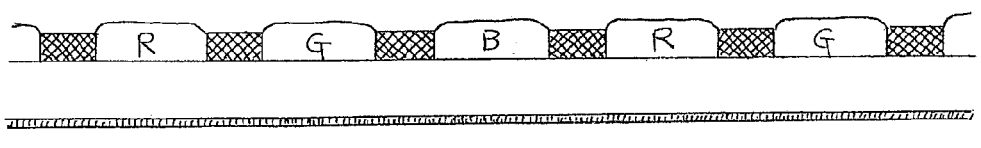

5) Use a slit coating machine to coat a planarization film.

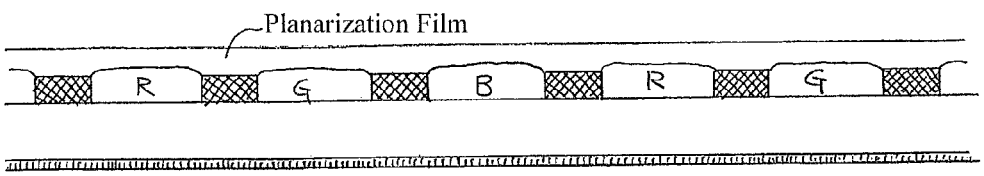

6) Use an ink-jet coating method to install a ball spacer at a fixed point.

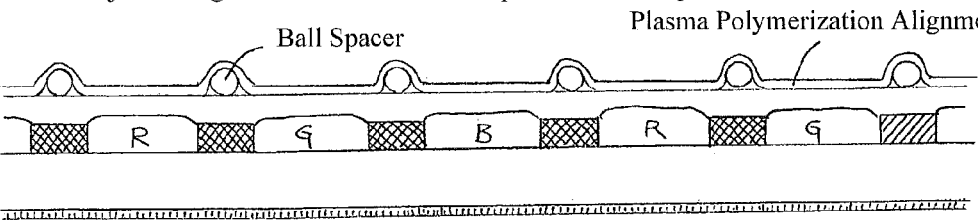

Fig. 41

| Gate Electrode Pixel Electrode & Common Electrode Halftone Exposure Manufacturing Process | | | |
|---|---|---|---|
| Type (Ia) manufacturing process | Type (Ib) manufacturing process | Type (IIa) manufacturing process | Type (IIb) manufacturing process |
| 2-layer metal continuous film formation (Ti or Zr) \Al-C-Ni | 2-layer metal continuous film formation (Ti or Zr) \Al-C-Ni | 2-layerl continuous film formation of transparent conducting nitride and metal (TiNx or Zr Nx) \Al-C-Ni | 2-layerl continuous film formation of transparent conducting nitride and metal (TiNx or Zr Nx) \Al-C-Ni |
| ↓ | ↓ | ↓ | ↓ |
| Use the halftone exposure method for the positive photoresist | Use the halftone exposure method for the positive photoresist | Use the halftone exposure method for the positive photoresist | Use the halftone exposure method for the positive photoresist |
| ↓ | ↓ | ↓ | ↓ |
| Etch Al-C-Ni upper layer metal | Selectively etch Al-C-Ni upper layer metal | Etch Al-C-Ni upper layer metal | Selectively etch Al-C-Ni upper layer metal |
| ↓ | ↓ | ↓ | ↓ |
| Etch titanium or zirconium lower layer metal | Ash and remove positive photoresist of halftone exposure region | Etch transparent conducting nitride (TiNx or ZrNx) | Ash and remove positive photoresist of halftone exposure region |
| ↓ | ↓ | ↓ | ↓ |
| Ash and remove positive photoresist of halftone exposure region | Use the exposed Al-C-Ni as a mask to selectively etch titanium or zirconium lower layer metal | Ash and remove positive photoresist of halftone exposure region | Use the exposed Al-C-Ni as a mask to selectively etch transparent conducting nitride (TiNx or ZrNx) |
| ↓ | ↓ | ↓ | ↓ |
| Selectively etched and exposed Al-C-Ni | Selectively etched and exposed Al-C-Ni | Selectively etched and exposed Al-C-Ni | Selectively etched and exposed Al-C-Ni |
| ↓ | ↓ | ↓ | ↓ |
| Peeled and remained positive photoresist | Peeled and remained positive photoresist | Peeled and remained positive photoresist | Peeled and remained positive photoresist |
| ↓ | ↓ | ↓ | ↓ |
| Perform Al-C-Ni oxidation-resisting surface treatment and Ti or Zr metal layer transparent nitrification treatment in the shower nitrogen ion doping for substrate | Perform Al-C-Ni oxidation-resisting surface treatment and Ti or Zr metal layer transparent nitrification treatment in the shower nitrogen ion doping on full surface of substrate | Perform Al-C-Ni oxidation-resisting surface treatment in the shower nitrogen ion doping on full surface of substrate | Perform Al-C-Ni oxidation-resisting surface treatment in the shower nitrogen ion doping on full surface of substrate |

Fig. 46

| a-Island & Contact Hole Halftone Exposure Process |
|---|

P-SiNx\i a-Si\n⁺-a-Si (Three-layer Plasma CVD Film Formation Method)
↓
Use the halftone exposure method for the positive photoresist pattern
↓
Dry etch contact hole portion
↓
Ash and remove positive photoresist of halftone exposure region
↓
Two-layer silicon layer of i a-Si\n⁺a-Si of selectively dry etched halftone exposure region
↓
Perform plasma nitrification for a-Si island sidewalls or perform nitrification treatment by nitrogen ion shower doping
↓
Peeled and remained positive photoresist

Fig. 47

| Source Electrode & Drain Electrode & | Cst (holdup capacitor) Forming Electrode, Alignment Control Electrode or Comb Common Electrode (General Exposure Manufacturing Process) |
|---|---|
| Metal single-layer film formation | |

↓
Positive photoresist pattern
↓
Metal etching
↓
Dry etch n⁺ a-Si channel region
↓
Peel off positive photoresist

Fig. 48

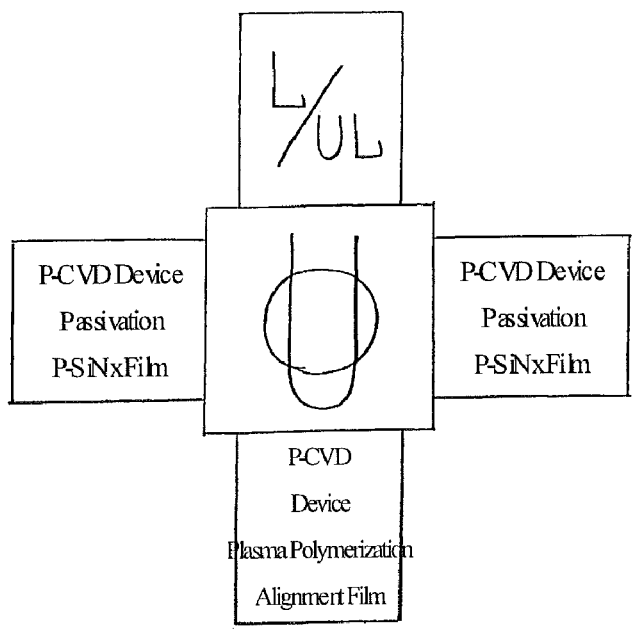
Fig. 59
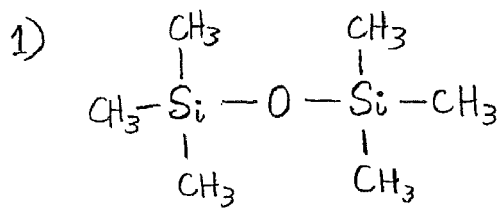
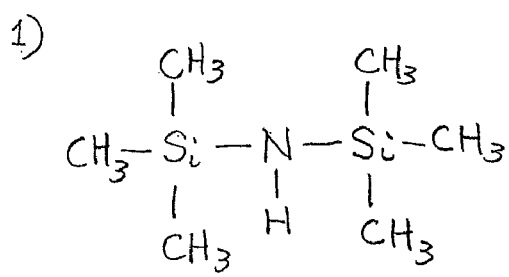
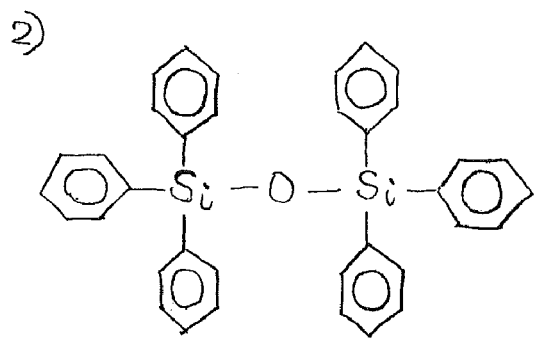
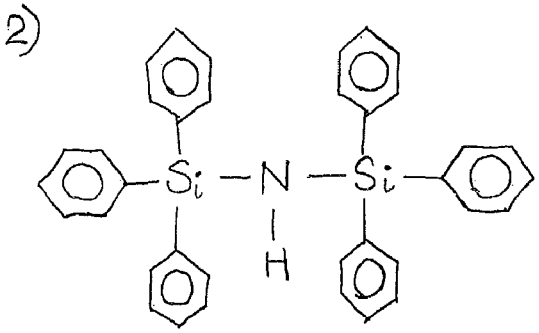
Fig. 60   Fig. 61

Bisallylnadiimide (BANI)
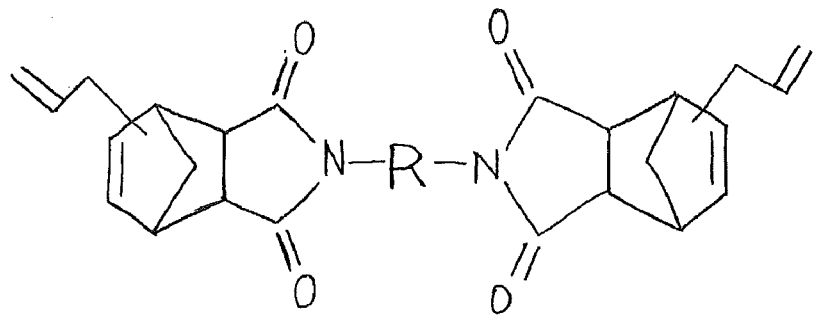
R ------
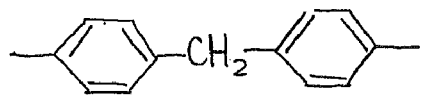 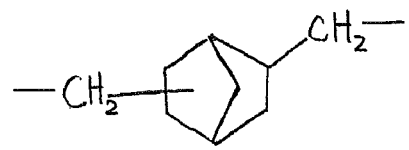
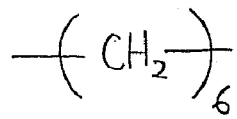 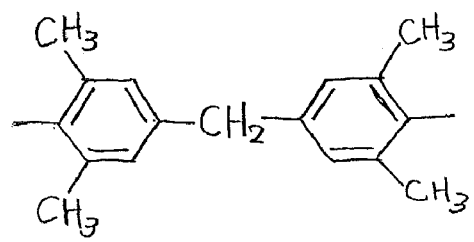
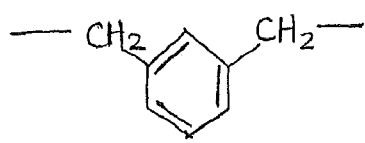
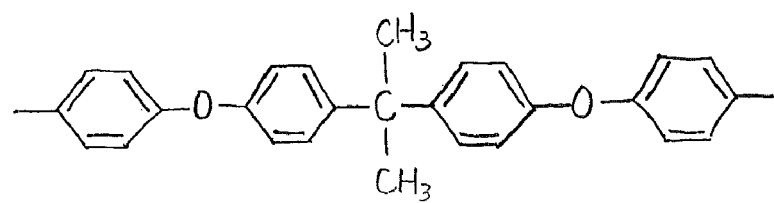
Fig. 64

Fig. 77

Type A manufacturing process (TN, MVA, or IPS mode) adopts a double exposure method.

Firstly, an absolute standard alignment mark is formed in a glass substrate by laser.

[1] i) Use a general mask to perform a bottom-side exposure for a gate electrode, a common electrode, a contact pad in a pixel.

ii) Use a general mask to perform a general exposure for a pixel electrode, gate electrode and common electrode.

[2] i) Use a general mask to perform a bottom-side exposure for an a-Si island.

ii) Use a general mask to perform a general exposure for a contact hole.

[3] Use a general mask to perform a general exposure for a source electrode, a drain electrode, and a Cst (holdup capacitor) forming electrode.

$n^+$ a-Si of dry etched channel portion

P-SiNx Passivation Film ···Mask Deposition Method

Fig. 78

Type B manufacturing process ( MVA mode) adopts a double exposure method.

Firstly, an absolute standard alignment mark is formed in a glass substrate by laser.

[1] i) Use a general mask to perform a bottom-side exposure for a gate electrode, a common electrode, a contact pad in a pixel.

ii) Use a general mask to perform a general exposure for a pixel electrode, gate electrode and common electrode.

[2] i) Use a general mask to perform a bottom-side exposure for an a-Si island.

ii) Use a general mask to perform a general exposure for a contact hole.

[3] Use a general mask to perform a general exposure for a source electrode, a drain electrode, and a Cst (holdup capacitor) forming electrode.

$n^+$ a-Si of dry etched channel portion

P-SiNx Passivation Film ···Mask Deposition Method

Fig. 79

Type C Manufacturing (FFS Mode) adopts a double exposure method

Firstly, an absolute standard alignment mark is formed in a glass substrate by laser.

[1]  i) Use a general mask to perform a bottom-side exposure for a gate electrode, a common electrode, a contact pad in a pixel.

ii) Use a general mask to perform a general exposure for a pixel electrode, gate electrode and common electrode.

[2]  i) Use a general mask to perform a bottom-side exposure for an a-Si island.

ii) Use a general mask to perform a general exposure for a contact hole.

[3]  Use a general mask to perform a general exposure for a source electrode, a drain electrode, and a Cst (holdup capacitor) forming electrode.

$n^+$ a-Si of dry etched channel portion

P-SiNx Passivation Film ···Mask Deposition Method

Fig. 80

DMD Non-Masking Direct Writing Halftone Exposure Device

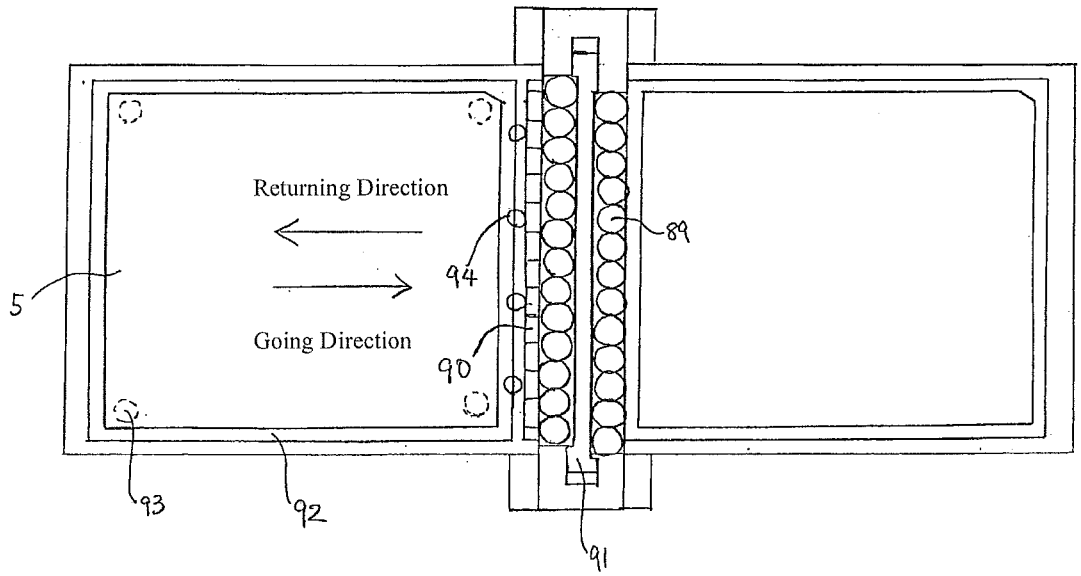

Fig. 82

Three Times of Photolithographic Process of Type A Manufacturing Process (TN, MVA or IPS Mode) adopts a DMD Direct Writing Exposure Device

[1] Gate Electrode & Pixel Electrode

&Common Electrode & Title········DMD Halftone Exposure Method

[2] a-Si Island & Contac Hole ········ DMD Halftone Exposure Method

[3] Source Electrode & Drain Electrode & Cst (holdup capacitor)

Forming Electrode ················ General Masking Exposure Method n+ a-Si of dry etched channel portion
P-SiNx Passivation Film········ Mask Deposition Method

Fig. 83

Three Times of Photolithographic Process of Type B Manufacturing Process (TN, MVA or IPS Mode) adopts a DMD Direct Writing Exposure Device

[1] Gate Electrode & Pixel Electrode

&Common Electrode & Title········DMD Halftone Exposure Method

[2] a-Si Island & Contac Hole ········ DMD Halftone Exposure Method

[3] Source Electrode & Drain Electrode

& Alignment Control Electrode ······ General Masking Exposure Method n+ a-Si of dry etched channel portion
P-SiNx Passivation Film···Mask Deposition Method

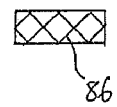
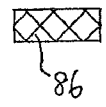
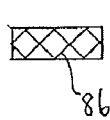
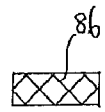
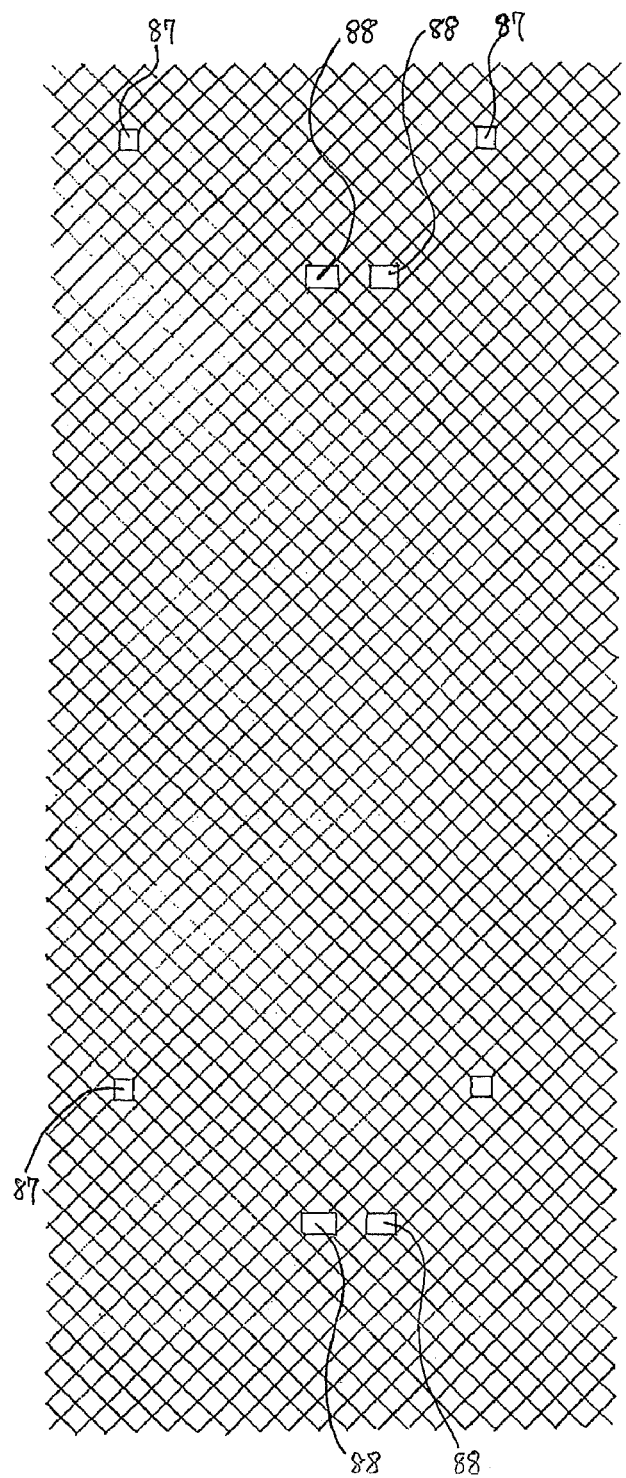
Fig. 94
Fig. 95

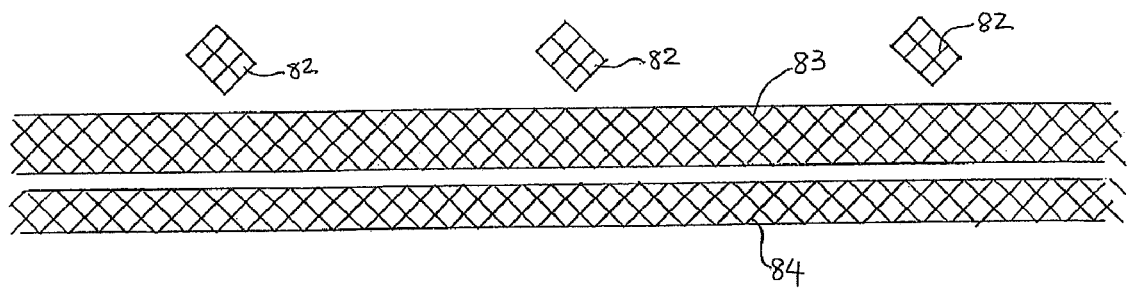
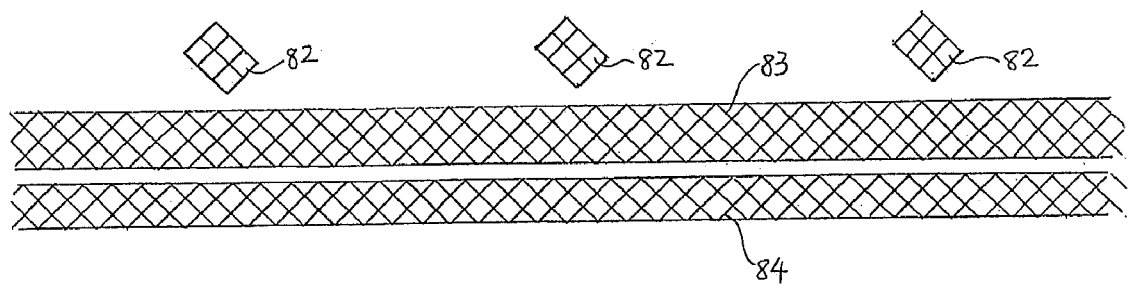
Fig. 96

Fig. 103

Three Times of Photolithographic Process of Type A Manufacturing Process (TN, MVA or IPS Mode) adopts a DMD Direct Writing Exposure Device

[1] Gate Electrode & Pixel Electrode

&Common Electrode & Title········DMD Halftone Exposure Method

[2] a-Si Island & Contac Hole ········ DMD Halftone Exposure Method

[3] Source Electrode & Drain Electrode & Cst (holdup capacitor)

Forming Electrode ················· DMD General Exposure Method n+ a-Si of dry etched channel portion
P-SiNx Passivation Film········ Mask Deposition Method

Fig. 104

Three Times of Photolithographic Process of Type B Manufacturing Process (MVA Mode) adopts a DMD Direct Writing Exposure Device

[1] Gate Electrode & Pixel Electrode

&Common Electrode & Title········ DMD Halftone Exposure Method

[2] a-Si Island & Contac Hole ········ DMD Halftone Exposure Method

[3] Source Electrode & Drain Electrode

& Alignment Control Electrode ······DMD General Exposure Method n+ a-Si of dry etched channel portion
P-SiNx Passivation Film···Mask Deposition Method

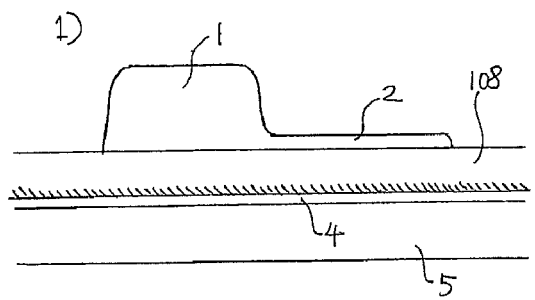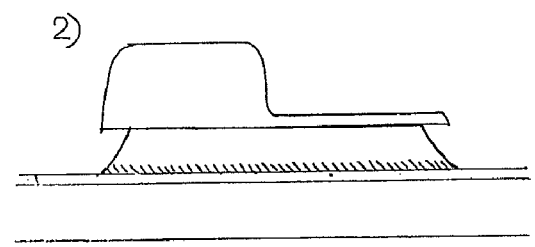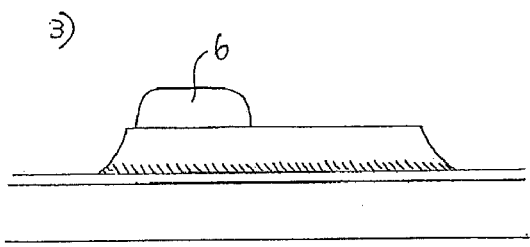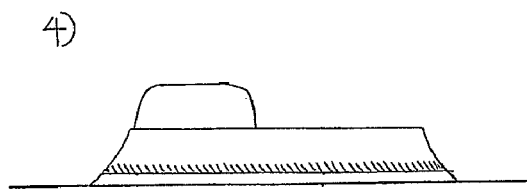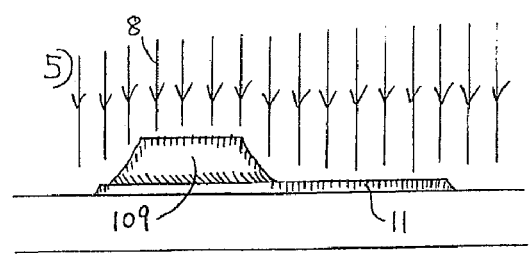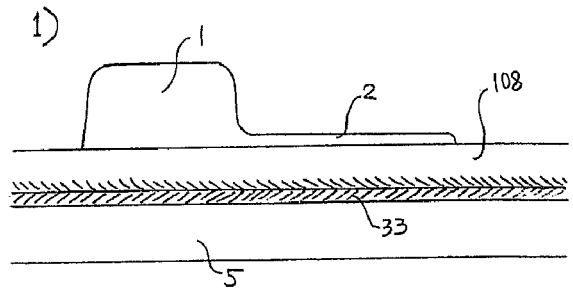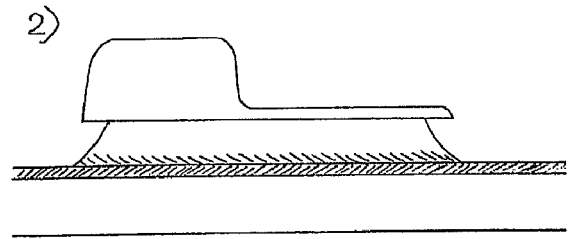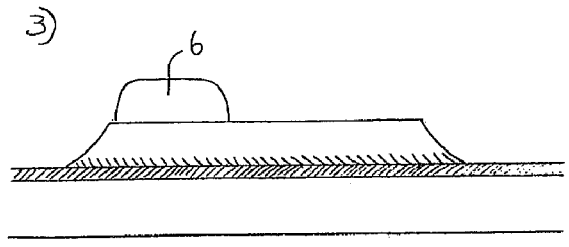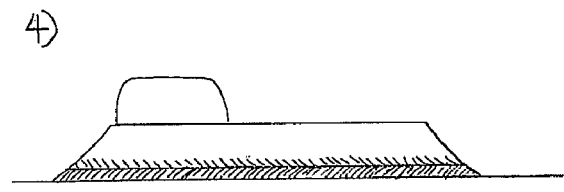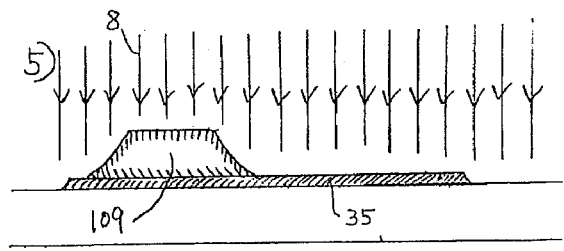
Fig. 112        Fig. 113

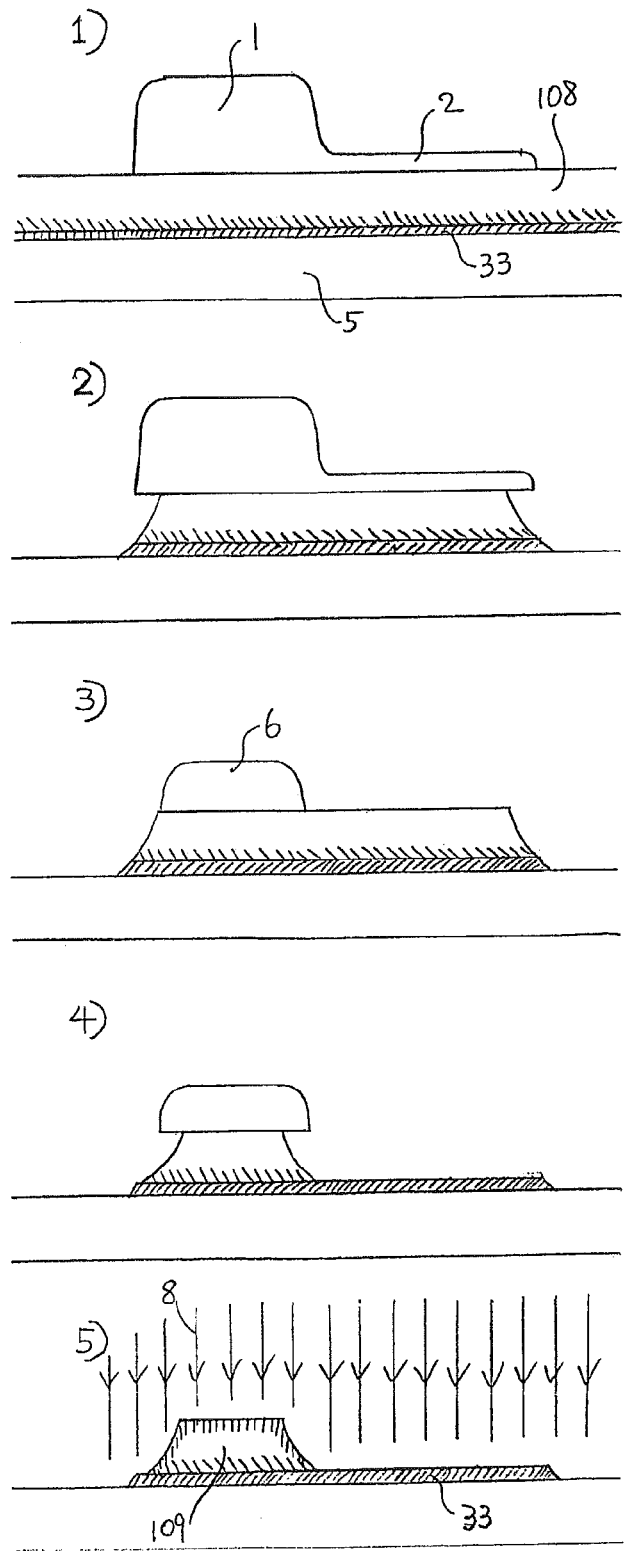

Rinse substrate
↓
Continuously deposit a first layer
(lower layer) transparent conductor
& a second layer (upper layer)
metal
↓
Coat positive photoresist
↓
Halftone Exposure
↓
Image Development
↓
Simultaneously etch the second layer
(upper layer) metal & the first layer
(lower layer) transparent conductor
↓
Semi-ash Process
(Remove the thin film portion of the
positive photoresist)
↓
Selectively etch the second layer
(upper layer) metal
↓
Peel off positive photoresist

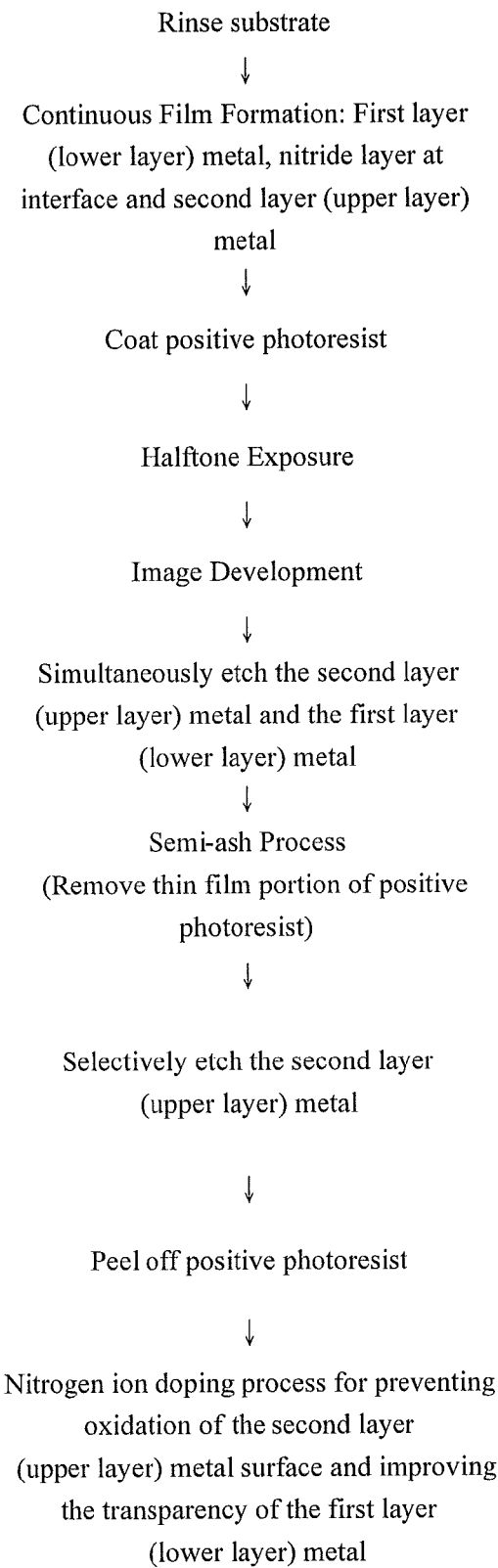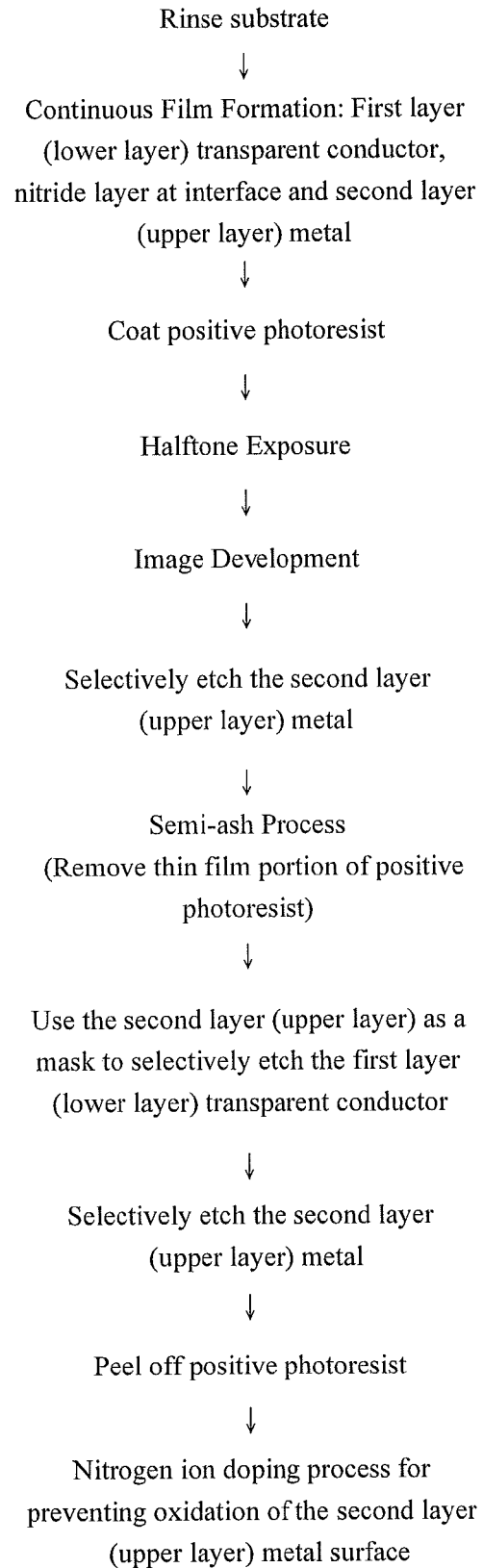
Fig 116
Fig. 117

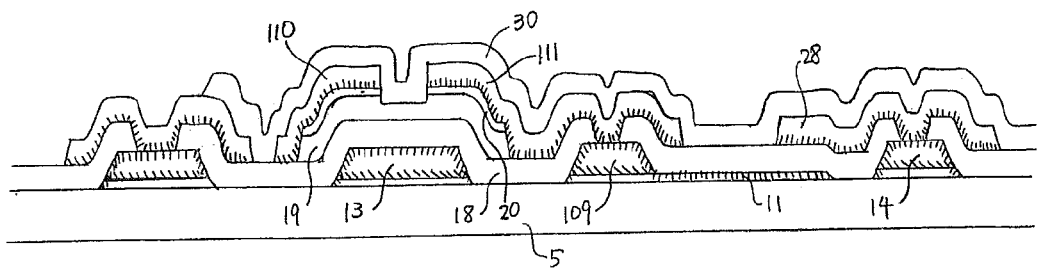
Fig. 120
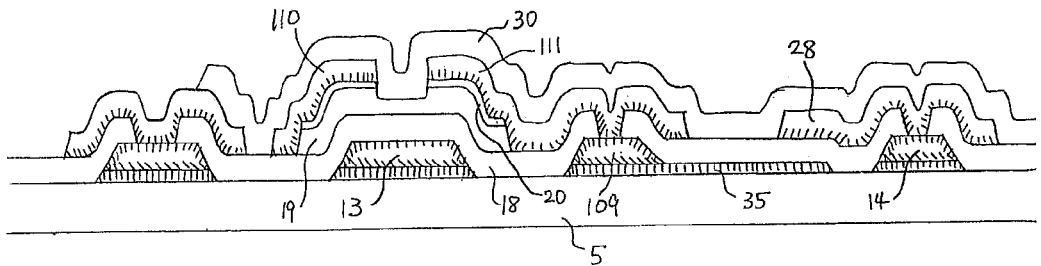
Fig. 121
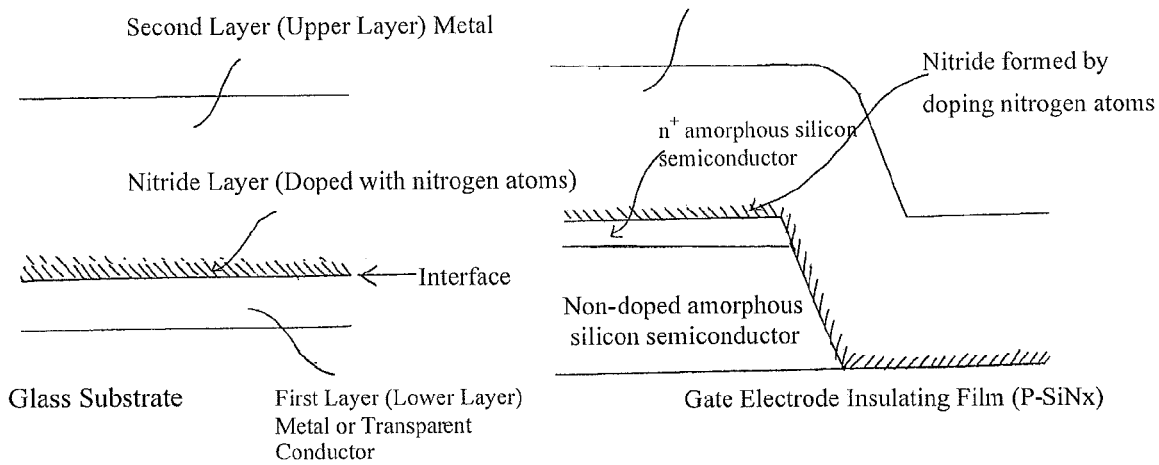
Fig. 122
Fig. 123

Fig. 128

1) Use DMD to perform a non-masking exposure to form a pattern of light shielding film (BM). Meanwhile, the title is formed by using DMD for the non-masking exposure.

2) Use an ink-jet coating method, multiple peeling coating method or planographic printing method to form a RGB color filer layer.

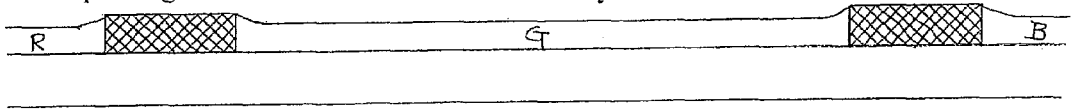

3) Deposit a transparent conducting film after the planarization film is coated.

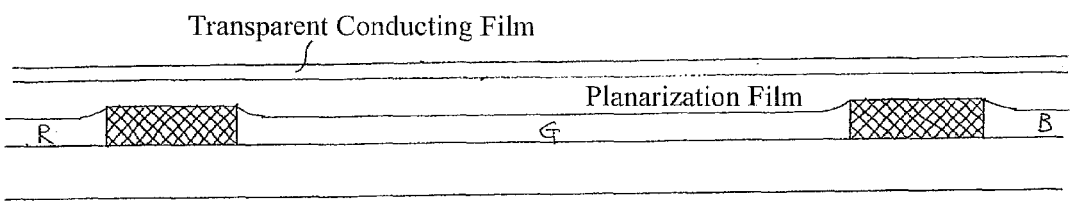

4) Use DMD to perform a non-masking exposure to form a pattern of the alignment control protruding lump (by using the planographic printing method directly)

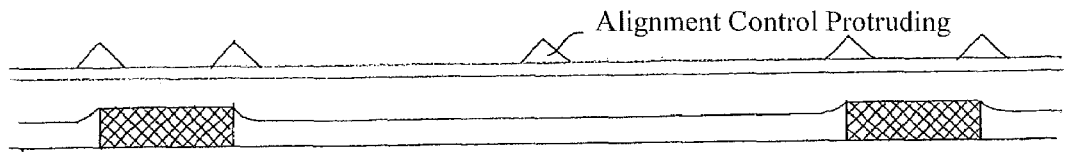

5) Use an ink-jet coating method or a planographic printing method to install a ball space at a fixed point, and use a plasma polymerization method to form the alignment film.

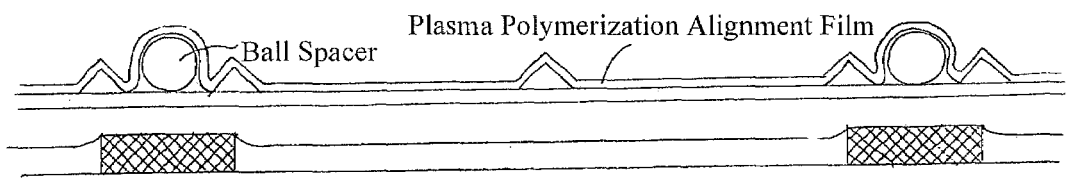

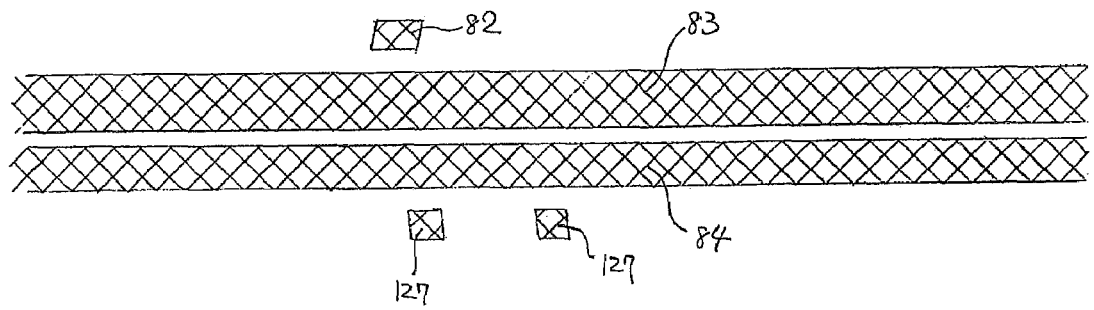
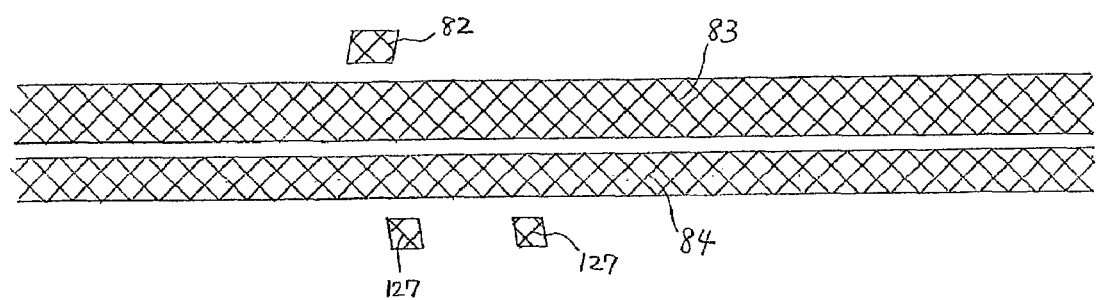
Fig. 155

MVA Mode
Main Seal Portion
(Virtual Terminal Portion)

IPS Mode
Main Seal Portion
(Virtual Terminal Portion)

| Gate Electrode & Pixel Electrode & Common Electrode Halftone Exposure Manufacturing Process | | | |
|---|---|---|---|
| Type (IIIa) Manufacturing Process | Type (IIIb) Manufacturing Process | Type (IVa) Manufacturing Process | Type (IVb) Manufacturing Process |
| 2-layer continuous film formation of (ITO or IZO) \Al-C-Ni of transparent conducting oxide and metal | 2-layer continuous film formation of (ITO or IZO) \Al-C-Ni of transparent conducting oxide and metal | 3-layer continuous film formation of Ti\Al alloy\Mo | 3-layer continuous film formation of Ti\Al alloy\Mo |
| ↓ | ↓ | ↓ | ↓ |
| Use the halftone exposure method for the positive photoresist | Use the halftone exposure method for the positive photoresist | Use the halftone exposure method for the positive photoresist | Use the halftone exposure method for the positive photoresist |
| ↓ | ↓ | ↓ | ↓ |
| Etch Al-C-Ni upper layer metal | Selectively etch Al-C-Ni upper layer metal | Etch aluminum alloy\molybdenum | Selectively etch aluminum alloy\molybdenum |
| ↓ | ↓ | ↓ | ↓ |
| Etch transparent conducting oxide (ITO or IZO) | Ash and remove positive photoresist in halftone exposure region | Etch Ti lower layer metal | Ash and remove positive photoresist in halftone exposure region |
| ↓ | ↓ | ↓ | ↓ |
| Ash and remove positive photoresist in halftone exposure region | Use exposed Al-C-Ni as a mask to selectively etch transparent conducting oxide (ITO or IZO) | Ash and remove positive photoresist in halftone exposure region | Use exposed Al alloy\Mo as a mask to selectively etch Ti lower layer metal |
| ↓ | ↓ | ↓ | ↓ |
| Selectively etched and exposed Al-C-Ni | Selectively etched and exposed Al-C-Ni | Two layer metals: selectively etched and exposed aluminum alloy\molybdenum | Selectively etched and exposed aluminum alloy\molybdenum |
| ↓ | ↓ | ↓ | ↓ |
| Peeled and remained positive photoresist | Peeled and remained positive photoresist | Peeled and remained positive photoresist | Peeled and remained positive photoresist |
| ↓ | ↓ | ↓ | ↓ |
| Perform Al-C-Ni oxidation-resisting surface treatment in the shower nitrogen ion doping for substrate | Perform Al-C-Ni oxidation-resisting surface treatment in the shower nitrogen ion doping for substrate | Perform a transparent nitrification for the titanium lower layer metal in the shower nitrogen ion doping for the whole substrate | Perform a transparent nitrification for the titanium lower layer metal in the shower nitrogen ion doping for the whole substrate |

Fig. 172

| Gate Electrode & Pixel Electrode & Common Electrode Halftone Exposure Manufacturing Process | | | |
|---|---|---|---|
| Type (Va) Manufacturing Process | Type (Vb) Manufacturing Process | Type (VIa) Manufacturing Process | Type (VIb) Manufacturing Process |
| 3-layer continuous film formation of (TiNx\Al Alloy\Mo) of transparent conducting oxide and metal | 3-layer continuous film formation of (TiNx\Al Alloy\Mo) of transparent conducting oxide and metal | 3-layer continuous film formation of (ITO\Al Alloy\Mo) of transparent conducting oxide and metal | 3-layer continuous film formation of (ITO\Al Alloy\Mo) of transparent conducting oxide and metal |
| ↓ | ↓ | ↓ | ↓ |
| Use the halftone exposure method for the positive photoresist | Use the halftone exposure method for the positive photoresist | Use the halftone exposure method for the positive photoresist | Use the halftone exposure method for the positive photoresist |
| ↓ | ↓ | ↓ | ↓ |
| Etch Al alloy\Mo | Selectively etch Al alloy\Mo | Etch Al alloy\Mo | Selectively etch Al alloy\Mo |
| ↓ | ↓ | ↓ | ↓ |
| Etch TiNx lower layer transparent conducting nitride | Ash and remove positive photoresist of halftone exposure region | Etch ITO lower layer transparent conducting nitride | Ash and remove positive photoresist of halftone exposure region |
| ↓ | ↓ | ↓ | ↓ |
| Ash and remove positive photoresist of halftone exposure region | Use exposed Al alloy\Mo as a mask to selectively etch TiNx lower layer transparent conducting nitride | Ash and remove positive photoresist of halftone exposure region | Use exposed Al alloy\Mo as a mask to selectively etch ITO lower layer transparent conducting nitride |
| ↓ | ↓ | ↓ | ↓ |
| Selectively etch two layers of metal of exposed Al alloy\Mo | Selectively etch exposed Al alloy\Mo | Selectively etch two layers of metal of exposed Al alloy\Mo | Selectively etch exposed Al alloy\Mo |
| ↓ | ↓ | ↓ | ↓ |
| Peeled and remained positive photoresist | Peeled and remained positive photoresist | Peeled and remained positive photoresist | Peeled and remained positive photoresist |

Fig. 173

| a-Si Island & Contact Hole (Halftone Exposure Process) |

P-SiNx\i a-Si\n⁺a-Si\Ti or Zr or Mo (Four Layer Film Formation Method)

↓

Use the halftone exposure method to form a pattern of positive photoresist.

↓

Dry etch a contact hole portion.

↓

Ash and remove the positive photoresist in the halftone exposure region.

↓

Selectively etch three layers: i a-Si\n⁺a-Si\ Ti or Zr or Mo in the halftone exposure region.

↓

Peeled and remained positive photoresist

↓

Perform plasma nitrification to the sidewalls of an a-Si island or nitrify the sidewalls by nitrogen ion shower doping.

Fig. 174

| Source Electrode, Drain Electrode, Cst (Holdup) Forming Electrode, Common Electrode, and Alignment Control Electrode |

Continuous film formation of two layer metals (Barrier Metal\Wiring Metal) | General Exposure Method |

↓

Form a pattern of positive photoresist.

↓

Etch two layers of metal films.

↓

Dry etch an n⁺ a-Si channel region.

↓

Peel off the positive photoresist

Fig. 175

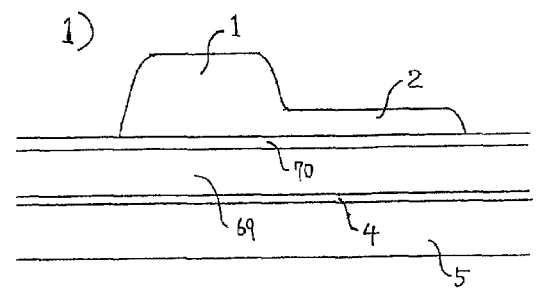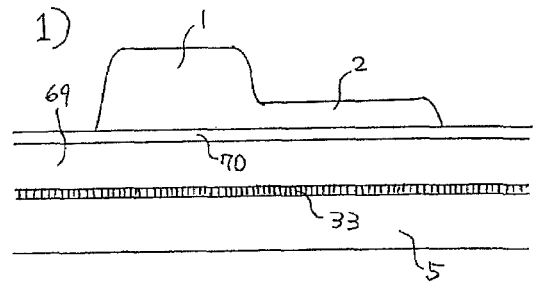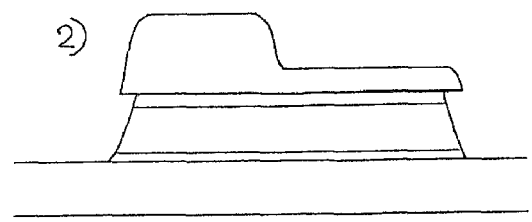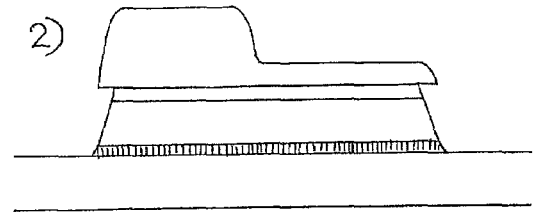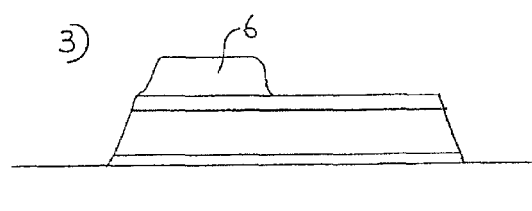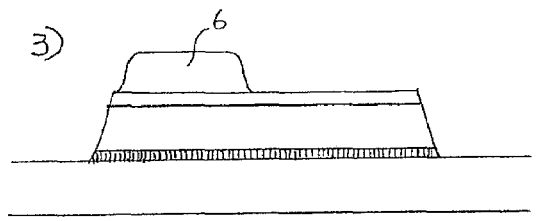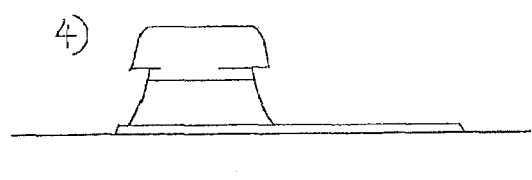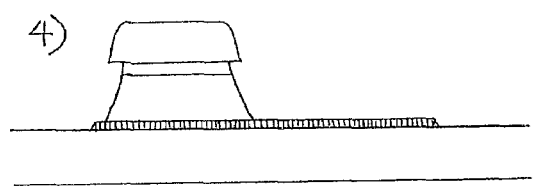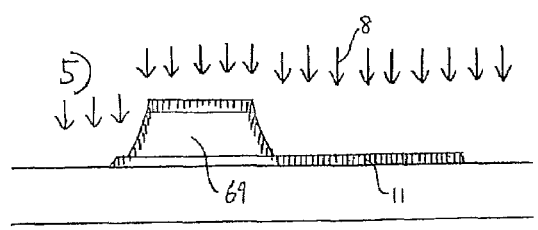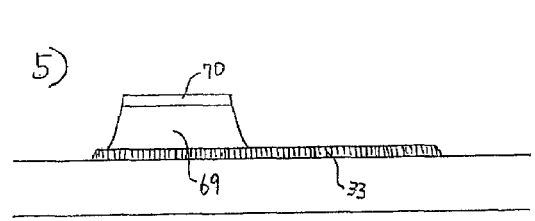
Fig. 176            Fig. 177

| a-Si Island and Contact Hole (Halftone Exposure Process) |
|---|

P-SiNx\i a-Si\n⁺a-Si\Ti or Zr or Mo (Three Layer Film Formation Method)

↓

Use halftone exposure method to form a pattern of positive photoresist.

↓

Halfly dry etch (incompletely dry etch) the contact hole portion.

↓

Ash and remove the positive photoresist of the halftone exposure region.

↓

Selectively etch the completely etched contact hole portion to expose two silicon layers (i a-Si\n⁺a-Si).

↓

Perform plasma nitrification for the a-Si sidewalls or process the sidewalls by nitrogen ion shower doping.

↓

Peeled and Remained Positive Photoresist

Fig. 178

| Source Electrode, Drain Electrode, Cst (Holdup) Forming Electrode, Common Electrode, and Alignment Control Electrode |
|---|

Use nitrified gas to form a nitrogen doped single layer Al alloy film in the interface region.   (General Exposure Process)

↓

Form a pattern of positive photoresist.

↓

Etch Al alloy.

↓

Dry etch an n⁺ a-Si channel region.

↓

Peel off the positive photoresist.

Fig. 179

| a-Si Island and Contact Hole (Halftone Exposure Process) |

P-SiNx\i a-Si\n⁺-a-Si\Ti or Zr or Mo (Four Layer Film Formation Method)

↓

Use halftone exposure method to form a pattern of positive photoresist.

↓

Halfly dry etch (incompletely dry etch) the contact hole portion.

↓

Ash and remove the positive photoresist of halftone exposure region.

↓

Selectively etch the completely etched contact hole to expose three layers of i a-Si\n⁺-a Si\Ti or Zr or Mo

↓

Peeled and remained positive photoresist

↓

Perform plasma nitrification for the a-Si island or process the sidewalls by nitrogen ion shower doping.

Fig. 180

| Source Electrode, Drain Electrode, Cst (Holdup) Forming Electrode, Common Electrode, and Alignment Control Electrode |

Form three metal layers.    (General Exposure Process)

↓

Form a pattern of positive photoresist.

↓

Etch three layer of metal films.

↓

Dry etch an n⁺ a-Si channel region.

↓

Peel off the positive photoresist.

Fig. 181

Fig. 183
1)
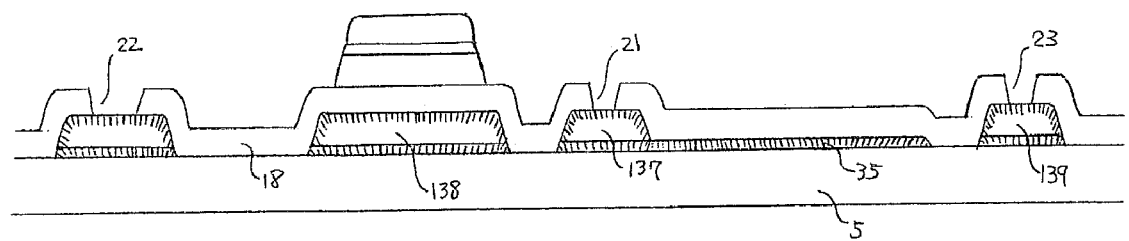
2)
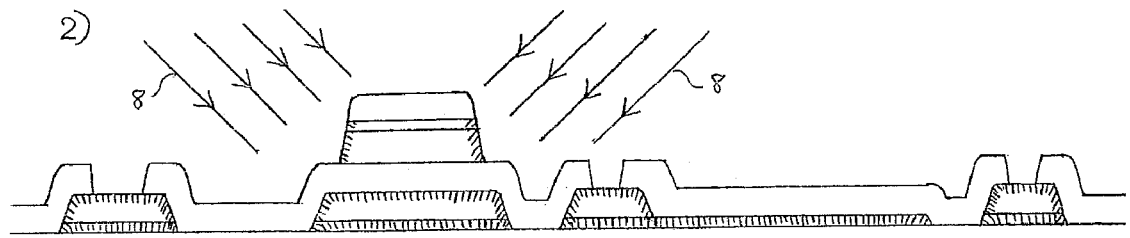
3)
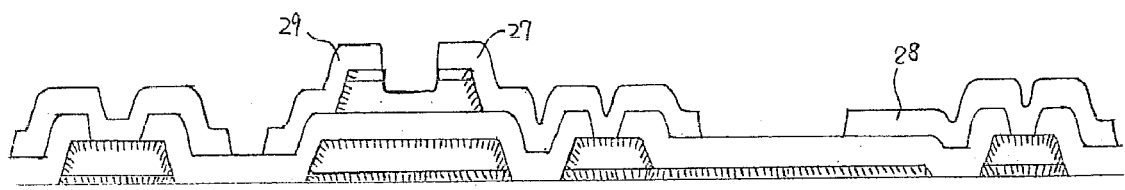
4)
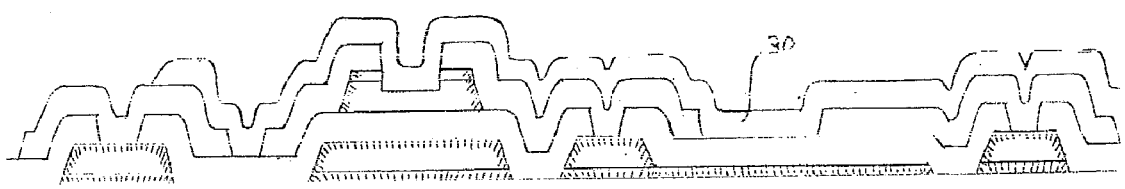

Fig. 185
1)
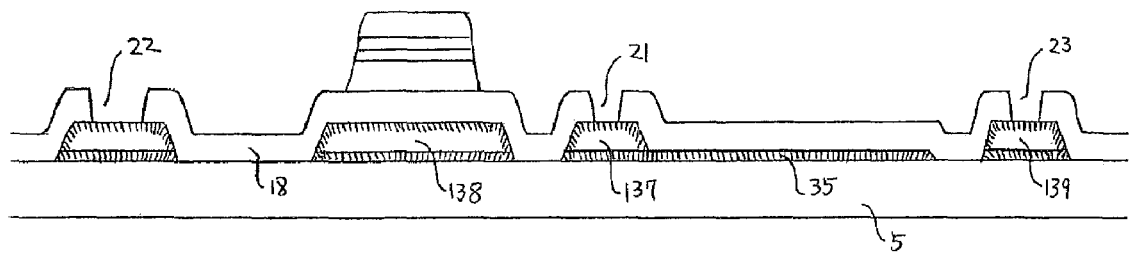
2)
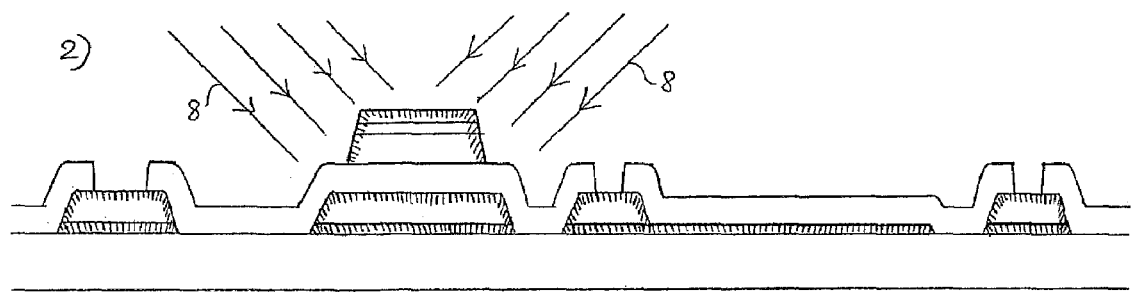
3)
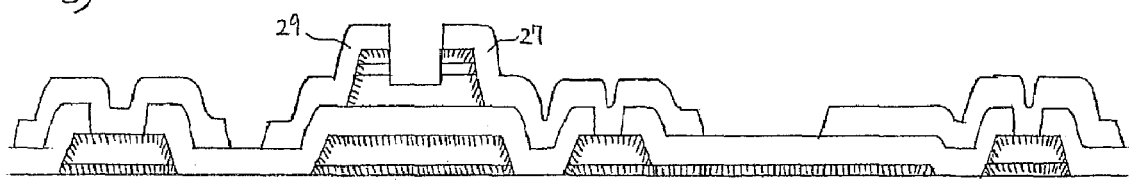
4)
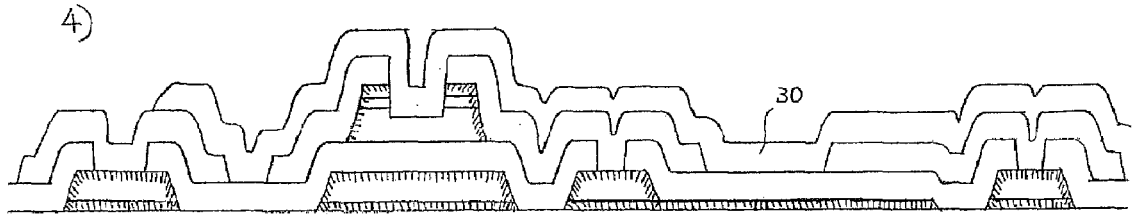

Unidyne Structure

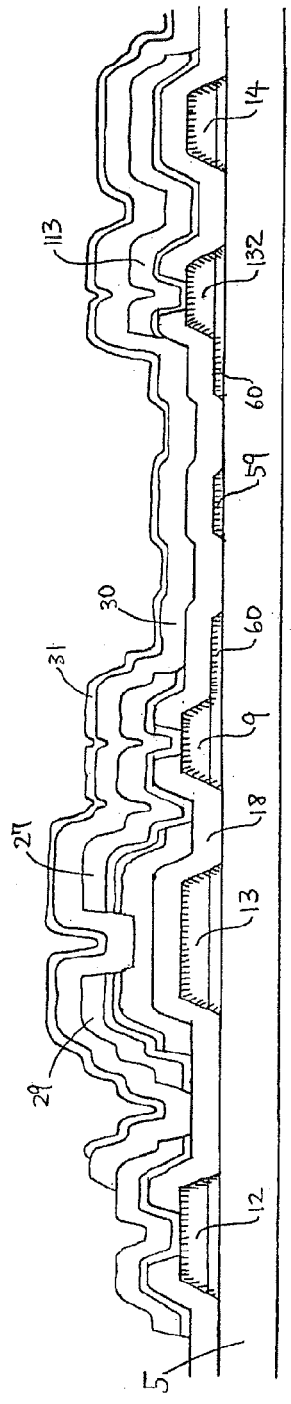
Fig. 251
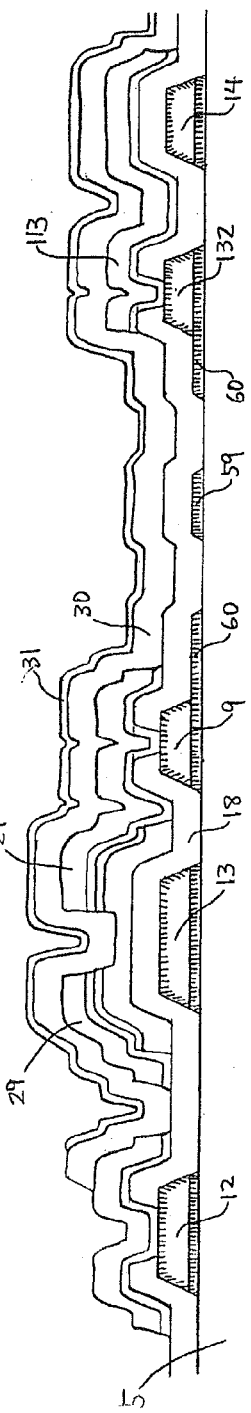
Fig. 252
Fig. 253

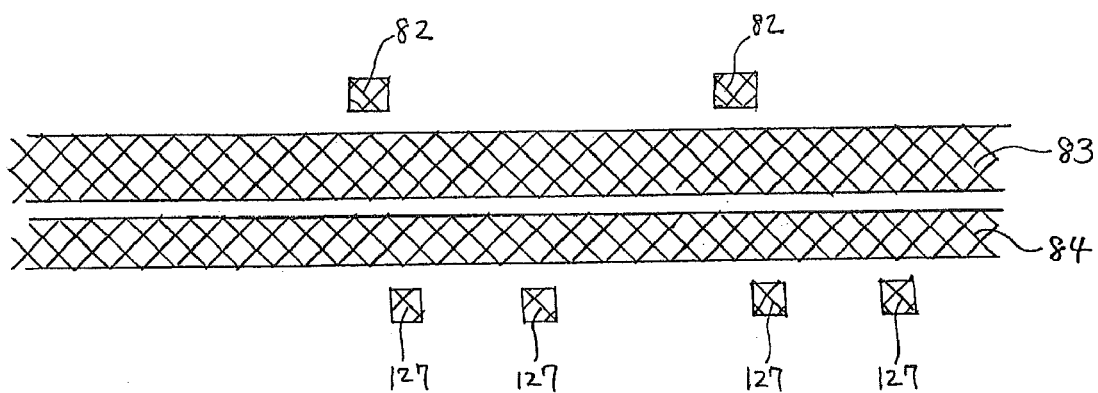
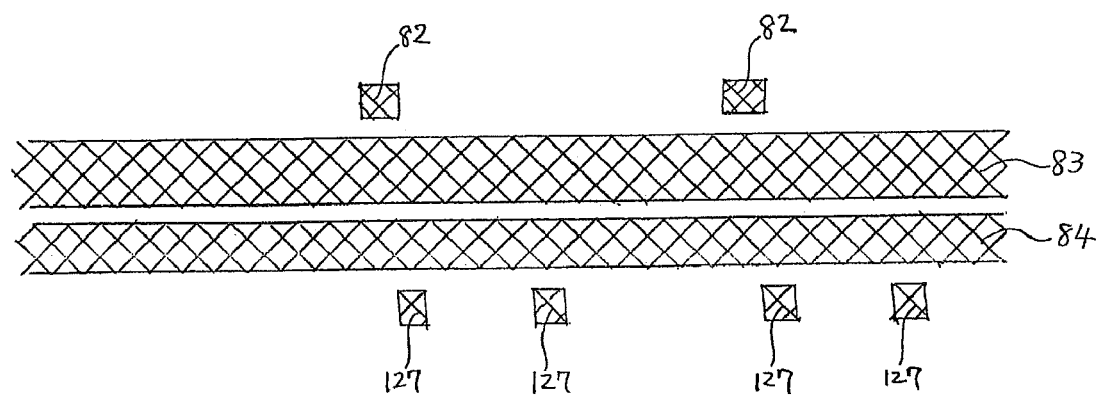
Fig. 267

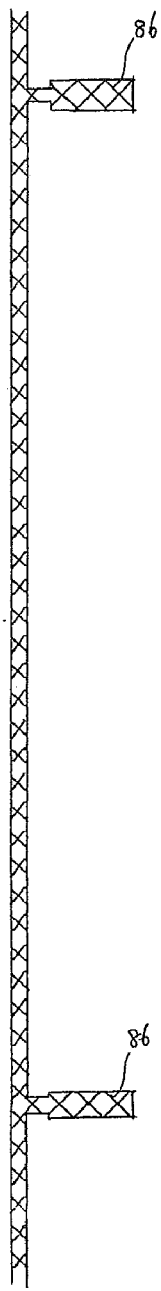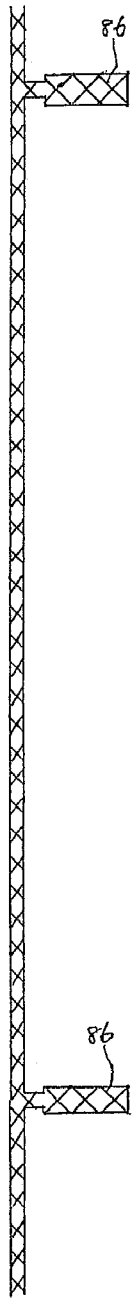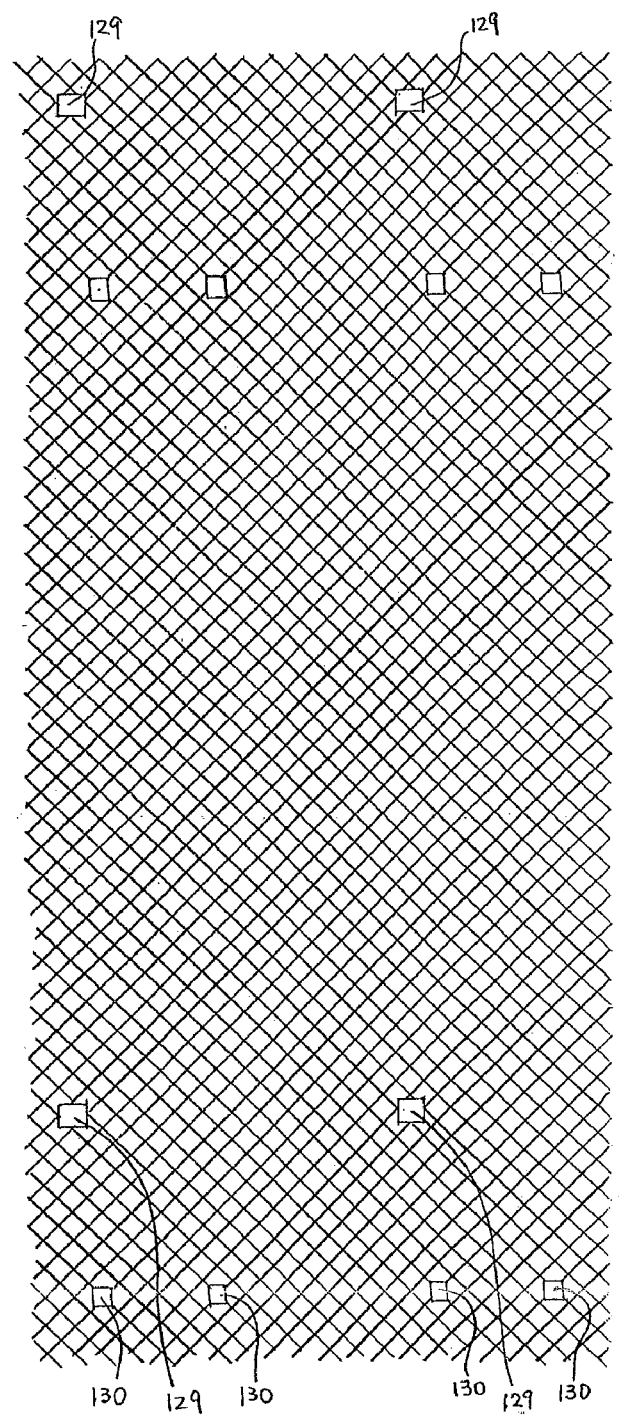
Fig. 269  Fig. 270

Fig. 277

Type A Manufacturing Process (TN, MVA or IPS Mode)   Four Times of Masking Process

[1] Gate Electrode, Pixel Electrode, Common Electrode and Contact Pad in Pixel Electrode ⋯                                    Halftone Exposure Method (using a halftone mask)

[2] a-Si Island and Contact Hole⋯⋯    Halftone Exposure Method (using a halftone mask)

[3] Source Electrode, Drain Electrode and Cst (Holdup Capacitor)Forming Electrode⋯⋯   General Exposure Method (using a general mask)

[4] Contact Hole connected to Terminal Portion for Driving IC ⋯⋯⋯⋯⋯⋯⋯⋯   General Exposure Method (using a general mask)

Fig. 278

Type B Manufacturing Process (MVA Mode)   Four Times of Masking Process B

[1] Gate Electrode, Pixel Electrode, Common Electrode and Contact Pad in Pixel Electrode ⋯ Halftone Exposure Method (using a halftone mask)

[2] a-Si Island and Contact Hole⋯⋯    Halftone Exposure Method (using a halftone mask)

[3] Source Electrode, Drain Electrode and

Alignment Electrode⋯⋯         General Exposure Method (using a general mask)

[4] Contact Hole connected to Terminal Portion for Driving IC ⋯⋯⋯⋯⋯⋯⋯⋯   General Exposure Method (using a general mask)

Fig. 279

Type C Manufacturing Process (FFS Mode)   Four Times of Masking Process

1. Gate Electrode, Pixel Electrode, Common Electrode and Contact Pad in Pixel Electrode ... Halftone Exposure Method (using a halftone mask)

2. a-Si Island and Contact Hole......   Halftone Exposure Method (using a halftone mask)

3. Source Electrode, Drain Electrode and

Comb Common Electrode ......... General Exposure Method (using a general mask)

4. Contact Hole connected to Terminal Portion for Driving IC ....................   General Exposure Method (using a general mask)

Fig. 280

Type A Manufacturing Process (TN, MVA or IPS Mode) Adopting Double Exposure Method Four Times of Masking Process Firstly, an absolute standard alignment mark is formed on a glass substrate by laser.

1. i) Use a general mask to perform a bottom-side exposure for a gate electrode, a common electrode and a contact pad in the pixel electrode.

ii) Use a general mask to perform a general exposure for a pixel electrode, a gate electrode and a common electrode.

2. i) Use a general mask to perform a bottom-side exposure of an a-Si island.

ii) Use a general mask to perform a general exposure for a contact hole.

3. Use a general mask to perform a general exposure for a source electrode drain electrode & Cst (holdup capacitor) forming electrode.

4. Use a general mask to perform a general exposure for a contact hole connected to a terminal portion for driving IC.

Fig. 281

Type B Manufacturing Process (MVA Mode) Adopting Double Exposure Method

Four Times of Masking Process

Firstly, an absolute standard alignment mark is formed on a glass substrate by laser.

[1] i) Use a general mask to perform a bottom-side exposure for a gate electrode, a common electrode and a contact pad in a pixel.

ii) Use a general mask to perform a general exposure for a pixel electrode, a gate electrode and a common electrode.

[2] i) Use a general mask to perform a bottom-side exposure for an a-Si island.

ii) Use a general mask to perform a general exposure for a contact hole.

[3] Use a general mask to perform a general exposure for a source electrode, a drain electrode, and an alignment control electrode.

[4] Use a general mask to perform a general exposure for a contact hole connected to a terminal portion for driving IC.

Fig. 282

Type C Manufacturing Process (MVA Mode) Adopting Double Exposure Method

Four Times of Masking Process

Firstly, an absolute standard alignment mark is formed on a glass substrate by laser.

[1] i) Use a general mask to perform a bottom-side exposure for a gate electrode, a common electrode and a contact pad in a pixel.

ii) Use a general mask to perform a general exposure for a pixel electrode, a gate electrode and a common electrode.

[2] i) Use a general mask to perform a bottom-side exposure for an a-Si island.

ii) Use a general mask to perform a general exposure for a contact hole.

[3] Use a general mask to perform a general exposure for a source electrode, a drain electrode and a comb common electrode.

[4] Use a general mask to perform a general exposure for a contact hole connected to a terminal portion for driving IC.

Fig. 283

Type A Manufacturing Process (TN, MVA or IPS Mode) Adopting DMD Direct Writing Exposure Device Four Times of Masking Process

[1]   Gate Electrode, Pixel Electrode, Common Electrode and Title⋯   <u>DMD Halftone Exposure Method</u>

[2]     a-Si Island and Contact Hole⋯⋯                        <u>DMD Halftone Exposure Method</u>

[3]   Source Electrode, Drain Electrode and Cst (holdup capacitor) forming electrode ⋯⋯⋯⋯⋯⋯⋯   DMD General Exposure Method

[4]   Contact Hole connected to a terminal portion for driving IC ⋯⋯DMD General Exposure Method

Fig. 284

Type B Manufacturing Process (TN, MVA or IPS Mode) Adopting DMD Direct Writing Exposure Device Four Times of Masking Process

[1]   Gate Electrode, Pixel Electrode, Common Electrode and Title⋯   <u>DMD Halftone Exposure Method</u>

[2]     a-Si Island and Contact Hole⋯⋯                        <u>DMD Halftone Exposure Method</u>

[3]   Source Electrode, Drain Electrode and Alignment Control Electrode ⋯DMD General Exposure Method

[4]   Contact Hole connected to a terminal portion for driving IC ⋯⋯⋯⋯ DMD General Exposure Method

METHOD OF MANUFACTURING LCD APPARATUS BY USING HALFTONE EXPOSURE METHOD

FIELD OF THE INVENTION

The present invention relates to a method of manufacturing an active matrix substrate of a liquid crystal display by using a halftone exposure method.

BACKGROUND OF THE INVENTION

Mask is used for the halftone exposure of three regions: a complete UV photo interrupt region, an UV light semi-transmitting region and a complete UV light transmitting region to carry out a photolithographic process and produce positive photoresists of different thicknesses, and its related technologies have been disclosed in Japanese Patent Laid-Open Publication No. Sho-61-181130 (published on Aug. 13, 1986) and Japanese Patent Laid-Open Publication No. 10-163174 (published on Jun. 19, 1998). The mask used for the halftone exposure that reduces the number of times of the photolithographic process in a TFT matrix substrate manufacturing process has been disclosed in Japanese Patent Laid-Open Publication No. 2000-066240 (published on Mar. 3, 2000) and Japanese Patent Laid-Open Publication No. 2000-206571 (published on Jul. 28, 2000). The mask is used for a halftone exposure, and a photolithographic process separates the components of an amorphous silicon thin film semiconductor layer for one time and forms a source electrode and a drain electrode and removes an ohmic contact layer of a channel of a thin film transistor component.

Japanese Patent Laid-Open Publication No. 2001-221992, Japanese Patent Laid-Open Publication No. 2001-228493 and Japanese Patent Laid-Open Publication No. 2001-235763 use two layers: a transparent electroconductive layer and a metal layer and adopt the halftone exposure method to carry out a photolithographic process for one time and form a gate electrode, a common electrode and a counter pixel electrode simultaneously.

Japanese Patent Laid-Open Publication No. 2001-201756 (published on Jul. 21, 2001) uses two layers of metal or alloy and adopts the halftone exposure method to carry out the photolithographic process for one time and form a gate electrode, a common electrode and a liquid crystal driving comb common electrode of a horizontal electric field display apparatus simultaneously. Similarly, two metal or alloy layers and the halftone exposure method are used to carry out the photolithographic process for one time and form a source electrode, a drain electrode and a liquid crystal driving comb pixel electrode simultaneously.

Japanese Patent Laid-Open Publication No. 2001-311965 (published on Nov. 9, 2001) adopts the halftone exposure method to carry out the first photolithographic process and separate the components of a gate electrode and a thin film semiconductor layer, and adopts the halftone exposure method to carry out the second photolithographic process and form a contact hole and a pixel electrode of a channel protective film of a thin film semiconductor component. The halftone exposure method is carried out twice and the general exposure method is carried out once, and thus the photolithographic process is carried out for three times to complete the TFT matrix substrate.

Japanese Patent Laid-Open Publication No. 2002-107762 (published on Apr. 10, 2002) uses two layers: a transparent electroconductive film layer and a metal layer and adopts the halftone exposure method to carry out the first photolithographic process and form a gate electrode and a transparent pixel electrode simultaneously. After the first photolithographic process is carried out, no other metal exists on the transparent pixel electrode, and the transparent pixel electrode is exposed completely. Further, the halftone exposure method is adopted to carry out the second photolithographic process and separate the components of the thin film semiconductor layer to expose the transparent pixel electrode completely. Finally, a general exposure method is adopted to carry out the third photolithographic process and connect the completely exposed transparent pixel electrode directly with the drain electrode, and electrically connect the transparent pixel electrode to the thin film transistor component. The formation of holdup capacitor (Cst) has not been discussed.

The manufacturing process as disclosed in Japanese Patent Laid-Open Publication No. 2002-141512 (published on May 17, 2002) is similar to the manufacturing process as disclosed in Japanese Patent Laid-Open Publication No. 2002-107762, except that only the first halftone exposure method is used, and two layers: a transparent electroconductive film layer and a metal layer are used to carry out the first photolithographic process of the general exposure method to form a gate electrode and a pixel electrode. After the first manufacturing process is completed, the transparent pixel electrode still has opaque metal. Further, the photolithographic process uses a mask for the halftone exposure, and components of the thin film semiconductor layer are separated, and the transparent pixel electrode is exposed completely. The third photolithographic process of the general exposure method connects the completely exposed transparent pixel electrode directly with the drain electrode and electrically connects the transparent pixel electrode to the thin film transistor component.

Japanese Patent Laid-Open Publication No. 2003-057673 (published on Feb. 26, 2003) uses two layers: a transparent electroconductive film layer and a metal or alloy layer and adopts the halftone exposure method to carry out the first photolithographic process and form a gate electrode, a common electrode, a transparent common electrode for driving liquid crystals or a comb common electrode for driving liquid crystals of a horizontal electric field LCD apparatus Japanese Patent Laid-Open Publication No. 2004-038130 (published on Feb. 5, 2004) adopts the halftone exposure method and the first photolithographic process to separate the components of the thin film semiconductor layer to form a contact hole of a terminal and a contact hole for forming an electrostatic protection circuit. Japanese Patent Laid-Open Publication No. 2002-107762 and Japanese Patent Laid-Open Publication No. 2002-141512 similarly adopt the halftone exposure method to separate the components of the thin film semiconductor layer and expose the terminal. Since the manufacturing process is provided for manufacturing a horizontal electric field LCD apparatus, therefore the opening on the pixel region is not formed completely. In the third photolithographic process, the liquid crystal driving wedge-shaped pixel electrode forms a source electrode and a drain electrode by adopting the general exposure method.

Japanese Patent Laid-Open Publication No. 2004-281687 relates to the manufacture of a positive-diversity TFT substrate, and adopts the halftone exposure method to carry out the photolithographic process for one time, and forms a source electrode and a drain electrode and separates the components of the thin film semiconductor layer.

Japanese Patent Laid-Open Publication No. 2004-319655 adopts a manufacturing process similar to that of Japanese Patent Laid-Open Publication No. 2002-141512, and uses two layers: a transparent electroconductive film layer and a metal layer and adopts the general exposure method to carry out the first photolithographic process and form a gate electrode and a pixel electrode, and then adopts the halftone exposure method to carry out the second photolithographic process, and separate the components of the thin film semiconductor layer and completely expose the transparent pixel electrode. Further, the general exposure method adopted in the third photolithographic process directly connects the completely exposed transparent pixel electrode and drain electrode.

In Japanese Patent Laid-Open Publication No. 2000-066240, Japanese Patent Laid-Open Publication No. 2001-311965 and Japanese Patent Laid-Open Publication No. 2002-107762, a combination of a halftone exposure method and a mask deposition P-CVD method is adopted to reduce the number of times of the photolithographic process.

Japanese Patent Laid-Open Publication No. H-07-230097 (published on Aug. 29, 1995), Japanese Patent Laid-Open Publication No. H-11-109393 (published on Apr. 23, 1999) and Japanese Patent Laid-Open Publication No. 2001-042347 (published on Feb. 16, 2001) disclosed a mechanism for controlling the alignment direction of liquid crystal molecules and the alignment control electrode in a MVA mode LCD apparatus. In Japanese Patent Laid-Open Publication No. H-07-230097, an alignment control electrode is split from a gate electrode, and extended in a direction of 45 degrees with respect to the gate electrode. The electric potential of the alignment control electrode is set to be the same as the electric potential of the gate electrode. The alignment control electrode and the pixel electrode are in direct contact with the vertical alignment film. The alignment control electrode and the gate electrode are made of the same material and formed at the same time of forming the gate electrode. A gate insulating film and a thin film semiconductor layer exist in the same pattern of the alignment control electrode and at a lower layer of the alignment control electrode.

In a second preferred embodiment of Japanese Patent Laid-Open Publication No. H-11-109393, a TFT has a positive diversity structure and comprises a pixel electrode (ITO layer), a source electrode, a drain electrode (chromium layer), an amorphous silicon thin film semiconductor layer, a silicon nitride insulating layer and a gate electrode (chromium layer) stacked on a lateral side of a substrate. From the structure, the alignment control electrode and the gate electrode as illustrated in FIG. 2 of Japanese Patent Laid-Open Publication No. H-11-109393 are formed on the same layer. The alignment control electrode and the gate electrode are independent with each other and set to an electric potential different from that of the corresponding electrode. Although the vertical alignment film is in direct contact with the alignment control electrode, the vertical alignment film is not in direct contact with the pixel electrode, because the pixel electrode is completely coated with the gate insulating film (or silicon nitride insulating layer).

In Japanese Patent Laid-Open Publication No. 2001-042347, a TFT has a counter diversity structure and comprises a gate insulating film disposed at a lower layer of the transparent pixel electrode (ITO film), a protruding insulator formed at an upper layer of the transparent pixel electrode, and an alignment control electrode formed on the protruding insulator. The structure is produced by performing six times of the masking procedure. The voltage applied to the alignment control electrode is the same as the voltage applied to the common electrode. The vertical alignment film is in direct contact with both alignment control electrode and transparent pixel electrode.

After aluminum alloy is used to form the gate electrode, source electrode and drain electrode, a contact hole is created, and the transparent electrode (or an oxide transparent conductor of an ITO film) is connected, an aluminum oxide layer is formed at a joint interface on the aluminum oxide layer, and thus causing a problem of increasing the electric resistance with time. In Japanese Patent Laid-Open Publication No. 2001-174848, mixed nitrified gas and argon gas are reacted and sputtered to form a doped nitrogen-containing aluminum alloy layer on the surface of the aluminum alloy during the final stage of the sputtering and film formation of the aluminum alloy. With this manufacturing process, the problem of connecting aluminum alloy with the oxide transparent conductor can be solved.

For large substrates, the color filter substrate manufacturing method is used to form a spacer for a cell gap by means of a photolithographic process that uses a mask. To achieve a high-contrast figure, any optical leak occurred at the surrounding of the ball spacer should be prevented completely, since the ball spacers used in the TN mode are distributed randomly. The photolithographic process for precisely controlling the positions of forming the spacers can be used to form spacers in the region of BM (light-shielding film).

When the BM (light-shielding film) or three R, G, B color filter layers of the color filter substrate are formed, a slit coater is used for coating a special-purpose negative photoresist onto the substrate, and the photolithographic process using a mask forms each pattern. For super large substrates of an LCD TV panel and BM, R, G, B patterns are formed by the mask of the photolithographic process, and MVA mode color filter substrate is formed on the transparent electroconductive film (or ITO film), and the photolithographic process forms slender protruding lumps for controlling the alignment direction of liquid crystal molecules. When spacers are used for forming the cell gaps, the photolithographic process is carried out for six times for the color filter substrate of the MVA mode LCD panel, and corresponding masks are required.

SUMMARY OF THE INVENTION

In view of the shortcomings of the prior art, the inventor of the present invention based on years of experience in the related industry to conduct researches and experiments, and finally invented a method of manufacturing an active matrix substrate for liquid crystal display by using a halftone exposure method in accordance with the present invention to overcome the foregoing shortcomings.

Two layers: an oxide transparent electroconductive film and a metal film are used for forming a gate electrode and a transparent pixel electrode by the aforementioned halftone exposure method. Firstly, oxygen and argon gases are used in a reaction or a sputtering for forming an oxide transparent electroconductive film. Sintered powder particles of oxides such as ITO and IZO are used, since the insulating oxide formed at a target surface or an attachment-proof board surface may have abnormal electric discharges. If the gate electrode so produced has abnormal electric discharges, the particles at the substrate surface will be melted by overburning, and the particles are washed away during the washing and cleaning process. Therefore, short circuit may occur at the intersection of the gate electrode and source electrode (or video signal electrode) easily, and thus the yield rate will be reduced significantly.

Further, the photolithography is carried out to wet etch the two layers of oxide transparent electroconductive film (ITO, IZO) and metal film during the manufacturing process. If the metal film is made of aluminum alloy, and the oxide transparent electroconductive film has a local cell reaction, the oxide transparent electroconductive film is reduced and blackened, and an abnormal etching is resulted. Such reaction cannot be avoided in the manufacture that adopts the wet etching method, but the manufacture that adopts a dry etching method takes a relatively long manufacturing time, and causes corrosions when exposed in the atmosphere. The foregoing metal film can be a high melting-point metal such as molybdenum, chromium, or molybdenum tantalum (MoTa). Molybdenum, chromium, or molybdenum tantalum film has high electric resistance, and thus these films cannot be used for producing a large LCD TV of over 30 inches.

Even if two films: an oxide transparent electroconductive film (ITO, IZO) and a metal film such as molybdenum or chromium film are used as disclosed in Japanese Patent Laid-Open Publication No. 2002-107762, Japanese Patent Laid-Open Publication No. 2002-141512 or Japanese Patent Laid-Open Publication No. 2004-319655, and the pixel electrode (ITO, IZO) are exposed completely, and the source electrode and the drain electrode are made of aluminum alloy, a local cell reaction will occur between the aluminum alloy and the transparent pixel electrode, and thus the pattern process cannot be performed for the aluminum alloy. Even if the electrodes are not made of a single-layer aluminum alloy, but the aluminum alloy film is formed on a barrier metal layer of molybdenum or chromium, the local cell reaction will occur during image development since the barrier metal layer has pin holes, and thus the occurrence of abnormal etching cannot be controlled completely.

Japanese Patent Laid-Open Publication No. 2003-057673 uses two layers of nitride transparent electroconductive film and metal film, and adopts the halftone exposure method to form a gate electrode and a transparent common electrode. Even if the metal film of the structure is made of aluminum alloy, no local cell reaction will occur. However, the two-layer structure cannot use the manufacturing processes as disclosed in Japanese Patent Laid-Open Publication No. 2002-107762, Japanese Patent Laid-Open Publication No. 2002-141512 or Japanese Patent Laid-Open Publication No. 2004-319655 to form the pixel electrode. Therefore, when the nitride transparent electroconductive film is used as a pixel electrode, the film must be very thin with a thickness of 10~15 nm (100~150 Å), and the selection ratio for dry etching the silicon nitride film (P—SiNx) and the nitride transparent electroconductive film (TiNx or ZrNx) used as the gate insulating films is not very large. If fluorine-series gases are used for dry etching the silicon nitride film on the nitride transparent electroconductive film, we cannot just keep the nitride transparent electroconductive film only.

In Japanese Patent Laid-Open Publication No. 2003-057673, two layers of nitride transparent electroconductive film and aluminum alloy film are used to suppress the local cell reaction successfully, but the aluminum alloy film uses the silicon nitride film (P—SiNx) as a gate insulating film. When the contact hole at the gate terminals are made, fluorine gases are used. To remove the fluoride formed on the positive photoresist surface before the positive photoresist is separated, oxygen plasma is used for carrying out an ashing process. By then, aluminum oxide is formed on the surface of the aluminum alloy. Particularly, if the halftone exposure method as disclosed in Japanese Patent Laid-Open Publication No. 2002-107762, Japanese Patent Laid-Open Publication No. 2002-141512, Japanese Patent Laid-Open Publication No. 2004-038130, or Japanese Patent Laid-Open Publication No. 2004-319655 is adopted, it is necessary to use oxygen plasma to remove the positive photoresist at the regions where the thickness of the photoresist film of the halftone exposure becomes thinner, and thus the surface made of aluminum alloy is exposed in the oxygen plasma for a long time, and aluminum oxide will be formed on the surface eventually. As a result, it is unable to avoid the increase of electric resistance at the contact hole region of the gate electrode terminal.

Japanese Patent Laid-Open Publication No. 2001-174848 discloses a method of preventing aluminum oxide from being formed by an oxygen plasma process or a thermal diffusion of oxygen atoms by doping nitrogen atoms on the surface of the aluminum alloy, and such manufacturing process has been already used in practical applications and mass productions. In this manufacturing process, the wet etching ratio of the aluminum alloy doped at the region having nitrogen atoms is smaller than that of the aluminum alloy, and the problem of having an etched pattern in an inverted conical shape arises easily.

If the gate electrode is in an inverted conical shape, the source electrode (video signal electrode) and the drain electrode will be short-circuited, and the gate insulating film will not be coated completely. The gate electrode and the source electrode or the drain electrode will become short-circuited easily to produce poor or defective display including a line defect or a dot defect.

If the absolute size of the BM pattern of the color filter does not match with the absolute size of the pattern of the TFT substrate, it is necessary to redesign the dimensions of the BM pattern to fit the actual size of the manufactured TFT substrate. If a proximity exposure method is adopted, the mask will be reworked, and the rework usually takes 2~3 months, and the cost will be over a million US dollars. Such cost for the rework is definitely not neglectible. Furthermore, the MVA mode may need to rework six types of masks (BM, R, G, B, alignment controlled protruding lump and photo spacer) for the worst scenario. The biggest problem resides in the very long delivery time for reworking the masks, and thus manufacturers have to shut down the production during the rework.

Even if the dimensions of the TFT substrate and the CF substrate are matched, the fluctuation error of the quantity of the liquid crystal in the manufacturing process of large liquid crystal cells and the fluctuation error of the height of spacer adopted in the photolithographic process are large, it is unable to suppress the occurrence of the remained bubbles and unevenness caused by gravity. To expedite the response of the liquid crystal molecules, the liquid crystal cell gap must be maintained below 3 microns, and the fluctuation of the height of the spacer is over 10%. As the height of the spacer becomes small, it is unable to avoid a decrease of the absolute value of the flexible deformation of the spacer. Therefore, the number of remained bubbles and the level of uneven gravity will be increased as the cell gap becomes smaller.

The pixel electrode (ITO, IZO) is exposed as disclosed in Japanese Patent Laid-Open Publication No. 2002-107762, Japanese Patent Laid-Open Publication No. 2002-141512 or Japanese Patent Laid-Open Publication No. 2004-319655, so that when the conducting micro-particles are mixed in the cells, the occurrence of short circuits at the top and bottom surfaces of the transparent electroconductive film at a lateral side of the CF substrate and the pixel electrode (ITO, IZO) at a lateral side of the TFT substrate is inevitable. As the liquid crystal cell gap decreases, the probability of the upper and lower surface having a short circuit caused by electric impurities tends to increase accordingly.

Compared with the IPS or FFS mode horizontal electric field method, a polyidmide alignment film may sink easily to produce many pinholes in the manufacturing process of coating the alignment film in the MVA mode vertical alignment method. Since a plate offset printing method adopts a soft rubber plate and consumes a large quantity of polyidmide solution, the operation cost is very high. Furthermore, a large quantity of toxic organic solvents is used, and thus creating a big problem of air pollution to the clean room operation as the substrate becomes larger.

The use of expensive polyidmide is stopped in the cell assembling and manufacturing process of an LCD panel, and a plasma CVD method and a sputtering method are adopted to form a diamond-like carbon film (DLC film). However, the DLC film is formed on the entire surface of the substrate, and thus the bonding force of a main seal becomes weak, and the seal may peel off easily, and a poor joint between the TAB and the COF may occur.

For a mask used for manufacturing a large LCD panel over 40 inches, the mask of over 1 meter is required to prevent a possible crooked mask caused by gravitation, and the thickness of the substrate of the mask must be over 1 cm, and thus incurring a very high cost. If a divided exposure method is adopted, the required mask can be smaller, but the throughput becomes small, and the production efficiency becomes low. For the manufacture of a large halftone mask, the manufacturing process of the mask is very complicated, and the yield rate is poor, and thus the cost of a halftone mask is very high and not suitable for mass productions. Even if a large LCD panel is produced by the manufacturing method of a notebook LCD panel or a PC screen LCD panel, the manufacturing time and cost for producing a large LCD TV panel cannot be lowered effectively.

Therefore, it is a primary objective of the present invention to decrease the number of times of the photolithographic process for the TFT active matrix substrate and color filter substrate during the manufacture of a TFT active matrix LCD apparatus, and simplify the manufacturing process to lower the manufacturing cost and improve the yield rate.

The measures taken for the present invention to solve the foregoing problems are described as follows:

In Measure 1, four times of the photolithographic process are performed for manufacturing an active matrix substrate of an TN mode, a MVA mode or an IPS mode LCD apparatus as follows:

A first halftone exposure method adopts a halftone mask for forming contact pads in a gate electrode, a pixel electrode, and a common electrode in the pixel electrode.

A second halftone exposure method adopts a halftone mask to form a component separation and a contact hole of a thin film semiconductor layer.

A general exposure method adopts a general mask to form a source electrode, a drain electrode and a holdup capacitor electrode.

A general exposure method adopts a general mask to form contact holes of a gate electrode terminal, a source electrode terminal and a common electrode terminal.

In Measure 2, four times of the photolithographic process are performed for manufacturing an active matrix substrate of a MVA mode LCD apparatus as follows:

A first halftone exposure method adopts a halftone mask to form contact pads in a gate electrode, a pixel electrode, and a common electrode in the pixel electrode.

A second halftone exposure method adopts a halftone mask to form a component separation and a contact hole of a thin film semiconductor layer.

A general exposure method adopts a general mask to form a source electrode, a drain electrode and an alignment control electrode.

A general exposure method adopts a general mask to form contact holes of a gate electrode terminal, a source electrode terminal and a common electrode terminal.

In Measure 3, four times of the photolithographic process are performed for manufacturing an active matrix substrate of a FFS mode LCD apparatus as follows:

A first halftone exposure method adopts a halftone mask to form a contact pad in a gate electrode, a pixel electrode, and a common electrode in the pixel electrode.

A second halftone exposure method adopts a halftone mask to form a component separation and a contact hole of a thin film semiconductor layer.

A general exposure method adopts a general mask to form a source electrode, a drain electrode and a comb common electrode.

A general exposure method adopts a general mask to form contact holes of a gate electrode terminal, a source electrode terminal and a common electrode terminal.

In Measure 4, three times of the photolithographic process are performed for manufacturing an active matrix substrate of a TN mode, a MVA mode or an IPS LCD apparatus as follows:

A first halftone exposure method adopts a halftone mask to form contact pads in a gate electrode, a pixel electrode, and a common electrode in the pixel electrode.

A second halftone exposure method adopts a halftone mask to form a component separation and a contact hole of a thin film semiconductor layer.

A general exposure method adopts a general mask to form a source electrode, a drain electrode and a holdup capacitor electrode.

After an ohmic contact layer of a channel of a thin film transistor component is dry etched, a mask deposition method and a P-CVD device are used to form a silicon nitride passivation layer on a display pixel region instead of forming a film on each of the gate electrode terminal, the source electrode terminal and the common electrode terminal.

In Measure 5, three times of the photolithographic process are performed for manufacturing an active matrix substrate of a MVA mode LCD apparatus as follows:

A first halftone exposure method adopts a halftone mask to form contact pads in a gate electrode, a pixel electrode, and a common electrode in the pixel electrode.

A second halftone exposure method adopts a halftone mask to form a component separation and a contact hole of a thin film semiconductor layer.

A general exposure method adopts a general mask to form a source electrode, a drain electrode and an alignment control electrode.

After an ohmic contact layer of a channel of a thin film transistor component is dry etched, a mask deposition method and a P-CVD device are used to form a silicon nitride passivation layer on a display pixel region instead of forming a film on each of the gate electrode terminal, the source electrode terminal and the common electrode terminal.

In Measure 6, three times of the photolithographic process are performed for manufacturing an active matrix substrate of a FFS mode LCD apparatus as follows:

A first halftone exposure method adopts a halftone mask to form contact pads in a gate electrode, a pixel electrode, and a common electrode in the pixel electrode.

A second halftone exposure method adopts a halftone mask to form a component separation and a contact hole of a thin film semiconductor layer.

A general exposure method adopts a general mask to form a source electrode, a drain electrode and a comb common electrode.

After an ohmic contact layer of a channel of a thin film transistor component is dry etched, a mask deposition method and a P-CVD device are used to form a silicon nitride passivation layer on a display pixel region instead of forming a film on each of the gate electrode terminal, the source electrode terminal and the common electrode terminal.

In Measure 7, the halftone double exposure method is used for 2 times and the photolithographic process is used for 4 times for manufacturing an active matrix substrate of a TN mode, a MVA mode or an IPS mode LCD apparatus as follows:

Firstly, pulsed laser is adopted to form an absolute standard alignment mark in a glass substrate.

Two different types of general masks are adopted to carry out a first photolithographic process by a bottom-side halftone double exposure method. Firstly, the general mask is used for aligning the absolute standard alignment mark, and the contact pads in a gate electrode, a common electrode and a pixel electrode are gone through a bottom-side semi exposure. Further, another type of general mask is used for aligning the absolute standard alignment mark, and carrying out a general exposure for the pixel electrode, the gate electrode and the common electrode. With the aforementioned multiple exposures, the gate electrode, the pixel electrode, the common electrode and the contact pad in the pixel electrode are formed.

Two different types of general masks are used for the halftone double exposure method by a bottom-side exposure to carry out a second photolithographic process. Firstly, the general mask is used for performing a bottom-side exposure for the thin film semiconductor component. Further, another different general mask is used to perform a general exposure to the contact hole. By the aforementioned multiple exposure, the component separation and contact hole of a thin film semiconductor layer are formed.

A general exposure method adopting a general mask is used to form a source electrode, a drain electrode and a holdup capacitor electrode.

A general exposure method adopting a general mask is used to form contact holes of a gate electrode terminal, a source electrode terminal and a common electrode terminal.

In Measure 8, the halftone double exposure method is used for 2 times and the photolithographic process is used for 4 times for manufacturing an active matrix substrate of a MVA mode LCD apparatus as follows:

Firstly, pulsed laser is adopted to form an absolute standard alignment mark in a glass substrate.

Two different types of general masks are adopted to carry out a first photolithographic process by a bottom-side exposure halftone double exposure method. Firstly, the general mask is used for aligning the absolute standard alignment mark, and the contact pads in a gate electrode, a common electrode and a pixel electrode are gone through a bottom-side semi exposure. Further, another type of general mask is used for aligning the absolute standard alignment mark and carrying out a general exposure for the pixel electrode, the gate electrode and the common electrode. With the aforementioned multiple exposures, the gate electrode, the pixel electrode, the common electrode and the contact pad in pixel electrode are formed.

Two different types of general masks are used for the halftone double exposure method by a bottom-side exposure to carry out a second photolithographic process. Firstly, the general mask is used for performing a bottom-side exposure for the thin film semiconductor component. Further, another different general mask is used to perform a general exposure to the contact hole. With the aforementioned multiple exposure, the component separation and the contact hole of a thin film semiconductor layer are formed. A general exposure method adopting a general mask is used to form a source electrode, a drain electrode and an alignment control electrode.

A general exposure method adopting a general mask is used to form contact holes of a gate electrode terminal, a source electrode terminal and a common electrode terminal.

In Measure 9, the halftone double exposure method is used for 2 times and the photolithographic process is used for 4 times for manufacturing an active matrix substrate of a FFS mode LCD apparatus as follows:

Firstly, pulsed laser is adopted to form an absolute standard alignment mark in a glass substrate.

Two different types of general masks are adopted to carry out a first photolithographic process by a bottom-side exposure halftone double exposure method. Firstly, the general mask is used for aligning the absolute standard alignment mark, and the contact pads in a gate electrode, a common electrode and a pixel electrode are gone through a bottom-side semi exposure. Further, another type of general mask is used for aligning the absolute standard alignment mark and carrying out a general exposure for the pixel electrode, the gate electrode and the common electrode. With the aforementioned multiple exposures, the gate electrode, the pixel electrode, the common electrode and the contact pad in the pixel electrode are formed.

Two different types of general masks are used for the halftone double exposure method by a bottom-side exposure to carry out a second photolithographic process. Firstly, the general mask is used for performing a bottom-side exposure for the thin film semiconductor component. Further, another different general mask is used to perform a general exposure to the contact hole. With the aforementioned multiple exposure, the component separation and the contact hole of a thin film semiconductor layer are formed.

A general exposure method adopting a general mask is used to form a source electrode, a drain electrode and a comb common electrode.

A general exposure method adopting a general mask is used to form contact holes of a gate electrode terminal, a source electrode terminal and a common electrode terminal.

In Measure 10, the halftone double exposure method is used for 2 times and three times of the photolithographic process are performed for manufacturing an active matrix substrate of a TN mode, a MVA mode or an IPS mode LCD apparatus as follows:

Firstly, pulsed laser is adopted to form an absolute standard alignment mark in a glass substrate.

Two different types of general masks are adopted to carry out a first photolithographic process by a bottom-side exposure halftone double exposure method. Firstly, the general mask is used for aligning the absolute standard alignment mark, and the contact pads in a gate electrode, a common electrode and a pixel electrode are gone through a bottom-side semi exposure. Further, another type of general mask is used for aligning the absolute standard alignment mark and carrying out a general exposure for the pixel electrode, the gate electrode and the common electrode. With the aforementioned multiple exposures, the gate electrode, the pixel electrode, the common electrode and the contact pad in the pixel electrode are formed.

Two different types of general masks are used for the halftone double exposure method by a bottom-side exposure to carry out a second photolithographic process. Firstly, the general mask is used for performing a bottom-side exposure for the thin film semiconductor component. Further, another different general mask is used to perform a general exposure to the contact hole. With the aforementioned multiple exposure, the component separation and the contact hole of a thin film semiconductor layer are formed.

A general exposure method adopting a general mask is used to form a source electrode, a drain electrode and a holdup capacitor electrode.

After an ohmic contact layer of a channel of a thin film transistor component is dry etched, a mask deposition method and a P-CVD device are used to form a silicon nitride passivation layer on a display pixel region instead of forming a film on each of the gate electrode terminal, the source electrode terminal and the common electrode terminal.

In Measure 11, the halftone double exposure method is used for 2 times and three times of the photolithographic process are performed for manufacturing an active matrix substrate of a MVA mode LCD apparatus as follows:

Firstly, pulsed laser is adopted to form an absolute standard alignment mark in a glass substrate.

Two different types of general masks are adopted to carry out a first photolithographic process by a bottom-side exposure halftone double exposure method. Firstly, the general mask is used for aligning the absolute standard alignment mark, and the contact pads in a gate electrode, a common electrode and a pixel electrode are gone through a bottom-side semi exposure. Further, another type of general mask is used for aligning the absolute standard alignment mark and carrying out a general exposure for the pixel electrode, the gate electrode and the common electrode. With the aforementioned multiple exposures, the gate electrode, the pixel electrode, the common electrode and the contact pad in the pixel electrode are formed.

Two different types of general masks are used for the halftone double exposure method by a bottom-side exposure to carry out a second photolithographic process. Firstly, the general mask is used for performing a bottom-side exposure for the thin film semiconductor component. Further, another different general mask is used to perform a general exposure to the contact hole. With the aforementioned multiple exposure, the component separation and the contact hole of a thin film semiconductor layer are formed.

A general exposure method adopting a general mask is used to form a source electrode, a drain electrode and an alignment control electrode.

After an ohmic contact layer of a channel of a thin film transistor component is dry etched, a mask deposition method and a P-CVD device are used to form a silicon nitride passivation layer on a display pixel region instead of forming a film on each of the gate electrode terminal, the source electrode terminal and the common electrode terminal.

In Measure 12, the halftone double exposure method is used for 2 times and three times of the photolithographic process are performed for manufacturing an active matrix substrate of a FFS mode LCD apparatus as follows:

Firstly, pulsed laser is adopted to form an absolute standard alignment mark in a glass substrate.

Two different types of general masks are adopted to carry out a first photolithographic process by a bottom-side exposure halftone double exposure method. Firstly, the general mask is used for aligning the absolute standard alignment mark, and the contact pads in a gate electrode, a common electrode and a pixel electrode are gone through a bottom-side semi exposure. Further, another type of general mask is used for aligning the absolute standard alignment mark and carrying out a general exposure for the pixel electrode, the gate electrode and the common electrode. With the aforementioned multiple exposures, the gate electrode, the pixel electrode, the common electrode and the contact pad in the pixel electrode are formed.

Two different types of general masks are used for the halftone double exposure method by a bottom-side exposure to carry out a second photolithographic process. Firstly, the general mask is used for performing a bottom-side exposure for the thin film semiconductor component. Further, another different general mask is used to perform a general exposure to the contact hole. With the aforementioned multiple exposure, the component separation and the contact hole of a thin film semiconductor layer are formed.

A general exposure method adopting a general mask is used to form a source electrode, a drain electrode and a comb common electrode.

After an ohmic contact layer of a channel of a thin film transistor component is dry etched, a mask deposition method and a P-CVD device are used to form a silicon nitride passivation layer on a display pixel region instead of forming a film on each of the gate electrode terminal, the source electrode terminal and the common electrode terminal.

In Measure 13, the DMD halftone non-masking exposure method adopting a DMD direct writing exposure device is used for 2 times and the photolithographic process is used for 4 times for manufacturing an active matrix substrate of a TN mode or a MVA mode LCD apparatus as follows:

A first DMD halftone non-masking exposure method adopting a DMD direct writing exposure device is used to form a gate electrode, a pixel electrode, a common electrode and a contact pad in the pixel electrode.

A second DMD halftone non-masking exposure method adopting a DMD direct writing exposure device is used to form a component separation and a contact hole of a thin film semiconductor layer.

A general exposure method adopting a general mask, or a general DMD non-masking exposure method adopting a DMD direct writing exposure device is used to form a source electrode, a drain electrode and a holdup capacitor electrode.

A general exposure method adopting a general mask, or a general DMD non-masking exposure method adopting a DMD direct writing exposure device is used to form contact holes of a gate electrode terminal, a source electrode terminal and a common electrode terminal.

In Measure 14, the DMD halftone non-masking exposure method adopting a DMD direct writing exposure device is used for 2 times and the photolithographic process is used for 4 times for manufacturing an active matrix substrate of a MVA mode LCD apparatus as follows:

A first DMD halftone non-masking exposure method adopting a DMD direct writing exposure device is used to form a gate electrode, a pixel electrode, a common electrode and a contact pad in the pixel electrode.

A second DMD halftone non-masking exposure method adopting a DMD direct writing exposure device is used to form a component separation and a contact hole of a thin film semiconductor layer.

A general exposure method adopting a general mask, or a general DMD non-masking exposure method adopting a DMD direct writing exposure device is used to form a source electrode, a drain electrode and an alignment control electrode.

A general exposure method adopting a general mask, or a general DMD non-masking exposure method adopting a DMD direct writing exposure device is used to form contact holes of a gate electrode terminal, a source electrode terminal and a common electrode terminal.

In Measure 15, the DMD halftone non-masking exposure method adopting a DMD direct writing exposure device is used for 2 times and three times of the photolithographic process are performed for manufacturing an active matrix substrate of a TN mode or a MVA mode LCD apparatus as follows:

A first DMD halftone non-masking exposure method adopting a DMD direct writing exposure device is used to form a gate electrode, a pixel electrode, a common electrode and a contact pad in the pixel electrode.

A second DMD halftone non-masking exposure method adopting a DMD direct writing exposure device is used to form a component separation and a contact hole of a thin film semiconductor layer.

A general exposure method adopting a general mask, or a general DMD non-masking exposure method adopting a DMD direct writing exposure device is used to form a source electrode, a drain electrode and an alignment control electrode.

After an ohmic contact layer of a channel of a thin film transistor component is dry etched, a mask deposition method and a P-CVD device are used to form a silicon nitride passivation layer on a display pixel region instead of forming a film on each of the gate electrode terminal, the source electrode terminal and the common electrode terminal.

In Measure 16, the DMD halftone non-masking exposure method adopting a DMD direct writing exposure device is used for 2 times and the photolithographic process are performed for 3 times for manufacturing an active matrix substrate of a MVA mode LCD apparatus as follows:

A first DMD halftone non-masking exposure method adopting a DMD direct writing exposure device is used to form a gate electrode, a pixel electrode, a common electrode and a contact pad in the pixel electrode.

A second DMD halftone non-masking exposure method adopting a DMD direct writing exposure device is used to form a component separation and a contact hole of a thin film semiconductor layer.

A general exposure method adopting a general mask, or a general DMD non-masking exposure method adopting a DMD direct writing exposure device is used to form a source electrode, a drain electrode and a holdup capacitor electrode.

After an ohmic contact layer of a channel of a thin film transistor component is dry etched, a mask deposition method and a P-CVD device are used to form a silicon nitride passivation layer on a display pixel region instead of forming a film on the gate electrode terminal, source electrode terminal and common electrode.

In Measure 17, a manufacturing method similar to those of Measures 1 to 16 adopts the following method in a first photolithographic process:

A film with a thickness of 5~25 nm is formed on a glass substrate, which is a metal silicide compound film made of titanium, zirconium, titanium and zirconium alloy or titanium and zirconium as a first metal layer (or a lower layer), and a vacuum condition is maintained to form a second metal layer (or an upper layer) made of molybdenum, aluminum alloy, pure copper, copper alloy, pure silver or silver alloy film. After a positive photoresist is coated, the halftone exposure method adopting a halftone mask (which is made by adjusting the exposure), or a halftone double exposure method adopting two types of general masks is used to perform a multiple exposure for two times of bottom side semi-exposure and general exposure, or a halftone non-masking exposure method adopting a DMD direct writing exposure component for the exposure and displaying images, and the thickness of the positive photoresist of the contact pad portions corresponding to the gate electrode portion, the common electrode portion and the pixel electrode section is adjusted and maximized, and thus the thickness of the positive photoresist corresponding to the pixel region other than the contact pad portion and a divided portion of the common electrode becomes thinner.

After the second metal layer (or upper layer) and the first layer (or lower layer) metal without reserving the positive photoresist region are removed, an oxygen plasma process or an ozone gas process is conducted to decompose and remove the thin positive photoresist at the reserved region of the positive photoresist. Only the exposed second metal layer (or upper layer) is selectively etched and removed, so that the first layer (or lower layer) metal is exposed. After the positive photoresist at the reserved region with a maximum thickness is peeled off, nitrogen ions are irradiated at an acceleration energy of 1~20 KeV onto the entire surface of the substrate to prevent surface oxidation of the contact pads on the surfaces of the gate electrode and the common electrode and in the pixel electrode. In the meantime, the thin film layer of a metal silicide compound made of titanium, zirconium, titanium and zirconium alloy, or titanium and zirconium at the first layer (or lower layer) metal of the exposed pixel electrode section is changed into a metal nitride such as titanium nitride or zirconium nitride to improve the transmission rate of visible light.

In Measure 18, a manufacturing method similar to those of Measures 1 to 16 adopts the following method in a first photolithographic process:

A film with a thickness of 5~25 nm is formed on a glass substrate, which is a metal silicide compound film made of titanium, zirconium, titanium and zirconium alloy or titanium and zirconium or an oxygen nitride film as a first layer (or a lower layer) of a transparent conductor, and a vacuum condition is maintained to form a second metal layer (or an upper layer) made of molybdenum, aluminum alloy, pure copper, copper alloy, pure silver or silver alloy film. After a positive photoresist is coated, a halftone exposure method adopting a halftone mask (which is made by adjusting the exposure), or a halftone double exposure method adopting two types of general masks to perform a multiple exposure for two times of a bottom side semi-exposure and general exposure, or a halftone non-masking exposure method adopting a DMD direct writing exposure component for the exposure and displaying images, the thickness of the positive photoresist of the contact pad portions corresponding to the gate electrode portion, the common electrode portion and the pixel electrode portion is adjusted and maximized, and thus the thickness of the positive photoresist corresponding to the pixel region other than the contact pad portion and a divided portion of the common electrode becomes thinner.

After the second metal layer (or upper layer) and the first layer (or lower layer) transparent conductor without reserving the positive photoresist region are removed, an oxygen plasma process or an ozone gas process is conducted to decompose and remove the thin positive photoresist at the reserved region of the positive photoresist. Only the exposed second metal layer (or upper layer) is selectively etched and removed, such that the first layer (or lower layer) transparent conductor is exposed. After the positive photoresist at the reserved region with the maximum thickness is peeled off, nitrogen ions are irradiated at an acceleration energy in the range of 0.5~10 KeV onto the entire surface of the substrate to prevent a surface oxidation of the contact pads on the surfaces of the gate electrode and the common electrode and in the pixel electrode.

In Measure 19, a manufacturing method similar to those of Measures 1 to 16 adopts the following method in a first photolithographic process:

A metal oxide is formed on a glass substrate, which is an ITO or IZO film serving as a first layer (or a lower layer) of a transparent conductor, and then splluttered, oxidized and reduced to form a film made of an aluminum alloy containing nickel, cobalt or iron and having an electric potential smaller than that of ITO and IZO, molybdenum, chromium, silver alloy, copper alloy or within a range of 0.5~7.0 atom % as a second metal layer (or an upper layer).

After a positive photoresist is coated, a halftone exposure method adopting a halftone mask (which is made by adjusting the exposure), or a halftone double exposure method adopting two types of general masks to perform a multiple exposure for two times of a bottom side semi-exposure and general exposure, or a halftone non-masking exposure method adopting a DMD direct writing exposure component for the exposure and displaying images, the thickness of the positive photoresist of the contact pad portions corresponding to the gate electrode portion, the common electrode portion and the pixel electrode portion is adjusted and maximized, and thus the thickness of the positive photoresist corresponding to the pixel region other than the contact pad portion and a divided portion of the common electrode becomes thinner.

After the second metal layer (or upper layer) and the first layer (or lower layer) transparent conductor without reserving the positive photoresist region are removed, an oxygen plasma process or an ozone gas process is conducted to decompose and remove the thin positive photoresist at the reserved region of the positive photoresist. Only the exposed second metal layer (or upper layer) is selectively etched and removed, such that the first layer (or lower layer) transparent conductor is exposed. After the positive photoresist at the reserved region with the maximum thickness is peeled off, nitrogen ions are irradiated at an acceleration energy in the range of 0.5~10 KeV onto the entire surface of the substrate to prevent a surface oxidation of the contact pads on the surfaces of the gate electrode and the common electrode and in the pixel electrode.

In Measure 20, a manufacturing method similar to those of Measures 1 to 16 adopts the following method in a first photolithographic process:

A film with a thickness of 5~25 nm is formed on a glass substrate, which is a metal silicide compound film made of titanium, zirconium, titanium and zirconium alloy or titanium and zirconium as a first metal layer (or a lower layer), and a vacuum condition is maintained to form a second metal layer (or an upper layer) made of molybdenum, aluminum alloy, pure copper, copper alloy, pure silver or silver alloy film. After a positive photoresist is coated, a halftone exposure method adopting a halftone mask (which is made by adjusting the exposure), or a halftone double exposure method adopting two types of general masks to perform a multiple exposure for two times of a bottom side semi-exposure and general exposure, or a halftone non-masking exposure method adopting a DMD direct writing exposure component for the exposure and displaying images, the thickness of the positive photoresist of the contact pad portions corresponding to the gate electrode portion, the common electrode portion and the pixel electrode portion is adjusted and maximized, and thus the thickness of the positive photoresist corresponding to the pixel region other than the contact pad portion and a divided portion of the common electrode becomes thinner.

After the second metal layer (or upper layer) of the transparent conductor without reserving the positive photoresist region is removed, an oxygen plasma process or an ozone gas process is conducted to decompose and remove the thin positive photoresist at the reserved region of the positive photoresist, and the patterned and exposed second metal layer (or upper layer) is used as a mask for selectively etching and removing the first metal layer (or lower layer). Further, only the second metal layer (or upper layer) is selectively etched and exposed, such that after the first layer (or lower layer) metal is exposed, the remained positive photoresist is peeled off. Further, nitrogen ions are irradiated at an acceleration energy in the range of 1~20 KeV onto the entire surface of the substrate to prevent a surface oxidation of the contact pads on the surfaces of the gate electrode and the common electrode and in the pixel electrode. In the meantime, the thin film layer of a metal silicide compound made of titanium, zirconium, titanium and zirconium alloy, or titanium and zirconium at the first layer (or lower layer) metal of the exposed pixel electrode section is changed into a metal nitride such as titanium nitride or zirconium nitride to improve the transmission rate of visible light.

In Measure 21, a manufacturing method similar to those of Measures 1 to 16 adopts the following method in a first photolithographic process:

A film with a thickness of 5~25 nm is formed on a glass substrate, which is a nitride or oxygen nitride film of a metal silicide compound made of titanium, zirconium, titanium and zirconium alloy or titanium and zirconium as a first layer (or a lower layer) of a transparent conductor, and a vacuum condition is maintained to form a second metal layer (or an upper layer) made of molybdenum, aluminum alloy, pure copper, copper alloy, pure silver or silver alloy film. After a positive photoresist is coated, a halftone exposure method adopting a halftone mask (which is made by adjusting the exposure), or a halftone double exposure method adopting two types of general masks to perform a multiple exposure for two times of a bottom side semi-exposure and general exposure, or a halftone non-masking exposure method adopting a DMD direct writing exposure component for the exposure and displaying images, the thickness of the positive photoresist of the contact pad portions corresponding to the gate electrode portion, the common electrode portion and the pixel electrode portion is adjusted and maximized, and thus the thickness of the positive photoresist corresponding to the pixel region other than the contact pad portion and a divided portion of the common electrode becomes thinner.

After the second metal layer (or upper layer) of the transparent conductor without reserving the positive photoresist region is removed, an oxygen plasma process or an ozone gas process is conducted to decompose and remove the thin positive photoresist at the reserved region of the positive photoresist, and the patterned and exposed second metal layer (or upper layer) is used as a mask for selectively etching and removing the first metal layer (or lower layer). Further, only the second metal layer (or upper layer) is selectively etched and exposed, such that after the first layer (or lower layer) metal is exposed, the remained positive photoresist is peeled off. Further, nitrogen ions are irradiated at an acceleration energy in the range of 0.5~10 KeV onto the entire surface of the substrate to prevent a surface oxidation of the contact pads on the surfaces of the gate electrode and the common electrode and in the pixel electrode.

In Measure 22, a manufacturing method similar to those of Measures 1 to 16 adopts the following method in a first photolithographic process:

A metal oxide is formed on a glass substrate, which is an ITO or IZO film serving as a first layer (or a lower layer) of a transparent conductor, and then splluttered, oxidized and reduced to form a film made of an aluminum alloy containing nickel, cobalt or iron and having an electric potential smaller than that of ITO and IZO, molybdenum, chromium, silver alloy, copper alloy or within a range of 0.5~7.0 atom % as a second metal layer (or an upper layer).

After a positive photoresist is coated, a halftone exposure method adopting a halftone mask (which is made by adjusting the exposure), or a halftone double exposure method adopting two types of general masks to perform a multiple exposure for two times of a bottom side semi-exposure and general exposure, or a halftone non-masking exposure method adopting a DMD direct writing exposure component for the exposure and displaying images, the thickness of the positive photoresist of the contact pad portions corresponding to the gate electrode portion, the common electrode portion and the pixel electrode portion is adjusted and maximized, and thus the thickness of the positive photoresist corresponding to the pixel region other than the contact pad portion and a divided portion of the common electrode becomes thinner.

After the second metal layer (or upper layer) without reserving the positive photoresist region are selectively etched and removed, an oxygen plasma process or an ozone gas process is conducted to decompose and remove the thin positive photoresist at the reserved region of the positive photoresist, and the patterned and exposed second metal layer (or upper layer) metal is used as a mask for selectively etching and removing the first layer (or lower layer) transparent conductor. The second metal layer (or upper layer) is selectively etched and exposed only, such that after the first layer (or lower layer) transparent conductor is exposed, the remained positive photoresist is peeled off.

Further, nitrogen ions are irradiated at an acceleration energy in the range of 0.5~10 KeV onto the entire surface of the substrate to prevent a surface oxidation of the contact pads on the surfaces of the gate electrode and the common electrode and in the pixel electrode.

In Measure 23, a manufacturing method similar to those of Measures 1 to 16 adopts the following method in a first photolithographic process:

A film with a thickness of 5~25 nm is formed on a glass substrate, which is a nitride or oxygen nitride film of a metal silicide compound made of titanium, zirconium, titanium and zirconium alloy or titanium and zirconium as a first layer (or a lower layer) of a transparent conductor, and then a second metal layer (or an upper layer) made of aluminum or aluminum alloy or pure copper, copper alloy, pure silver or silver alloy film is formed, and then a molybdenum or chromium film is formed and serves as a third metal layer (or upper layer). After a positive photoresist is coated, a halftone exposure method adopting a halftone mask (which is made by adjusting the exposure), or a halftone double exposure method adopting two types of general masks to perform a multiple exposure for two times of a bottom side semi-exposure and general exposure, or a halftone non-masking exposure method adopting a DMD direct writing exposure component for the exposure and displaying images, the thickness of the positive photoresist of the contact pad portions corresponding to the gate electrode portion, the common electrode portion and the pixel electrode portion is adjusted and maximized, and thus the thickness of the positive photoresist corresponding to the pixel region other than the contact pad portion and a divided portion of the common electrode becomes thinner. Further, after the molybdenum or chromium of the third metal layer (or upper layer) without keeping the positive photoresist region, the aluminum, aluminum alloy, pure copper, copper alloy, pure silver or silver alloy of the second metal layer (or middle layer), and the first layer (or lower layer) metal are etched and removed, and an oxygen plasma process or an ozone gas process is conducted to decompose and remove the remained area of the positive photoresist. The third metal layer (or upper layer) and the second metal layer (or middle layer) are selectively etched and removed, such that the first layer (or lower layer) metal is exposed. After the remained area of the positive photoresist with the maximum thickness is peeled off, nitrogen ions having an acceleration energy with a range of 1~20 KeV are irradiated on the entire surface of the substrate, such that the titanium, zirconium, or titanium and zirconium alloy of the first layer (or lower layer) metal of the exposed pixel electrode section or the titanium and zirconium of the metal silicide compound of the thin film layer is changed into a metal nitride such as titanium nitride or zirconium nitride to improve the transmission rate of visible light.

In Measure 24, a manufacturing method similar to those of Measures 1 to 16 adopts the following method in a first photolithographic process:

A film with a thickness of 5~25 nm is formed on a glass substrate, which is a nitride or oxygen nitride film of a metal silicide compound made of titanium or zirconium or titanium and zirconium alloy or titanium and zirconium and serves as a first layer (or lower layer) of a transparent conductor, and a vacuum condition is maintained, and then an aluminum or aluminum alloy or pure copper, copper alloy, pure silver or silver alloy film is formed and serves as a second metal layer (or middle layer), and further a molybdenum or chromium film is formed and serves as a third metal layer (or upper layer). After the positive photoresist is coated, a halftone exposure method adopting a halftone mask (which is a mask made by adjusting the exposure), or a halftone double exposure method adopting two types of general masks to carry out a multiple exposure for two times, or a halftone non-masking exposure method adopting a DMD direct writing exposure component is used to develop images, and the thickness of the positive photoresist corresponding to the gate electrode portion, common electrode portion and the contact pad portion of the pixel electrode is maximized, and thus the thickness of the positive photoresist corresponding to the pixel region other than the contact pad portion and a divided portion of the common electrode becomes thinner. Further, after the molybdenum or chromium of the third metal layer (or upper layer) without keeping the positive photoresist region, the aluminum, aluminum alloy, pure copper, copper alloy, pure silver or silver alloy of the second metal layer (or middle layer), and the titanium nitride, zirconium nitride, oxygen titanium nitride or oxygen zirconium nitride of the first layer (or lower layer) transparent conductor are etched and removed, an oxygen plasma process or an ozone gas process is conducted to decompose and remove the remained area of the positive photoresist. The third metal layer (or upper layer) and the second metal layer (or middle layer) are selectively etched and removed, such that the first layer (or lower layer) of transparent conductor is exposed. Finally, the remained positive photoresist with the maximum thickness is peeled off.

In Measure 25, a manufacturing method similar to those of Measures 1 to 16 adopts the following method in a first photolithographic process:

A metal oxide is formed on a glass substrate, which is an ITO or IZO film serving as a first layer (or a lower layer) of a transparent conductor, and then a copper alloy containing molybdenum or chromium are oxidized and reduced by 0.5~7.0 atom % to an electric potential smaller than that of the ITO and IZO, a silver alloy containing molybdenum or chromium by 0.5~7.0 atom %, or an aluminum alloy film containing nickel, cobalt or iron by 0.5~7.0 atom % as a second metal layer (or middle layer), and further a molybdenum or chromium film is formed and serves as a third metal layer (or upper layer). After the positive photoresist is coated, a halftone exposure method adopting a halftone mask (which is a mask made by adjusting the exposure), or a halftone double exposure method adopting two types of general masks are used for carrying out a multiple exposure for two times, or a halftone non-masking exposure method adopting a DMD direct writing exposure component is used to develop images, and the thickness of the positive photoresist corresponding to the gate electrode portion, common electrode portion and the contact pad portion of the pixel electrode is maximized, and thus the thickness of the positive photoresist corresponding to the pixel region other than the contact pad portion and a divided portion of the common electrode becomes thinner.

Further, after the molybdenum or chromium of the third metal layer (or upper layer) without keeping the positive photoresist region, the copper alloy, silver alloy or aluminum alloy of the second metal layer (or middle layer), and the ITO or IZO of the first layer (or lower layer) transparent conductor are etched and removed, an oxygen plasma process or an ozone gas process is conducted to decompose and remove the remained area of the positive photoresist. The third metal layer (or upper layer) and the second metal layer (or middle layer) are selectively etched and removed, such that the first layer (or lower layer) transparent conductor is exposed. Finally, the remained positive photoresist with the maximum thickness is peeled off.

In Measure 26, a manufacturing method similar to those of Measures 1 to 16 adopts the following method in a first photolithographic process:

A film with a thickness of 5~25 nm is formed on a glass substrate, and a metal silicide compound film made of titanium, zirconium, titanium and zirconium alloy, or titanium and zirconium is formed and serves as a first metal layer (or lower layer), and then an aluminum, aluminum alloy, pure copper, copper alloy, pure silver, or silver alloy film is formed and serves as a second metal layer (or middle layer), and further a molybdenum or chromium film is formed and serves as a third metal layer (or upper layer). After the positive photoresist is coated, a halftone exposure method adopting a halftone mask (which is a mask made by adjusting the exposure), or a halftone double exposure method adopting two different types of general masks to carry out a multiple exposure for two times for the bottom-side exposure and general exposures, or a halftone non-masking exposure method adopting a DMD direct writing exposure component for the exposure to develop an image, and the thickness of the positive photoresist corresponding to the gate electrode portion, common electrode portion and the contact pad portion of the pixel electrode is maximized, and thus the thickness of the positive photoresist corresponding to the pixel region other than the contact pad portion and a divided portion of the common electrode becomes thinner.

After the molybdenum or chromium of the third metal layer (or upper layer) without keeping the area of positive photoresist, and the aluminum, aluminum alloy, pure copper, copper alloy, pure silver or silver alloy of the second metal layer (or middle layer) are etched and removed, an oxygen plasma process or an ozone gas process is conducted to decompose and remove the remained area of the positive photoresist. The patterned and exposed third metal layer (or upper layer) and the second metal layer (or middle layer) serve as masks, and the first layer (or lower layer) metal is selectively etched and exposed. Further, only the third metal layer (or upper layer) and the second metal layer (or middle layer) are selectively etched and removed, such that the first layer (or lower layer) metal is exposed, and then the remained positive photoresist is peeled off. Further, nitrogen ions having an acceleration energy with a range of 1~20 KeV are irradiated on the entire surface of the substrate, so that the first layer (or lower layer) metal of the exposed pixel electrode section is changed to a metal nitride such as titanium nitride or zirconium nitride to improve the transmission rate of visible light.

In Measure 27, a manufacturing method similar to those of Measures 1 to 16 adopts the following method in a first photolithographic process:

A film with a thickness of 5~25 nm is formed on a glass substrate, which is a nitride or oxygen nitride film of a metal silicide compound made of titanium, zirconium, titanium and zirconium alloy, or titanium and zirconium and serves as a first layer (or lower layer) transparent conductor, and a vacuum condition is maintained, and then an aluminum or aluminum alloy or pure copper, copper alloy, pure silver or silver alloy film is formed and serves as a second metal layer (or middle layer), and a molybdenum or chromium film is formed and serves as a third metal layer (or upper layer). After the positive photoresist is coated, a halftone exposure method adopting a halftone mask (which is a mask made by adjusting the exposure), or a halftone double exposure method adopting two types of general masks is used for carrying out a multiple exposure for two times, or a halftone non-masking exposure method adopting a DMD direct writing exposure component is used to develop images, and the thickness of the positive photoresist corresponding to the gate electrode portion, common electrode portion and the contact pad portion of the pixel electrode is maximized, and thus the thickness of the positive photoresist corresponding to the pixel region other than the contact pad portion and a divided portion of the common electrode becomes thinner. After the molybdenum or chromium of the third metal layer (or upper layer) without keeping the area of the positive photoresist, and the aluminum, aluminum alloy, pure copper, copper alloy, pure silver or silver alloy of the second metal layer (or middle layer) are etched and removed, an oxygen plasma process or an ozone gas process is conducted to decompose and remove the remained area of the positive photoresist. The patterned and exposed third metal layer (or upper layer) and the second metal layer (or middle layer) serve as masks, and the first layer (or lower layer) transparent conductor is selectively etched and exposed. After only the third metal layer (or upper layer) and the second metal layer (or middle layer) are selectively etched and removed, and the first layer (or lower layer) transparent conductor is exposed, the remained positive photoresist is peeled off.

In Measure 28, a manufacturing method similar to those of Measures 1 to 16 adopts the following method in a first photolithographic process:

A metal oxide is formed on a glass substrate, which is an ITO or IZO film serving as a first layer (or a lower layer) of a transparent conductor, and a copper alloy containing molybdenum or chromium with an electric potential smaller than that of the ITO and IZO by 0.5~7.0 atom %, a silver alloy containing molybdenum or chromium by 0.5~7.0 atom %, or an aluminum alloy film containing nickel, cobalt or iron by 0.5~7.0 atom % are formed, oxidized and reduced to serve as a second metal layer (or middle layer), and then a molybdenum or chromium film is formed and serves as a third metal layer (or upper layer). After the positive photoresist is coated, a halftone exposure method adopting a halftone mask (which is a mask made by adjusting the exposure), or a halftone double exposure method adopting two types of general masks is used to carry out a multiple exposure for two times, or a halftone non-masking exposure method adopting a DMD direct writing exposure component is used to develop images, and the thickness of the positive photoresist corresponding to the gate electrode portion, the common electrode portion and the contact pad portion of the pixel electrode is maximized, and thus the thickness of the positive photoresist corresponding to the pixel region other than the contact pad portion and a divided portion of the common electrode becomes thinner.

After the molybdenum or chromium of the third metal layer (or upper layer) at a region without keeping the positive photoresist, and the copper alloy, silver alloy or aluminum alloy of the second metal layer (or middle layer) are etched and removed, an oxygen plasma process or an ozone gas process is conducted to decompose and remove the remained area of the positive photoresist. The patterned and exposed third metal layer (or upper layer) and the second metal layer (or middle layer) serve as masks, and the first layer (or lower layer) transparent conductor is selectively etched and exposed. After only the third metal layer (or upper layer) and the second metal layer (or middle layer) is selectively etched and removed, and the first layer (or lower layer) of transparent conductor is exposed, the remained positive photoresist is peeled off.

In Measure 29, similar to Measures 17, 20, 23 and 26, after an alloy film of titanium, zirconium or titanium and zirconium is formed on a first metal layer (or lower layer), and a metal film is formed on a second layer by sputtering, at least one type of nitrified gas such as nitrogen, ammonia, hydrazine and hydrazone in the range of 1~20% is mixed with an inert gas such as argon or krypton used for spluttering to discharge electricity, and nitrogen atoms are doped in the metal film of the second layer. After a metal film with a thickness of 1~10 nm is formed on the second layer, the mixing of nitrified gas is stopped, and only the inert gas such as argon or krypton is used in the spluttering process for the film formation, such that the etching rate of the second metal layer in the region at an interface proximate to the interface of the first layer (or lower layer) metal is smaller than that of the second metal layer without doped nitrogen atoms, and thus the etching for a regular conical shape can be achieved.

In Measure 30, similar to Measures 18, 19, 21, 22, 24, 25, 27 and 28, the film thickness of the thin film transparent conductor at the first layer (or lower layer) falls within the range of 10~100 nm. After the film formation of the thin film transparent conductor on the first layer (or lower layer) is completed, and the metal film of the second layer is formed by sputtering, at least one type of nitrified gas such as nitrogen, ammonia, hydrazine and hydrazone in the range of 1~20% is mixed with an inert gas such as argon or krypton used for spluttering to discharge electricity, and nitrogen atoms are doped in the metal film of the second layer. After a metal film with a thickness of 1~10 nm is formed on the second layer, the mixing of nitrified gas is stopped, and only the inert gas such as argon or krypton is used in the spluttering process for the film formation is used for preventing the transparent conductor containing oxygen atoms in the first layer (or lower layer) from being diffused and moved to the metal on the second layer metal, such that the etching rate of the second layer meta in the region at an interface proximate to the interface of the first layer (or lower layer) metal is smaller than that of the second layer metal without doped nitrogen atoms, and thus the etching for a regular conical shape can be achieved.

In Measure 31, similar to Measure 17, 20, 23 and 26, the range of film thickness of titanium, zirconium or alloys of the first layer (or lower layer) metal is changed to 5~25 nm. After the positive photoresist is peeled off, the acceleration energy produced when nitrogen ions are doped on the substrate falls within a range of 1~20 KeV according to the film thickness of the first metal layer (or lower layer), so that the visible light transmission rate is maximized. By adjusting dosage, the contact resistance of the contact pad portion in the pixel electrode is below 100 KΩ.

In Measure 32, similar to Measures 18, 19, 21 and 22, the dosage is adjusted, so that the range of film thickness of the transparent conductor of the first layer (or lower layer) metal falls within a range of 10~100 nm. After the positive photoresist is peeled off, the acceleration energy produced when nitrogen ions are doped on the substrate falls within a range of 0.5~10 KeV and the contact resistance of the contact pad portion in the pixel electrode is below 100 KΩ.

In Measure 33, the manufacturing method taken by this measure similar to those of Measures 1 to 16, and 33 adopts the following method in a second photolithographic process:

After the first photolithographic process is finished, a gate insulating film is formed on the entire surface of the substrate, and then films of a non-doped thin film semiconductor layer and a doped ohmic contact thin film semiconductor layer are formed, and a positive photoresist is coated, and a halftone exposure method adopting a halftone mask (which is a mask made by adjusting the exposure), or a halftone double exposure method adopting two types of general masks is used to carry out a multiple exposure for two times, or a halftone non-masking exposure method adopting a DMD direct writing exposure component is used to develop images, and the thickness of the positive photoresist is maximized in the region of forming the thin film transistor component, and the gate electrode terminal, the source electrode terminal or the common electrode terminal, and an electrostatic protection circuit section or a portion of the positive photoresist of the contact hole formed at the contact pad portion of the pixel electrode portion are removed completely, such that the thickness of the positive photoresist in the region other than those mentioned above becomes thinner and remains at such thickness. After the thin film semiconductor layer and gate insulating film of the contact hole portion of the positive photoresist are etched and removed completely, an oxygen plasma process or an ozone gas process is used to decompose and remove the positive photoresist, and maintain an even film thickness of the positive photoresist of the halftone exposure region. After the processing is completed, the positive photoresist in the region of the thin film transistor component still remains, and the film thickness of the positive photoresist of the halftone exposure region and the film thickness of the positive photoresist of the unexposed region of the thin film transistor component are adjusted in advance.

After the positive photoresist in the halftone exposure region is removed, the thin film semiconductor layer is selectively etched and removed to expose the gate insulating film, and only keep the portion for forming the contact hole, and all other portions including the entire areas of the gate electrode, the common electrode and the pixel electrode are covered by the gate insulating film, and the thin film semiconductor layer of the thin film transistor component portion is patterned.

Then, the positive photoresist remained on the thin film semiconductor layer of the thin film transistor component portion is peeled off.

In Measure 34, the manufacturing method taken by this measure similar to those of Measures 1 to 16, and 34 adopts the following method in a second photolithographic process:

After the first photolithographic process is finished, a gate insulating film is formed on the entire surface of the substrate, and then films of non-doped thin film semiconductor layer and doped ohmic contact thin film semiconductor layer are formed to produce an oxidation-resisting barrier metal film. After a positive photoresist is coated, a halftone exposure method adopting a halftone mask (which is a mask made by adjusting the exposure), or a halftone double exposure method adopting two types of general masks is used to carry out a multiple exposure for two times, or a halftone non-masking exposure method adopting a DMD direct writing exposure component is used to develop images, and the thickness of the positive photoresist formed in the region of the thin film transistor component is maximized, and the positive photoresist in the contact hole portion of the gate electrode terminal, the source electrode terminal or the common electrode terminal and the electrostatic protection circuit portion or the contact pad portion formed in the pixel electrode portion are removed completely to adjust the remaining area, so that a thinner positive photoresist remains. After the oxidation-resisting barrier metal in the contact hole portion of the positive photoresist is removed, the thin film semiconductor layer and gate insulating film are removed completely, and an oxygen plasma process or an ozone gas process are used to decompose and remove the thin positive photoresist, and keep the positive photoresist with an even film thickness of the halftone exposure region. After the process, the positive photoresist in the thin film transistor component region still remains, and the film thickness of the positive photoresist in the halftone exposure region and the film thickness of the positive photoresist in the unexposed region of the thin film transistor component are adjusted in advance.

After the positive photoresist of the halftone exposure region is decomposed and removed, the oxidation-resisting barrier metal is selectively etched and removed to form a thin film semiconductor layer at the lower layer to expose the gate insulating film, so as to expose the gate insulating film, and only keep the portion for forming the contact hole, and all other portions including the entire areas of the gate electrode, the common electrode and the pixel electrode are covered by the gate insulating film, and the oxidation-resisting barrier metal and thin film semiconductor layer of the thin film transistor component portion are patterned.

Then, the positive photoresist remained on the thin film semiconductor layer of the thin film transistor component portion is peeled off.

In Measure 35, a manufacturing method similar to those of Measures 1 to 16 adopts the following method in a second photolithographic process:

After the first photolithographic process is finished, a gate insulating film is formed on the entire surface of the substrate, and then films of non-doped thin film semiconductor layer and doped ohmic contact thin film semiconductor layer are formed, and a positive photoresist is coated, a halftone exposure method adopting a halftone mask (which is a mask made by adjusting the exposure), or a halftone double exposure method adopting two types of general masks is used to carry out a multiple exposure for two times, or a halftone non-masking exposure method adopting a DMD direct writing exposure component is used to develop images, and the thickness of the positive photoresist in the region of the thin film transistor component is maximized, and the positive photoresists at the gate electrode terminal, the source electrode terminal or the common electrode terminal and the electrostatic protection circuit portion or the contact hole portion formed in the region of the pixel electrode are removed completely, and thus the thickness of the positive photoresist becomes evenly thinner and such thinner thickness is maintained.

After the thin film semiconductor layer of the contact hole portion of the positive photoresist is etched and removed completely, the gate insulating film of the contact hole portion is etched, and only a small amount of the gate insulating film (with a thickness of approximately 5~200 nm) is remained.

And then, an oxygen plasma process or an ozone gas process is used to decompose and remove the thin positive photoresist, and the positive photoresist in the halftone exposure region is remained with a uniform film thickness. After the process, the positive photoresist of the film transistor component region still remains, and the film thickness of the positive photoresist in the halftone exposure region as well as the unexposed region of the thin film transistor component region is adjusted in advance.

After the photoresist in the halftone exposure region is decomposed and removed, the thin film semiconductor layer is etched and exposed, while a small amount of the gate insulating film remained in the region of the contact hole portion is etched. The etching rate of the small amount of remained gate insulating film in the region of the contact hole portion is adjusted to be faster than that of the exposed thin film semiconductor layer, and is etched completely.

After the gate insulating film remained in the region of the contact hole portion is etched and removed completely, the etching conditions are changed, and only the thin film semiconductor layer is selectively etched and exposed to avoid damages to the gate insulating film in the halftone exposure region, and the gate insulating film is exposed. Therefore, the whole region of the gate electrode, common electrode and pixel electrode covered and included completely by the gate insulating film except the contact hole portion is maintained, and the thin film semiconductor layer of the thin film transistor component portion is patterned. And then, the positive photoresist remained on the thin film semiconductor layer of the thin film transistor component portion is peeled off.

In Measure 36, a manufacturing method similar to those of Measures 1 to 16 adopts the following method in a second photolithographic process:

After the first photolithographic process is finished, a gate insulating film is formed on the entire surface of the substrate, and then films of non-doped thin film semiconductor layer and doped ohmic contact thin film semiconductor layer are formed to produce an oxidation-resisting barrier metal film.

After a positive photoresist is coated, a halftone exposure method adopting a halftone mask (which is a mask made by adjusting the exposure), or a halftone double exposure method adopting two types of general masks is used to carry out a multiple exposure for two times, or a halftone non-masking exposure method adopting a DMD direct writing exposure component is used to develop images, and the thickness of the positive photoresist in the region of the thin film transistor component is maximized, and the gate electrode terminal, the source electrode terminal, and the electrostatic protection circuit portion are removed completely or a positive photoresist is formed at a contact hole portion of the contact pad portion of the pixel electrode portion, and the thickness of the positive photoresist in a region other than those described above is adjusted to be uniformly thin and such thin uniform thickness is maintained. After the oxidation-resisting barrier metal and the thin film semiconductor layer in the contact hole portion of the positive photoresist are etched and removed completely, the gate insulating film of the contact hole portion is halfly etched, and only a small amount of the gate insulating film (with a thickness of 5~200 nm) is remained.

And then, an oxygen plasma process or an ozone gas process is used to decompose and remove the thin positive photoresist, and the positive photoresist in the halftone exposure region is remained with a uniform film thickness. After the process, the positive photoresist of the film transistor component region still remains, and the film thickness of the positive photoresist in the halftone exposure region as well as the unexposed region of the thin film transistor component region is adjusted in advance.

After the photoresist in the halftone exposure region is decomposed and removed, the oxidation-resisting barrier metal is etched and exposed and formed on a thin film semiconductor layer on a metal lower layer of the oxidation-resisting barrier, while a small amount of the gate insulating film remained in the region of the contact hole portion is etched. The etching is adjusted, such that a small amount of gate insulating film remained in the region of the contact hole portion is etched faster than the thin film semiconductor layer of the halftone exposure region and is etched completely.

After the gate insulating film remained in the region of the contact hole portion is etched and removed completely, the etching conditions are changed, and only the thin film semiconductor layer is selectively etched and exposed to avoid damages to the gate insulating film in the halftone exposure region, and the gate insulating film is exposed.

Therefore, the whole region of the gate electrode, the common electrode and the pixel electrode covered and included completely by the gate insulating film except the contact hole portion is maintained, and the oxidation-resisting barrier and the thin film semiconductor layer of the thin film transistor component portion are patterned.

And then, the positive photoresist remained on the metal film of the oxidation-resisting barrier of the thin film transistor component portion is peeled off.

In Measure 37, a manufacturing method similar to those of Measures 1 to 16 adopts the following method in a second photolithographic process:

After the first photolithographic process is finished, a gate insulating film is formed on the entire surface of the substrate, and then films of a non-doped thin film semiconductor layer and a doped ohmic contact thin film semiconductor layer are formed, and a positive photoresist is coated, a halftone exposure method adopting a halftone mask (which is a mask made by adjusting the exposure), or a halftone double exposure method adopting two types of general masks is used to carry out a multiple exposure for two times, or a halftone non-masking exposure method adopting a DMD direct writing exposure component is used to develop images, and the thickness of the positive photoresist in the region of the thin film transistor component is maximized, and the positive photoresist at the gate electrode terminal, the source electrode terminal or the common electrode terminal, and the electrostatic protection circuit or a portion of the contact hole formed on the contact pad portion of the pixel electrode are removed completely, and the thickness of the positive photoresist in a region other than those described above is adjusted to be uniformly thin and such thin uniform thickness is maintained.

After the thin film semiconductor layer and gate insulating film of the contact hole portion of the positive photoresist are etched and removed completely, an oxygen plasma process or an ozone gas process is used to decompose and remove the thin positive photoresist, and the positive photoresist in the halftone exposure region is remained with a uniform film thickness. After the process, the positive photoresist of the film transistor component region still remains, and the film thickness of the positive photoresist in the halftone exposure region as well as the unexposed region of the thin film transistor component region is adjusted in advance.

After the photoresist in the halftone exposure region is decomposed and removed, only the thin film semiconductor layer is selectively etched and removed to expose the gate insulating film. The status of the whole region of the gate electrode, the common electrode and the pixel electrode except the contact hole being covered completely by the gate insulating film is maintained, and the thin film semiconductor layer of the thin film transistor component portion is patterned.

And then, the ion doping method is used, and nitrogen ions are projected obliquely onto the substrate, or a nitrified gas is used for a plasma processing of the substrate, and the sidewalls of the thin film semiconductor layer in the thin film transistor component portion are nitrified. Finally, the remained positive photoresist is peeled off.

In Measure 38, a manufacturing method similar to those of Measures 1 to 16 adopts the following method in a second photolithographic process:

After the first photolithographic process is finished, a gate insulating film is formed on the entire surface of the substrate, and then films of non-doped thin film semiconductor layer and doped ohmic contact thin film semiconductor layer are formed to produce an oxidation-resisting barrier metal film.

And then, after a positive photoresist is coated, a halftone exposure method adopting a halftone mask (which is a mask made by adjusting the exposure), or a halftone double exposure method adopting two types of general masks is used to carry out a multiple exposure for two times, or a halftone non-masking exposure method adopting a DMD direct writing exposure component is used to develop images, and the thickness of the positive photoresist in the region of the thin film transistor component is maximized, and the positive photoresists at the gate electrode terminal, the source electrode terminal or the common electrode terminal, and the electrostatic protection circuit or a portion of the contact hole formed on the contact pad portion of the pixel electrode are removed completely, and the thickness of the positive photoresist in a region other than those described above is adjusted to be uniformly thin and such thin uniform thickness is maintained. After the positive photoresist of the contact hole portion of the oxidation-resisting barrier metal, the thin film semiconductor layer and the gate insulating film are etched and removed, an oxygen plasma process or an ozone gas process is used to decompose and remove the thin positive photoresist, and the positive photoresist in the halftone exposure region is remained with a uniform film thickness. After the process, the positive photoresist of the film transistor component region still remains, and the film thickness of the positive photoresist in the halftone exposure region as well as the unexposed region of the thin film transistor component region is adjusted in advance.

After the photoresist in the halftone exposure region is decomposed and removed, only the oxidation-resisting barrier metal and the thin film semiconductor layer formed on its lower layer are selectively etched and removed to expose the gate insulating film. The status of the whole region of the gate electrode, the common electrode and the pixel electrode covered completely by the gate insulating film except the contact hole portion is maintained, and the oxidation-resisting barrier and the thin film semiconductor layer of the thin film transistor component portion are patterned.

And then, the ion doping method is used, and nitrogen ions are projected obliquely onto the substrate, or a nitrified gas is used for a plasma processing of the substrate, and the sidewalls of the thin film semiconductor layer in the thin film transistor component portion are nitrified. Finally, the remained positive photoresist is peeled off.

In Measure 39, a manufacturing method similar to those of Measures 1 to 16 adopts the following method in a second photolithographic process:

After the first photolithographic process is finished, a gate insulating film is formed on the entire surface of the substrate, and then a non-doped thin film semiconductor layer and a doped ohmic contact thin film semiconductor layer are formed, and a positive photoresist is coated, and a halftone exposure method adopting a halftone mask (which is a mask made by adjusting the exposure), or a halftone double exposure method adopting two types of general masks is used to carry out a multiple exposure for two times, or a halftone non-masking exposure method adopting a DMD direct writing exposure component is used to develop images, and the thickness of the positive photoresist in the region of the thin film transistor component is maximized, and the positive photoresist at the gate electrode terminal, the source electrode terminal or the common electrode terminal, and the electrostatic protection circuit or a portion of the contact hole formed on the contact pad portion of the pixel electrode is removed completely, and the thickness of the positive photoresist in a region other than those described above is adjusted to be uniformly thin and such thin uniform thickness is maintained. After the thin film semiconductor layer of the contact hole portion of the positive photoresist is etched and removed completely, the gate insulating film of the contact hole portion is halfly etched, and only a small amount of the gate insulating film is remained (such as a thickness of 5~200 nm is remained). And then, an oxygen plasma process or an ozone gas process is used to decompose and remove the thin positive photoresist, and the positive photoresist in the halftone exposure region is remained with a uniform film thickness. After the process, the positive photoresist of the film transistor component region still remains, and the film thickness of the positive photoresist in the halftone exposure region as well as the unexposed region of the thin film transistor component region is adjusted in advance.

After the photoresist in the halftone exposure region is decomposed and removed, the thin film semiconductor layer is etched and exposed, while a small amount of the gate insulating film remained in the region of the contact hole portion is etched. The etching of the small amount of remained gate insulating film in the region of the contact hole portion is adjusted to be faster than the exposed thin film semiconductor layer and etched completely. After the gate insulating film remained in the region of the contact hole portion is etched and removed completely, the etching conditions are changed, and only the thin film semiconductor layer is selectively etched and exposed to avoid damages to the gate insulating film in the halftone exposure region, and the gate insulating film is exposed.

Therefore, the status of the whole region of the gate electrode, common electrode and pixel electrode covered and included completely by the gate insulating film except the contact hole portion is maintained, and the thin film semiconductor layer of the thin film transistor component portion is patterned. And then, the ion doping method is used, and nitrogen ions are projected obliquely onto the substrate, or a nitrified gas is used for a plasma processing of the substrate, and the sidewalls of the thin film semiconductor layer in the thin film transistor component portion are nitrified. Finally, the remained positive photoresist is peeled off.

In Measure 40, a manufacturing method similar to those of Measures 1 to 16 adopts the following method in a second photolithographic process:

After the first photolithographic process is finished, a gate insulating film is formed on the entire surface of the substrate, and after the non-doped thin film semiconductor layer and the thin film semiconductor layer doped with impurities used for the ohmic contact are formed, a metal film of an oxidation-resisting barrier is produced.

And then, after a positive photoresist is coated, and a halftone exposure method adopting a halftone mask (which is a mask made by adjusting the exposure), or a halftone double exposure method adopting two types of general masks is used to carry out a multiple exposure for two times, or a halftone non-masking exposure method adopting a DMD direct writing exposure component is used to develop images, and the thickness of the positive photoresist in the region of the thin film transistor component is maximized, and a portion of the positive photoresist at the contact holes of the gate electrode terminal, the source electrode terminal or the common electrode terminal, and the contact holes of the contact pad of the electrostatic protection circuit portion or contact pad portion formed at pixel electrode portion are removed completely, and the thickness of the positive photoresist in a region other than those described above is adjusted to become thin uniformly and such thin thickness is maintained.

After the oxidation-resisting barrier metal and the thin film semiconductor layer with removed positive photoresist of their contact hole portion are etched and removed completely, the gate insulating film of the contact hole portion is halfly etched, and only a small amount of the gate insulating film is remained (such as a thickness of 5~200 nm is remained). And then, an oxygen plasma process or an ozone gas process is used to decompose and remove the thin positive photoresist and the positive photoresist with a uniform film thickness in the halftone exposure region. After the process, the positive photoresist of the film transistor component region still remains, and the film thickness of the positive photoresist in the halftone exposure region as well as the unexposed region of the thin film transistor component region is adjusted in advance.

After the photoresist in the halftone exposure region is decomposed and removed, the oxidation-resisting barrier metal and a thin film semiconductor layer on the metal lower layer of the oxidation-resisting barrier metal are etched and exposed, while a small amount of the gate insulating film remained in the region of the contact hole portion is etched. The etching is adjusted, such that a small amount of gate insulating film remained in the region of the contact hole portion is etched faster than the thin film semiconductor layer of the halftone exposure region and is etched completely.

After the gate insulating film remained in the region of the contact hole portion is etched and removed completely, the etching conditions are changed, and only the thin film semiconductor layer is selectively etched and exposed to avoid damages to the gate insulating film in the halftone exposure region, and the gate insulating film is exposed.

Therefore, the status of the whole region of the gate electrode, the common electrode and the pixel electrode covered completely by the gate insulating film except the portion of the contact hole is maintained, the oxidation-resisting barrier metal and the thin film semiconductor layer of the thin film transistor component portion are patterned.

And then, the ion doping method is used, and nitrogen ions are projected obliquely onto the substrate, or a nitrified gas is used for a plasma processing of the substrate, and the sidewalls of the thin film semiconductor layer in the thin film transistor component portion are nitrified. Finally, the remained positive photoresist is peeled off.

In Measure 41, the metal material of the oxidation-resisting barrier used in Measure 34, 36, 38, 40 can be a high melting-point metal such as molybdenum, titanium, zirconium, tantalum or niobium that can be etched by a fluorine-series dry etching gas to form a film with a thickness of 1~50 nm by sputtering.

In Measure 42 and Measures 37, 38, 39, 40, an ion doping method is used for nitrifying a sidewall of the thin film semiconductor layer of the thin film transistor component portion, the projection angle of nitrogen ions falls within a range of 5 degrees~60 degrees horizontally from the substrate, and the range of the acceleration energy of nitrogen ions is set to 1 KeV~10 KeV.

In Measure 43, a manufacturing method similar to those of Measures 1 to 16 adopts a first photolithographic process for forming at least one contact pad made of the same metal material of the gate electrode in the pixel electrode other than the thin film pixel electrode, a second photolithographic process for forming a contact hole in the contact pad portion, and a third photolithographic process for electrically coupling the contact pad with a drain electrode of the thin film transistor component through the contact hole, and the pixel electrode except the contact hole is covered completely by the gate insulating film.

In Measure 44, a manufacturing method similar to those of Measures 1, 4, 7, 10, 13 and 15 adopts a first photolithographic process for forming a gate electrode, a common electrode parallel and proximate to the gate electrode, a pixel electrode, at least two contact pads made of the same metal material of the gate electrode in the pixel electrode except the thin film pixel electrode on the same layer. The contact hole formed by a second photolithographic process, at least one of the two or more of the contact pads is electrically coupled with a drain electrode of thin film transistor component formed by a third photolithographic process, and the remaining one or more contact holes is electrically coupled to a holdup capacitor (Cst) forming electrode formed by the third photolithographic process, and the holdup capacitor (Cst) forming electrode and the common electrode are stacked through the gate insulating film to form a capacitor, and a pixel electrode except the contact hole is covered completely by the gate insulating film.

In Measure 45, a manufacturing method similar to those of Measures 2, 5, 8, 11, 14 and 16 adopts a first photolithographic process for forming a gate electrode, a common electrode parallel and proximate to the gate electrode, at least one contact pad made of the same metal material of the gate electrode in the pixel electrode and a portion in the pixel electrode except the thin film pixel electrode on the same layer. After a second photolithographic process is used for forming one or more contact holes at the positions corresponding to the common electrode and the contact pad respectively, a third photolithographic process is used for forming a drain electrode of a thin film transistor component and an alignment control electrode for controlling the alignment direction of the liquid crystal molecules. The drain electrode is electrically coupled to the contact pad through the contact hole. An alignment control electrode is electrically coupled to a common electrode through the contact hole and stacked with a thin film pixel electrode by a gate insulating film to form a capacitor. A pixel electrode except the contact hole is covered completely by the gate insulating film.

In Measure 46, a manufacturing method similar to those of Measures 1, 4, 7, 10, 13 and 15 adopts a first photolithographic process for forming a gate electrode, a comb pixel electrode, two or more contact pads in the comb pixel electrode, a common electrode parallel with and proximate to the gate electrode, a source signal screening electrode extended parallelly from the common electrode and proximate to both left and right sides of a source electrode, and a comb common electrode extended similarly and parallelly from the common electrode at the comb pixel electrode on the same layer. The contact hole formed in a second photolithographic process is formed in at least one of the two or more contact pads in the comb pixel electrode and electrically coupled with a drain electrode of a thin film transistor component formed by a third photolithographic process, and the remaining one or more contact pads is electrically coupled with a holdup capacitor (Cst) forming electrode in the third photolithographic process, and the holdup capacitor (Cst) forming electrode and the common electrode parallel and proximate to the gate electrode are stacked through a gate insulating film to form a capacitor. The comb pixel electrode, the comb common electrode and the source signal screening electrode except the contact hole are completely covered by the gate insulating film.

In Measure 47, a manufacturing method similar to those of Measures 1, 4, 7, 10, 13 and 15 adopts a first photolithographic process for forming a gate electrode, a common electrode parallel with and proximate to the gate electrode, a pixel electrode, and at least one contact pad made of the same metal material of the gate electrode and disposed in the pixel electrode except the thin film pixel electrode on the same layer. After a second photolithographic process is used for forming one or more contact holes corresponding to the positions of the common electrode and the contact pad respectively, a third photolithographic process is used for forming a drain electrode and a holdup capacitor (Cst) forming electrode of the thin film transistor component, and the drain electrode is electrically coupled to the contact pad through the contact hole, and a holdup capacitor (Cst) forming electrode is electrically coupled to the common electrode through the contact hole, such that the holdup capacitor (Cst) forming electrode and the thin film pixel electrode are stacked through a gate insulating film to form a capacitor. A pixel electrode except the contact hole is covered completely by the gate insulating film.

In Measure 48, a manufacturing method similar to those of Measures 1, 4, 7, 10, 13 and 15 adopts a first photolithographic process for forming a gate electrode, a common electrode, a pixel electrode divided into two regions by the common electrode, two or more contact pads formed on the divided pixel electrode which is divided into two regions by the common electrode and proximate to the pixel electrode of a thin film transistor component, and at least one contact pad formed in another side of the divided pixel electrode. A second photolithographic process is used for forming a contact hole at a position corresponding to the contact pad. A third photolithographic process is used for forming a drain electrode and a holdup capacitor (Cst) forming electrode of a thin film transistor component, and the drain electrode is electrically coupled to the contact hole proximate to the pixel electrode through the contact hole, and the holdup capacitor (Cst) forming electrode and the contact pad in the divided pixel electrode form two contact pads which are proximate to the two different pixel regions of the common electrode and electrically coupled through the contact hole, and the holdup capacitor (Cst) forming electrode is stacked with the common electrode through a gate insulating film to form a capacitor. The pixel electrode except the contact hole is covered completely by the gate insulating film.

In Measure 49, a manufacturing method similar to those of Measures 1, 4, 7, 10, 13 and 15 uses a first photolithographic process for forming two electrically independent common electrodes in a basic unit pixel, one gate electrode, a pixel electrode divided into two regions by the gate electrode, and two or more contact pads are formed in a pixel electrode divided into two regions. And then, a second photolithographic process is used for forming a contact hole at a position corresponding to the contact pad. A third photolithographic process is used for forming two drain electrodes corresponding to each pixel electrode divided into two regions by the gate electrode, and a holdup capacitor (Cst) forming electrode two holdup capacitor (Cst), the two drain electrodes and the contact pad formed in a pixel electrode divided into two regions by the gate electrode are proximate to the contact pad of the gate electrode and electrically coupled to the contact hole, and a holdup capacitor (Cst) forming electrode 2 holdup capacitor (Cst) and the remaining contact pad formed at the divided pixel electrode are electrically coupled to the contact hole, and the electrode formed by 2 holdup capacitor (Cst) is stacked with two common electrodes through a gate insulating film to form independent capacitors. The pixel electrode divided into two regions except the contact hole is covered completely by the gate insulating film.

In Measure 50, a manufacturing method similar to those of Measures 2, 5, 8, 11, 14 and 16 adopts a first photolithographic process for forming two electrically independent common electrodes, one gate electrode in a basic unit pixel, a pixel electrode divided into two regions by the gate electrode, and one or more contact pads formed on a portion of the pixel electrode divided into two regions and at a position proximate to the gate electrode. And then, a second photolithographic process is used for forming a contact hole at a position corresponding to the contact pad and the two common electrodes. A third photolithographic process is used for forming: two drain electrodes corresponding to each pixel electrode divided into two regions of a thin film transistor component, and two sets of alignment control electrodes for controlling the alignment direction of liquid crystal molecules corresponding to the two pixel electrodes, and the two drain electrodes in the two divided pixel electrodes are electrically coupled to the contact pad through the contact hole, the two sets of alignment control electrodes and the two common electrodes are electrically coupled to the contact hole, and the two sets of alignment control electrodes are stacked with the pixel electrode divided into two regions through the gate insulating film to form each independent capacitor. The pixel electrode divided into two regions except the contact hole is covered completely by the gate insulating film.

In Measure 51, a manufacturing method similar to those of Measures 1, 2, 4, 5, 7, 8, 10, 11, 13, 14, 15 and 16 adopts a first photolithographic process for forming two electrically independent common electrodes, one gate electrode, and a pixel electrode divided into two regions by the gate electrode in a basic unit pixel, and forming two or more contact pads in one of the two divided regions of the pixel electrode and at least one contact pad in another region of the pixel electrode. A second photolithographic process is used for forming a contact hole at the contact pads and the common electrode proximate to a latter pixel electrode and having at least one contact pad. A third photolithographic process is used for forming: two drain electrodes, one electrode formed by holdup capacitor (Cst), and a set of alignment control electrode for controlling the alignment direction of liquid crystal molecules corresponding to the thin film transistor component of each divided pixel electrode. The two drain electrodes and the contact pad formed in the pixel electrode divided into two regions are electrically coupled through each contact hole, and the common electrode having contact hole in the set of alignment control electrode and two common electrodes are electrically coupled through the contact hole, and the one holdup capacitor (Cst) forming electrode and the contact pad having at least two common electrodes proximate to the pixel electrode of the contact pad are electrically coupled through the contact hole.

The set of alignment control electrode is stacked with a pixel electrode having at least one contact pad through the gate insulating film to form a capacitor, and the holdup capacitor (Cst) forming electrode is stacked with another pixel electrode having at least two contact pads through the gate insulating film to form a capacitor. The two divided pixel electrodes except the contact hole are covered completely by the gate insulating film.

In Measure 52, a manufacturing method similar to those of Measures 1, 4, 7, 10, 13 and 15 adopts a first photolithographic process for forming a gate electrode, a comb pixel electrode, at least one contact pad in the pixel electrode, a common electrode parallel and proximate to the gate electrode, a source signal screening electrode extended parallelly from the common electrode and proximate to both left and right sides of the source electrode, and a comb common electrode extended parallelly from the common electrode at a comb pixel electrode on same layer. After a second photolithographic process is used for forming one or more contact holes corresponding to the positions of the common electrode and the contact pad respectively, a third photolithographic process is used for forming: a drain electrode and a holdup capacitor (Cst) forming electrode of a thin film transistor component, and the drain electrode is electrically coupled to the contact pad through the contact hole, and the holdup capacitor (Cst) forming electrode and the common comb pixel electrode are stacked through the gate insulating film to form a capacitor. The comb pixel electrode, the comb common electrode and the source signal screening electrode except the contact hole are covered completely by the gate insulating film.

In Measure 53, a manufacturing method similar to those of Measures 3, 6, 9 and 12 adopts a first photolithographic process for forming a gate electrode, a common electrode parallel and proximate to the gate electrode, a Betta shaped pixel electrode, and at least one contact pad made of the same metal material of the gate electrode in a Betta shaped pixel electrode portion other than the transparent pixel electrode on the same layer. After a second photolithographic process is used for forming one or more contact holes at the positions corresponding to the common electrode and the contact pad respectively, a third photolithographic process is used for forming a drain electrode and a comb common electrode of a thin film transistor component, and the drain electrode is electrically coupled to the contact pad through the contact hole, and the comb common electrode is electrically coupled to the common electrode through the contact hole and parallel and proximate to the gate electrode, and the comb common electrode and the Betta shaped pixel electrode are stacked through the gate insulating film to form a capacitor. The Betta shaped pixel electrode except the contact hole is covered completely by the gate insulating film.

In Measure 54, a manufacturing method similar to those of Measures 1, 4, 7, 10, 13 and 15 adopts a first photolithographic process for forming a linear gate electrode, a pixel electrode, and a contact pad in the pixel electrode, and a plurality of slit periodically formed in the pixel electrode for controlling the alignment direction of liquid crystal molecules are extended linearly upward in a direction of +/−45 degrees with respect to the gate electrode, and bent to an angle of 90 degrees at a position proximate to the center of the pixel electrode. The pixel electrode except the contact hole formed at the contact pad is completely covered by the gate insulating film by a second photolithographic process. The linear source electrode (video signal electrode) formed by a third photolithographic process is disposed perpendicular to the gate electrode through the gate insulating film.

In Measure 55, a manufacturing method similar to those of Measures 1, 4, 7, 10, 13, and 15 adopts a first photolithographic process for forming a linear gate electrode, a pixel electrode and a contact pad in the pixel electrode, and a matrix slit used for controlling the alignment direction of liquid crystal molecules in the pixel electrode is extended parallelly or perpendicularly to the linear gate electrode. The pixel electrode except the contact hole of the contact pad is completely covered by the gate insulating film in a second photolithographic process. The linear source electrode (video signal electrode) produced by a third photolithographic process is disposed perpendicularly to the gate electrode through the gate insulating film.

In Measure 56, a manufacturing method similar to those of Measures 2, 5, 8, 11, 14 and 16 adopts a first photolithographic process for forming a linear gate electrode, a common electrode, a pixel electrode and a contact pad in the pixel electrode, and the pixel electrode except the contact hole of the contact pad portion produced by a second photolithographic process is completely covered by the gate insulating film. A third photolithographic process is used for forming a slender alignment control electrode for controlling the alignment direction of liquid crystal molecules and a linear source electrode, and the alignment control electrode is extended linearly upward in a direction of +/−45 degrees with respect to the linear gate electrode and bent to an angle of 90 degrees at a position proximate to the center of the pixel electrode. The alignment control electrode is electrically coupled to the common electrode through the contact hole, and the linear source electrode is installed perpendicular to the gate electrode through the gate insulating film.

In Measure 57, a manufacturing method similar to those of Measures 2, 5, 8, 11, 14 and 16 adopts a first photolithographic process for forming a linear gate electrode, a common electrode, a pixel electrode and a contact pad in the pixel electrode, a second photolithographic process for completely covering the pixel electrode except a contact hole of the contact pad by the gate insulating film, and a third photolithographic process for forming a slender alignment control electrode for controlling the alignment direction of liquid crystal molecules and a linear source electrode (video signal electrode), and the alignment control electrode is extended slenderly upward and parallel to or perpendicular to the linear gate electrode to define a matrix shape. The alignment control electrode is electrically coupled to the common electrode through the contact hole, and the linear source electrode is installed perpendicular to the gate electrode through the gate insulating film.

In Measure 58, a manufacturing method similar to those of Measures 1, 2, 4, 5, 7, 8, 10, 11, 13, 14, 15 and 16 adopts a first photolithographic process to form in a basic unit pixel: a gate electrode, a common electrode, a pixel electrode, at least one contact pad in the pixel electrode, and a plurality of slits for controlling the alignment direction of the liquid crystal molecules in an area occupying $2/3$ to $4/5$ of the area of the pixel electrode. The plurality of slits are extended linearly upward in the direction of +/−45 degrees with respect to the gate electrode and bent to an angle of 90 degrees to define a shape and formed at a position proximate to the center of the pixel region, or a matrix shape is formed and extended linearly parallel or perpendicular to the gate electrode.

And then, a second photolithographic process is used for forming one or more contact holes on the common electrode and contact pad respectively. The pixel electrode except the contact hole is completely covered by the gate insulating film.

A third photolithographic process is used for forming: a linear source electrode perpendicular to the gate electrode, and an alignment control electrode disposed on an area without the slit and occupying an area of $1/5$ to $1/3$ of the pixel electrode for controlling the alignment direction of liquid crystal molecules. The alignment control electrode is electrically coupled to the common electrode through the contact hole, and extended linearly upward in the direction of +/−45 degrees with respect to the gate electrode, and bent to an angle of 90 degrees to define a shape at a position proximate to the pixel region having the alignment control electrode, or formed into a matrix shape, and extended linearly upward and parallel or perpendicular to the gate electrode. The liquid crystal driving threshold voltage at the pixel region having the alignment control electrode is less than that of the pixel region having the slit.

In Measure 59, a manufacturing method similar to those of Measures 1, 4, 7, 10, 13 and 15 adopts a first photolithographic process for forming a linear gate electrode, a pixel electrode, a contact pad in the pixel electrode, and a plurality of slits periodically formed in the pixel electrode for controlling the alignment direction of liquid crystal molecules, and the plurality of slits are extended linearly upward in the direction of +/−45 degrees with respect to the linear gate electrode, and bent to an angle of 90 degrees at a position proximate to the center of the pixel electrode. Similarly, the pixel electrode extended linearly upward in the direction of +/−45 degrees with respect to the linear gate electrode, and bent to an angle of 90 degrees at a position proximate to the center of the pixel electrode. A second photolithographic process is used for covering the pixel electrode except a contact hole of the contact pad completely by the gate insulating film.

The source electrode (video signal electrode) produced by a third photolithographic process is extended linearly upward in the direction of +/−45 degrees with respect to the gate electrode, and similarly, the pixel electrode and the slits formed at the pixel electrode are bent to an angle of 90 degrees at a position proximate to the center of the pixel electrode.

In Measure 60, a manufacturing method similar to those of Measures 2, 5, 8, 11, 14 and 16 adopts a first photolithographic process for forming a linear gate electrode, a common electrode, a pixel electrode, a contact pad in the pixel electrode, a pixel electrode extended linearly upward in the direction of +/−45 degrees with respect to the linear gate electrode and bent to an angle of 90 degrees at a position proximate to the center of the pixel electrode. A second photolithographic process is used for forming contact holes at the common electrode portion and the contact pad portion, and the pixel electrode except the contact hole is completely covered by the gate insulating film.

A third photolithographic process is used for forming a slender alignment control electrode for controlling the alignment direction of liquid crystal molecules and a source electrode (video signal electrode), and the alignment control electrode is extended linearly upward in the direction of +/−45 degrees with respect to the linear gate electrode, and bent to an angle of 90 degrees at a position proximate to the center of the pixel electrode. The alignment control electrode is electrically coupled to the common electrode through the contact hole, and stacked with the pixel electrode through the gate insulating film to form a capacitor. The source electrode is also extended linearly upward in the direction of +/−45 degrees with respect to the gate electrode, and the pixel electrode and alignment control electrode are similarly bent to an angle of 90 degrees at positions proximate to the center of the pixel electrode.

In Measure 61, a manufacturing method similar to those of Measures 1, 2, 4, 5, 7, 8, 10, 11, 13, 14, 15 and 16 adopts a first photolithographic process for forming a linear one gate electrode, a common electrode, a pixel electrode, at least one contact pad in the pixel electrode, and a plurality of slits occupying ⅔ to ⅘ of the area of the pixel electrode for controlling the alignment direction of liquid crystal molecules in a basic unit pixel. The plurality of slits are extended linearly upward in the direction of +/−45 degrees with respect to the gate electrode and bent to an angle of 90 degrees at a position proximate to the center of the pixel electrode. Similarly, the pixel electrode is also extended linearly upward in the direction of +/−45 degrees with respect to the linear gate electrode and bent to an angle of 90 degrees at a position proximate to the center of the pixel electrode.

A second photolithographic process is used for forming one or more contact holes on the common electrode and the contact pad respectively. The pixel electrode except the contact hole is completely covered by the gate insulating film. A third photolithographic process is used for forming a source electrode (video signal electrode) and an alignment control electrode occupying a pixel region without forming a slit and equal to ⅕ to ⅓ of the area of the pixel electrode for controlling the alignment direction of liquid crystal molecules. The alignment control electrode is electrically coupled to the common electrode through the contact hole, and extended linearly upward in the direction of +/−45 degrees with respect to the gate electrode and bent to an angle of 90 degrees at a position proximate to the center of the pixel electrode. The alignment control electrode is stacked with the pixel electrode through the gate insulating film to form a capacitor.

Similarly, the source electrode is also extended linearly upward in the direction of +/−45 degrees with respect to the gate electrode, and together with the pixel electrode, the slit formed at the pixel electrode and the alignment control electrode are bent to an angle of 90 degrees at positions proximate to the center of the pixel electrode.

The threshold voltage for driving the liquid crystals in a region occupying ⅕ to ⅓ of the area of the pixel electrode having the alignment control electrode is smaller than that of the remaining region that occupies ⅔ to ⅘ of the area of the pixel electrode having the slits.

In Measure 62, a manufacturing method similar to those of Measures 1, 4, 7, 10, 13 and 15 adopts a first photolithographic process, for forming a linear one gate electrode, a common electrode, a pixel electrode, at least one contact pad in the pixel electrode, and a plurality of slits occupying ⅔ to ⅘ of the area of the pixel electrode for controlling the alignment direction of liquid crystal molecules in a basic unit pixel. The pixel electrode divided into two regions, and a plurality of slits occupied in a region having an area equal to ⅔ to ⅘ of the area of the pixel electrode for controlling the alignment direction of liquid crystal molecules are extended linearly upward in the direction of +/−45 degrees with respect to the gate electrode, and the slits are scatterly and parallelly arranged with an interval of 40~60 μm apart from each other, and the pixel electrode and the plurality of slits are bent to an angle of 90 degrees at positions proximate to the center of the scatter and arranged region.

The plurality of slits occupying the remaining region with an area equal to ⅕ to ⅓ of the area of the pixel electrode for controlling the alignment direction of liquid crystal molecules are extended linearly upward in the direction of +/−45 degrees with respect to the gate electrode, and the slits are densely and parallelly arranged with an interval of 20~40 μm apart from each other, and the pixel electrode and the plurality of slits are bent to an angle of 90 degrees at positions proximate to the center of the densely and parallelly arranged region A second photolithographic process is used for completely covering the pixel electrode except the contact hole formed at the contact pad by the gate insulating film.

The source electrode (video signal electrode) produced by a third photolithographic process is also extended linearly upward in the direction of +/−45 degrees with respect to the gate electrode, and a structure of the source electrode together with the pixel electrode and the slit bent bend to an angle of 90 degrees for at least two times at the two positions of the scatterly arranged slits proximate to the center of the pixel region and the densely arranged slits proximate to the center of the pixel region.

In Measure 63, a manufacturing method similar to those of Measures 2, 5, 8, 11, 14 and 16 adopts a first photolithographic process for forming a linear gate electrode, a common electrode, and a pixel electrode in a basic unit pixel, and forming at least one contact pad in the pixel electrode. A second photolithographic process is used for completely covering the pixel electrode except the contact hole formed at the contact pad by the gate insulating film.

A third photolithographic process is used for forming a source electrode (video signal electrode), and a plurality of slender alignment control electrodes for controlling the alignment direction of liquid crystal molecules. The alignment control electrode in a region occupying ⅔ to ⅘ of the area of the pixel electrode is extended linearly upward in the direction of +/−45 degrees with respect to the gate electrode, and the alignment control electrodes are scattered and parallelly arranged with an interval of 40~60 μm apart from each other, and both of the pixel electrode and the plurality of slender alignment control electrodes are bent to an angle of 90 degrees. Several alignment control electrodes in the remaining scatterly arranged region occupying ⅕ to ⅓ of the area of the pixel electrode and proximate to the center of the pixel electrode are extended linearly upward in the direction of +/−45 degrees with respect to the gate electrode, and the alignment control electrodes are densely and parallelly arranged with an interval of 20~40 μm apart from each other. Both of the pixel electrode and the plurality of slender alignment control electrodes disposed proximate to the center of the densely arranged region are bent to an angle of 90 degrees.

Similarly, the source electrode together with the pixel electrode and the slender alignment control electrode are bent to 90 degrees for at least two times at two positions: a position proximate to the center of the pixel region of the scatterly arranged alignment control electrode, and a position proximate to the center of the densely arranged alignment control electrode. The boundaries of two alignment control electrode arranged in the regions of the pixel region are connected and electrically coupled to the common electrode through the contact hole, and stacked with the pixel electrode through the gate insulating film to form a capacitor.

In Measure 64, a manufacturing method similar to those of Measures 1, 2, 4, 5, 7, 8, 10, 11, 13, 14, 15 and 16 adopts a first photolithographic process for forming a linear gate electrode, a common electrode, and a pixel electrode in a basic unit pixel and forming at least one contact pad in the pixel electrode. A second photolithographic process is used for forming a common electrode portion and a contact hole in a contact pad portion. The pixel electrode except the contact hole of the contact pad is completely covered by the gate insulating film. A third photolithographic process is used for forming a source electrode (video signal electrode), and a plurality of slender alignment control electrodes for controlling the alignment direction of liquid crystal molecules, and the alignment control electrode is electrically coupled to the common electrode through the contact hole.

The pixel electrode is divided into two regions, and the plurality of slits disposed in a region occupying ⅔ to ⅘ of the area of the pixel electrode for controlling the alignment direction of liquid crystal molecules are extended linearly upward in the direction of +/−45 degrees with respect to the gate electrode, and the slits are scatterly and parallelly arranged with an interval of 40~60 μm apart from each other. Both of the pixel electrode and the plurality of slits proximate to the center of the region are bent to an angle of 90 degrees.

The plurality of alignment control electrodes disposed at a region occupying the remaining ⅕ to ⅓ of the area of the pixel electrode are extended linearly upward in the direction of +/−45 degrees with respect to the gate electrode, and the alignment control electrodes are densely and parallelly arranged with an interval of 20~40 μm apart from each other, and both of the pixel electrode and the plurality of slender alignment control electrodes are bent to an angle of 90 degrees at positions proximate to the center of the region.

Similarly, the source electrode, the pixel electrode, the slit and the slender alignment control electrode are bent to 90 degrees for a total of at least two times at two positions: a position proximate to the center of the pixel region of the scatterly arranged slit, and a position proximate to the center of the pixel region of the densely arranged alignment control electrode.

The threshold voltage for driving the liquid crystal molecules of the densely and parallelly arranged alignment control electrode disposed in a region occupying ⅕ to ⅓ of the area of the pixel electrode is smaller than that of the scattered and parallelly arranged slit disposed in a region occupying ⅔ to ⅘ of the area of the pixel electrode.

In Measure 65, a manufacturing method similar to those of Measures 1, 4, 7, 10, 13 and 15 adopts a first photolithographic process for forming a gate electrode, two common electrodes, two pixel electrodes divided by the gate electrode into two regions with a bigger area and a smaller area, and two or more contact pads in each of the two divided regions of the pixel electrode (and thus a total of four or more contact pads) in a basic unit pixel. The area of the larger pixel electrode is approximately two to four times of the area of the smaller pixel electrode. The plurality of slits formed at the larger pixel electrode for controlling the alignment direction of liquid crystal molecules are extended linearly upward in the direction of +/−45 degrees with respect to the gate electrode, and the slits are scatterly and parallelly arranged with an interval of 40~60 μm apart from each other. The slit proximate to the center of the larger pixel electrode bends to an angle of 90 degrees. The plurality of slits formed at the smaller pixel electrode for controlling the alignment direction of liquid crystal molecules are extended linearly upward in the direction of +/−45 degrees with respect to the gate electrode, and the slits are densely and parallelly arranged with an interval of 20~40 μm apart from each other. The slit proximate to the center of the smaller pixel electrode bends to an angle of 90 degrees. A second photolithographic process is used for forming a contact hole in the contact pad portion and completely covering the two divided pixel electrodes except the contact hole by the gate insulating film.

A third photolithographic process is used for forming a linear source electrode (video signal electrode) perpendicular to the gate electrode and corresponding to the each two drain electrodes of the larger pixel electrode and the smaller pixel electrode and two electrodes formed by holdup capacitor (Cst) in a basic unit pixel. The two drain electrodes are electrically coupled to the larger and smaller pixel electrodes through the contact hole respectively. The two electrodes formed by holdup capacitor (Cst) are electrically coupled to the larger and smaller pixel electrodes through the contact hole respectively, and stacked with the corresponding two common electrodes through the gate insulating film to form two independent capacitors.

In Measure 66, a manufacturing method similar to those of Measures 2, 5, 8, 11, 14 and 16 adopts a first photolithographic process for forming one gate electrode, two common electrodes, two pixel electrodes divided into a larger region and a smaller region by the gate electrode, and at least one contact pad formed at each of the two divided pixel electrodes in a basic unit pixel. The area of the larger pixel electrode is approximately equal to two to four times of the area of the smaller pixel electrode. A second photolithographic process is used for forming contact holes at the contact pad portion in the larger and smaller pixel electrodes and two common electrode portions corresponding to the larger and smaller pixel electrodes, and completely covering the larger and smaller pixel electrodes except the contact hole by the gate insulating film.

A third photolithographic process is used for forming a linear source electrode (video signal electrode) perpendicular to the gate electrode, two drain electrodes corresponding to the larger and smaller pixel electrodes, and a slender alignment control electrode corresponding to the larger and smaller pixel electrodes for controlling the alignment direction of liquid crystal molecules in a basic unit pixel. The two drain electrodes and the contact pads formed at the larger and smaller pixel electrodes are electrically coupled through the contact hole. The larger pixel electrode and the alignment control electrode are extended linearly upward in the direction of +/−45 degrees with respect to the gate electrode, and a plurality of alignment control electrodes are scatterly and parallelly arranged with an interval of 40~60 μm apart from each other. The slender alignment control electrode proximate to the center of the larger pixel electrode bends to an angle of 90 degrees. The smaller pixel electrode and the alignment control electrode are extended linearly upward in the direction of +/−45 degrees with respect to the gate electrode, and a plurality of alignment control electrodes are densely and parallelly arranged with an interval of 20~40 μm apart from each other. The slender alignment control electrode proximate to the center of the smaller pixel electrode bends to an angle of 90 degrees. The two common electrodes corresponding to each alignment control electrode arranged in the larger and smaller pixel electrodes are electrically coupled through the contact hole, and stacked separately with the larger and smaller pixel electrodes through the gate insulating film to form two independent capacitors.

In Measure 67, a manufacturing method similar to those of Measures 1, 2, 4, 5, 7, 8, 10, 11, 13, 14, 15 and 16 adopts a first photolithographic process for forming one gate electrode, two common electrodes, two pixel electrodes divided into two larger and smaller regions by the gate electrode pixel, two or more contact pads at the pixel electrode with a larger area, and one or more contact pads at the pixel electrode with a smaller area in a basic unit. The area of the larger pixel electrode is approximately two to four times of the area of the smaller pixel electrode, and a plurality of slits are formed in the larger pixel electrode for controlling the alignment direction of liquid crystal molecules. The plurality of slits are extended linearly upward in the direction of +/−45 degrees with respect to the gate electrode, and scatterly and parallelly arranged with an interval of 40~60 μm apart from each other. The plurality of slits proximate to the center of the larger pixel electrode are bent to an angle of 90 degrees.

A second photolithographic process is used for forming contact holes on the contact pad portion inside the larger and smaller pixel electrodes and on a common electrode corresponding to the smaller pixel electrode, and the larger and smaller pixel electrodes except the contact holes are completely covered by the gate insulating film.

A third photolithographic process is used for forming a linear source electrode (video signal electrode) perpendicular to the gate electrode, two drain electrodes corresponding to the larger and smaller pixel electrodes, one holdup capacitor (Cst) forming electrode corresponding to the larger pixel electrode, and a slender alignment control electrode corresponding to the smaller pixel electrode for controlling the alignment direction of liquid crystal molecules in a basic unit pixel. The two drain electrodes are electrically coupled to the contact pad on the larger and smaller pixel electrodes through the contact hole. The smaller pixel electrode and the alignment control electrode are extended linearly upward in the direction of +/−45 degrees with respect to the gate electrode. A plurality of alignment control electrodes are densely and parallelly arranged with an interval of 20~40 μm apart from each other, and bent to an angle of 90 degrees at a position proximate to the center of the smaller pixel electrode. The alignment control electrode and one common electrode corresponding to the smaller pixel electrode are electrically coupled through the contact hole, and stacked with the smaller pixel electrode through the gate insulating film to form a capacitor.

The holdup capacitor (Cst) forming electrode is electrically coupled to the large pixel electrode through the contact hole, and stacked with the common electrode corresponding to the large pixel electrode through the gate insulating film to form a capacitor. The threshold voltage for driving liquid crystals in a smaller pixel electrode portion of the densely and parallelly arranged alignment control electrode is less than that of a larger pixel electrode portion of the scattered and parallelly arranged slender alignment control slit.

In Measure 68, a manufacturing method similar to those of Measures 1, 4, 7, 10, 13 and 15 adopts a first photolithographic process for forming a gate electrode, two common electrodes, two pixel electrodes divided into two larger and smaller regions by the gate electrode, and two or more contact pads inside each divided pixel electrode in a basic unit pixel. The area of the larger pixel electrode is approximately two to four times of the area of the smaller electrode. The plurality of slits of the larger pixel electrode for controlling the alignment direction of liquid crystal molecules are extended linearly upward in the direction of +/−45 degrees with respect to the gate electrode, and the slits are scatterly and parallelly arranged with an interval of 40~60 μm apart from each other, and the plurality of slits and the larger pixel electrode are bent to an angle of 90 degrees at positions proximate to the center of the pixel electrode, The plurality of slits of the smaller pixel electrode for controlling the alignment direction of liquid crystal molecules are also extended linearly upward in the direction of +/−45 degrees with respect to the gate electrode, and the slits are densely and parallelly arranged with an interval of 20~40 μm apart from each other. The plurality of slits and the smaller pixel electrode are bent to an angle of 90 degrees at positions proximate to the center of the pixel electrode.

A second photolithographic process is used for forming contact pad portions inside the larger and smaller pixel electrodes. The larger and smaller pixel electrodes except the contact holes are completely covered by the gate insulating film.

A third photolithographic process is used for forming a source electrode (video signal electrode), two drain electrodes corresponding to each larger pixel electrode and each smaller pixel electrode, and a holdup capacitor (Cst) forming electrode 2 holdup capacitor (Cst) in a basic unit pixel. The source electrode is extended linearly upward in the direction of +/−45 degrees with respect to the gate electrode, and the larger and smaller pixel electrodes, similar to the slit, are bent to 90 degrees for at least two times at two positions: a position proximate to the center of the larger pixel electrode and a position proximate to the center of the smaller pixel region.

The two drain electrodes are electrically coupled to the larger and smaller pixel electrodes through the contact hole respectively. The two electrodes formed by holdup capacitor (Cst) are electrically coupled to the larger and smaller pixel electrodes through the contact hole respectively, and stacked with the two common electrodes through the gate insulating film and corresponding to each electrode formed by Cst to form two independent capacitors.

In Measure 69, a manufacturing method similar to those of Measures 2, 5, 8, 11, 14 and 16 adopts a first photolithographic process for forming in a basic unit pixel: one gate electrode, two common electrodes, two pixel electrodes divided into two larger and smaller regions by the gate electrode, and at least one contact pad formed in each divided pixel electrode portion. The area of the larger pixel electrode is approximately two to four times of the area of the smaller electrode. Each of the larger and smaller pixel electrodes proximate to the center of the pixel electrode is bent to an angle of 90 degrees, and the gate electrode is bent to an angle of +/−45 degrees.

A second photolithographic process is used for forming contact holes at the contact pad portion in the larger and smaller pixel electrodes and the two common electrodes corresponding to the larger and smaller pixel electrodes, and completely covering the larger and smaller pixel electrodes except the contact hole by the gate insulating film.

A third photolithographic process is used for forming a source electrode (video signal electrode), two drain electrodes corresponding to the larger and smaller pixel electrodes respectively, and a slender alignment control electrode corresponding to the larger and smaller pixel electrodes for controlling the alignment direction of liquid crystal molecules in a basic unit pixel. The two drain electrodes and the contact pad formed in the larger and smaller pixel electrodes are electrically coupled through the contact hole. The larger pixel electrode portion and the alignment control electrode are extended upward in the direction of +/−45 degrees with respect to the gate electrode, and a plurality of alignment control electrodes are scatterly and parallelly arranged with an interval of 40~60 μm apart from each other. The slender alignment control electrode and larger pixel electrode are bent to an angle of 90 degrees at positions proximate to the center of the larger pixel electrode similarly. The smaller pixel electrode portion and the alignment control electrode are extended upward in the direction of +/−45 degrees with respect to the gate electrode, and a plurality of alignment control electrodes are densely and parallelly arranged with an interval of 20~40 μm apart from each other. The slender alignment control electrode and the smaller pixel electrode are bent to an angle of 90 degrees at positions proximate to the center of the smaller pixel electrode. Each alignment control electrode arranged in the larger and smaller pixel electrode portions and two common electrodes corresponding to the larger and smaller pixel electrodes are electrically coupled through the contact hole, and stacked with the larger and smaller pixel electrodes separately through the gate insulating film to form two independent capacitors. The source electrode is extended linearly upward in the direction of +/−45 degrees with respect to the gate electrode, and the larger and smaller pixel electrodes, and the slender alignment control electrode are similarly bent to 90 degrees for at least two times at two positions: a position proximate to the center of the larger pixel electrode and a position proximate to the center of the smaller pixel electrode.

In Measure 70, a manufacturing method similar to those of Measures 1, 2, 4, 5, 7, 8, 10, 11, 13, 14, 15 and 16 adopts a first photolithographic process for a gate electrode, two common electrodes, two pixel electrodes divided into larger and smaller regions by the gate electrode, two or more contact pads on the larger pixel electrode forming, and one or more contact pads on the smaller pixel electrode in a basic unit pixel.

The area of the larger pixel electrode is approximately equal to two to four times of the area of the smaller pixel electrode, and a plurality of slits is formed in the larger pixel electrode for controlling the alignment direction of liquid crystal molecules. The plurality of slits are extended upward in the direction of +/−45 degrees with respect to the gate electrode, and the slits are scatterly and parallelly arranged with an interval of 40~60 μm apart from each other and bent to an angle of 90 degrees at a position proximate to the center of the larger pixel electrode.

The larger and smaller pixel electrodes are bent to an angle of 90 degrees at a position proximate to the center of the each pixel electrode, and the gate electrode is bent to an angle of +/−45 degrees.

A second photolithographic process is used for forming a contact pad portion in the larger and smaller pixel electrodes and a contact hole corresponding to one common electrode of the smaller pixel electrode, and the larger and smaller pixel electrodes except the contact hole are completely covered by the gate insulating film.

A third photolithographic process is used for forming a source electrode (video signal electrode), two drain electrodes corresponding to the larger and smaller pixel electrodes, a holdup capacitor (Cst) forming electrode corresponding to larger pixel electrode, and a slender alignment control electrode corresponding to the smaller pixel electrode for controlling the alignment direction of liquid crystal molecules in a basic unit pixel. The two drain electrodes are electrically coupled to the contact pad formed at the larger and smaller pixel electrodes through the contact hole.

The smaller pixel electrode portion and the alignment control electrode are extended upward in the direction of +/−45 degrees with respect to the gate electrode. The plurality of alignment control electrodes are densely and parallelly arranged with an interval of 20~40 μm apart from each other, and bent to an angle of 90 degrees at a position proximate to the center of the smaller pixel electrode. The alignment control electrode and one common electrode corresponding to the smaller pixel electrode are electrically coupled through the contact hole, and stacked with the smaller pixel electrode through the gate insulating film to form a capacitor.

The holdup capacitor (Cst) forming electrode is electrically coupled to the large pixel electrode through the contact hole, and stacked with one common electrode corresponding to the large pixel electrode through the gate insulating film to form a capacitor.

The source electrode is extended linearly upward in the direction of +/−45 degrees with respect to the gate electrode, and bent to an angle of 90 degrees for at least two times in the unit pixel and at two positions: a position proximate to the center of the larger pixel electrode and a position proximate to the center of the smaller pixel electrode.

The threshold voltage for driving liquid crystal molecules of a smaller pixel region of the densely and parallelly arranged alignment control electrode is smaller than that of a larger pixel electrode portion of the scattered and parallelly arranged slender alignment control slit.

In Measure 71, a manufacturing method similar to those of Measures 1, 4, 7, 10, 13 and 15 adopts a first photolithographic process for forming a gate electrode, a comb pixel electrode, at least two contact pads in the comb pixel electrode, a common electrode parallel and proximate to the gate electrode, a source signal screening electrode parallelly extended from the common electrode proximate to both left and right sides of the source electrode (video signal electrode), and a comb common electrode divided from the common electrode and parallelly extended from the comb pixel electrode on the same layer in a basic unit pixel. The electrode width of both comb pixel electrode and comb common electrode is 2~6 μm, and the electrode distance of the two electrodes is 6~18 μm, and the electrode width of the source signal screening electrode is expanded to 10~20 μm. The comb pixel electrode, the comb common electrode and the source signal screening electrode are extended upward in the direction of +/−60 degrees to +/−90 degrees with respect to the gate electrode and bent to an angle of 120 degrees to 180 degrees for at least one time in the unit pixel. A second photolithographic process is used for forming a contact hole on the contact pad portion inside the comb pixel electrode portion. The comb pixel electrode, the comb common electrode and the source signal screening electrode except the contact hole are completely covered by the gate insulating film.

A third photolithographic process is used for forming a source electrode (video signal electrode), a drain electrode and a holdup capacitor (Cst) forming electrode in a basic unit pixel. The source electrode is extended upward in the direction of +/−60 degrees to +/−90 degrees with respect to the gate electrode and bent to an angle of 120 degrees to 180 degrees for at least one time in the unit pixel.

The drain electrode and the holdup capacitor (Cst) forming electrode are electrically coupled to the comb pixel electrode through the contact hole. The holdup capacitor (Cst) forming electrode is stacked with the common electrode through the gate insulating film to form a capacitor.

In Measure 72, a manufacturing method similar to those of Measures 3, 6, 9 and 12 adopts a first photolithographic process for forming a gate electrode, a common electrode parallelly proximate to the gate electrode, a Betta shaped pixel electrode, and at least one contact pad inside the Betta shaped pixel electrode on the same layer in a basic unit pixel. The Betta shaped pixel electrode is extended upward in the direction of +/−60 degrees to +/−90 degrees with respect to the gate electrode, and bent to an angle of 120 degrees to 180 degrees for at least one time in the unit pixel.

A second photolithographic process is used for forming one or more contact holes at positions corresponding to the common electrode and the contact pad. The Betta shaped pixel electrode except the contact hole is completely covered by the gate insulating film.

A third photolithographic process is used for forming a source electrode (video signal electrode), a drain electrode and a comb common electrode in a basic unit pixel. The source electrode and the comb common electrode are extended upward in the direction of +/−60 degrees to +/−90 degrees with respect to the gate electrode and bent to an angle of 120 degrees to 180 degrees for at least one time in the unit pixel.

The drain electrode is electrically coupled to the Betta shaped pixel electrode through the contact hole. The comb common electrode is electrically coupled to the common electrode through the contact hole, and stacked with the gate insulating film through the Betta shaped pixel electrode to form a capacitor.

In Measure 73, a manufacturing method similar to those of Measures 45, 50, 51, 56, 57, 58, 60, 61, 63, 64, 66, 67, 69, 70, the lower layer and the thin film semiconductor layer of the alignment control electrode for controlling the alignment direction of the liquid crystal molecules are sealed substantially in the same shape, and formed by a second photolithographic process and the alignment control electrode is completely covered by the passivation film in the display pixel region.

In Measure 74, a manufacturing method similar to those of Measures 45, 50, 51, 56, 57, 58, 60, 61, 63, 64, 66, 67, 69 and 70 forms the lower layer of the alignment control electrode for controlling the alignment direction of liquid crystal molecules, and the gate insulating film is made of the same material of the gate electrode and substantially in the same shape of the alignment control electrode by a first photolithographic process, and the alignment control electrode is completely covered by the passivation film in the display pixel region.

In Measure 75, a manufacturing method similar to those of Measures 45, 50, 51, 56, 57, 58, 60, 61, 63, 64, 66, 67, 69 and 70 seals the lower layer and the thin film semiconductor layer of the alignment control electrode for controlling the alignment direction of the liquid crystal molecules substantially in the same shape by a second photolithographic process, and the gate insulating film and the gate electrode are made of the same metal material, and substantially in the same shape of the alignment control electrode with, or a shape with a width of several microns by a first photolithographic process, and the alignment control electrode is completely covered by the passivation film in the display pixel region.

In Measure 76, a manufacturing method similar to those of Measures 4, 5, 6, 10, 11, 12, 15 and 16 adopts a photolithographic process for three times, and a passivation film and a liquid crystal alignment film are formed by the same plasma CVD device under a vacuum condition, and the passivation film is larger than the liquid crystal alignment film by the area of a mean seal region.

In Measure 77, a manufacturing method similar to those of Measures 4, 5, 10, 11, 15 and 16 adopts a photolithographic process for three times, and the passivation film is a plasma silicon nitride film (P—SiNx) and the liquid crystal alignment film uses a gas of hexamethyl disiloxane (HMDSO), hexaproply disiloxane (HPDSO), hexamethyl disilazane or hexapropyl disilazane or a mixed gas of two or more of the above as the raw materials of a plasma polymer film, and the two types of films are formed by the same plasma CVD device and maintained in a vacuum condition, and the silicon nitride film (P—SiNx) is larger than the plasma polymerization alignment film by the area of a main seal region.

In Measure 78, a manufacturing method similar to those of Measures 4, 6, 10 and 12 adopts a photolithographic process for three times, and the passivation film is a plasma silicon nitride film (P—SiNx) and the liquid crystal alignment film is a diamond-like carbon film (DLC), and the two types of films are formed continuously by the same plasma CVD device and maintained in a vacuum condition, and the silicon nitride film (P—SiNx) is larger than the DLC alignment film by the area of a main seal region.

In Measure 79, similar to those of Measures 4, 6, 10 and 12 adopts a photolithographic process for three times, manufacturing method, and the passivation film is a plasma silicon nitride film (P—SiNx), and the liquid crystal alignment film is a diamond-like carbon film (DLC), and the two types of films are formed continuously by the same plasma CVD device, and maintained in a vacuum condition, and the silicon nitride film (P—SiNx) is larger than the DLC alignment film by the area of a mean seal region. After the two types of films are formed and maintained in a vacuum condition, the surface of the alignment DLC alignment film is processed in an ion alignment treatment chamber.

In Measure 80, a manufacturing method similar to those of Measures 4, 5, 10, 11, 15, 16 adopts a photolithographic process for three times, and the passivation film uses a silicon nitride film (P—SiNx), and the liquid crystal alignment film uses Unidyne (DAIKIN industrial fluoride series coating material), and the passivation film (P—SiNx) is larger than the liquid crystal alignment film (Unidyne) by the area of a mean seal region.

In Measure 81, a manufacturing method similar to those of Measures 4, 6, 10, 12 adopts a photolithographic process for three times, and the passivation film is a silicon nitride film (P—SiNx), and the liquid crystal alignment film is made of a ladder structured (Ladder Structure) or cage structured (Cage Structure-T8, T10, T12) Silsesquioxan, and the passivation film is larger than the liquid crystal alignment film (Silsesquioxan) by the area of the mean seal region.

In Measure 82, a manufacturing method similar to those of Measures 4, 6, 10 and 12 adopts a photolithographic process for three times, and the passivation film is a silicon nitride film (P—SiNx), and the liquid crystal alignment film is made of bisallylnadiimide, and the passivation film (P—SiNx) is larger than the liquid crystal alignment film (bisallylnadiimide) by the area of a mean seal region.

In Measure 83, a manufacturing method similar to those of Measures 4, 6, 10 and 12 adopts a photolithographic process for three times, and the passivation film is a silicon nitride film (P—SiNx), and the liquid crystal alignment film is made of bicycle(2,2,2)octane tetracarboxylic acid, and the passivation film (P—SiNx) is larger than the liquid crystal alignment film (Bisallylnadiimide) by the area of a mean seal region.

In Measure 84, a manufacturing method similar to those of Measures 1 to 16, and a gate electrode terminal, a source electrode terminal and a common electrode terminal are formed by each electrode terminal produced in a first photolithographic process and each electrode terminal produced in a third photolithographic process, and passed through the contact holes produced in a second photolithographic process and connected to form a two-layer structure, and the total film thickness of each type of electrodes, the gate insulating film and the passivation film of the active matrix glass substrate in the main seal region is equal at the four sides of the perimeter of the display screen.

In Measure 85, this measure relates to a color filter substrate used by an IPS mode and a FFS mode horizontal electric field LCD apparatus, and a thin film of titanium or zirconium of a film thickness of 5~10 nm is formed on the backside of the color filter layer, and then an ion shower doping apparatus injects nitrogen ions to form TiNx or ZrNx, or uses a titanium or zirconium metal target to mix nitrogen gas with argon gas for performing reaction and spluttering, and after a TiNx or ZrNx film of a film thickness of 5~10 nm is formed, the surface of the color filter layer is coated with BM (a light-shielding film) to form a negative photoresist, and a non-masking direct writing exposure method adopting a DMD component is used for an exposure, and a BM pattern corresponding to the source electrode and within a range of 120 degrees to 180 degrees is formed in a unit pixel, and the BM pattern is bent for at least one time. And then, an ink-jet coating method or a planographic printing method is used to form a R, G, B color filter layer, and after a planarization film containing silicon is coated and cured, the ink-jet coating method or the planographic printing method is used for installing a ball spacer at a fixed point corresponding to the gate electrode and the common electrode and in a parallelly arranged region proximate to the center of the BM (light-shielding film).

In Measure 86, this measures relates to a color filter substrate used by a MVA mode vertical alignment LCD apparatus, and a BM (light-shielding film) is coated to form a negative photoresist, and a non-masking direct writing exposure method adopting a DMD component is used for an exposure, and a BM pattern corresponding to source electrode is formed in a unit pixel and bent to an angle of 90 degrees for at least one time and substantially in the same shape of the source electrode. After a R, G, B n-type photoresist color filter is coated, a non-masking direct writing exposure method adopting a DMD component is used for performing an exposure, a color filter layer is formed in the unit pixel, and the BM (light-shielding film) is similarly bent to an angle of 90 degrees for at least one time. After a transparent electroconductive film is formed on the entire surface of the substrate, an n-type photoresist containing silicon is coated a non-masking direct writing exposure method adopting a DMD component is used for performing an exposure, and after an alignment control protruding lump for controlling the alignment direction of liquid crystal molecules is formed, an ink-jet coating method or a planographic printing method is used for installing a ball spacer at a fixed point corresponding to the gate electrode and the common electrode and in a parallelly arranged region proximate to the center of the BM (light-shielding film).

In Measure 87, this measures relates to a color filter substrate used by a MVA mode vertical alignment LCD apparatus, a BM (light-shielding film) is coated to form a negative photoresist, and a non-masking direct writing exposure method adopting a DMD component is used for performing an exposure, and a BM pattern corresponding to source electrode is formed in a unit pixel and bent to an angle of 90 degrees for at least two times and substantially in the same shape of the source electrode. After a R, G, B n-type photoresist color filter is coated, a non-masking direct writing exposure method adopting a DMD component is used for performing an exposure, and similar to the BM (light-shielding film), a color filter layer is formed in a unit pixel, and bent to an angle of 90 degrees for at least two times. After a transparent electroconductive film is formed on the entire surface of the substrate, an n-type photoresist containing silicon is coated, and a non-masking direct writing exposure method adopting a DMD component is used for performing an exposure, and after an alignment control protruding lump for controlling the alignment direction of liquid crystal molecules is formed, an ink-jet coating method or a planographic printing method is used for installing a ball spacer in the corresponding pixel unit and at a fixed point of a parallelly arranged region of the two common electrode proximate to the center of the BM (light-shielding film).

In Measure 88, this measure relates to a color filter substrate used in a MVA mode vertical alignment LCD apparatus, and a BM (light-shielding film) is coated to form a negative photoresist, and a non-masking direct writing exposure method adopting a DMD component is used for performing an exposure to linearly form a BM pattern corresponding to the source electrode. After an ink-jet coating method or a planographic printing method is used to form a R, G, B color filter layer, a transparent electroconductive film is formed on the entire surface of the substrate. And then, an n-type photoresist containing silicon is coated, and a non-masking direct writing exposure method adopting a DMD component is used for performing an exposure, and after an alignment control protruding lump for controlling the alignment direction of liquid crystal molecules is formed, an ink-jet coating method or a planographic printing method is used for installing a ball spacer at a fixed point corresponding to the gate electrode and the common electrode and in a parallelly arranged region proximate to the center of the BM (light-shielding film).

In Measure 89, this measures relates to a color filter substrate used in a MVA mode vertical alignment LCD apparatus, and a BM (light-shielding film) is coated to form a negative photoresist, and a non-masking direct writing exposure method adopting a DMD component is used for performing an exposure to linearly form a BM pattern corresponding to the source electrode. After an ink-jet coating method or a planographic printing method is used to form a R, G, B color filter layer, a transparent electroconductive film is formed on the entire surface of the substrate. And then, an n-type photoresist containing silicon is coated, and a non-masking direct writing exposure method adopting a DMD component is used for performing an exposure. After an alignment control protruding lump for controlling the alignment direction of liquid crystal molecules is formed, an ink-jet coating method or a planographic printing method is used for installing a ball spacer in the corresponding pixel unit and at a fixed point of a parallelly arranged region of the two common electrode proximate to the center of the BM (light-shielding film).

In Measure 90, this measure relates to a horizontal electric field LCD apparatus adopting an active matrix substrate produced by the method of Measure 71 or 72, and a color filter substrate produced by the method of Measure 85. When liquid crystal cells are assembled, a plasma CVD method is used for forming an alignment film on a ball spacer installed at a fixed point.

In Measure 91, this measure relates to a MVA mode vertical alignment LCD apparatus adopting an active matrix substrate produced by the method of Measure 60, 61, 62, 63 or 64, and a color filter substrate produced by the method of Measure 86. When liquid crystal cells are assembled, a plasma CVD method is used for forming an alignment film on a ball spacer installed at a fixed point.

In Measure 92, this measures relates to a MVA mode vertical alignment LCD apparatus adopting an active matrix substrate produced by the method of Measure 68, 69 or 70 and a color filter substrate produced by the method of Measure 87. When liquid crystal cells are assembled, a plasma CVD method is used for forming an alignment film on a ball spacer installed at a fixed point.

In Measure 93, this measure relates to a MVA mode vertical alignment LCD apparatus adopting an active matrix substrate produced by the method of Measure 56, 57 or 58 and a color filter substrate produced by the method of Measure 88. When liquid crystal cells are assembled, a plasma CVD method is used for forming an alignment film on a ball spacer installed at a fixed point.

In Measure 94, this measure relates to a MVA mode vertical alignment LCD apparatus adopting produced an active matrix substrate by the method of Measure 65, 66 or 67, and a color filter substrate produced by the method of Measure 89. When liquid crystal cells are assembled, a plasma CVD method is used for forming an alignment film on a ball spacer installed at a fixed point.

In Measure 95, a first photolithographic process similar to those of Measures 1, 2, 3, 4, 5 and 6 adopts a piece of mask for the halftone exposure, and the mask is comprised of three types of regions: a complete UV photo interrupt region, a UV light semi-transmitting region and a UV light transmitting region, and a region corresponding to a gate electrode portion and a common electrode portion is formed by the complete UV photo interrupt region, and a region corresponding to a pixel electrode is formed by the UV light semi-transmitting region, and a region corresponding to a contact pad portion inside the pixel electrode is formed by the complete UV photo interrupt region, and at least one region corresponding to a contact hole portion exists in the region corresponding to the basic unit pixel electrode.

In Measure 96, a second photolithographic process similar to those of Measures 1, 2, 3, 4, 5 and 6 adopts one piece of mask for the halftone exposure, and the mask is comprised of three types of regions: a complete UV photo interrupt region, a UV light semi-transmitting region and a UV light transmitting region, and a region corresponding to a thin film semiconductor portion of a thin film transistor component is formed by the complete UV photo interrupt region, and a region corresponding to a contact hole portion inside a pixel electrode is formed by the UV light transmitting region, and at least one region corresponding to a contact hole portion exists in the region corresponding to the basic unit pixel electrode.

In Measure 97, a second photolithographic process similar to those of Measures 1, 2, 3, 4, 5 and 6 adopts one piece of mask for the halftone exposure, and the mask is comprised of three types of regions: a complete UV photo interrupt region, a UV light semi-transmitting region and a UV light transmitting region, and a region corresponding to a thin film semiconductor portion of a thin film transistor component is formed by the complete UV photo interrupt region, and a region corresponding to a contact hole portion inside a pixel electrode and a contact hole portion of a common electrode portion is formed by the UV light transmitting region, and at least one region corresponding to the contact hole portion exists in each of the corresponding basic unit pixel electrode portion and basic unit common electrode portion respectively.

EFFECTS OF THE INVENTION

Measures 1 to 16 are used for manufacturing a thin film transistor matrix substrate to reduce the mask manufacturing process as shown in FIGS. 36, 169 and 212, a thin film transistor component (68) of a static charge protection circuit is formed at the periphery of a display region and on the thin film transistor matrix substrate. In FIG. 169, the static charge protection circuit adopts an electrode made of the same material of a common electrode (65), a gate electrode (13) and a source electrode (29). Even if a static charge of a large capacitor is introduced, the electrodes will not be heated up or melted. For a static charge protection circuit made of transparent thin film electrode material such as a pixel electrode, the contact resistance is high, and thus having a heating and melting issue.

For Measures 1 to 16, the pixel electrode can be made of titanium, zirconium, a metal nitride of the above, or an oxygen nitride. The manufacturing process of FIGS. 84 to 86 is used for separating the thin film semiconductor component of FIG. 85 and etching and removing the semiconductor layer and gate insulating film (P—SiNx) on the pixel electrode by using a fluorine-series gas dry etching method. In the foregoing manufacturing process, the pixel electrode cannot be one made of titanium or zirconium nitride or oxygen nitride, since the dry etching selection ratio of titanium or zirconium nitride or oxygen nitride and the gate insulating film (P—SiNx) is low. If Measures 1~16 as shown in FIGS. 3, 4, 5, 8, 9, 27, 28 and 29 are used, a contact pad portion (9) is formed in a pixel electrode portion. If the contact pad portion is made of aluminum alloy, the dry etching selection ratio of the gate insulating film (P—SiNx) is higher, and thus the pixel electrode can be made of titanium, zirconium, a metal nitride of the above, or an oxygen nitride with a thin thickness of 5 nm~15 nm. Similar to the description of Measures 1~16, a contact pad is formed inside the pixel electrode, for protecting the 5~15 nm thin film of titanium nitride or zirconium nitride, and allowing the formation of a contact hole, and thus no ITO or IZO transparent electroconductive film is required in the pixel electrode, and the low-cost titanium or zirconium can be used for spluttering. In FIG. 10, the 5~10 nm titanium nitride thin film provides a light transmission rate of over 80% in the visible light region. In FIG. 11, the 5~10 nm titanium nitride thin film has a surface electric resistance below 30 KΩ, and it can be used as a transparent pixel electrode.

For Measure 17, 18, 20, 21, 23, 24, 26 or 27, abnormal electric discharges occurred in the process of sintering an ITO or IZO metal oxide powder can be reduced significantly since a metal with a low melting point such as titanium or zirconium is used, and thus the yield rate can be improved. The surface of the ITO or IZO conductor film is very rough. The surface will become rougher after a metal film is formed, and thus short circuit occurs easily at the ITO or IZO gate electrode and the source electrode short circuit, and the static charge resistance will be lowered. The surface of a film formed by sputtering with titanium or zirconium metal will be very fine and smooth like a mirror. Therefore, the chance of having a short circuit at the gate electrode and the source electrode will be lowered, and thus improving the yield rate.

In Measures 17, 18, 19, 20, 21, 22, 23, 24, 25, 26, 27, 28, 33, 34, 35 and 36, the ITO and aluminum alloy seldom has a chemical reaction such as a local cell reaction. Even if both gate electrode and pixel electrode are formed on the same layer, no abnormal etching reaction will occur. In the aforementioned manufacturing process as shown in FIGS. 84 to 86, if the pixel electrode is exposed completely exposed, aluminum alloy cannot be used in the source electrode or the drain electrode, and large LCD panels cannot be manufactured. In the present invention, a contact pad is formed on the ITO transparent pixel electrode, and if the transparent pixel electrode except the contact hole is completely covered by the gate insulating film, the occurrence of chemical reaction such as local cell reaction still can be suppressed regardless of the types of electrode material used for the source electrode and the drain electrode.

With doped nitrogen atoms in a region of a second layer (or upper layer) metal of the first film formation used in Measures 29 and 30 as shown in FIG. 122, the halftone exposure manufacturing process as shown in FIGS. 112 to 114 can be used for manufacturing the second layer (or upper layer) metal into a regular conical shape. If the regular conical shape cannot be achieved, defects like wire breaking at the source electrode or the drain electrode and short circuits at the gate electrode and the source electrode or the drain electrode will occur easily, and thus lowering the yield rate. With the present invention, the etching speed for a two-layer interface can be controlled to prevent a drop of yield rate, even if a first layer (or lower layer) metal or a first layer (or lower layer) thin film transparent conductor is stacked with a second layer (or upper layer) metal.

In Measures 17, 18, 19, 20, 21, 22, 23, 26, 31 and 32, after a contact hole is formed on the gate electrode made of aluminum alloy, and a positive photoresist is formed by ashing of the halftone manufacturing process for suppressing the oxidation of the aluminum alloy surface. After a pattern is produced in accordance with the present invention, nitrogen ions are implanted on the aluminum alloy surface by an ion doping device. Unlike the method disclosed in Japanese Patent Laid-Open Publication No. 2001-174848 that an aluminum alloy film is formed by spluttering, and a mixed nitrified gas and argon inert gas are used for performing reaction and spluttering, and nitrogen atoms are doped on the aluminum alloy surface, the present invention does not form an inverted conical shape structure. In the conventional anti-oxidation treatment of the aluminum alloy surface, the aluminum alloy pattern as shown in FIG. 105 will be formed. In the present invention as shown in FIGS. 1, 2, 42, 43, 106, 112, 113, 114 and 176, a surface nitrification treatment can be performed even to the sidewalls of the aluminum alloy pattern, since the whole region of the substrate is reacted with a uniform concentration, and the surface nitrification treatment can be carried out to produce uniform depth, and thus having the advantages of a very good recurrence and a regular conical shape. In the conventional oxidation-resisting method for the aluminum alloy, it is very difficult to carry out nitrification evenly on the entire surface of the substrate, and an inverted conical shape etched form will result easily. In mass production, wire breaking may occurs at the source electrode or the drain electrode easily, and thus such prior art cannot avoid a reduction of the yield rate.

In Measures 17, 20 and 31, a nitrification treatment of the aluminum alloy surface and a nitrification of the pixel electrode can be carried out simultaneously. The present invention uses a nitrogen ion doping method for the surface nitrification treatment, also applies pure copper, copper alloy, pure silver, and silver alloy. With the present invention, no oxide transparent conducting material is used, and only metal is used for forming the gate electrode, the common electrode, the pixel electrode and the contact pad, and thus greatly lower the material cost as well as reducing abnormal electric discharge during spluttering and film formation. The halftone exposure manufacturing process is used for forming patterns, and thus no local cell reaction will occur, and such manufacturing process is applicable for mass production.

In Measures 20, 21 and 22, the uniform ashing process can be adopted even for large substrates. In FIGS. 42 to 45, 106, 112 and 113, a halftone exposure used to develop images in an incompletely exposed area, and keeping a thin portion of the positive photoresist. When an oxygen plasma processing is used for ashing and removing the first layer (or lower layer) metal or the thin film transparent conductor on the whole surface of the substrate, the plasma and electric field produced by the substrate will not interfere a uniform ashing process. FIG. 235 shows a schematic view of the conventional halftone exposure manufacturing process and FIG. 236 shows a schematic view of the halftone exposure manufacturing process of the present invention. Obviously, the precision of producing a pattern is enhanced by the present invention.

In Measures 23, 24, 25, 26, 27 and 28, even if the halftone exposure manufacturing process is used for forming a thin film semiconductor component separation and a contact hole, the existence of the third layer (or upper layer) metal can prevent a poor connection of the source electrode or the drain electrode. Even if the dry etching selection ratio of the third layer (or upper layer) metal and the gate insulating film P—SiNx is low, the sidewall and drain electrode are connected by the third layer (or upper layer) metal as shown in FIG. 239 to achieve a full contact.

In Measures 7, 8, 9, 10, 11 and 12, even if the expensive halftone exposure mask is not used, a general mask still can be used to carry out the halftone exposure manufacturing process. Although the quantity of exposure devices are doubled, the UV projection for the halfly exposed region can be adjusted, and thus the precision of the pattern size is higher than that produced by using a halftone exposure mask.

In Measures 13, 14, 15 and 16, even if an expensive mask is not used, the halftone exposure manufacturing process can be carried out. When the size alignment of the color filter substrate is performed, it is necessary to calculate the size error at a first time, and then the size alignment can be performed according to the corrected CAD data, and thus minimizing the time of adjusting the machines in the production line. The invention simply needs to increase the DMD quantity to cope with a larger substrate size, and thus it can lower the manufacturing cost of the exposure devices for super large substrates.

In Measures 33, 34, 35 and 36, a contact hole can be formed on a contact pad portion in a pixel electrode portion produced by the first halftone exposure manufacturing process. The present invention simultaneously forms a thin film semiconductor component separation and a contact hole of the contact pad portion, and the transparent pixel electrode other than the contact hole is covered completely by the gate insulating film. Even if the cell gap of the LCD panel is below 3 µm or conducting impurities are mixed, the invention can prevent short circuits occurred at the common electrode on a side of the color filter and the pixel electrode at the top and bottom of the TFT matrix substrate. For LCD panel providing a fast response animation display, even if the cell gap is below 2 µm, the manufacturing process of the present invention can still reduce the chance of having pixel defects, and thus improving the yield rate.

In Measures 35 and 36, the oxidation on the surface of the contact pad electrode can be reduced significantly. In FIGS. 182 and 184, contact holes are not created all over, and only a small amount of the gate insulating film is remained, and the oxygen plasma ashes and removes the incompletely exposed thin positive photoresist, and thus the metal surface of the contact pad is not exposed directly in oxygen plasma. In the present invention, a good low-resistance ohmic contact can be achieved without doping nitrogen atoms on the metal surface of the contact pad. Particularly, a very good ohmic contact can be achieved if an aluminum alloy containing over 4 atom % of nickel is used.

In Measures 37, 38, 39, 40, 41 and 42, even if the intensity of backlight is increased, the chance of having a short circuit of the thin film transistor component can be reduced. In the process of performing a component separation as shown in FIGS. 183 and 185, the thin film semiconductor layer is patterned to prevent it from falling out from the gate electrode, and the backlight will not projected directly on the thin film semiconductor layer. If the sidewalls of the thin film semiconductor layer is not ion doped or plasma doped, but replaced by silicon nitride, the electric potential of the gate electrode shifts to the cathode, the positively charged holes are gathered at the interface of the non-doped thin film semiconductor in contact with the gate insulating film, and the resistance is lowered. A large breaking current will flow in when such interface with a low resistance is connected directly to the semiconductor layer, the source electrode and the drain electrode. Even if the sidewalls of the thin film semiconductor layer are ion doped or plasma doped, the doped phosphor n+amorphous silicon film becomes silicon nitride, which will be etched together with the n+amorphous silicon film of the dry etching channel portion, and thus the aforementioned issue does not exist.

In Measure 43, basic thin film transistor components used by the LCD apparatus of the present invention basic are produced. In Measures 1 to 16 of the present invention, a first halftone exposure manufacturing process is used for forming a gate electrode, a pixel electrode, a contact pad inside the pixel electrode, and a common electrode, wherein the common electrode is not necessary. For super large LCD panels, the capacitance of the pixel electrode and the common electrode on a side of the color filter substrate is very large, and sometimes it is not necessary to form a holdup capacitor (Cst). The vertical alignment mode (MVA mode) as shown in FIGS. 14, 16 and 18 can adopt a structure without forming a common electrode used for the holdup capacitor (Cst) in the display pixel region on a side of the TFT substrate If such structure is used, a large hole diameter can be used making the substrate, and thus lowering the power consumption.

In Measures 1, 4, 7, 10, 13, 15, 44, 47 and 48, the holdup capacitor (Cst) forming electrode can be installed in a basic unit pixel, and thus the present invention can be applied in a high-precision LCD apparatus such as a display apparatus of a PC display. In FIGS. 12, 13, 129 and 130, a mask manufacturing process can be used three or four three times for the manufacture of a TN mode TFT matrix substrate, and thus greatly lowering the cost. Unlike Japan Patent Laid-Open Publication No. 2000-066240 and Japanese Published Unexamined Patent No. 2000-206571, the present invention adopts the halftone exposure manufacturing process to form a channel of the thin film transistor portion, and thus the length of the channel is not changed easily, and a very good recurrence can be achieved, and the size management in mass production can be achieved easily. Therefore, the present invention is suitable for the production of high-precision LCD panels such as SXGA and UXGA.

In Measures 2, 5, 8, 11, 14, 16 and 45, it is not necessary to install the holdup capacitor (Cst) forming electrode in a basic unit pixel for the manufacture of a super high-precision vertical alignment LCD apparatus. In the present invention as shown in FIGS. 15, 17, 19 and 53, a source electrode or a drain electrode is formed while an alignment control electrode for controlling the inclined direction of vertical alignment liquid crystal molecules is formed. The electrode width of the alignment control electrode of the present invention depends on the resolution of the exposure device. In mass production, the resolution of the projecting exposure device is 3~4 μm, and this value is used for designing the width of the alignment control electrode. In a slit electrode or a protruding lump of the conventional vertical alignment LCD panel, if the width of a pattern is 6~10 μm, then the width of the alignment control electrode will be more than two times of the alignment control electrode of the present invention. Light is not transmitted in the regions of the conventional alignment control slit and protruding lump. With the alignment control electrode of the present invention, the light transmission rate can be improved. In the present invention as shown in FIGS. 23 and 24, the pixel electrode (11) and the alignment control electrode (46) form a capacitor through the gate insulating film (18), and thus it is not necessary to form a holdup capacitor (Cst) forming electrode holdup capacitor (Cst). If the pixel electrode (11) and the alignment control electrode (46) are 0.3~0.5 μm thick, which is very close to the cell gap of 2~4 μm, a strong electric field can be produced. The invention can provide a faster response of liquid crystal molecules than the conventional vertical alignment LCD panel adopting the slit or protruding lump, and the invention can be used for animation display without any blurred image.

In Measures 1, 4, 7, 10, 13, 15, 46, 52 and 71, a mask manufacturing process is used for three or four times to manufacture a TFT matrix substrate of a horizontal electric field (IPS mode) LCD apparatus. In FIGS. 30, 152, 233, 27 and 28, the present invention forms a comb pixel electrode (60) for driving liquid crystal molecules, a comb common electrode (59) and a common electrode (58) used for source electrode signal screening on the same layer. The foregoing three electrodes except the contact pad are completely covered by the gate insulating film (18) and the passivation film (30), and the ghosting effect frequently occurred in the horizontal electric field will not occur easily. For IPS mode, the aforementioned three electrodes do not need to use transparent electrodes, and thus the present invention can use any metal, as long as the metal does not produce a local cell reaction with aluminum alloy and can selectively etch aluminum alloy, and thus the invention provides a very flexible selection of materials. For the anti-oxidation treatment of the aluminum alloy in accordance with the present invention, titanium or zirconium is selected as the first layer (or lower layer) metal, and titanium or zirconium can enhance visible light transmission rate and lower electric resistance when nitrogen ions are injected. Even the TFT substrate produced by three or four times of photolithographic process, a high visible light transmission rate for the mass production of horizontal electric field LCD panels can be achieved.

In Measures 3, 6, 9, 12, 53 and 72, three or four times of mask manufacturing process are adopted for manufacturing the TFT matrix substrate of a horizontal electric field FFS mode LCD apparatus. The transparent pixel electrode of the present invention as shown in FIGS. 31 and 29 can be made of titanium nitride or zirconium nitride, and aluminum alloy is used as the second layer (or upper layer) metal for the gate electrode, the common electrode or the contact pad, and no local cell reaction will occur. For the FFS mode, the pixel electrode (43) and the comb common electrode (59) produce a large capacitor, and thus a small pixel size will not result in an insufficient capacitance, and the invention can be used for manufacturing super high-precision LCD apparatus.

In Measure 1, 4, 7, 10, 13, 15, 49, 50 and 51, the viewing angle of the TN mode LCD panel or vertical alignment mode (MVA) LCD panel can be expanded and a RGB γcorrection can be performed. The circuit model of the basic unit pixel in accordance with the present invention is shown in FIG. 210, and two sub pixels exist in the basic unit pixel, and two TFTs are used for driving the two sub pixels. The voltage with different polarity of a rectangular wave signal A is applied to two COM electrodes as shown in FIG. 211 to vary the threshold voltage for driving liquid crystal molecules of the two sub pixels, so as to overcome the viewing angle of the TN mode or vertical alignment mode, and the wide viewing angle can be used for achieving a high contrast.

In Measures 1, 4, 7, 10, 13, 15, 54, 55, 59 and 62, the negative dielectric anisotropic liquid crystal molecules of the vertical alignment mode LCD panel can fall towards four different directions to achieve a display with a wide viewing angle. With the TFT matrix substrate as shown in FIGS. 14, 16, 100, 101, 240 and 241 and the color filter substrate as shown in FIGS. 20 and 21, the inclined directions of the liquid crystal molecules can be determined as shown in the cross-sectional view of the structure of liquid crystal cells in FIGS. 25 and 26.

FIGS. 18, 102 and 242 show planar view of a source electrode (video signal line) proximate to the center of a pixel being bent to 90 degrees, and FIG. 22 shows a color filter substrate corresponding to the TFT matrix substrate.

Regardless of a linear structure of the source electrode or a structure bent to 90 degrees, the inclined directions of the liquid crystal molecules of the present invention are set to four directions of ±45 degrees, ±35 degrees with respect to the gate electrode, so that the polarization axis of a polarizer can be extended in a direction parallel or perpendicular to the gate electrode to improve the efficiency of using the polarizer.

In the present invention, three or four times of photolithographic process can be adopted for manufacturing a four-domain type vertical alignment liquid crystal mode TFT matrix substrate, and lowering the manufacturing cost.

In Measure 2, 5, 8, 11, 14, 16, 56, 57, 60, 63, the negative dielectric anisotropic liquid crystal molecules of the vertical alignment mode LCD panel can fall towards four different directions to achieve a display with a wide viewing angle. With the TFT matrix substrate as shown in FIGS. 15 and 17 and the color filter substrate as shown in FIGS. 20 and 21, the inclined directions of the liquid crystal molecules can be determined as shown in the cross-sectional view of the structure of liquid crystal cells in FIGS. 23 and 24.

Since the alignment control electrode (46) and the pixel electrode (11) are formed on the same layer of the source electrode (video signal line) and separated by the thickness of the gate insulating film only, a strong electric field occurs at a position proximate to the alignment control electrode, and thus a fast response of liquid crystal molecules can be achieved. When a slit is formed on the pixel electrode (11), the width of the liquid crystal cell gap must be two times of the width of the slit. However, alignment control electrode (46) of the present invention just require an electrode width substantially equal to the liquid crystal cell gap to provide a sufficient effect. Therefore, the numeric value of the hole diameter can be increase substantially.

FIGS. 19 and 53 show the planar views of a source electrode (video signal line) being bent to 90 degrees at a position proximate to the center of the pixel. FIG. 22 shows a color filter substrate corresponding to the TFT matrix substrate. FIGS. 54 to 56 shows a cross-sectional view of a structure of the liquid crystal cell produced by the TFT matrix substrate as shown in FIG. 53 and the color filter substrate as shown in FIG. 22.

In the vertical alignment mode LCD apparatus, an alignment control electrode is used for controlling the alignment direction of liquid crystal molecules of an LCD panel as disclosed in Japanese Patent Laid-Open Publication No. H-07-230097, Japanese Patent Laid-Open Publication No. H-11-109393 and Japanese Patent Laid-Open Publication No. 2001-042347. In these prior arts as shown in FIGS. 107 to 111, the alignment control electrode is exposed from the surface of the TFT matrix substrate to form a structures in direct contact with the vertical alignment film, and a part of the whole of the pixel electrode is exposed from the surface of the TFT matrix substrate to form a structure in direction contact with the vertical alignment film. In such structure, even a small discrepancy between the average electric potential of the alignment control electrode and the electric potential of the common electrode of the corresponding color filter substrate of the TFT matrix substrate will cause a ghosting or cross-talk phenomenon. In FIGS. 107 and 108, the electric potential of the alignment control electrode so produced is equal to the electric potential of the common electrode, but a very small discrepancy between the average electric potential of the pixel electrode and the electric potential of the common electrode still causes a ghosting or cross-talk phenomenon. Since the present invention adopts a passivation film to cover both pixel electrode and alignment control electrode completely, they are not in touch with the vertical alignment film, and thus preventing a ghosting or cross-talk phenomenon.

In the present invention, regardless of a linear structure of the source electrode or a structure bent to 90 degrees, the inclined directions of the liquid crystal molecules are set to four directions of ±45 degrees and ±135 degrees with respect to the gate electrode, and three or four times of photolithographic process are used for manufacturing a four-domain type vertical alignment liquid crystal mode TFT matrix substrate, and lowering the manufacturing cost.

In Measure 1, 2, 4, 5, 7, 8, 10, 11, 13, 14, 15, 58, 61 and 64, the negative dielectric anisotropic liquid crystal molecules of the vertical alignment mode LCD panel are inclined in four different directions to provide a wide viewing angle, and a RGB γ-correction is performed. For example, the source electrode (video signal line) of the TFT matrix substrate is perpendicular to the slender gate electrode, the source electrode (video signal line) as shown in FIGS. 87 88 and 189 is bent upward in an angle of ±45 degrees with respect to the gate electrode as shown in FIGS. 89, 97, 218 222, 223 and 227. In the present invention as shown in FIG. 90, a region (Region B) occupies ⅔ to ⅘ of the area of the pixel electrode, and a slit is formed in the pixel electrode, and another region (Region A) occupies the remaining ⅕ to ⅓ of the area of the pixel electrode, and the alignment control electrode is formed on the pixel electrode through the gate insulating film as shown in FIG. 91. The threshold voltage for driving vertical alignment liquid crystal molecules in Region B is smaller than the threshold voltage in Region A, and the dependency of the γ property to the viewing angle can be reduced. Since the present invention does not use the driving circuit to control the threshold voltage, therefore the driving circuit similar to the prior art can be used for the same purpose without incurring a higher cost.

In FIGS. 243 and 244, the present invention uses a passivation film (P—SiNx) for completely covering both pixel electrode and alignment control electrode, therefore the vertical alignment film and the pixel electrode or the alignment control electrode are not in direct contact with each other. If the alignment film and the pixel electrode are in direct contact with each other, and a discrepancy occurs between the average electric potential of the common electrode on a side of the color filter substrate and the pixel electrode on a side of the TFT matrix substrate, a large portion of the voltage is applied to the alignment film, and thus causing a ghosting or crosstalk phenomenon easily. When the pixel electrode is covered completely by the gate insulating film, and the voltage is applied to the gate insulating film and the alignment film, only a very small portion of the voltage is allocated for the alignment film, and thus the ghosting or cross-talk phenomenon will not occur easily.

In Measure 1, 4, 7, 10, 13, 15, 65 and 68, the negative dielectric anisotropic liquid crystal molecules of the vertical alignment mode LCD panel are inclined in four different directions to provide a wide viewing angle and a RGB γ-correction is performed. The circuit model of the basic unit pixel of the present invention as shown in FIG. 210 uses one gate electrode to control two TFTs, and the pixel electrode is composed of sub pixel (A) and sub pixel (B). Two holdup capacitors (Csa and Csb) are formed by two common electrodes and the gate insulating film corresponding to each sub pixel. The driving signal waveform is shown in FIG. 211, and a signal waveform with a phase difference of 180 degrees is applied on the two common electrodes, and different from the virtual voltage of the image signal voltage of the written-in sub pixel (A) and sub pixel (B). The threshold voltage of the sub pixel (A) is smaller than that of the sub pixel (B), and thus the invention can greatly enhance the dependence of the γ property to the viewing angle. The present invention uses a slit formed on the pixel electrode for controlling the inclined direction of the liquid crystal molecules, and the source electrode (video signal line) is perpendicular to the gate electrode linear as shown in FIGS. 200 and 201, and the corresponding color filter is shown in FIGS. 202 and 203. The source electrode (video signal line) bends the gate electrode ±45 degrees upward as shown in FIG. 228. The present invention adjusts the signal voltage applied on two independent common electrodes in the basic unit pixel to freely change the threshold voltage of the sub pixel (A) and the sub pixel (B). The voltage of the common electrodes can be changed according to the viewing angle, so as to display the best image.

In Measure 2, 5, 8, 11, 14, 16, 66 and 69, the negative dielectric anisotropic liquid crystal molecules of the vertical alignment mode LCD panel are inclined in four different directions to provide a wide viewing angle, and the RGB γ-correction can be performed, and a fast response for animation display can be achieved. In the circuit model of the basic unit pixel of the present invention as shown in FIG. 210, one gate electrode controls two TFTs, and the pixel electrode is composed of sub pixel (A) and sub pixel (B), and two holdup capacitors (Csa and Csb) are formed by the connected alignment control electrode (46) and gate insulating film through two common electrodes corresponding to each sub pixel. The driving signal waveform is shown in FIG. 211, and a signal waveform with a phase difference of 180 degrees is applied on the two common electrodes, and different from the virtual voltage of the image signal voltage of the written-in sub pixel (A) and sub pixel (B). The threshold voltage of the sub pixel (A) is smaller than that of the sub pixel (B), and thus the invention can greatly enhance the dependence of the γ property to the viewing angle. The present invention forms an alignment control electrode on a gate insulating film covered onto the pixel electrode for controlling the inclined direction of liquid crystal molecules. For example, the source electrode (video signal line) perpendicular to the gate electrode as shown in FIGS. 231 and 232 is bent to ±45 degrees upward with respect to the gate electrode as shown in FIGS. 208 and 229. The pixel electrode and the alignment control electrode are proximate to each other through the gate insulating film, and a strong electric field can be produced even with a small voltage, and thus driving the vertical alignment liquid crystal molecules in a high speed.

In Measures 1, 2, 4, 5, 7, 8, 10, 11, 13, 14, 15, 16, 67 and 70, the negative dielectric anisotropic liquid crystal molecules of the vertical alignment mode LCD panel are inclined in four different directions to provide a wide viewing angle and a RGB γ-correction is performed. For example, the source electrode (video signal line) of the TFT matrix substrate perpendicular to the gate electrode as shown in FIGS. 204 and 205 is bent ±45 degrees upward with respect to the gate electrode as shown in FIGS. 208, 207 and 230. The circuit model of the basic unit pixel of the present invention as shown in FIG. 210, and one gate electrode controls two TFTs, and the pixel electrode is divided completely into two regions: sub pixel (A) and sub pixel (B) by the gate electrode, and the two common electrodes corresponding to the two sub pixels exist in the basic unit pixel. The alignment control electrode connected to the common electrode corresponding to sub pixel (A) form the pixel electrode and the holdup capacitor (Csa) through the gate insulating film, and the electrode formed by holdup capacitor holdup capacitor (Csb) and the pixel electrode connected to a common electrode corresponding to the sub pixel B) forms a holdup capacitor (Csb) through the gate insulating film. The driving signal waveform is shown in FIG. 211, and a signal waveform with a phase difference of 180 degrees is applied on the two common electrodes, and different from the virtual voltage of the image signal voltage of the written-in sub pixel (A) and sub pixel (B). The threshold voltage of the sub pixel (A) is smaller than that of the sub pixel (B), and thus the invention can greatly enhance the dependence of the γ property to the viewing angle The sub pixel (A) of the present invention uses the alignment control electrode covered onto the gate insulating film of the pixel electrode for controlling the inclined direction of liquid crystal molecules, and the sub pixel (B) uses the slit formed on the pixel electrode for controlling the inclined direction of liquid crystal molecules. Since the present invention comes with a strong electric field on the sub pixel (A), therefore the threshold voltage of the sub pixel (A) is much smaller than the threshold voltage of the sub pixel (B). Even if a very small signal voltage is applied to the two common electrodes, the dependency of the γ property to the viewing angle can be enhanced significantly With Measures 13, 14, 15, 16, 85, 86, 87, 88 and 89, the super large LCD panels can be mass produced in factories in near future, and fast response LCD panels used for animation and featuring low price and good yield rate can be produced. The problem of using large glass substrates to produce LCD panels resides in the absolute size alignment of TFT substrates and color filter substrates. If TFT substrates or color filter substrates are exposed, the cost of large mask will be very high, and it also will take 12 months for the delivery of the mask. If the absolute size alignment of the TFT substrate and color filter substrate is not precise, a rework of the large mask will take several months and will delay the manufacturing schedule. Since the present invention does not use large masks, but simply uses a DMD direct writing exposure device for the manufacture, therefore manufactures just need to modify the CAD data in a computer to carry out an overall absolute size alignment. Therefore, an absolute size tester can be used as a standard for adjusting the exposure property of the DMD direct writing exposure device easily to eliminate the poor property of the exposure device in a short time.

Since the present invention can use the DMD direct writing exposure device for the halftone exposure, therefore the film thickness of the positive photoresist of the halftone exposure region can be adjusted freely in the whole area of a large substrate. Even if the ashing of a positive photoresist ashing device is very uneven, the film thickness of the positive photoresist can be adjusted according to the unevenness of the ashing to minimize any change to the manufacturing size and precision, and thus improving the yield rate. In the meantime, 3~4 times of photolithographic process can be used for manufacturing TFT substrates, and thus greatly lowering the production cost.

The present invention can reduce the time to eliminate poor properties of the exposure device by the exposure manufacturing process that adopts a DMD direct writing exposure device. Further, the CAD data can be changed to cope with different types of productions, and thus maintaining the production efficiency for the manufacture of small quantity of various different types of products. Since the gate electrode and the common electrode used in the TFT matrix manufacturing process of the present invention are installed proximate to each other, the pattern width of the BM (light-shielding film) of the color filter substrate corresponding to that region is large, so that an ink-jet coating method or a planographic printing method can be used for installing ball spacer at a fixed point. Using photolithography to form the ball spacer can greatly lower costs, and provide a fast response of liquid crystal molecules. Even if the cell gap is below 3 μm, the elastic deformation of the ball spacer is large and can prevent remained bubbles and uneven gravity, so as to maintain the yield rate in the ODF manufacturing process.

In Measure 2, 5, 8, 11, 14, 16, 45, 50, 51, 56, 57, 58, 60, 61, 63, 64, 66, 67, 69, 70, 73, 74 and 75, the height of the alignment control electrode is adjusted to change the distribution of electric fields of the pixel electrode, the alignment control electrode and the common electrode of the color filter substrate of the TFT matrix substrate. In FIGS. 23, 54, 55 and FIG. 56, each layer can be installed at the lower layer of the alignment control electrode. If the height of the alignment control electrode is changed as shown in FIG. 56, all regions are stacked, and the height of the alignment control electrode is equal to or greater than 1 µm, and optimized by the cross-section to form a natural alignment control protruding lump (50) with the same functions on a side of the color filter substrate.

The prior art as shown in FIGS. 107 and FIG. 108, the photolithographic process as shown in FIG. 107 is taken place for six times, and the photolithographic process as shown in FIG. 108 is taken place for five times. The photolithographic process of the present invention as shown in FIGS. 23, FIG. 54, 55 and 56 is taken place for three or four times to complete manufacturing a TFT matrix substrate with a lower cost.

Both alignment control electrode and pixel electrode of the prior art as shown in FIGS. 107, 108 and 245 are in direct contact with the alignment film. Since the electric field is concentrated at the edges of the alignment control electrode, therefore ghosting occurs easily when the alignment film is divided into polarities or electrolyzed, and thus causing a reliability issue. In the present invention as shown in FIGS. 23, 54, 55 and 56, the pixel electrode and the alignment control electrode are covered by the insulating film completely, and thus avoiding the electric field to be concentrated at the alignment film, and reducing the ghosting phenomenon and improving reliability. Further, the prior art as shown in FIGS. 109, 110 and 245, the pixel electrode does not form any alignment control slit or protruding lump on the common electrode, so that when the pixel electrode becomes larger, the response speed of the liquid crystal molecules becomes slower, and alignment direction of liquid crystal molecules cannot be controlled precisely, and thus causing uneven display. Therefore, the prior art as shown in FIG. 109 cannot be used in this case. The structure as shown in FIGS. 110 and 245 is used for manufacturing a display apparatus for large LCD TV, and the present invention is illustrated in FIGS. 23, 24, 54 55 and 56. Since the alignment control slit or protruding lump is formed on the common electrode corresponding to the pixel electrode, and combined with the alignment control electrode installed on the pixel electrode for accurately controlling the alignment direction of liquid crystal molecules, and avoiding identification lines, and fully preventing any uneven display. With the present invention, the reliability is improved, the cost is lowered, the yield rate is improved, and a large LCD TV panel with uniform display is provided In Measures 4, 5, 6, 10, 11, 12, 15, 16, 76, 77 and 78, the photolithography is carried out for three times to complete the TFT matrix manufacturing process, and the conventional manufacturing process including transferring the alignment film is switched from the liquid crystal cell manufacturing process to the TFT matrix manufacturing process to omit some manufacturing processes.

After the alignment film is produced by the conventional manufacturing process after the TFT substrate is cleaned, a polyidmide alignment film is coated by a soft printing method and sintered at 220~230 degrees for several tens of minutes, the MVA mode is rinsed by pure water. After drying, a vacuum and heating process is performed for several tens of minutes for dehydration, and then the ODF manufacturing process is started. The present invention adopts a screening film formation method after the TFT matrix manufacturing process, and uses a plasma CVD device to form a portion of passivation film (P—SiNx), and uses the same plasma CVD device for an alignment film under a vacuum condition by a plasma polymerization method, and thus greatly simplifying and shortening the manufacturing process. The present invention uses a plasma CVD device as shown in FIG. 59 to form a passivation film (P—SiNx) and a plasma polymerization alignment film in different processing chambers. While the vacuum condition is maintained, the film formation continues, so as to provide an even surface of the alignment film, prevent an uneven alignment, and improve the yield rate. The MVA vertical alignment film adopts a gas of hexamethyl disiloxane (HMDSO) and hexaproply disiloxane (HPDSO) of as shown in FIG. 60, or hexamethyl disilazane or hexapropyl disilazane as shown in FIG. 61, or a mixed gas of the abovementioned two kinds of gases as raw material, and performs a plasma discharge in the vacuum processing chamber, so as to easily integrate a vertical alignment plasma polymer film. The TN mode, IPS and FSS mode alignment film adopts methane, ethane, ethylene, acetylene, benzene or toluene gas as raw material to form a diamond-like carbon (DLC) film in a vacuum processing chamber. The film thickness of the alignment film can be only a few nanometers for providing sufficient functions. Compared with the polyidmide alignment film of the prior art, the invention uses a low-cost gas to lower the operation cost by approximately 1%. In FIG. 37, the passivation film (P—SiNx) is larger than the plasma polymerization alignment film by the area of the main seal portion, and thus the invention can prevent poor seals or connections.

If the plasma polymerization method is used in the present invention, a 3-meter glass substrate without pinholes or uneven alignment films can be produced in a very short time, and the plasma CVD device comes with a self-cleaning function, and requires a minimum maintenance, and a good recurrence of plasma polymer films can be achieved.

In Measure 4, 6, 10, 12 and 79, the photolithography is carried out for three times to complete the TN mode, IPS mode and FSS mode TFT matrix manufacturing process, and the alignment film formation process and the direction alignment process of the conventional liquid crystal cell manufacturing process can be moved to the TFT matrix manufacturing process to simplify the manufacturing process. The conventional TN mode, IPS mode and FSS mode alignment film formation process and direction alignment process are taken place after the TFT substrate is cleaned, and a soft printing method is used for coating a polyidmide alignment film. After a sintering process is taken place at 220~230 degrees for several tens of minutes, a rubbing method is used for the direction alignment process, and then cleaning and drying are performed, and dehydration is taken place in vacuum for several tens of minutes, and then the ODF manufacturing process is performed. The present invention adopts a screening film formation method after the TFT matrix manufacturing process, and uses a plasma CVD device to form a portion of passivation film (P—SiNx), and then uses the same plasma CVD device while maintaining a vacuum condition to form an alignment film by the plasma polymerization method, and then the vacuum condition is maintained to perform an ion alignment in the vacuum processing chamber, and thus simplifying and shortening the manufacturing process. The present invention adopts the plasma CVD device and the ion alignment device as shown in FIG. 58 to form the complex vacuum device that integrates the aforementioned two devices. The passivation film (P—SiNx) and the plasma polymerization alignment film are formed in different processing chambers, and the ion alignment is performed in another independent processing chamber. The TN mode, IPS mode and FSS mode alignment film adopts a diamond-like carbon (DLC) film that uses a raw material of hydrocarbon gas such as methane, ethane, ethylene, acetylene, benzene or toluene as raw material. The film thickness of the alignment film can be a few nanometers for providing a sufficient function. Compared with the cost of the polyidmide alignment film of the prior art, the invention can use a low-cost material for the manufacture and lower the operation cost by approximately 1%. In FIG. 37, the passivation film (P—SiNx) is larger than the plasma polymerization alignment film by the area of a main seal region, and thus preventing poor seals and connections.

After the present invention forms the plasma polymerization alignment film, a vacuum condition is maintained and an ion alignment is performed directly in the ion alignment treatment chamber, and then the ODF manufacturing process can be started immediately. No preliminary rubbing, cleaning, drying, vacuum, dehydration or gas removal is required. The ion alignment and rubbing alignment are different, and no contaminants or dusts will be deposited on the surface of the alignment film, and the uniform direction alignment can be maintained, so as to greatly improve the yield rate and reliability. The rubbing alignment process requires a frequent change of Velver, and the production line must be stopped to change the Velver, and thus lowering the operation efficiency of the rubbing machines. The ion alignment machine of the present invention can be operated continuously for over 700 hours without any maintenance during such operation period, and thus a good recurrence can be achieve in the alignment process.

The ion alignment processing method and the rubbing alignment processing method are compared. Since there is no strict limitation on the alignment film material, almost all materials can be used, and there is no significant mechanical force acted on the alignment film, and thus the alignment film will not peeled off or cracked easily. Therefore, if the ion alignment processing method is adopted, the thickness of the alignment film can be reduced significantly as long as there is no pinhole, and the material cost can be reduced greatly.

In Measure 4, 5, 6, 10, 11, 12, 15, 16, 80, 81, 82 and 83, a new, low-cost, and heat resisting material can be used as an alignment film for liquid crystals, and thus greatly lowering the operation cost. Particularly, the TN mode, IPS mode and FFS mode can use ion alignment, to overcome the materials having no alignment function and used in the conventional rubbing process. The invention provides a very flexible way of selecting materials. To assure the reliability of TFT, a P—SiNx or P—SiCNx film with alkali ions having a high screening property is used as the passivation film. In FIG. 37, the formed passivation film is larger than the coated alignment film by the area of a main seal region, and thus the invention can prevent peeling due to poor seals and connections. The rough surface of the TN mode, IPS mode and FFS mode TFT substrate surface affects the alignment process adversely, and thus it is necessary to coat an alignment film as thick as possible to planarize the rough surface of the TFT substrate in order to achieve the high contrast. In the present invention, an ink-jet coating method or a planographic printing method is used for coating an alignment film, and since the surface of the substrate is covered by the passivation film, and the surface can be maintained uniform, and the coating liquid will not sprinkle or the occurrence of pin holes can be reduced.

With Measures 77, 78, 79, 90, 91, 92, 93 and 94, marks or unevenness at the periphery of the ball spacer can be prevented. If the plasma polymerization method is used for forming an alignment film, the roughness of a surface no longer is a factor anymore, since a uniform polymerization film can be formed on almost any surface without any issue of sprinkling a coating liquid or having pin holes. Since the plasma polymerization method is a dry method, therefore it does not require using a large quantity of toxic organic solvents for the coating (as needed in the conventional coating method). The clean room has no air pollution problem at all. When the present invention performs the TN mode, IPS mode and FFS mode alignment process, the ion alignment processing method is adopted, and thus no significant mechanical force is acted on the ball spacer installed at a fixed point, and the ball spacer will not be peeled off.

After a plasma polymer film is formed, the ball spacer is installed at a fixed point in the manufacturing process, and after the dispersing liquid of the ball spacer is dried, marks will remain easily, and the alignment will be inconsistent. Further, the bonding force between the plasma polymer film and the ball spacer is weak, a mechanical force exerted on the ball spacer during the ODF manufacturing process of bonding the TFT substrate with the color filter substrate may peel the ball spacer off from the alignment film peel. With the present invention, the foregoing shortcomings can be overcome.

In Measure 1 to 16 and 84, even the photolithographic process is performed for three times to manufacture the TFT matrix substrate, a uniform cell gap can be formed, and thus uneven display caused by abnormal cell gaps will not happen. FIGS. 32, 33 and FIG. 170 show cross-sectional views a connecting terminal and a main seal region of the MVA mode LCD panel and FIGS. 167 and FIG. 168 show the cross-sectional views of a connecting terminal and a main seal region of the TN mode LCD panel, and FIGS. 34, 35 and 171 show the cross-sectional views of a connecting terminal and a main seal region of the IPS mode LCD panel in accordance with the present invention. For any liquid crystal mode, both gate terminal and source electrode terminal forms a structure of stacking a gate electrode and a source electrode on a main seal region, and the main seal region served as a boundary between the interior and the exterior of liquid crystal cell is passed through the contact hole with a double bonding. The source electrode is designed to be rougher than the gate electrode, and the source electrode is completely covered gate electrode. A main seal region of a connecting terminal as shown in FIG. 170 and FIG. 171 outside the region without the gate electrode and the source electrode portion has a virtual gate electrode and a virtual source electrode, and the thickness of the main seal region is maintained evenly around the four sides of the periphery of the display screen. The passivation film (P—SiNx) formed on the TFT substrate is in contact with the main seal, and the gate electrode and source electrode of the TFT substrate are electrically insulated. With such structure, the TFT matrix manufacturing process can be simplified, and poor cell gap of the LCD panel can be prevented, so as to assure the reliability of the LCD panel.

With Measures 95, 96 and 97, a halftone exposure mask is used for manufacturing the TFT matrix substrate, and thus the number of positive photoresist exposure can be reduced to 3~4 times to achieve the effects of reducing the manufacturing time and lowering the manufacturing cost.

Although the DMD direct writing exposure method can be achieve the same effects, the resolution of the DMD component is limited to 7~8 $\mu$m. When the halftone exposure mask of the invention is used, the projecting exposure optical system can provide a resolution of 3~4 $\mu$m, and thus we can produce large screen supper high-precision LCD apparatus for a medical display apparatus with a low cost.

With the use of the mask of the present invention, even if the number of exposure devices is not increased, the same flux used in the prior art can be used for the exposure, so that manufacturers can lower the invested capital at the early stage and the spacer of the clean room.

BRIEF DESCRIPTION OF THE DRAWINGS

FIG. 4 is a cross-sectional view of a manufacturing process of forming a source electrode, a drain electrode, a terminal electrode, and a holdup capacitor (Cst) for forming an electrode or a liquid crystal alignment control electrode in accordance with the present invention;

FIG. 5 is a cross-sectional view of forming a passivation film of a TFT matrix substrate and a liquid crystal alignment film in accordance with the present invention;

FIG. 37 is a planar view of a mask deposition P—SiNx (passivation) film, and a main sealed and aligned film in accordance with the present invention;

FIG. 38 is a schematic view of a manufacturing process that uses a halftone exposure method for two times and a mask manufacturing process for three times in accordance with the present invention;

FIG. 39 is a schematic view of a manufacturing process that uses a halftone exposure method for two times and a mask manufacturing process for three times in accordance with the present invention;

FIG. 40 is a schematic view of a manufacturing process that uses a halftone exposure method for two times and a mask manufacturing process for three times in accordance with the present invention;

FIG. 41 is a schematic view of a manufacturing process that uses an IPS mode or FFS mode color filter substrate in accordance with the present invention;

FIG. 46 is a schematic view of a manufacturing flow of forming a gate electrode, a pixel electrode and a common electrode by halftone exposure in accordance with the present invention;

FIG. 47 is a schematic view of a manufacturing flow of forming an amorphous silicon island and a contact hole by halftone exposure in accordance with the present invention;

FIG. 48 is a schematic view of a general exposure process flow for forming a source electrode, a drain electrode and an alignment control electrode in accordance with the present invention;.

FIG. 59 is a planar view of a multi-processing chamber type vacuum device in accordance with the present invention;

FIG. 60 shows a series of silsesquioxanes compounds that use a plasma polymerization and alignment film material in accordance with the present invention;

FIG. 61 shows a series of silazane compounds that use a plasma polymerization and alignment film material in accordance with the present invention;

FIG. 64 shows a bisallylnadiimide compound coated with a planarization film as well as an alignment film by an ink-jet coating device in accordance with the present invention;

FIG. 71 is a cross-sectional view of a mask used for halftone exposure as shown in FIGS. 68 and 70;

FIG. 77 is a schematic view of a TFT matrix manufacturing process that uses a halftone double exposure method for two times in accordance with the present invention;

FIG. 78 is a schematic view of a TFT matrix manufacturing process that uses a halftone double exposure method for two times in accordance with the present invention;

FIG. 79 is a schematic view of a TFT matrix manufacturing process that uses a halftone double exposure method for two times in accordance with the present invention;

FIG. 80 is a planar view of a DMD non-masking direct writing halftone exposure device in accordance with the present invention;

FIG. 82 is a schematic view of a manufacturing process of a third photolithographic process that uses a DMD halftone exposure method for two times in accordance with the present invention;

FIG. 83 is a schematic view of a manufacturing process of a third photolithographic process that uses a DMD halftone exposure method for two times in accordance with the present invention;

FIG. 94 is a planar view of a general mask used for Step (i) of a third halftone double exposure manufacturing process used for MVA mode as shown in FIG. 78 in accordance with the present invention;

FIG. 95 is a planar view of a general mask used for Step (ii) of a third halftone double exposure manufacturing process used for MVA mode as shown in FIG. 78 in accordance with the present invention;

FIG. 96 is a planar view of a general mask used for Step (i) of a second halftone double exposure manufacturing process used for MVA mode as shown in FIG. 78 in accordance with the present invention;

FIG. 103 is a schematic view of a manufacturing process of a third photolithographic process that uses a DMD halftone exposure method for two times and a DMD general exposure method for one time in accordance with the present invention;

FIG. 104 is a schematic view of a manufacturing process of a third photolithographic process that uses a DMD halftone exposure method for two times and a DMD general exposure method for one time in accordance with the present invention;

FIG. 112 is a cross-sectional view of a manufacturing process that uses a halftone exposure method to form a pixel electrode in accordance with the present invention;

FIG. 113 is a cross-sectional view of a manufacturing process that uses a halftone exposure method to form a pixel electrode in accordance with the present invention;

FIG. 114 illustrates a manufacturing process that uses a halftone exposure method to form a pixel electrode in accordance with the present invention;

FIG. 115 illustrates a manufacturing flow that uses the previously used halftone exposure method to form a pixel electrode in accordance with the present invention;

FIG. 116 illustrates a manufacturing flow that uses a halftone exposure method to form a pixel electrode in accordance with the present invention;

FIG. 117 illustrates a manufacturing flow that uses a halftone exposure method to form a pixel electrode in accordance with the present invention;

FIG. 120 is a cross-sectional view of completing the formation of a TFT matrix substrate in accordance with the present invention;

FIG. 121 is a cross-sectional view of completing the formation of a TFT matrix substrate in accordance with the present invention;

FIG. 122 is a cross-sectional view of a metal interface of a first layer (or lower layer) metal or a transparent conductor and a second layer (or upper layer) in accordance with the present invention;

FIG. 123 is a cross-sectional view of a metal electrode interface of an n+amorphous silicon layer and a source electrode and a drain electrode in accordance with the present invention;

FIG. 124 is a cross-sectional view of a mask used for halftone exposure as shown in FIGS. 67 and 69;

FIG. 125 is a cross-sectional view of a mask used for halftone exposure as shown in FIGS. 68 and 70;

FIG. 126 is a cross-sectional view of a mask used for halftone exposure as shown in FIGS. 67 and 69;

FIG. 127 is a cross-sectional view of a mask used for halftone exposure as shown in FIGS. 68 and 70;

FIG. 128 is a schematic view of a manufacturing process of a MVA mode color filter substrate in accordance with the present invention;

FIG. 129 is a planar view of a TFT matrix substrate that connects a holdup capacitor (Cst) forming electrode Cst to a pixel electrode in accordance with the present invention;

FIG. 130 is a planar view of a TFT matrix substrate that connects a holdup capacitor (Cst) forming electrode Cst to a pixel electrode in accordance with the present invention;

FIG. 131 is a planar view of a TFT matrix substrate that installs two types of alignment control electrodes in accordance with the present invention;

Figure 131:
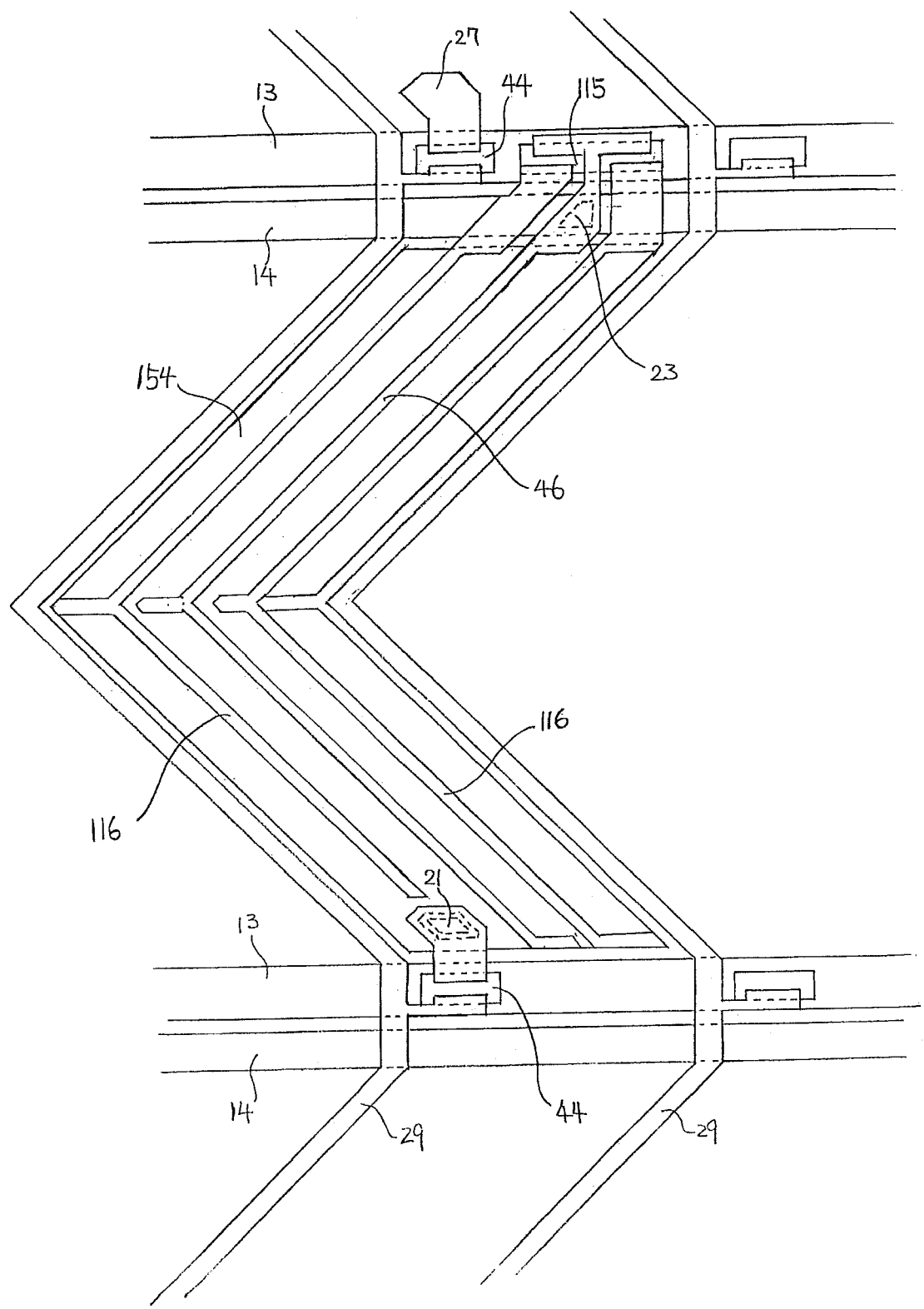
Figure 132:
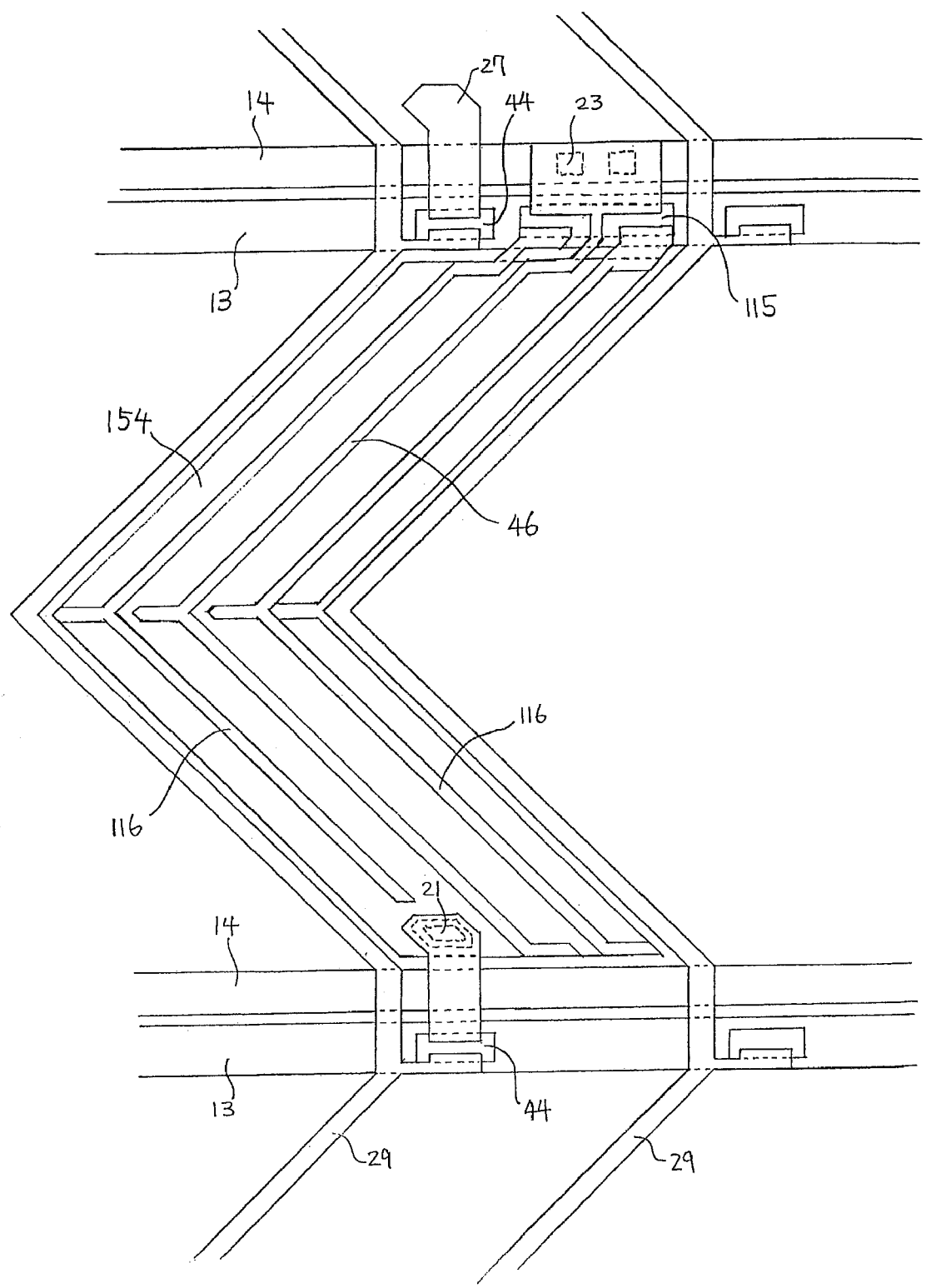
Figure 133:
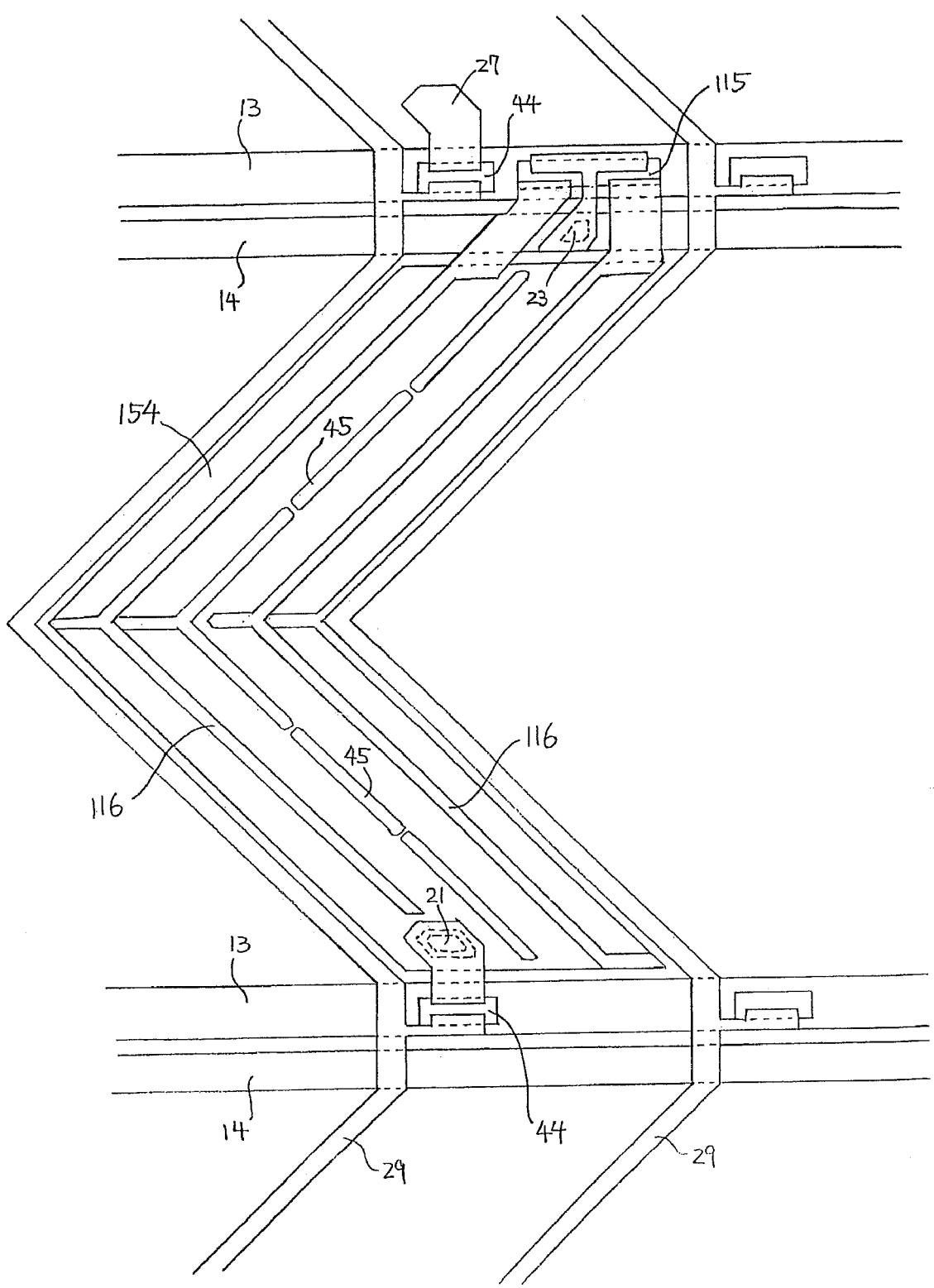
Figure 134:
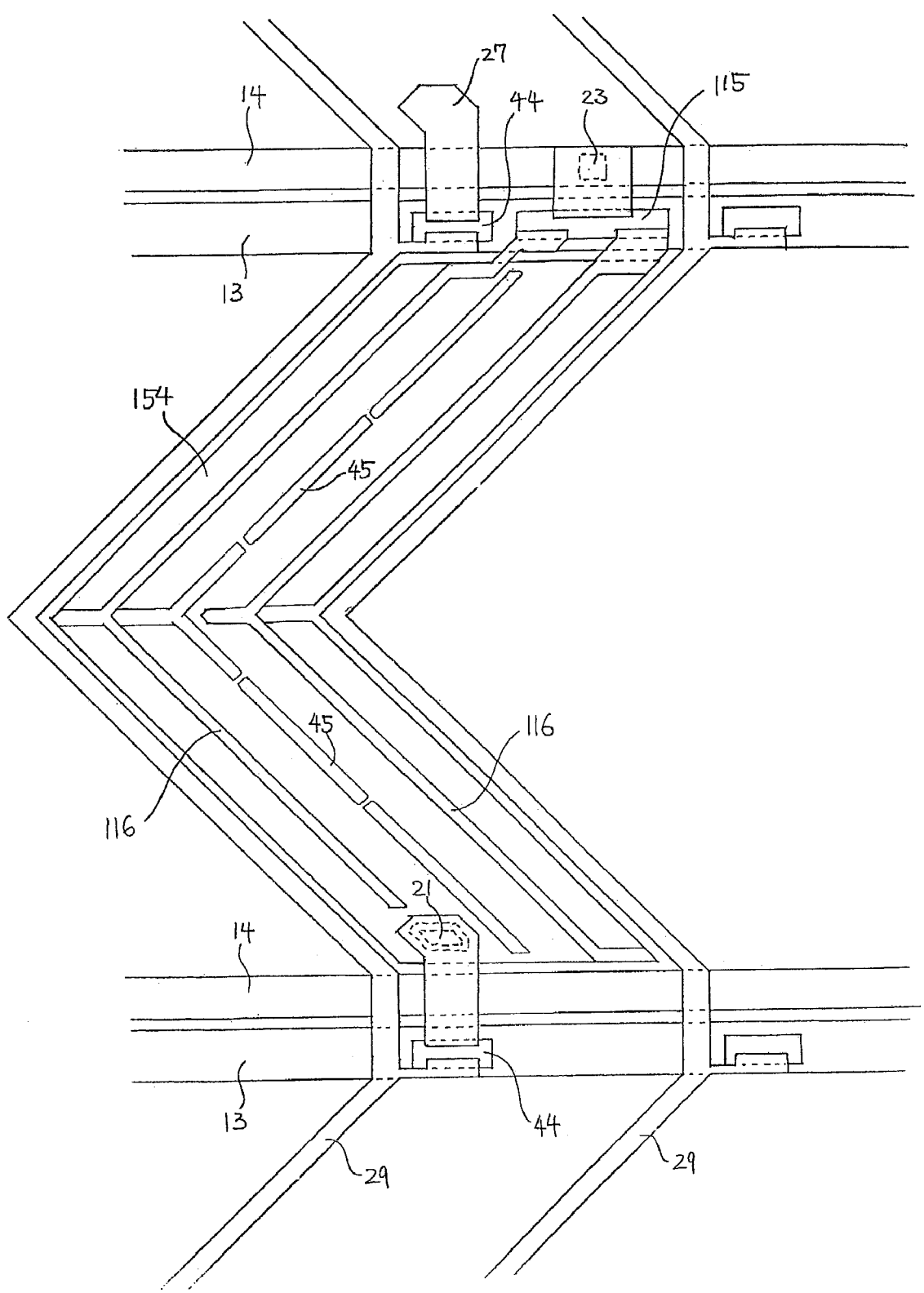
Figure 135:
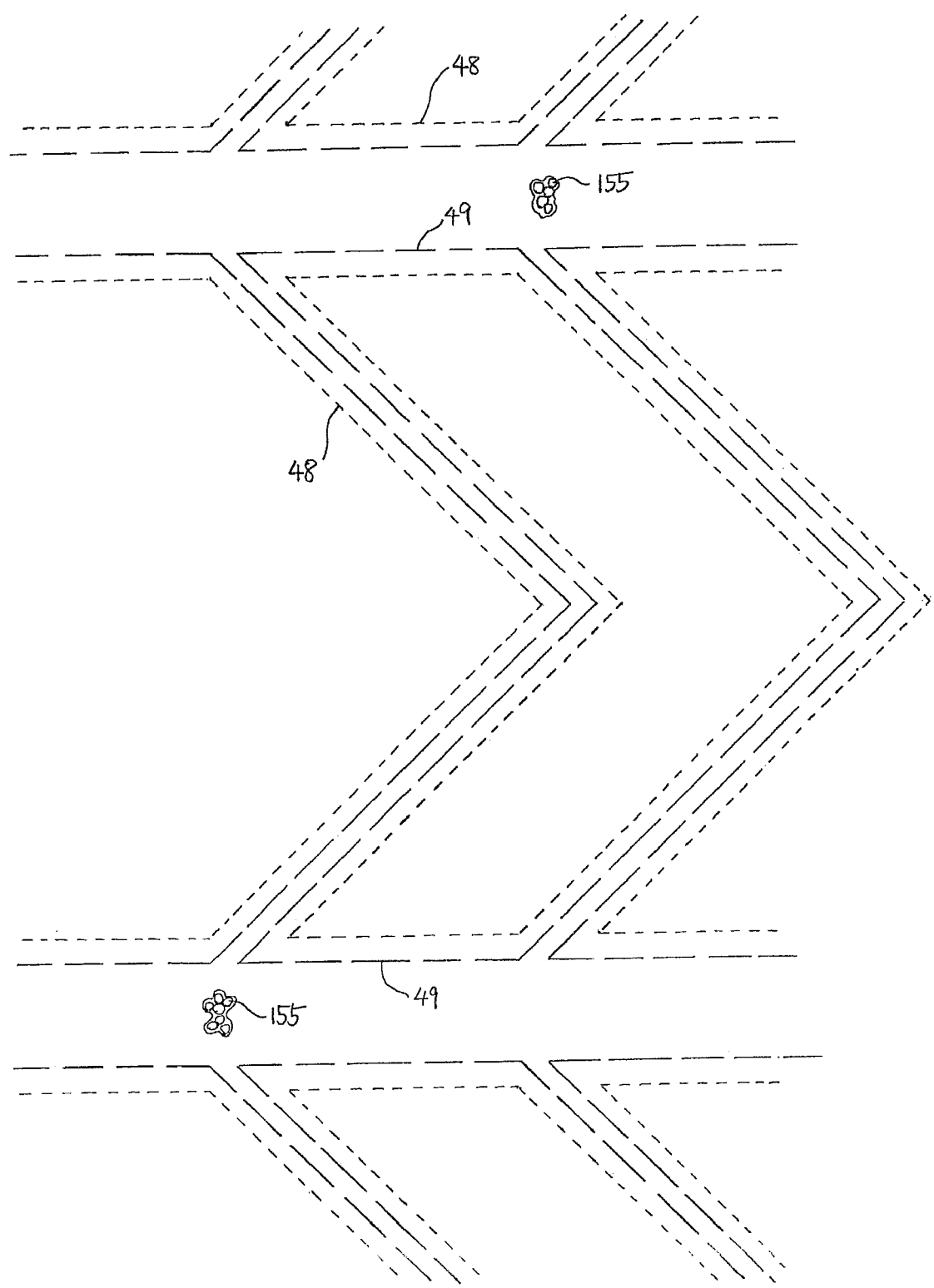
Figure 136:
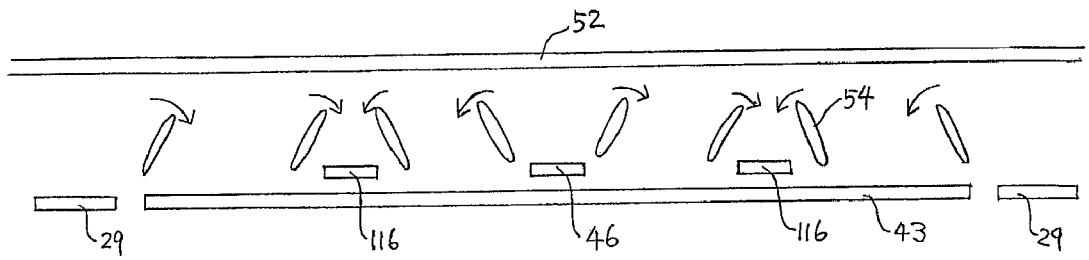
Figure 137:
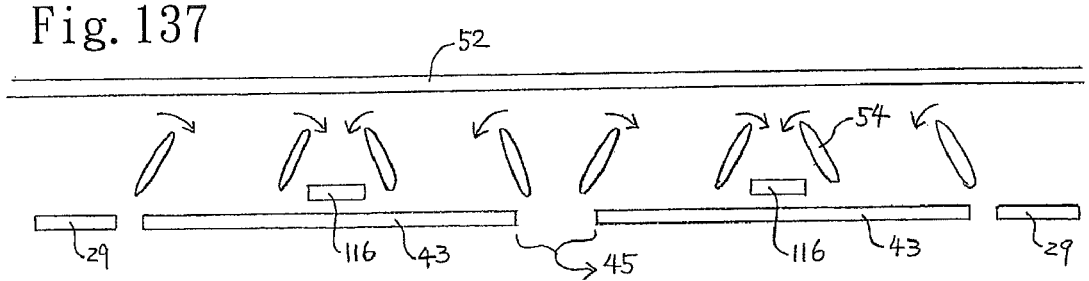
Figure 138:
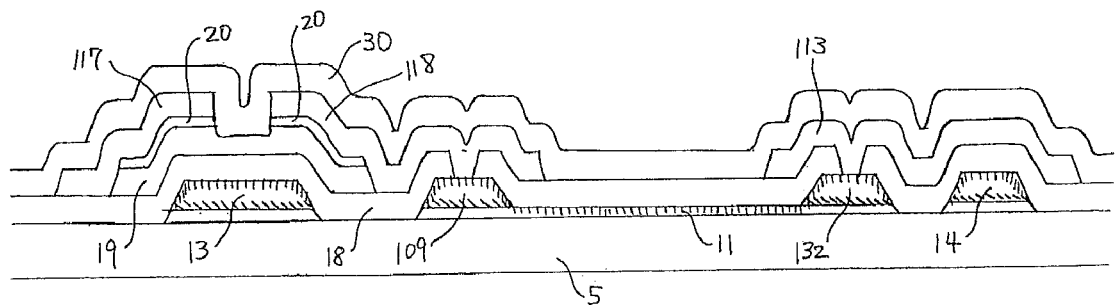
Figure 139:
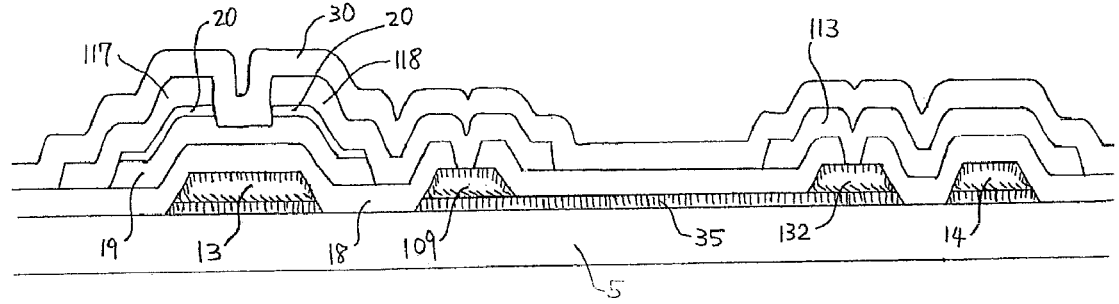
Figure 140:
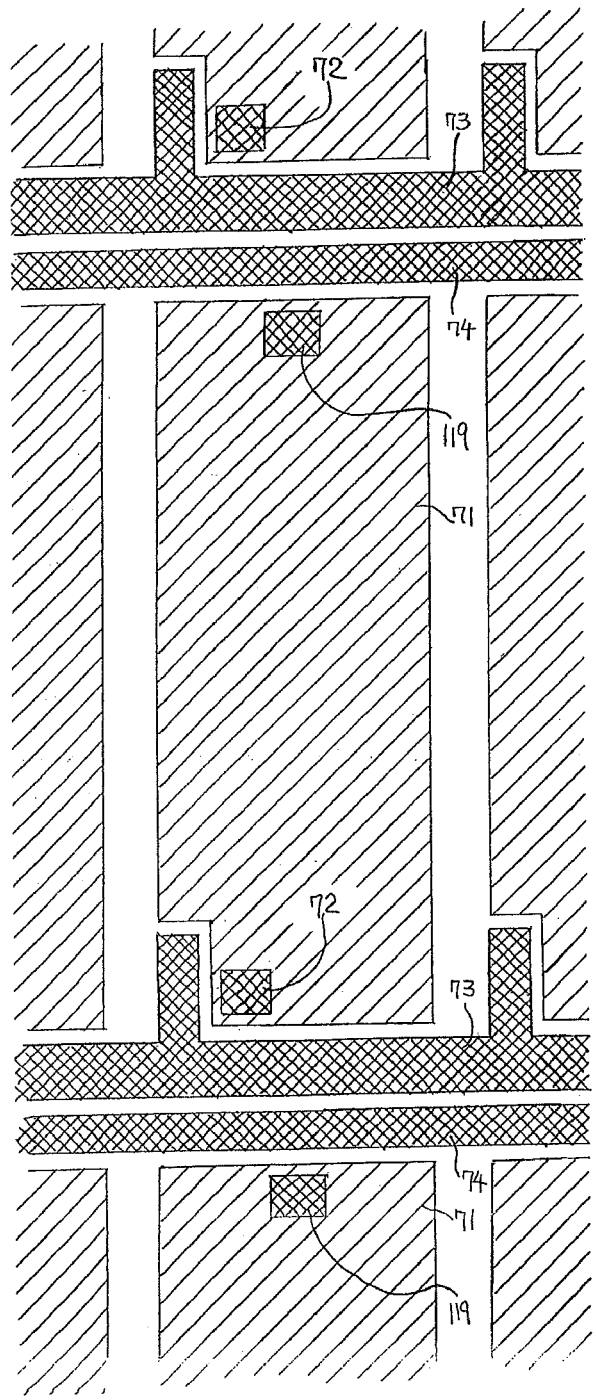
Figure 141:
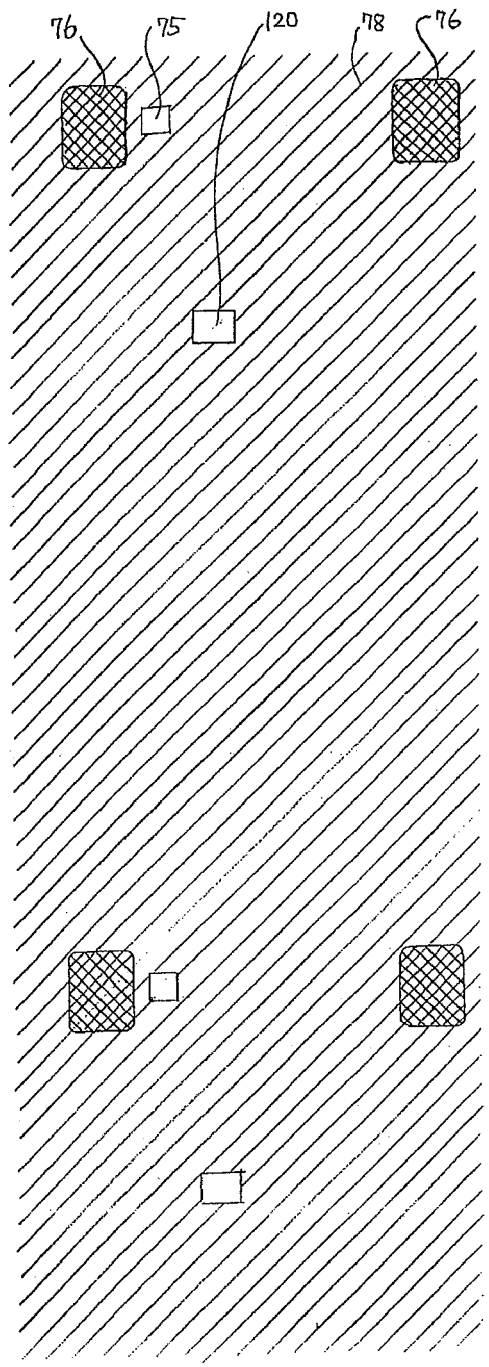
Figures 142, 143:
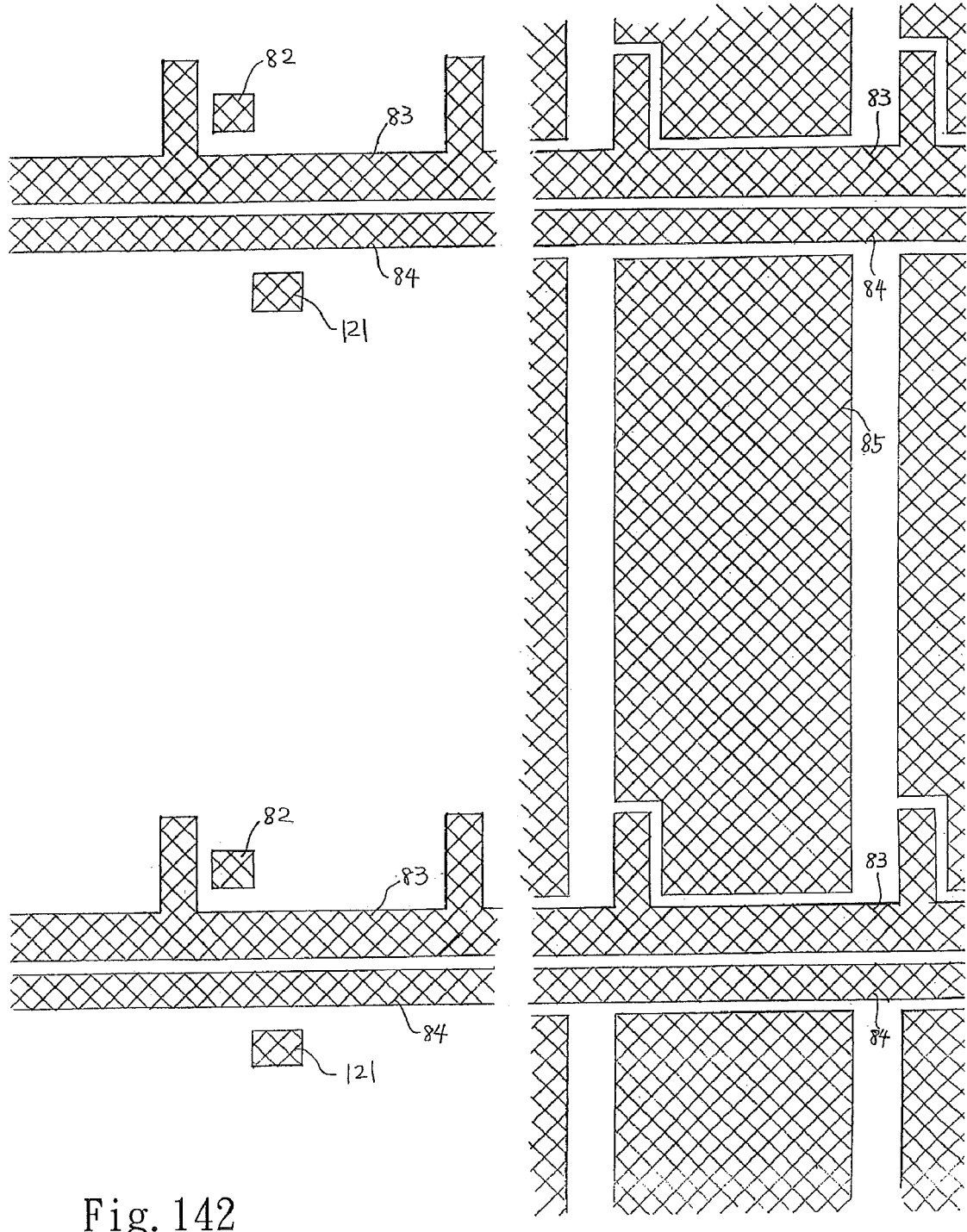
Figures 144, 145:
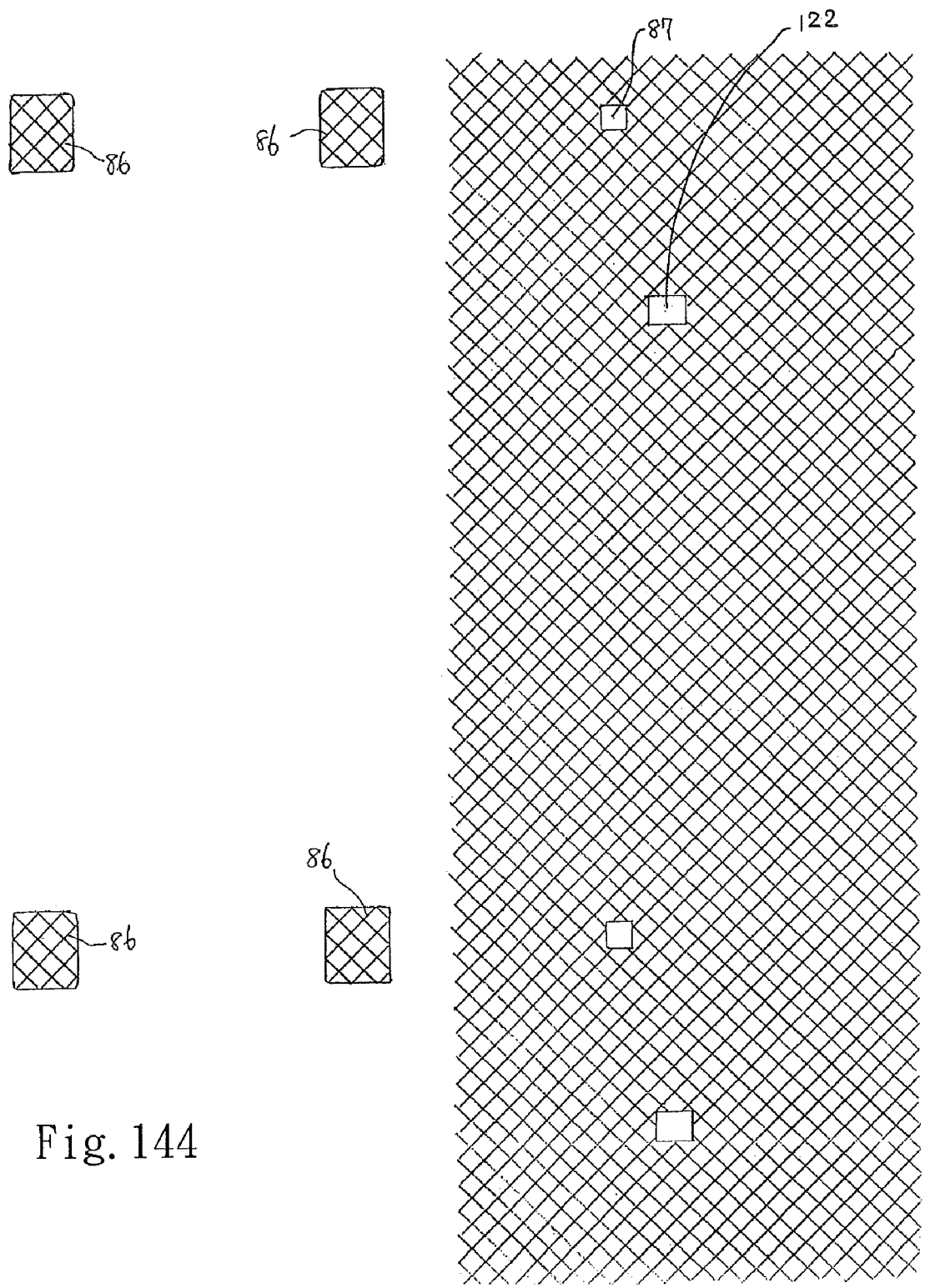
Figure 146:
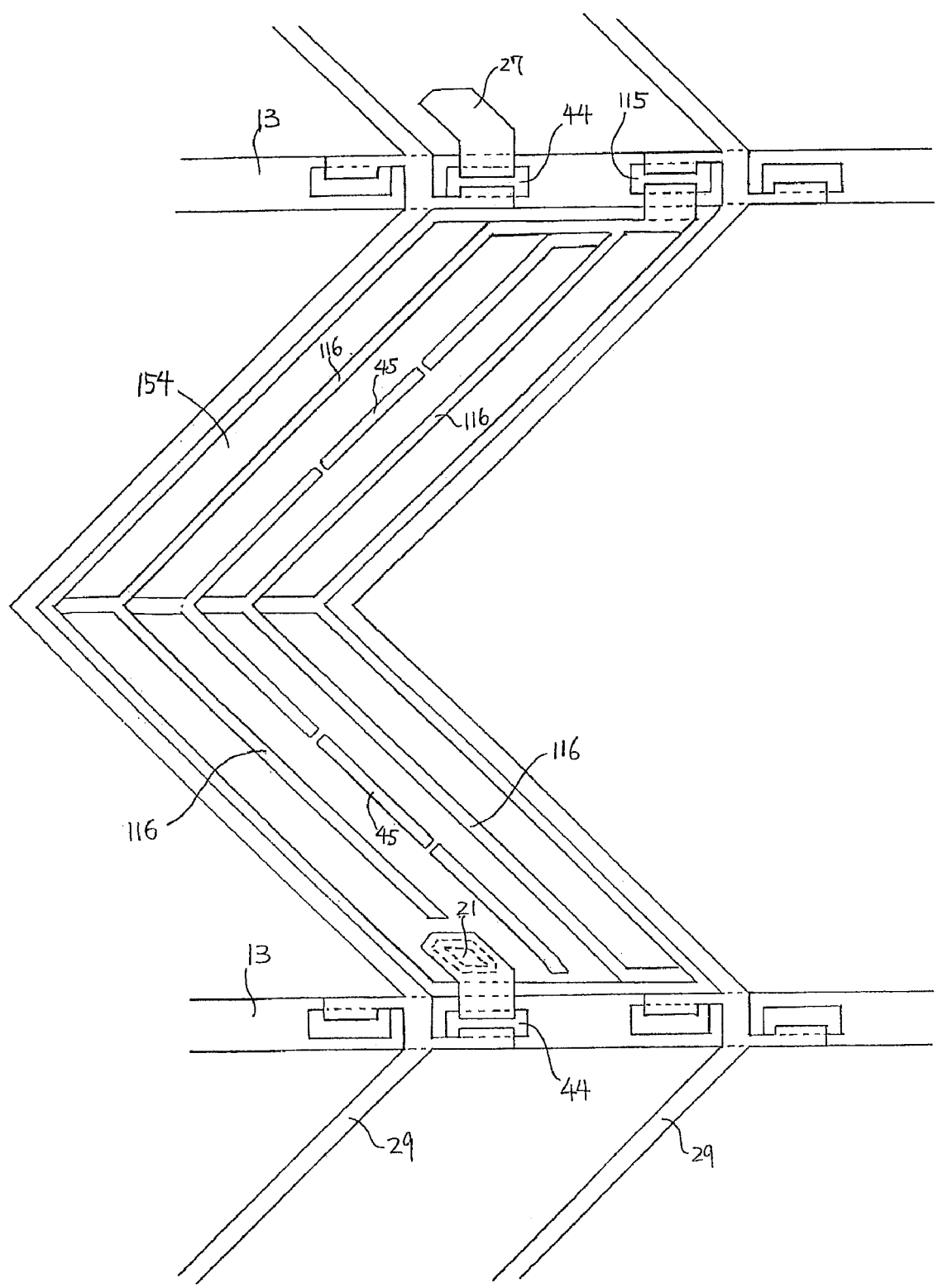
Figure 147:
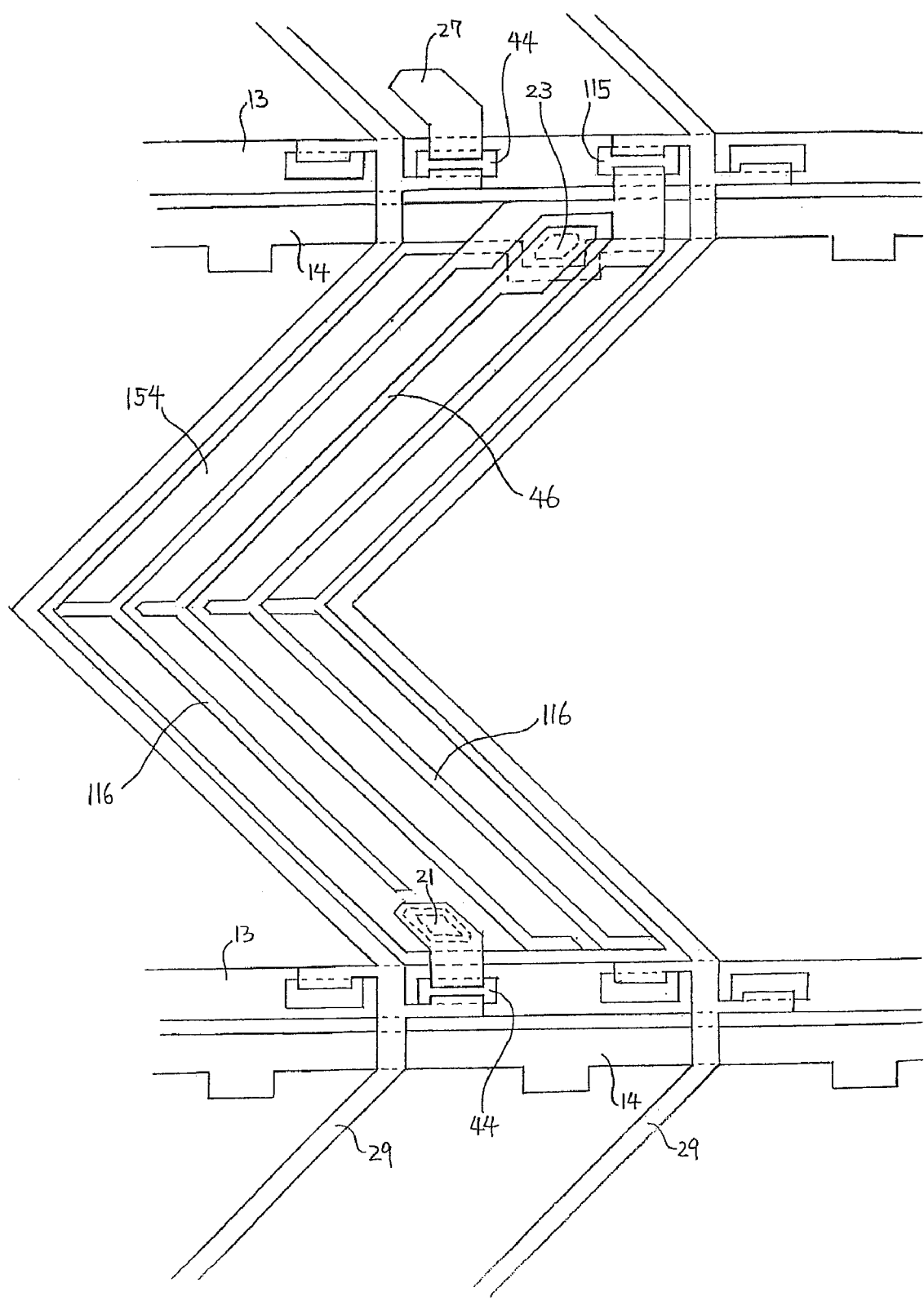
Figure 148:
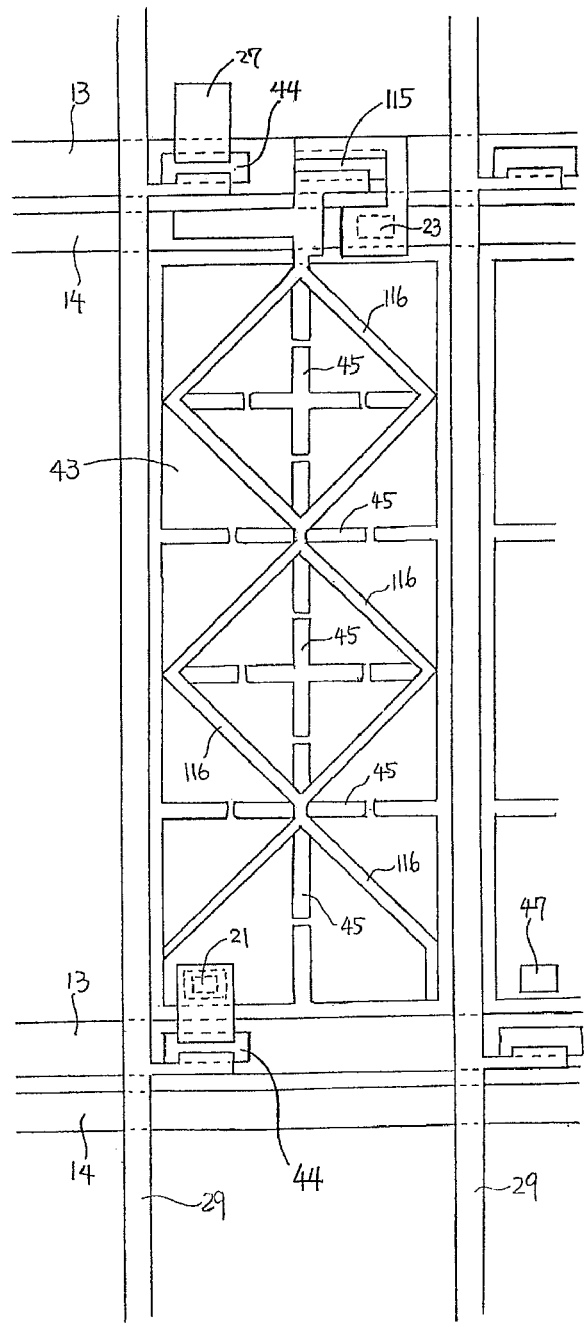
Figure 149:
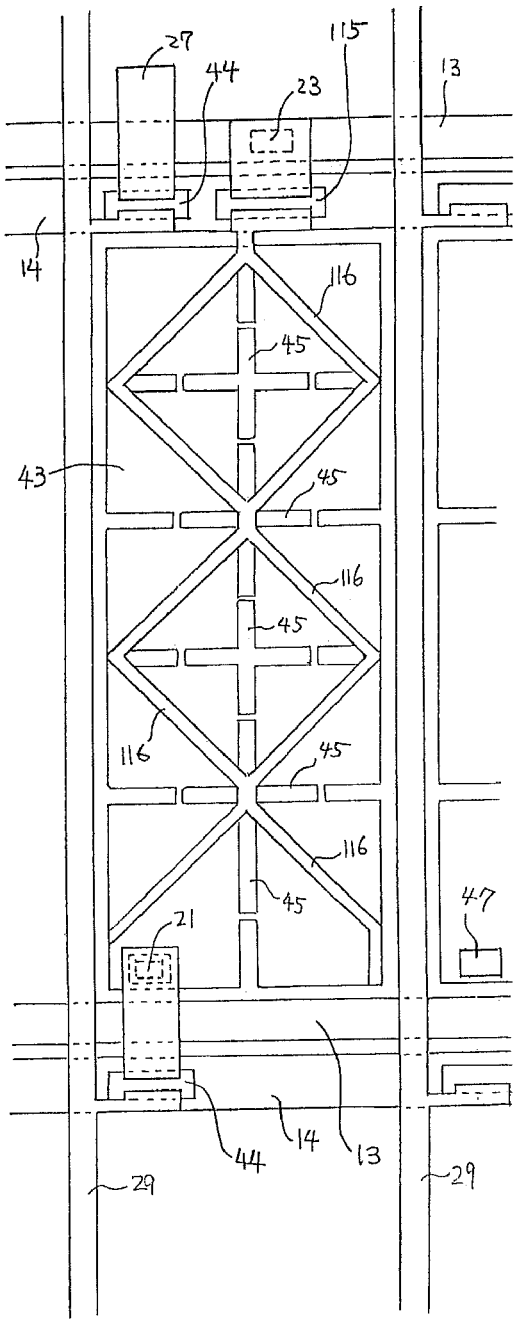
Figures 150, 151:
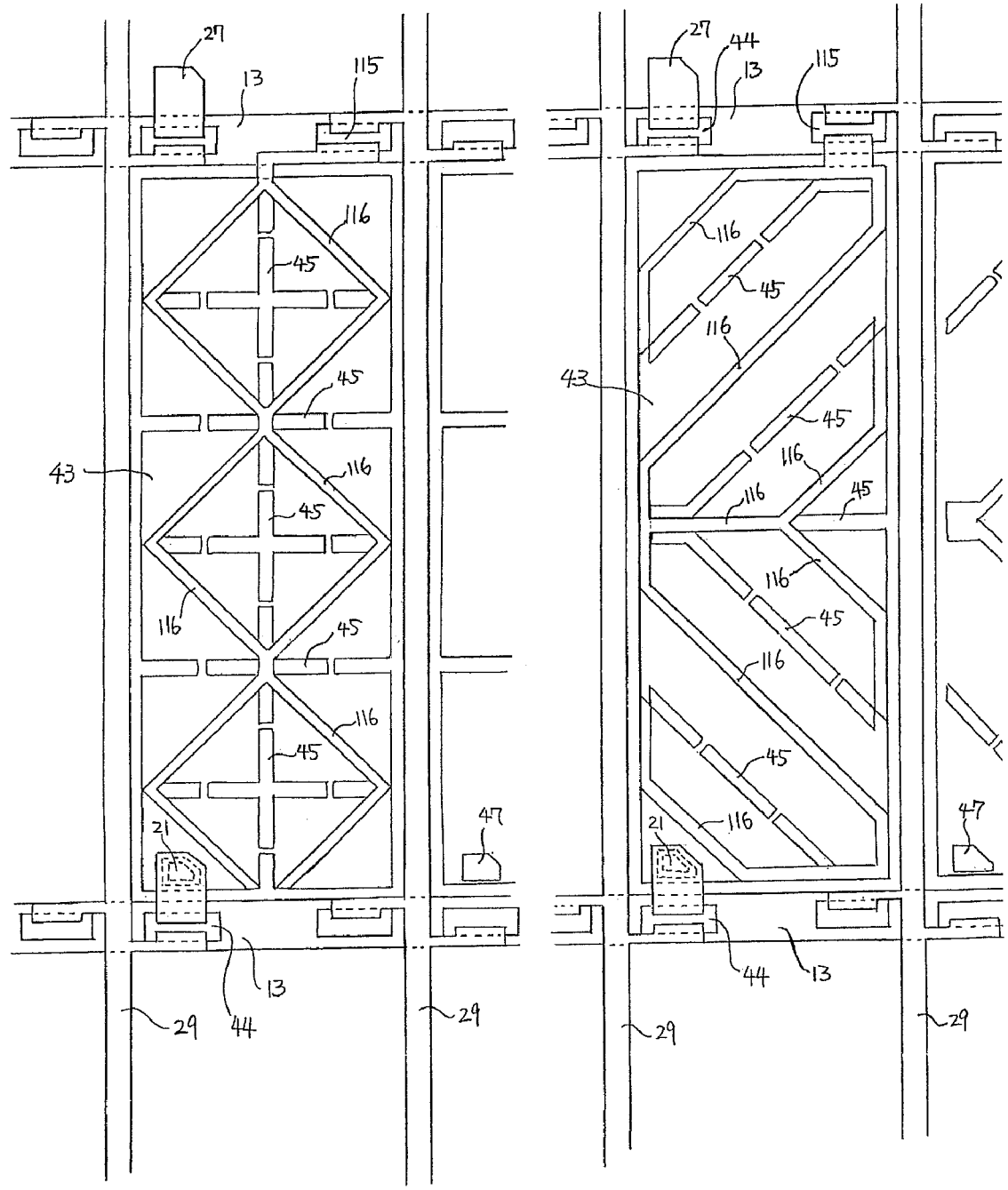
Figure 152:
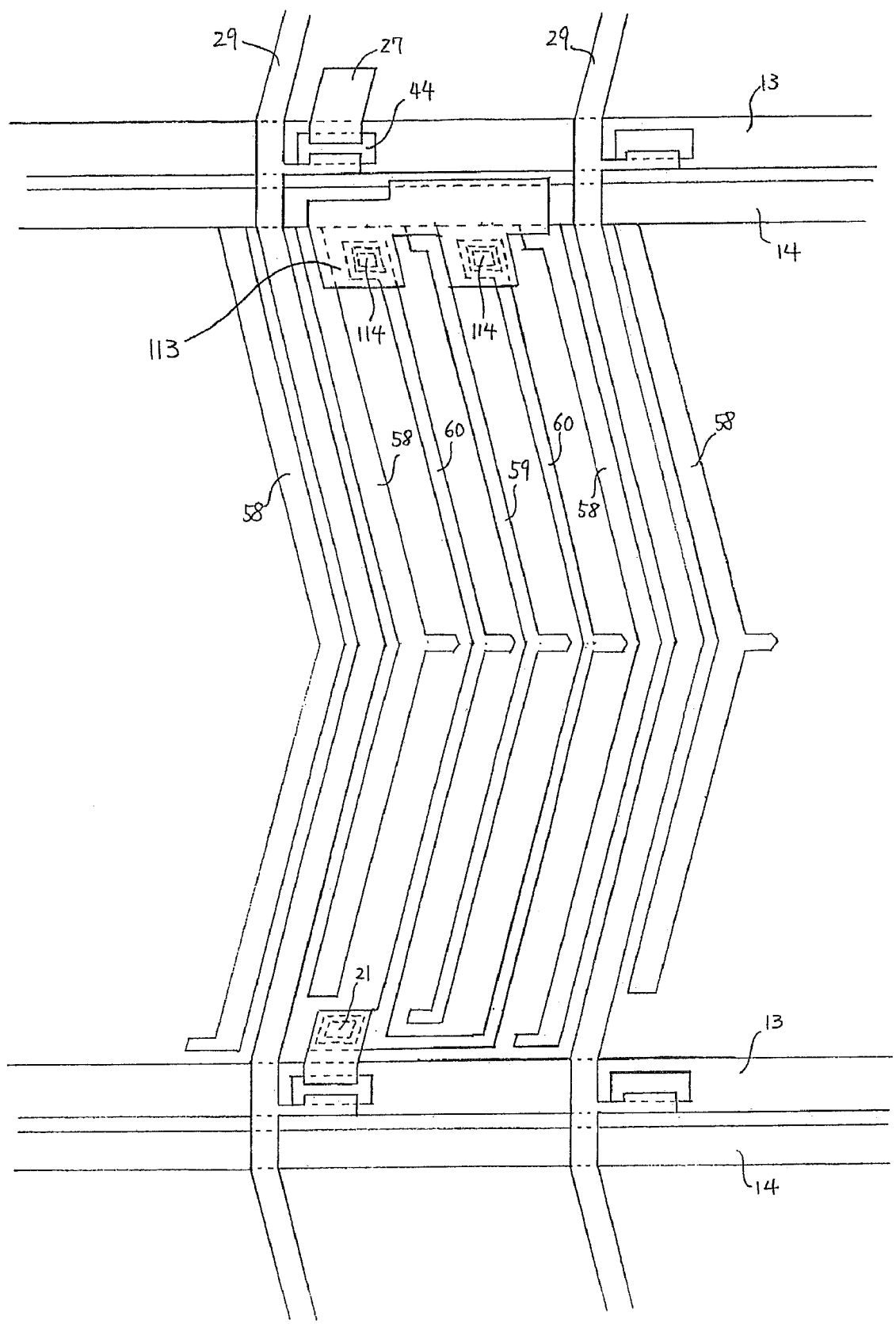
Figure 153:
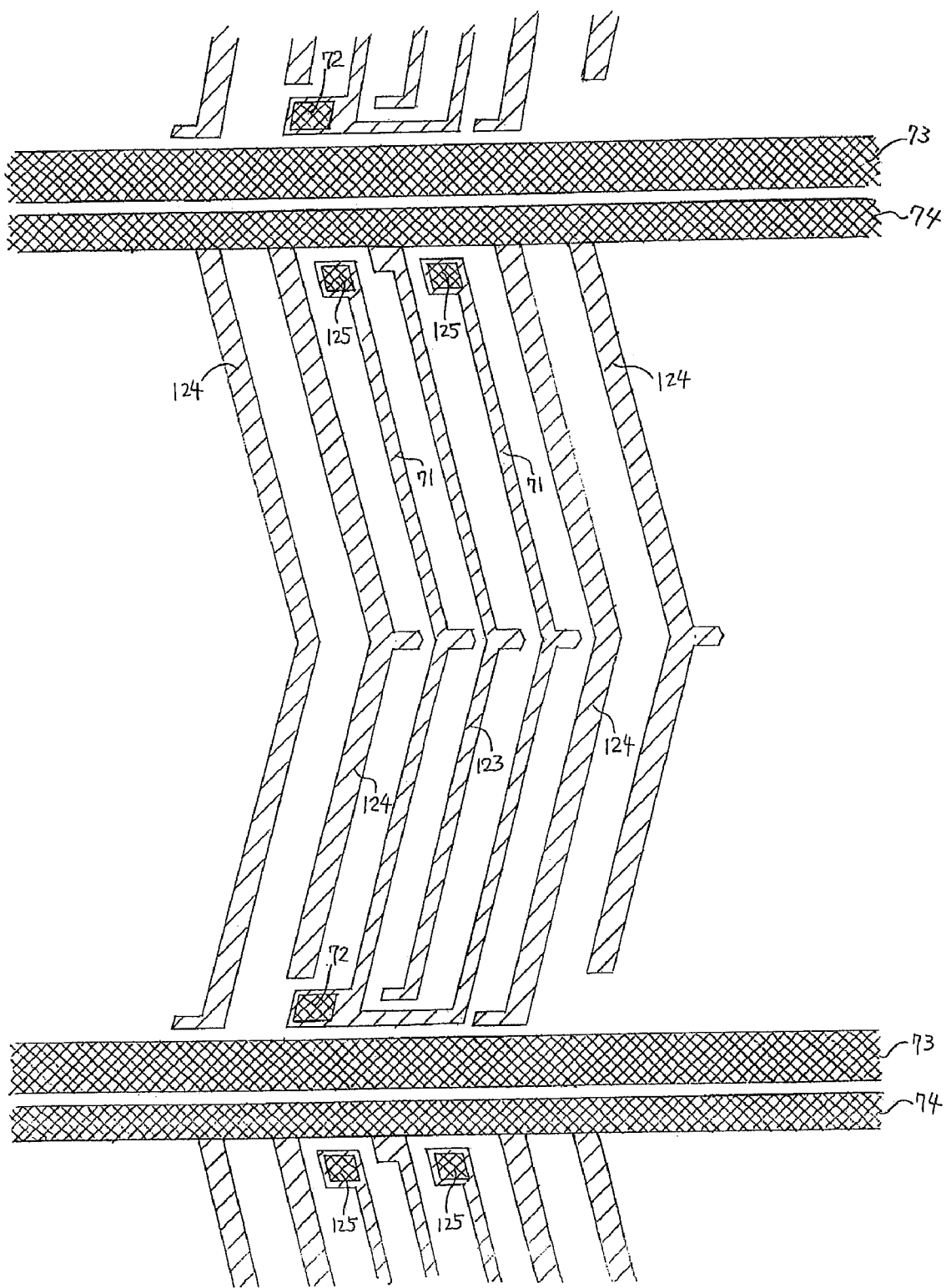
Figure 154:
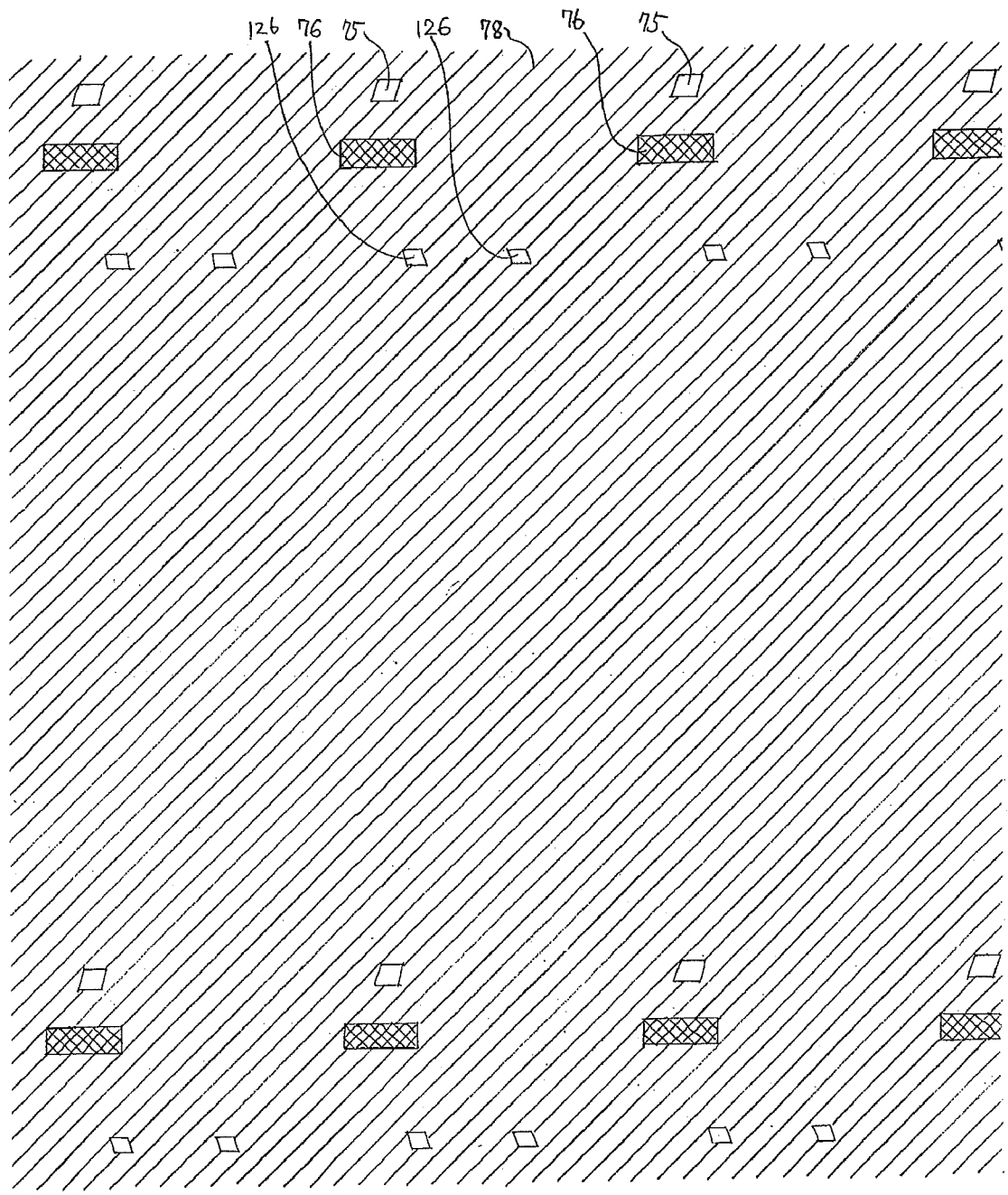
Figure 156:
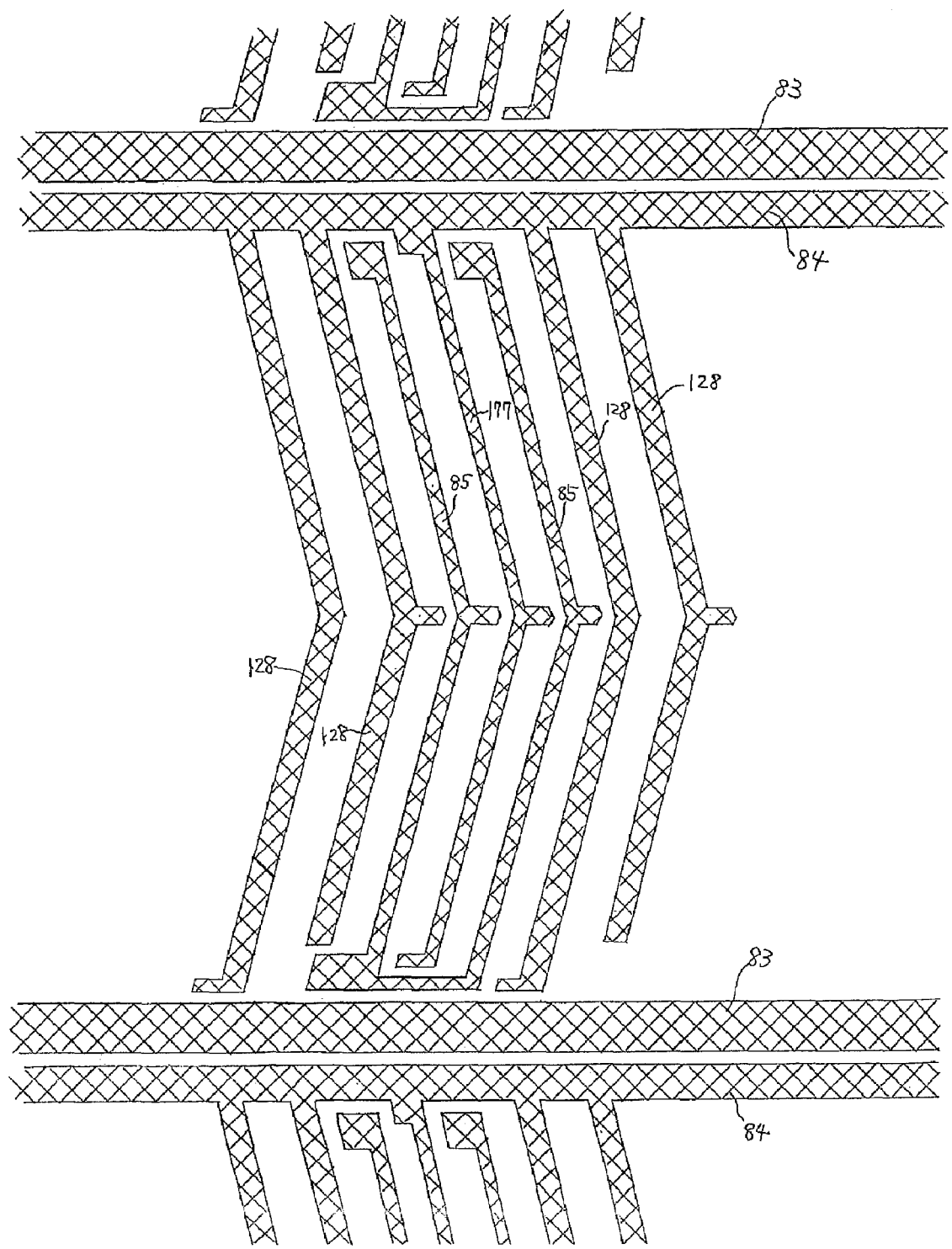
Figures 157, 158:
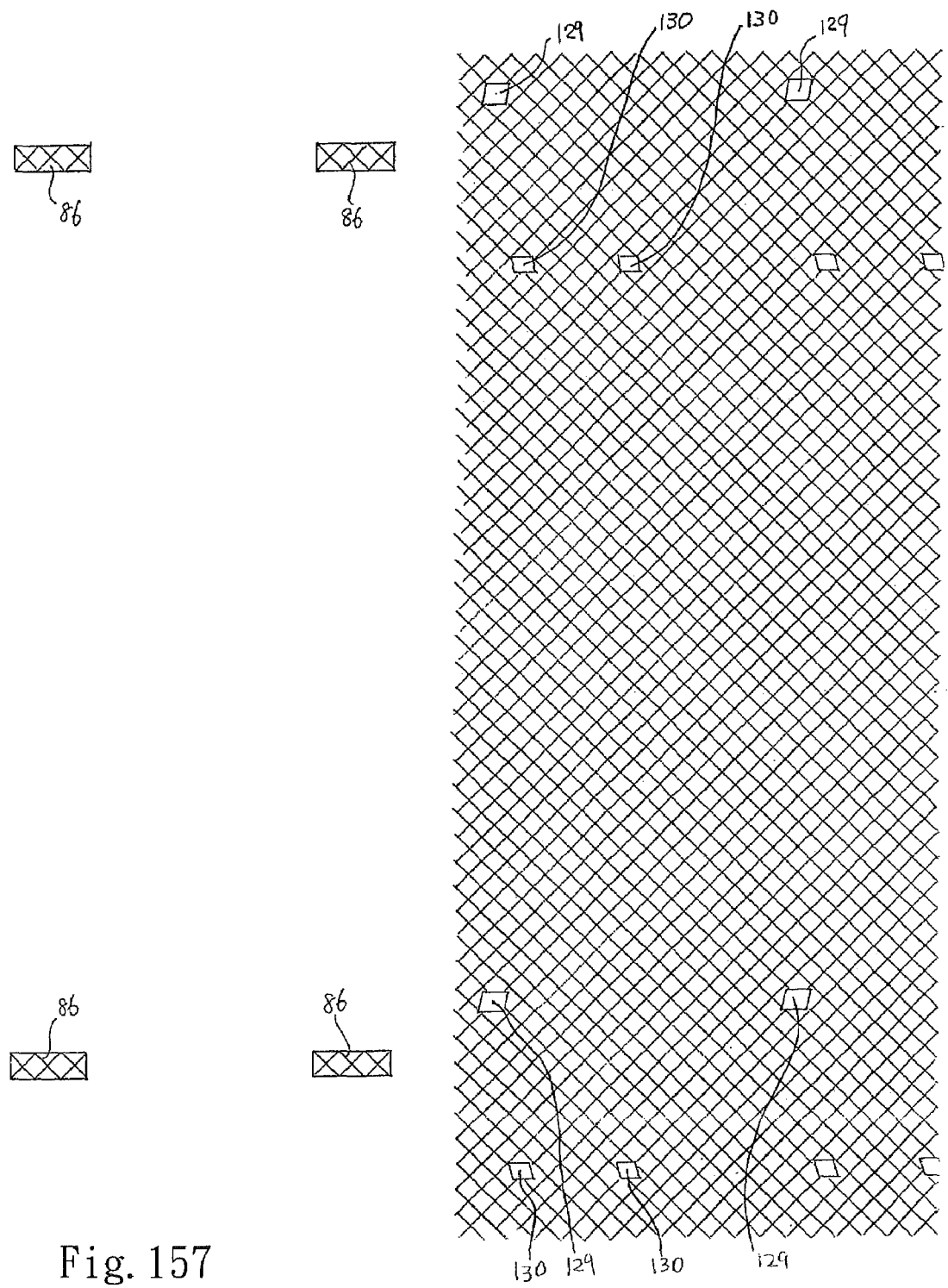
Figure 159:
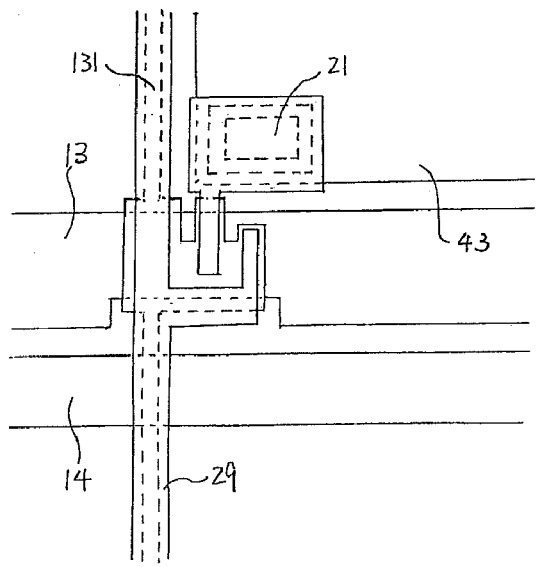
Figure 160:
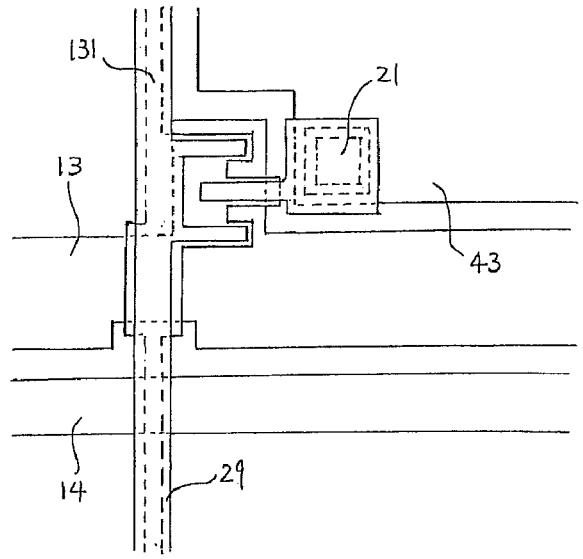
Figure 161:
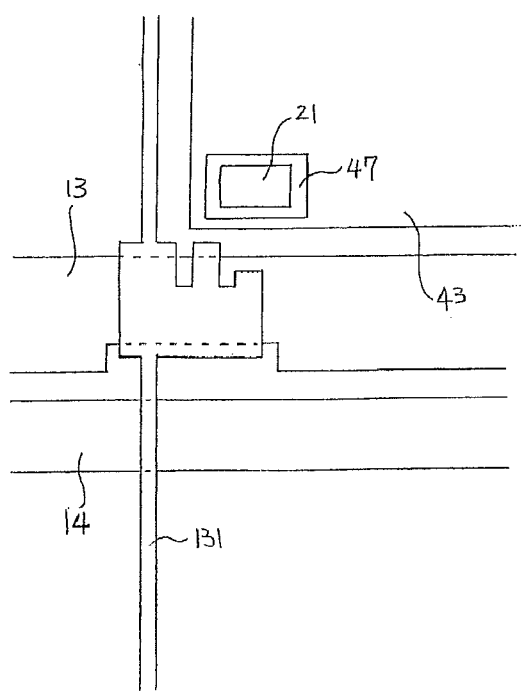
Figure 162:
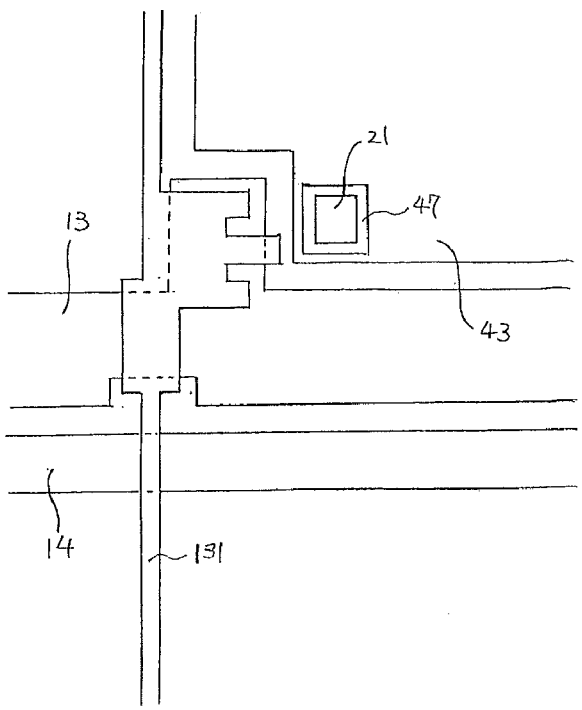
Figure 163:
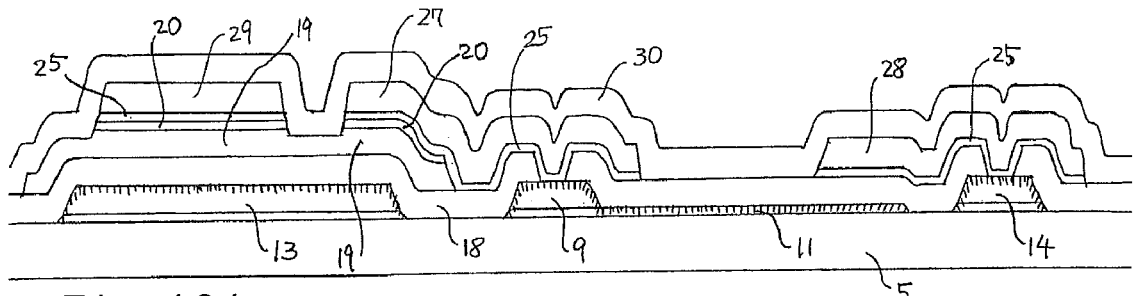
Figure 164:
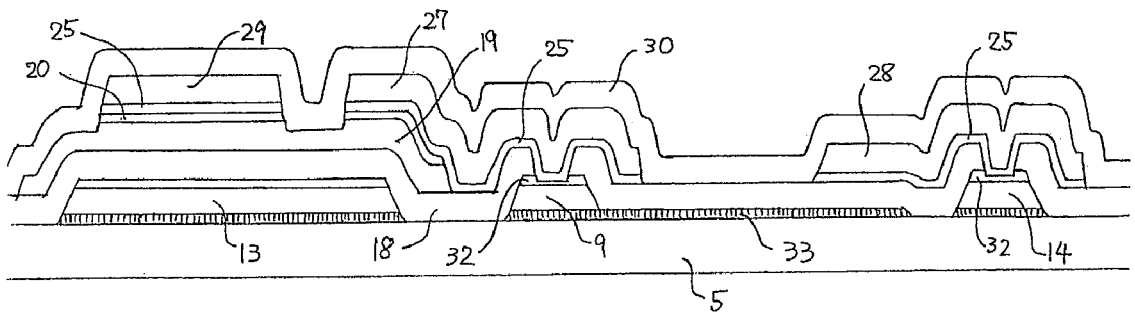
Figure 165:
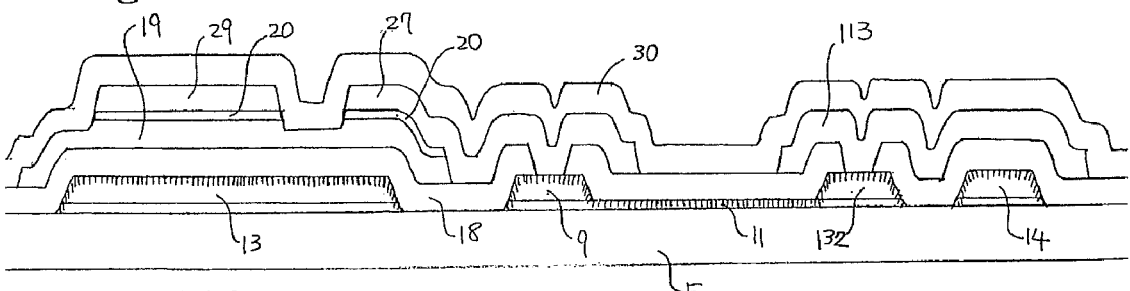
Figure 166:
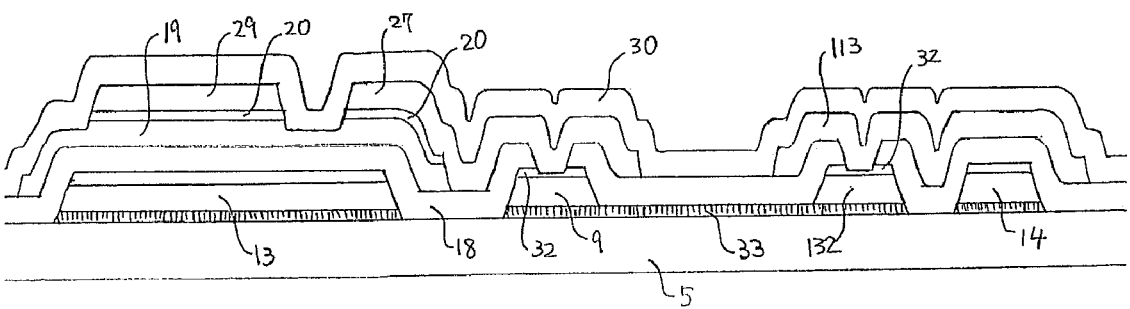
Figure 167:
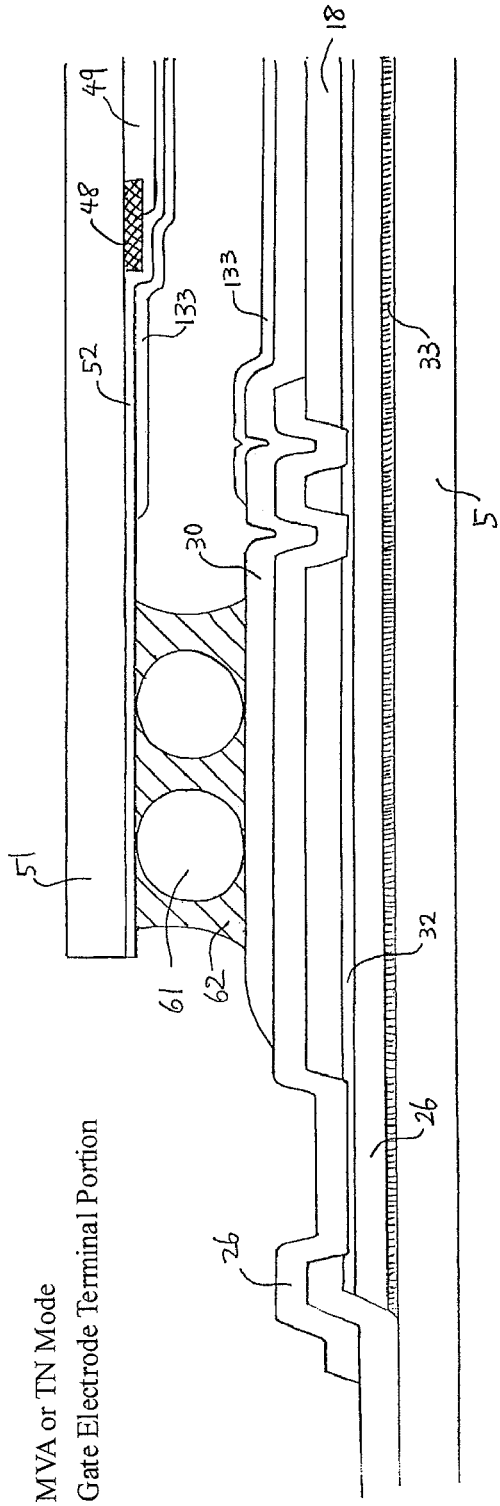
Figure 168:
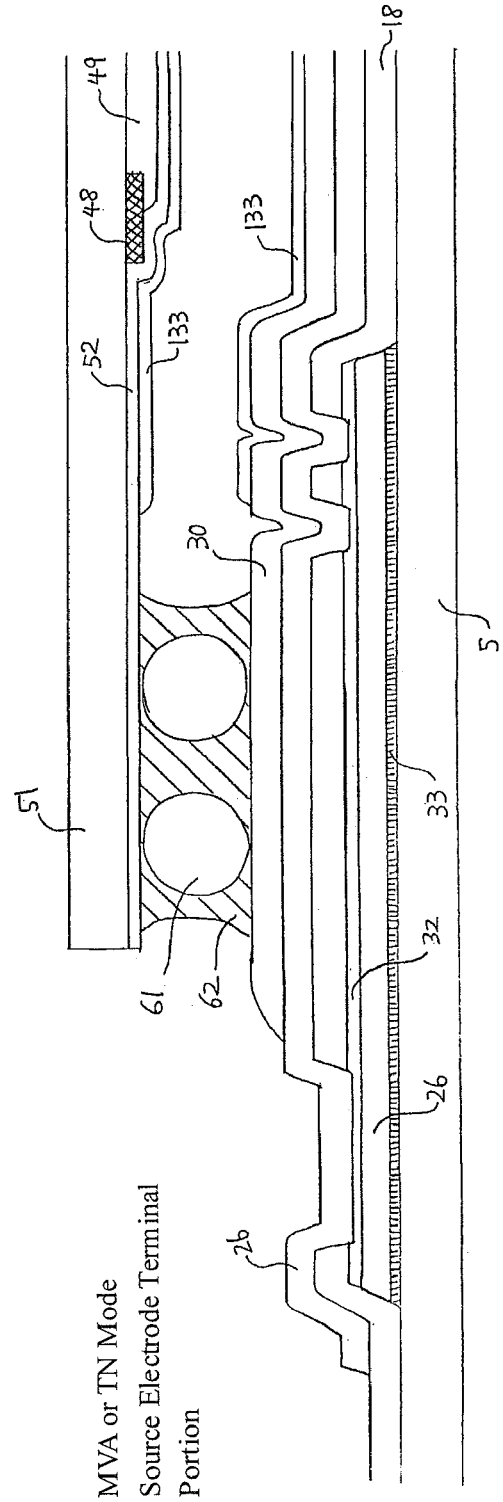
Figure 169:
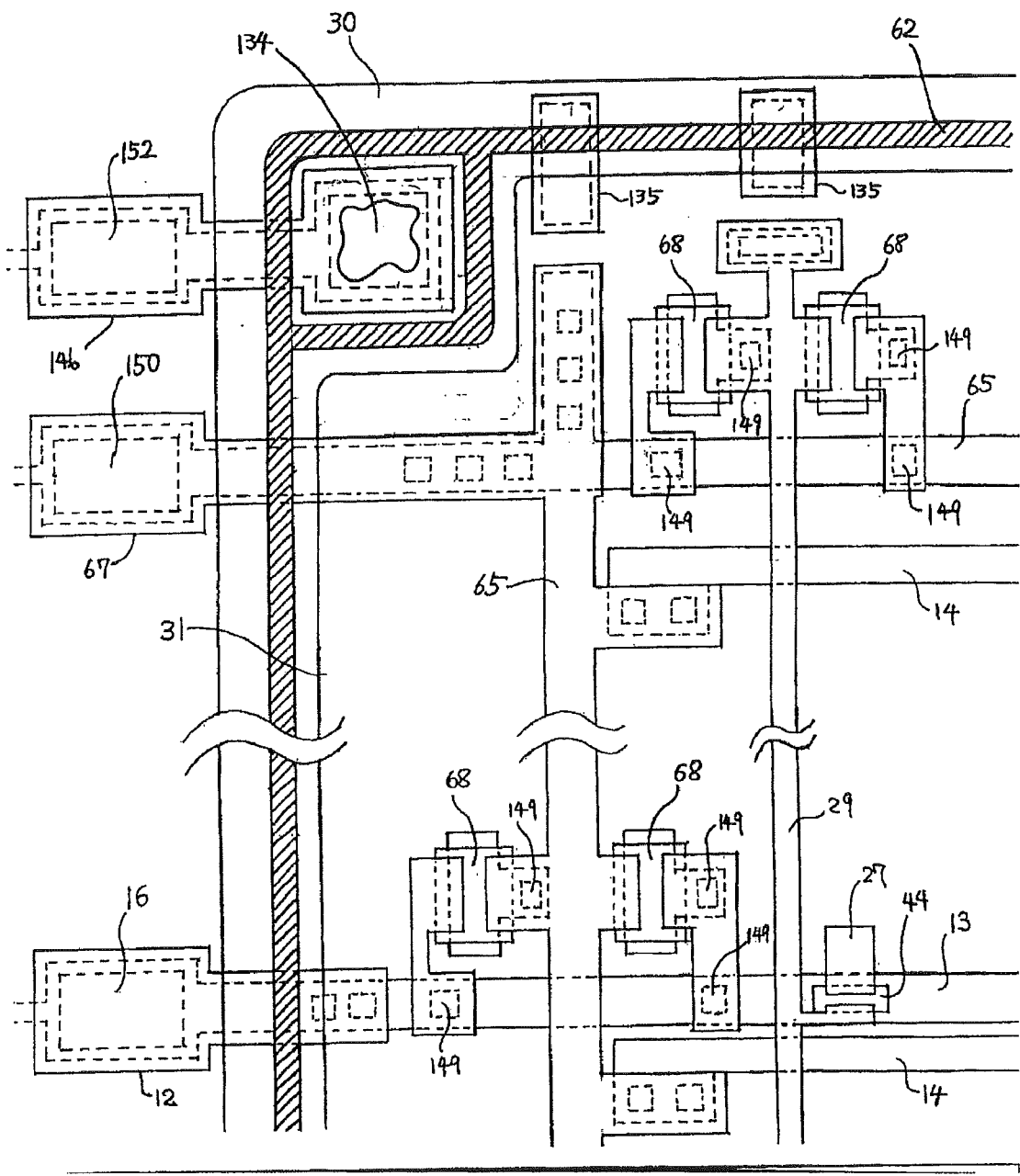
Figure 170:
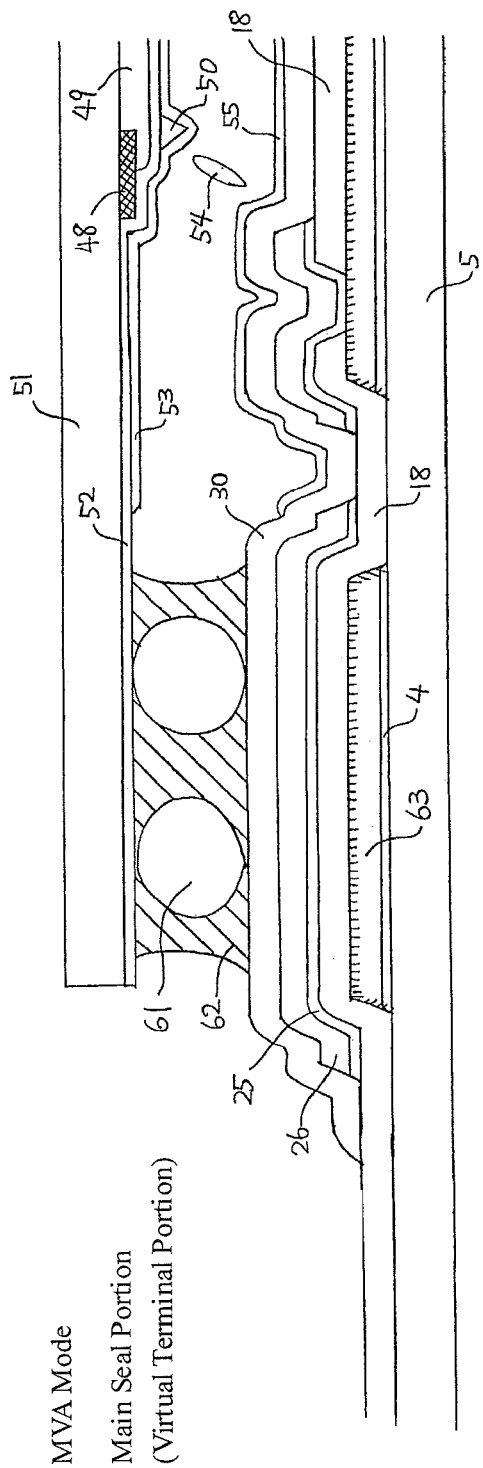
Figure 171:
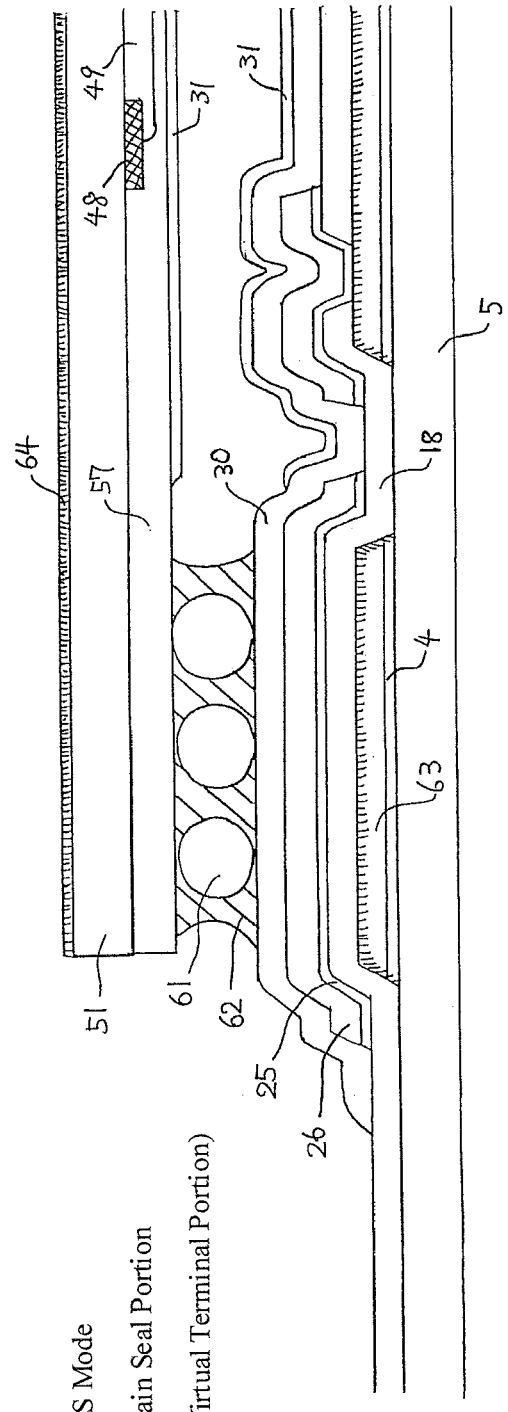
Figure 182:
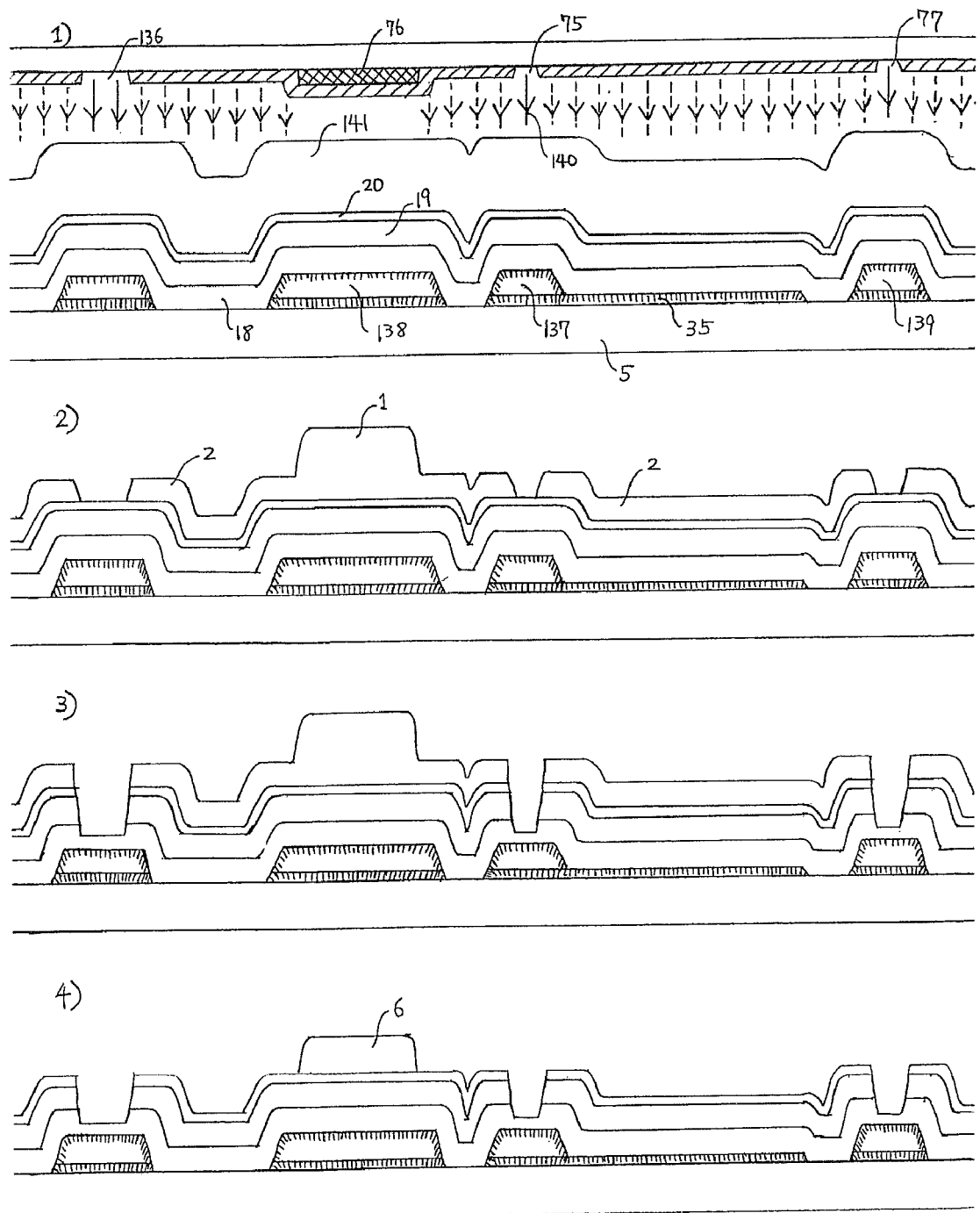
Figure 184:
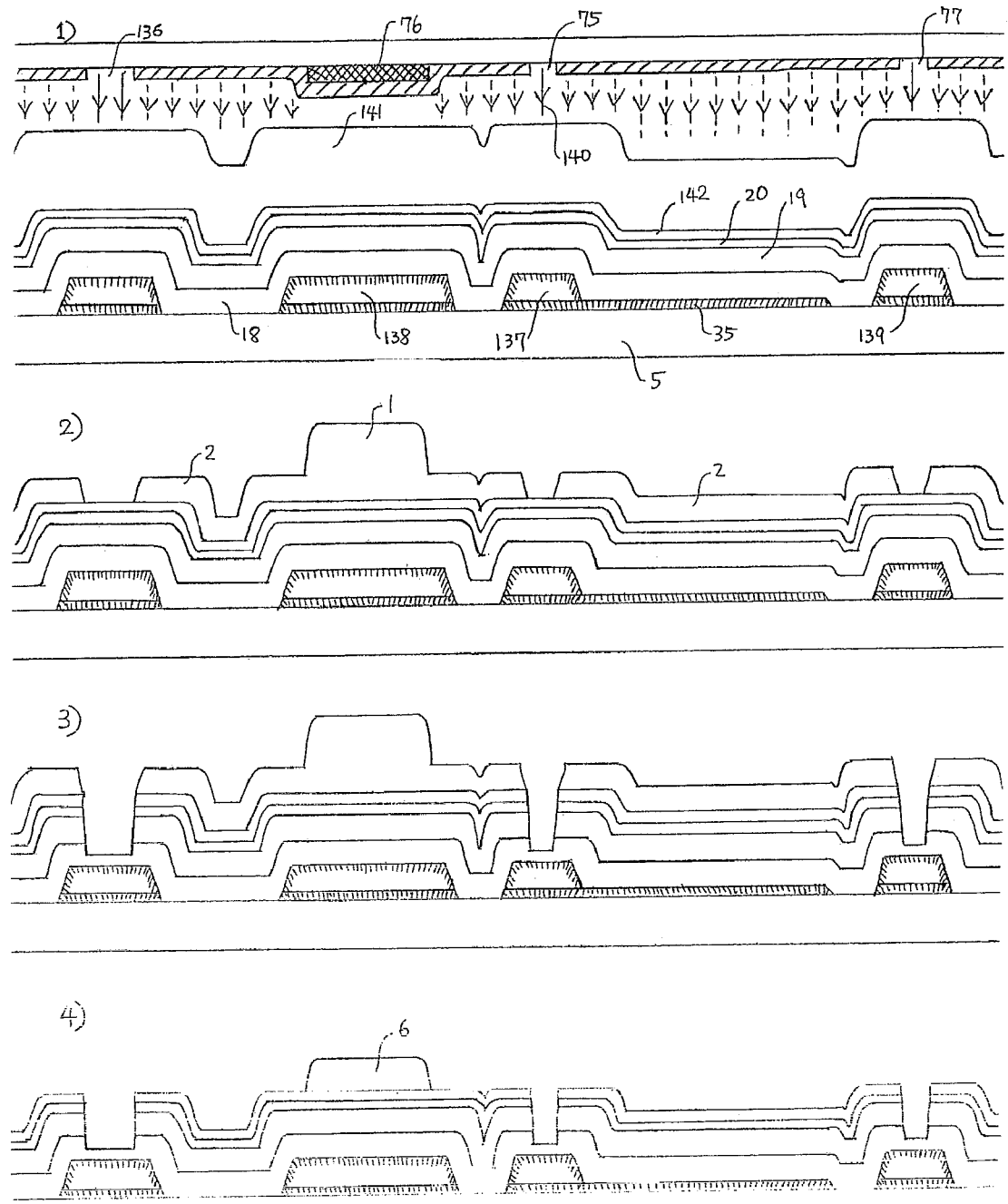
Figure 186:
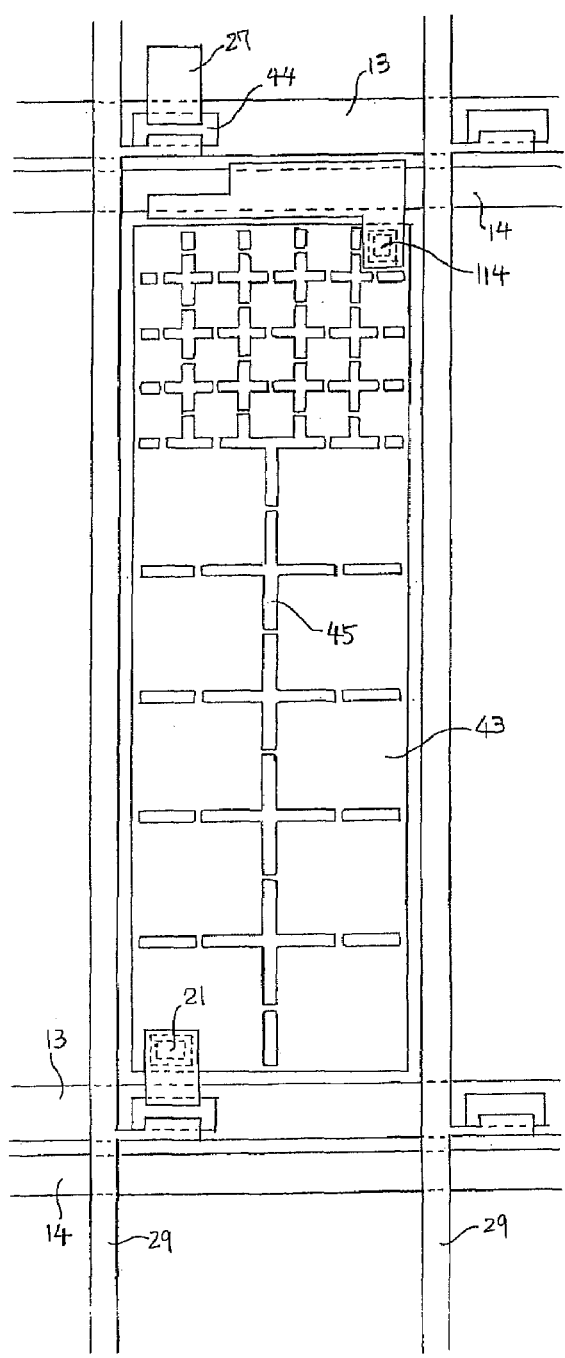
Figure 187:
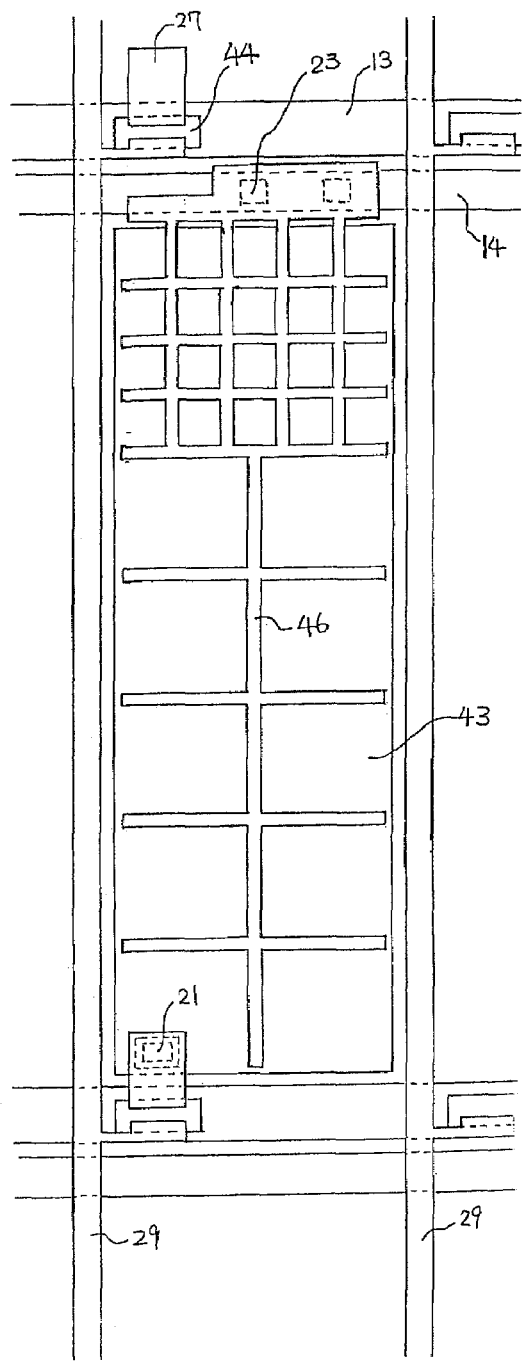
Figure 188:
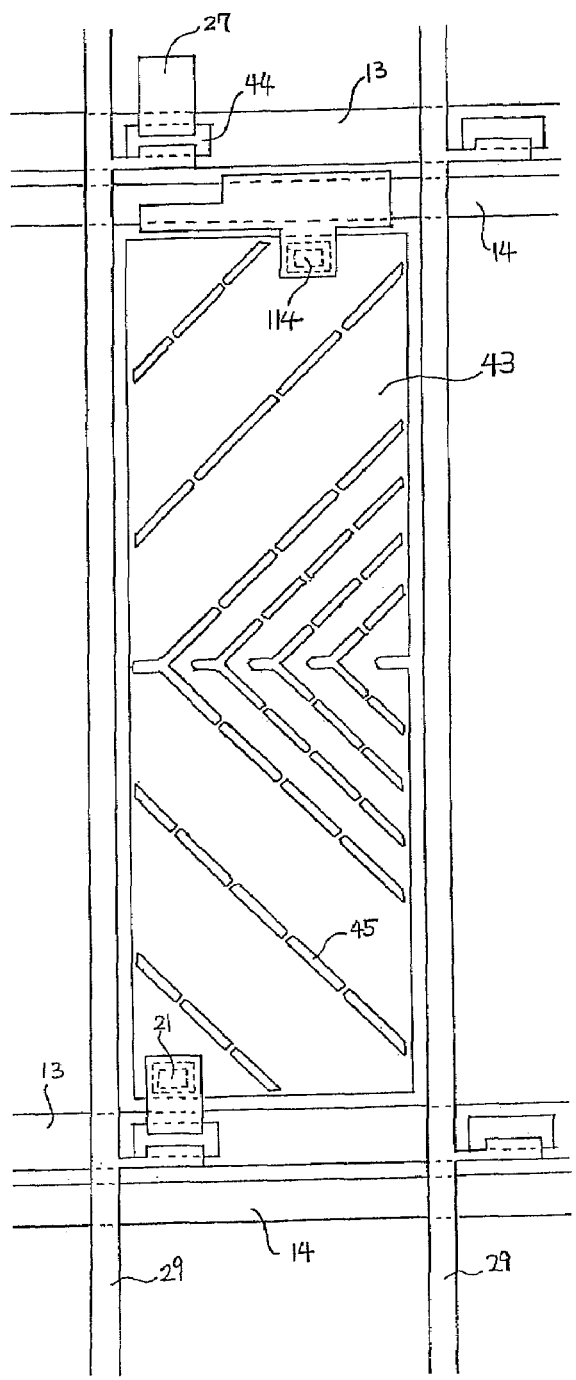
Figure 189:
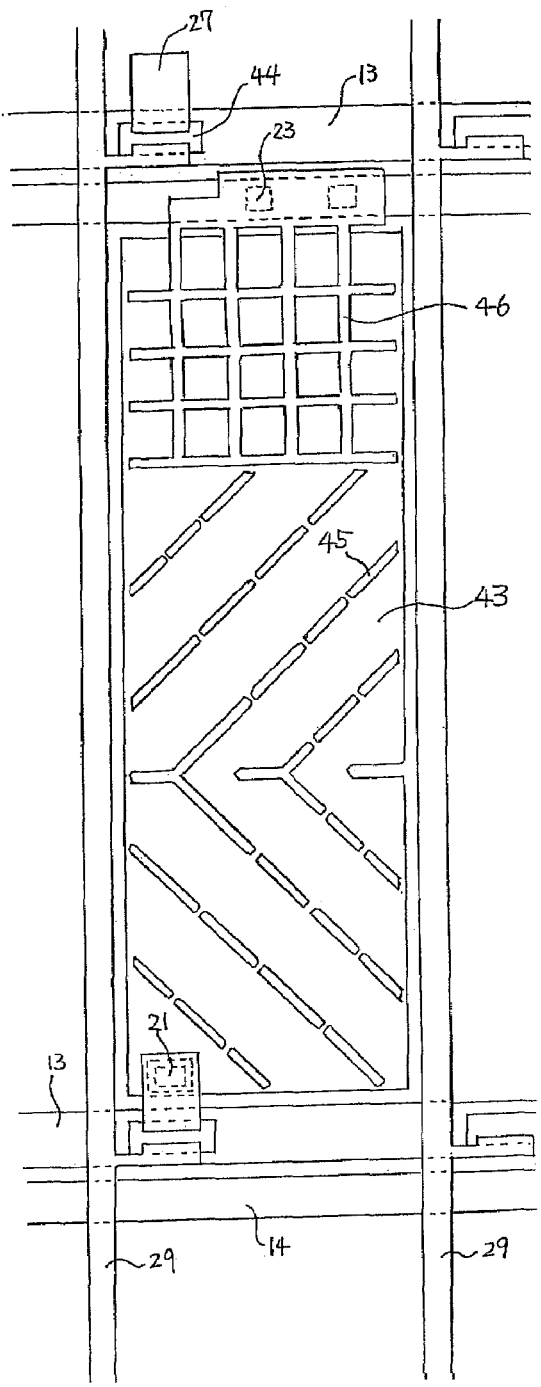
Figure 190:
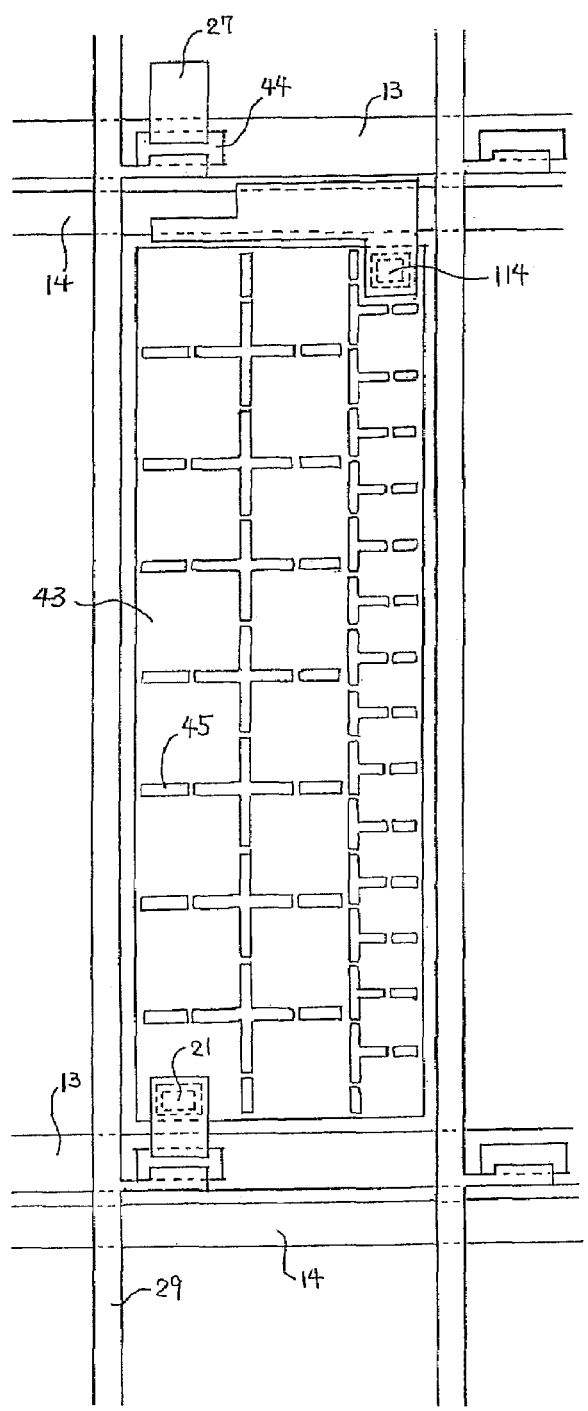
Figure 191:
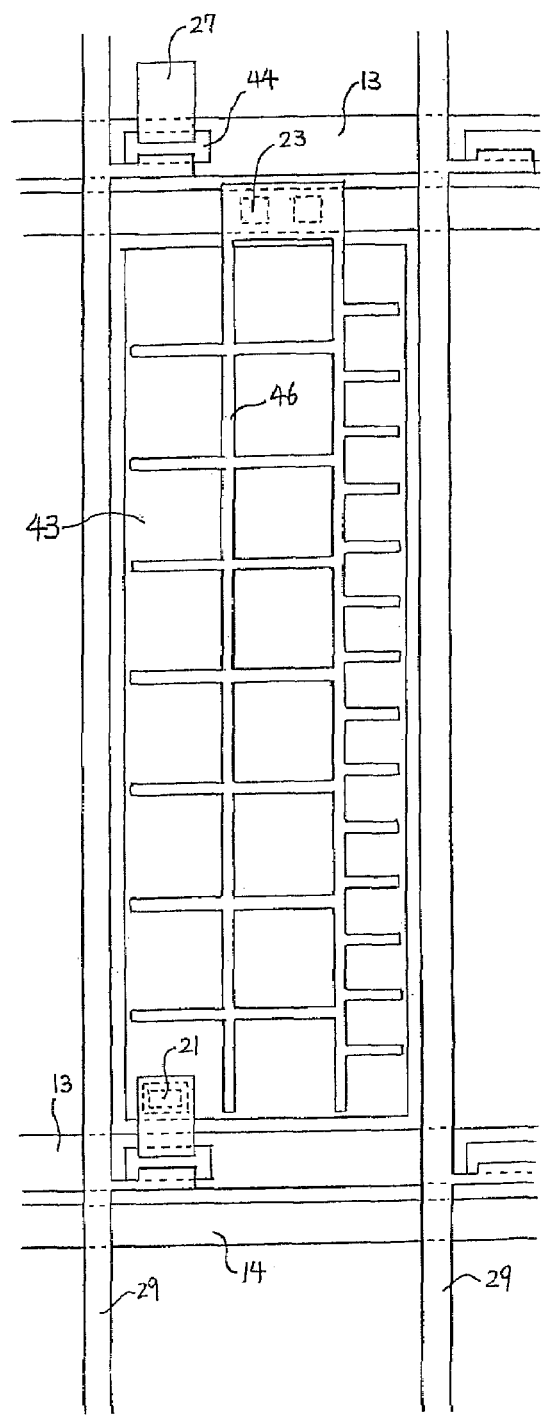
Figure 192:
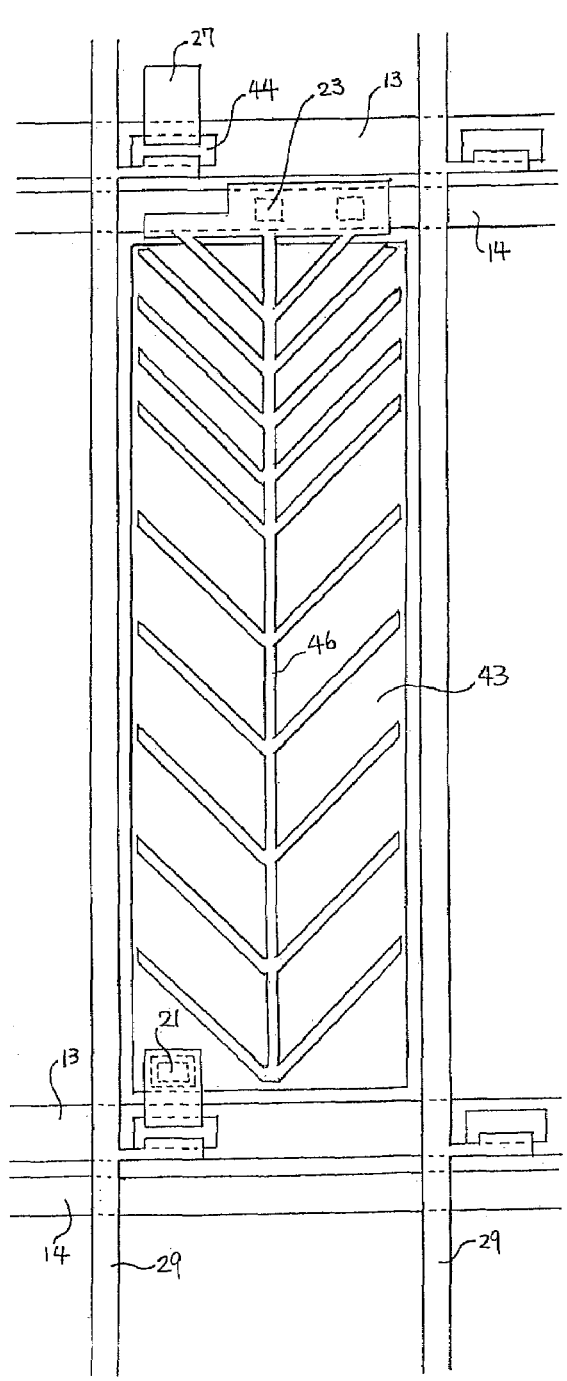
Figure 193:
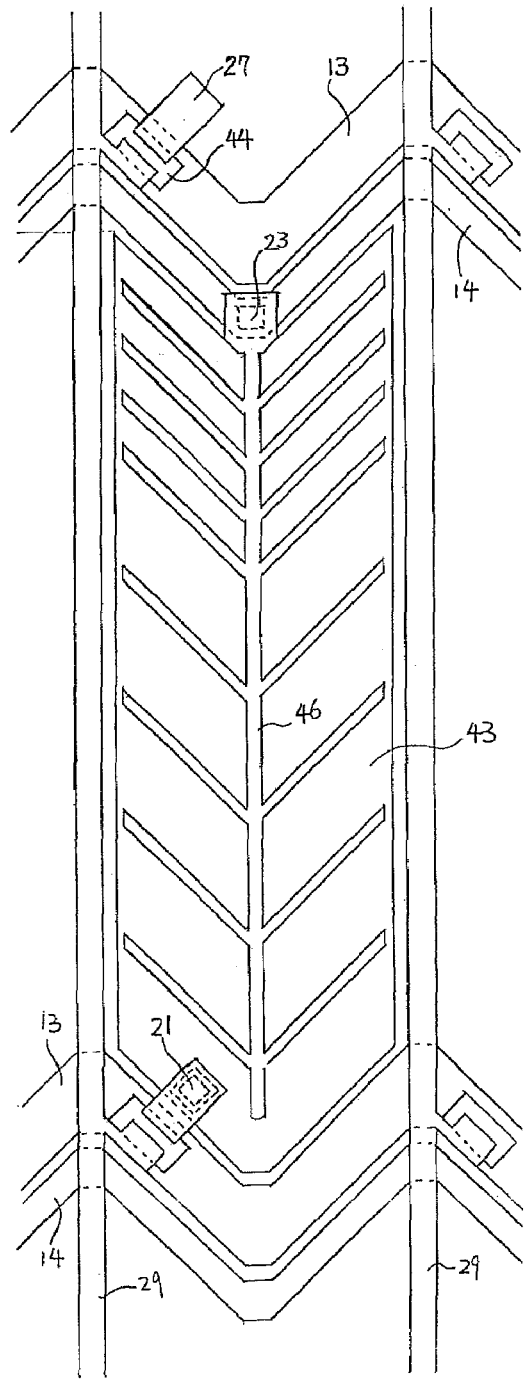
Figure 194:
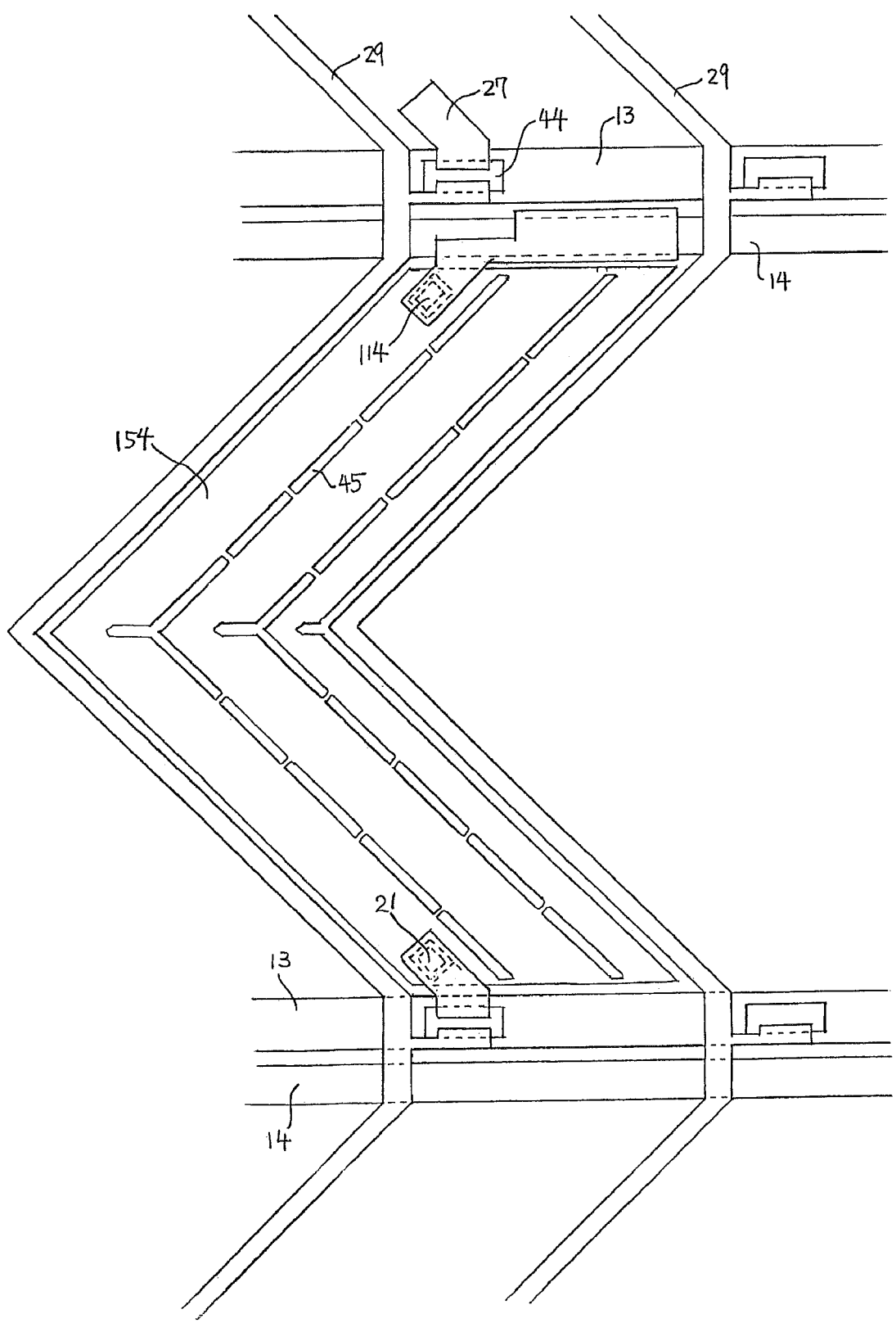
Figure 195:
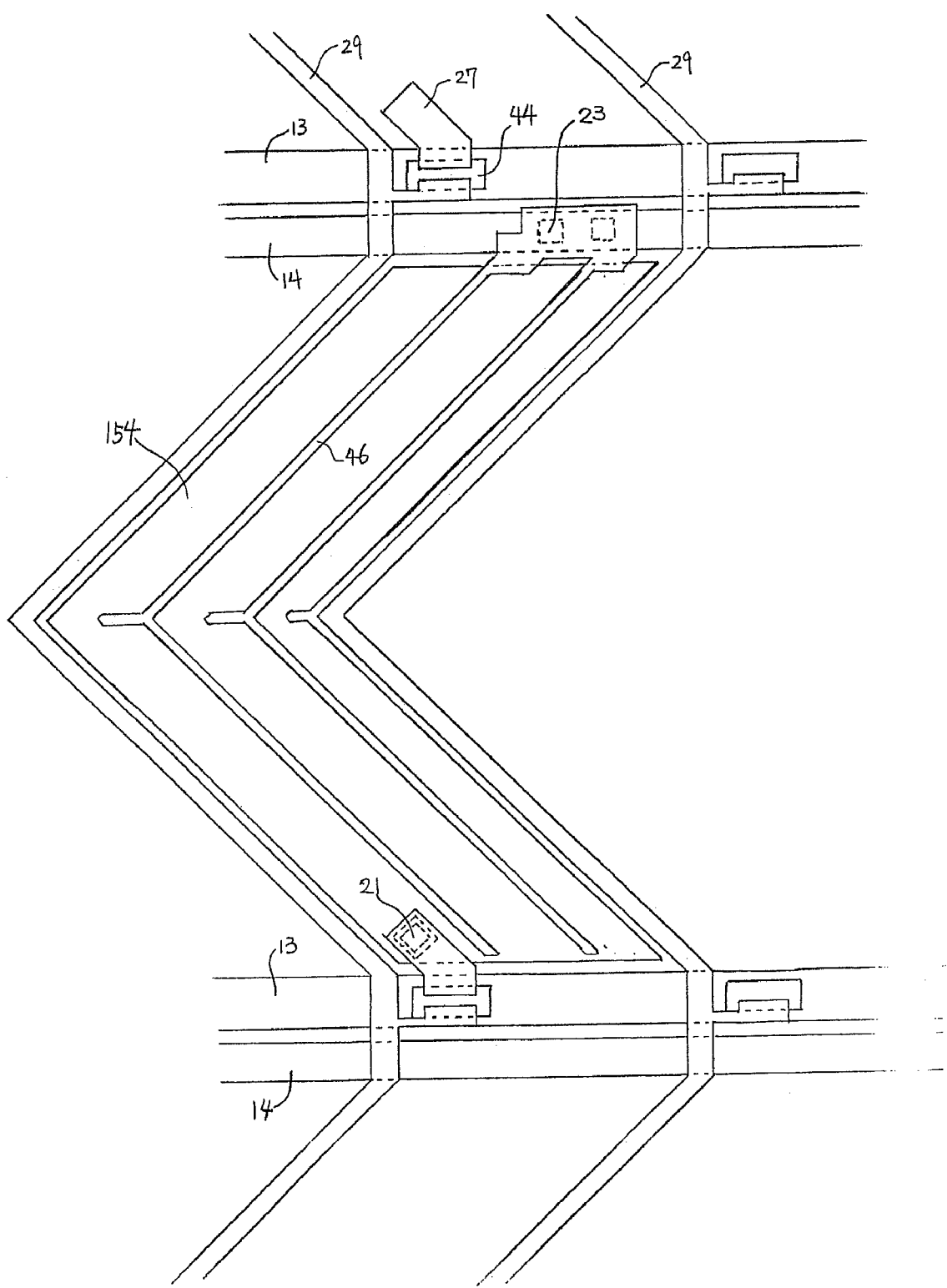
Figure 196:
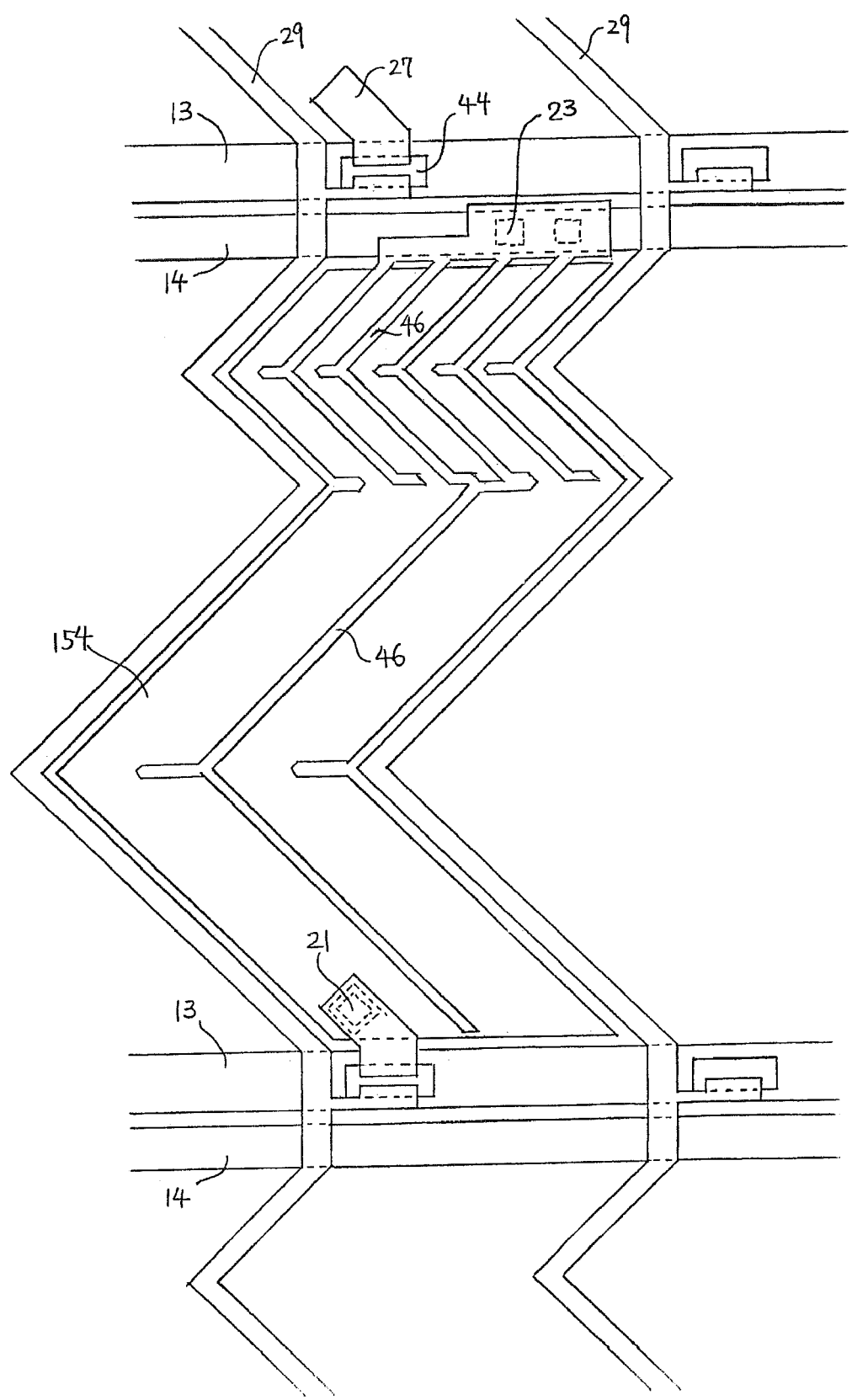
Figure 197:
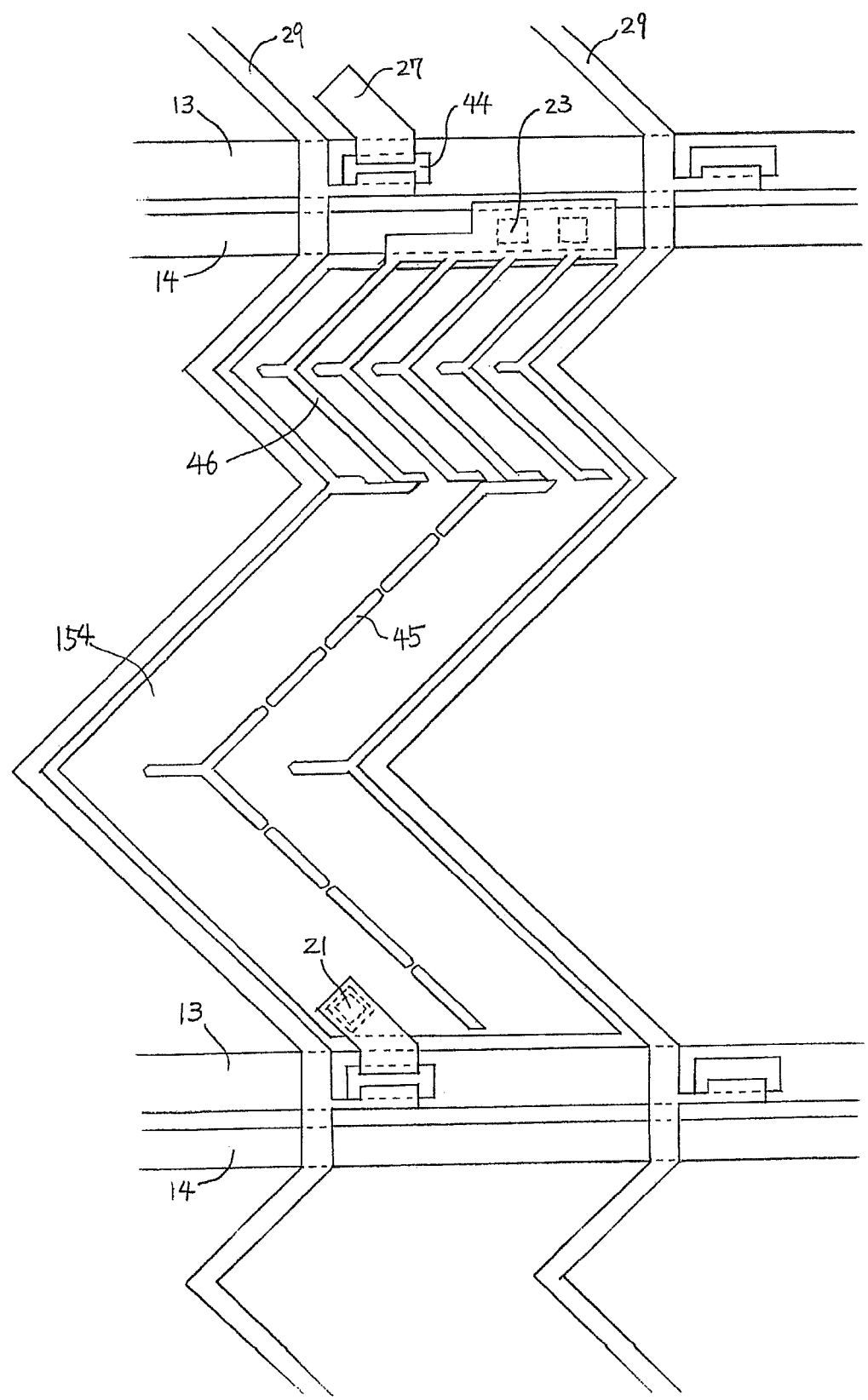
Figures 198, 199:
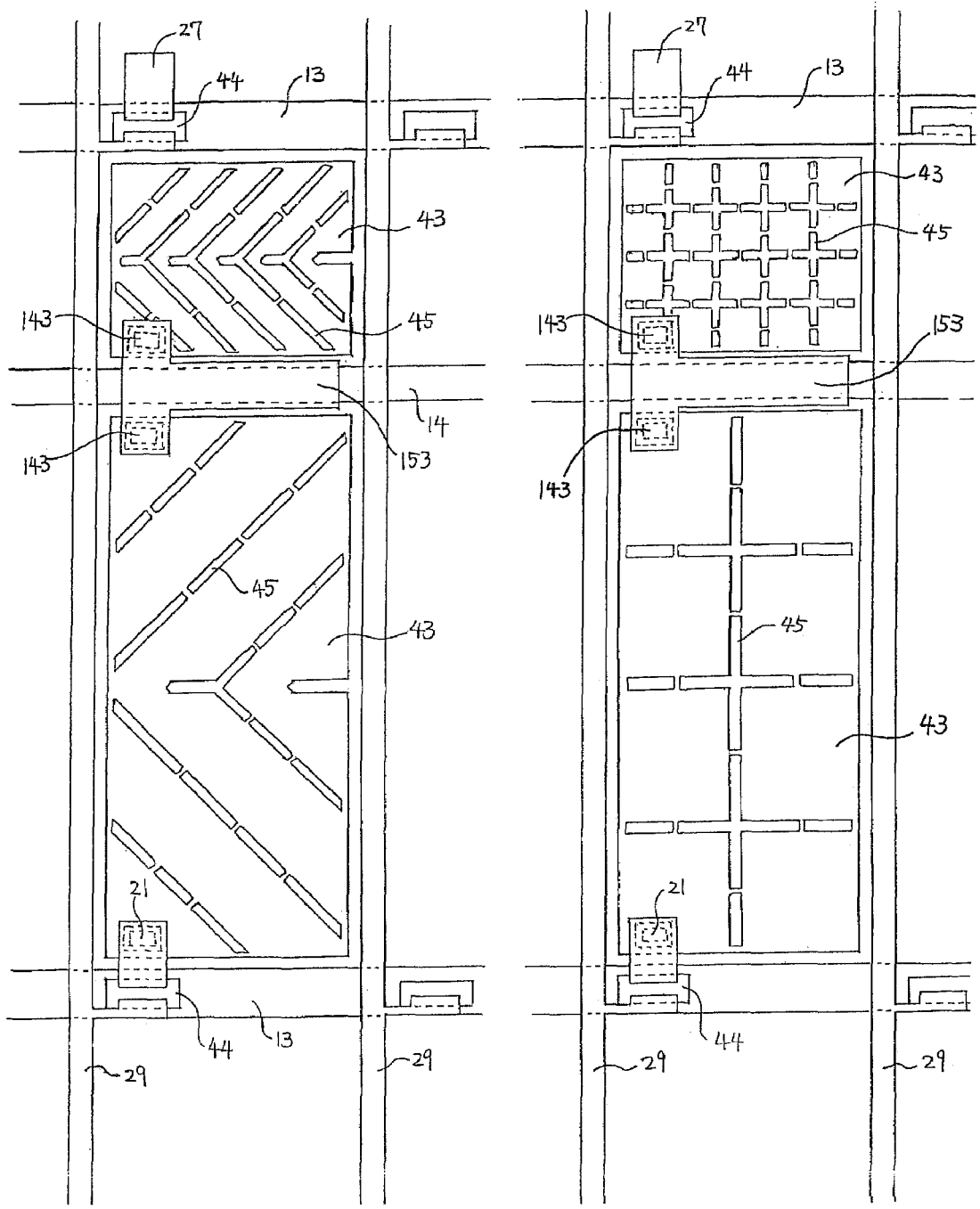
Figure 200:
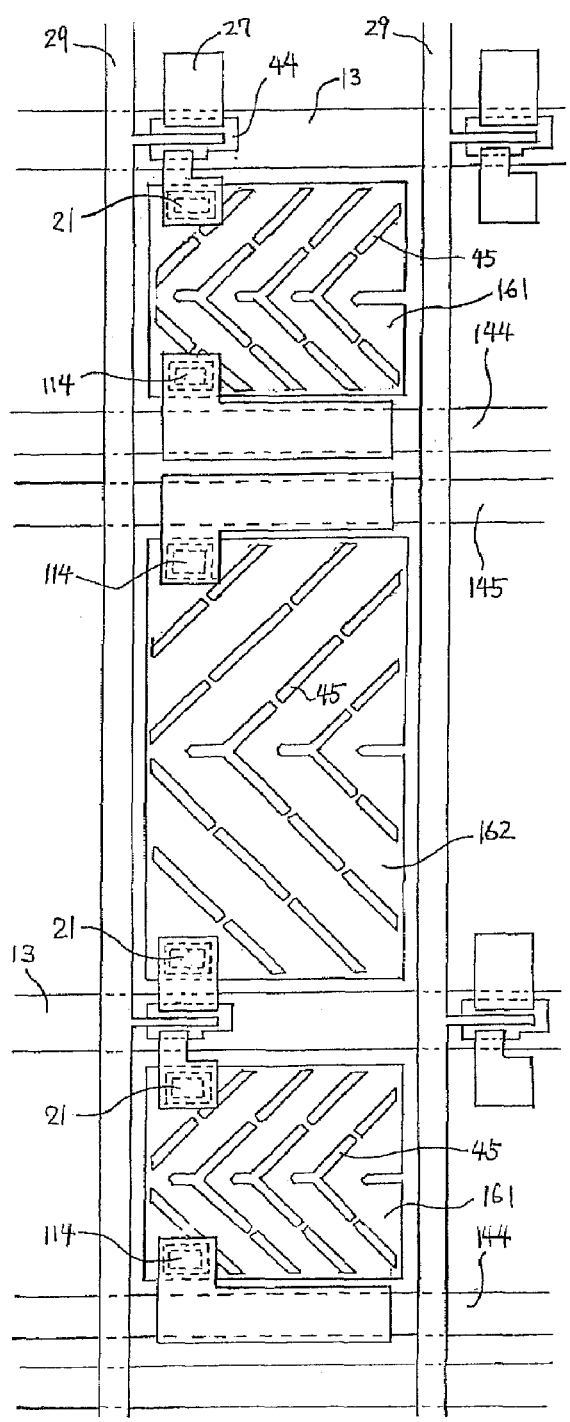
Figure 201:
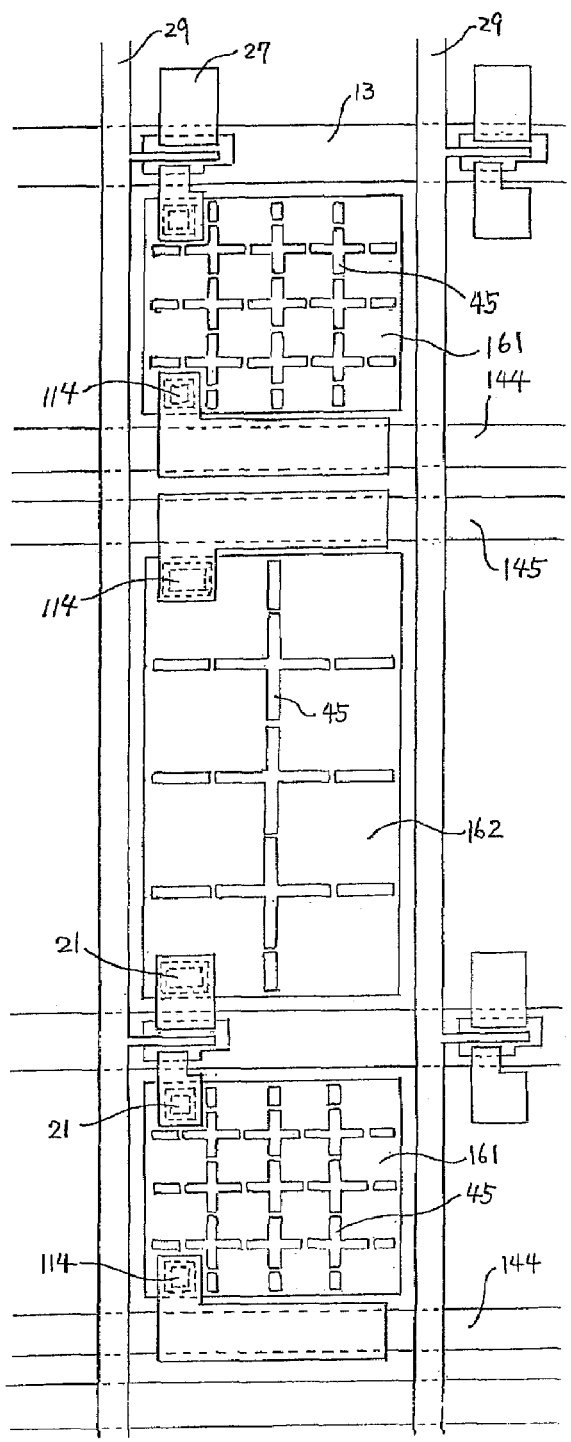
Figures 202, 203:
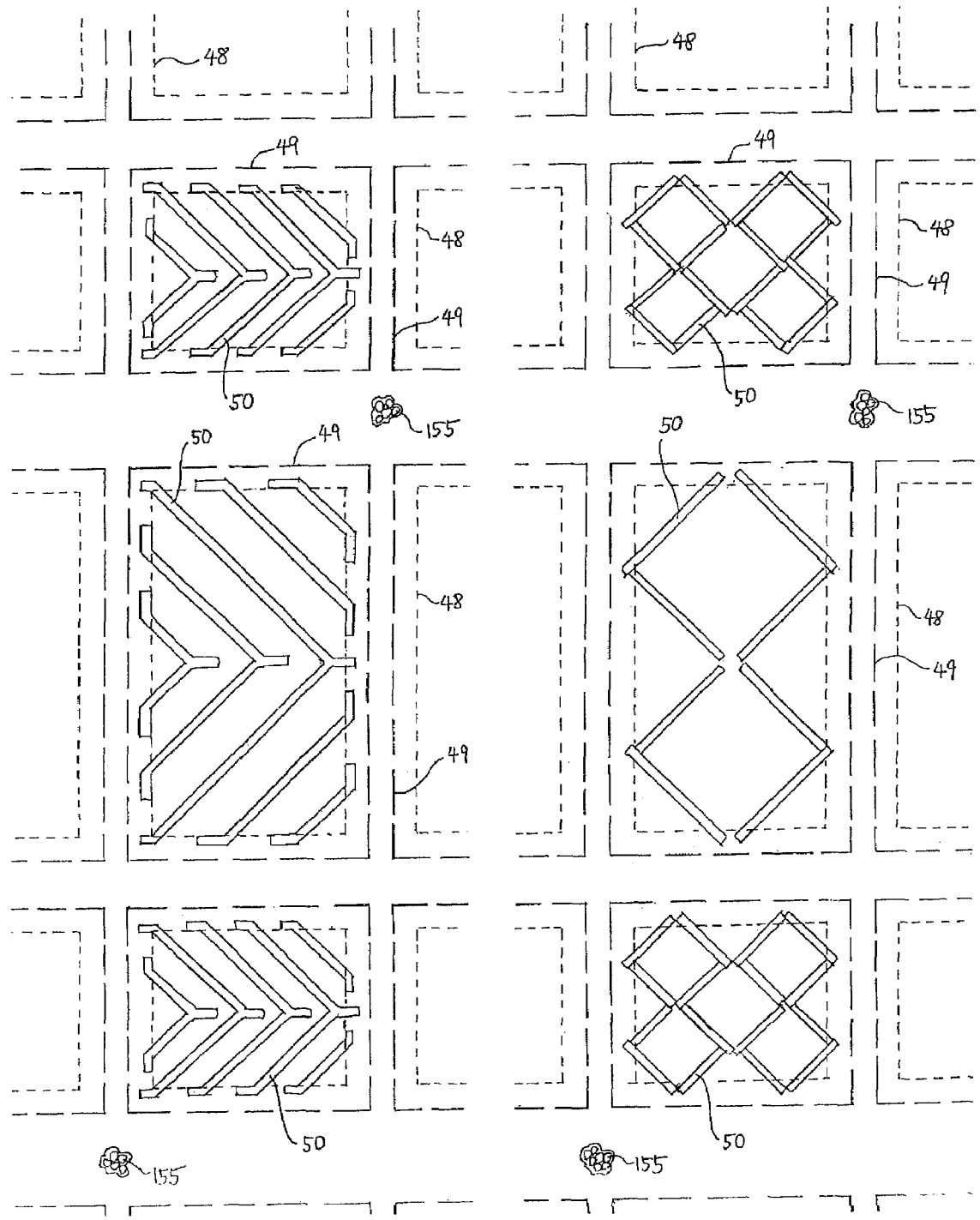
Figure 204:
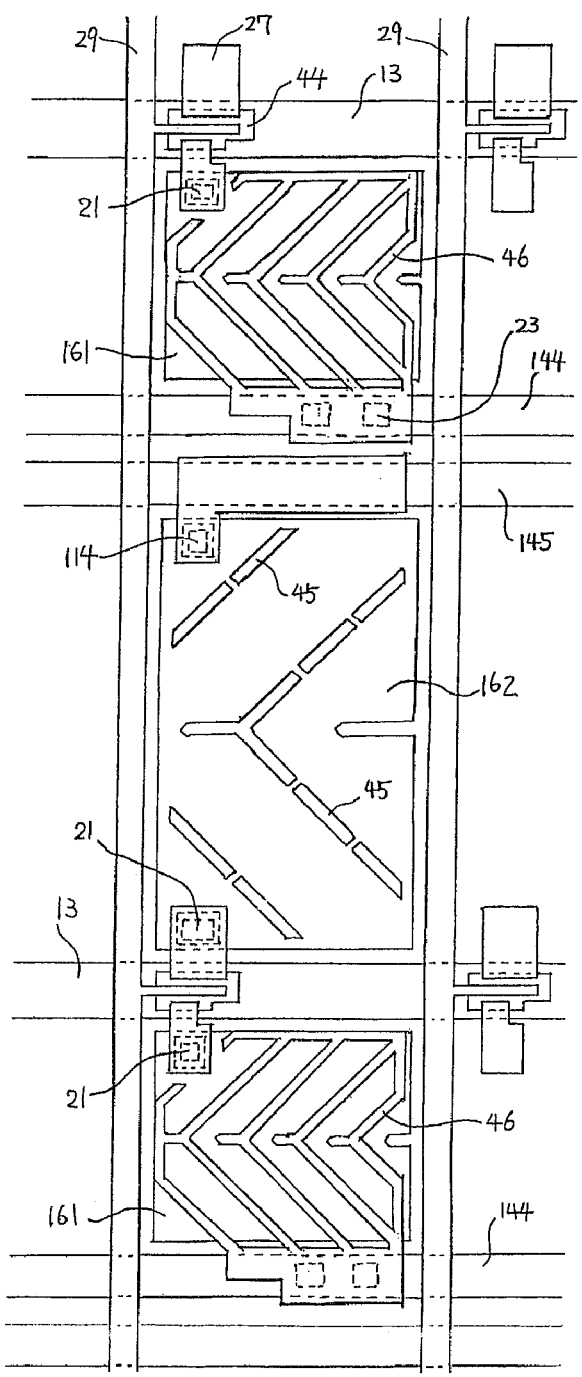
Figure 205:
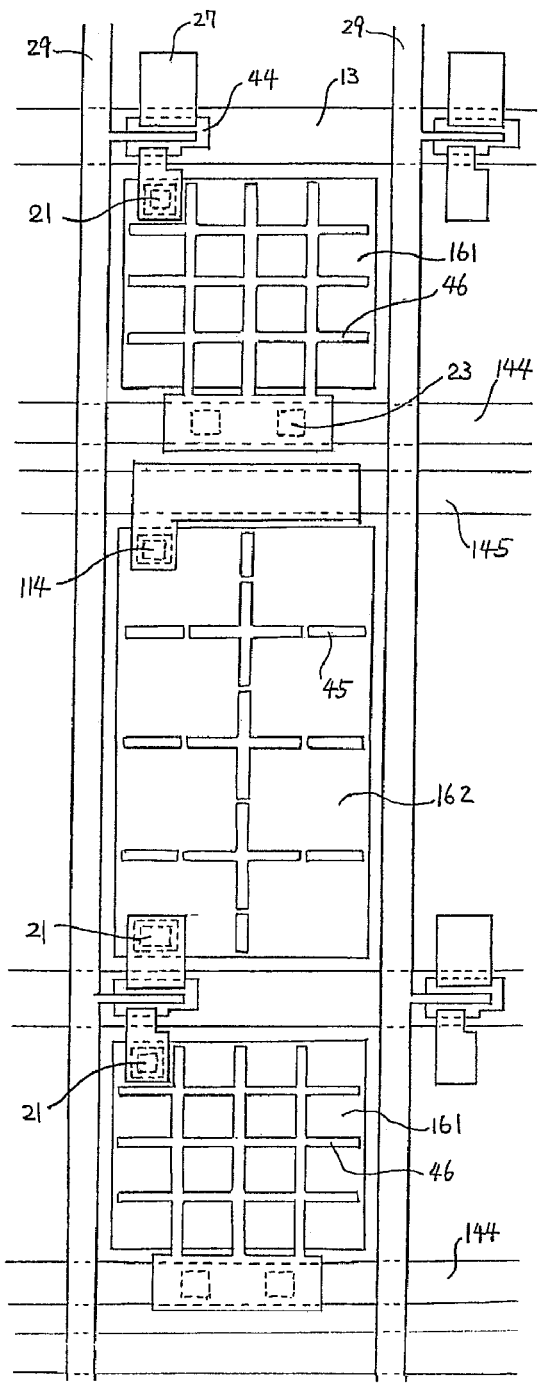
Figure 206:
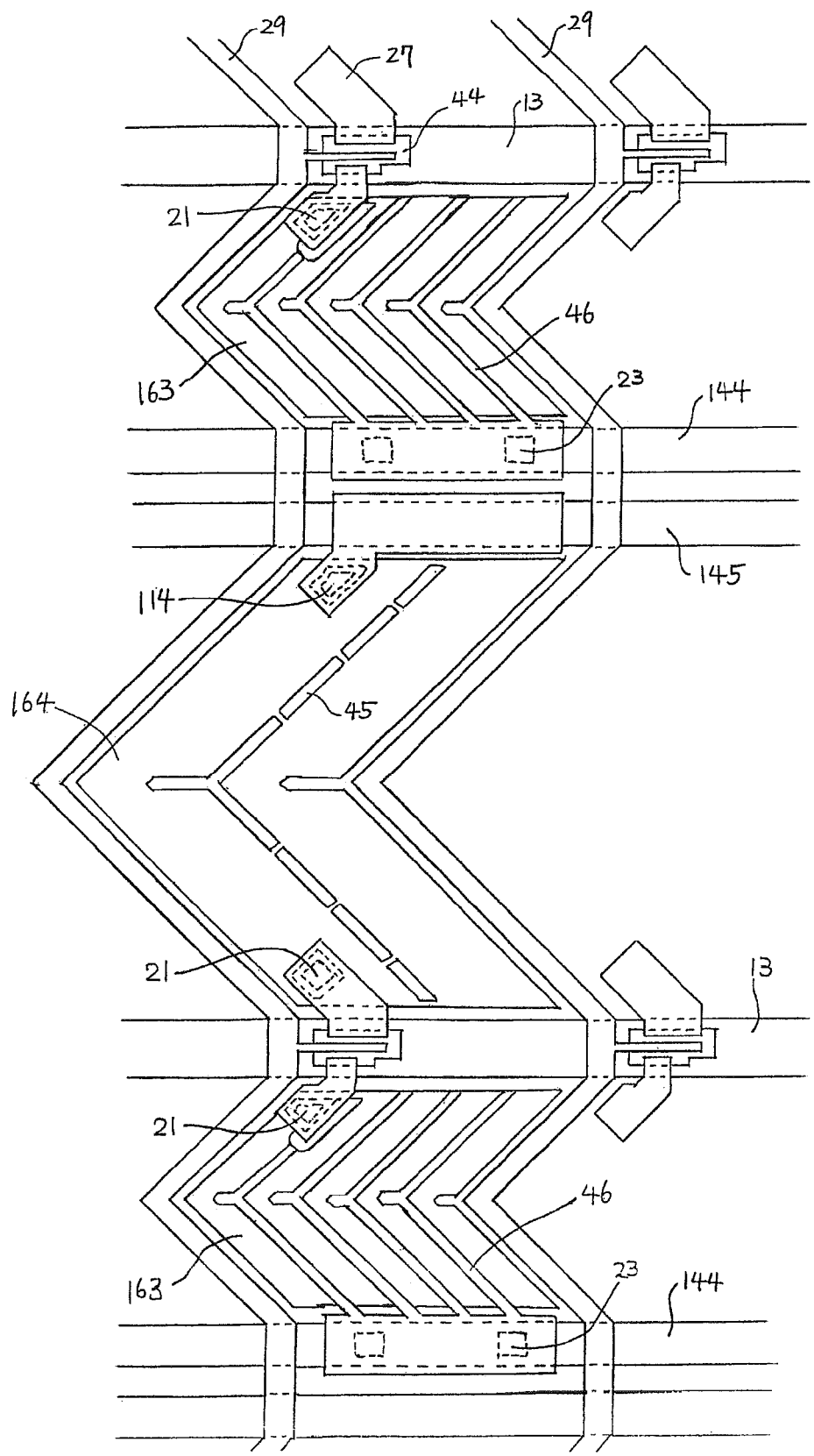
Figure 207:
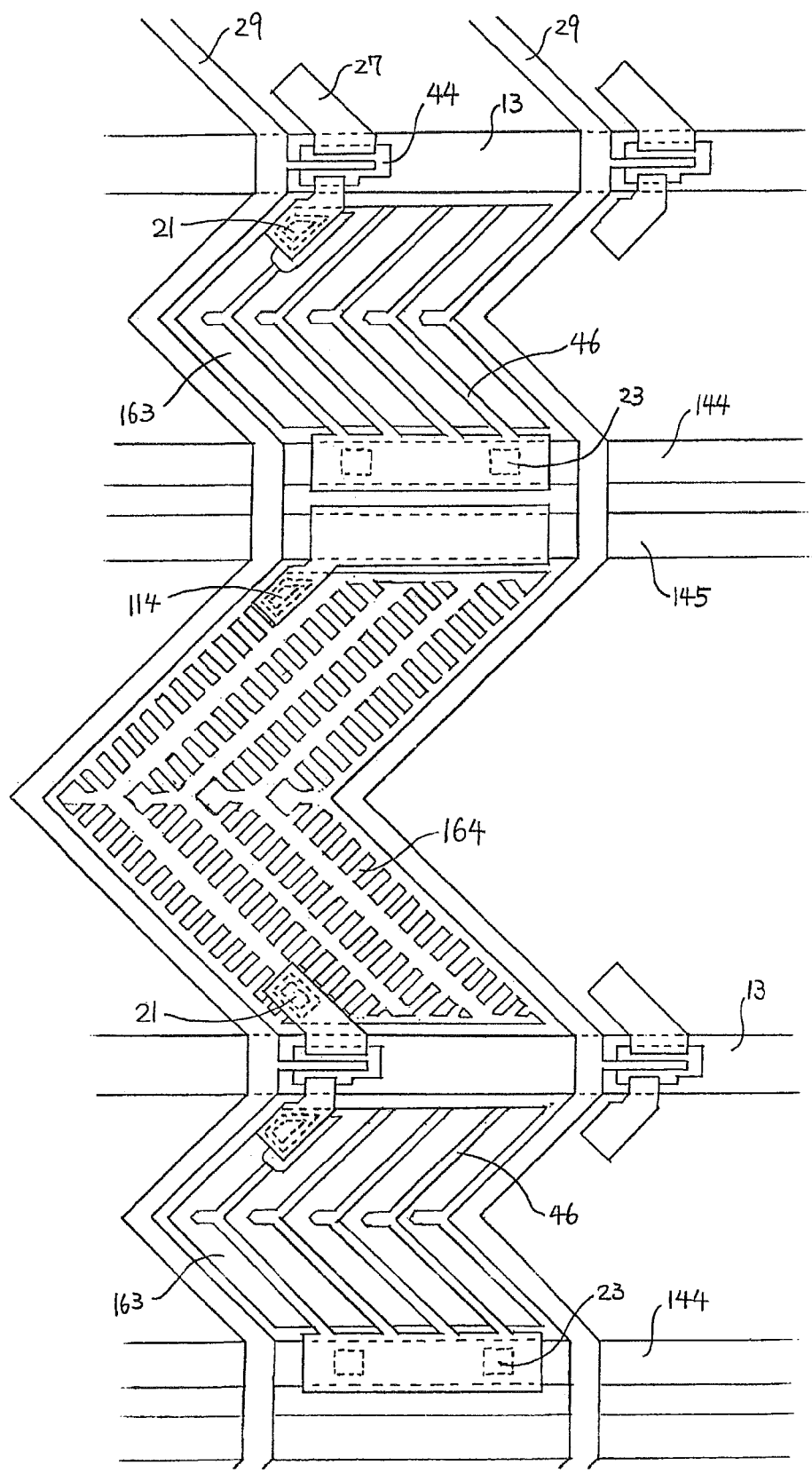
Figure 208:
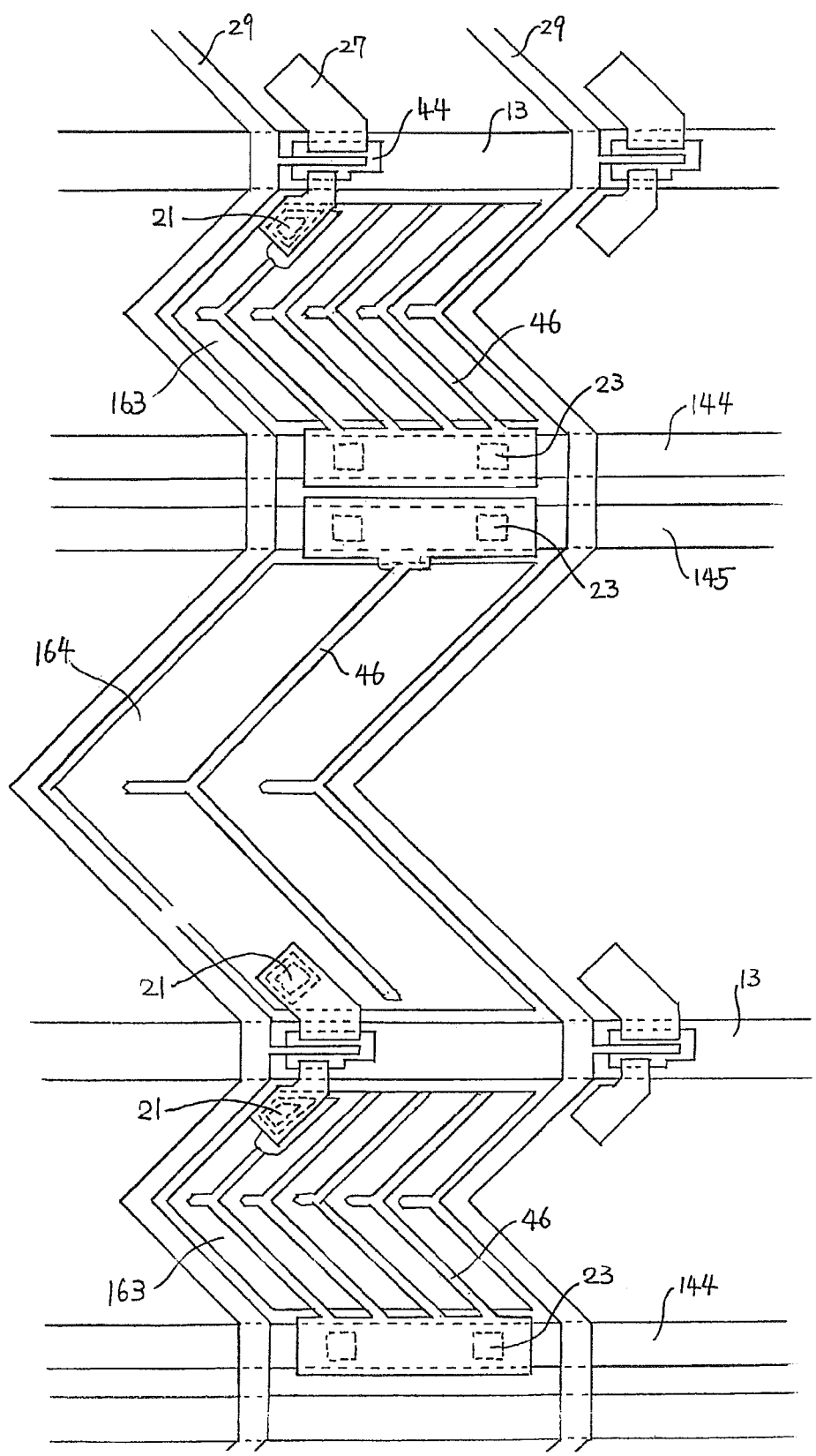
Figure 209:
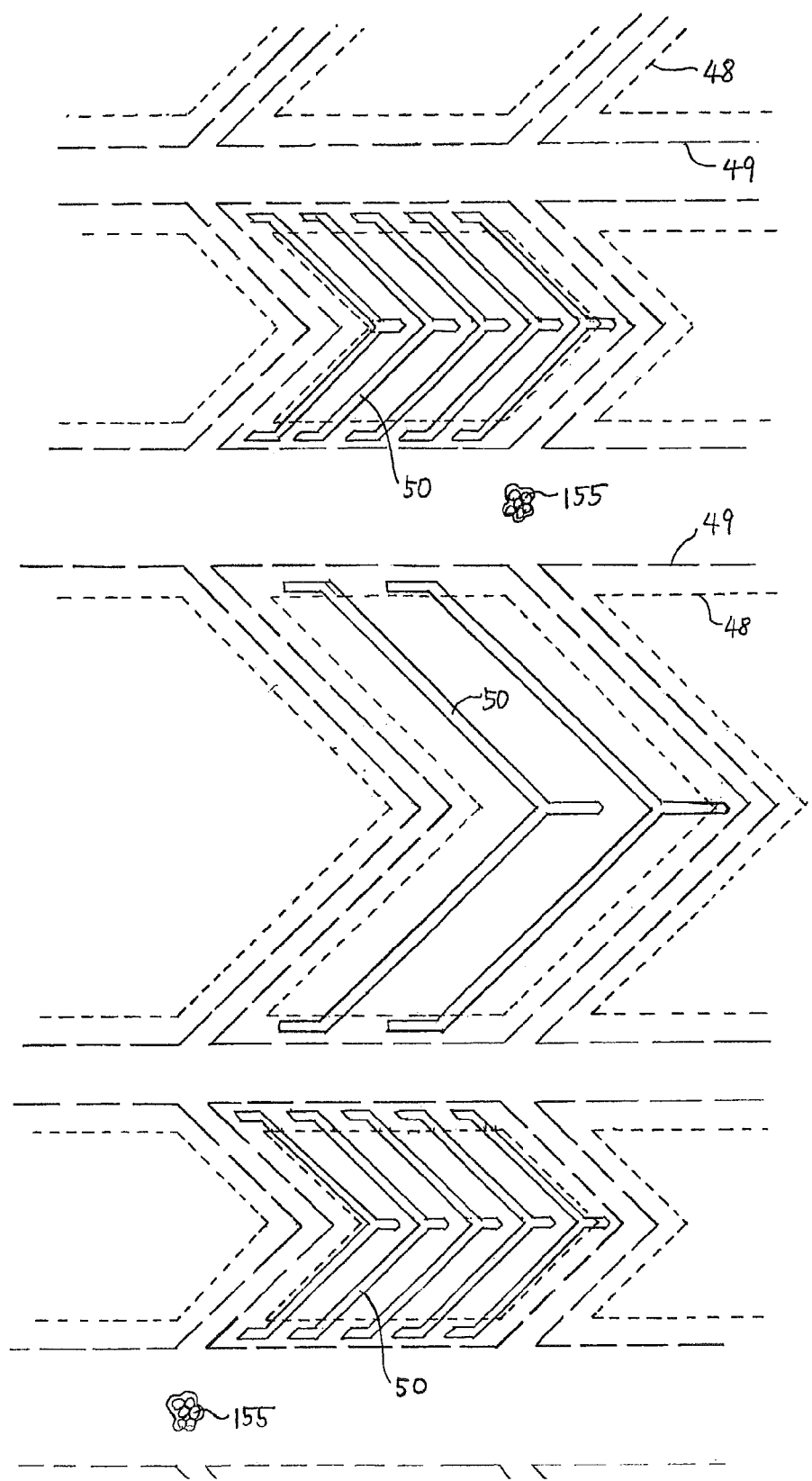
Figure 210:
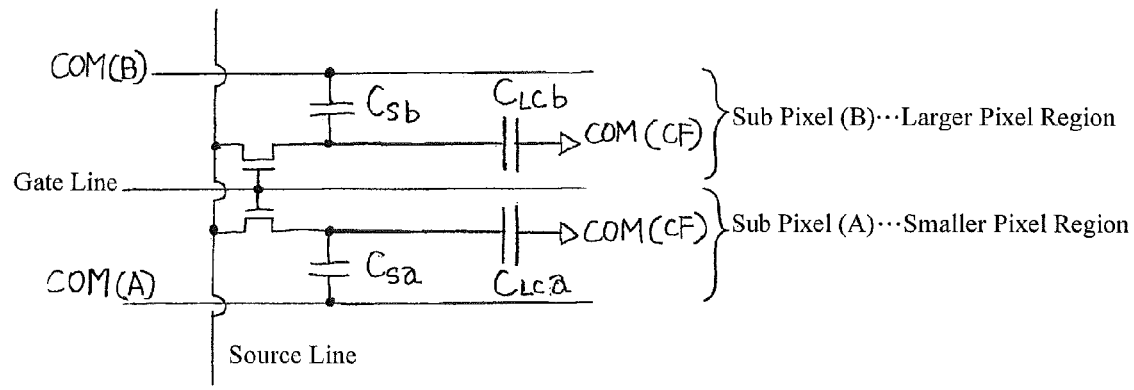
Figure 211:
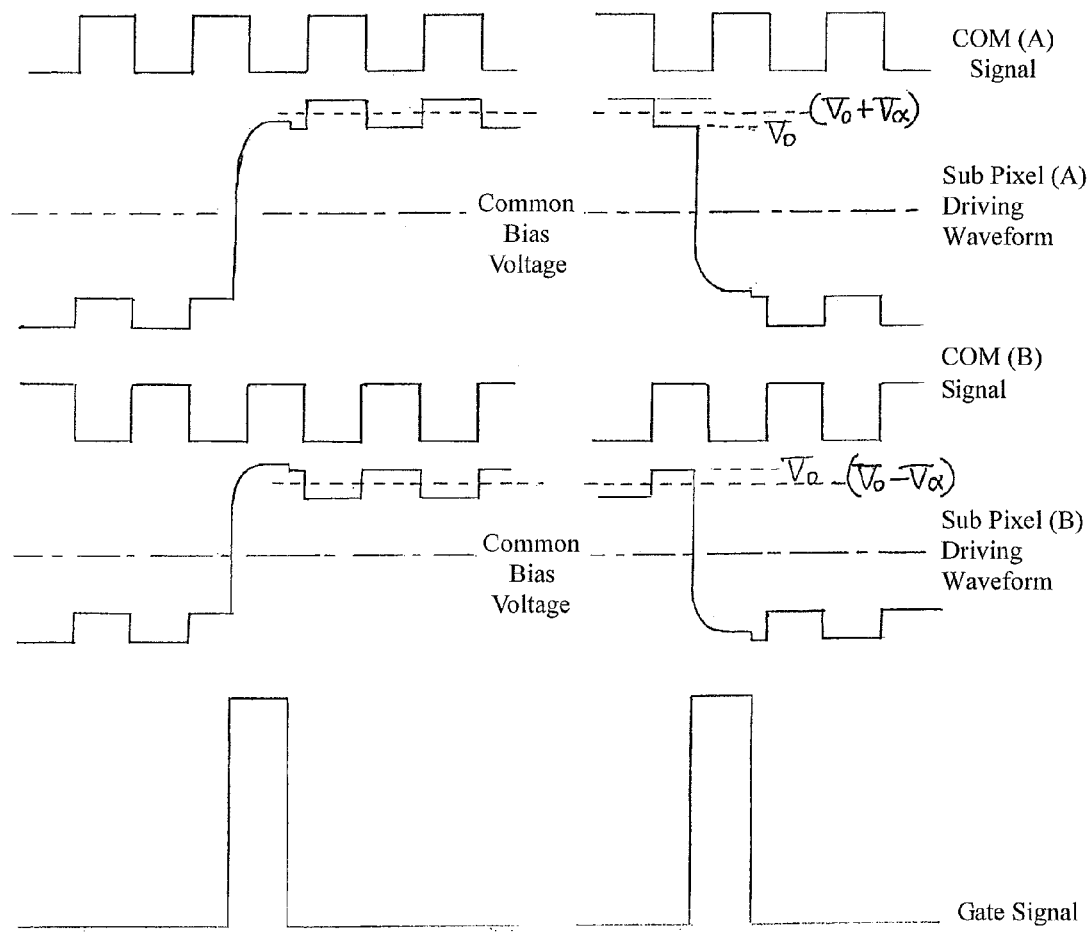
Figure 212:
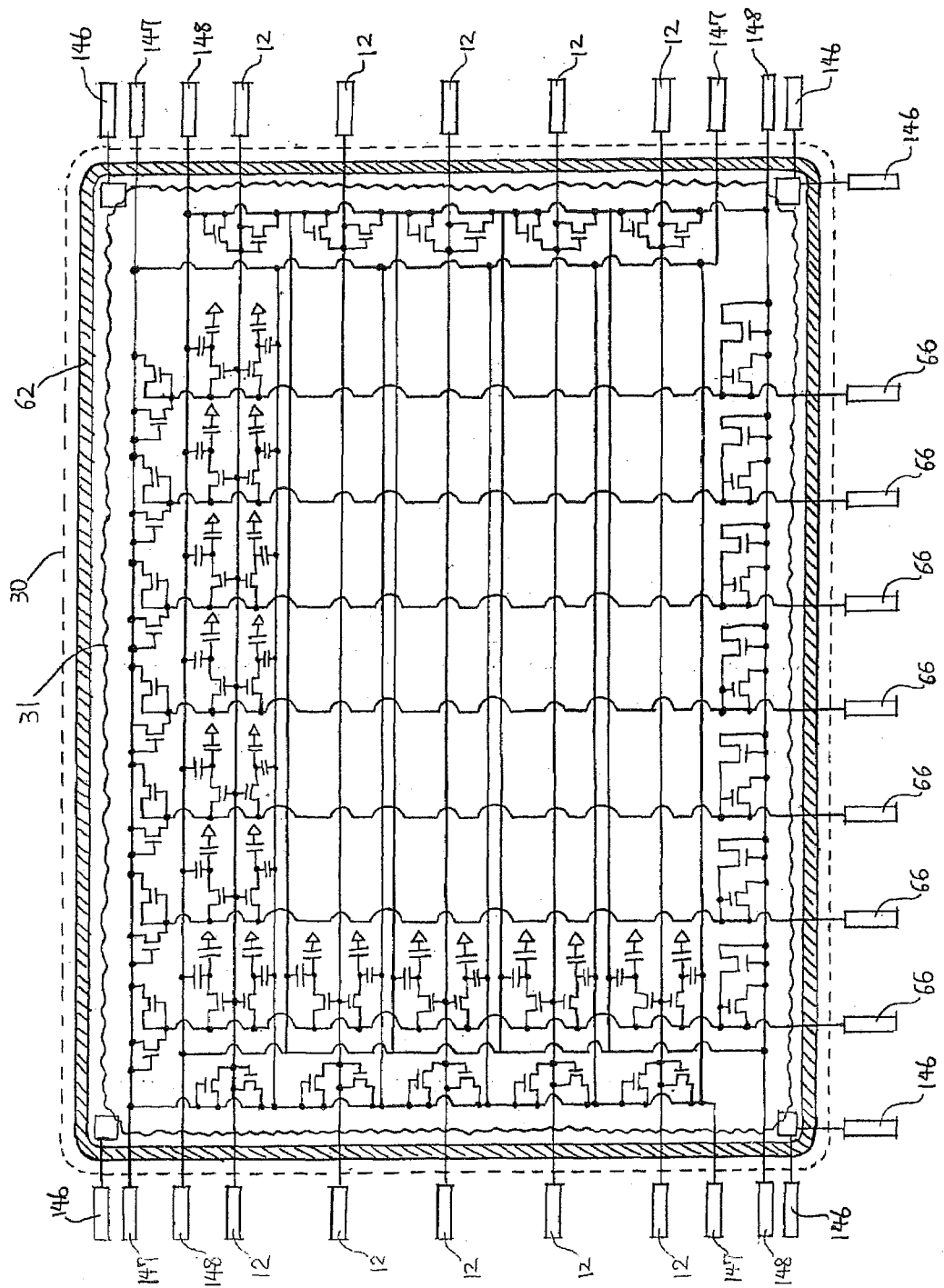

FIG. 132 is a planar view of a TFT matrix substrate that installs two types of alignment control electrodes in accordance with the present invention;

FIG. 133 is a planar view of a TFT matrix substrate that forms an alignment control electrode and a slit used for alignment control in accordance with the present invention;

FIG. 134 is a planar view of a TFT matrix substrate that forms an alignment control electrode and a slit for alignment control in accordance with the present invention;

FIG. 135 is a planar view of a color filter substrate used for TFT matrix assembly as shown in FIGS. 130, 132, 133 and 134 in accordance with the present invention;

FIG. 136 is a schematic view of the movement of liquid crystal molecules when the TFT matrix substrate as shown in FIGS. 131 and 132 and the color filter substrate as shown in FIG. 135 are assembled in accordance with the present invention;

FIG. 137 is a schematic view of the movement of liquid crystal molecules when the TFT matrix substrate as shown in FIGS. 133 and 134 and the color filter substrate as shown in FIG. 135 are assembled in accordance with the present invention;

FIG. 138 is a cross-sectional view of a TFT matrix substrate of the present invention;

FIG. 139 is a cross-sectional view of a TFT matrix substrate of the present invention;

FIG. 140 is a planar view of a mask used for a first halftone exposure that adopts a TN mode photolithographic process for three times as shown in FIG. 38 in accordance with the present invention;

FIG. 141 is a planar view of a mask used for a second halftone exposure that adopts a TN mode photolithographic process for three times as shown in FIG. 38 in accordance with the present invention;

FIG. 142 is a planar view of a general mask used in Step (i) of a second TN mode halftone double exposure manufacturing process as shown in FIG. 77 in accordance with the present invention;

FIG. 143 is a planar view of a general mask used in Step (ii) of a second TN mode halftone double exposure manufacturing process as shown in FIG. 77 in accordance with the present invention;

FIG. 144 is a planar view of a general mask used in Step (i) of a third TN mode halftone double exposure manufacturing process as shown in FIG. 77 in accordance with the present invention;

FIG. 145 is a planar view of a general mask used in Step (ii) of a third TN mode halftone double exposure manufacturing process as shown in FIG. 77 in accordance with the present invention;

FIG. 146 is a planar view of a TFT matrix substrate for forming a liquid crystal alignment control electrode and a liquid crystal alignment controlled slit pixel electrode in accordance with the present invention;

FIG. 147 is a planar view of a TFT matrix substrate that adopts two types of liquid crystal alignment control electrodes in accordance with the present invention;

FIG. 148 is a planar view of a TFT matrix substrate for forming a liquid crystal alignment control electrode and a liquid crystal alignment controlled slit pixel electrode in accordance with the present invention;

FIG. 149 is a planar view of a TFT matrix substrate for forming a liquid crystal alignment control electrode and a liquid crystal alignment controlled slit pixel electrode in accordance with the present invention;

FIG. 150 is a planar view of a TFT matrix substrate for forming a liquid crystal alignment control electrode and a liquid crystal alignment controlled slit pixel electrode in accordance with the present invention;

FIG. 151 is a planar view of a TFT matrix substrate for forming a liquid crystal alignment control electrode and a liquid crystal alignment controlled slit pixel electrode in accordance with the present invention;

FIG. 152 is a planar view of a TFT matrix substrate that connects a holdup capacitor (Cst) forming electrode to a pixel electrode in accordance with the present invention;

FIG. 153 is a planar view of a mask used in a first halftone exposure that adopts an IPS mode photolithographic process for three times as shown in FIG. 38 accordance with the present invention;

FIG. 154 is a planar view of a mask used in a second halftone exposure that adopts an IPS mode photolithographic process for three times as shown in FIG. 38 accordance with the present invention;

FIG. 155 is a planar view of a general mask used in Step (i) of a second IPS mode halftone double exposure manufacturing process as shown in FIG. 77 accordance with the present invention;

FIG. 156 is a planar view of a general mask used in Step (ii) of a second IPS mode halftone double exposure manufacturing process as shown in FIG. 77 accordance with the present invention;

FIG. 157 is a planar view of a general mask used in Step (i) of a third IPS mode halftone double exposure manufacturing process as shown in FIG. 77 accordance with the present invention;

FIG. 158 is a planar view of a general mask used in Step (ii) of a third IPS mode halftone double exposure manufacturing process as shown in FIG. 77 accordance with the present invention;

FIG. 159 is an enlarged planar view of an intersection area of a thin film transistor component region and a gate electrode and a source electrode in accordance with the present invention;

FIG. 160 is an enlarged planar view of an intersection area of a thin film transistor component region and a gate electrode and a source electrode in accordance with the present invention;

FIG. 161 is an enlarged planar view of a contact hole in a contact pad portion of a thin film semiconductor layer and a pixel electrode as shown in FIG. 159 in accordance with the present invention;

FIG. 162 is an enlarged planar view of a contact hole in a contact pad portion of a thin film semiconductor layer and a pixel electrode as shown in FIG. 160 in accordance with the present invention;

FIG. 163 is a cross-sectional view of a TFT matrix substrate as shown in FIG. 159 and 160 in accordance with the present invention;

FIG. 164 is a cross-sectional view of a TFT matrix substrate as shown in FIG. 159 and 160 in accordance with the present invention;

FIG. 165 is a cross-sectional view of a TFT matrix substrate as shown in FIG. 159 and 160 in accordance with the present invention;

FIG. 166 is a cross-sectional view of a TFT matrix substrate as shown in FIG. 159 and 160 in accordance with the present invention;

FIG. 167 is a cross-sectional view of the structure of a gate terminal portion and a main seal region of a MVA or TN mode LCD panel in accordance with the present invention;

FIG. 168 is a cross-sectional view of the structure of a source electrode terminal and a main seal region of a MVA or TN mode LCD panel in accordance with the present invention;

FIG. 169 is a cross-sectional view of the structure of a static charge protection circuit and a main seal region of an LCD panel in accordance with the present invention;

FIG. 170 is a cross-sectional view of the structure of a static charge protection circuit and a main seal region of a MVA mode LCD panel in accordance with the present invention;

FIG. 171 is a cross-sectional view of the structure of a static charge protection circuit and a main seal region of an IPS LCD panel in accordance with the present invention;

FIG. 172 is a schematic view of a halftone exposure manufacturing flow for forming a gate electrode, a pixel electrode and a common electrode in accordance with the present invention;

FIG. 173 is a schematic view of a halftone exposure manufacturing flow for forming a gate electrode, a pixel electrode and a common electrode in accordance with the present invention;

FIG. 174 is a schematic view of a halftone exposure manufacturing flow for forming an amorphous silicon island and a contact hole in accordance with the present invention;

FIG. 175 is a schematic view of a general exposure process flow for forming a source electrode, a drain electrode and an alignment control electrode in accordance with the present invention;

FIG. 176 is a cross-sectional view of a manufacturing process that adopts a halftone exposure method for forming a pixel electrode in accordance with the present invention;

FIG. 177 is a cross-sectional view of a manufacturing process that adopts a halftone exposure method for forming a pixel electrode in accordance with the present invention;

FIG. 178 is a schematic view of a manufacturing process that adopts a halftone exposure method for forming an amorphous silicon island and a contact hole in accordance with the present invention;

FIG. 179 is a schematic view of a general exposure process flow for forming a source electrode, a drain electrode and an alignment control electrode in accordance with the present invention;

FIG. 180 is a schematic view of a halftone exposure manufacturing flow for forming an amorphous silicon island and a contact hole in accordance with the present invention;

FIG. 181 is a schematic view of a general exposure process flow for forming a source electrode, a drain electrode and an alignment control electrode in accordance with the present invention;

FIG. 182 is a cross-sectional view of a manufacturing process that adopts an island semiconductor layer of a thin film transistor component formed by a halftone exposure method and a contact hole in accordance with the present invention;

FIG. 183 is a cross-sectional view of a manufacturing process that adopts a source electrode, drain a electrode, terminal electrode and a holdup capacitor (Cst) to form an electrode or an alignment control electrode in accordance with the present invention;

FIG. 184 is a cross-sectional view of a manufacturing process that adopts an island semiconductor layer of a thin film transistor component formed by a halftone exposure method and a contact hole in accordance with the present invention;

FIG. 185 is a cross-sectional view of a manufacturing process for forming a source electrode, a drain electrode, a terminal electrode and a holdup capacitor (Cst) or forming an electrode or an alignment control electrode in accordance with the present invention;

FIG. 186 is a planar view of a TFT matrix substrate composed of a plurality of pixel regions with different threshold voltages in accordance with the present invention;

FIG. 187 is a planar view of a TFT matrix substrate composed of a plurality of pixel regions with different threshold voltages in accordance with the present invention;

FIG. 188 is a planar view of a TFT matrix substrate composed of a plurality of pixel regions with different threshold voltages in accordance with the present invention;

FIG. 189 is a planar view of a TFT matrix substrate composed of a plurality of pixel regions with different threshold voltages in accordance with the present invention;

FIG. 190 is a planar view of a TFT matrix substrate composed of a plurality of pixel regions with different threshold voltages in accordance with the present invention;

FIG. 191 is a planar view of a TFT matrix substrate composed of a plurality of pixel regions with different threshold voltages in accordance with the present invention;

FIG. 192 is a planar view of a TFT matrix substrate composed of a plurality of pixel regions with different threshold voltages in accordance with the present invention;

FIG. 193 is a planar view of a TFT matrix substrate composed of a plurality of pixel regions with different threshold voltages in accordance with the present invention;

FIG. 194 is a planar view of a TFT matrix substrate composed of a plurality of pixel regions with different threshold voltages in accordance with the present invention;

FIG. 195 is a planar view of a TFT matrix substrate composed of a plurality of pixel regions with different threshold voltages in accordance with the present invention;

FIG. 196 is a planar view of a TFT matrix substrate composed of a plurality of pixel regions with different threshold voltages in accordance with the present invention;

FIG. 197 is a planar view of a TFT matrix substrate composed of a plurality of pixel regions with different threshold voltages in accordance with the present invention;

FIG. 198 is a planar view of a TFT matrix substrate composed of a plurality of pixel regions with different threshold voltages in accordance with the present invention;

FIG. 199 is a planar view of a TFT matrix substrate composed of a plurality of pixel regions with different threshold voltages in accordance with the present invention;

FIG. 200 is a planar view of a TFT matrix substrate composed of a plurality of pixel regions with different threshold voltages in accordance with the present invention;

FIG. 201 is a planar view of a TFT matrix substrate composed of a plurality of pixel regions with different threshold voltages in accordance with the present invention;

FIG. 202 is a planar view of a color filter substrate corresponding to FIG. 200 of the present invention;

FIG. 203 is a planar view of a color filter substrate corresponding to FIG. 201 of the present invention;

FIG. 204 is a planar view of a TFT matrix substrate composed of a plurality of pixel regions with different threshold voltages in accordance with the present invention;

FIG. 205 is a planar view of a TFT matrix substrate composed of a plurality of pixel regions with different threshold voltages in accordance with the present invention;

FIG. 206 is a planar view of a TFT matrix substrate composed of a plurality of pixel regions with different threshold voltages in accordance with the present invention;

FIG. 207 is a planar view of a TFT matrix substrate composed of a plurality of pixel regions with different threshold voltages in accordance with the present invention;

FIG. 208 is a planar view of a TFT matrix substrate composed of a plurality of pixel regions with different threshold voltages in accordance with the present invention;

FIG. 209 is a planar view of a color filter substrate corresponding to FIGS. 206, 207 and 208 of the present invention;

FIG. 210 is an equivalent circuit diagram of a pixel structure corresponding to FIG. 200, 201, 204, 205, 206, 207, 208, 228, 229, 230, 231 and 232 in accordance with the present invention FIG. 211 is a driving waveform diagram of an LCD panel with a pixel structure as shown in FIGS. 200, 201, 204, 205, 206, 207, 208, 228 229, 230, 231 and 232 in accordance with the present invention FIG. 212 is a planar view of a LCD panel of the present invention having a pixel structure as shown in FIGS. 200, 201, 204, 205, 206, 207, 208, 228 229, 230, 231 and 232.

Figure 213:
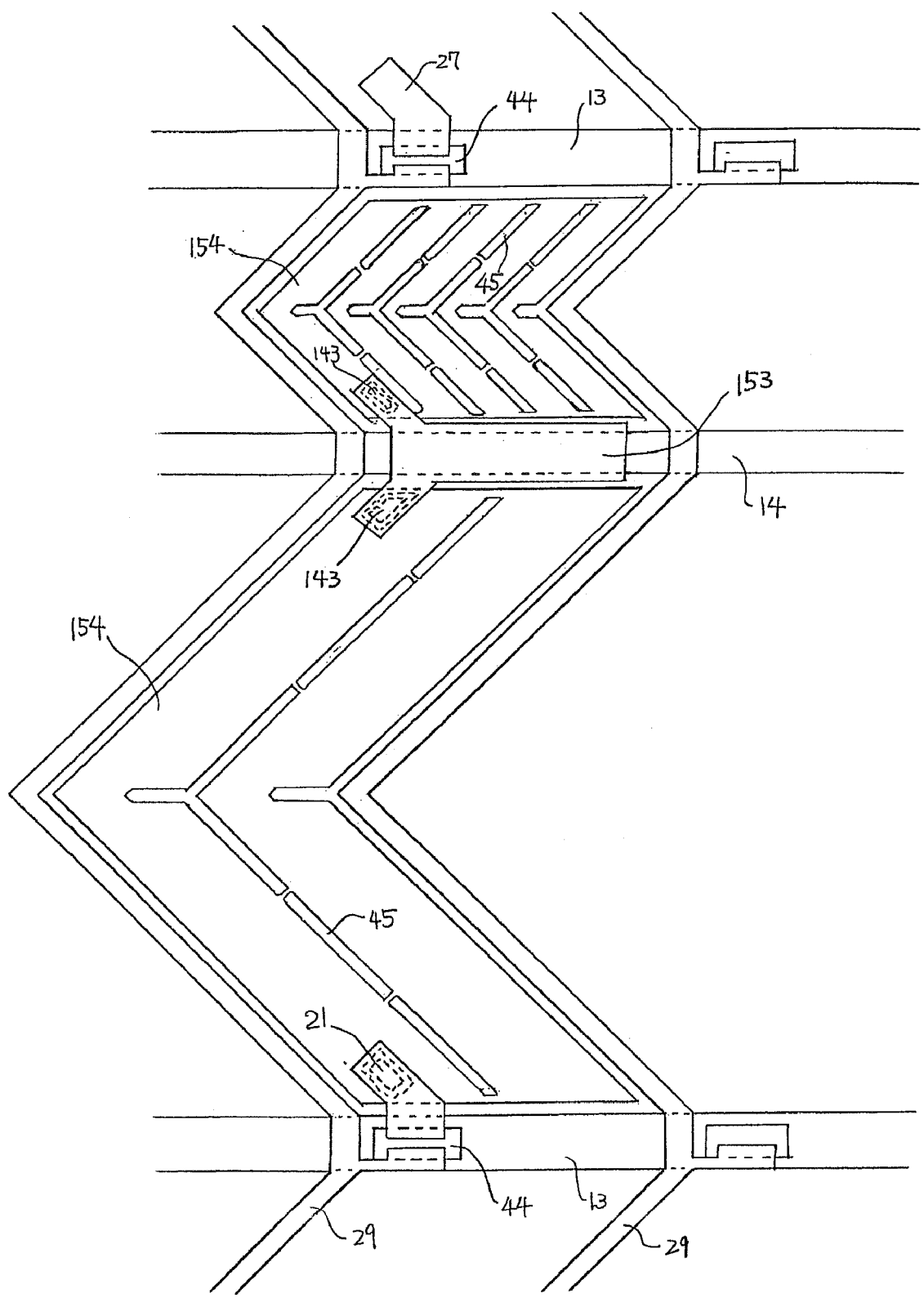
Figure 214:
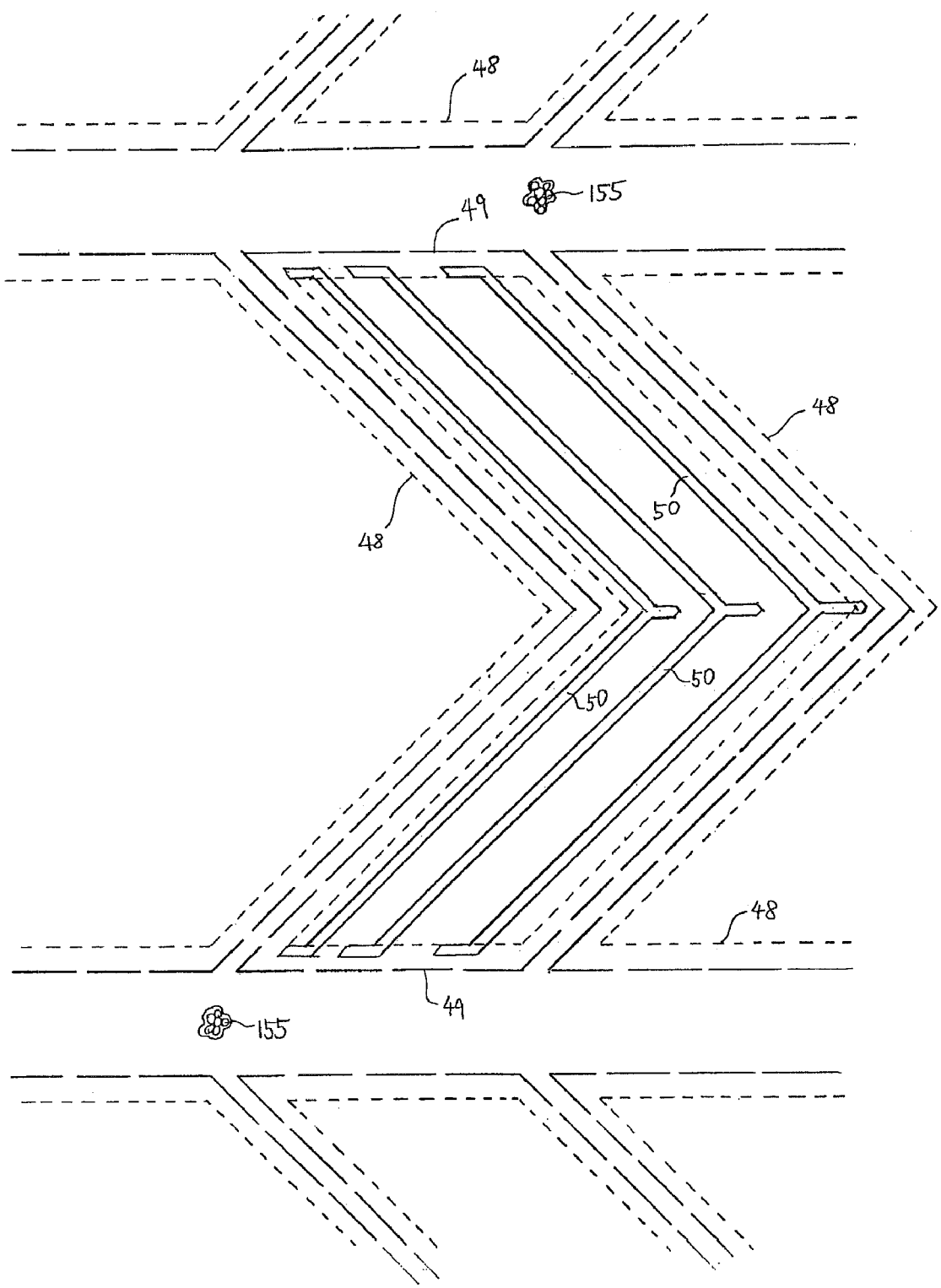
Figure 215:
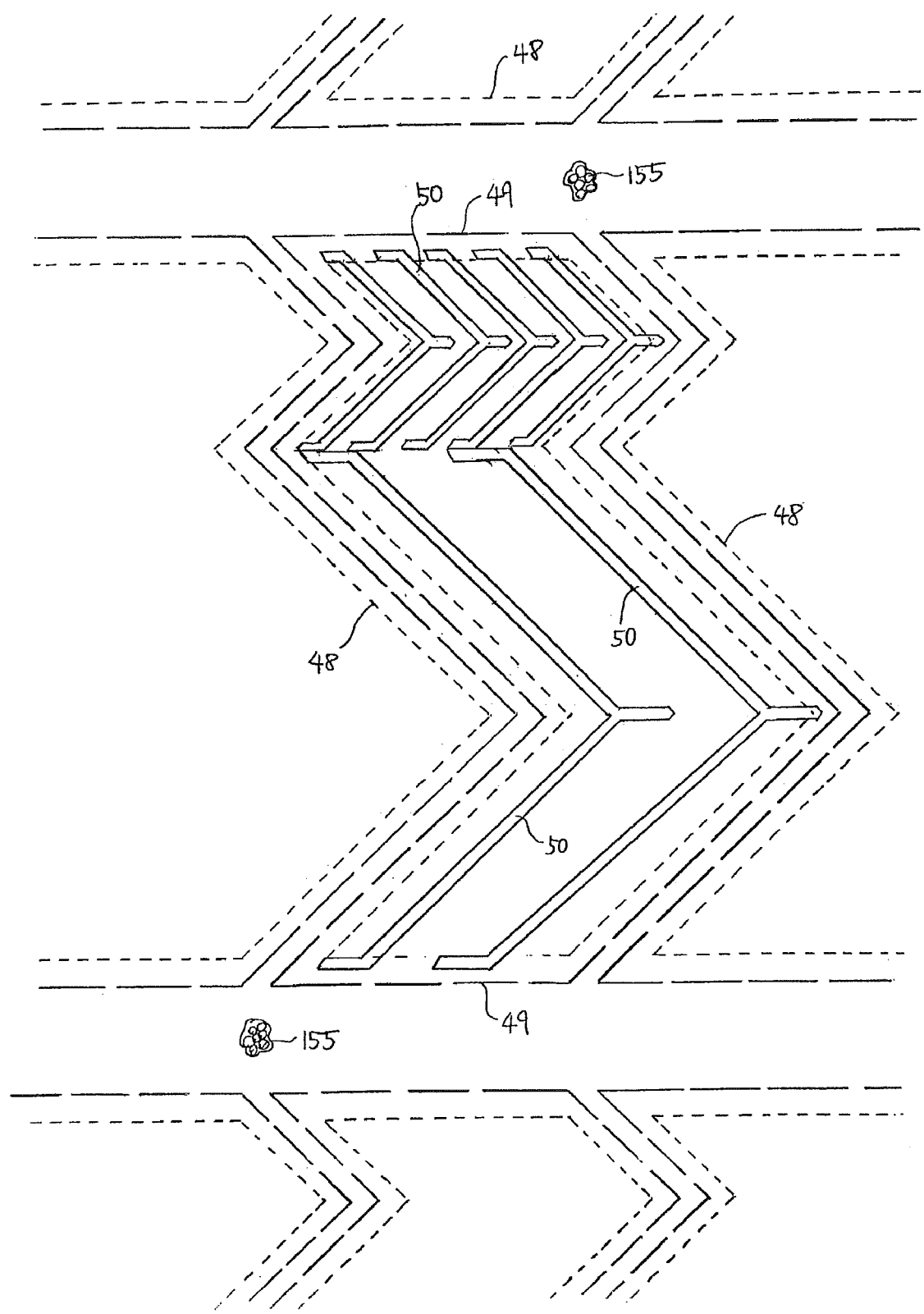
Figure 216:
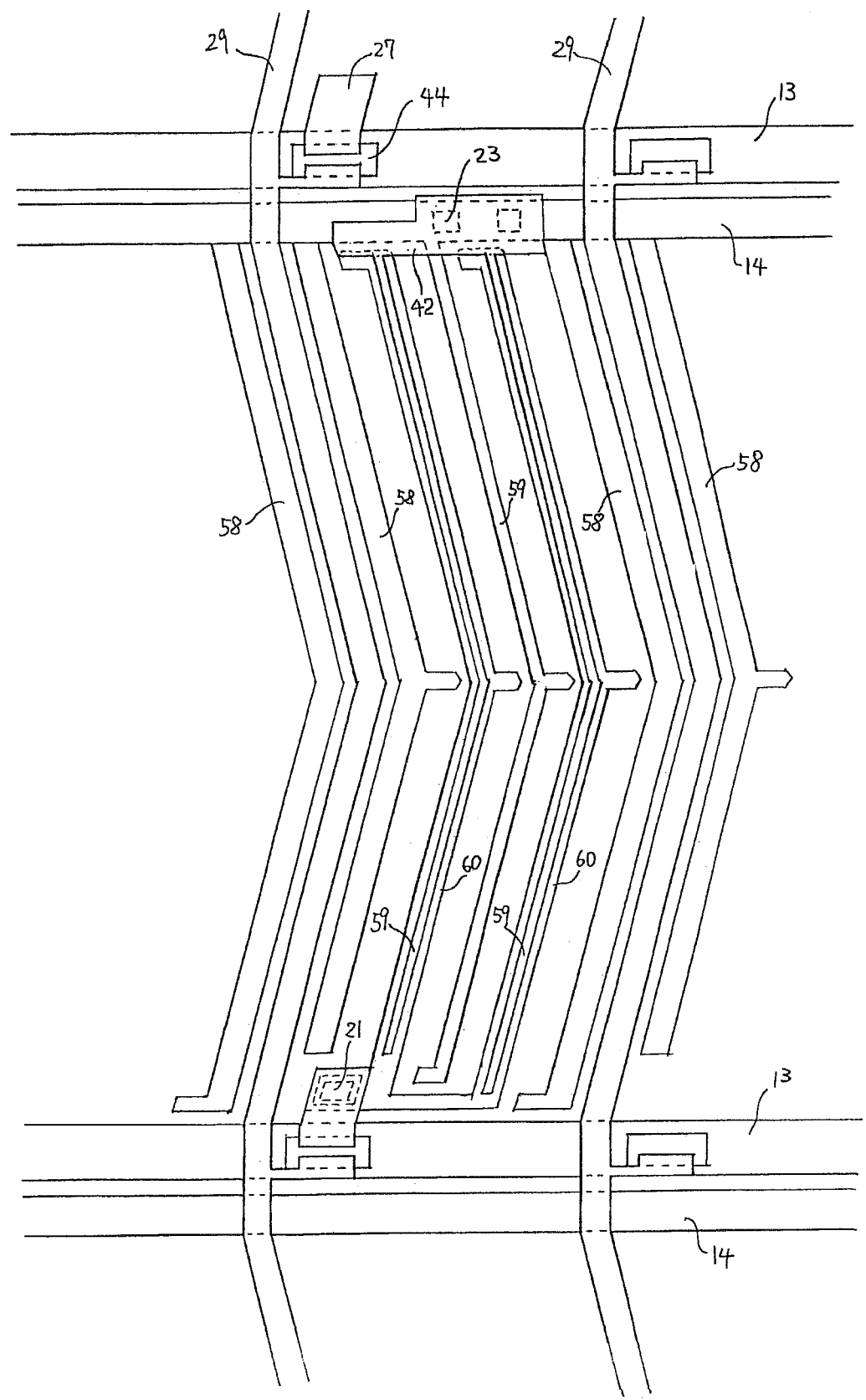
Figure 217:
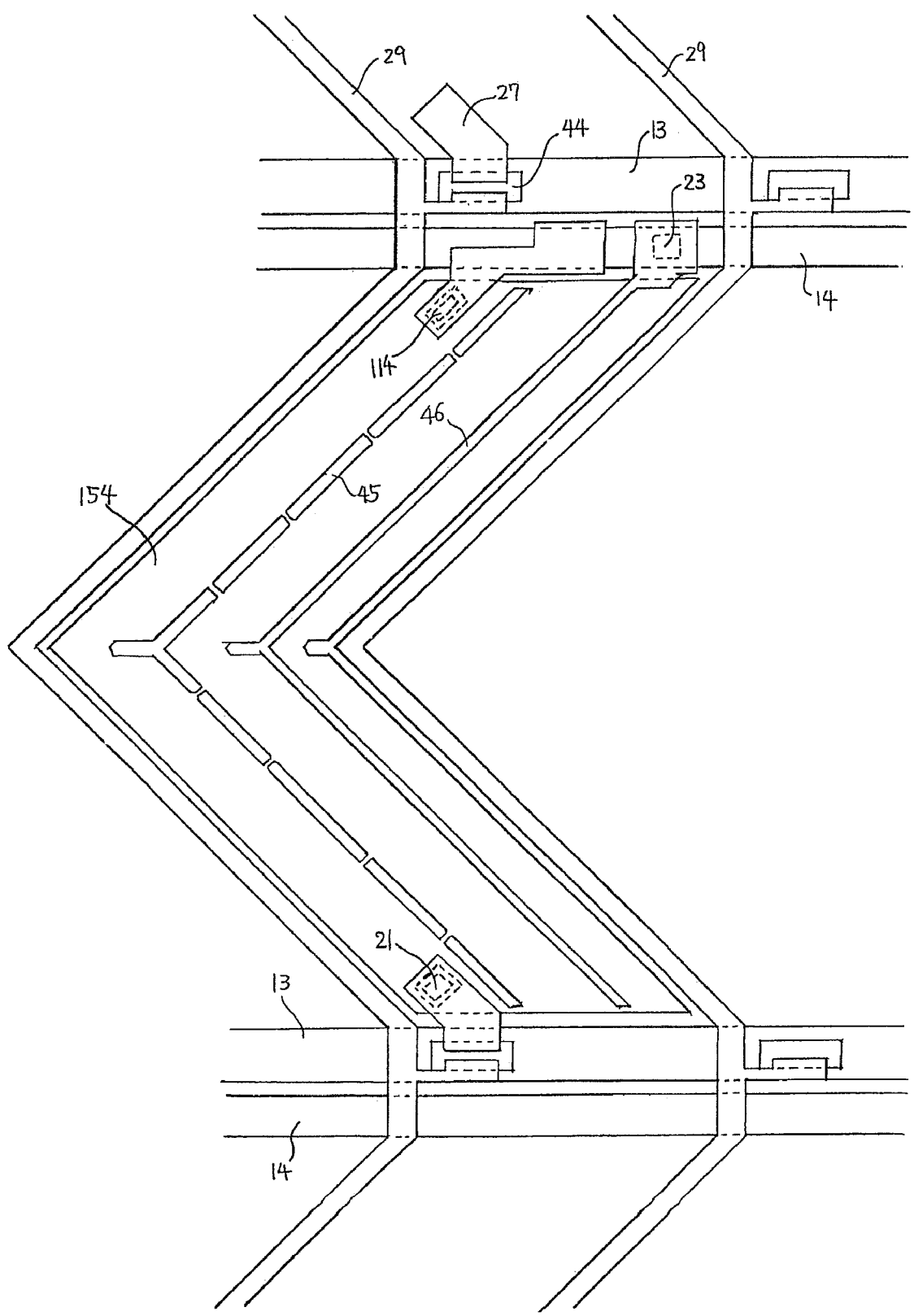
Figure 218:
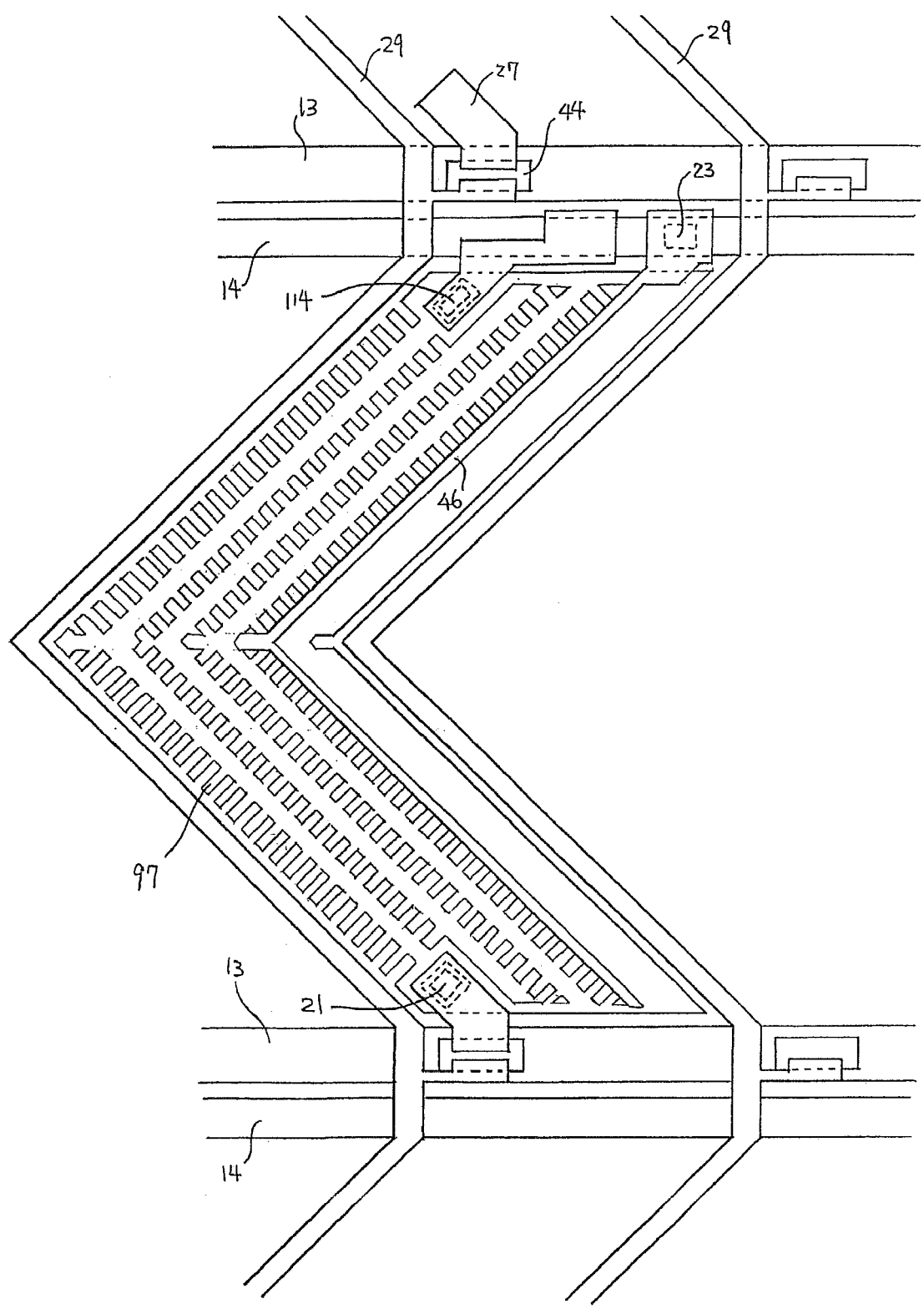
Figure 219:
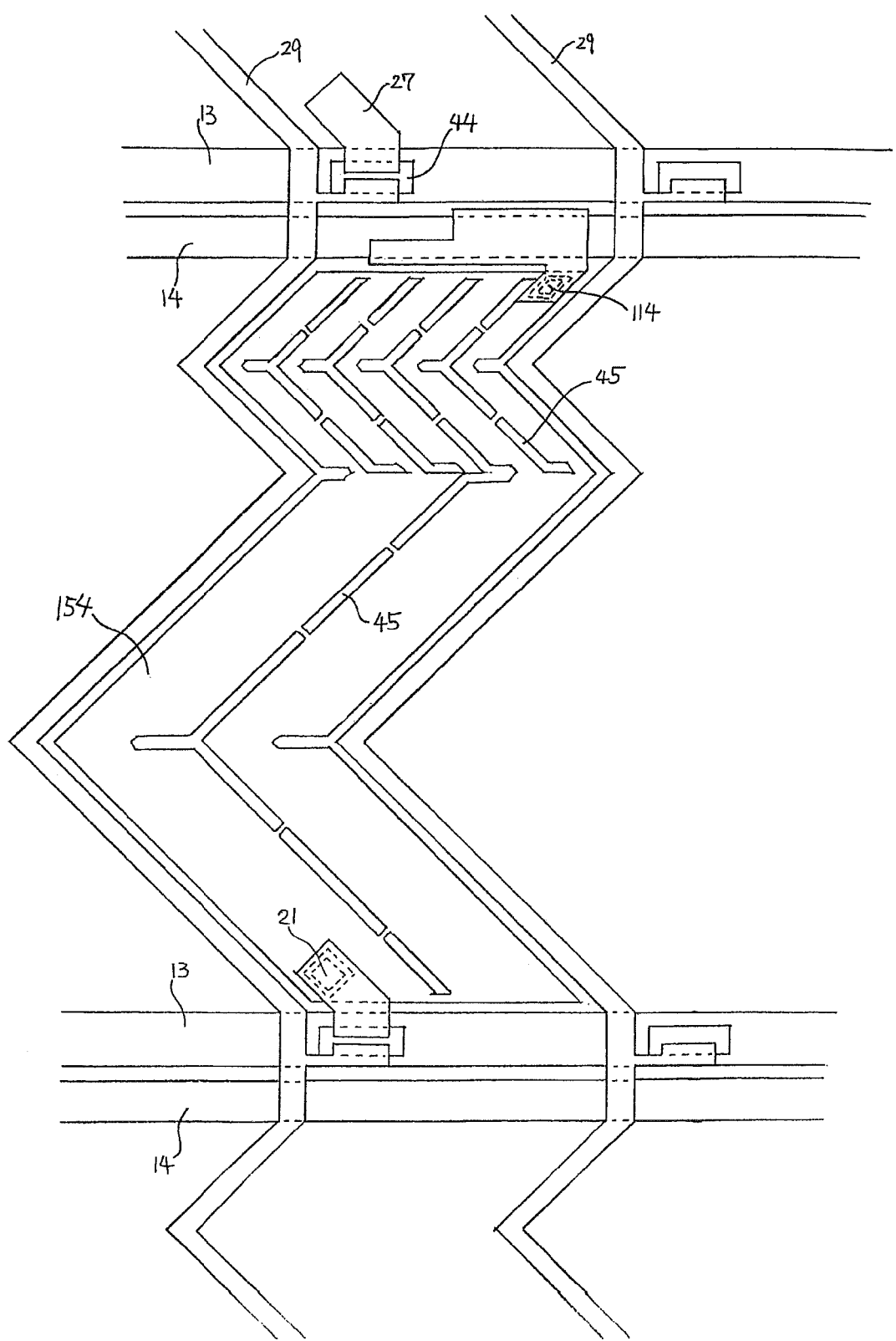
Figure 220:
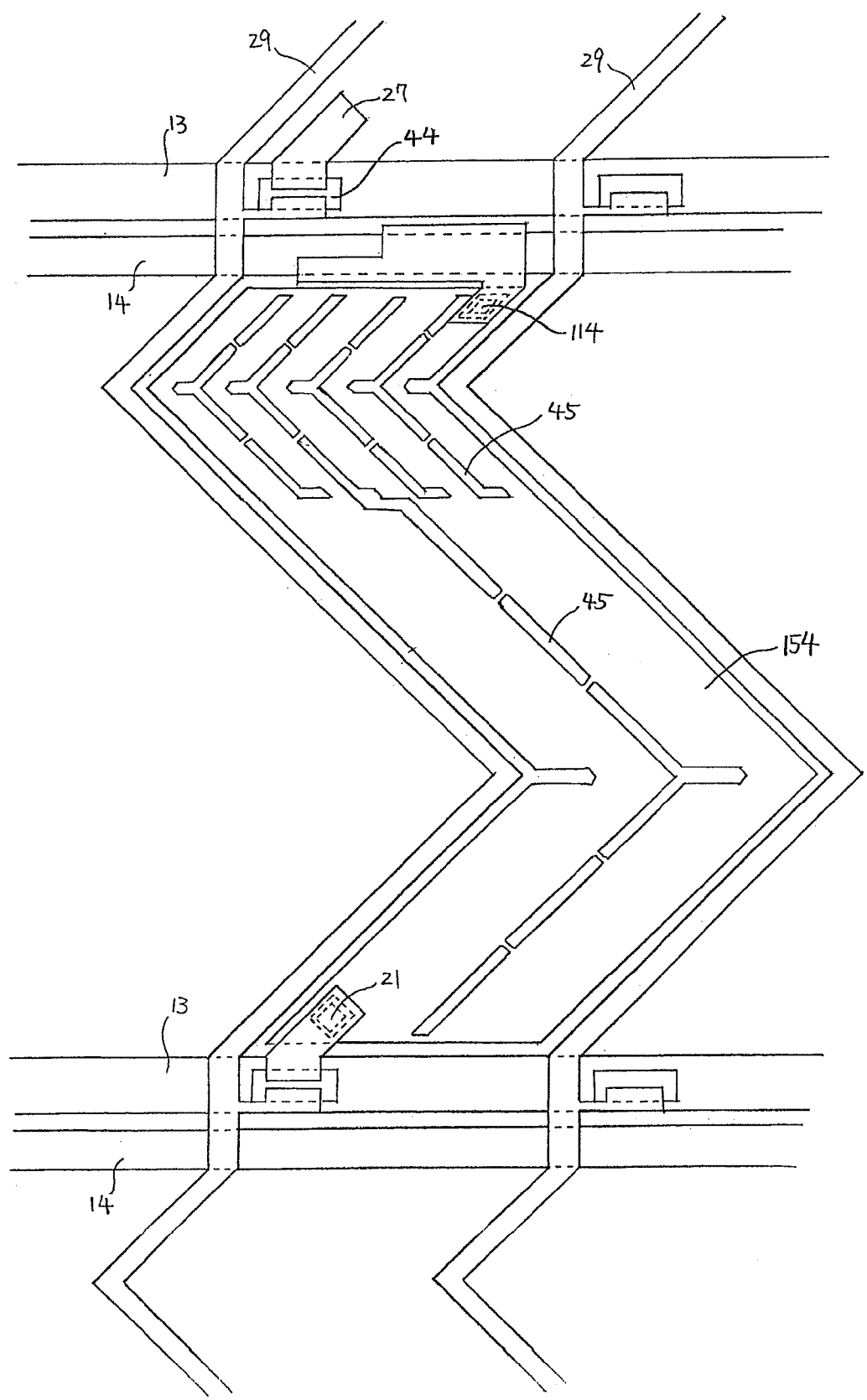
Figure 221:
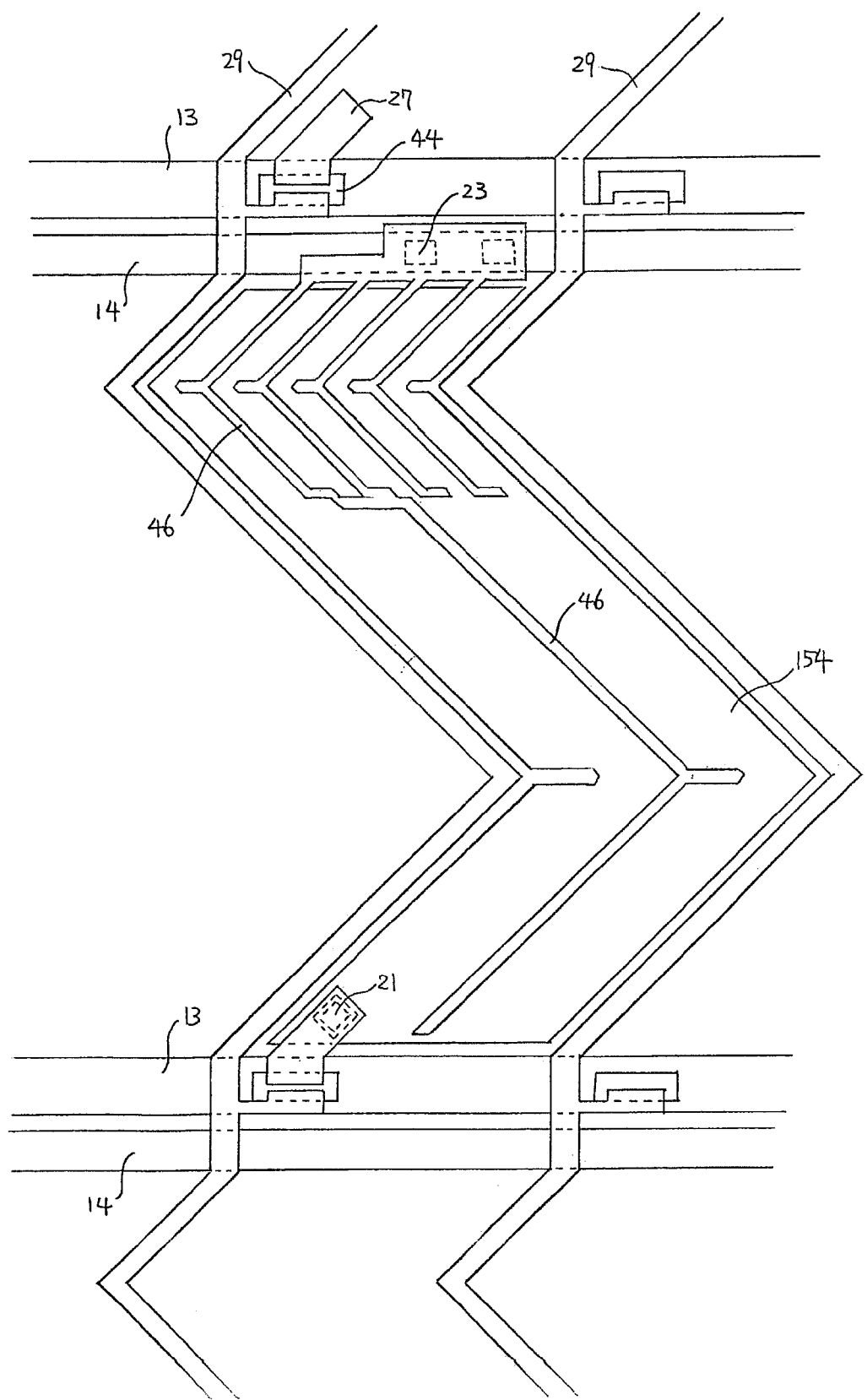
Figure 222:
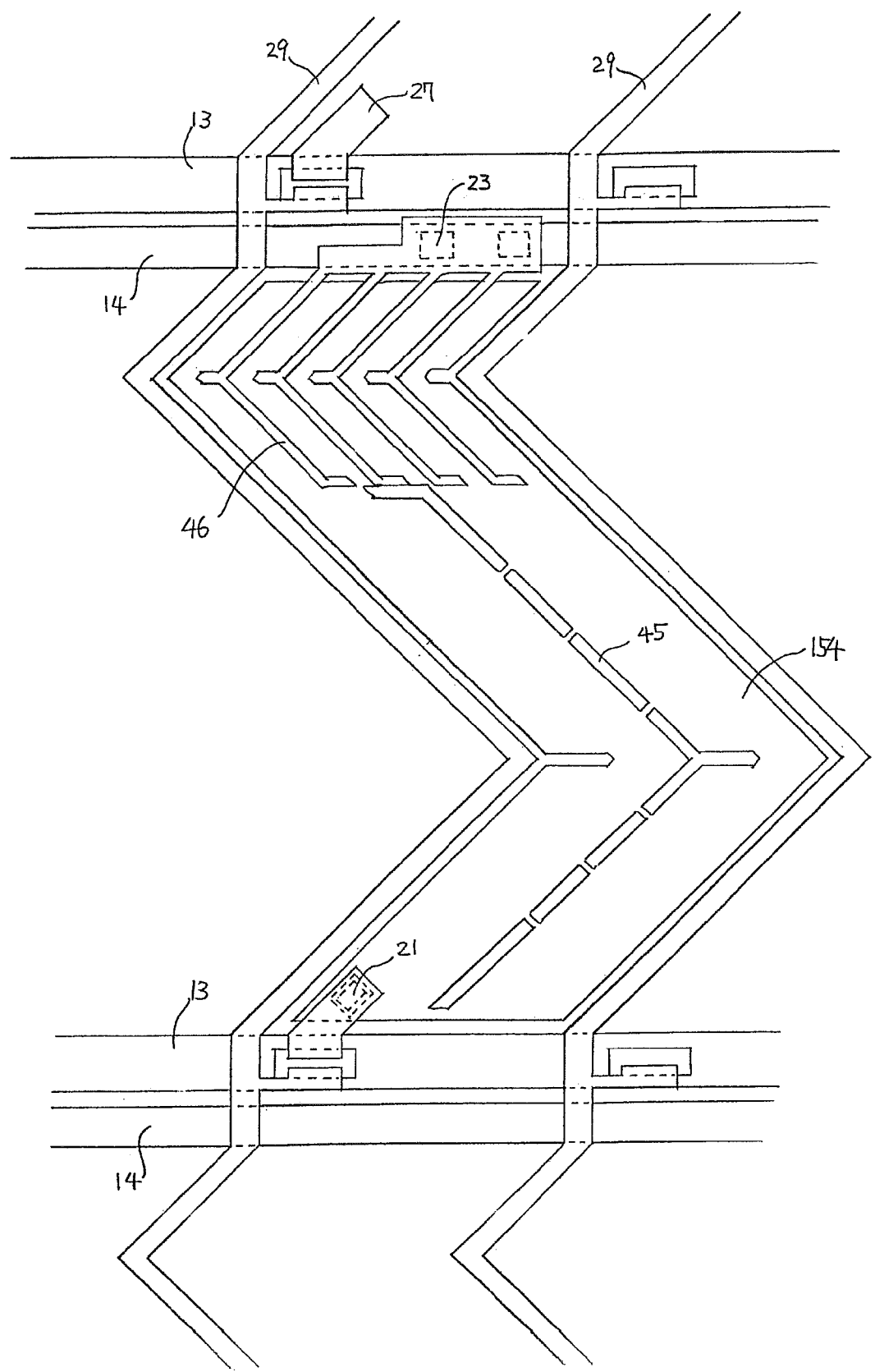
Figure 223:
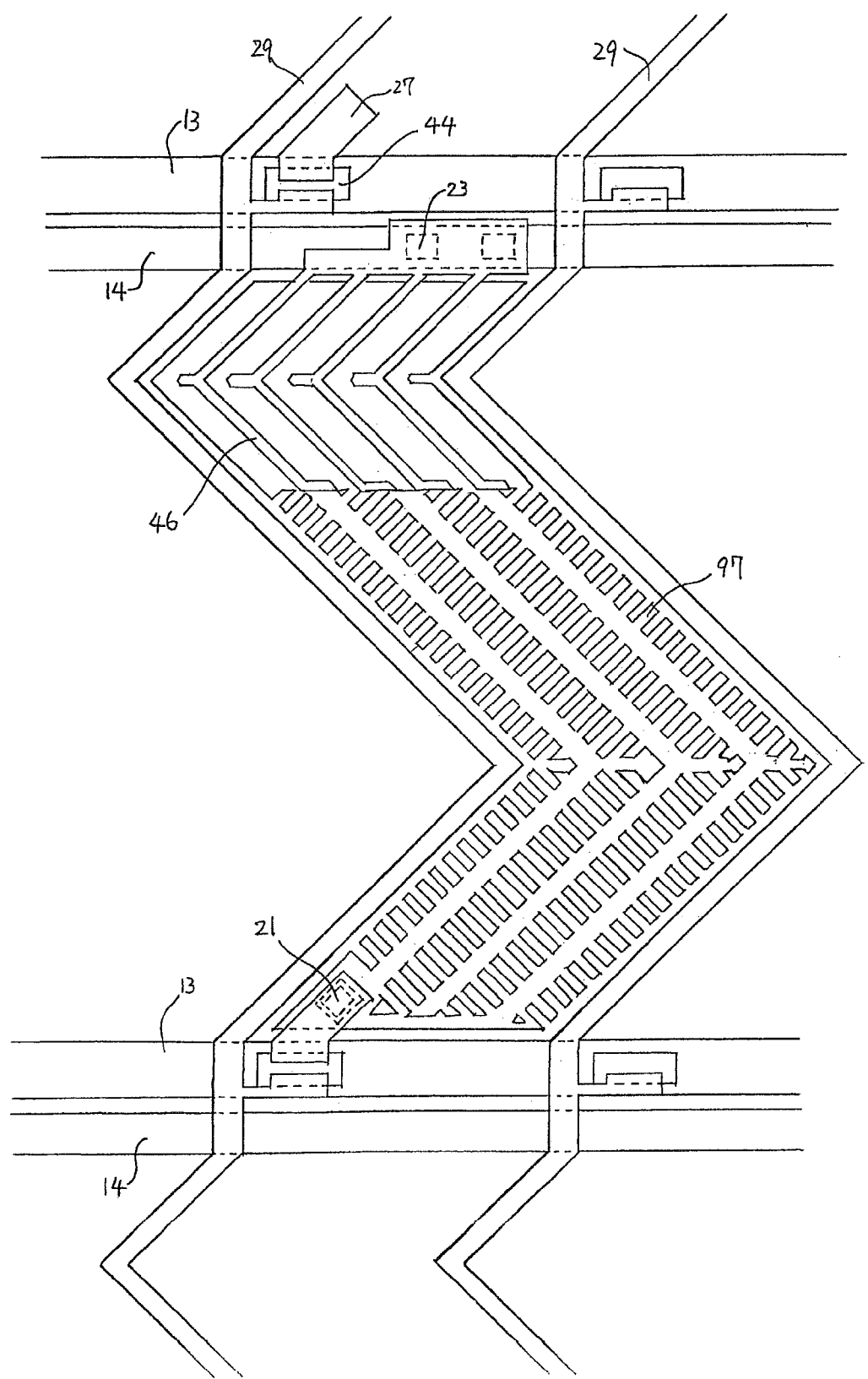
Figure 224:
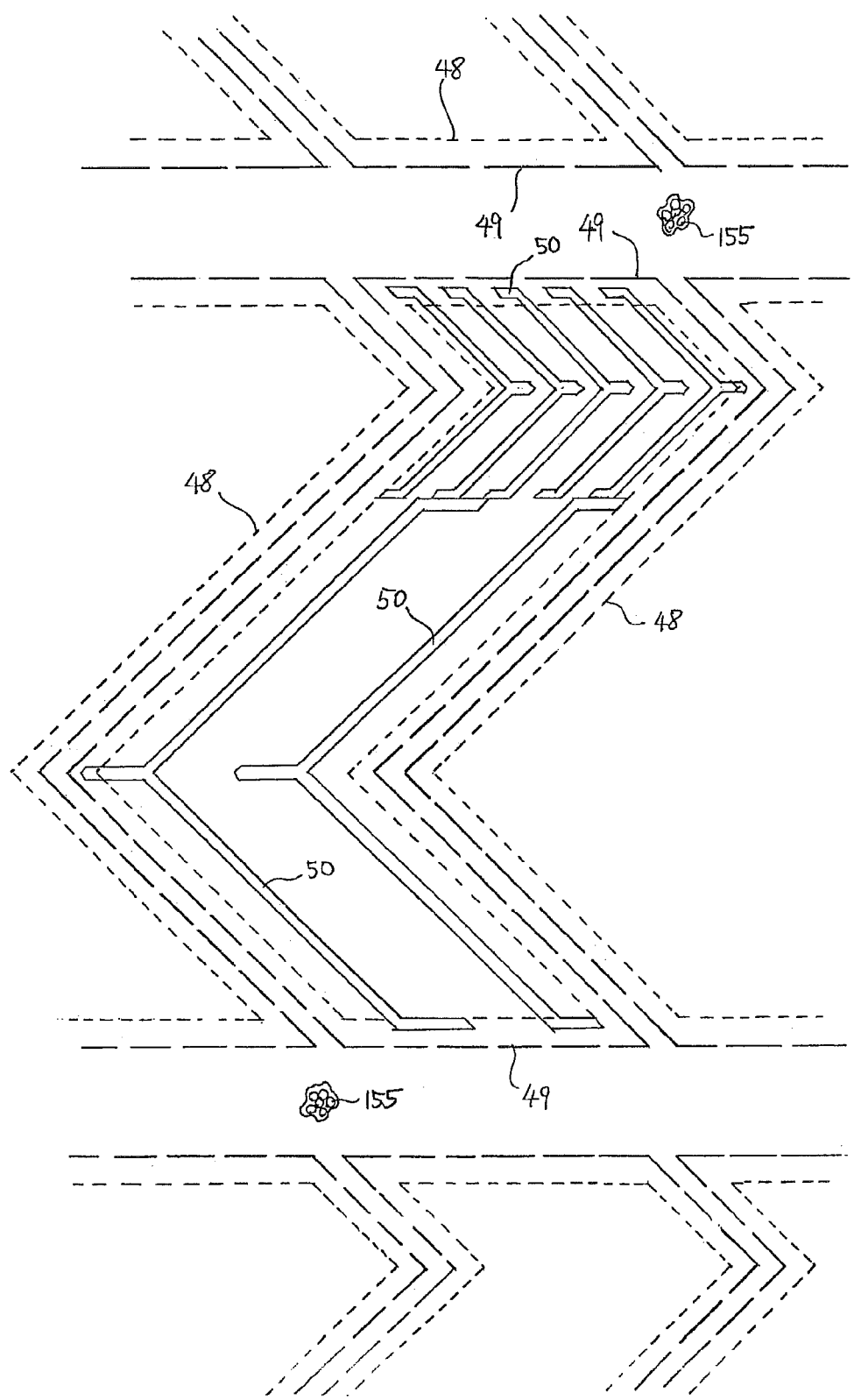
Figure 225:
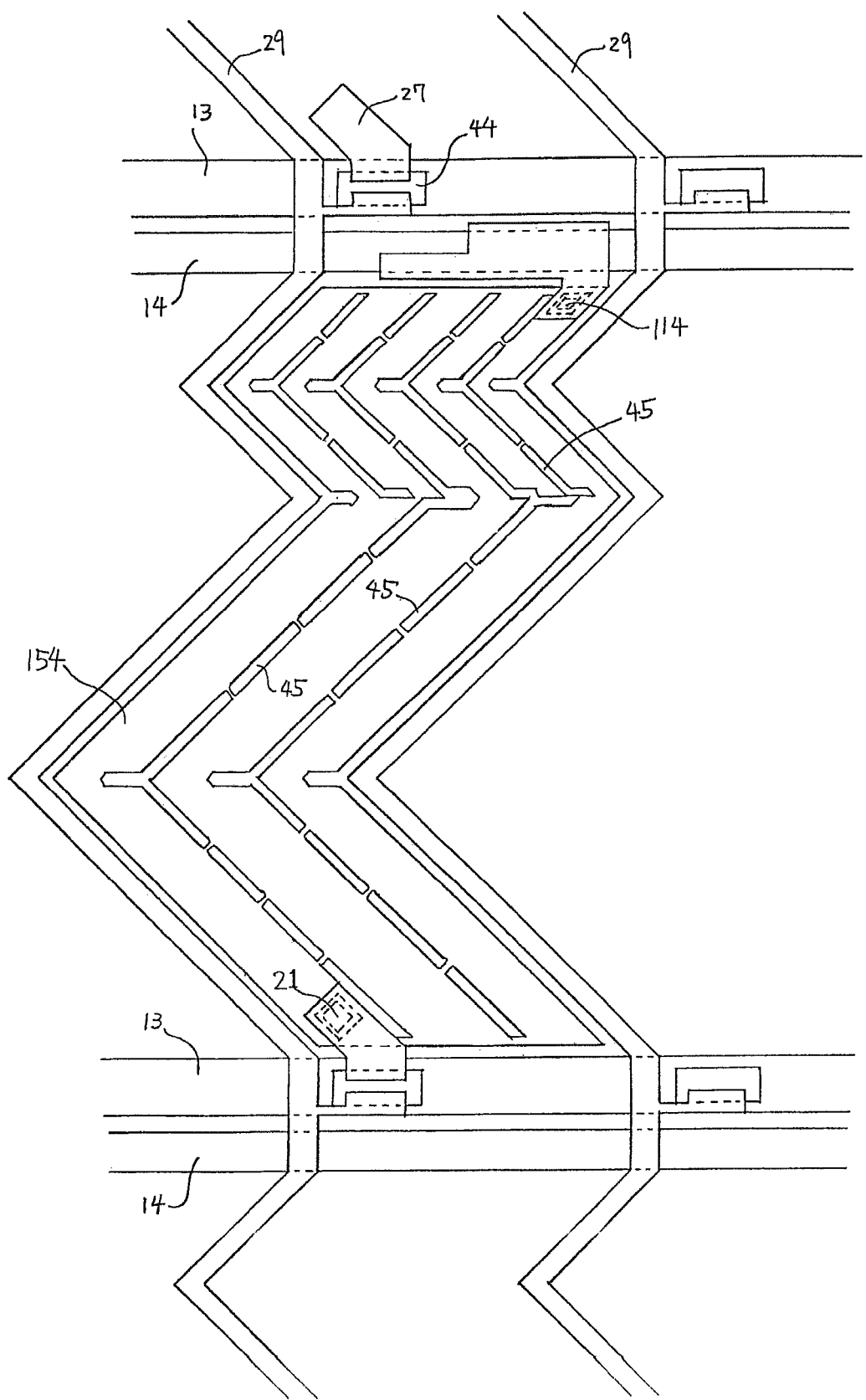
Figure 226:
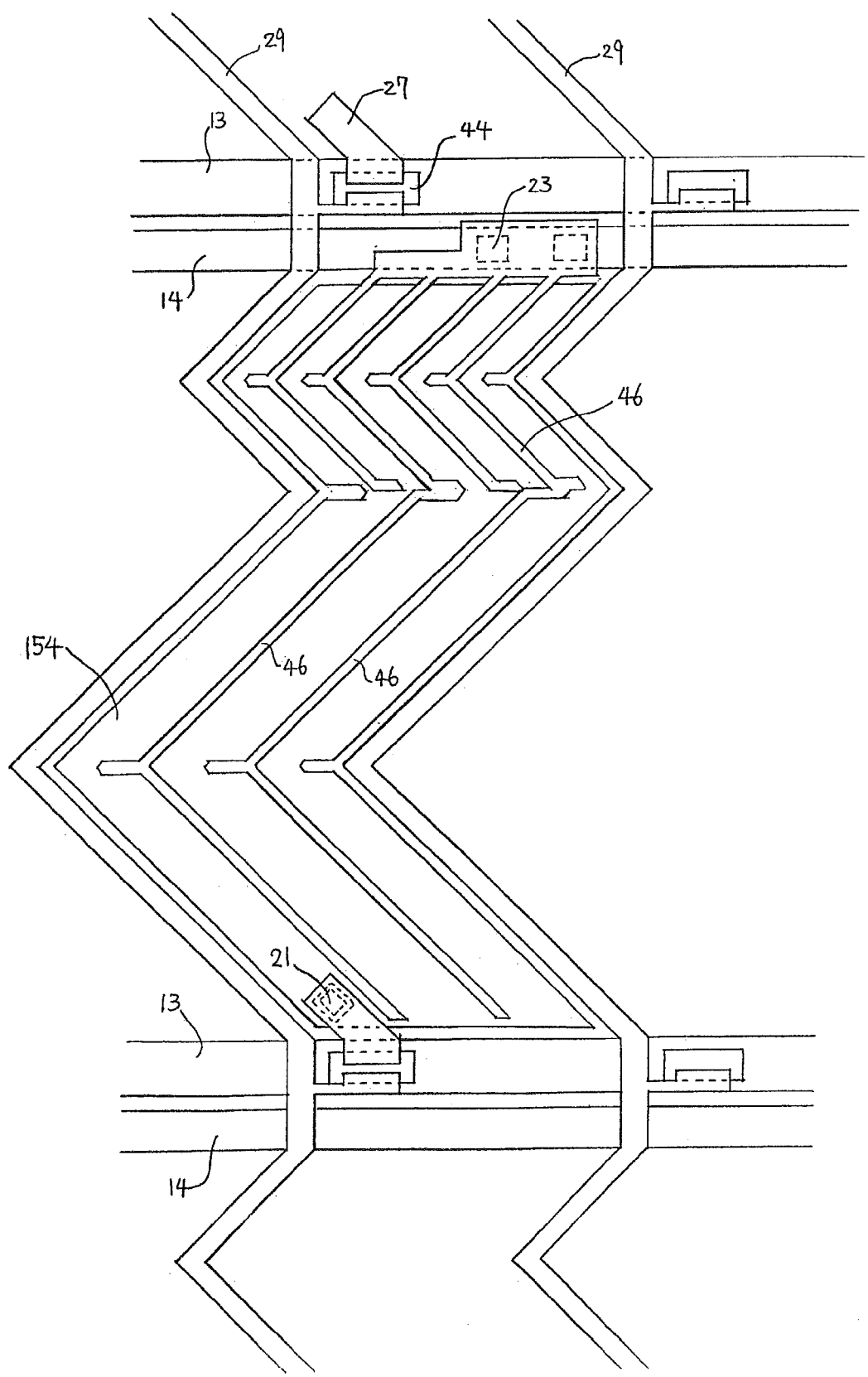
Figure 227:
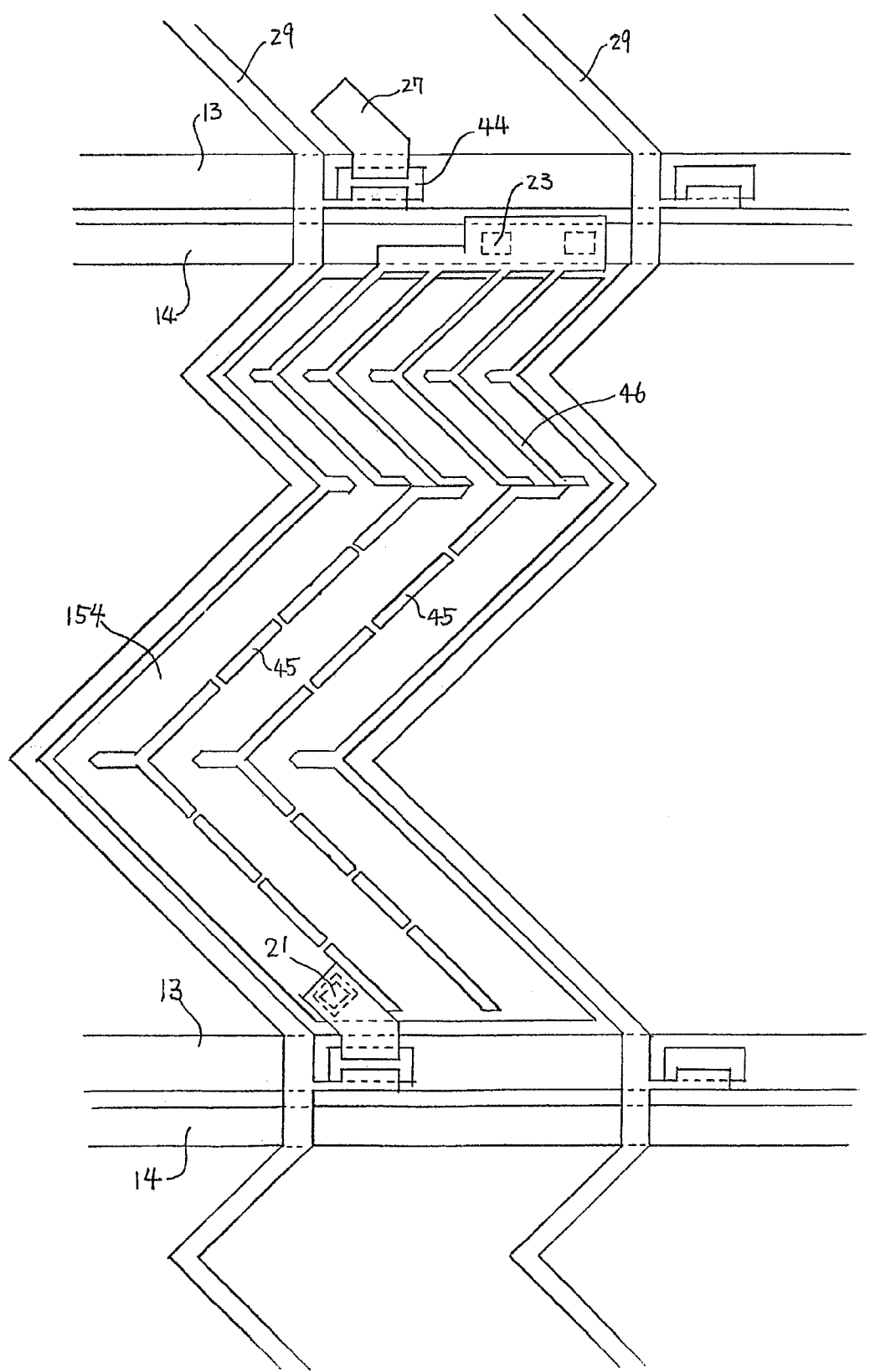
Figure 228:
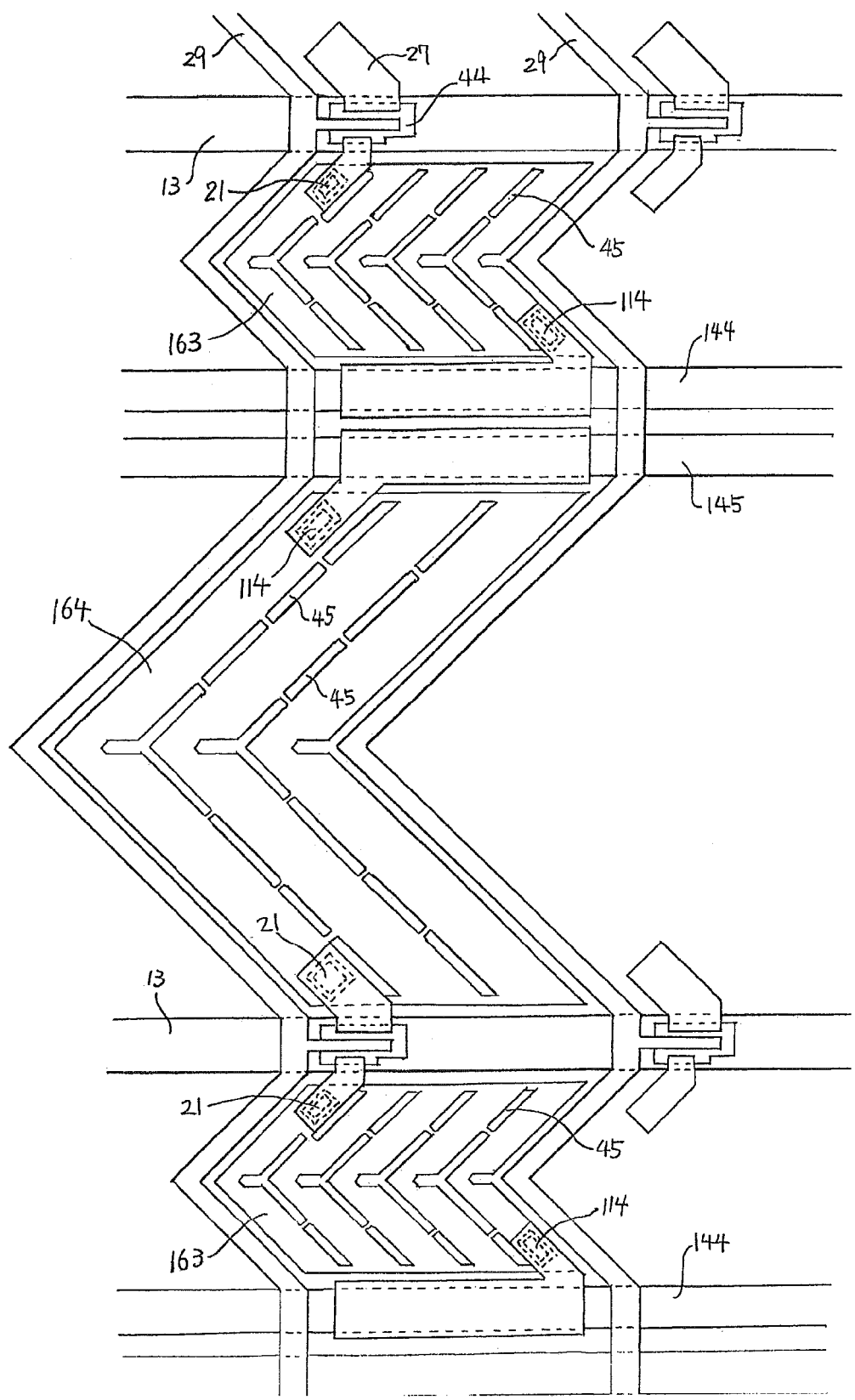
Figure 229:
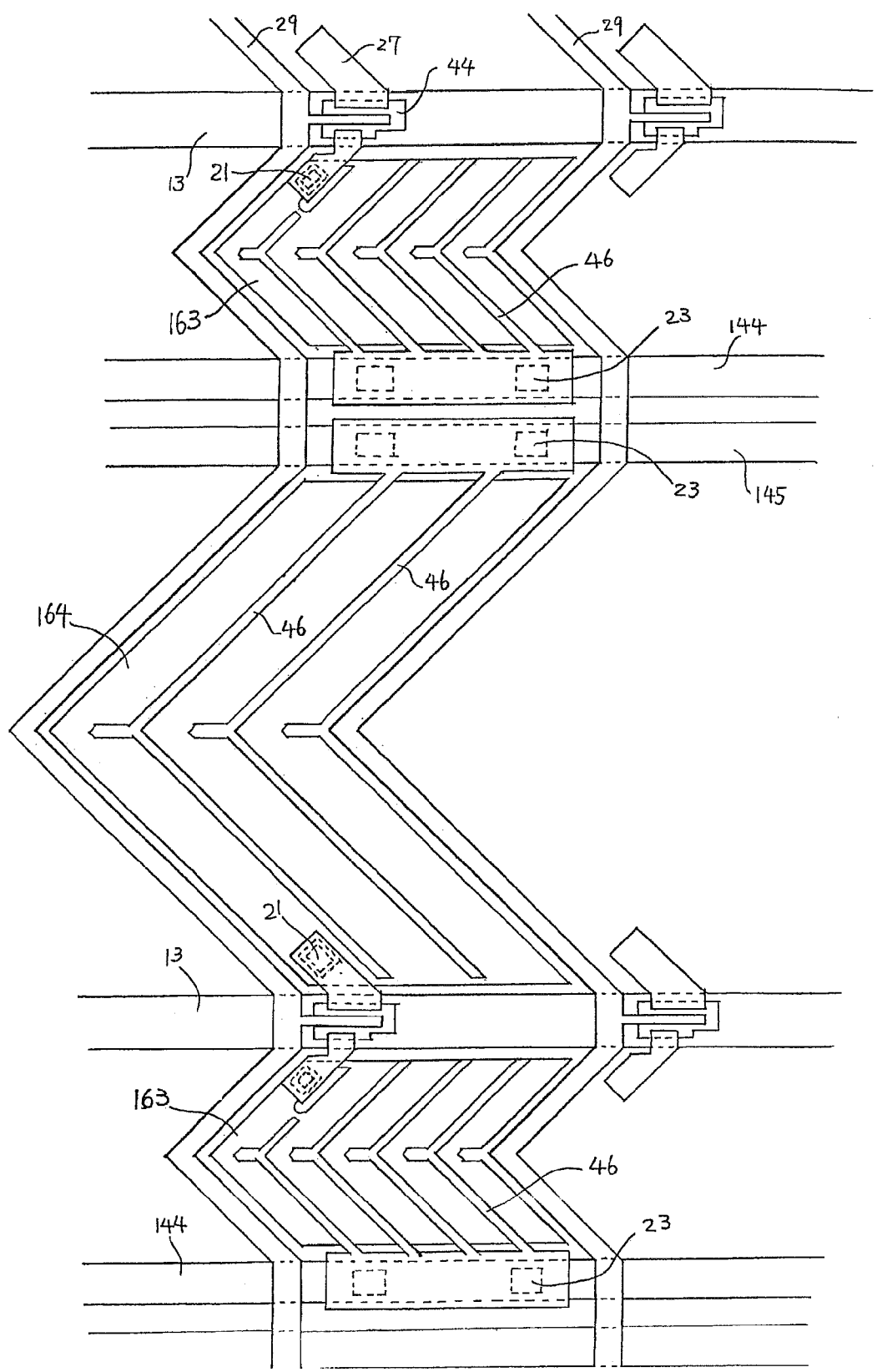
Figure 230:
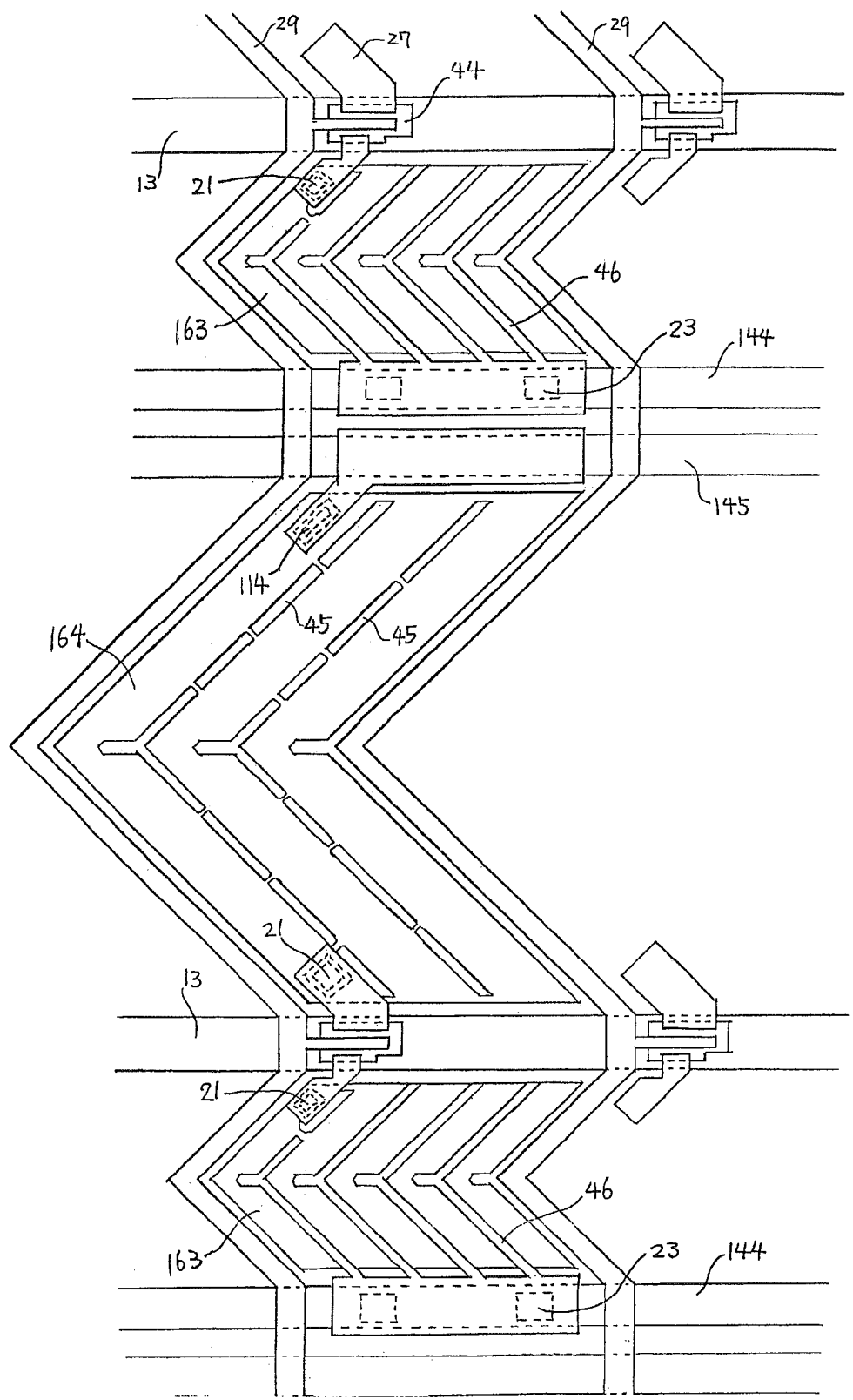
Figure 231:
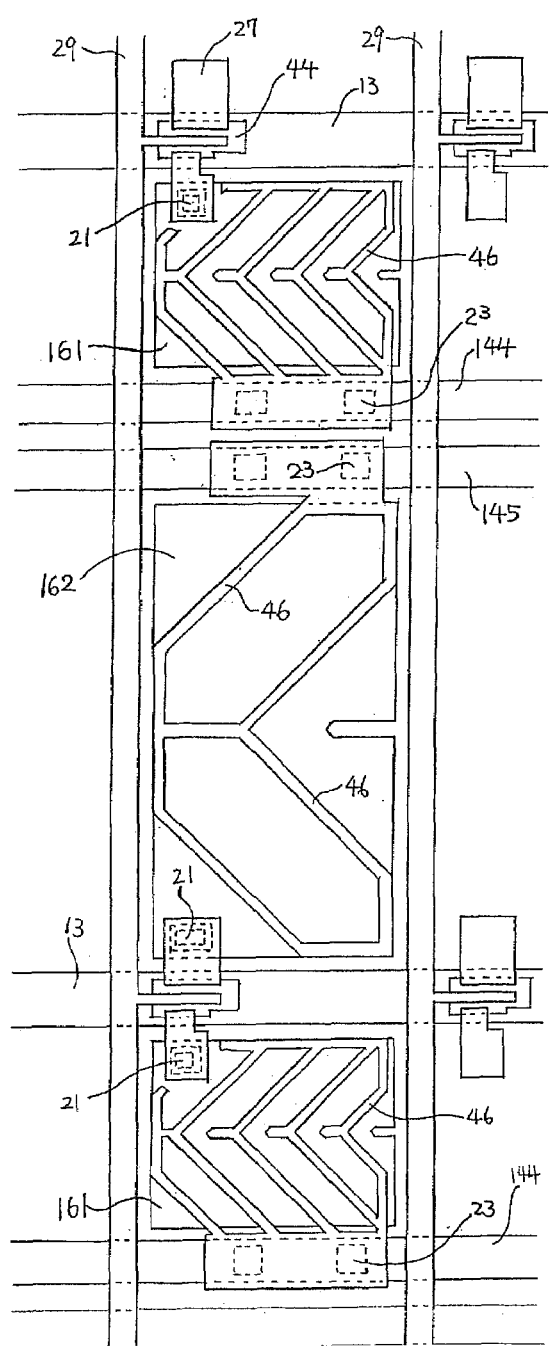
Figure 232:
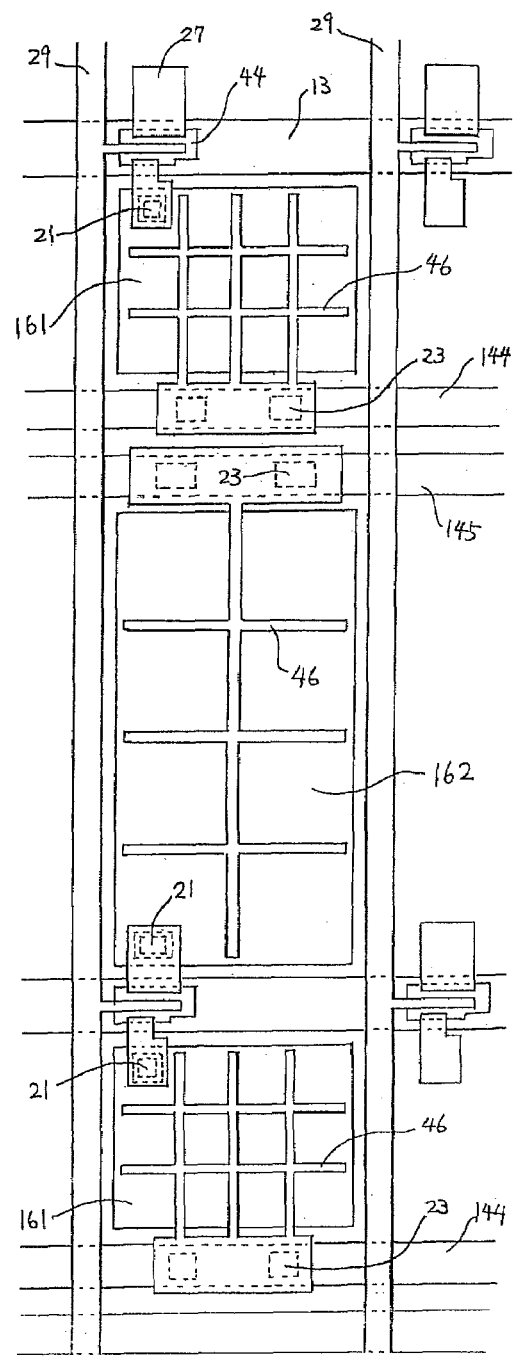
Figure 233:
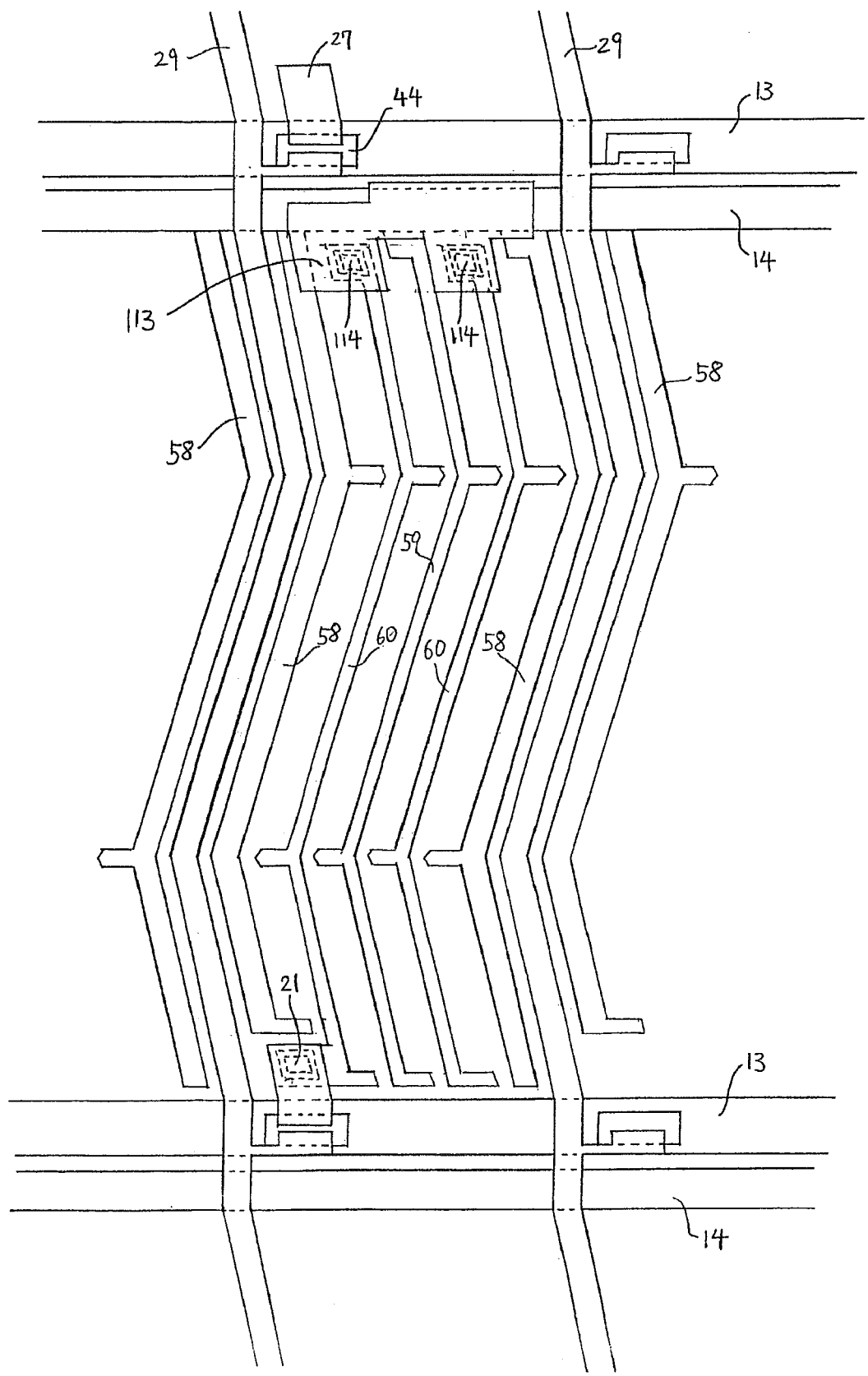
Figure 234:
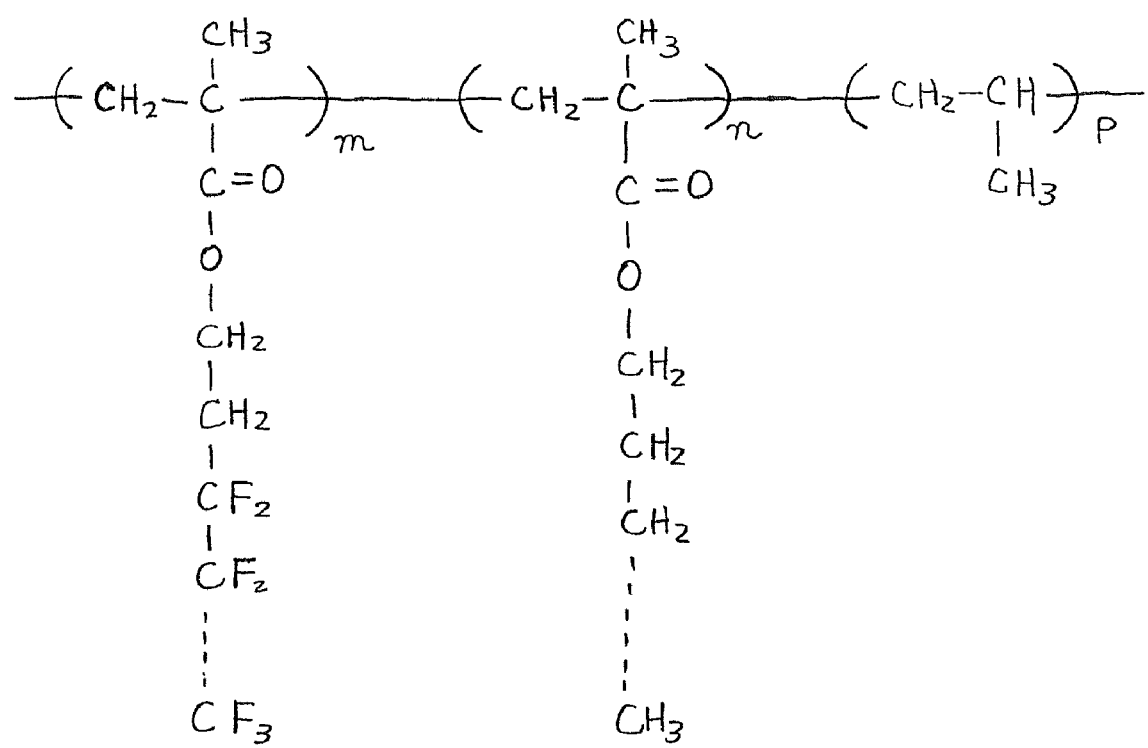
Figures 235, 236:
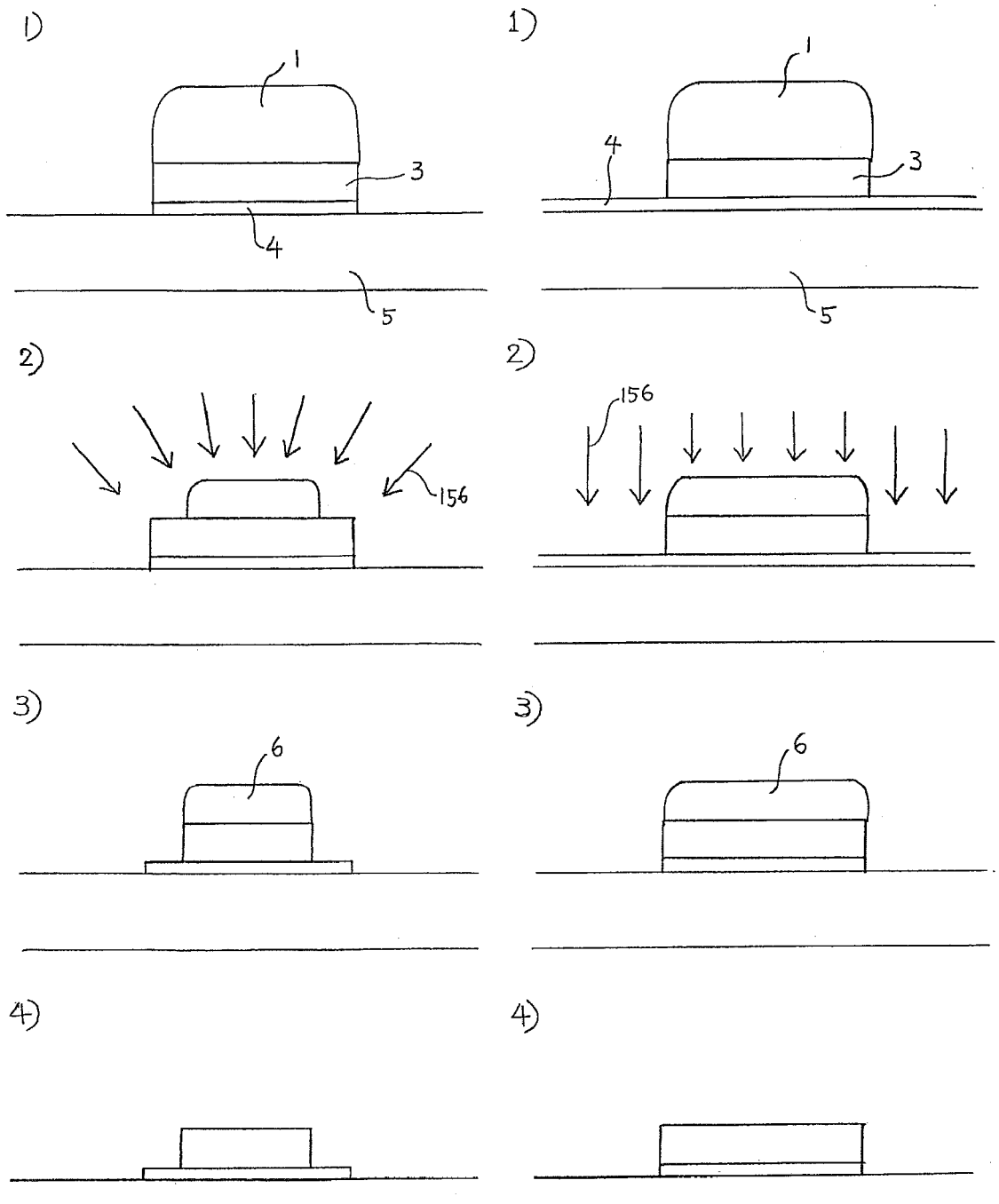
Figures 237, 238:
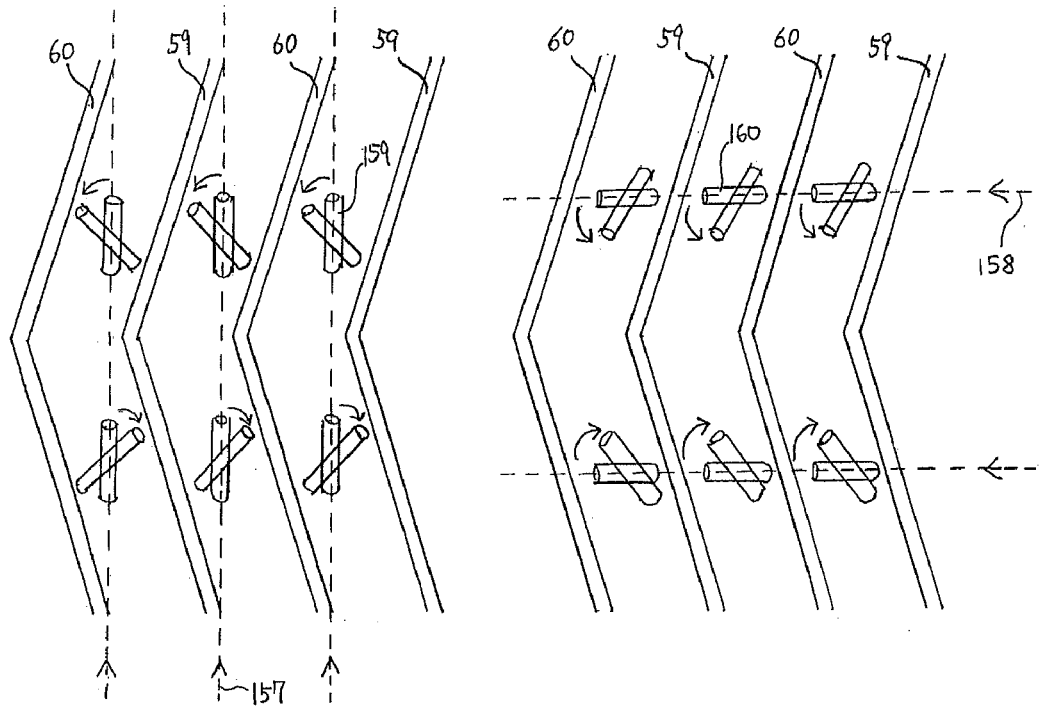
Figure 239:
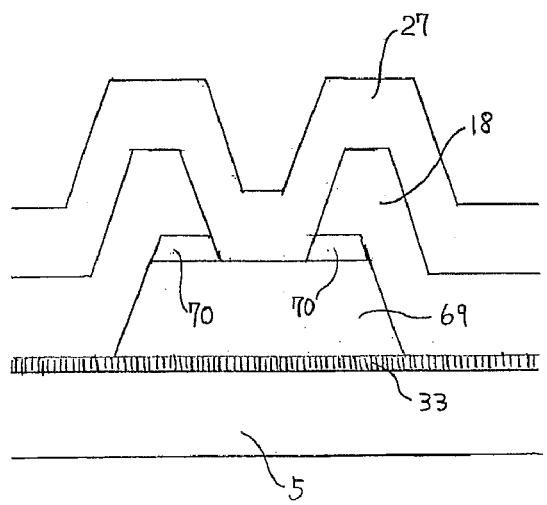
Figure 240:
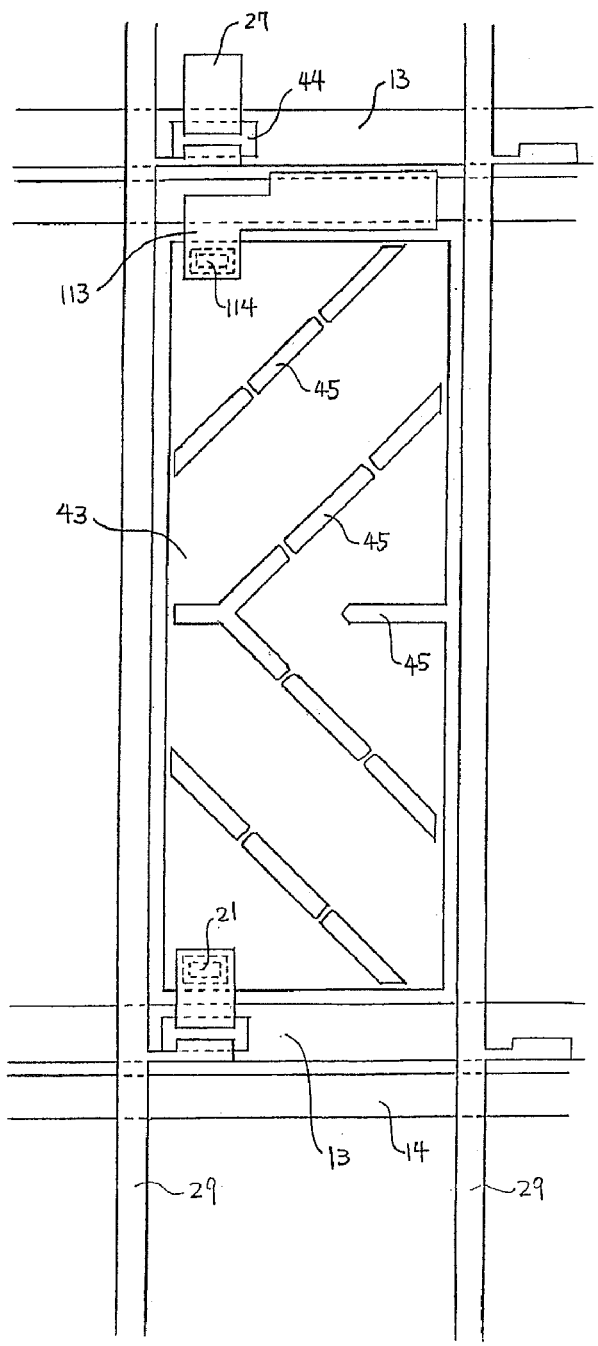
Figure 241:
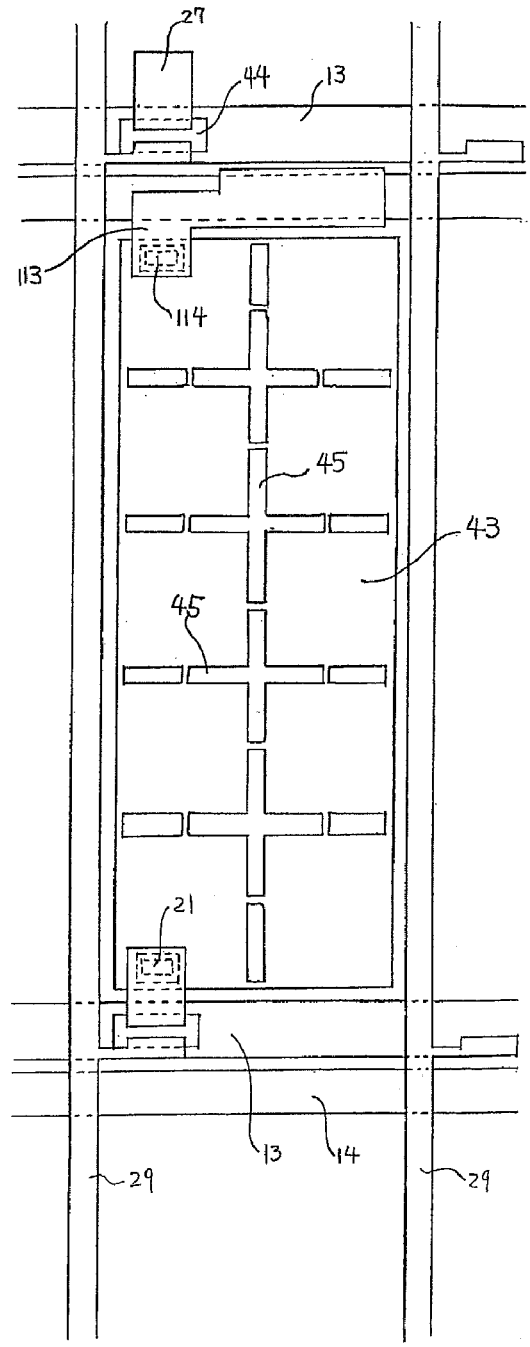
Figure 242:
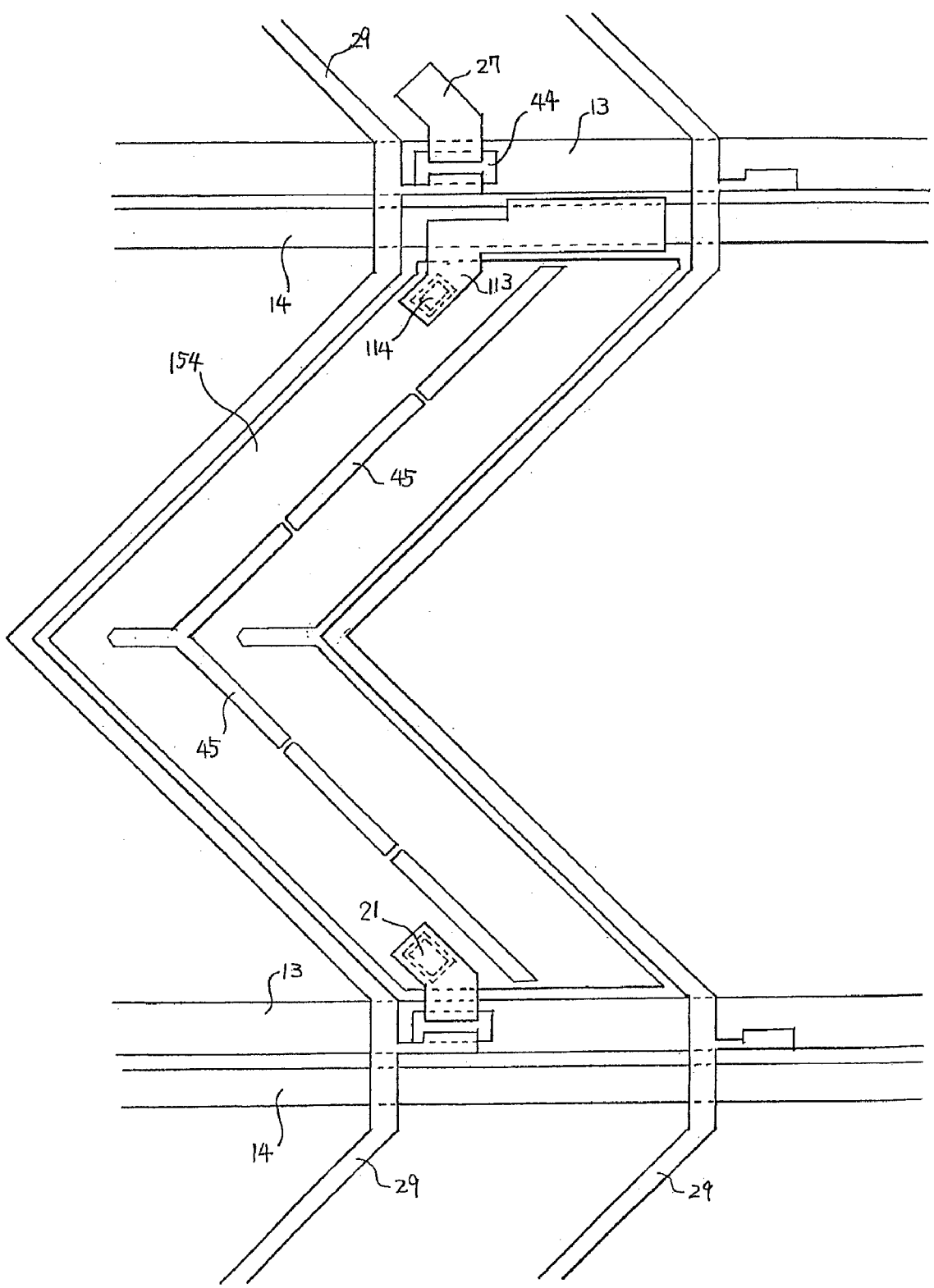
Figure 243:
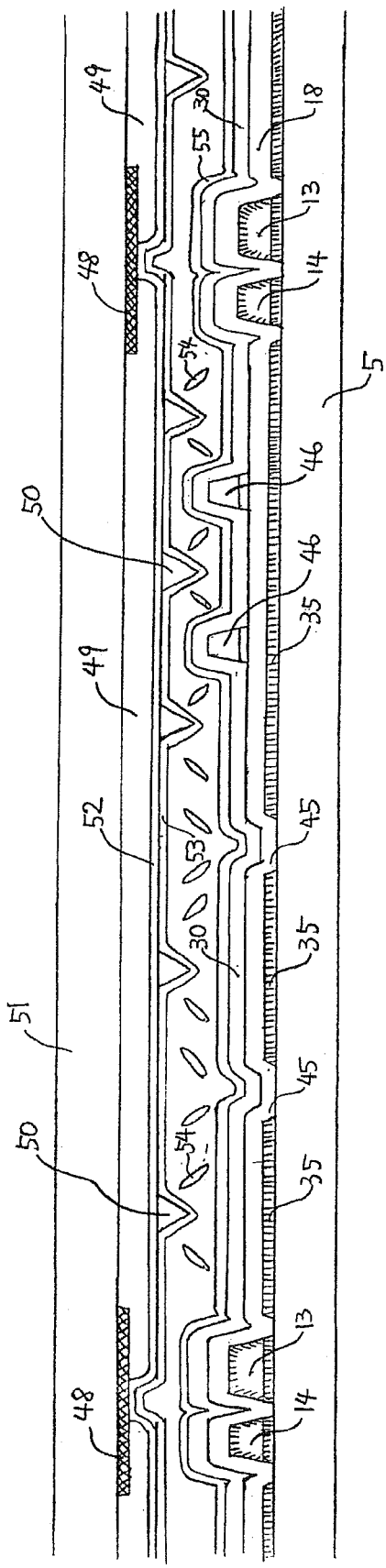
Figure 244:
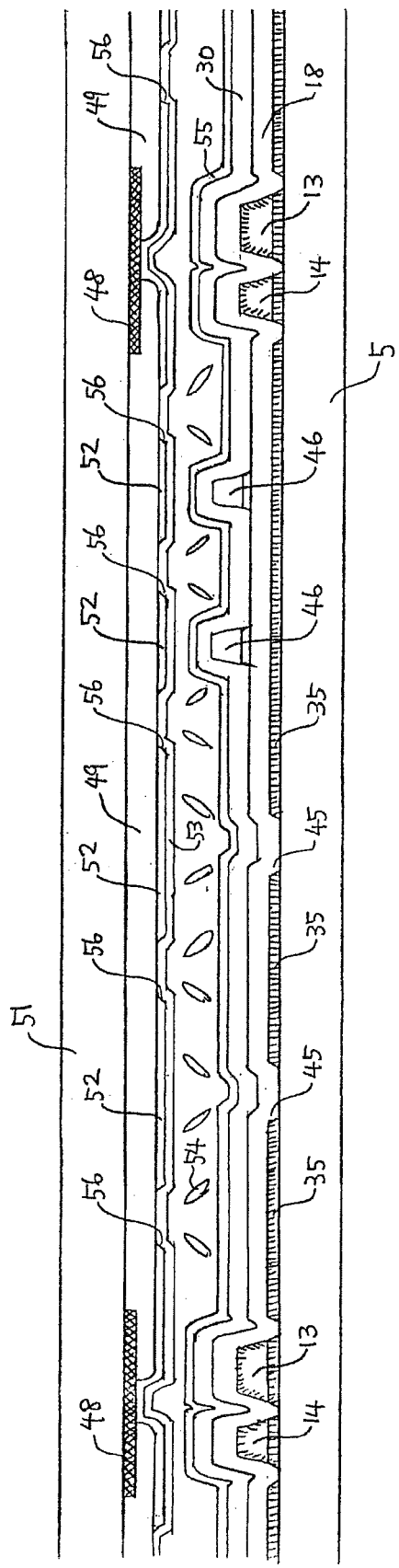
Figure 245:
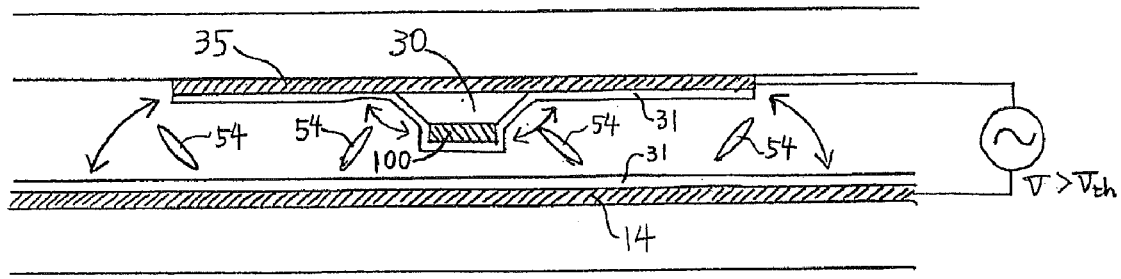
Figure 246:
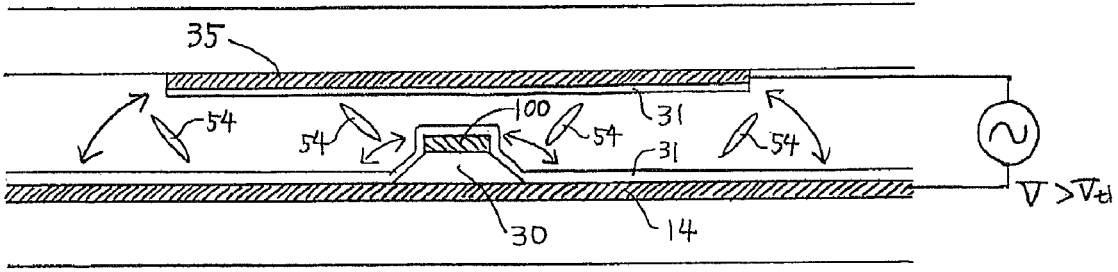
Figure 247:
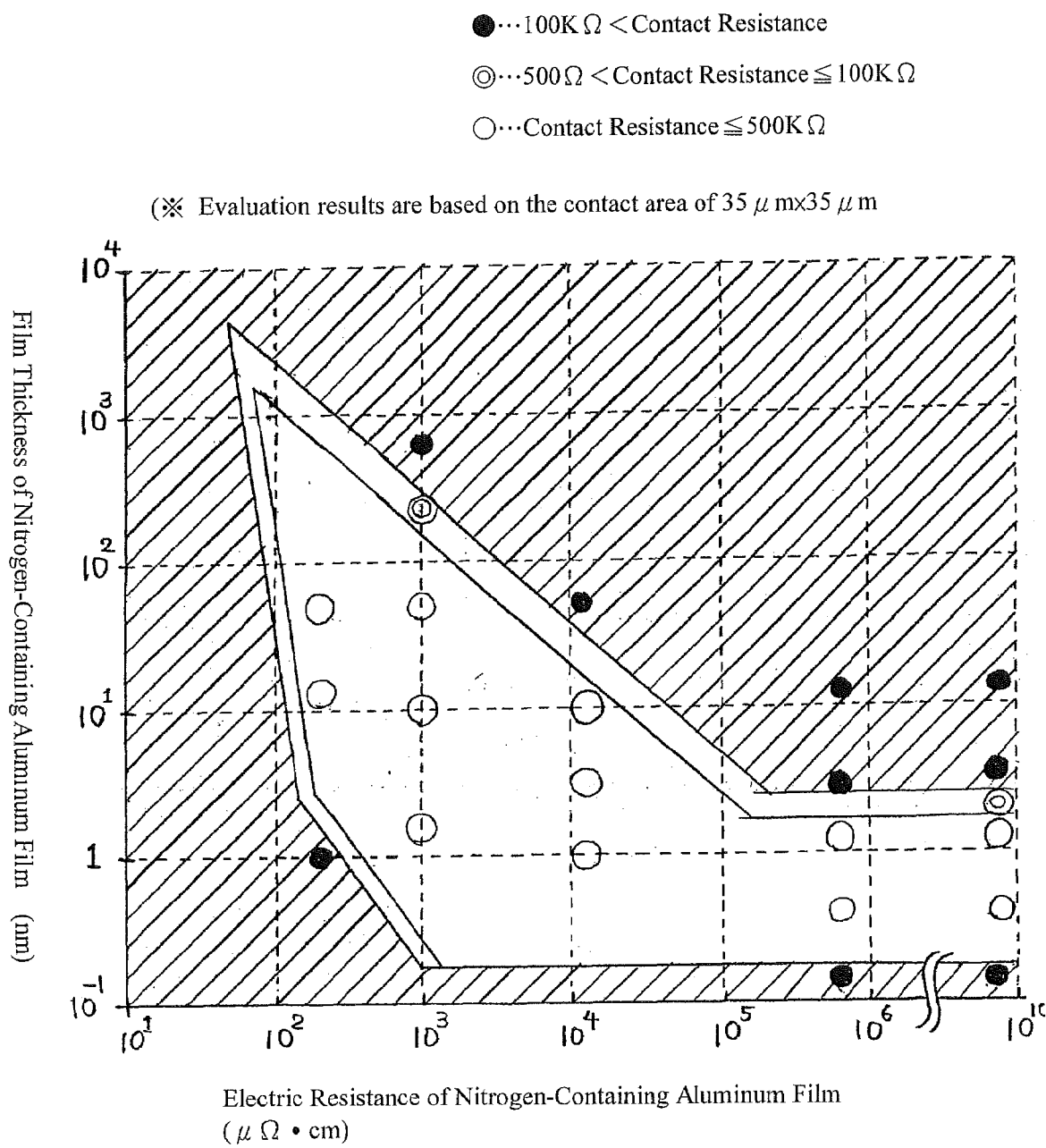
Figure 248:
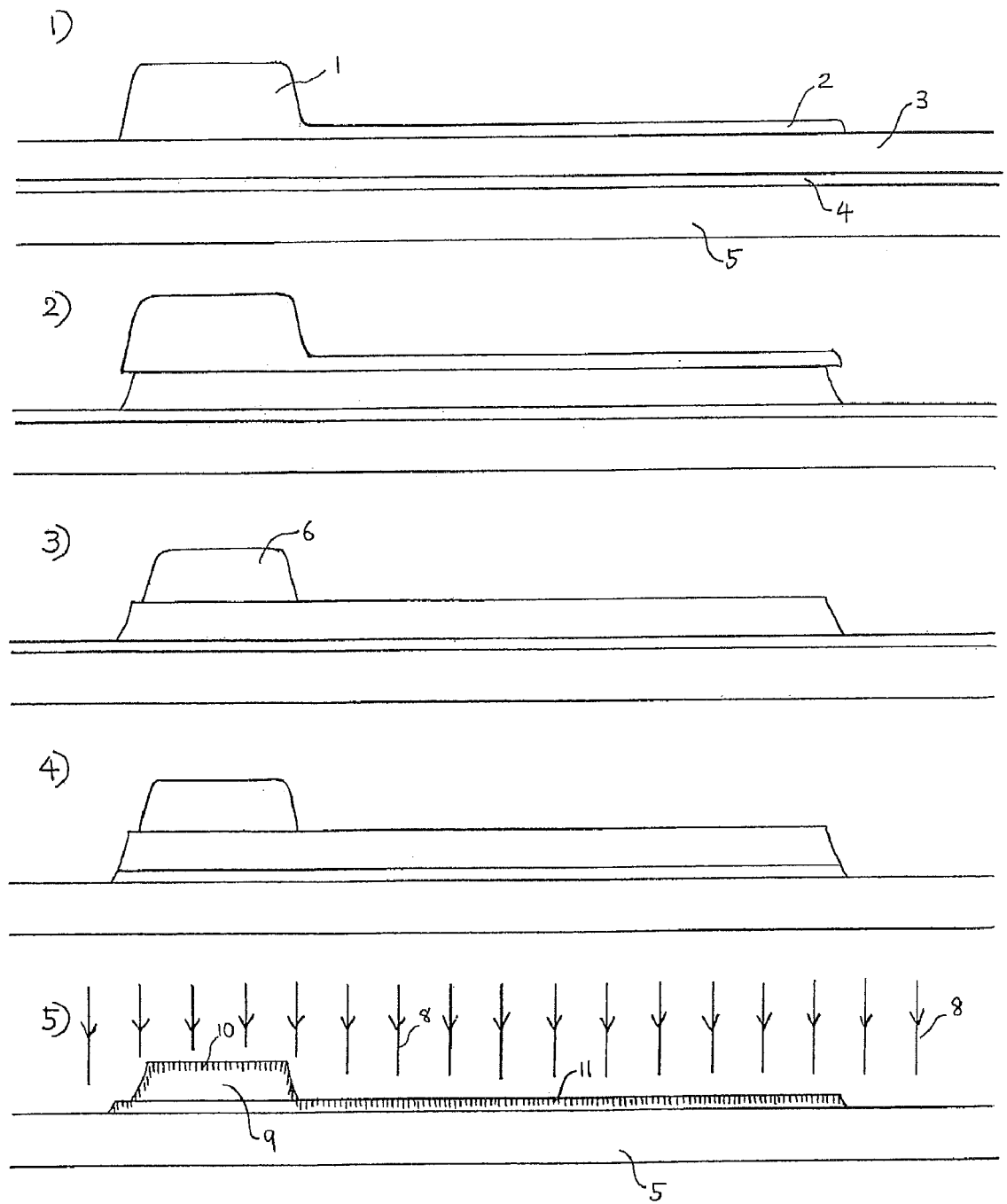
Figures 249, 250:
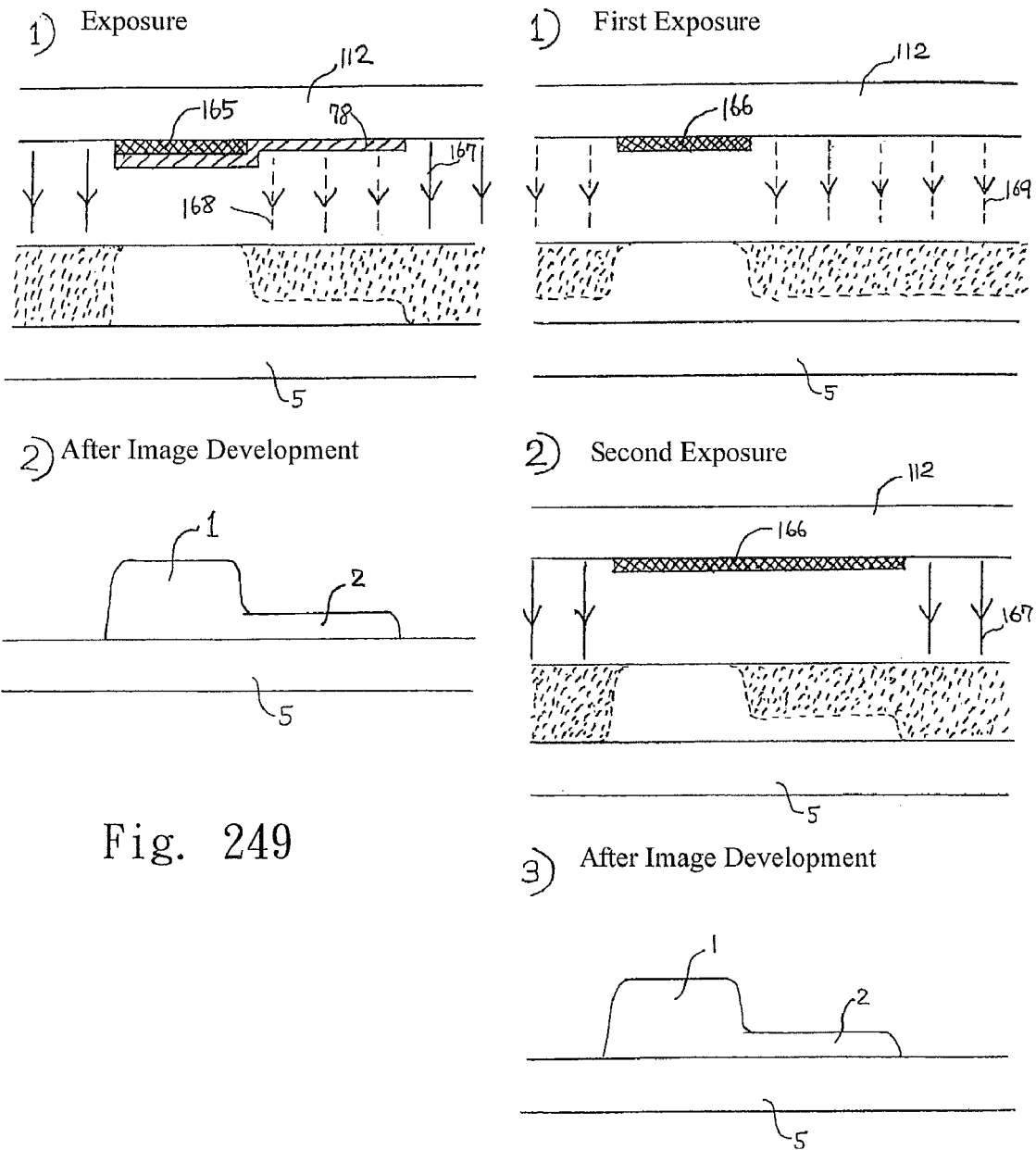
Figure 254:
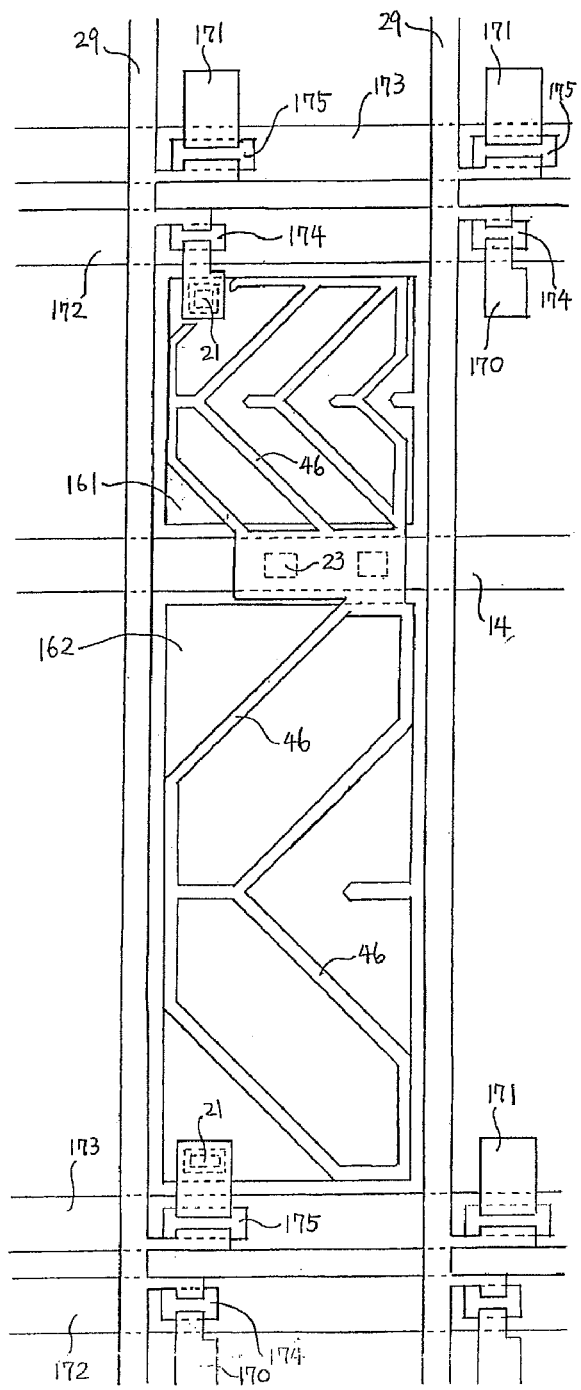
Figure 255:
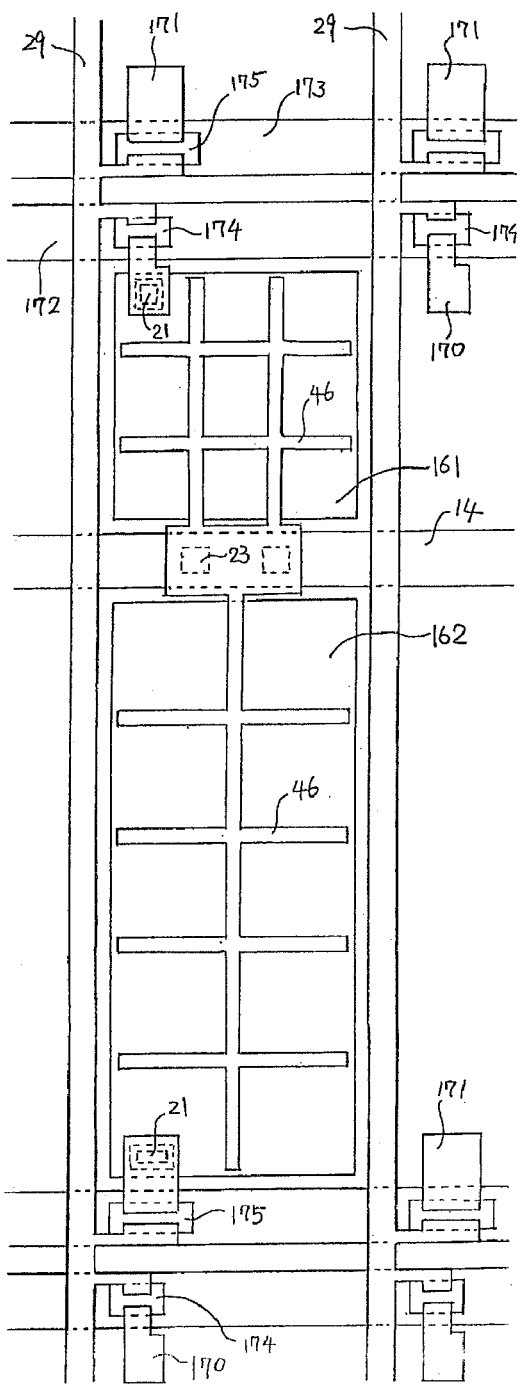
Figure 256:
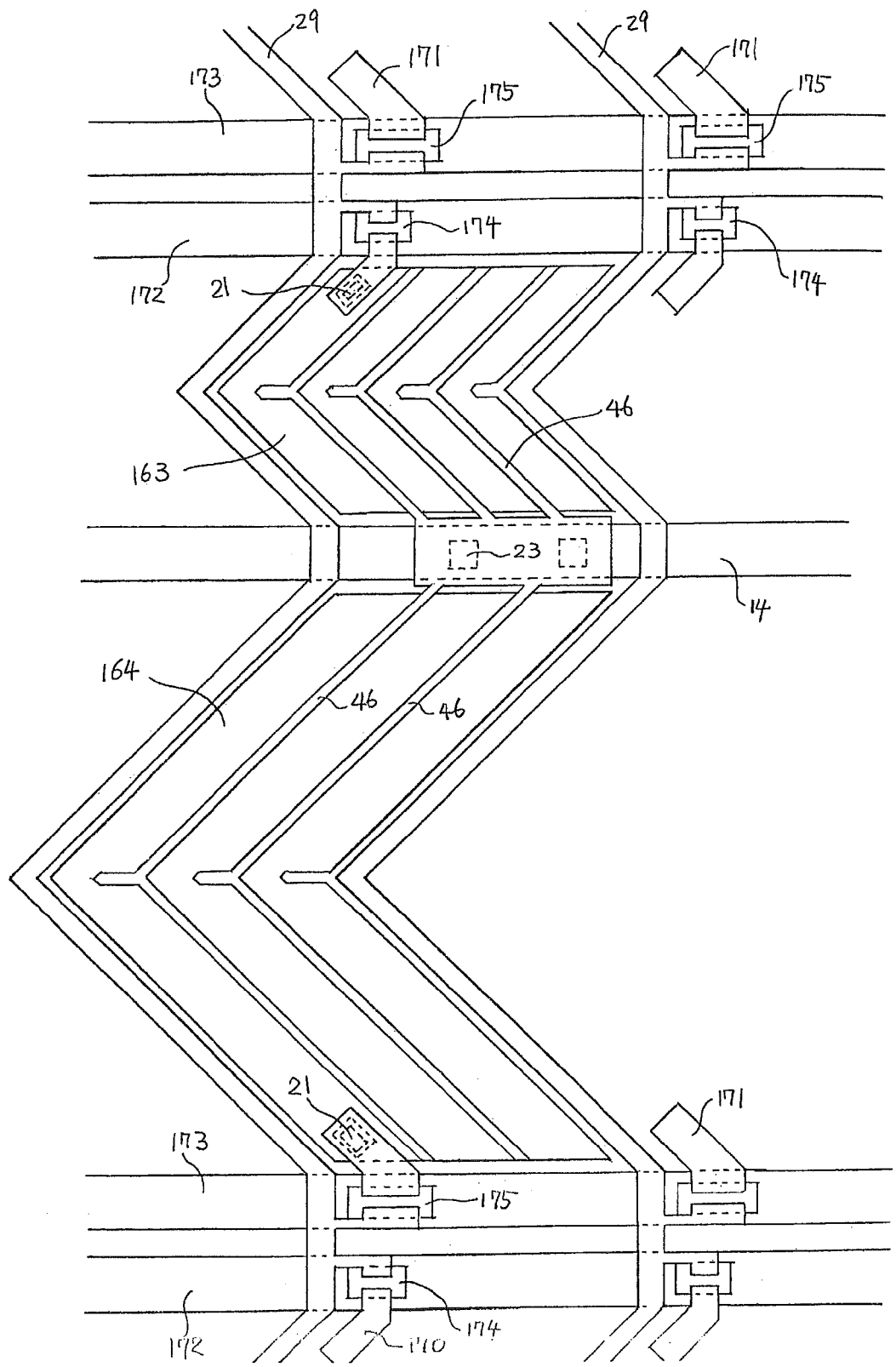
Figure 257:
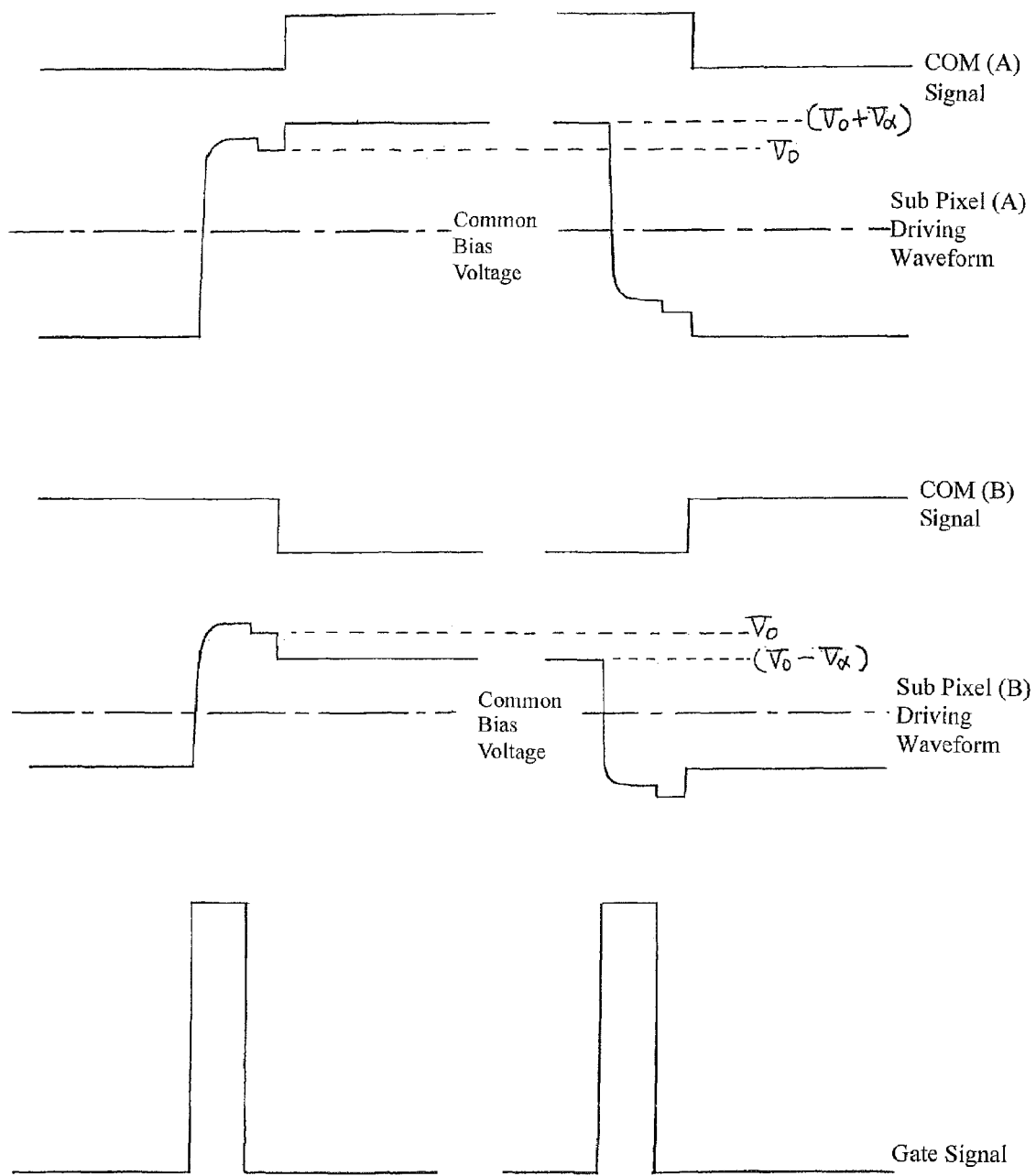
Figure 258:
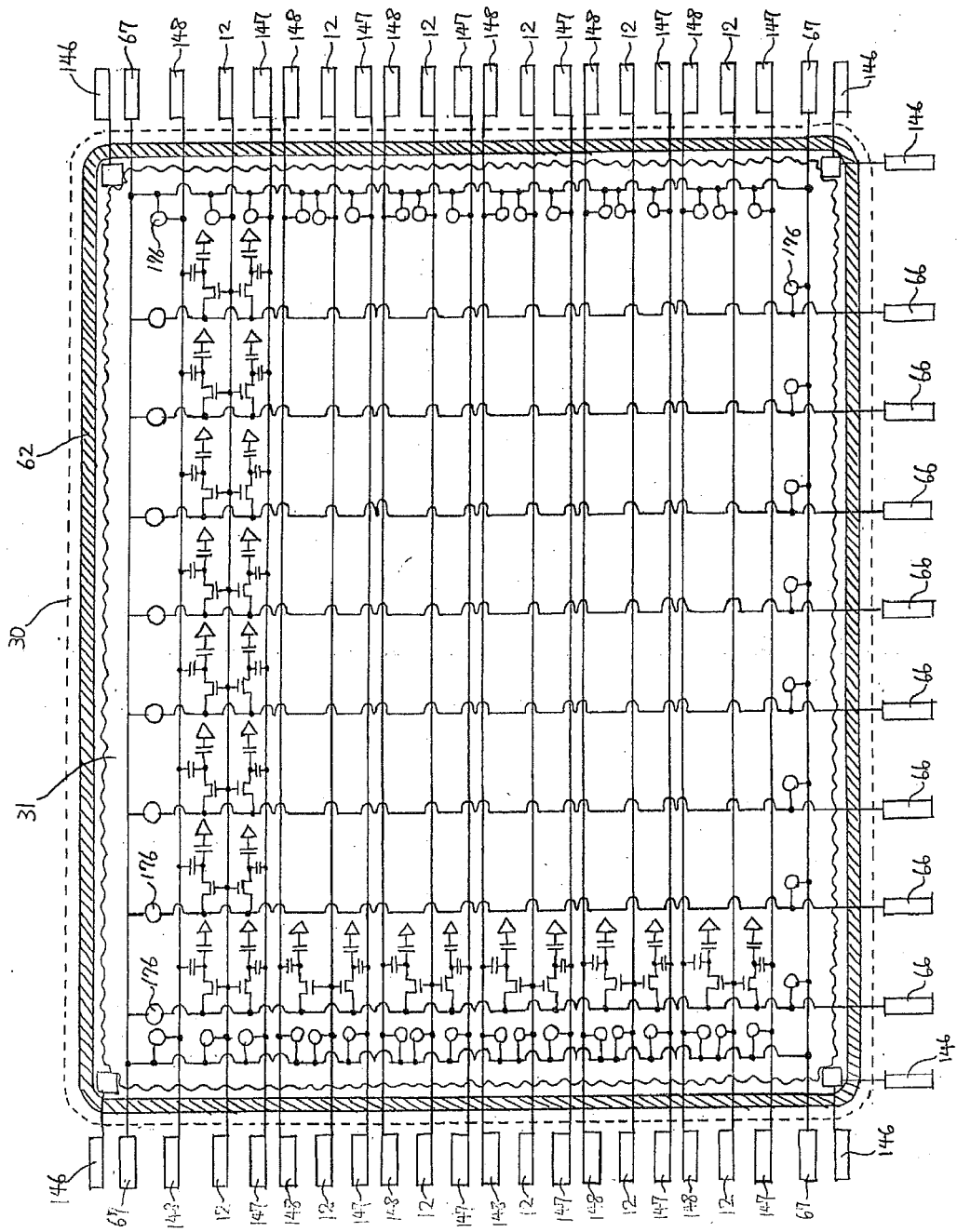
Figure 259:
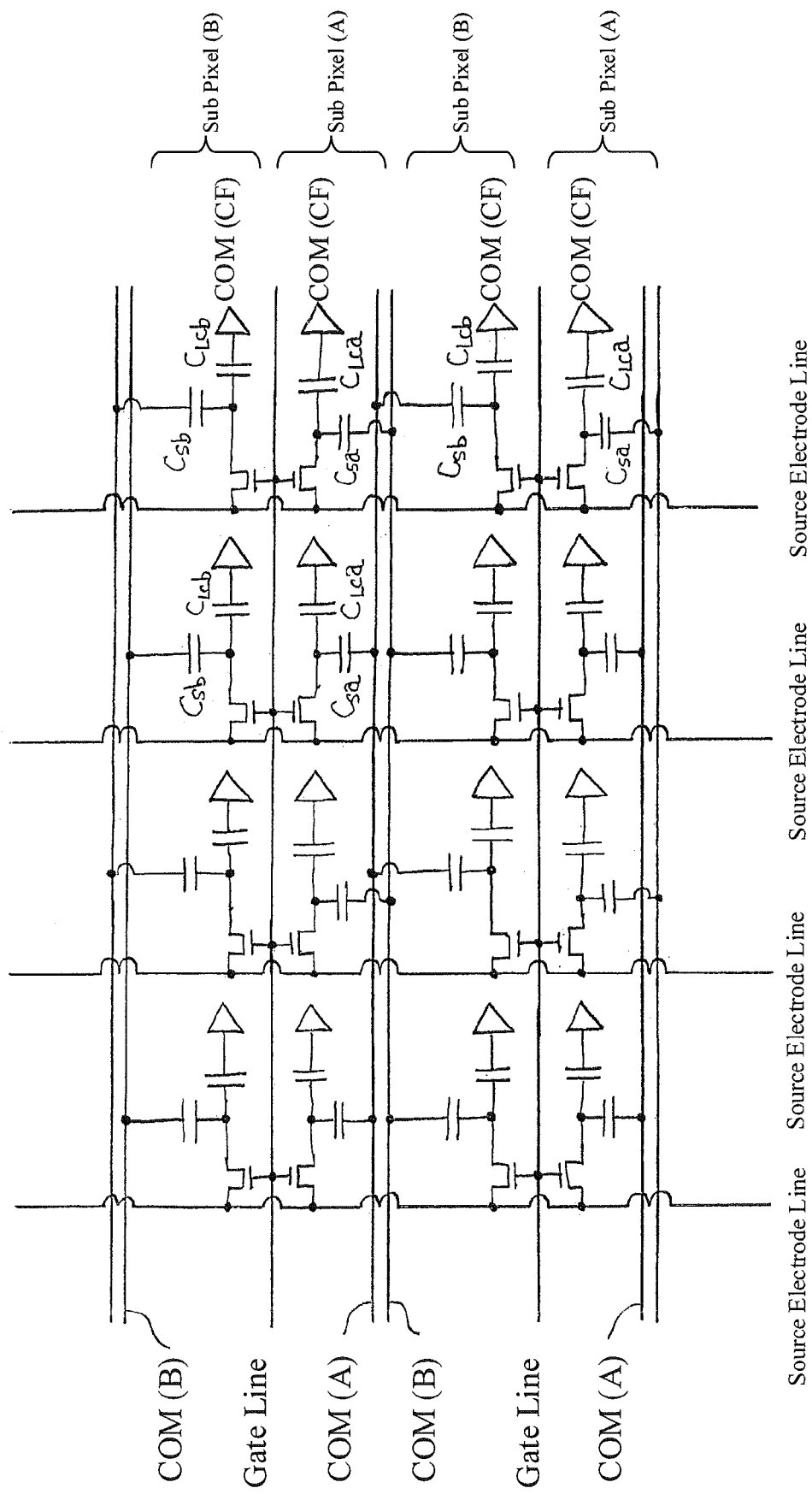
Figure 260:
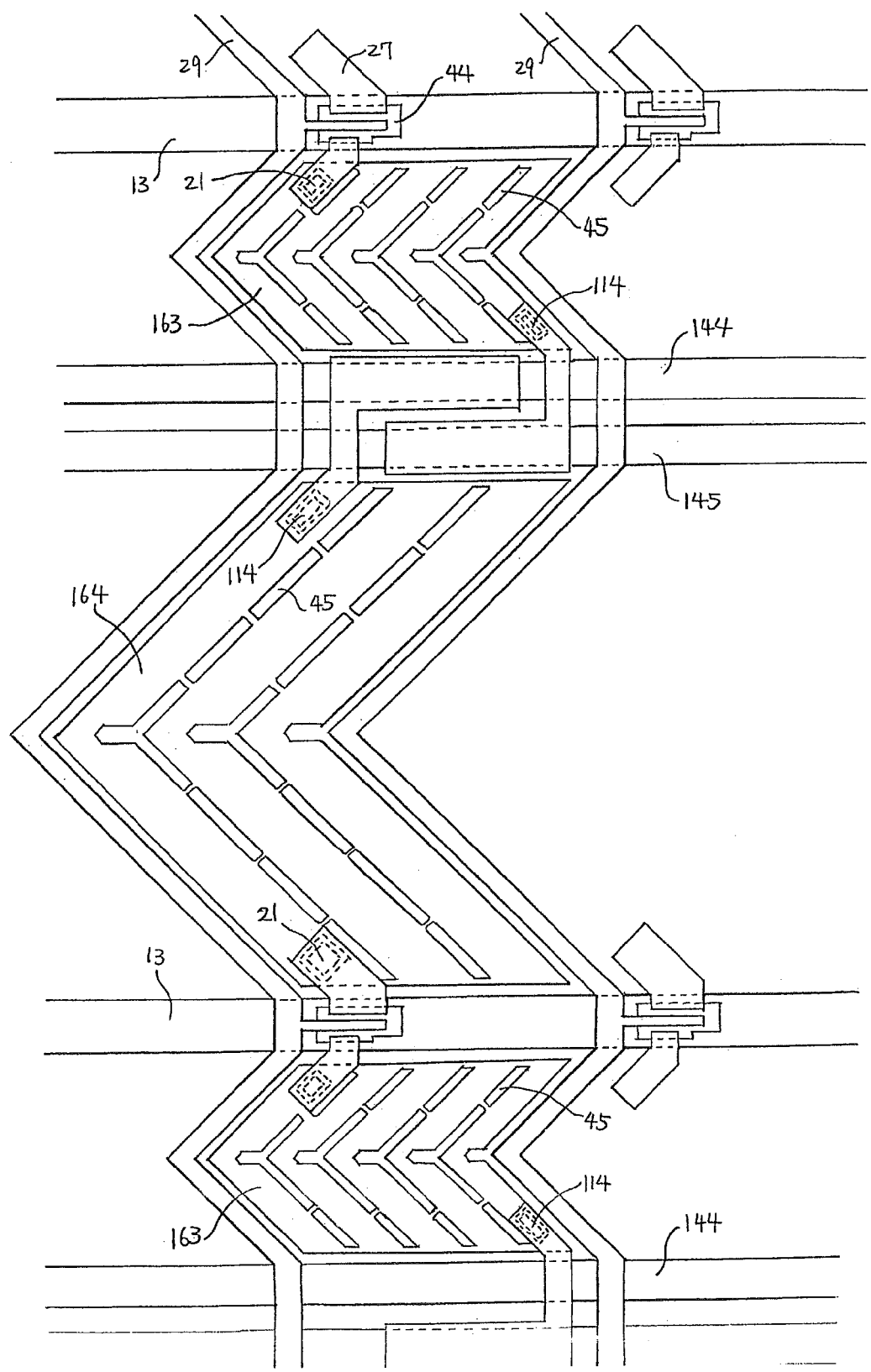
Figure 261:
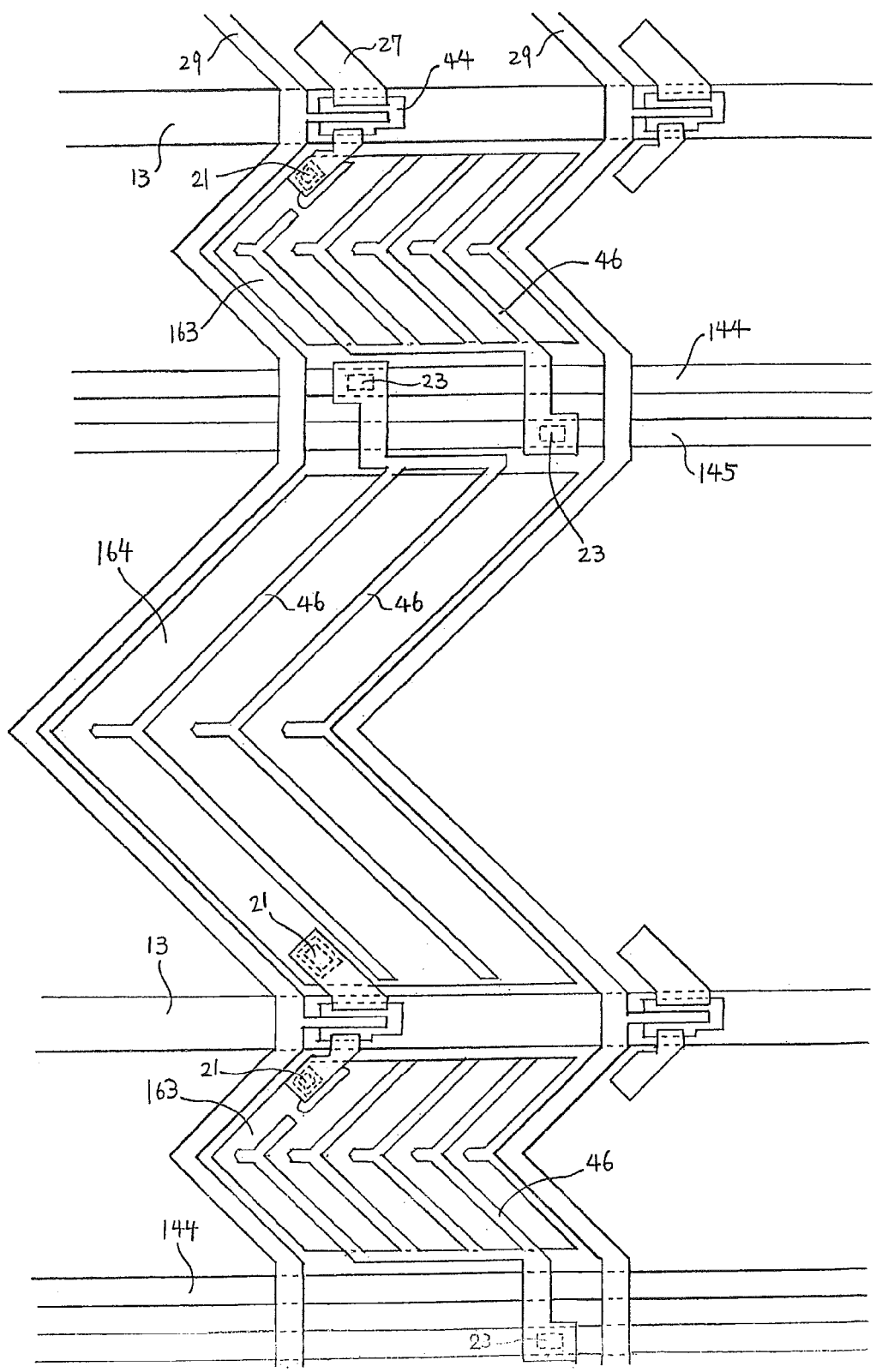
Figure 262:
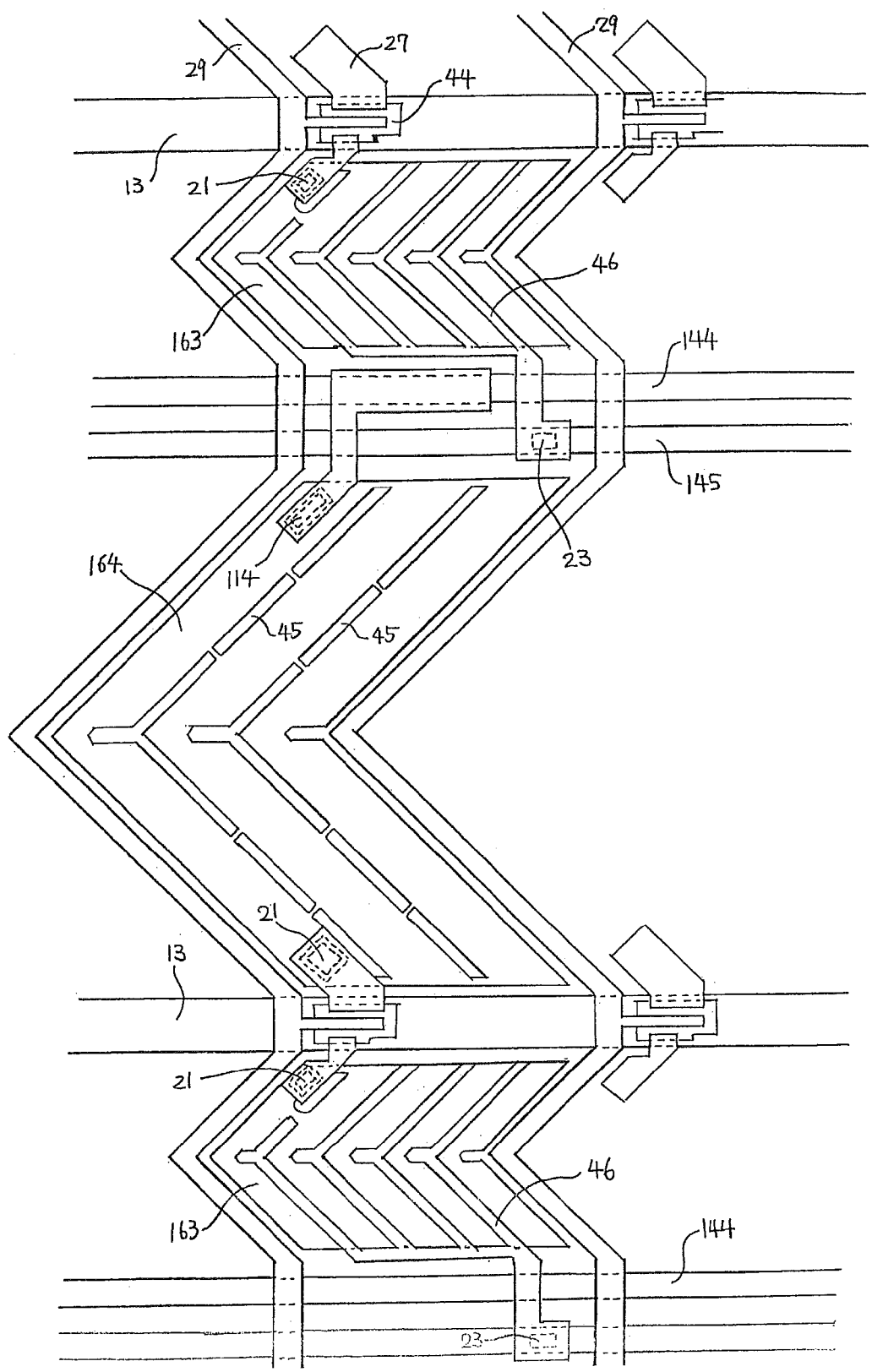
Figure 263:
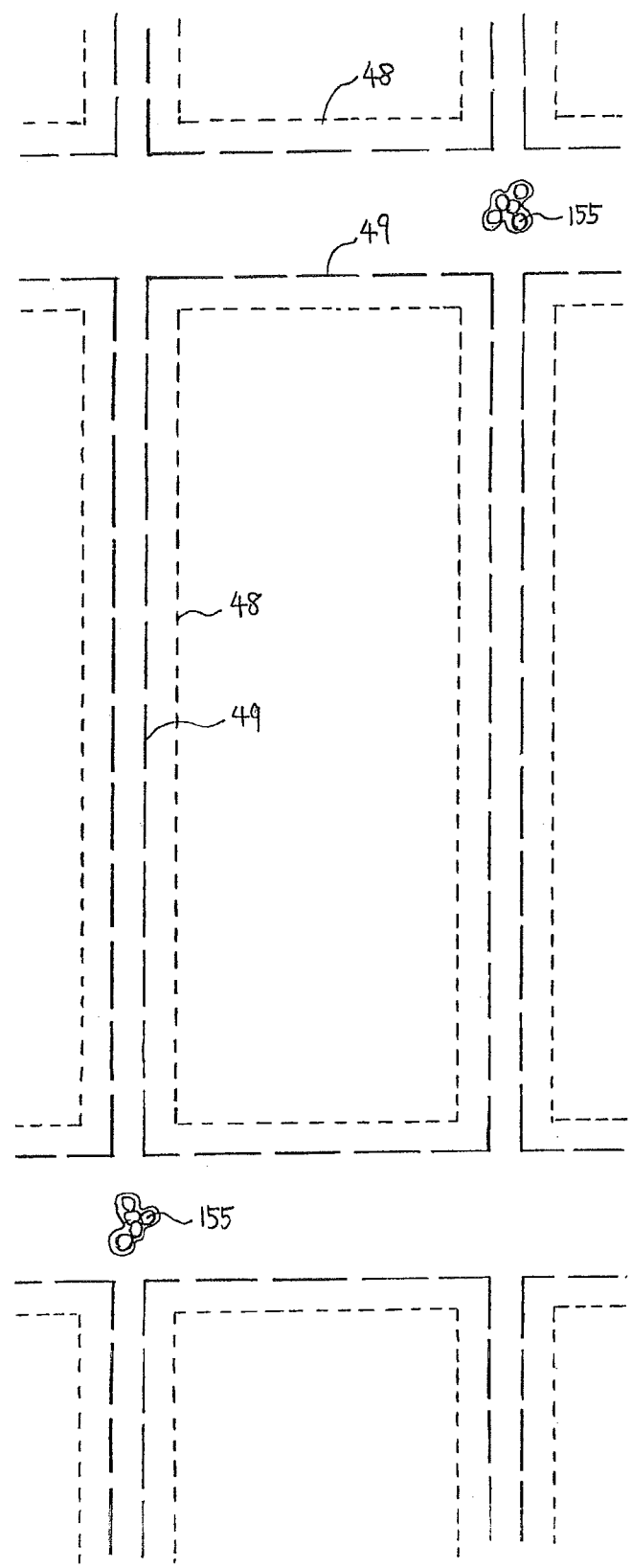
Figure 264:
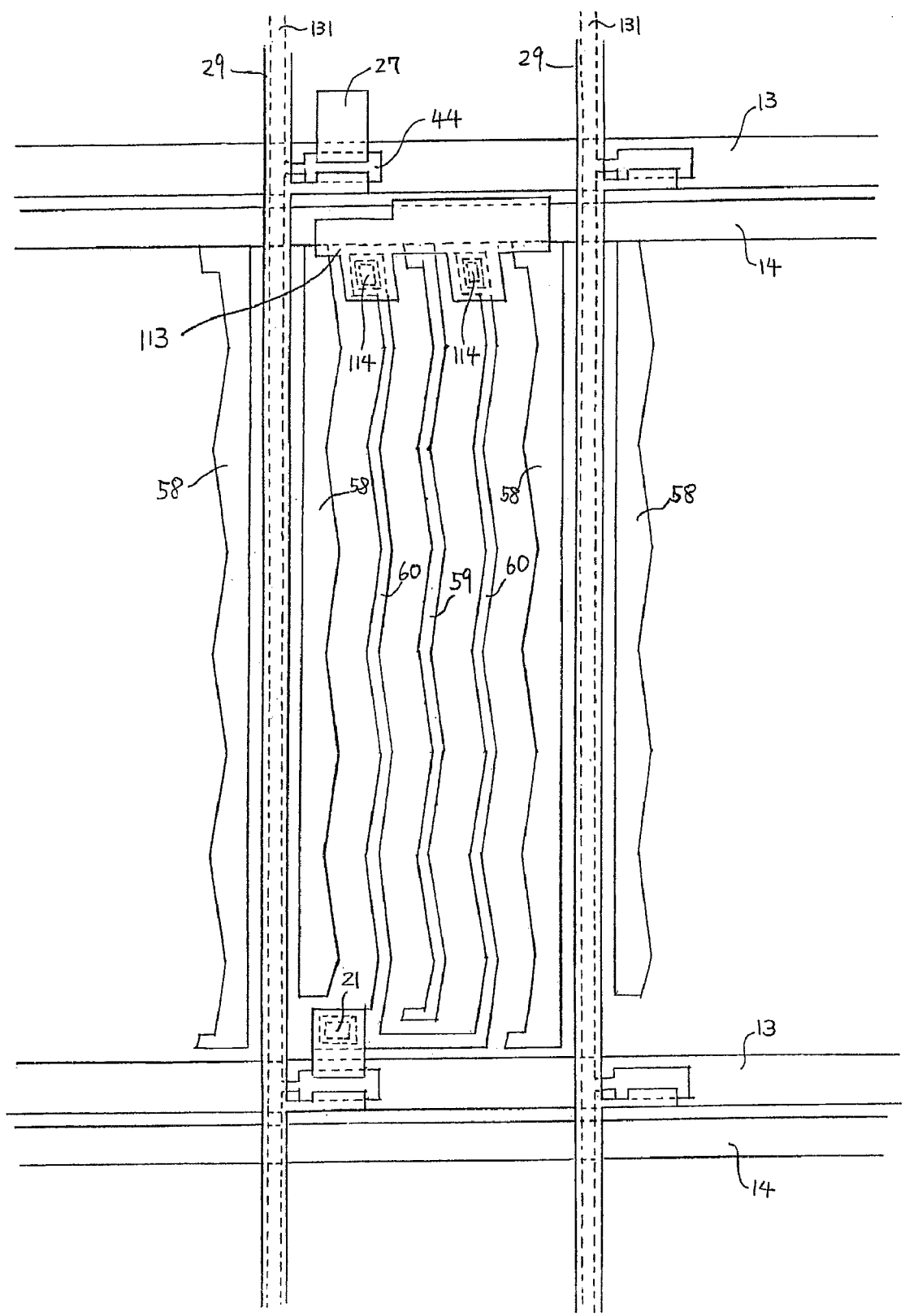
Figure 265:
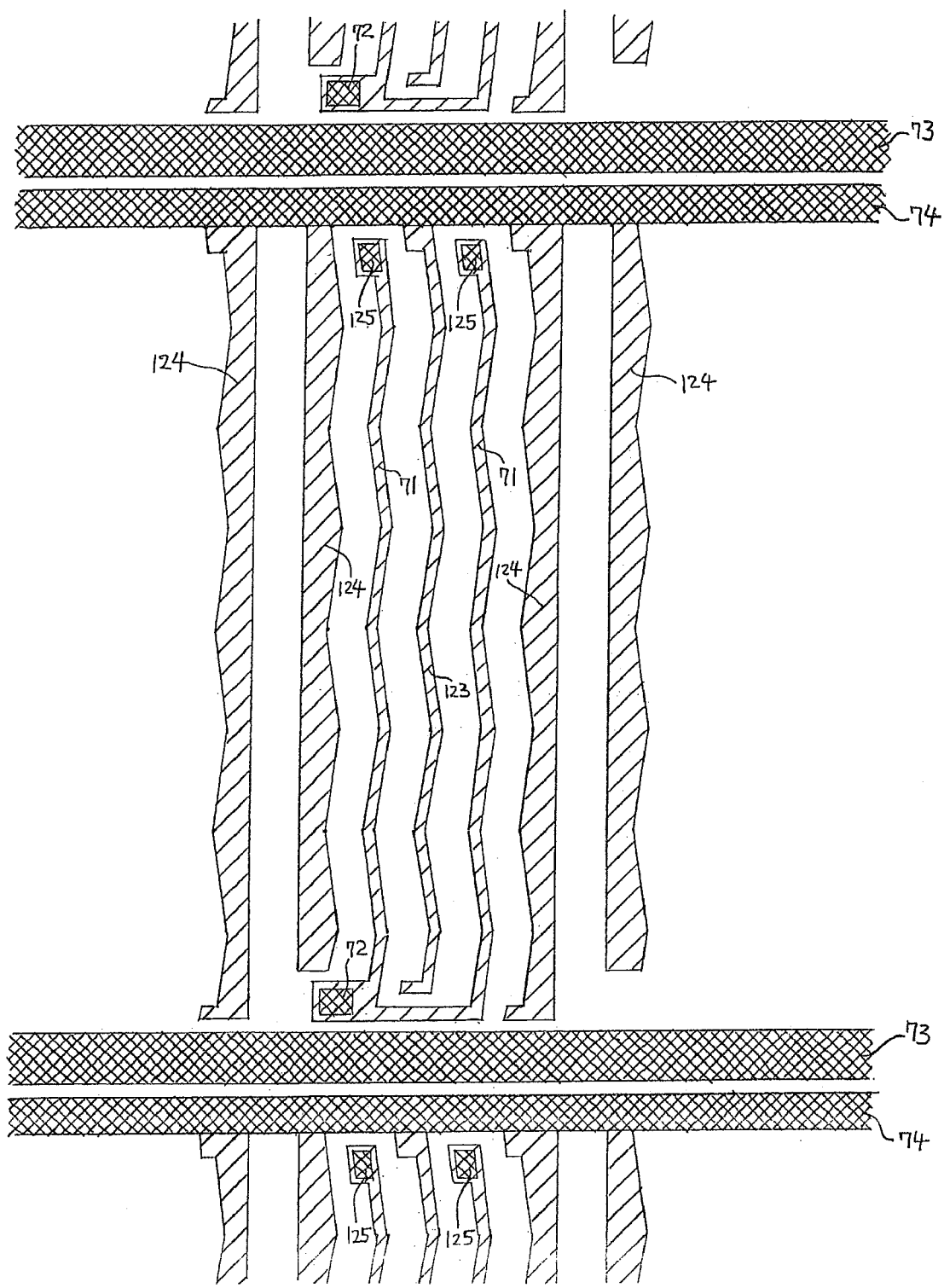
Figure 266:
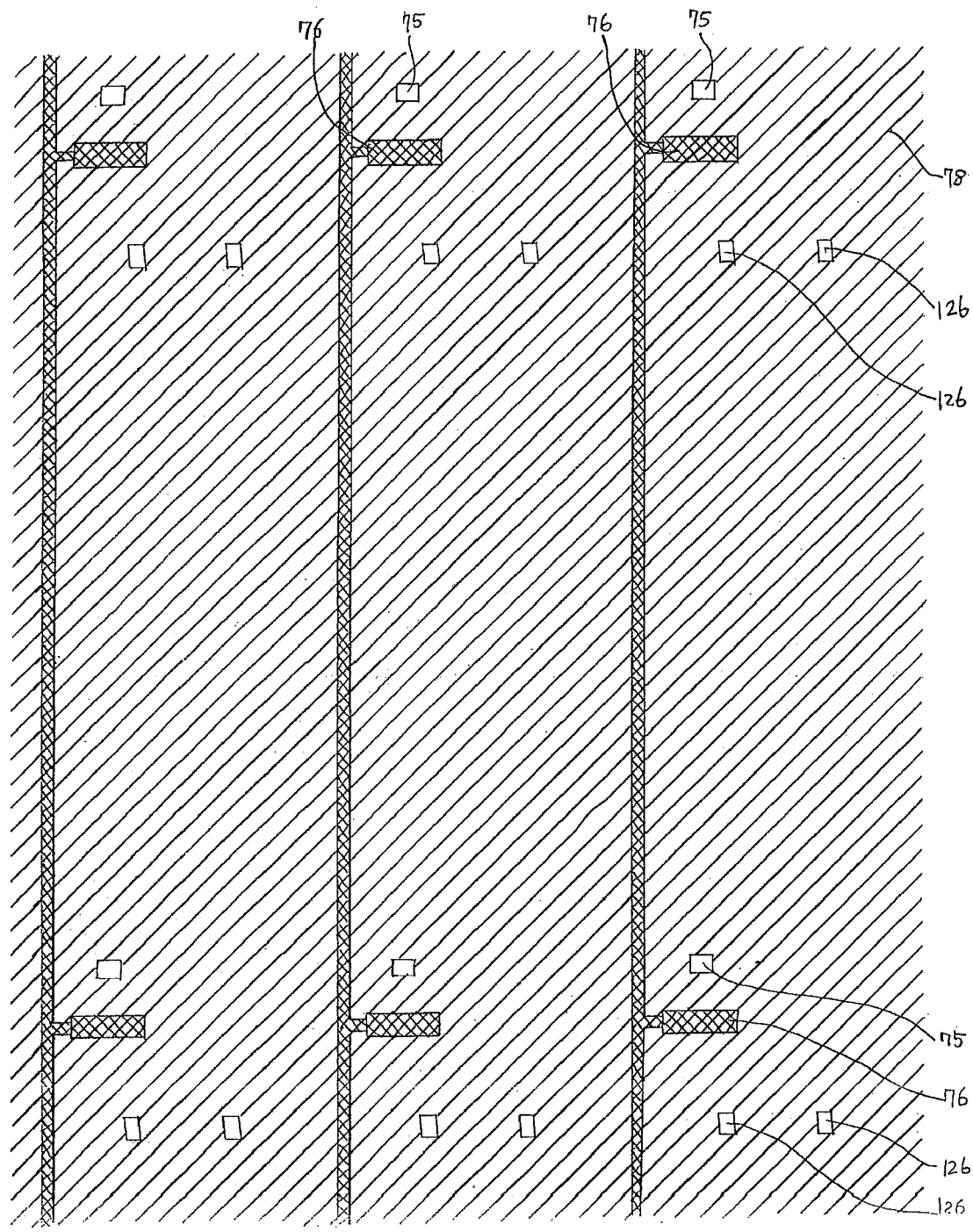
Figure 268:
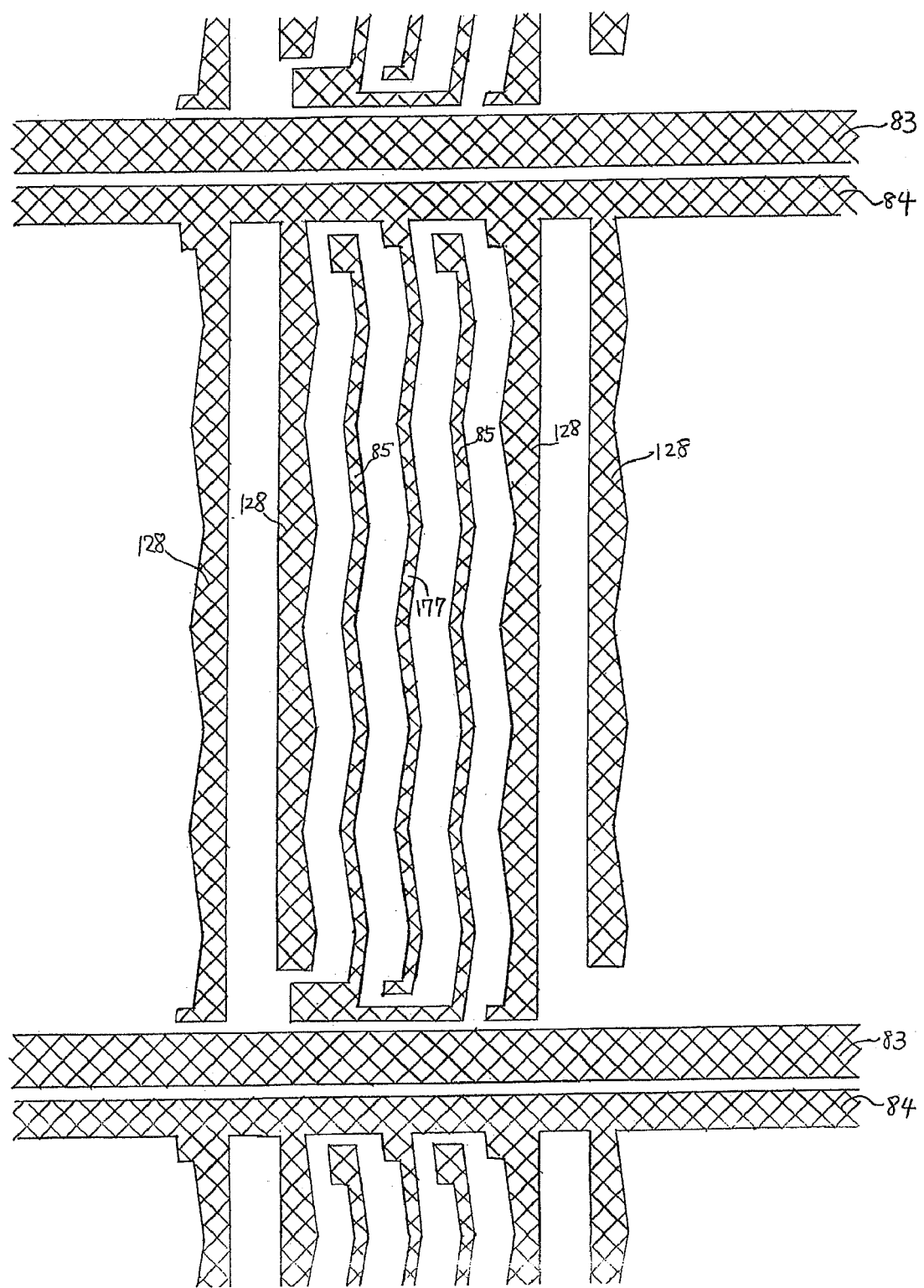
Figure 271:
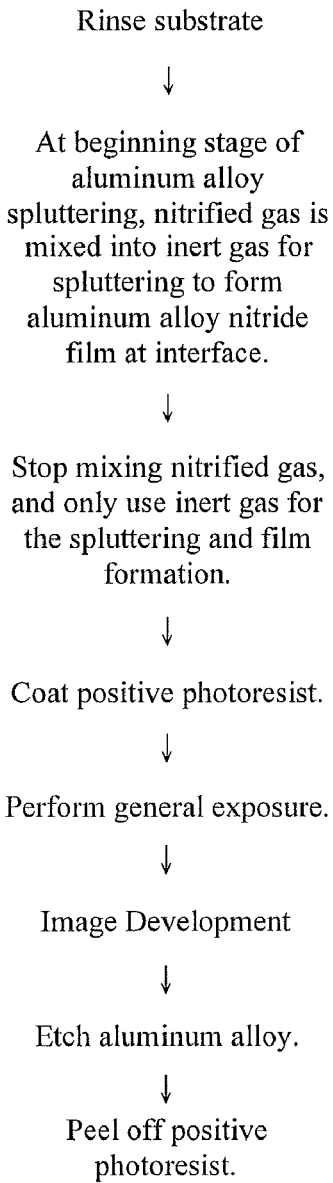
Figure 272:
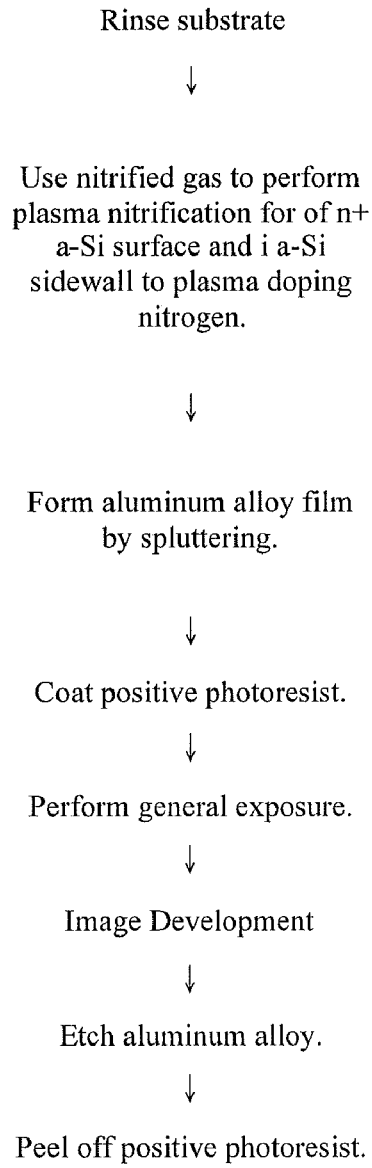
Figure 273:
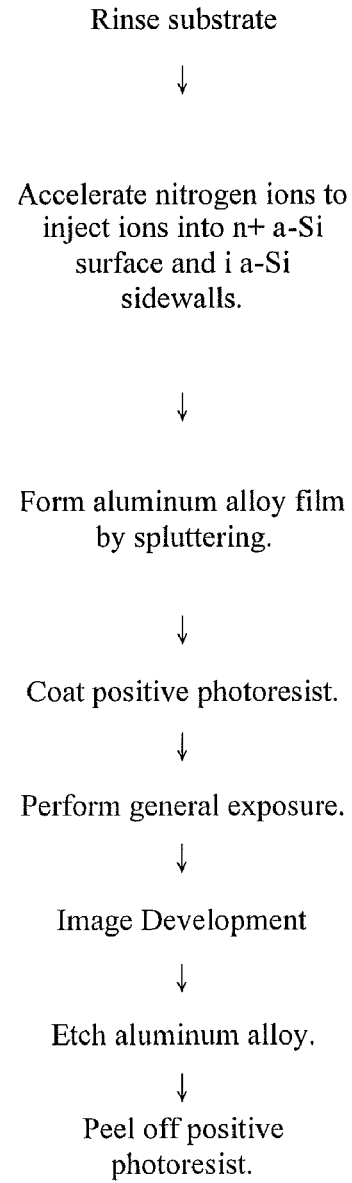
Figure 274:
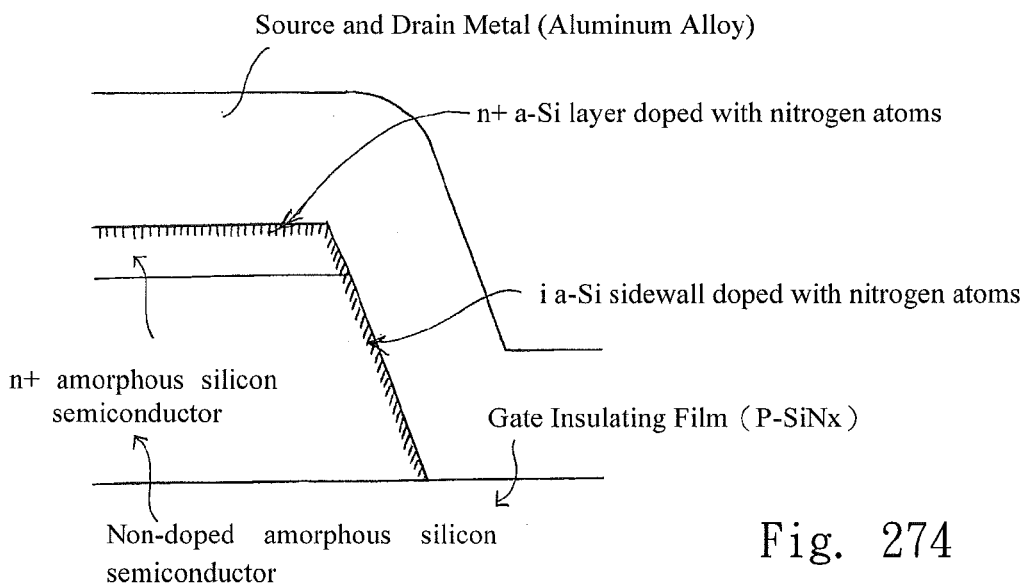
Figure 275:
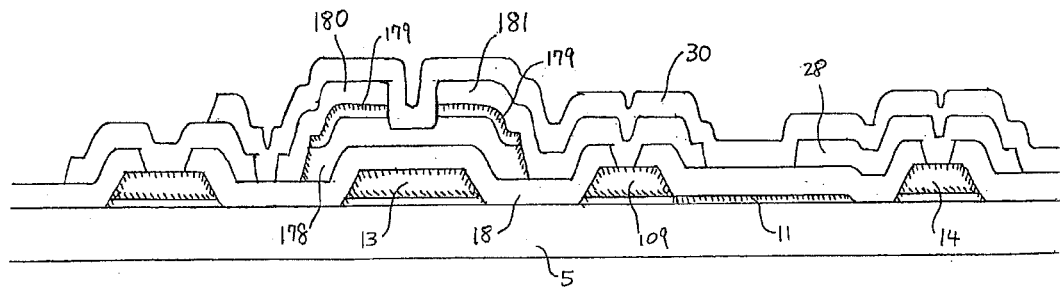
Figure 276:
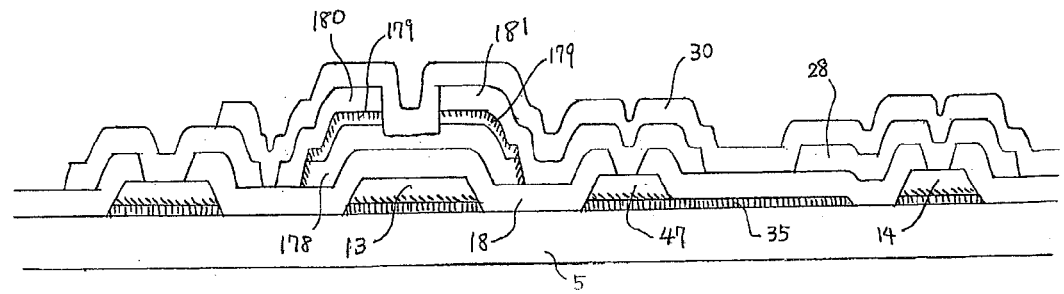

FIG. 213 is a planar view of a TFT matrix substrate composed of a plurality of pixel regions with different threshold voltages in accordance with the present invention;

FIG. 214 is a planar view of a color filter substrate corresponding to FIGS. 194, 195, 217 and 218 of the present invention;

FIG. 215 is a planar view of a color filter substrate corresponding to FIGS. 89, 196, 197 and 219 of the present invention;

FIG. 216 is a planar view of a TFT matrix substrate that connects a holdup capacitor (Cst) forming electrode Cst to a common electrode in accordance with the present invention;

FIG. 217 is a planar view of a TFT matrix substrate composed of a plurality of pixel regions with different threshold voltages in accordance with the present invention;

FIG. 218 is a planar view of a TFT matrix substrate composed of a plurality of pixel regions with different threshold voltages in accordance with the present invention;

FIG. 219 is a planar view of a TFT matrix substrate composed of a plurality of pixel regions with different threshold voltages in accordance with the present invention;

FIG. 220 is a planar view of a TFT matrix substrate composed of a plurality of pixel regions with different threshold voltages in accordance with the present invention;

FIG. 221 is a planar view of a TFT matrix substrate composed of a plurality of pixel regions with different threshold voltages in accordance with the present invention;

FIG. 222 is a planar view of a TFT matrix substrate composed of a plurality of pixel regions with different threshold voltages in accordance with the present invention;

FIG. 223 is a planar view of a TFT matrix substrate composed of a plurality of pixel regions with different threshold voltages in accordance with the present invention;

FIG. 224 is a planar view of a color filter substrate corresponding to FIGS. 220, 221, 222 and 223 of the present invention;

FIG. 225 is a planar view of a TFT matrix substrate composed of a plurality of pixel regions with different threshold voltages in accordance with the present invention;

FIG. 226 is a planar view of a TFT matrix substrate composed of a plurality of pixel regions with different threshold voltages in accordance with the present invention;

FIG. 227 is a planar view of a TFT matrix substrate composed of a plurality of pixel regions with different threshold voltages in accordance with the present invention;

FIG. 228 is a planar view of a TFT matrix substrate composed of a plurality of pixel regions with different threshold voltages in accordance with the present invention;

FIG. 229 is a planar view of a TFT matrix substrate composed of a plurality of pixel regions with different threshold voltages in accordance with the present invention;

FIG. 230 is a planar view of a TFT matrix substrate composed of a plurality of pixel regions with different threshold voltages in accordance with the present invention;

FIG. 231 is a planar view of a TFT matrix substrate composed of a plurality of pixel regions with different threshold voltages in accordance with the present invention;

FIG. 232 is a planar view of a TFT matrix substrate composed of a plurality of pixel regions with different threshold voltages in accordance with the present invention;

FIG. 233 is a planar view of a TFT matrix substrate that connects a holdup capacitor (Cst) forming electrode to a pixel electrode in accordance with the present invention;

FIG. 234 shows an Unidyne structure of the present invention used as an alignment film;

FIG. 235 is a schematic view of a manufacturing process that forms a gate electrode by halftone exposure;

FIG. 236 is a schematic view of a manufacturing process that forms a gate electrode by halftone exposure;

FIG. 237 is a schematic view of the movement of anisotropic liquid crystal molecules with a positive dielectric constant of a horizontal electric field LCD apparatus;

FIG. 238 is a schematic view of the movement of anisotropic liquid crystal molecules with a negative dielectric constant of a horizontal electric field LCD apparatus;

FIG. 239 is a cross-sectional view of the connection of a contact pad and a drain electrode in accordance with the present invention;

FIG. 240 is a planar view of a TFT matrix substrate that connects a holdup capacitor (Cst) forming electrode to a pixel electrode in accordance with the present invention;

FIG. 241 is a planar view of a TFT matrix substrate that connects a holdup capacitor (Cst) forming electrode to a pixel electrode in accordance with the present invention;

FIG. 242 is a planar view of a TFT matrix substrate that connects a holdup capacitor (Cst) forming electrode to a pixel electrode in accordance with the present invention;

FIG. 243 is a cross-sectional view of a MVA mode LCD panel that adopts a liquid crystal alignment control slit, a liquid crystal alignment control electrode and a liquid crystal alignment control protruding lump in accordance with the present invention;

FIG. 244 is a cross-sectional view of a MVA mode LCD panel that adopts a liquid crystal alignment control slit, a liquid crystal alignment control electrode and a liquid crystal alignment control protruding lump in accordance with the present invention;

FIG. 245 is a cross-sectional view of a portion of a previous wide viewing angle liquid crystal display;

FIG. 246 is a cross-sectional view of a portion of a previous wide viewing angle liquid crystal display;

FIG. 247 is a distribution diagram showing the film thickness of an aluminum film containing nitrogen and the contact resistance of a resistance;

FIG. 248 is a cross-sectional view of a manufacturing process that forms a pixel electrode by a halftone exposure method in accordance with the present invention;

FIG. 249 is a cross-sectional view of the shape of a mask used for halftone exposure for a halftone exposure method and a developed positive photoresist in accordance with the present invention;

FIG. 250 is a cross-sectional view of the shape of a general mask used for halftone exposure for a halftone exposure method and a developed positive photoresist in accordance with the present invention;

FIG. 251 is a cross-sectional view of completing an IPS mode TFT matrix substrate of the present invention;

FIG. 252 is a cross-sectional view of completing an IPS mode TFT matrix substrate of the present invention;

FIG. 253 is a cross-sectional view of completing an FFS mode TFT matrix substrate of the present invention;

FIG. 254 is a planar view of a TFT matrix substrate having two independent thin film transistor components and two independent pixel region in a unit pixel in accordance with the present invention;

FIG. 255 is a planar view of a TFT matrix substrate having two independent thin film transistor components and two independent pixel region in a unit pixel in accordance with the present invention;

FIG. 256 is a planar view of a TFT matrix substrate having two independent thin film transistor components and two independent pixel region in a unit pixel in accordance with the present invention;

FIG. 257 is a driving waveform diagram of an LCD panel with a pixel structure as shown in FIGS. 200, 201, 204, 205, 206, 207, 208, 228 229, 230, 231 and 232 of the present invention;

FIG. 258 is a planar view of an LCD panel with a pixel structure as shown in FIGS. 200, 201, 204, 205, 206, 207, 208, 228 229, 230, 231 and 232 of the present invention;

FIG. 259 is an equivalent circuit diagram of a pixel structure corresponding to FIGS. 260, 261 and 262 of the present invention;

FIG. 260 is a planar view of a TFT matrix substrate composed of a plurality of pixel regions with different threshold voltages in accordance with the present invention;

FIG. 261 is a planar view of a TFT matrix substrate composed of a plurality of pixel regions with different threshold voltages in accordance with the present invention;

FIG. 262 is a planar view of a TFT matrix substrate composed of a plurality of pixel regions with different threshold voltages in accordance with the present invention;

FIG. 263 is a planar view of a color filter substrate used for assembling a TFT matrix substrate as shown in FIGS. 148 and 149 of the present invention;

FIG. 264 is a planar view of an IPS mode TFT matrix substrate that connects a holdup capacitor (Cst) forming electrode to a comb pixel electrode in accordance with the present invention;

FIG. 265 is a planar view of a mask for a first halftone exposure in a third IPS mode photolithographic process as shown in FIG. 38 of the present invention;

FIG. 266 is a planar view of a mask for a second halftone exposure in a third IPS mode photolithographic process as shown in FIG. 38 of the present invention;

FIG. 267 is a planar view of a general mask used in Step (i) of a second IPS mode halftone double exposure manufacturing process as shown in FIG. 77 of the present invention;

FIG. 268 is a planar view of a general mask used in Step (ii) of a second IPS mode halftone double exposure manufacturing process as shown in FIG. 77 of the present invention;

FIG. 269 is a planar view of a general mask used in Step (i) of a third IPS mode halftone double exposure manufacturing process as shown in FIG. 77 of the present invention;

FIG. 270 is a planar view of a general mask used in Step (ii) of a second IPS mode halftone double exposure manufacturing process as shown in FIG. 77 of the present invention;

FIG. 271 is a schematic view of a manufacturing flow of a third photolithographic process in accordance with the present invention;

FIG. 272 is a schematic view of a manufacturing flow of a third photolithographic process in accordance with the present invention;

FIG. 273 is a schematic view of a manufacturing flow of a third photolithographic process in accordance with the present invention;

FIG. 274 is a cross-sectional view of the interface of an n+amorphous silicon layer and a source electrode and a drain electrode metal electrode of the present invention;

FIG. 275 is a cross-sectional view of forming a TFT matrix substrate in accordance with the present invention;

FIG. 276 is a cross-sectional view of forming a TFT matrix substrate in accordance with the present invention;

FIG. 277 is a schematic view of a manufacturing process that uses a halftone exposure method for two times and a mask manufacturing process for four times in accordance with the present invention;

FIG. 278 is a schematic view of a manufacturing process that uses a halftone exposure method for two times and a mask manufacturing process for four times in accordance with the present invention;

FIG. 279 is a schematic view of a manufacturing process that uses a halftone exposure method for two times and a mask manufacturing process for four times in accordance with the present invention;

FIG. 280 is a schematic view of a manufacturing process that uses a halftone exposure method for two times and a mask manufacturing process for four times in accordance with the present invention;

FIG. 281 is a schematic view of a manufacturing process that uses a halftone exposure method for two times and a mask manufacturing process for four times in accordance with the present invention;

FIG. 282 is a schematic view of a manufacturing process that uses a halftone exposure method for two times and a mask manufacturing process for four times in accordance with the present invention;

FIG. 283 is a schematic view of a manufacturing process that uses a DMD halftone exposure method for two times in a fourth and a mask manufacturing process for a four-time photolithographic process in accordance with the present invention; and FIG. 284 is a schematic view of a manufacturing process that uses a DMD halftone exposure method for two times in a fourth and a mask manufacturing process for a four-time photolithographic process in accordance with the present invention.

DETAILED DESCRIPTION OF THE PREFERRED EMBODIMENTS

To make it easier for our examiner to understand the objective, innovative features and performance of the present invention, we use preferred embodiments and the accompanying drawings for a detailed description of the present invention.

Embodiment 1

Figure 1:
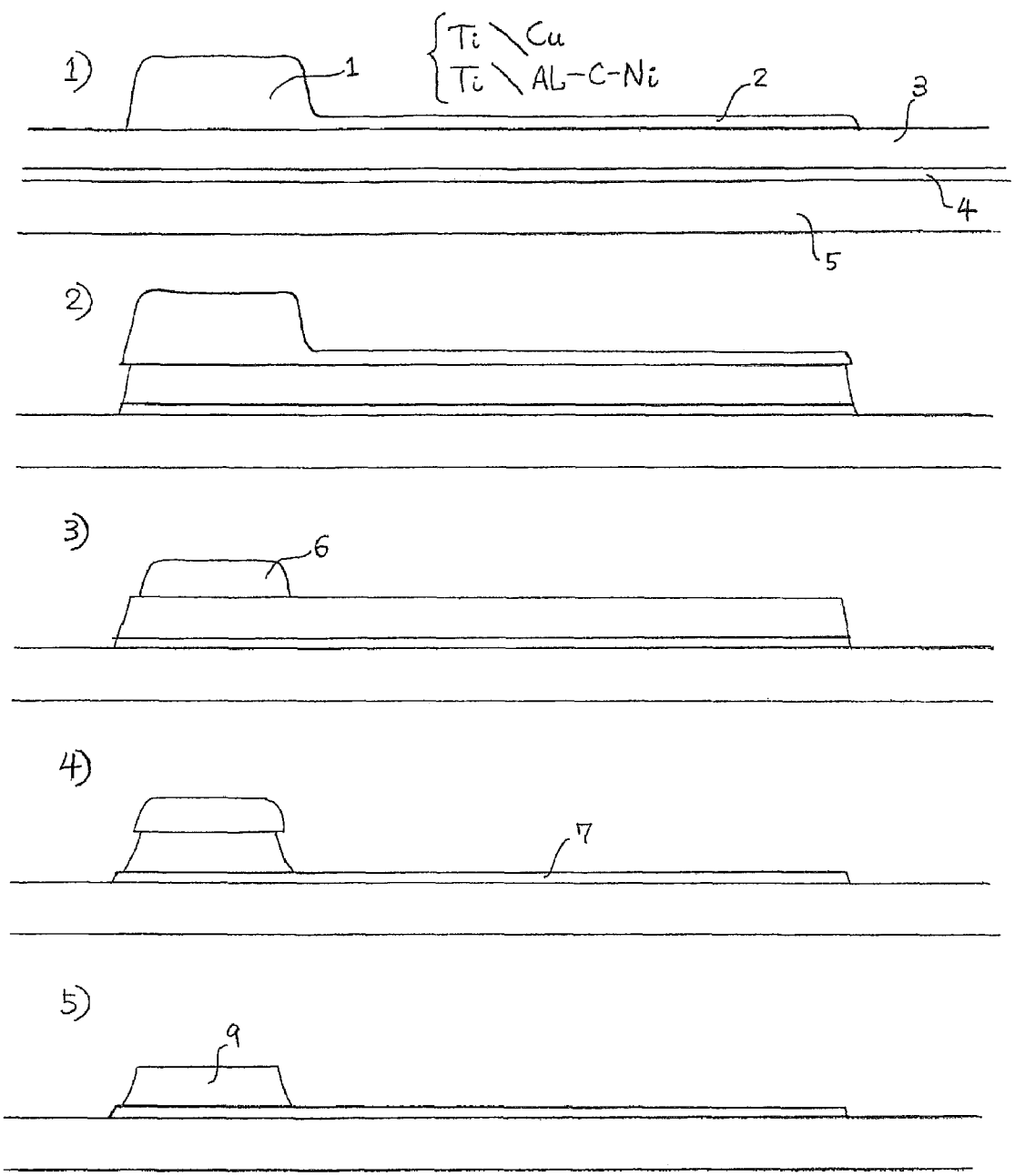
FIG. 1 is a cross-sectional view of a manufacturing process for forming a pixel electrode by using a halftone exposure method in accordance with the present invention.
Figure 2:
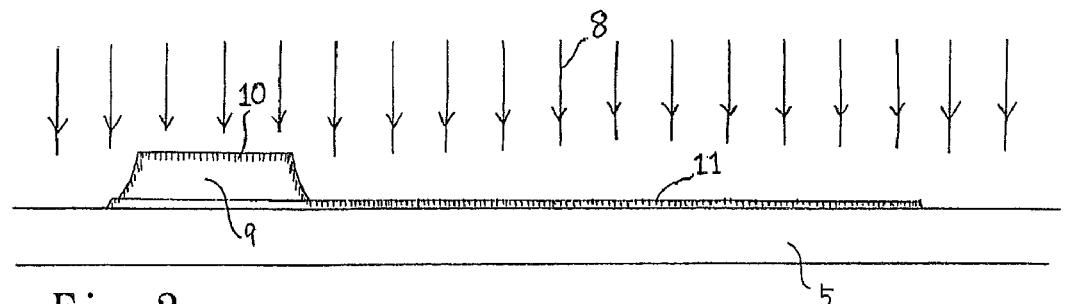
FIG. 2 is a flow chart of performing a nitrogen ion doping process to form a pixel electrode by using a halftone exposure method in accordance with the present invention.
Figure 10:
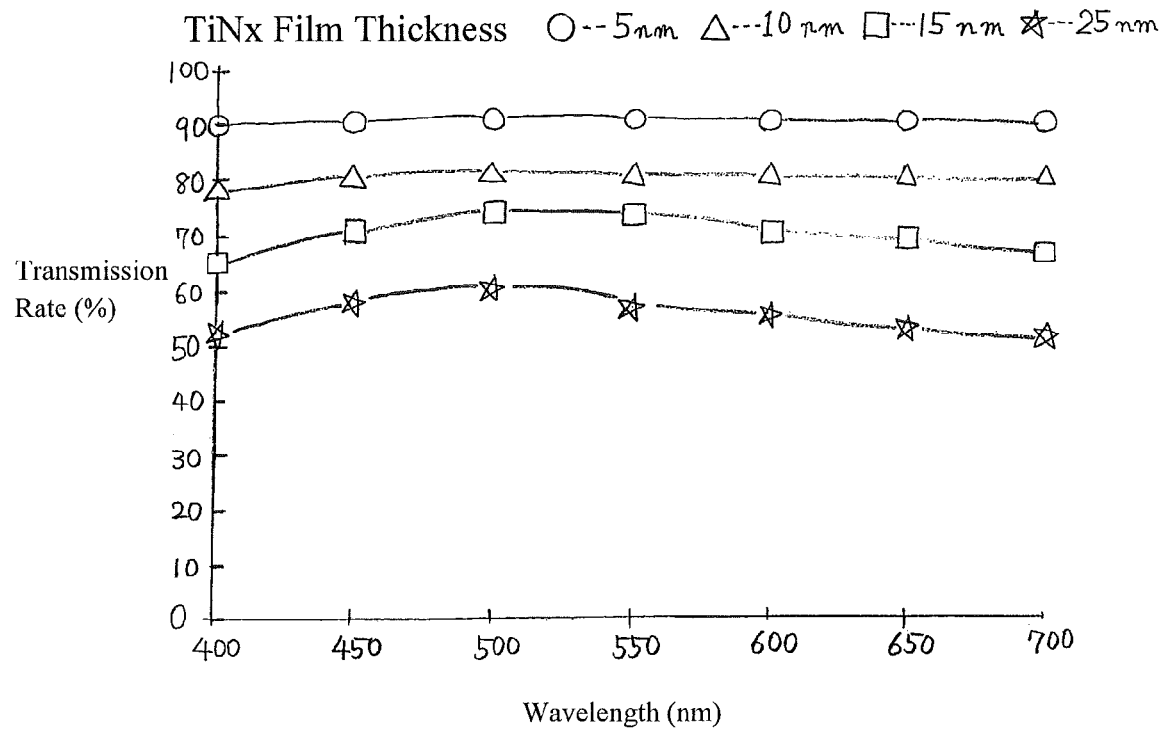
FIG. 10 illustrates the relation between the thickness of a TiNx film and the transmission rate of a visible light.
Figure 11:
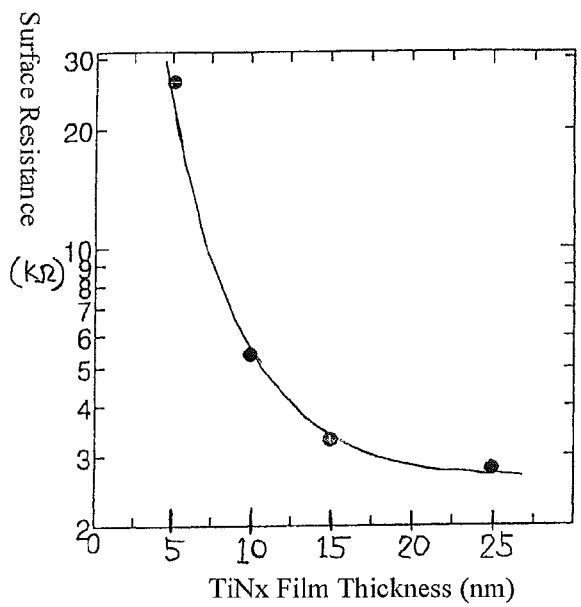
FIG. 11 illustrates the relations between the film thickness and surface resistance of TiNx.

Referring to FIGS. 11 to 15 for a schematic cross-sectional view of a manufacturing process of an active matrix TFT substrate in accordance with Embodiment 1 of the present invention, a titanium thin film or a zirconium thin film of 5~25 nm is formed on a glass substrate, and then an aluminum alloy (aluminum-carbon-nickel or aluminum-neodymium-nickel), copper or copper alloy (copper-nickel or copper-chromium) or silver alloy of 200~800 nm is formed on the whole surface of the substrate as shown in FIGS. 249 and 250. After the positive photoresist is coated, a halftone exposure method is used for carrying out an exposure to develop an image and produce a positive photoresist pattern in the shape as shown in FIG. 1-1. In FIG. 1-2, the pattern is used for simultaneously etching and manufacturing a lower layer metal thin film and an upper layer metal thin film into the same shape, and then an oxygen plasma ashing process is used for ashing away the thin positive photoresist region to expose the upper layer metal layer. And then, the upper layer metal layer is selectively etched and exposed, and the positive photoresist remained in the contact pad portion is peeled off to achieve the shape as shown in FIG. 1-5. In FIG. 2, an ion shower doping method is used for implanting nitrogen ions on the whole surface of the substrate, such that the metal surface of the contact pad portion and the exposed lower layer metal thin film becomes metal nitride. The aforementioned manufacturing process can be classified as a Type (Ia) manufacturing process as shown in FIG. 46. An aluminum nitride layer is formed on the surface of the contact pad for enhancing the oxidation-resisting function of the contact pad and preventing poor contact. Within the range indicated by a hollow circle in FIG. 247, a good contact is achieved. The titanium thin film or zirconium thin film of the lower layer is changed to nitride by the doped nitrogen ions as shown in FIG. 10 for achieving a good visible light transmission rate. In FIG. 11, a surface electric resistance below 30 KΩ can be achieved, even if the titanium nitride thin film is 5 nm thick, and used in a pixel electrode of the active matrix substrate, so as to obtain a sufficient surface electric resistance. A gate electrode and a common electrode are formed simultaneously by the manufacturing process as shown in FIGS. 1 and 2.

Figure 3:
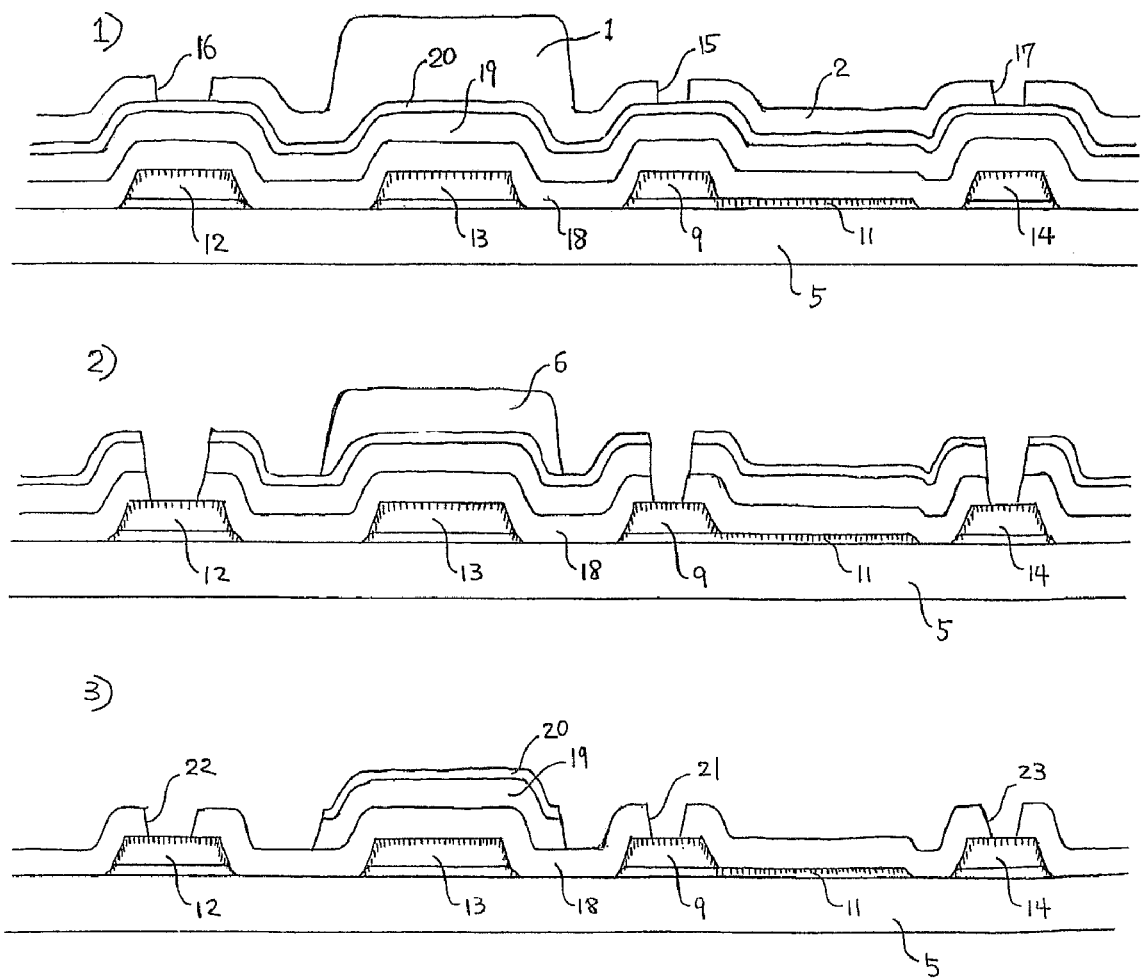
FIG. 3 is a cross-sectional view of a manufacturing process of forming an island and a contact hole of a semiconductor layer of a thin film transistor component by using a halftone exposure method in accordance with the present invention.

Referring to FIG. 3 for a schematic cross-sectional view of Embodiment 1 of the present invention, one photolithographic process is used for carrying out a component separation of the thin film semiconductor layer and the manufacturing process of the contact hole. In FIG. 47, a plasma CVD method is used continuously to form three layers: a gate insulating film (P—SiNx), a non-doped thin film semiconductor layer and a doped thin film semiconductor used for an ohmic contact on the entire surface of the substrate as shown in FIGS. 249 and 250. After the positive photoresist is coated, a halftone exposure method is used for carrying an exposure to develop an image and creating a positive photoresist pattern with a shape as shown in FIG. 3-1. To form a contact hole at the interface of a contact pad portion and a gate electrode terminal or a common electrode portion in the pixel electrode portion and the Cst electrode, the positive photoresist is removed. Since the region of the thin film transistor component is not exposed to UV, therefore a positive photoresist with the maximum thickness is maintained, and the other region becomes a halftone exposure region. A thin positive photoresist remains after the image is developed. In FIG. 3-2, contact holes are created by dry etching, and then the thin positive photoresist at the halftone exposure region is ashed away by an oxygen plasma processing, and the positive photoresist only remains in the region of the thin film transistor component. After the exposed thin film semiconductor layer is removed by dry etching, the positive photoresist is removed as shown in FIG. 3-3.

Figure 36:
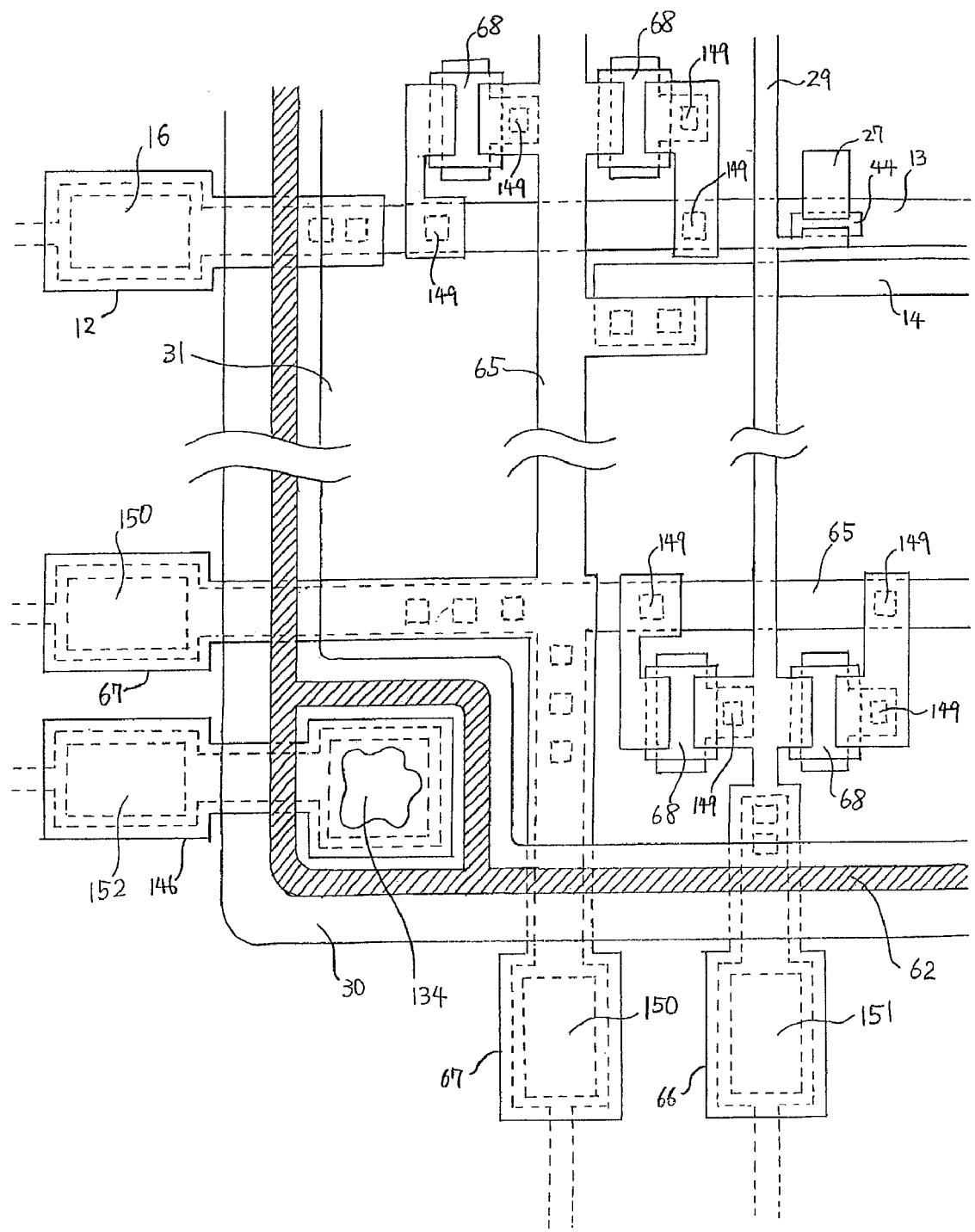
FIG. 36 is a planar view of a LCD panel static charge protection circuit and a main seal region in accordance with the present invention.

Referring to FIGS. 4 and 175 respectively for a cross-sectional view and a schematic view of a photolithographic process of forming a source electrode, a drain electrode and a holdup capacitor (Cst) forming electrode in accordance with Embodiment 1 of the present invention, the photolithographic process adopts a general mask for the manufacture. In the manufacturing process, the drain electrode of a thin film transistor component and a contact pad of the pixel region are electrically coupled through the contact hole. The holdup capacitor (Cst) forming electrode is also electrically coupled to the common electrode through the contact hole. In this manufacturing process as shown in FIGS. 36 and 169, an electrostatic protection circuit is formed at the periphery of the valid display area. In FIG. 4, the source electrode and the drain electrode as shown in FIG. 175 become a two-layer metal structure using a barrier metal layer, which can be connected directly to the doped ohmic contact semiconductor layer, and the single-layer metal structure as shown in FIG. 48 can be used for the manufacturing process of the source electrode and the drain electrode. Metals, even those that can be diffused with each other easily, can be bonded directly on the doped ohmic contact semiconductor layer, when the temperature of the substrate is high as shown in FIG. 179. When aluminum alloy is spluttered and deposited on the surface of the ohmic contact semiconductor layer, argon gas is mixed into a nitrified gas such as nitrogen gas, for forming a doped nitrogen aluminum alloy film on the interface region at the early stage of film formation, so as to manufacture a structure as shown in FIG. 123. By using an aluminum alloy with nitrogen doped at the interface, the mutual diffusion can be prevented. Even the single-layer metal structure can be used for manufacturing the large LCD panels. Referring to FIGS. 120 and 121 for cross-sectional views of a TFT matrix substrate using the single-layer structure of aluminum alloy, a source electrode and a drain electrode adopt pure aluminum. As shown in FIG. 181, the Hirox of aluminum can be prevented, and a good ohmic contact can be achieved. Therefore, the way of using upper and lowering barrier metals to include a three-layer metal structure of aluminum can be adopted.

FIG. 5 shows a cross-sectional view of forming a passivation film of a TFT matrix substrate on a region other than an externally connected terminal region by a P-CVD device adopting a mask deposition method in accordance with Embodiment 1 of the present invention. As shown in FIGS. 5-2, 32 to 37, and 167 to 171, the film formation area of the passivation film is larger than the film formation area of the alignment film by the area of a main seal region. The present invention uses the mask deposition method to omit the photolithographic process of forming a contact hole on the terminal portion, and reduce the number of photolithographic process for one time.

The manufacturing process of an active matrix substrate in accordance with Embodiment 1 is classified into the types as shown in FIGS. 38 to 40, 77 to 79, 82, 83, 103 and 104 according to different exposure methods. In the manufacturing process of the present invention, a photolithographic process is carried out for three times to manufacture an active matrix substrate.

Figure 84:
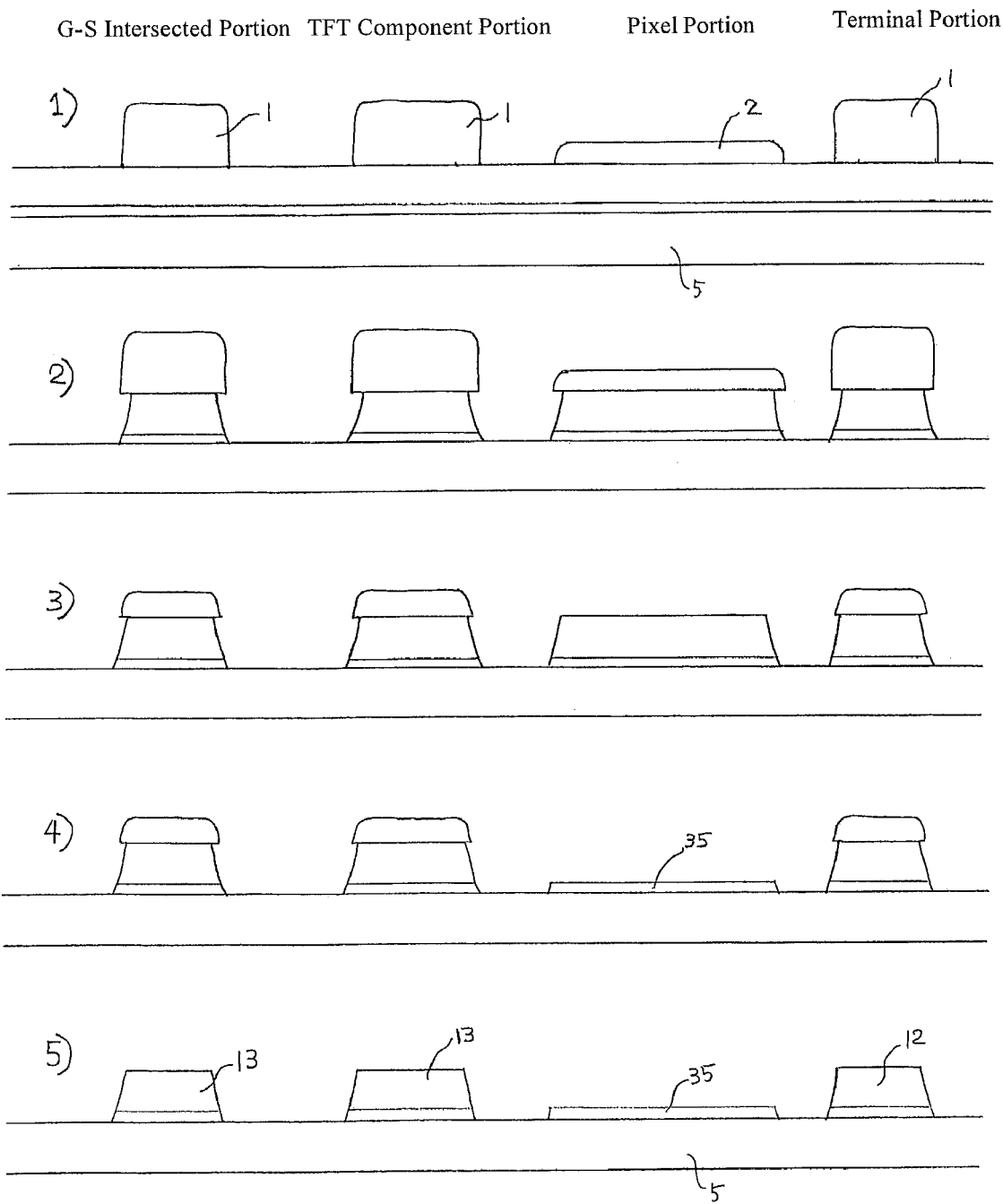
FIG. 84 is a schematic cross-sectional view of a manufacturing process of the previously used halftone exposure method.
Figure 85:
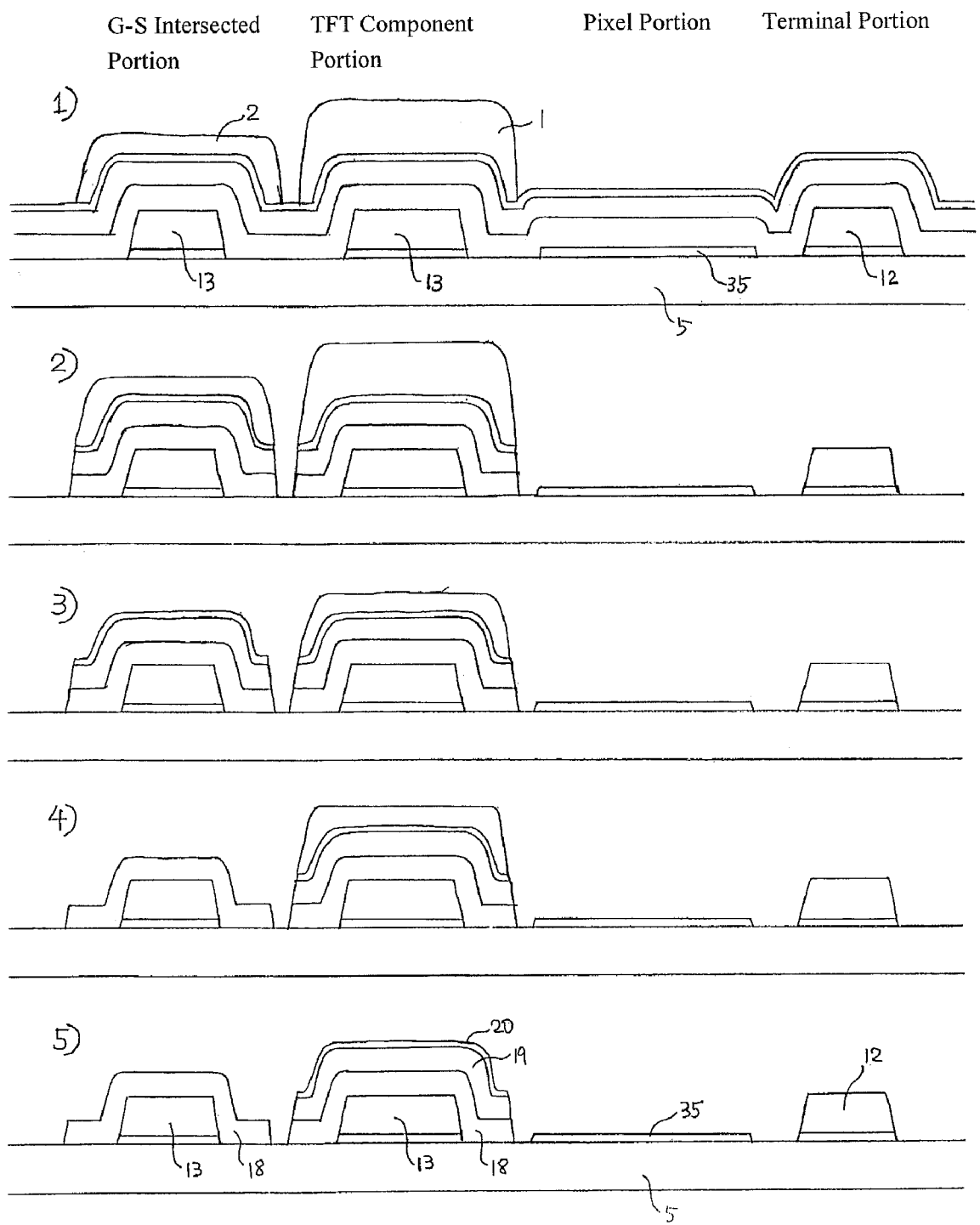
FIG. 85 is a schematic cross-sectional view of a manufacturing process of the previously used halftone exposure method.
Figure 86:
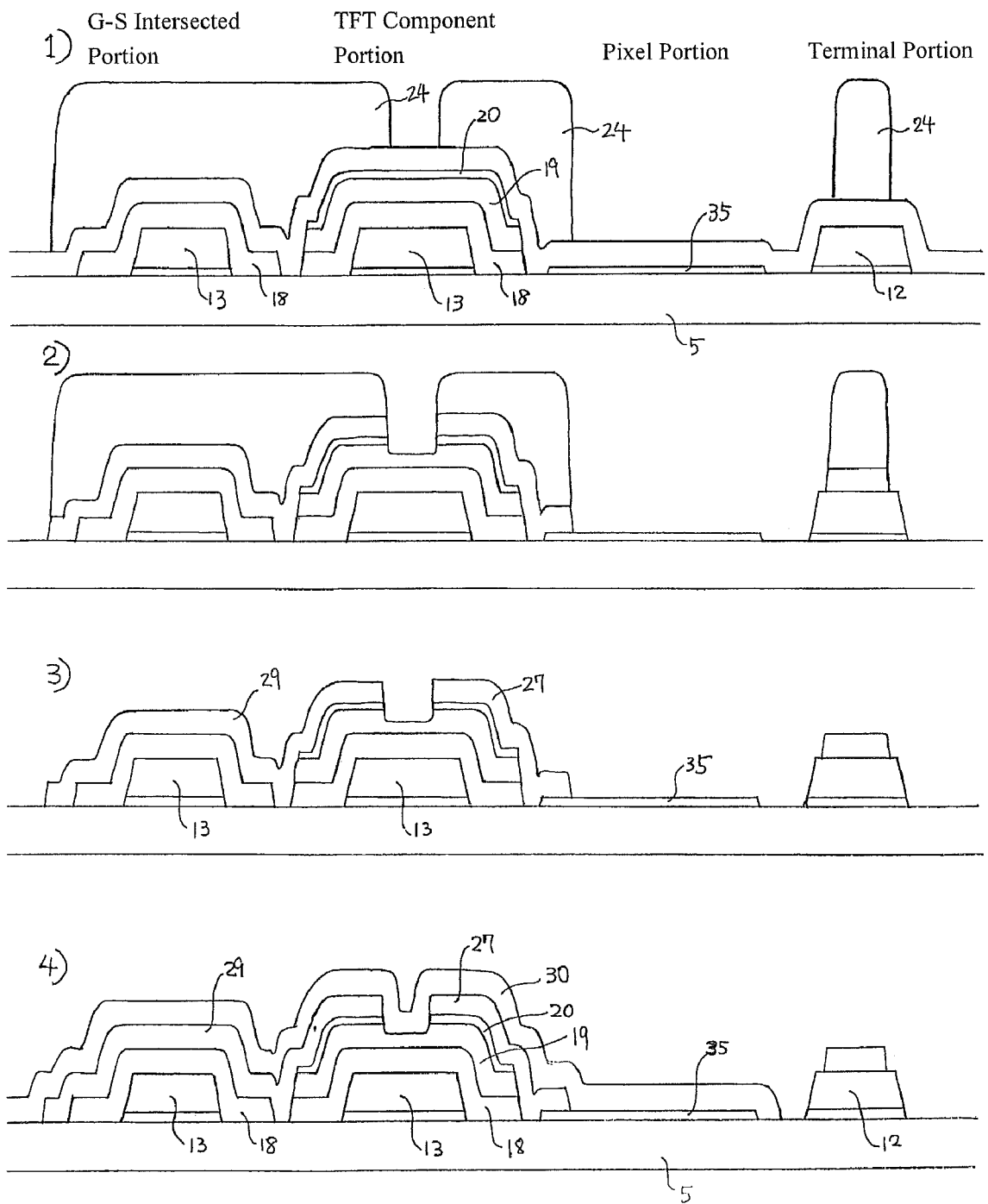
FIG. 86 is a schematic cross-sectional view of a manufacturing process of the previously used halftone exposure method.

A prior art similar to the manufacturing process of the present invention is illustrated in FIGS. 84 to 86, and an oxide transparent conductor (of ITO or IZO series) is used in a transparent pixel electrode. In a manufacturing process as shown in FIG. 84, if a transparent electroconductive film (of indium series) is used for the lower layer, and aluminum alloy is used for the upper layer, a local cell reaction will be produced to reduce and blacken a transparent electroconductive film. Similarly, in a manufacturing process as shown in FIG. 86, aluminum alloy is used in a source electrode and a drain electrode, the local cell reaction will be produced, and thus the prior art is unable to avoid the transparent electroconductive film from being blackened.

In a manufacturing process adopting the prior art as shown in FIGS. 84 and 86, only molybdenum or chromium can be used as the upper layer metal. The metal of molybdenum or chromium has a relatively large electric resistance, and large LCD TV panels cannot use the conventional manufacturing process as shown in FIGS. 84 and 86 for their manufacture. If aluminum alloy is used as the upper layer metal in the conventional manufacturing process as shown in FIGS. 84 and 86, and titanium nitride or zirconium nitride is used in the transparent electroconductive film, no local cell reaction will be produced, but when the manufacturing process as shown in FIG. 85-2 is used for dry etching a gate insulating film, titanium nitride or zirconium nitride is also dry etched at the same time, since no dry etching gas with a high selection ratio exists in the P—SiNx film and titanium nitride or zirconium nitride used in the gate insulating film. To manufacture large LCD TV panels, and avoid local cell reactions produced by using aluminum alloy with a relatively low resistance, a titanium or zirconium thin film (with a film thickness of 5~25 nm) is used in a pixel electrode in accordance with the present invention. To achieve the contact of the drain electrode with the pixel electrode, a contact hole is created on the gate insulating film by dry etching. To increase the selection ratio of the dry etching, an aluminum alloy contact pad is installed in the pixel electrode portion having the contact hole. After a contact hole is created on the surface of the contact pad, an oxygen plasma processing is used for removing the thin positive photoresist left from the halftone exposure. Since the contact hole is exposed in oxygen plasma, the contact hole should not be oxidized easily. Therefore, the present invention as shown in FIG. 2 adopts a nitrogen ion shower doping process. A good contact can be achieved within the range of the circle as shown in FIG. 247. If the pixel electrode adopts a titanium thin film, a nitrogen ion shower doping process is used for forming a titanium nitride thin film, and the transmission rate of visible light can be improved as shown in FIG. 10. If the film thickness of the pixel electrode is greater than 5 nm, a surface electric resistance of less than 30 KΩ can be achieved as shown FIG. 11, and thus the foregoing problem does not exists all.

Embodiment 2

FIG. 248 shows a schematic cross-sectional view of a manufacturing process for forming a pixel electrode by using the halftone exposure method in accordance with Embodiment 2 of the present invention. As shown in FIG. 1-2, two metal films are etched and manufactured to a same pattern. Embodiment 2 of the present invention is shown in FIG. 248-2. Firstly, a metal film of an upper layer is etched selectively as shown in FIG. 248-3, and after an oxygen plasma ashing process is performed to remove the region of a thin positive photoresist left from a halftone exposure, a metal pattern of the upper layer serves as a mask, and the dry etched metal thin film of the lower layer is patterned. After the upper layer metal is selectively etched and exposed, a nitrogen ion shower doping process is performed, and the nitrogen atoms doped on the metal surface of the upper layer of a contact pad portion to provide an oxidation-resisting function. In the meantime, the metal thin film pixel electrode of the lower layer becomes a metal nitride, so as to greatly improve the transmission rate of visible light.

A manufacturing process in accordance with Embodiment 2 of the present invention as shown in FIG. 248 is classified as a Type (Ib) manufacturing process as shown in FIG. 46, and the advantages of the manufacturing process as shown in FIG. 236-2 resides in that the pattern width of the positive photoresist has a small change during the oxygen plasma ashing process manufacturing process. Embodiment 1 is classified as a Type (Ia) manufacturing process as shown in FIG. 46. As shown in FIG. 235-2, the pattern width of the positive photoresist has a large change during the oxygen plasma ashing process manufacturing process.

Embodiment 3

Figure 42:
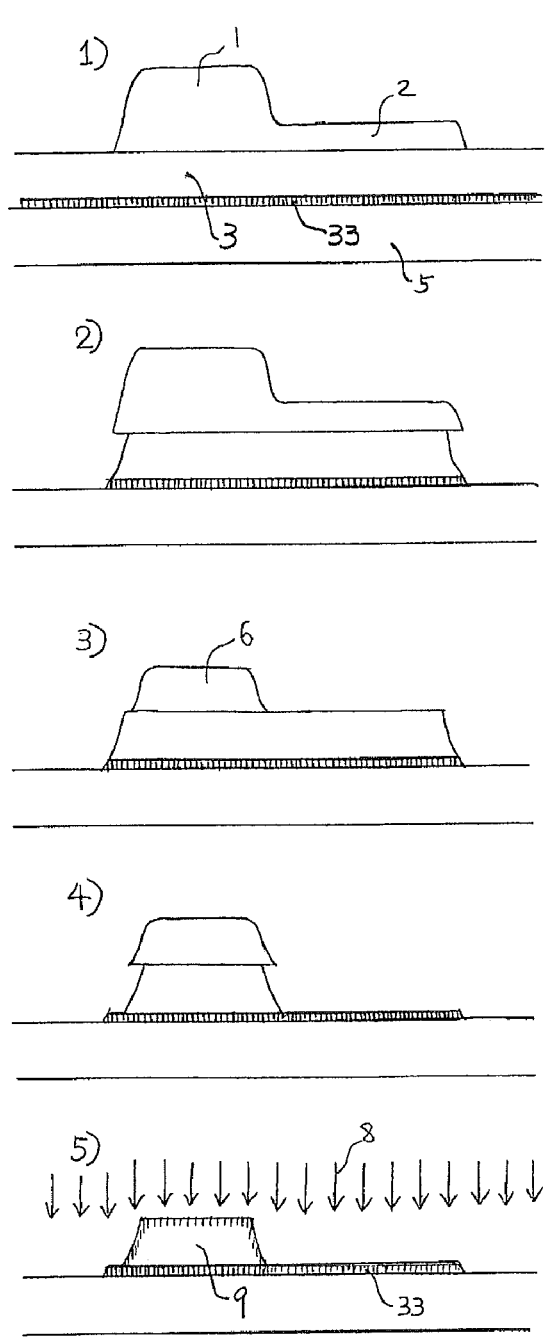
FIG. 42 is a cross-sectional view of a manufacturing processing of forming a pixel electrode by a halftone exposure method in accordance with the present invention.

FIG. 42 shows the cross-sectional view of a manufacturing process of forming a pixel electrode and a contact pad by using a halftone exposure method in accordance with Embodiment 3 of the present invention. This manufacturing process is classified as Type (IIa) manufacturing process as shown in FIG. 46. Aluminum alloy (aluminum-carbon-nickel or aluminum-neodymium-nickel), pure copper, copper alloy (copper-molybdenum or copper-chromium) or silver alloy (silver-copper or silver-palladium) that does not cause Hirox is used as the upper layer metal. The gate electrode and the common electrode of a super large TFT matrix substrate for LCD TV adopt the metal of the aforementioned three systems. The lower layer transparent conducting electrode of the present invention adopts titanium nitride or zirconium nitride, for the reason of: the aforementioned two types of nitride material and aluminum alloy do not cause a local cell reaction (or a Galvanic reaction). Furthermore, both wet etching and dry etching have a large etching selectivity. To prevent the surface of the upper layer metal from being oxidized by the oxygen plasma ashing process, the present invention perform a nitrogen ion shower doping process, and dopes nitrogen atoms on the surface of the contact pad for achieving a good contact.

Embodiment 4

Figure 44:
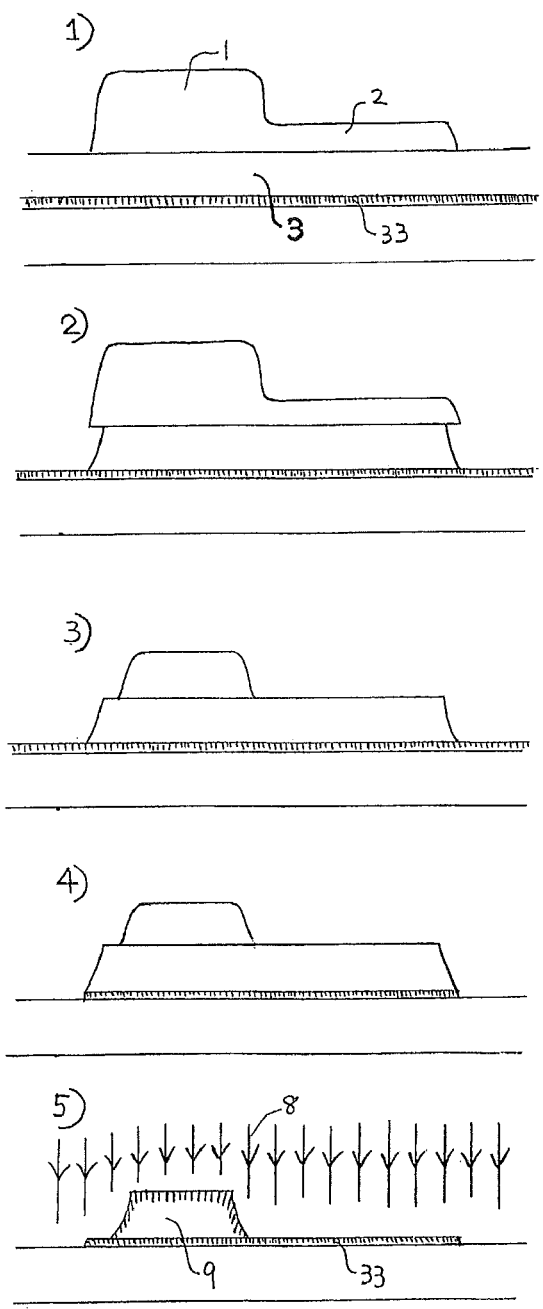
FIG. 44 is a cross-sectional view of a manufacturing process that uses a halftone exposure method to form a pixel electrode in accordance with the present invention.

FIG. 44 shows a cross-sectional view of a manufacturing process of forming a pixel electrode and a contact pad by using the halftone exposure method in accordance with Embodiment 4 of the present invention. Embodiment 3 is shown in FIG. 42-2, and two layers of electrode materials are etched and manufactured into a same pattern. In the present invention as shown in FIG. 44-2, aluminum alloy (aluminum-carbon-nickel or aluminum-neodymium-nickel), pure copper, copper alloy (copper-molybdenum or copper-chromium) or silver alloy (silver-copper or silver-palladium) of the upper layer is selectively etched, and then a halftone exposure is performed as shown in FIG. 44-3 to carry out the oxygen plasma ashing process to remove the region of the remained thin positive photoresist, and then uses the metal pattern of the upper layer as a mask, and dry etches and manufactures a nitride transparent conducting material of titanium nitride or zirconium nitride of the lower layer into a pattern. After the upper layer metal is selectively etched and exposed, a nitrogen ion shower doping process is carried out, and nitrogen atoms are doped on the surface of the upper layer of the contact pad portion to give the oxidation-resisting function.

The manufacturing process of Embodiment 4 of the present invention as shown in FIG. 4 is classified as Type (IIb) manufacturing process of FIG. 46, and the advantages of this manufacturing process as shown in FIG. 236-2 reside in that the change of pattern width of the positive photoresist in the oxygen plasma ashing process manufacturing process is smaller than that of Embodiment 3.

Embodiment 5

FIG. 176 shows a cross-sectional view of a manufacturing process for forming a pixel electrode and a contact pad by using the halftone exposure method in accordance with Embodiment 5 of the present invention. This manufacturing process is classified as Type (IVa) manufacturing process of FIG. 172. In a three-layer structure electrode, titanium or zirconium is used for its lower layer metal, and pure aluminum, pure copper, pure silver is used for its middle layer metal, and molybdenum is used for its upper layer metal. Since pure aluminum, pure copper or pure silver is used for the three-layer structure of Embodiment 5 of the present invention, therefore the resistance of the gate electrode and the common electrode of the TFT matrix substrate for super large LCD TV can be minimized. Since this embodiment of the present invention does not require alloy series metal, therefore the cost of metal target is lowered, and abnormal electric discharges during spluttering and film formation can be reduced, and the yield rate can be improved greatly. The thickness of the titanium or zirconium film formed as the lower layer metal of the pixel electrode is just 5~25 nm, and the thickness of the middle layer metal is 200~600 nm, and the thickness of the upper layer metal is 30~60 nm. The metals adopted in this embodiment do not cause any local cell reaction (or Galvanic reaction). Since the upper layer metal adopts molybdenum, therefore even if exposed in oxygen plasma, a poor contact will not occur. As shown in FIG. 176-2, a nitrogen ion shower doping process is performed to change titanium into titanium nitride, and thus the visible light transmission rate can be improved greatly. When the titanium nitride film thickness is over 5 nm, the surface electric resistance falls below 30 KΩ, which will not cause problem.

Embodiment 6

Figure 43:
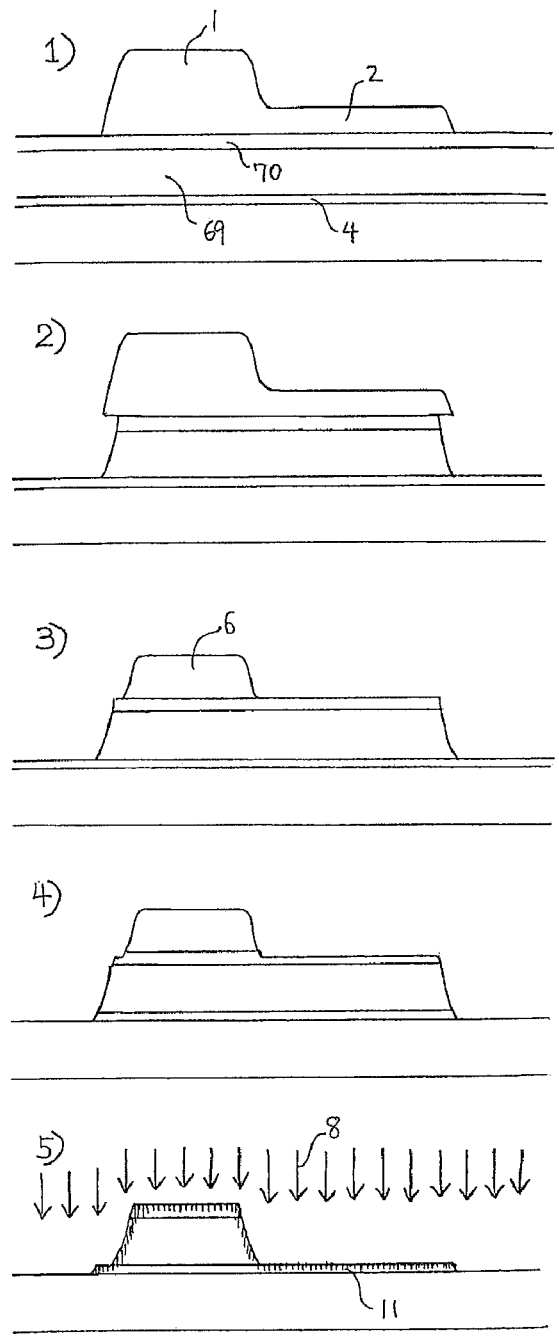
FIG. 43 is a cross-sectional view of a manufacturing process of forming a pixel electrode by a halftone exposure method in accordance with the present invention.

FIG. 43 shows a cross-sectional view of a manufacturing process for forming a pixel electrode and a contact pad by using the halftone exposure method in accordance with Embodiment 6 of the present invention. In Embodiment 5 as shown in FIG. 176-2, three layers of metal are etched and manufactured into a same pattern. This embodiment of the present invention is shown in FIG. 43-2, and firstly, molybdenum of the upper layer, and pure aluminum, pure copper or pure silver of the middle layer are etched simultaneously, and then a halftone exposure is performed as shown in FIG. 43-3, and after an oxygen plasma ashing process is carried out to remove the remained thin positive photoresist region, the metal pattern of the upper layer and middle layer is used as a mask to dry etch the titanium or zirconium of the lower layer to give a pattern. In FIG. 43-4, the film thickness is decreased by dry etching the molybdenum exposed from the upper layer, but the molybdenum exposed from the upper layer can be dry etched completely, After the remained positive photoresist is peeled off as shown in FIG. 43-5, a nitrogen ion shower doping process is performed to change titanium or zirconium of the lower layer into nitride for achieving a good visible light transmission rate.

The manufacturing process in accordance with Embodiment 6 of the present invention is classified as a Type (IVb) manufacturing process as shown in FIG. 172, and the advantages of this manufacturing process is shown in FIG. 236-2, and the change of pattern width of the positive photoresist during the oxygen plasma ashing process manufacturing process is smaller than that of Embodiment 5.

Embodiment 7

FIG. 177 shows a cross-sectional view of a manufacturing process of forming a pixel electrode and a contact pad by using a halftone exposure method in accordance with Embodiment 7 of the present invention. This embodiment of the present invention is classified as a Type (Va) manufacturing process of FIG. 173. In a three-layer structured electrode, a metal nitride transparent electrode material such as titanium nitride or zirconium nitride is used for the transparent electrode material of its lower layer, and pure aluminum, pure copper or pure silver is used for its middle layer metal, and molybdenum is used for its upper layer metal.

In the three-layer structure, even if pure aluminum is used, the occurrence of Hirox still can be prevented. Even if pure copper is used, the bonding force of the substrate will not be lowered. Even if pure silver is used, the diffusion of the silver towards the substrate can be prevented. Therefore, this embodiment increases the degree of freedom for selecting metal materials.

When a pure metal is used, the quality of spluttering object will not be changed, so as to give a better recurrence for film formation, and significantly reduce the occurrence of abnormal electric discharges during spluttering and film formation, and thus improving the yield rate. In FIGS. 10 and 11, if the metal nitride transparent electrode material of the lower layer is titanium nitride, the manufacturing process just requires a film thickness of over 5 nm to obtain sufficient surface electric resistance and visible light transmission rate. When the titanium nitride thin film is formed, the following method can be adopted. The method comprises the steps of using titanium nitride as the spluttering object and mixing a small amount of nitrified gas (1~5%) into argon gas for puttering film and formation; and using titanium as the spluttering object and mixing a nitrified gas (10~30%) in argon gas for sputtering and film formation. The nitrified gas is nitrogen ($N_2$), ammonia ($NH_3$), hydrazine or dydrazone. Embodiment 7 of the present invention is shown in FIG. 177-5. Since molybdenum exists on the surface of the contact pad, therefore the surface oxidation of the middle layer metal only takes place at the sidewall portion, and thus will not cause any problem of having a poor contact with the drain electrode, and the nitrogen ion shower doping process is no longer needed.

Figure 9:
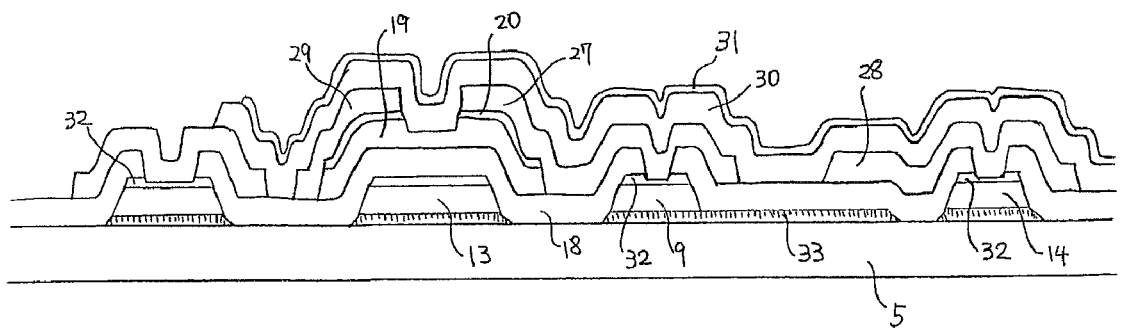
FIG. 9 is a cross-sectional view of forming a TFT matrix substrate in accordance with the present invention.

FIG. 9 shows a cross-sectional view of a manufacturing process of a TFT matrix substrate in accordance with the present invention as shown in FIG. 177. In FIG. 9, molybdenum at the contact hole portion is dry etched to a smaller thickness. Even if molybdenum at the contact hole portion is dry etched completely as shown in FIG. 239, the molybdenum sidewall and drain electrode can be connected without any poor contact issue.

Embodiment 8

Figure 45:
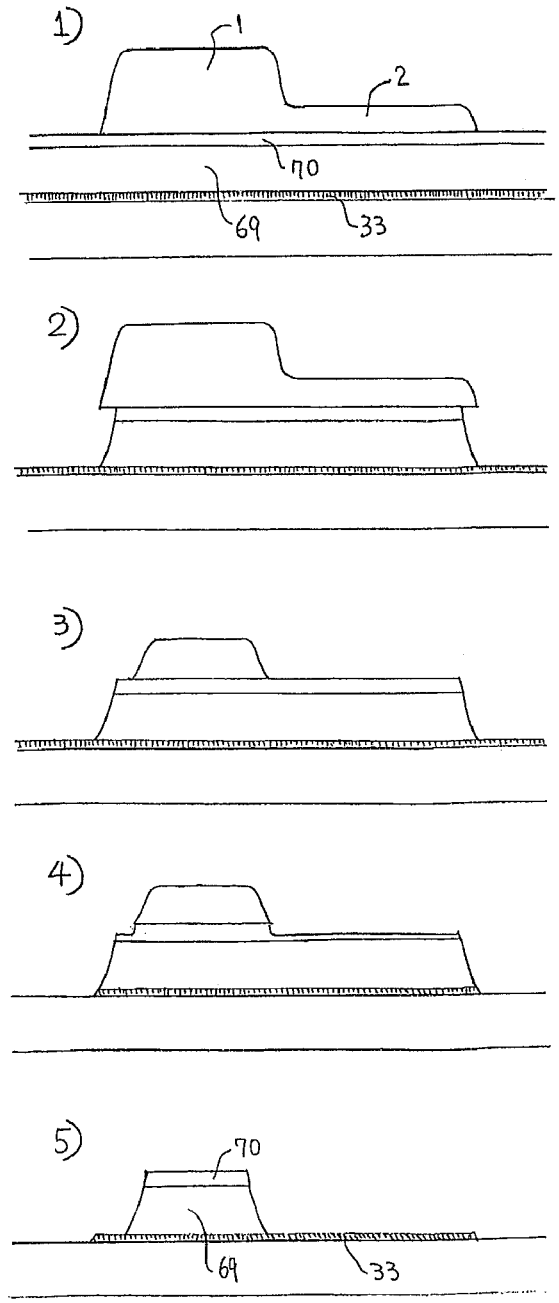
FIG. 45 is a cross-sectional view of a manufacturing process that uses a halftone exposure method to form a pixel electrode in accordance with the present invention.

FIG. 45 shows a cross-sectional view of a manufacturing process of forming a pixel electrode and a contact pad by using a halftone exposure method in accordance with Embodiment 8 of the present invention. Embodiment 7 is shown in FIG. 177-2, and the three layers of metal nitride and metal are etched and manufactured into a same pattern. This embodiment of the present invention is shown in FIG. 45-2, and firstly, molybdenum of the upper layer and pure aluminum, pure copper or pure silver of the middle layer are etched simultaneously as shown in FIG. 45-3, and a halftone exposure is carried out, and an oxygen plasma ashing process is performed to remove the remained thin positive photoresist region, and then the pattern of the upper layer metal and the middle layer metal serves as a mask for dry etching the metal nitride of the lower layer into a pattern. In FIG. 45-4, the film thickness is decreased by dry etching the molybdenum exposed from the upper layer, but the molybdenum exposed from the upper layer can be dry etched completely. Embodiment 8 of the present invention is shown in FIG. 45-5. Since molybdenum exists on the surface of the contact pad, therefore the surface oxidation of the middle layer metal only takes place at the sidewall portion, and thus there is no problem of having a poor contact with the drain electrode poor contact, and the nitrogen ion shower doping process is no longer needed.

The manufacturing process in accordance with Embodiment 8 of the present invention as shown in FIG. 45 is classified as a Type (Vb) manufacturing process as shown in FIG. 173, and the advantages of the manufacturing process as shown in FIG. 236-2 reside in that the change of pattern width of the positive photoresist during the oxygen plasma ashing process manufacturing process is smaller than that of Embodiment 7. Even this embodiment of the present invention is used, the TFT matrix substrate having a cross-sectional structure as shown in FIG. 9 and similar to the structure as shown in Embodiment 7 can be manufactured. In FIG. 9, molybdenum at the contact hole portion is dry etched to a smaller thickness, but no poor contact occurs even if the molybdenum at the contact hole portion is dry etched. Therefore, the sidewall and the drain electrode of molybdenum can be connected as shown in FIG. 239.

Embodiment 9

Figures 105, 106:
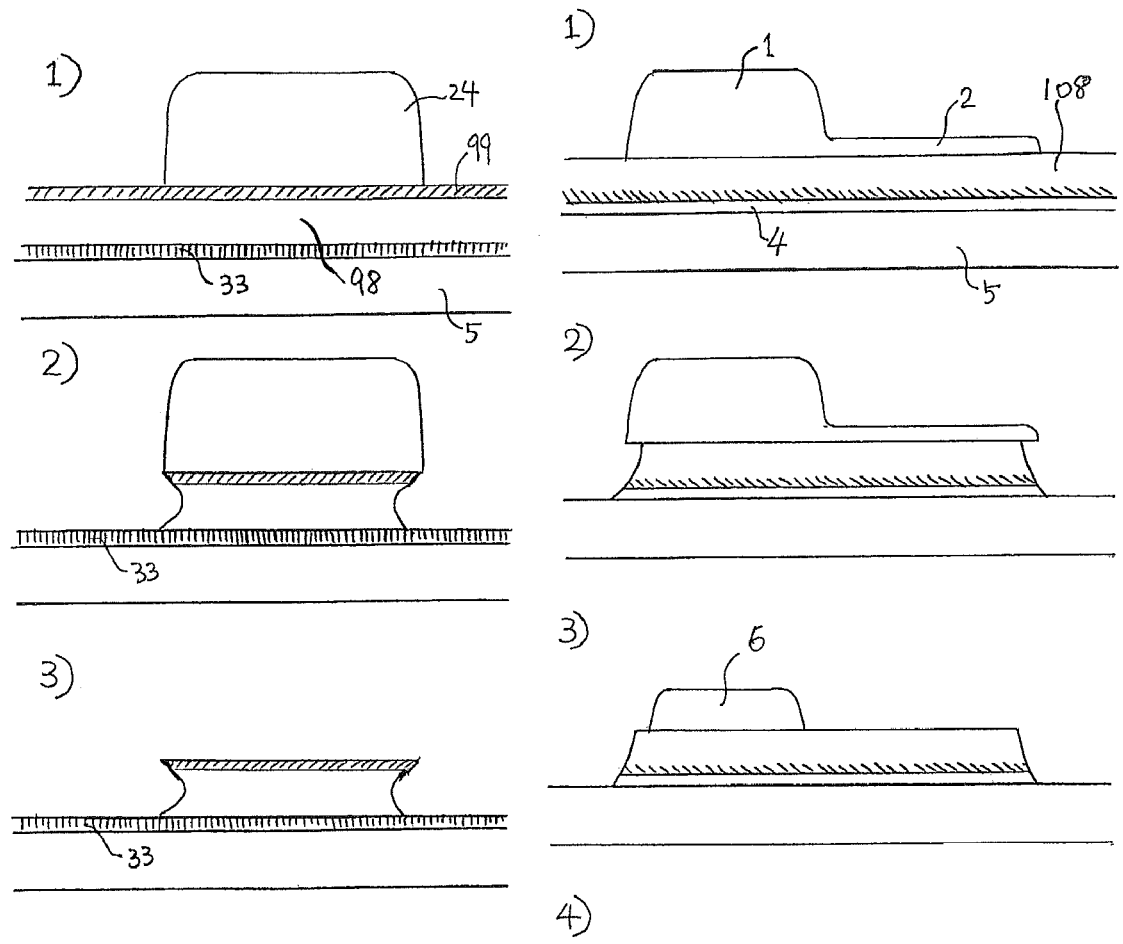
FIG. 105 is a cross-sectional view of an etching shape of an aluminum alloy electrode when an aluminum nitride layer is formed on the foregoing surface.
FIG. 106 is a cross-sectional view of a manufacturing process that uses a halftone exposure method to form a pixel electrode in accordance with the present invention.

FIG. 106 shows a cross-sectional view of a manufacturing process of forming a pixel electrode and a contact pad by using a halftone exposure method in accordance with Embodiment 9 of the present invention. This embodiment of the invention is classified as a Type (Ia) manufacturing process of FIG. 46. The manufacturing process of this embodiment is substantially the same as that of Embodiment 1, and the difference resides on that: when the upper layer metal film is formed, a nitrified gas (several %) used for spluttering is mixed with an inert gas, and the interface region of the lower layer metal and the upper layer metal is doped with nitrogen atoms. With an interface doped with several nm of nitrogen, the etching rate in the interface region area is retarded, so as to produce a pattern of the upper layer metal into a regular conical shape. In general, different types of metals at the joint interface region area diffuse with each other when these metals are stacked, and the etching rate tends to become larger. If the etching rate at the joint interface region is not controlled to a smaller etching rate, then the pattern will be in an inverted conical shape. The gate electrode or common electrode in the inverted conical shape will easily cause a short circuit to the source electrode or drain electrode, and the breakdown voltage becomes significantly lower. As a result, the yield rate is poor, and such manufacturing process cannot be used for mass production. With nitrogen atoms doped on the joint interface, the etching rate can be controlled in an acceptable range for the manufacture to provide the best regular conical shape. Since the lower layer metal adopts titanium or zirconium, therefore the visible light transmission rate can be improved. After the pattern is completed, a nitrogen ion shower doping process is carried out. In the meantime, the surface of the contact pad is nitrified to provide the oxidation-resisting function.

Embodiment 10

FIG. 112 shows a cross-sectional view of a manufacturing process for forming a pixel electrode and a contact pad by using a halftone exposure method in accordance with Embodiment 10 of the present invention. This embodiment of the present invention is classified as a Type (Ib) manufacturing process of FIG. 46. The manufacturing process of this embodiment is substantially the same as Embodiment 2, and the difference resides on that: when the upper layer metal film is formed, a nitrified gas (several %) used for spluttering is mixed with an inert gas, and the interface region of the lower layer metal and the upper layer metal is doped with nitrogen atoms. With an interface doped with several nm of nitrogen, the etching rate in the interface region area is retarded as shown in FIG. 112-2, and the upper layer metal is selectively etched and manufactured into a regular conical shape. Since the lower layer metal adopts titanium or zirconium, therefore the visible light transmission rate can be improved. After the pattern is completed, a nitrogen ion shower doping process is carried out. In the meantime, the surface of the contact pad is nitrified to provide the oxidation-resisting function. Compared with Embodiment 9, Embodiment 10 as shown in FIG. 236-2 features the advantage of having a small change of pattern width of the positive photoresist during the oxygen plasma ashing process manufacturing process.

Embodiment 11

FIG. 114 shows a cross-sectional view of a manufacturing process of forming a pixel electrode and a contact pad by using a halftone exposure method in accordance with Embodiment 11 of the present invention. This embodiment of the invention is classified as a Type (IIa) manufacturing process as shown in FIG. 46, which is substantially the same as the manufacturing process of Embodiment 3. The difference resides on that: when the upper layer metal film is formed, a nitrified gas (several %) used for splputtering is mixed with an inert gas, and nitrogen atoms are doped on the interface region of a metal nitride transparent conductor of the lower layer metal and the upper layer metal. With the interface doped with several nm of nitrogen, the etching rate in the interface region area is retarded, and the pattern upper layer metal is manufactured into a regular conical shape. With the gate electrode or common electrode manufactured into a regular conical shape, a short circuit will not occur easily at the source electrode or drain electrode, so as to improve the breakdown voltage as well as the yield rate. With nitrogen atoms doped on the joint interface, the etching rate can be controlled to a lower rate to give a regular conical shape. After the pattern is completed, a nitrogen ion shower doping process is performed to the surface of the contact pad for nitrification to providing the oxidation-resisting function.

Embodiment 12

FIG. 113 shows a cross-sectional view of a manufacturing process of forming a pixel electrode and a contact pad by using a halftone exposure method in accordance with Embodiment 12 of the present invention. This embodiment of the invention is classified as a Type (IIb) manufacturing process of FIG. 46, which is substantially the same as the manufacturing process of Embodiment 4. The difference resides on that: when the upper layer metal film is formed, a nitrified gas (several %) used for splputtering is mixed with an inert gas, and nitrogen atoms are doped on the interface region of a metal nitride transparent conductor of the lower layer metal and the upper layer metal. With an interface doped with several nm of nitrogen, the etching rate in the interface region area is retarded as shown in FIG. 113-2. The upper layer metal can be selectively etched and manufactured into a regular conical shape. After the pattern is completed, a nitrogen ion shower doping process is performed to the surface of the contact pad for nitrification to providing the oxidation-resisting function. Compared with Embodiment 11, Embodiment 12 as shown in FIG. 236-2 features the advantages of having a small change of pattern width of the positive photoresist during the oxygen plasma ashing process manufacturing process.

When the aluminum alloy film of the upper layer in accordance with Embodiments 3, 4, 11 and 12, a nitrified gas is mixed into an inert gas for splputtering after the film formation, and nitrogen atoms are doped on aluminum alloy to provide an oxidation-resisting function to the surface of the film. However, the etching rate at the region on the surface doped with nitrogen atoms becomes smaller when the foregoing procedure is adopted. As shown in FIG. 105, the etching rate at the region on the surface doped nitrogen atoms becomes lower to provide an inverted conical shape. The gate electrode or common electrode in an inverted conical shape may cause a short circuit to the source electrode or drain electrode easily, and the breakdown voltage becomes significantly lower. As a result, the yield rate is poor, and such manufacturing process cannot be used for mass production. To solve this problem, Embodiments 3, 4, 11, 12 of the present invention perform a nitrogen ion shower doping process after the manufacture of the electrodes in a regular conical shape is completed, so that the aluminum alloy surface of the upper layer has the oxidation-resisting function.

Embodiment 13

Figure 7:
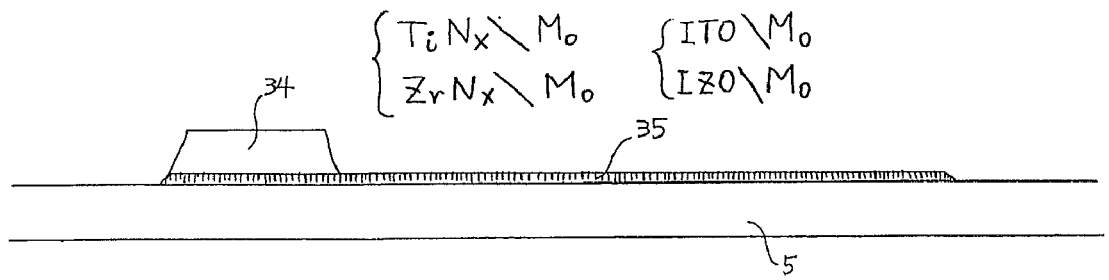
FIG. 7 is a cross-sectional view of a structure of a pixel electrode formed by using a halftone exposure method in accordance with the present invention.
Figure 8:
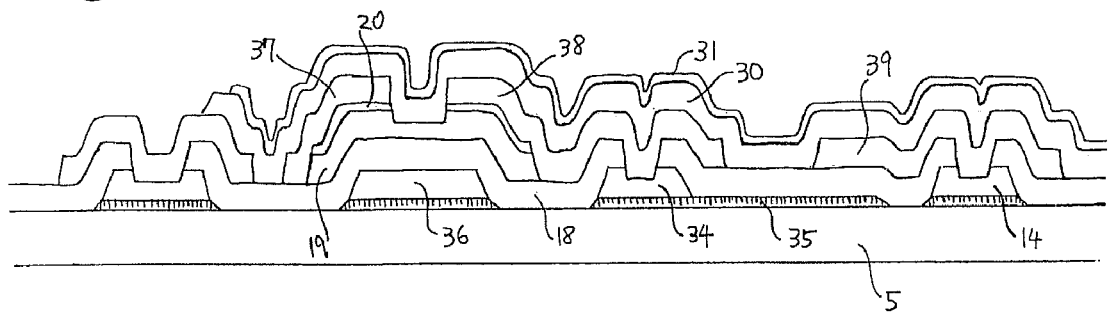
FIG. 8 is a cross-sectional view of forming a TFT matrix substrate in accordance with the present invention.

FIG. 7 shows a cross-sectional view of a pixel electrode of a contact pad manufactured by a halftone exposure method in accordance with Embodiment 13 of the present invention. The present invention adopts Type (IIIa) manufacturing process or Type (IIIb) manufacturing process of FIG. 172, or Type (IIa) manufacturing process or Type (IIb) manufacturing process for the manufacture. The contact pad adopts molybdenum. The gate electrode or common electrode also adopts molybdenum metal. Due to the resistance issue, such manufacturing process cannot be used for manufacturing large LCD panels of LCD TV, but it can be used very well in the manufacturing the LCD panels for the 15-inch PC screen. Even if the indium oxide (ITO or IZO) transparent conductor and molybdenum are stacked for the wet etching, no local cell reaction (or Galvanic reaction) occurs, and a selective etching can be performed. Therefore, this manufacturing process can be used for mass production. FIG. 8 shows a cross-sectional view of manufacturing a TFT substrate by using the present invention. In FIGS. 7 and 8, the contact pad made of molybdenum exists on the pixel electrode portion, and thus no poor contact between the drain electrode and the contact pad occurs. Even if titanium nitride or zirconium nitride is used for the material of the transparent pixel electrode, there is a contact pad made of molybdenum with a large film thickness, and thus poor penetration will not occurs even when there is a contact hole.

Embodiment 14

FIGS. 178, 182 and 183 show schematic and cross-sectional view of a manufacturing process in accordance with Embodiment 14 of the present invention.

In the conditions of Embodiment 1, a second photolithographic process of three times of a photolithographic process as shown in FIGS. 38 to 40, 77 to 79, 82 and 83 is used for forming a silicon semiconductor component separation and a contact pad in a pixel electrode on a contact hole, but the contact hole of Embodiment 1 as shown in FIG. 47 is dry etched completely. If the contact hole is dry etched completely, the metal surface of the contact pad portion will be exposed. Therefore, when the second manufacturing process uses oxygen plasma to ash and remove the thin remained positive photoresist region, the contact pad portion exposed from the metal surface is also exposed to the oxygen plasma for a long time. Aluminum alloy will be oxidized easily. In the condition of increasing the resistance at the surface of the metal oxide by oxidation, a poor contact may result easily in the manufacturing process of FIG. 47. If the contact pad is composed of aluminum alloy, a nitrogen ion shower doping process is performed, and nitrogen atom is doped on the surface of the aluminum alloy contact pad to improve oxidation resistance. However, the foregoing method is not effective for aluminum alloy in all regions. Sometimes, a poor contact may occur due to different conditions of the oxygen plasma ashing process. In a manufacturing process of the present invention as shown in FIG. 178 does not dry etch the contact hole portion completely, but it keeps a small amount of gate insulating film (P—SiNx) to prevent the surface of the contact pad being oxidized in the oxygen plasma ashing process. In FIG. 183-1, the gate insulating film (P—SiNx) remained on the upper layer of the contact pad portion is also dry etched and removed, while the non-doped semiconductor layer and the doped ohmic contact semiconductor layer are being formed on the gate insulating film by dry etching. Now, the dry etching method as shown in FIG. 182-4 can adopt fluorine-series gases to achieve an etching rate substantially equal to that for the gate insulating film of the exposed semiconductor layer and exposed contact hole portion. After the gate insulating film of the contact hole portion on all regions of the substrate is diy etched completely, the dry etching gas is switched to a high-selectivity gas of mixed fluorine-series gases and chlorine-series gases. The dry etching method with two steps etches the semiconductor layer only. The foregoing dry etching method is illustrated in FIG. 138-1.

Since the active matrix TFT substrate of LCD TV comes with a strong intensity of backlight, therefore a leak current occurs drastically when the thin film semiconductor is squeezed out from the layer gate electrode as shown in FIG. 4-2, the thin film transistor component breaks open by the light. The method of suppressing the foregoing phenomenon as shown in FIG. 183-1 is designed in a way of preventing the thin film semiconductor is squeezed out from the layer gate electrode. A good effect is achieved, provided that the sidewalls of the thin film semiconductor layer must be insulated first, and then the thin film semiconductor layer, the source electrode and the drain electrode are in a Schotty connection status. Even if the thin film transistor component breaks open, the leak current will not be reduced. In the embodiment of the present invention as shown in FIG. 183-2, nitrogen ions are doped in directions inclined to left and right sides, and a silicon nitride layer is formed on the sidewalls of the thin film semiconductor layer. Nitrified gases can also be used for the plasma nitrification of the sidewalls of the thin film semiconductor. With the aforementioned sidewall nitrification, leak currents can be reduced to achieve a high-brightness LCD TV.

Embodiment 15

FIGS. 180, 184 and 185 are schematic view and cross-sectional view of a manufacturing process in accordance with Embodiment 15 of the present invention.

The present invention forms a gate insulating film and a non-doped semiconductor layer to obtain a doped ohmic contact semiconductor layer and the four layers of films covered on the metal layer is unlike Embodiment 14. In FIG. 174, four layers of films are formed, but since the contact hole is dry etched completely as shown in FIG. 174, therefore such surface is oxidized easily. For a contact pad made of aluminum alloy, an oxygen plasma ashing process is performed to form aluminum oxide insulator on the surface, and thus a poor contact may result. Similarly, a contact hole is formed incompletely as shown in FIGS. 180 and 178, and a gate insulating film of 5~200 nm is remained on the contact pad.

Before the positive photoresist is peeled off in Embodiment 14 as shown in FIG. 183-2, a nitrogen ion shower doping process is carried out to nitrify the sidewalls of the thin film semiconductor layer, and thus it is very difficult to peel off the positive photoresist. However, in the present invention as shown in FIG. 185-2, the nitrogen ion shower doping process takes place after the positive photoresist is peeled off, and thus the remained residues of the positive photoresist will not cause a problem. Since titanium, zirconium or molybdenum is used as the covering metal, therefore no poor connection of the source electrode and the drain electrode metal nitride will occur, even if the metal oxide is formed on the surface.

Embodiment 16

FIGS. 37, 36 and 169 show planar views and a planar view of an enlarged portion of a main seal periphery in accordance with Embodiment 16 of the present invention. A main seal with liquid crystal cell is formed on an internal side of the P—SiNx passivation film of the TFT substrate, and alignment film is formed on the internal side of the main seal. The static charge protection circuit of this embodiment of the invention is also installed on the internal side of the main seal, but it is not necessary to install it on the internal side of the main seal. Any region other than the main seal region and situated on the external side of the main seal and covered by the passivation film can be used for installing the static charge protection circuit.

Figure 34:
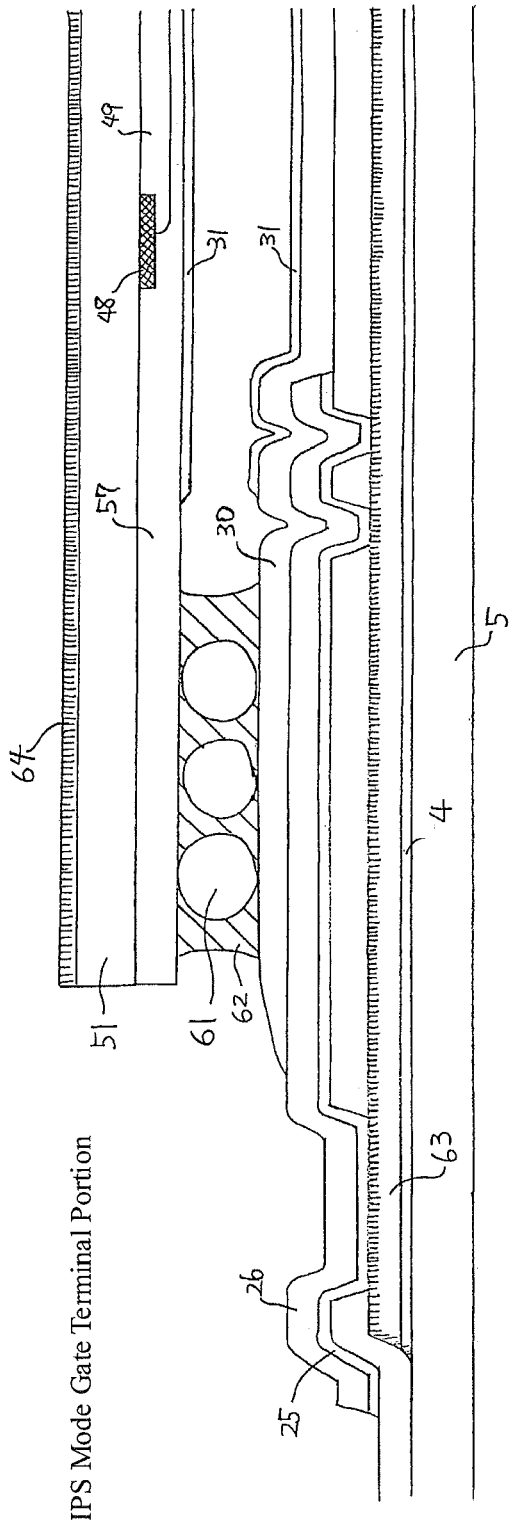
FIG. 34 is a cross-sectional view of a gate terminal portion and a main seal region of an IPS mode LCD panel in accordance with the present invention.
Figure 35:
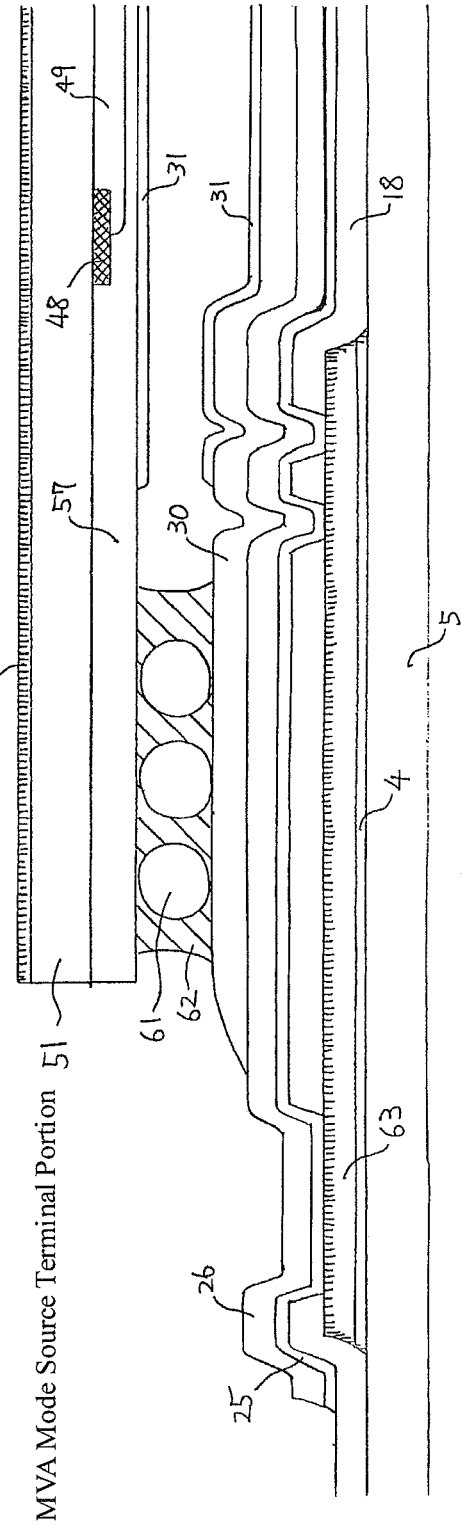
FIG. 35 is a cross-sectional view of a gate terminal portion and a main seal region of an IPS mode LCD panel in accordance with the present invention.

FIGS. 32 to 35, 167, 168 show cross-sectional views of an enlarged portion of a main seal region and a terminal of FIG. 36. FIGS. 170 and 171 show cross-sectional views of an enlarged portion of a main seal region and a virtual terminal of FIG. 169. To make the cell gap of the liquid crystal displayed on the entire region to be a consistent value, the coating regions of the main seal constitute a stack structure with same thin films. In FIGS. 34 and 35, titanium nitride or zirconium nitride is used in a static charge screening transparent electroconductive film on the IPS mode color filter substrate. After a titanium or zirconium thin film (5~20 μm) is formed, a nitrogen ion shower doping method used for sputtering or a method of changing a metal nitride for improving the transparency, reaction and sputtering can be used for forming the metal nitride film directly.

Figure 49:
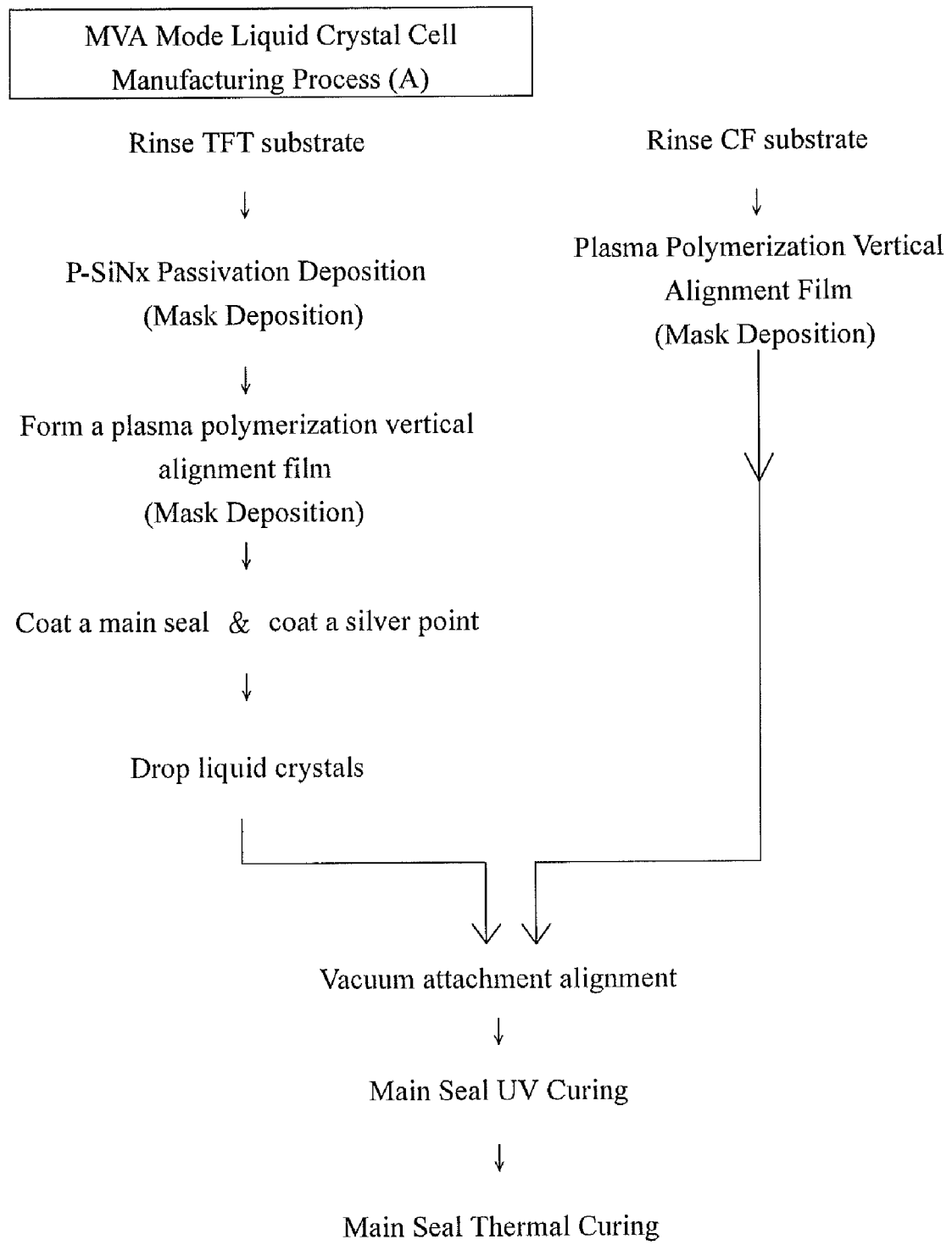
FIG. 49 in is a schematic view of a manufacturing flow of a MVA mode liquid crystal cell in accordance with the present invention.
Figure 51:
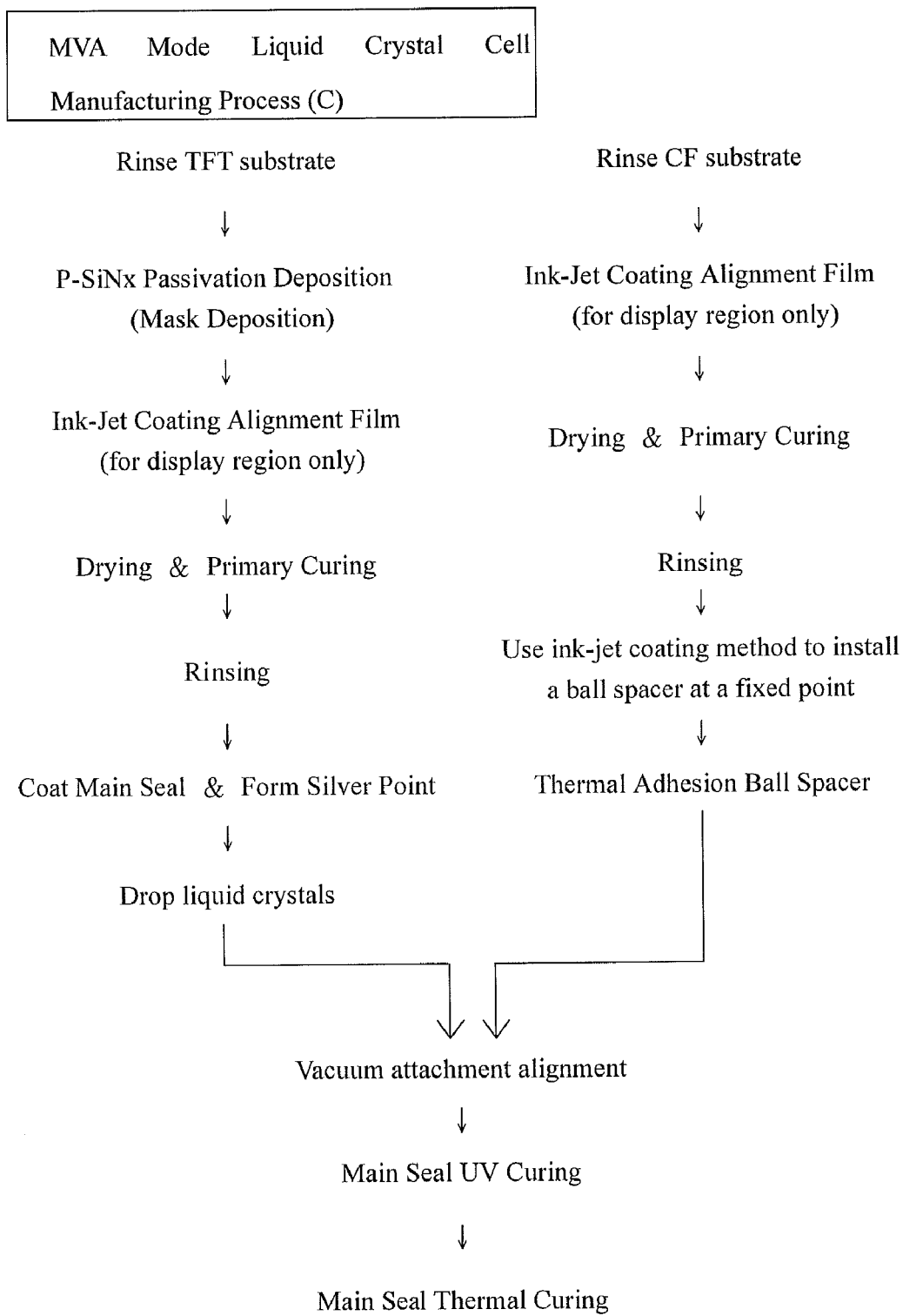
FIG. 51 is a schematic view of a manufacturing flow of a MVA mode liquid crystal cell in accordance with the present invention.

In FIG. 37, a method of forming a P—SiNx passivation film in a local region adopts a mask deposition method. FIGS. 49 and 51 show the flows of a MVA mode liquid crystal cell manufacturing process. In FIG. 49, a P-CVD method is used for forming a passivation film and a vertical alignment film by using a device with multiple processing chambers as shown in FIG. 59, and maintaining a vacuum condition for a continuous film formation. When the P-CVD method is used for forming the alignment film as shown in FIG. 49, it is not necessary to dry the solvent. With the heat treatment for the curing and the rinsing after the thermal curing, the manufacturing process can be simplified. When the alignment film is formed by the P-CVD method, no pin hole or uniform film (that results in uniform display) will occur, and the raw material gases are of low cost, and thus the invention can greatly improve the yield rate and lower the cost. The raw material gases used for forming the vertical alignment film are compounds having the chemical structural formula as shown in FIGS. 60 and 61. The coating materials used for forming the vertical alignment film are polymers with the structure as shown in FIG. 234.

Figure 50:
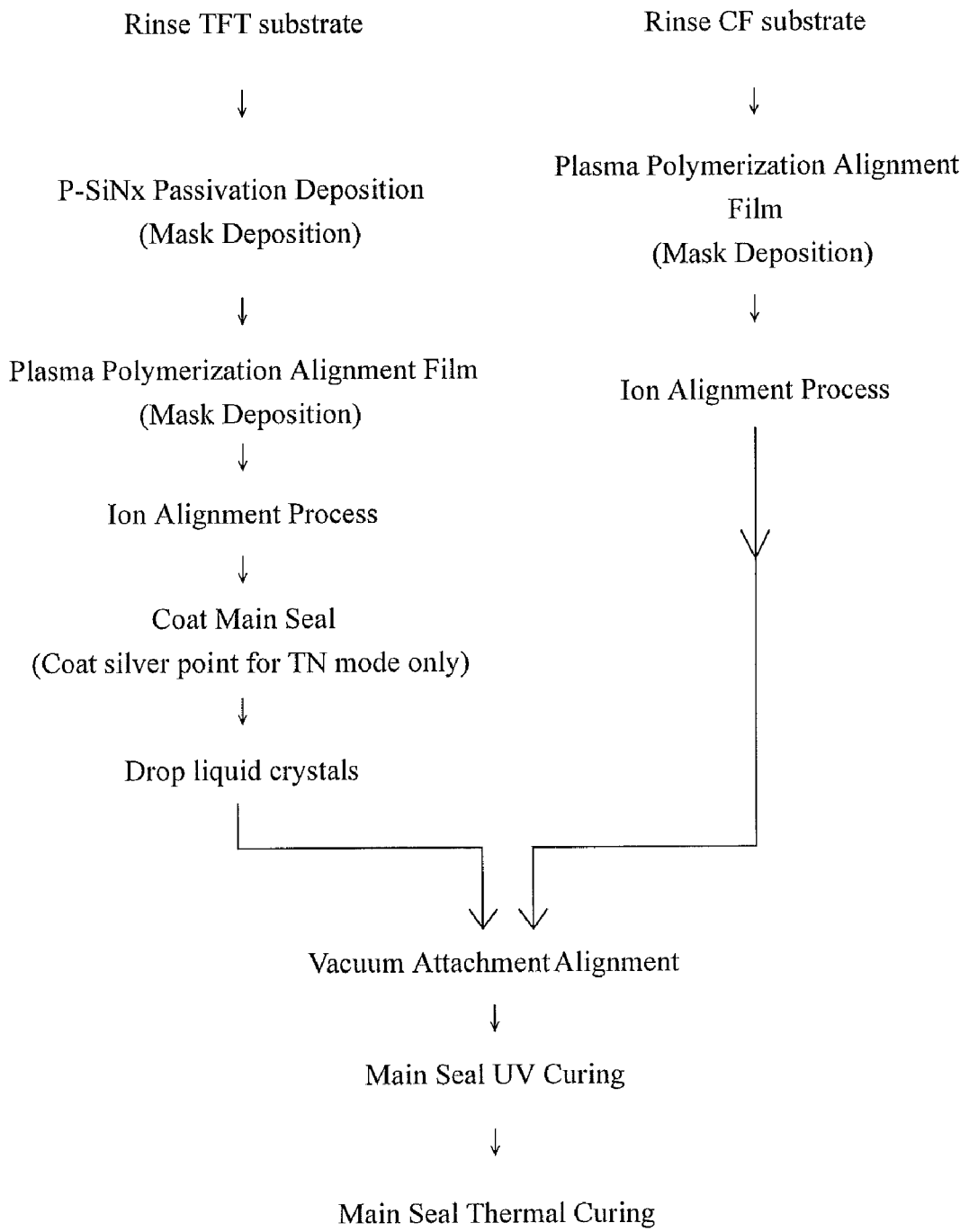
FIG. 50 is a schematic view of a manufacturing flow of an IPS mode (or FFS mode) liquid crystal cell in accordance with the present invention.
Figure 52:
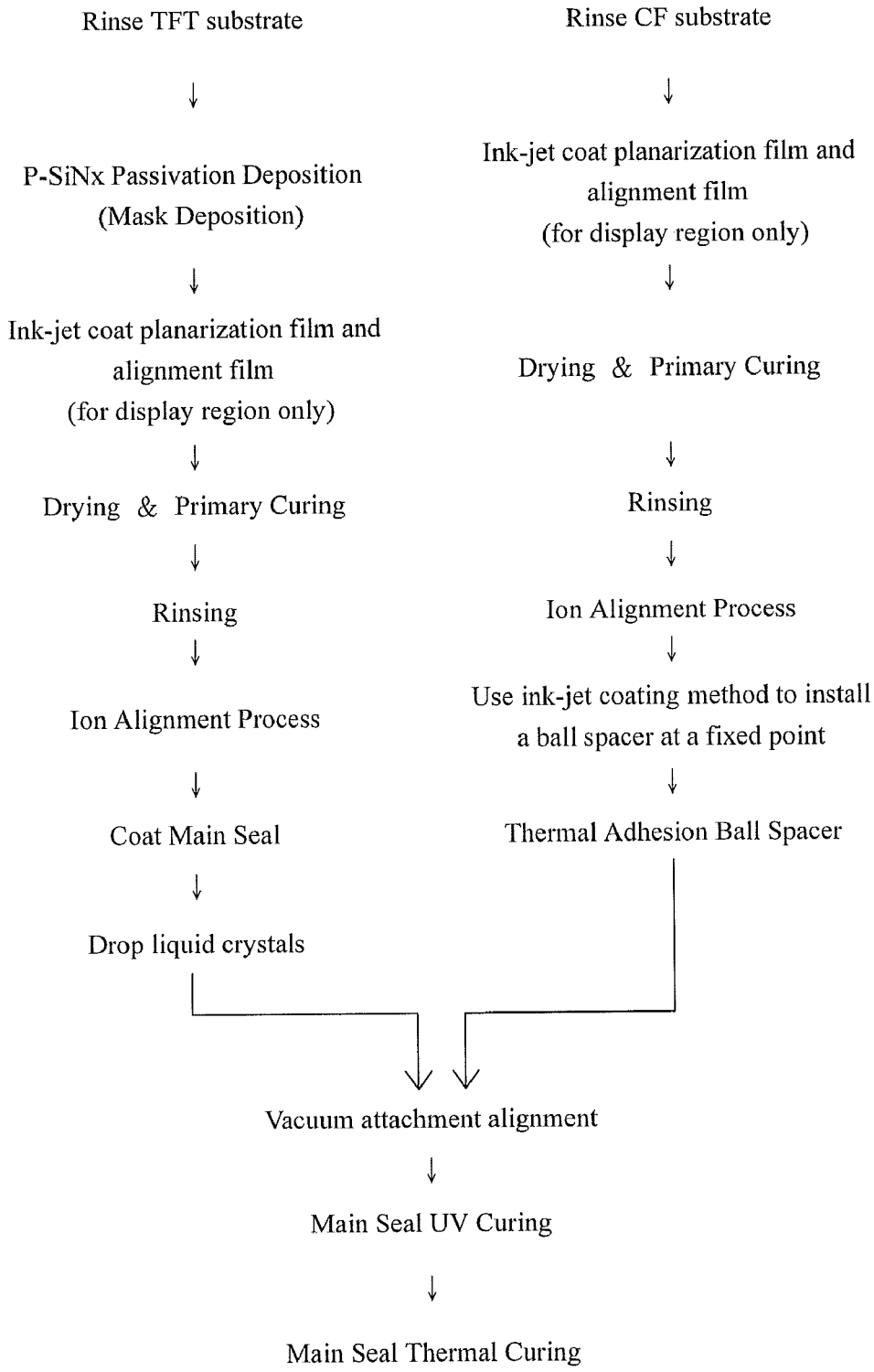
FIG. 52 is a schematic view of a manufacturing flow of an IPS mode (or FFS mode) liquid crystal cell in accordance with the present invention.
Figures 57, 58:
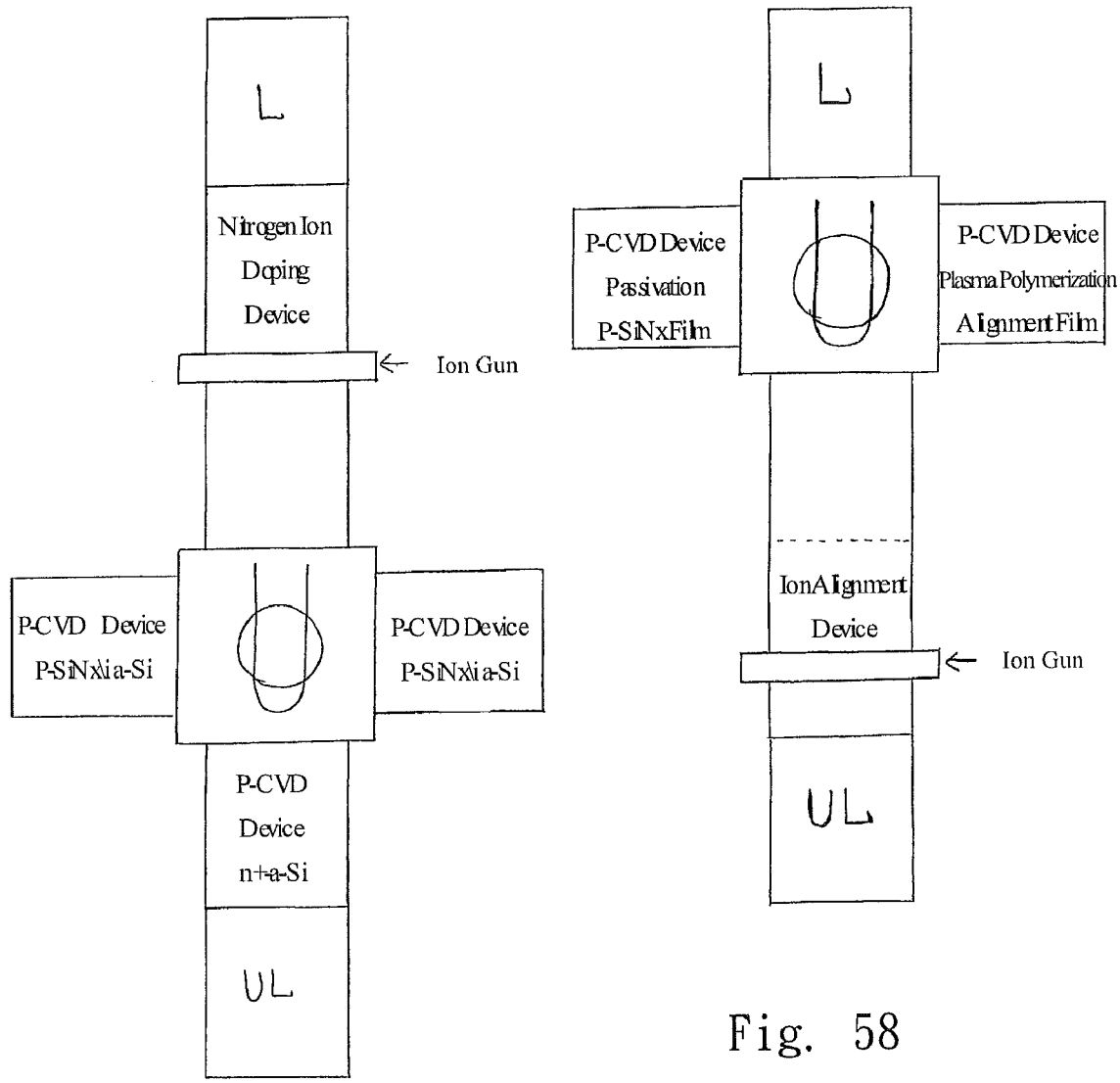
FIG. 57 is a planar view of a multi-processing chamber type vacuum device in accordance with the present invention.
FIG. 58 is a planar view of a multi-processing chamber type vacuum device in accordance with the present invention.
Figure 62:
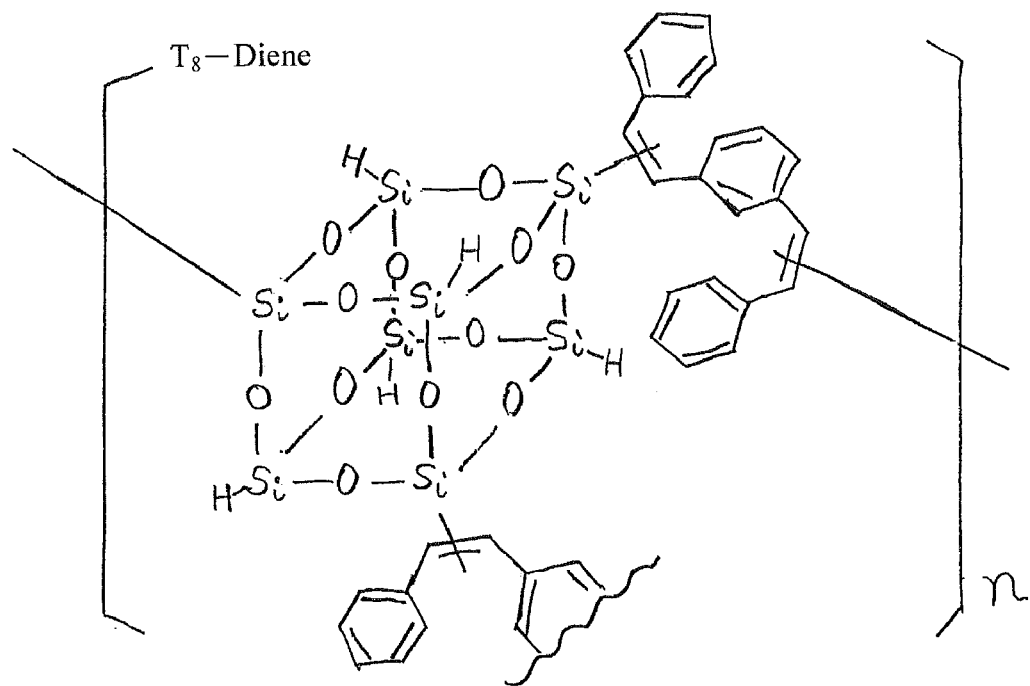
FIG. 62 shows a series of silsesquioxane compounds coated with a planarization film as well as an alignment film by an ink-jet coating device in accordance with the present invention.
Figure 63:
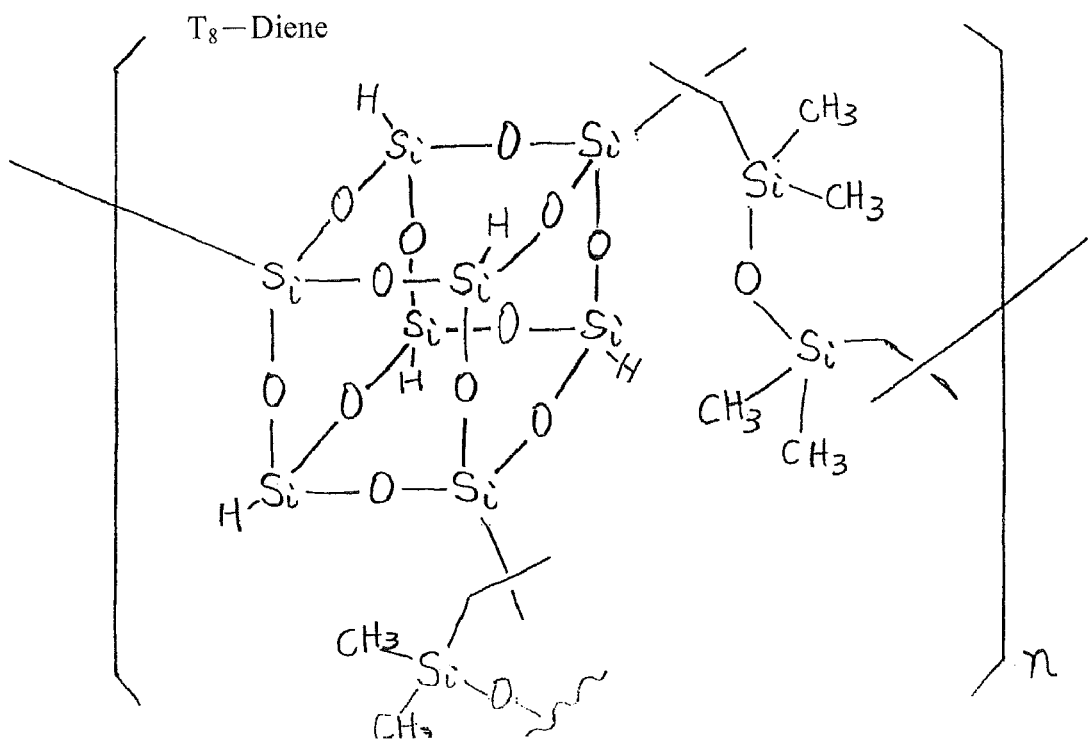
FIG. 63 shows a series of silsesquioxane compounds coated with a planarization film as well as an alignment film by an ink-jet coating device in accordance with the present invention.
Figure 65:
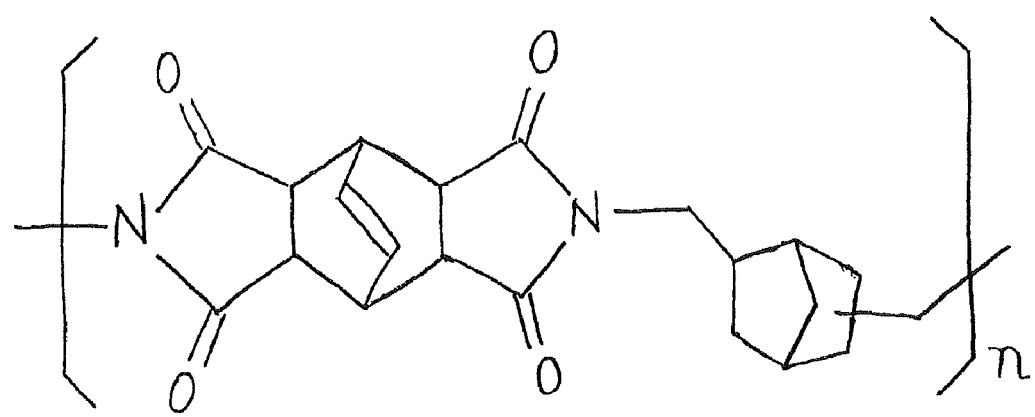
FIG. 65 shows a soluble polyidmide compound with a low dielectric constant coated with a planarization film as well as an alignment film by an ink-jet coating device in accordance with the present invention.
Figure 66:
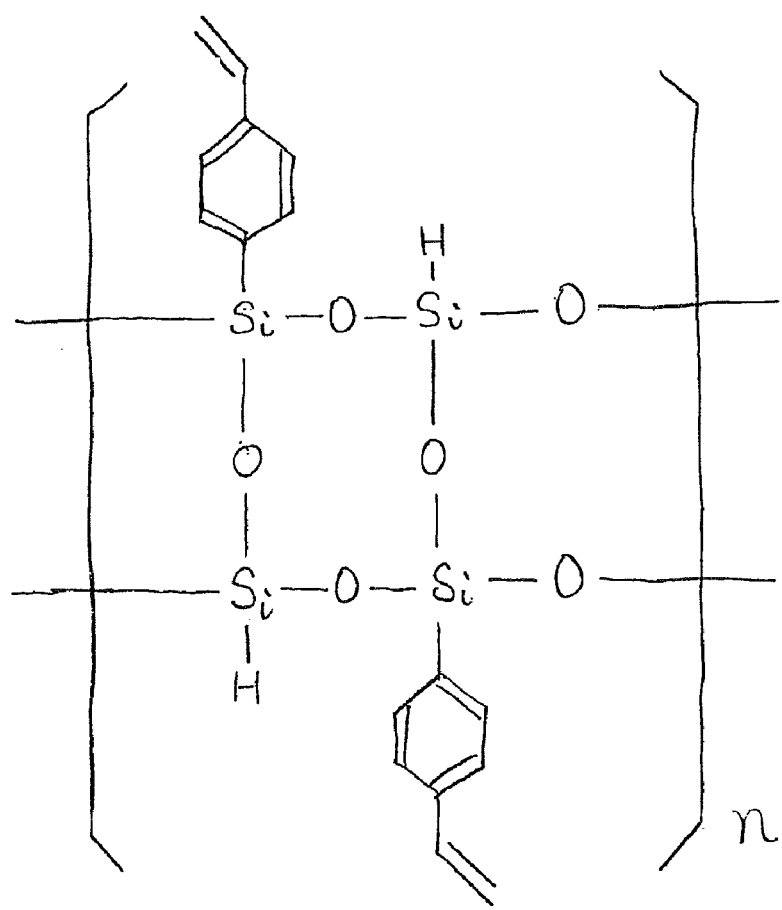
FIG. 66 shows a series of silsesquioxane compounds coated with a planarization film as well as an alignment film by an ink-jet coating device in accordance with the present invention.

FIGS. 50 and 52 show the flows of a manufacturing process of an IPS mode, FFS mode and TN mode liquid crystal cell. In FIG. 50, a passivation film, an alignment film and an alignment film are maintained in a vacuum condition by a vacuum device as shown in FIG. 58 for film formation and alignment to greatly simplify the manufacturing process. This embodiment of the present invention adopts the ion alignment processing method that generally does not cause uneven alignments and almost requires no maintenance. In the prior art, a Velver is used for the rubbing process, and thus requiring a frequent change of Velvers, and it is not easy to prevent uneven rubbing of the IPS mode and FFS mode, and it is difficult to maintain a high yield rate. The ion alignment simply requires a simple maintenance by changing the ion source filament monthly, and thus the production line can run almost all the time, and the operating efficiency of the production line is improved. Even if the ion alignment adopts the materials without the alignment function and used for the conventional rubbing method, the alignment function can still be achieved easily in this embodiment. The polymer compound illustrated in FIGS. 62 to 66 can also be used for the function of planarizing the films as well as aligning the liquid crystal molecules of the color filter substrate and the TFT substrate. Even an anchor ring energy alignment film can have good alignment if the ion alignment is performed on a P—SiNx passivation surface by using the liquid crystal molecules with a good alignment property. Now, the invention simultaneously provides the passivation film and the alignment film of the TFT substrate to greatly simplify the manufacturing process.

Embodiment 17

FIG. 41 shows a cross-sectional view of a manufacturing flow of an IPS mode or FFS mode color filter substrate in accordance with Embodiment 17 of the present invention. After a static charge resisting conductive material is coated on the backside, and a titanium or zirconium thin film (of 5~20 nm thick) is sputtered, and a nitrogen ion shower doping method is used for the transparent nitrification. The acceleration voltage of the nitrogen ion depends on the film thickness, and falls within the range of 1 KeV~20 KeV. Alternatively, a titanium nitride or zirconium nitride film with a film thickness of 5~20 nm can be used for the reaction and sputtering. Compared with the high material cost of ITO, this embodiment adopts a low-cost titanium or zirconium, and can improve the corrosive resistance. The BM (light-shielding film) of the color filter of the present invention is exposed by the DMD non-masking direct writing exposure method FIG. 80 instead of using an expensive large mask. With the DMD non-masking direct writing exposure method, the size deviation can be measured, if the absolute size of the TFT matrix substrate is not aligned precisely, and manufacturers can correct the CAD data of the DMD non-masking direct writing exposure method, so as to directly expose the BM without any size deviation.

Figure 6:
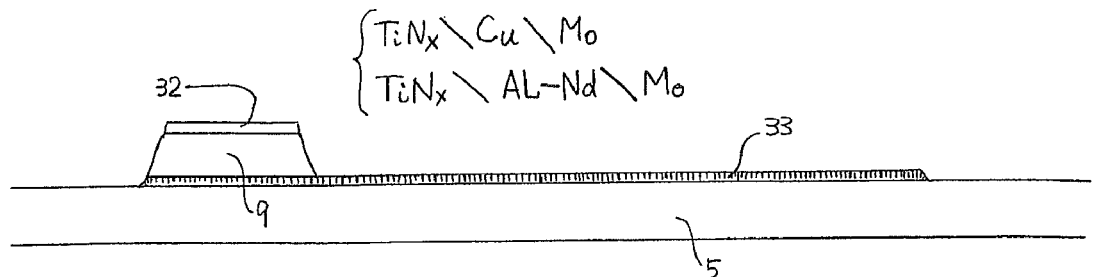
FIG. 6 is a cross-sectional view of a structure of a pixel electrode formed by using a halftone exposure method in accordance with the present invention.

In FIG. 41-4, an ink-jet coating method is used for forming a R, G, B color filter layer, but the planographic printing method can be used as well. In FIG. 41-3, when the DMD non-masking direct writing exposure method is used for exposing the BM, the IPS mode color filter layer of the pixel unit is bent by the linear color filter layer for the exposure without using a mask. In FIG. 41-6, the ink-jet coating method is used for installing a ball spacer on the BM such that the gap of the liquid crystal cell is precise and consistent. Even if the planographic printing method is used, the ball spacer can still be installed at a fixed point. To prevent any resolution deterioration of an animation display due to the ghosting or cross-talk phenomenon, a fast response of the LCD panel is required. The most effective way of solving this problem is to reduce the viscosity of the liquid crystals and minimize the liquid crystal cell gap. If the liquid crystal cell gap is below 3 µm, the conventional photolithography can be used for forming the photo spacer. When a stress is applied on the spacer, the elastic deformation is small, which may easily result in bubbles and defects during the ODF manufacturing process of the liquid crystal cell. If the ball spacer is adopted, the elastic deformation is twice of the photo spacer, and the occurrence of bubbles drops drastically.

In FIG. 41-6, after the alignment film of the present invention is used as the plasma polymerization alignment film, and the ball spacer is installed at a fixed point, a plasma polymerization alignment film is formed in a vacuum chamber. The IPS mode and FFS mode plasma polymerization alignment film adopts diamond-like carbon (DLC). If the DLC adopts the conventional Velver for rubbing, a good alignment function is not found. If the ion alignment is used, then a sufficient alignment function can be achieved. While the vacuum condition is maintained, a continuous film formation of the plasma polymerization alignment film, and an ion alignment, the manufacturing process can be simplified. When the ion alignment is used, it is not necessary to perform the rubber before rinsing, drying and removing gas from the substrate, and thus the invention can greatly reduce the spacer of the clean room, and lower the operation cost.

Embodiment 18

FIG. 128 shows a schematic cross-sectional view of a manufacturing flow of a MVA mode color filter substrate in accordance with Embodiment 18 of the present invention. Similar to Embodiment 17, the BM (light-shielding film) is exposed by a DMD non-masking direct writing exposure method of FIG. 80. If the exposure device is used, the title of the substrate can be formed at the same time by the exposure, so that it is not necessary to change the mask when different types of products are manufactured. Therefore, the operation efficiency will not be lowered, when small quantity of many different kinds of devices are manufactured. Compared with the horizontal electric field mode (IPS and FFS) color filter substrate, the MVA mode color filter substrate requires an additional alignment control protruding lump or alignment control slit, and thus incurring a much larger volume of operations for the absolute size alignment of the TFT substrate, and a higher cost for the design of the mask. If the DMD non-masking direct writing exposure method of the present invention, manufacturers simply correct the CAD data for a change of design, and thus greatly lower the cost and reduce the correction time.

In FIG. 128-2, an ink-jet coating method or a multiple feeder coating method is used for forming the color filter layer, but a planographic printing method can be used as well. Since the MVA mode color filter layer with its pixel unit bent to 90 degrees cannot be formed by the aforementioned three methods, therefore a DMD non-masking direct writing exposure method uses a BM (light-shielding film) to form the MVA mode color filter layer. In FIG. 128-4, the DMD non-masking direct writing exposure method is used for forming an alignment control protruding lump. Similarly, an alignment control slit can be formed by the DMD non-masking direct writing exposure method. Even if the color filter layer of the MVA mode color filter substrate is produced in a linear form, the alignment control protruding lump or alignment control slit must be in a form of being bent to 90 degrees inside a unit pixel, and thus the photolithography is necessary for the production.

In FIG. 128-5, similar to Embodiment 17, an ink-jet coating method is used for installing the ball spacer at a fixed point, but the planographic printing method can be used for installing the ball spacer at a fixed point. After the ball spacer is installed, a plasma polymerization method is used for forming a vertical alignment film. In FIG. 37, plasma polymerization alignment film must be formed at a region on the internal side of a main seal. Even if the substrate is not heated, the plasma polymerization alignment film formed at room temperature can provide a sufficient alignment function, and thus giving a much broader and more flexible choice for the dye of the color filter. Any color filter photoresist with high transmission rate and good purity can be used. Since the plasma polymerization alignment film generally does not cause pin hole and uneven display, and thus it is suitable for large LCD TV.

Embodiment 19

Figure 12:
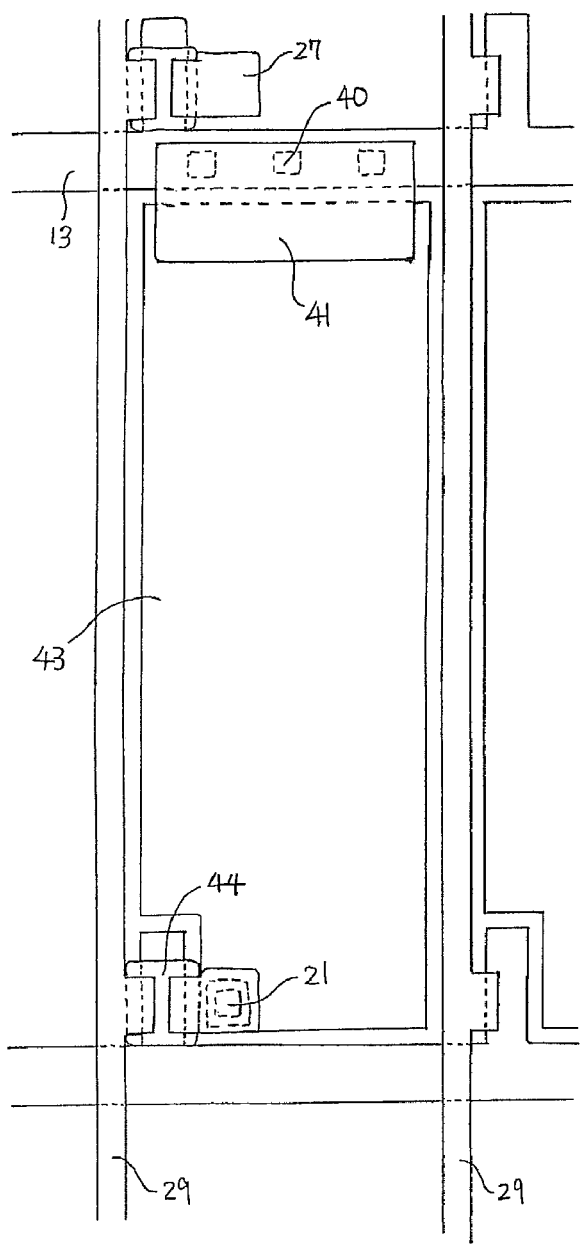
FIG. 12 is a planar view of a TFT matrix substrate that connects a holdup capacitor (Cst) forming electrode Cst to a gate electrode in accordance with the present invention.
Figure 13:
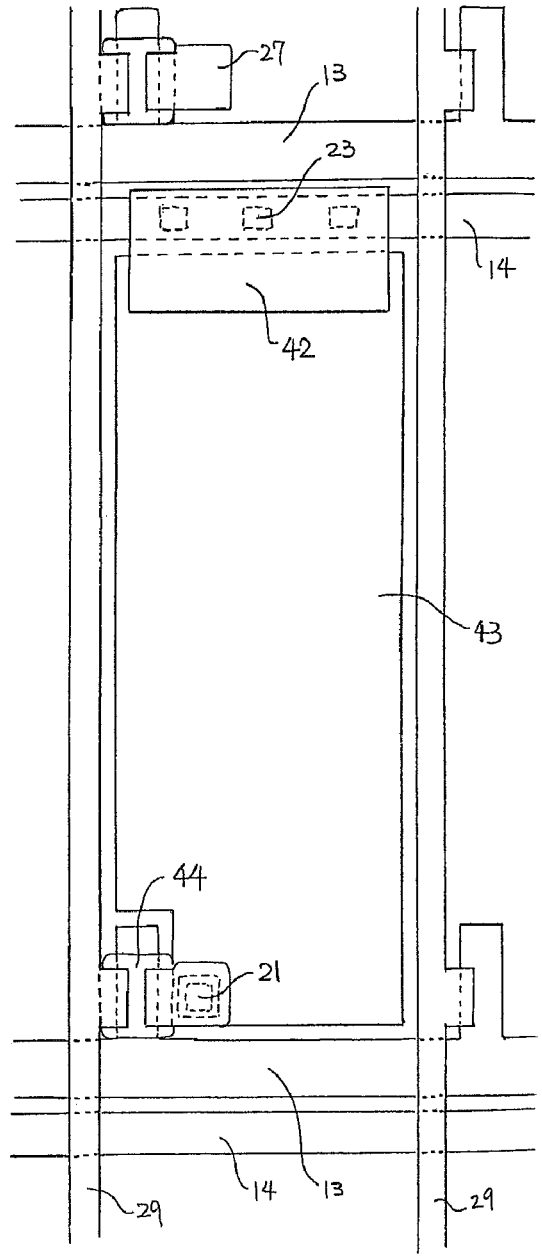
FIG. 13 is a planar view of a TFT matrix substrate that connects a holdup capacitor (Cst) forming electrode Cst to a common electrode in accordance with the present invention.
Figures 129, 130:
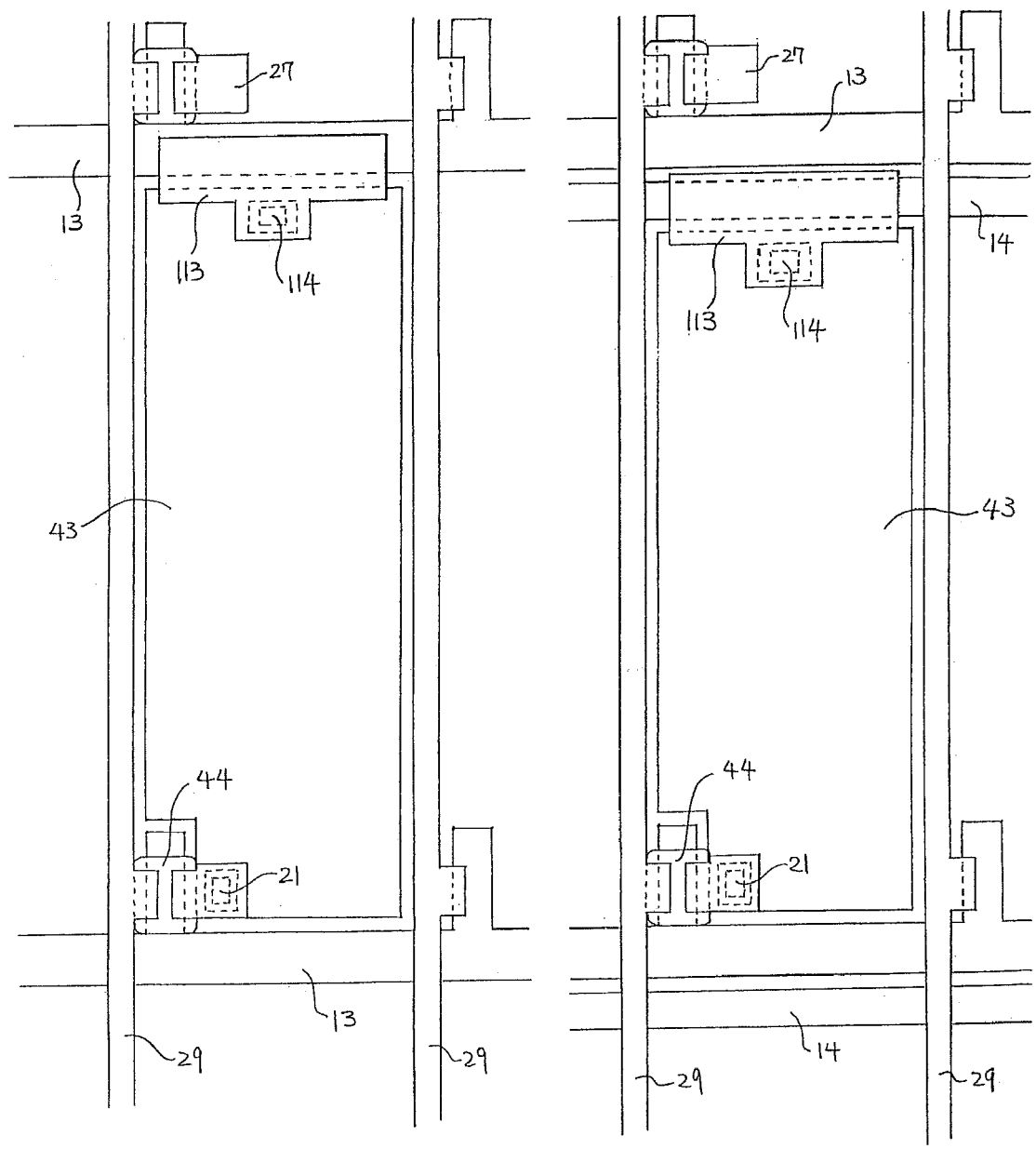

FIGS. 129 and 130 show planar views of a TN mode active matrix TFT substrate in accordance with Embodiment 19 of the present invention. FIGS. 138 and 139 are cross-sectional views of FIG. 130. In FIG. 130, a holdup capacitor (Cst) forming electrode and a common electrode formed on a contact pad inside the pixel electrode are electrically coupled through the contact hole to form a capacitor by a gate insulating film. In FIG. 129, a holdup capacitor (Cst) forming electrode and a gate electrode are formed on a contact pad inside a pixel electrode, and electrically coupled through a contact hole to form a capacitor by a gate insulating film. FIGS. 12 and 13 show a TN mode active matrix TFT substrate in accordance with Embodiment 19 of the present invention. In FIG. 12, the holdup capacitor (Cst) forming electrode is electrically connected to the gate electrode to form a capacitor through the pixel electrode and the gate insulating film. In FIG. 13, the holdup capacitor (Cst) forming electrode is electrically connected to the common electrode to form a capacitor through the pixel electrode and the gate insulating film.

In FIGS. 12, 13, 129 and 130, a Type A manufacturing process of FIG. 38 is used for the manufacture, a photolithographic process is performed for three times to complete manufacturing a TFT matrix substrate. In a first photolithographic process and a second photolithographic process, a halftone exposure method adopting a halftone mask is used to reduce the number of times of the photolithography. In FIGS. 12, 13, 129 and 130, the photolithographic process still can be performed for three times to complete manufacturing a TFT matrix substrate, even if the type A manufacturing process adopting a double exposure method of FIG. 77, the type A manufacturing process adopting a DMD of FIG. 82, or the type A manufacturing process of a DMD of FIG. 103 is used.

FIGS. 12 and 13 show the shape of a thin film transistor component, and if the alignment precision of the gate electrode and the drain electrode is poor, the image display will be uneven, and the actual shape of the thin film transistor component of the large LCD panel adopts the shape as shown in FIGS. 159 and 160. If a comb source electrode and a comb drain electrode are used, uneven display will not occur easily even if the alignment precision is poor.

The planar view of a thin film semiconductor layer after the component separation and the contact hole are created constitutes the shape as shown in FIGS. 161 and 162. In the lower layer of the source electrode (video signal line), the thin film semiconductor layer is smaller than the source electrode and installed along the source electrode. If the thin film semiconductor layer adopts an incompletely separated structure of the present invention, wire breaking of the source electrode will not occur easily, and the chance of having a short circuit of the source electrode and the gate electrode will drop drastically. FIGS. 163 to 166 show cross-sectional views of the comb transistor component.

Embodiment 20

Figure 30:
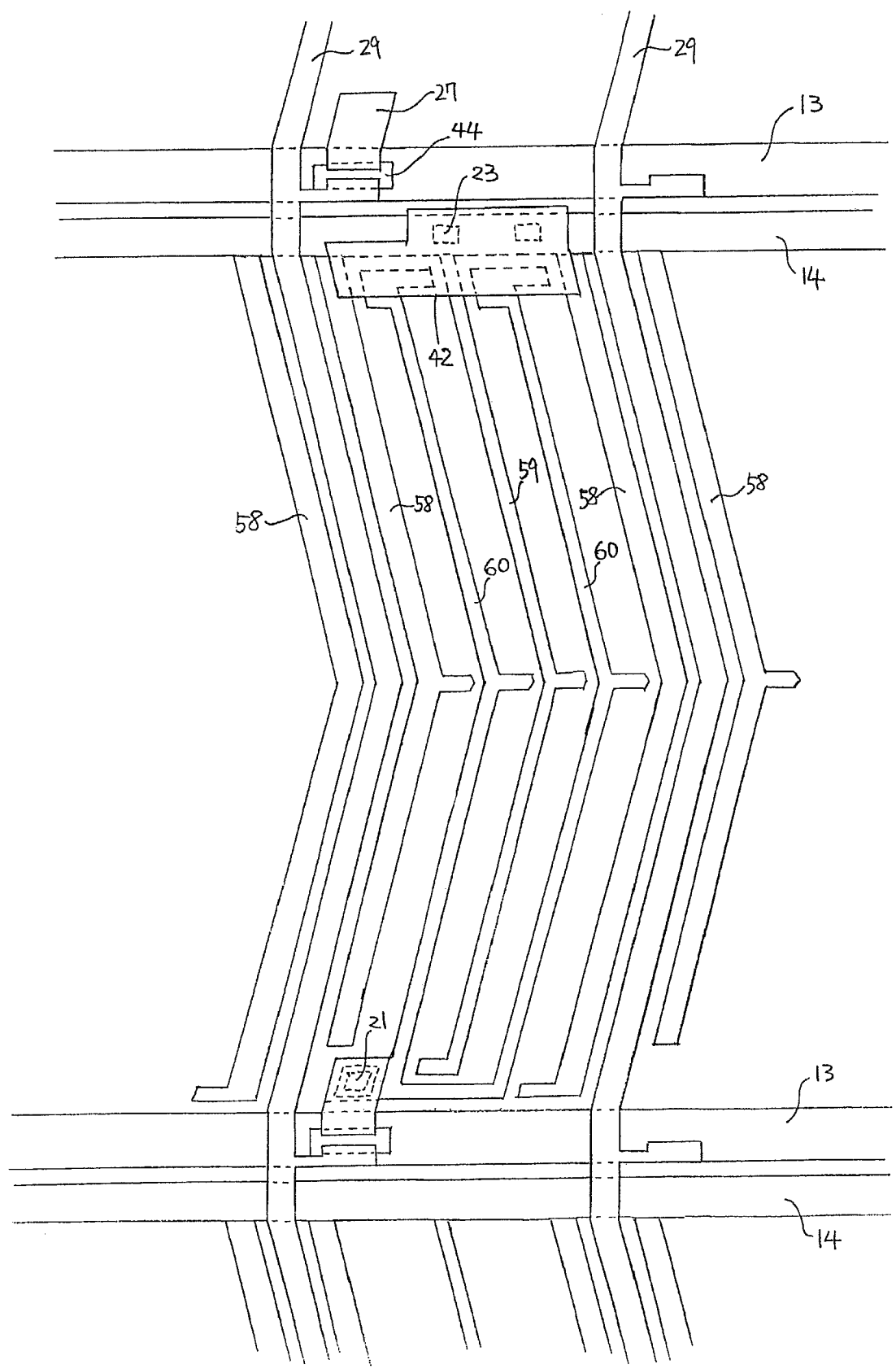
FIG. 30 is a planar view of a TFT matrix substrate that connects a holdup capacitor (Cst) forming electrode Cst to a common electrode in accordance with the present invention.

FIGS. 30, 152 and 233 are planar views of an IPS mode active matrix TFT substrate in accordance with Embodiment 20 of the present invention. FIGS. 27, 28, 251 and 252 are cross-sectional views of an IPS mode TFT substrate in accordance with the present invention Embodiment 20. There are two methods for connecting the holdup capacitor (Cst) forming electrode as shown in FIG. 152. The way of connecting a contact pad formed on a liquid crystal driving comb pixel electrode to a holdup capacitor (Cst) forming electrode can increase the numeric value of the hole diameter to form a large capacitor. The IPS mode is shown in FIGS. 237 and 238. In a unit pixel the liquid crystal molecules are aligned, and the liquid crystal driving comb common electrode and the liquid crystal driving comb pixel electrode are bent, so that the rotating direction of the liquid crystal molecules is divided into left turn or right turn. Therefore, the viewing angle is expanded, and the color shift problem can be solved. FIGS. 30 and 152 show an electrode structure that is bent for one time and formed in a unit pixel, FIG. 233 shows an electrode structure that is bent for two times and formed in a unit pixel. Although there is no limitation on the number of times of bending, yet an identification line will occur, and the light transmission rate will drop, if there are many times of bending. In general, a structure with 1~3 times of bending is usually adopted. Similarly, the color filter substrate, the BM (light-shielding film) and the color filter layer match the curved shape of the source electrode of the TFT substrate to form a curved shape.

The IPS mode TFT substrate of the present invention can use the Type A manufacturing process of a halftone mask of FIG. 38, or the Type A manufacturing process adopting a double exposure method of FIG. 77, and perform a photolithographic process for three times for the manufacture. The electrode width of the liquid crystal driving comb common electrode and the liquid crystal driving comb pixel electrode is generally very small (4~8 μm), and thus the resolution of the present DMD (about 10 μm) cannot be used for the Type A manufacturing process of FIG. 103 that adopts the Type A manufacturing process of FIG. 82 for manufacturing the IPS mode TFT substrate. When the resolution of the future DMD is increased, the Type A manufacturing process of FIG. 82 or the Type A manufacturing process of FIG. 103, and a photolithographic process performed for three times can be used for manufacturing the IPS mode TFT substrate.

The IPS mode of the present invention, the liquid crystal driving comb common electrode, the liquid crystal driving comb pixel electrode and the source electrode signal electrode screening common electrode need not to be transparent, and thus the Type (Ia) and Type (Ib) manufacturing processes of FIG. 46 or the Type (IVa) and the Type (IVb) manufacturing processes of FIG. 172 are not required for performing a nitrogen ion shower doping on the titanium or zirconium thin film of the lower layer electrode until the transmission rate of visible light is increased. Type (IVa) manufacturing process and Type (IVb) manufacturing process of FIG. 172 may not need to use a nitrogen ion shower doping process at all. To reduce the power consumption of backlight, titanium or zirconium of the lower layer electrode must be nitrified. After the first photolithographic process of FIG. 172 is completed, a device of FIG. 57 is used. After the surfaces of the lower layer electrode and the contact pad are nitrified, a vacuum condition is maintained to form a gate insulating film and a thin film semiconductor layer. The doped phosphorus thin film semiconductor layer of FIG. 57 is formed in another vacuum chamber, but the method of skipping such arrangement and using left and right vacuum chambers can be adopted instead, such that three layer films of the gate insulating film and the thin film semiconductor layer are formed in the same chamber. After a third photolithographic process of FIG. 38 and FIG. 77 is completed, the device of FIG. 58 is used to form a P—SiNx passivation film, and then the vacuum condition is maintained, and the plasma polymerization alignment films from several Å to several hundreds of Å are formed continuously. And then, the vacuum condition is maintained to carry out an ion alignment directly in an ion alignment treatment chamber, and thus greatly simplifying the conventional manufacturing process and improving the yield rate.

Embodiment 21

Figure 31:
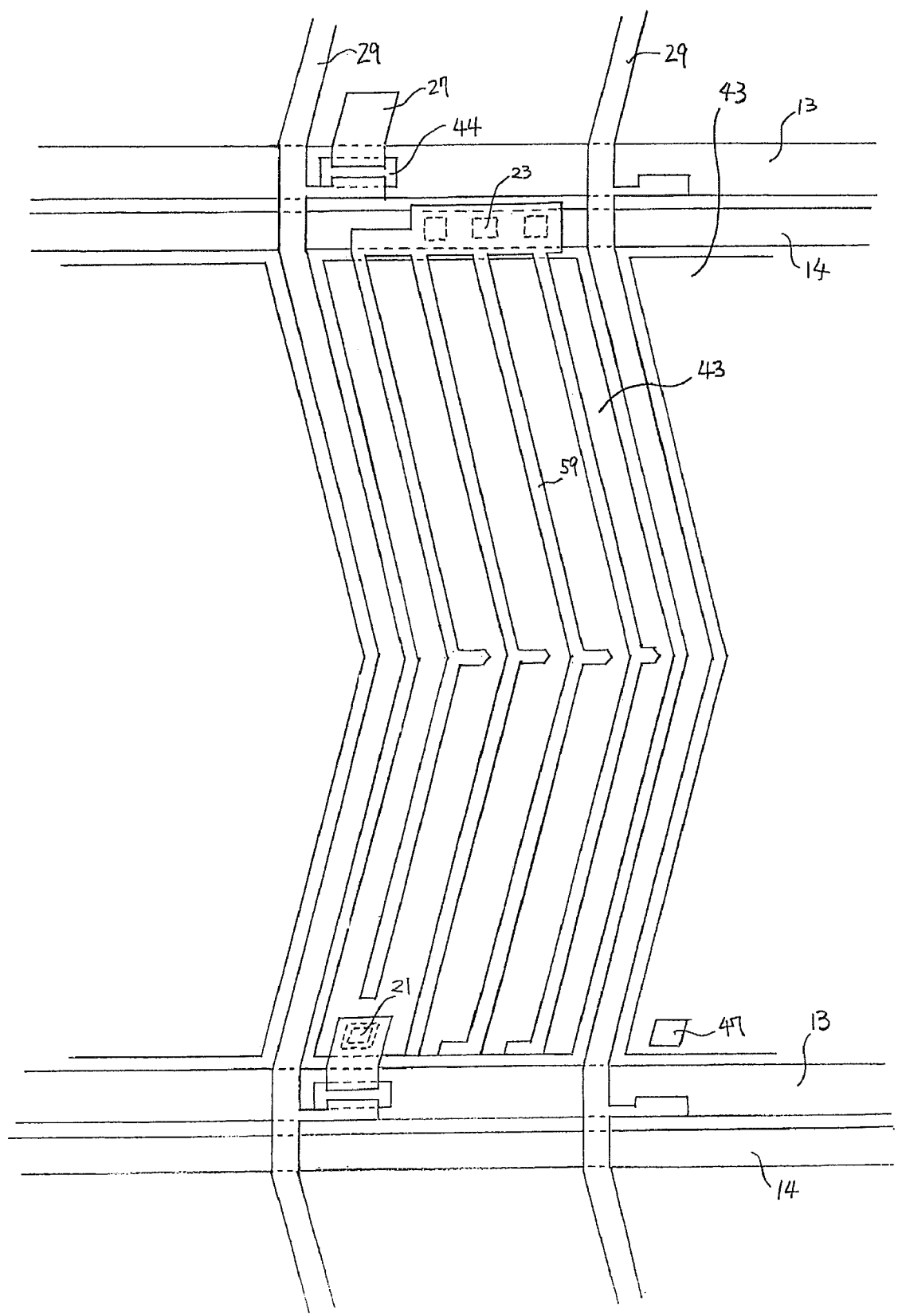
FIG. 31 is a planar view of a TFT matrix substrate in accordance with the present invention.
Figure 32:
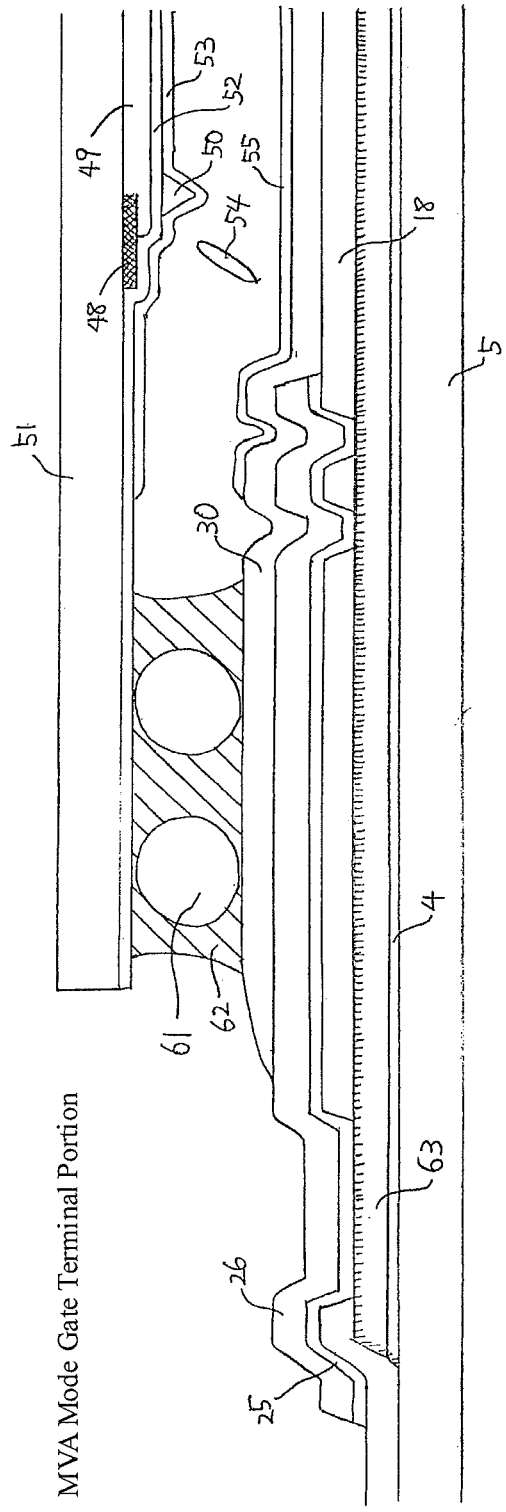
FIG. 32 is a cross-sectional view of a gate terminal portion and a main seal region of a MVA mode LCD panel in accordance with the present invention.
Figure 33:
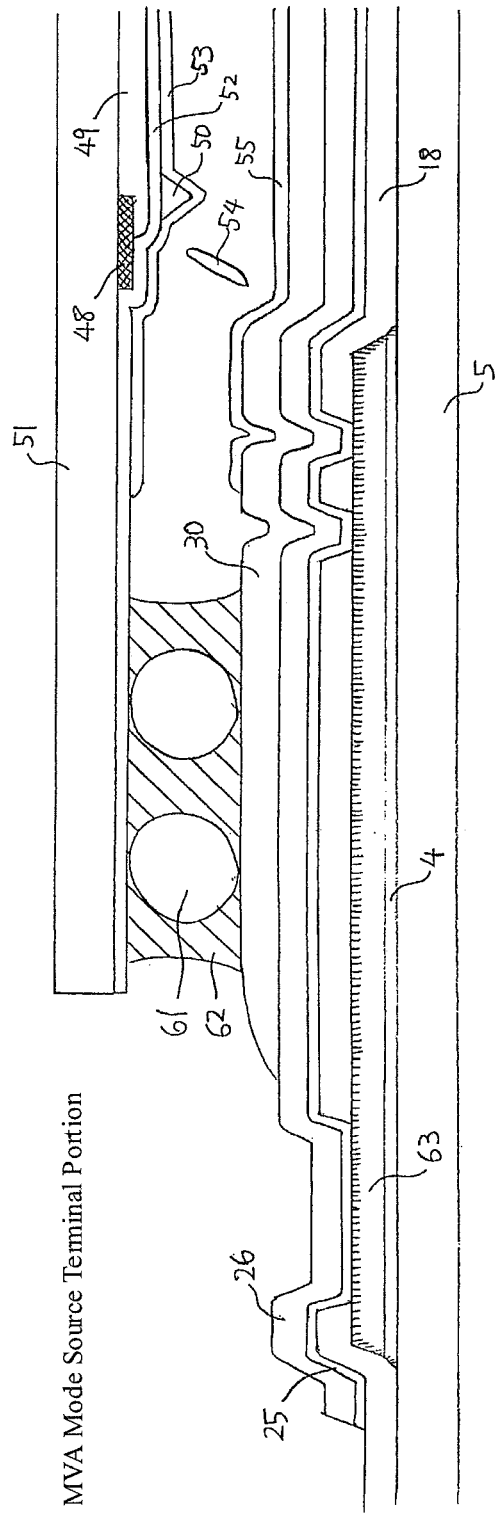
FIG. 33 is a cross-sectional view of a source electrode terminal and a main seal region of a MVA mode LCD panel in accordance with the present invention.

FIGS. 31, 216, 29 and 253 are planar views and cross-sectional views of a FFS mode active matrix TFT substrate in accordance with Embodiment 21 of the present invention. FFS mode as shown in FIG. 31. In this embodiment of the invention, a gate insulating film is used for stacking: a Betta shape pixel electrode and a liquid crystal driving comb common electrode to produce horizontal electric field to rotate liquid crystal molecules. The rotation of liquid crystal molecules is based on the same principle of the IPS mode. In FIG. 31, the shape of a liquid crystal driving comb common electrode being bent for one time in a unit pixel is used, but the one being bent for several times can be used as well. With the foregoing bent electrode structure, same as the IPS mode, the liquid crystal molecules can be rotated in different directions including left turn and right turn. Therefore, the viewing angle can be expanded and the color shift phenomenon can be improved.

The FFS mode TFT substrate of the present invention can use a Type C manufacturing process adopting a halftone mask of FIG. 40 and a photolithographic process for three times for the manufacture. Even if the Type C manufacturing process adopting a double exposure method of FIG. 79 is used, the photolithographic process can still be performed for three times for the manufacture. If the direct writing exposure method of a DMD component is used, the first and second photolithographic processes can be carried out, but the resolution of the DMD is lowered when the liquid crystal driving comb common electrode is exposed in the third photolithographic process, and thus such method cannot be used.

Figure 29:
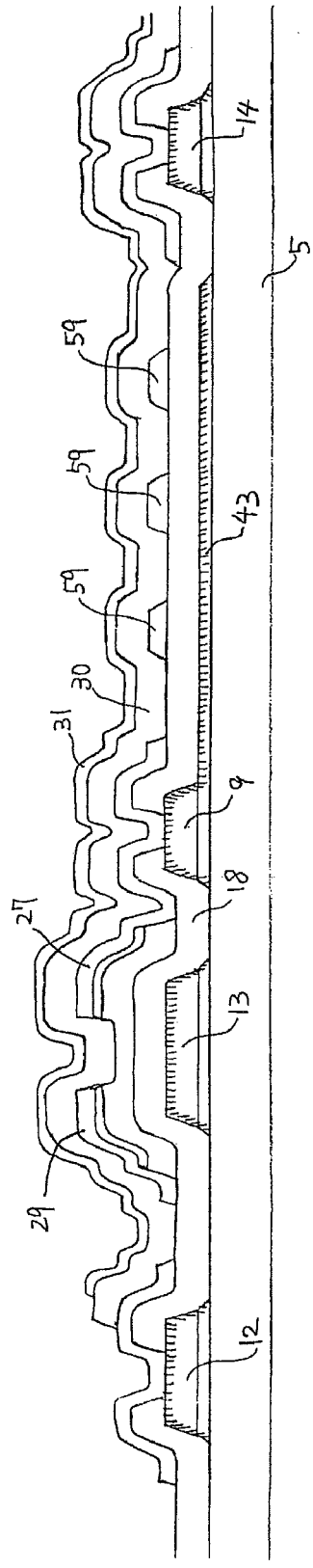
FIG. 29 is a cross-sectional view of a completed FFS mode TFT matrix substrate in accordance with the present invention.

The FFS mode is shown in FIG. 29. Since the gate insulating film is used for stacking a Betta shaped pixel electrode and a liquid crystal driving comb common electrode to easily produce a large holdup capacitor, therefore it is suitable for the super high-precision liquid crystal display with small pixels. However, the super large LCD panel, pixel is so large that the holdup capacitor is too large to be driven by an amorphous silicon thin film transistor component. To solve the problem, both IPS mode and FFS mode electrode structure in the unit pixel structure in accordance with the present invention as shown in FIG. 216. FIG. 253 shows the cross-sectional view of the aforementioned structure.

With this structure, the best holdup capacitor can be designed freely, and thus the super large FFS mode LCD TV (which is difficult to be manufactured by the conventional methods) can be now manufactured.

Since FFS mode can produce a strong electric field more easily than IPS mode, therefore the liquid crystal molecules can be more rapidly, and it can meet the requirements of a good animation image free from ghosting.

Embodiment 22

Figures 20, 21:
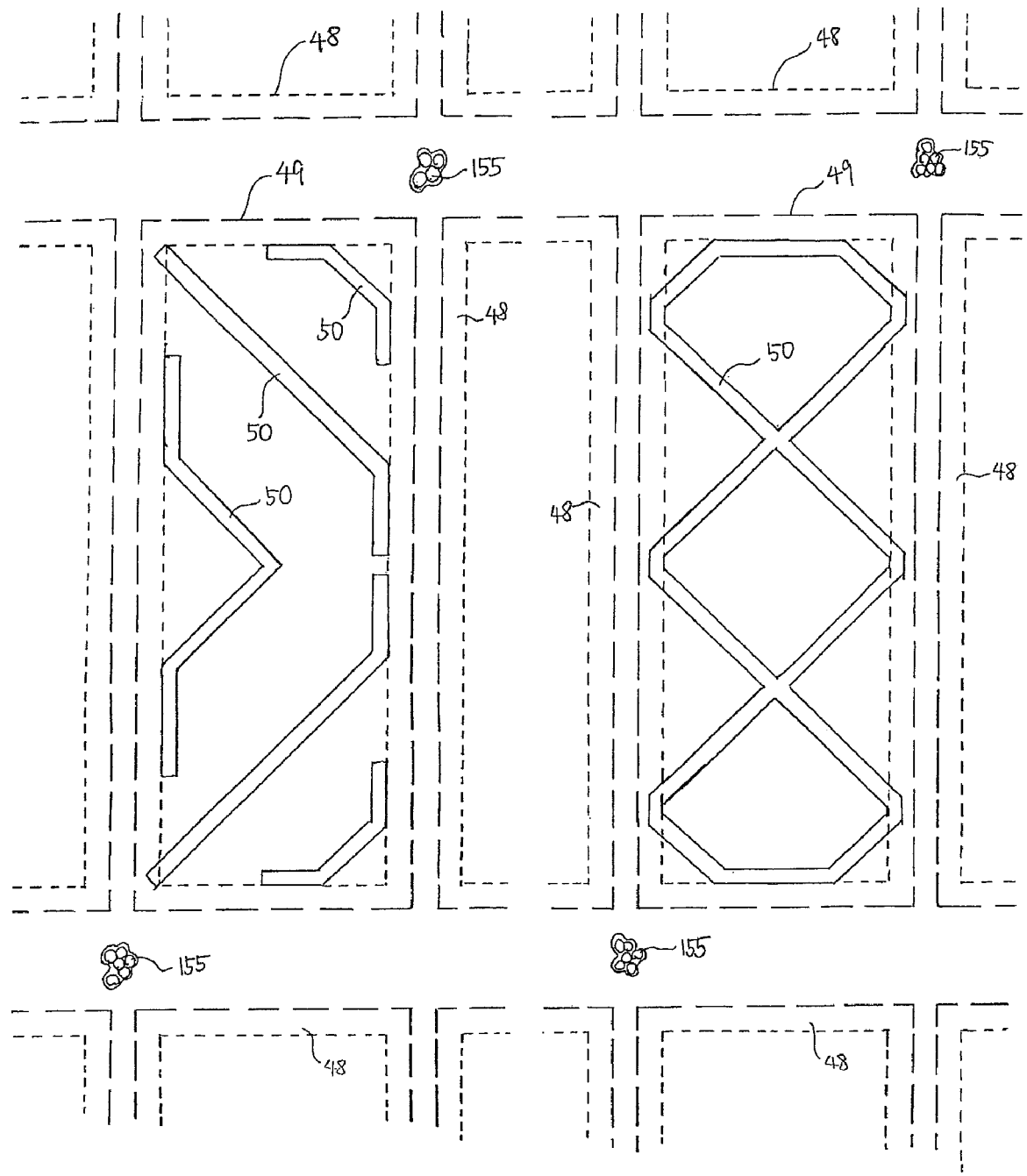
FIG. 20 is a planar view of a color filter substrate corresponding to the TFT matrix substrate as shown in FIG. 15 in accordance with the present invention.
FIG. 21 is a planar view of a color filter substrate corresponding to the TFT matrix substrate as shown in FIG. 17 in accordance with the present invention.
Figure 25:
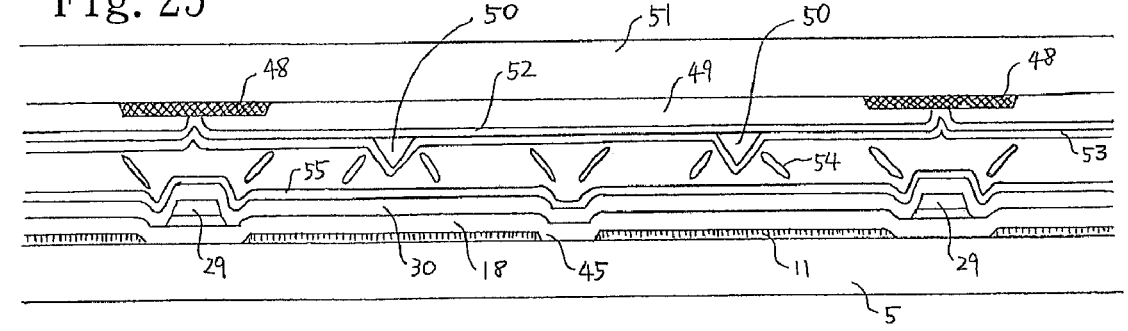
FIG. 25 is a cross-sectional view of a MVA mode LCD panel that uses a slit for a liquid crystal alignment control and a liquid crystal alignment control protruding lump in accordance with the present invention.
Figure 26:
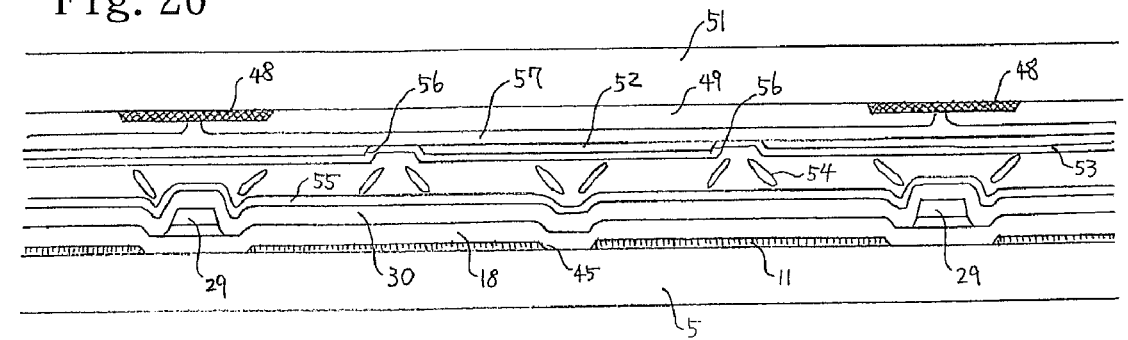
FIG. 26 is a cross-sectional view of a MVA mode LCD panel that uses a slit for a liquid crystal alignment control in accordance with the present invention.
Figure 27:
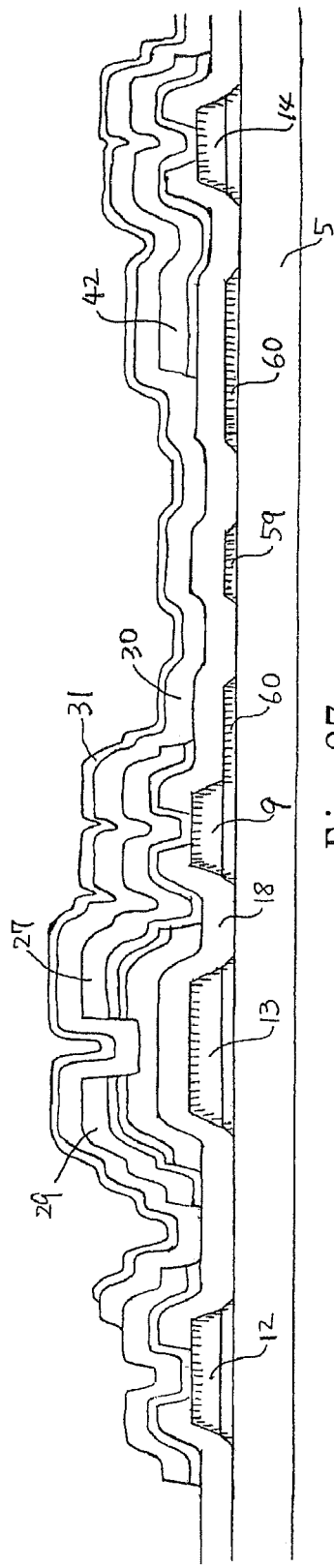
FIG. 27 is a cross-sectional view of a completed IPS mode TFT matrix substrate in accordance with the present invention.
Figure 28:
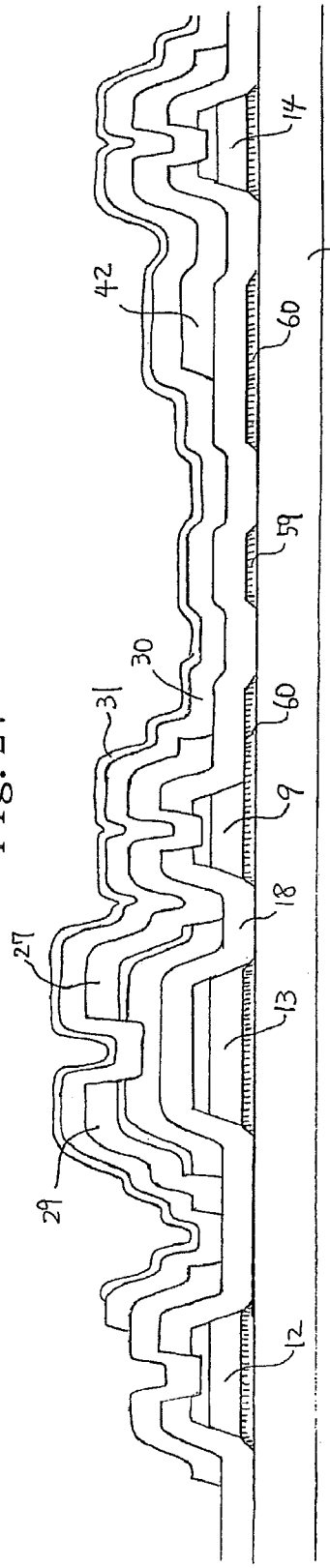
FIG. 28 is a cross-sectional view of a completed IPS mode TFT matrix substrate in accordance with the present invention.

FIGS. 14, 16, 100, 101, 240 and 241 are planar view of a MVA mode active matrix TFT substrate in accordance with Embodiment 22 of the present invention. The source electrode (video signal line) is linear, and one or more contact pads are installed in a pixel electrode for controlling the moving direction of a vertical alignment negative dielectric anisotropic liquid crystal molecules, and an alignment control slit is created in the pixel electrode. The color filter corresponding to the TFT substrate is shown in FIGS. 20 and 21. In FIGS. 20 and 21, an alignment control protruding lump is formed on the color filter layer. FIG. 25 is a cross-sectional view of a color filter substrate and a TFT substrate of an LCD panel. Instead of using the alignment control protruding lump, an alignment control slit having the same pixel electrode of the TFT substrate is installed on a side of the color filter substrate. FIG. 26 is a cross-sectional view of an LCD panel attached with the color filter substrate and TFT substrate.

Figures 14, 15:
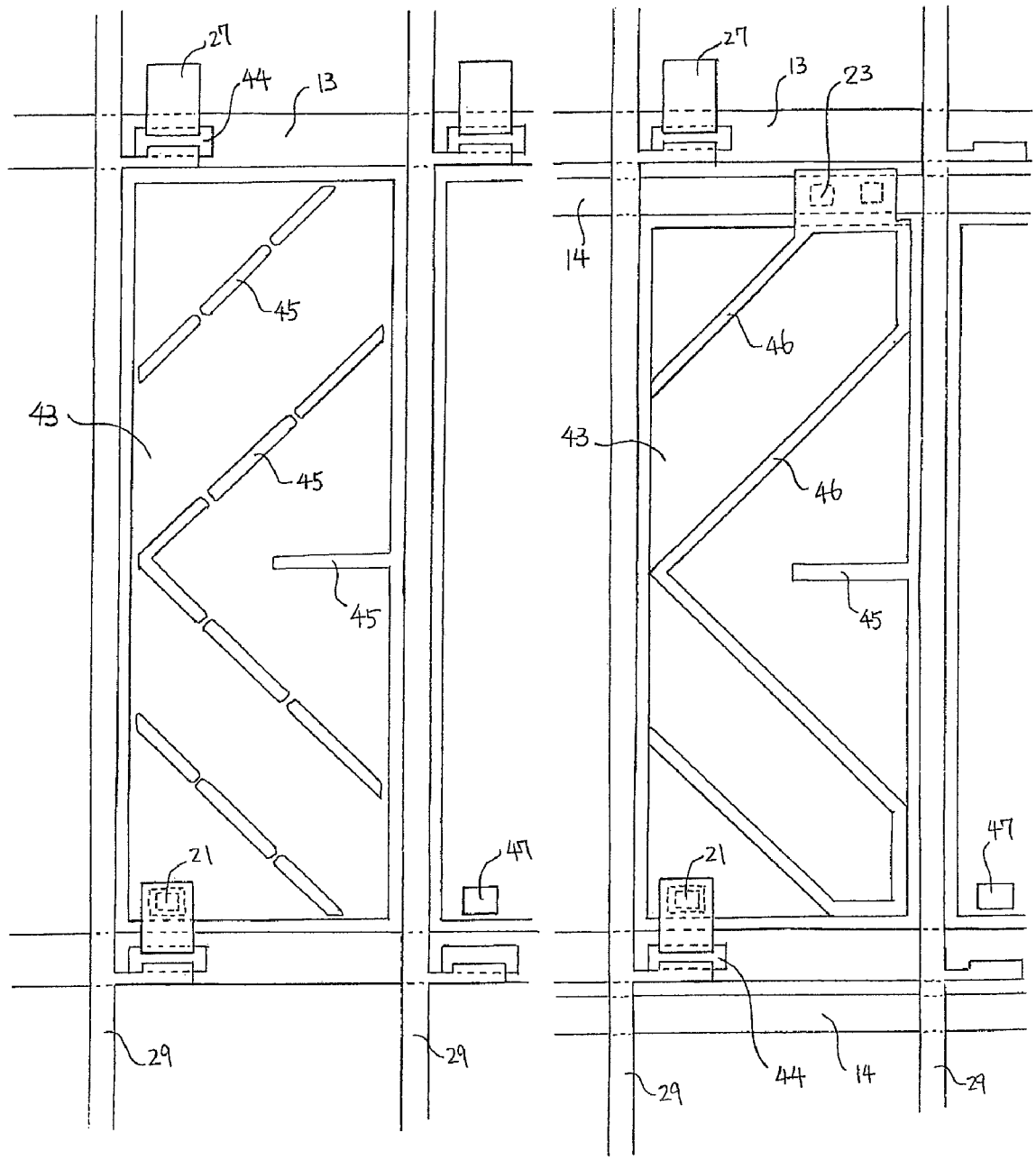
FIG. 14 is a planar view of a TFT matrix substrate that forms a slit used for a liquid crystal alignment control on a pixel electrode in accordance with the present invention.
FIG. 15 is a planar view of a TFT matrix substrate that connects a liquid crystal alignment control electrode to a common electrode in accordance with the present invention.
Figure 16:
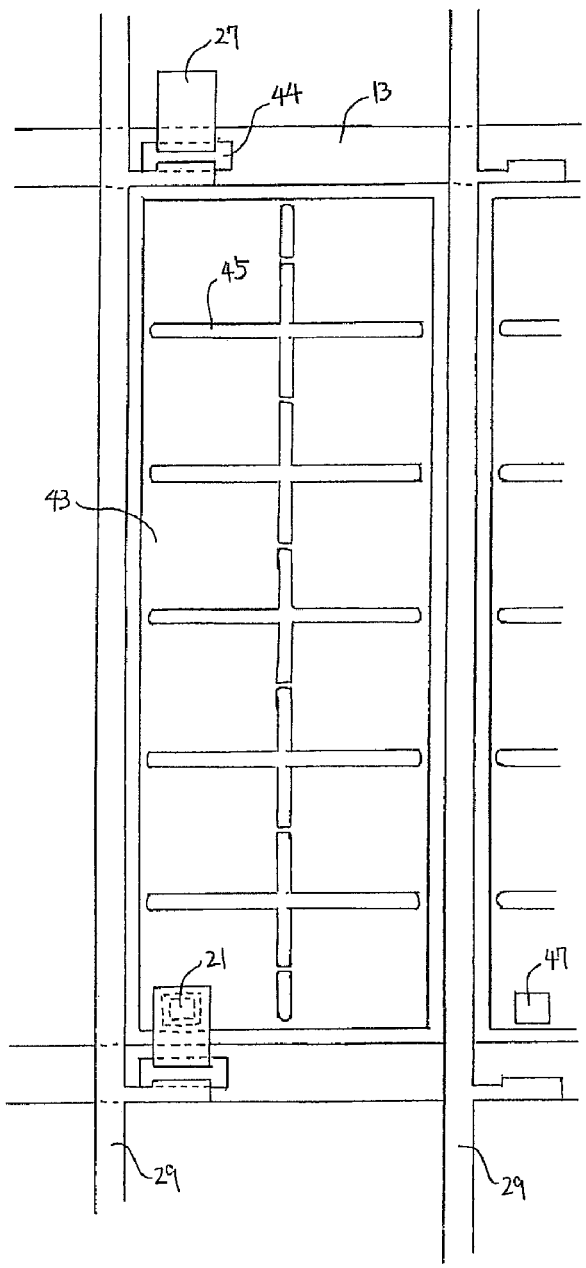
FIG. 16 is a planar view of a TFT matrix substrate that forms a slit used for a liquid crystal alignment control on a pixel electrode in accordance with the present invention.
Figures 100, 101:
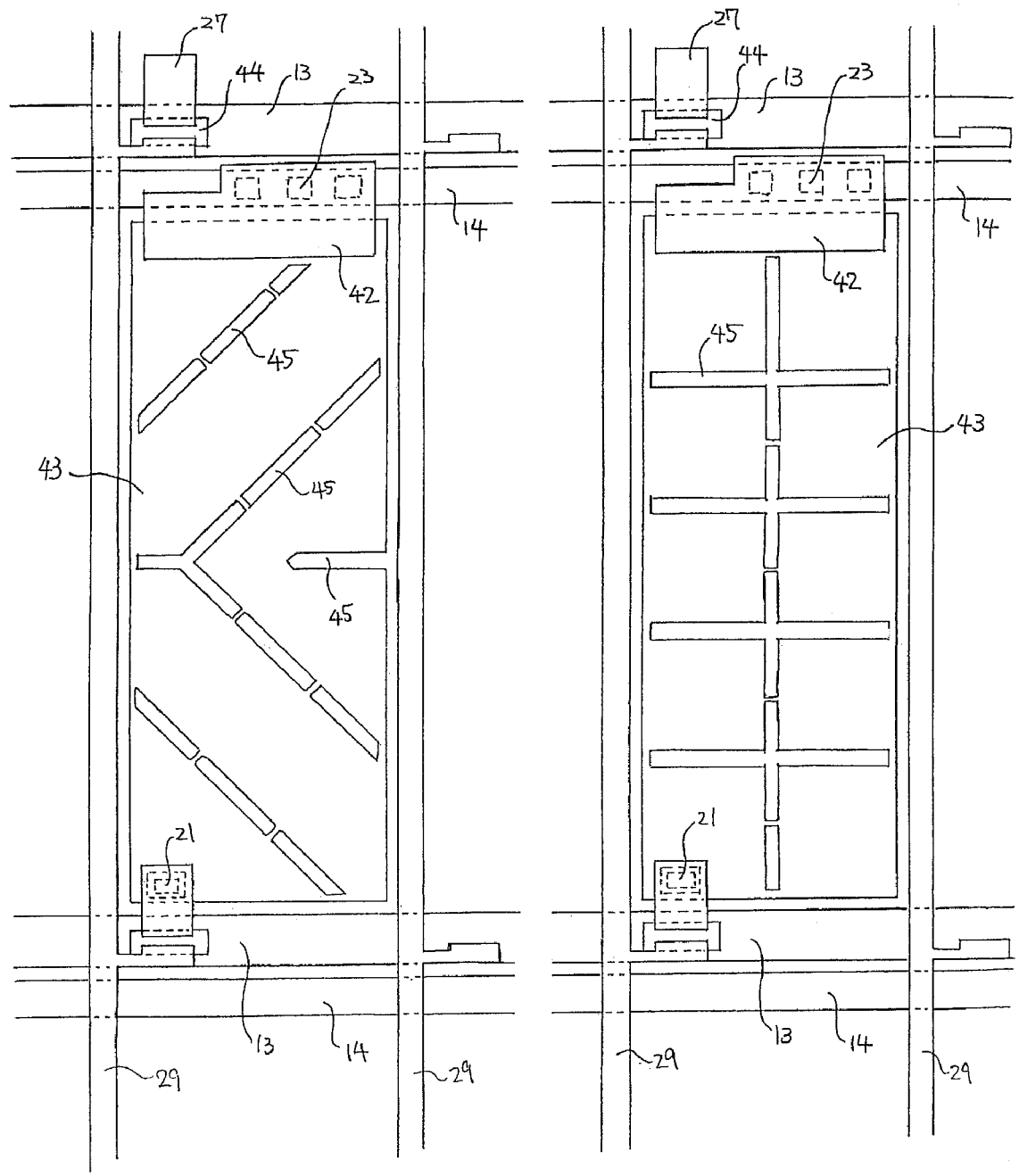
FIG. 100 is a planar view of a TFT matrix substrate that connects a holdup capacitor (Cst) forming electrode Cst to a common electrode in accordance with the present invention.
FIG. 101 is a planar view of a TFT matrix substrate that connects a holdup capacitor (Cst) forming electrode Cst to a common electrode in accordance with the present invention.

In FIGS. 240 and 241, the contact pad formed in the pixel electrode is electrically coupled to the holdup capacitor (Cst) forming electrode and the common electrode through the contact hole to form a capacitor through the gate insulating film. In FIGS. 100 and 101, the holdup capacitor (Cst) forming electrode is electrically connected to the common electrode and form a capacitor through the pixel electrode and the gate insulating film. In the large LCD TV, a pixel capacitor formed by a pixel electrode and a common electrode on a side of the color filter through the liquid crystal become larger, and thus as shown in FIGS. 14 and 16, sometimes it is not necessary to have the holdup capacitor (Cst) forming electrode to achieve the maximum hole diameter. Since the pixel electrode except the contact hole of the contact pad portion is covered completely by the gate insulating film, and thus no local cell reaction will occur, even when the pixel electrode is made of a material ITO or IZO and the source electrode or drain electrode is made of any aluminum series metal material. Unlike the structure of the prior art, this region of the present invention can be made with a considerable number of choices of materials.

FIGS. 14, 16, 100, 101, 240 and 241 show a TFT matrix substrate manufactured by the Type A manufacturing process of FIG. 38 and three times of a photolithographic process. In the first and second photolithographic processes, a halftone exposure method using a halftone mask is adopted to reduce one time of the photolithography. The present invention uses: Type A manufacturing process adopting a double exposure method of FIG. 77, Type A manufacturing process adopting a DMD of FIG. 82 or Type A manufacturing process adopting a DMD of FIG. 103, and three times of a photolithographic process for the manufacture of the TFT matrix substrate.

Embodiment 23

Figure 17:
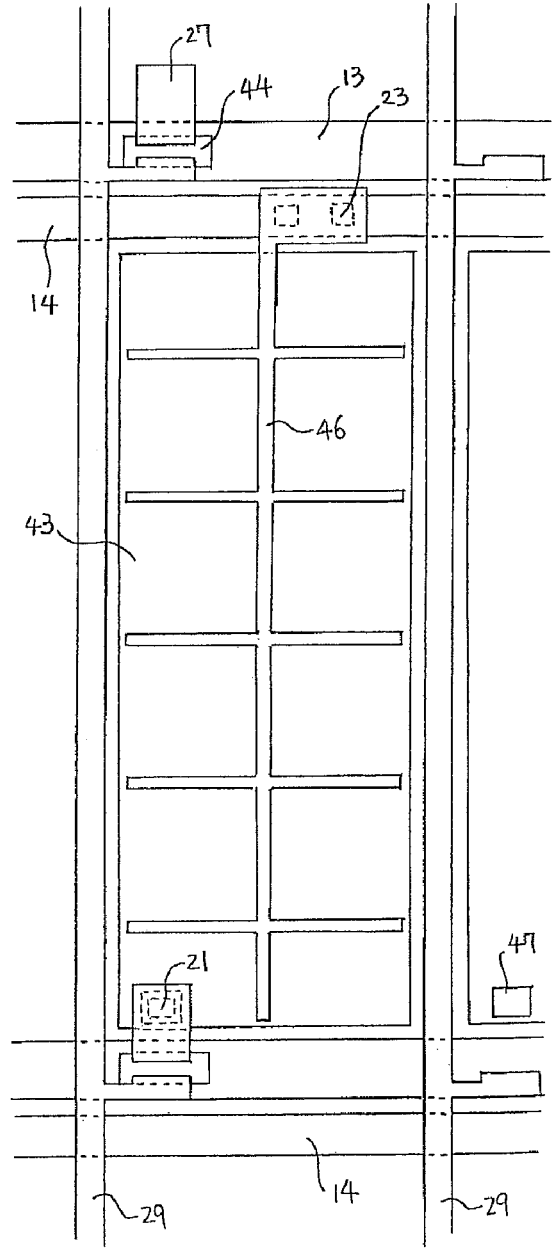
FIG. 17 is a planar view of a TFT matrix substrate that connects a liquid crystal alignment control electrode to a common electrode in accordance with the present invention.

FIGS. 15 and 17 are planar views of a MVA mode active matrix TFT substrate in accordance with Embodiment 23 of the present invention. The source electrode (video signal line) is linear, and one or more contact pads are installed in the pixel electrode, and electrically coupled to the drain electrode of the thin film transistor component through the contact hole formed on the gate insulating film.

Figure 23:
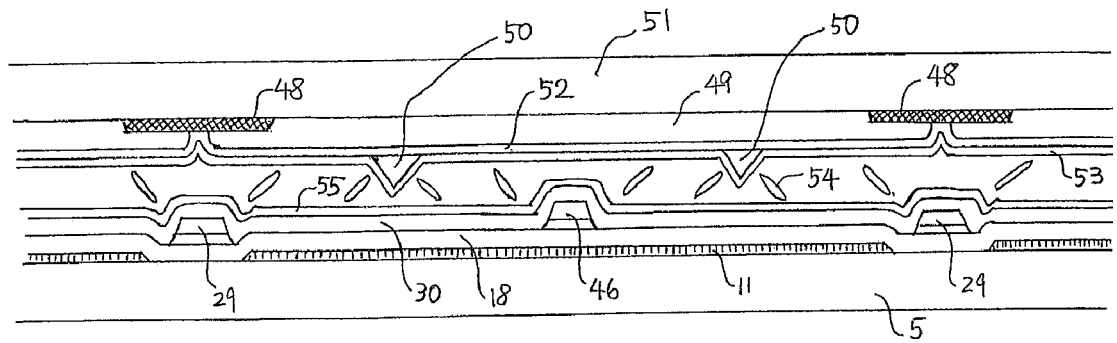
FIG. 23 is cross-sectional view of a MVA mode LCD panel that uses a liquid crystal alignment control electrode and a liquid crystal alignment control protruding lump in accordance with the present invention.
Figure 24:
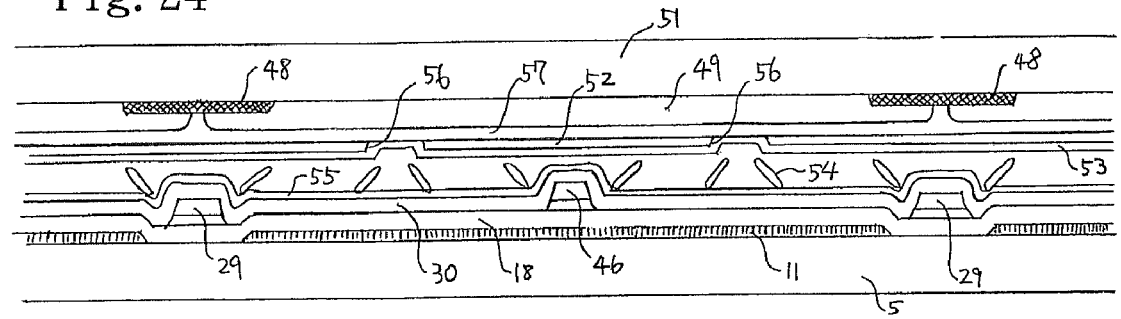
FIG. 24 is a cross-sectional view of a MVA mode LCD panel that uses a slit for a liquid crystal alignment control electrode and a liquid crystal alignment control in accordance with the present invention.

The pixel electrode except the contact hole is covered completely by the gate insulating film, and the alignment control electrode is formed on the gate insulating film for controlling the moving direction of the vertical alignment negative dielectric anisotropic liquid crystal molecules. The alignment control electrode is electrically coupled to the common electrode through the contact hole of the gate insulating film, and FIGS. 20 and 21 show a color filter substrate corresponding to these TFT substrates. In FIGS. 20 and 21, the alignment control protruding lump is formed on the color filter layer. FIG. 23 is a cross-sectional view of the LCD panel attached with the foregoing color filter substrate and TFT substrate. FIG. 24 is a cross-sectional view of the LCD panel attached with the color filter substrate and TFT substrate, wherein the alignment control slit is formed on the common electrode on a side of the color filter substrate.

FIGS. 245, 246, and 107 to 111 show the alignment control electrodes formed on the pixel electrode or common electrode through an insulator for controlling the moving direction of the vertical alignment negative dielectric anisotropic liquid crystal molecules according to the prior arts. In these prior arts, the alignment control electrode is installed on a side of the TFT substrate, and on a common electrode at a side of the substrate corresponding to a side of the TFT substrate and without the alignment control slit or alignment control protruding lump. This structure including a TFT LCD panel of a mobile phone is good for a very small pixel size, and the electric field distortion at the periphery of the pixel electrode can be used to drive the movement of liquid crystal molecules, but when the pixel size is up to 100 μm, the aforementioned prior art electrode structure is not good for practical applications because the moving speed of the liquid crystal molecules is very slow. In large LCD TV panels, the pixel size is up to 150 μm, and thus if the present invention as shown in FIGS. 23 and 24 does not form the alignment control slit or the alignment control protruding lump on a side of the TFT substrate having the alignment control electrode and corresponding to the common electrode of the substrate, then fast response of liquid crystal molecules and good animation display cannot be achieved.

Figure 107:
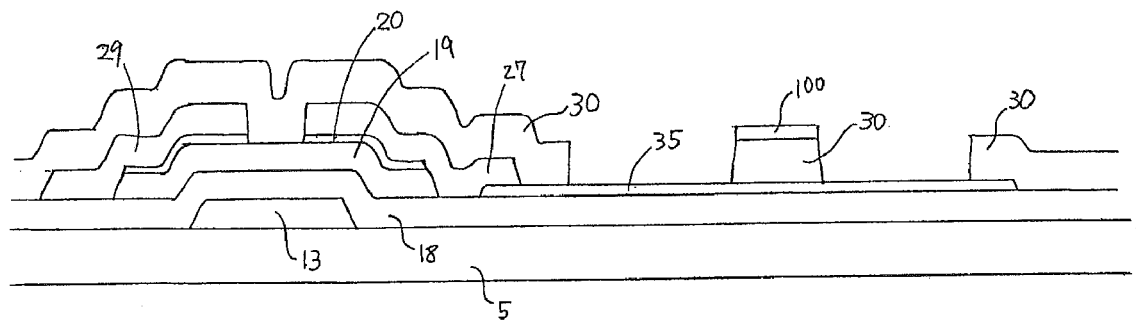
FIG. 107 is a cross-sectional view of the structure of a TFT matrix substrate that forms an alignment control electrode on a pixel electrode.
Figure 108:
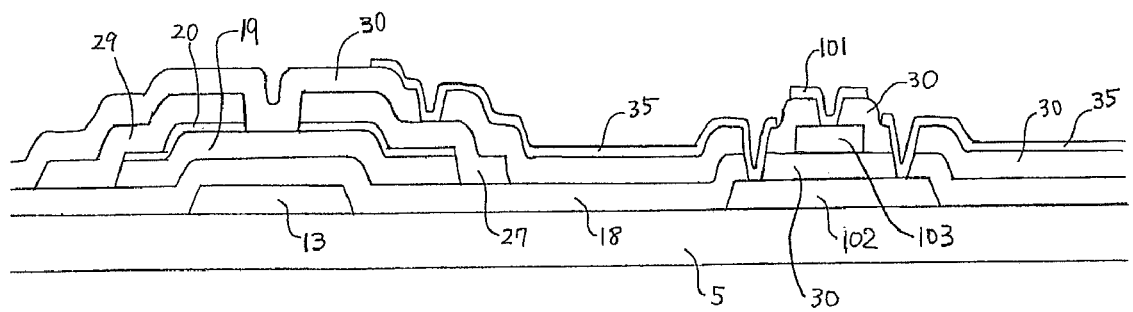
FIG. 108 is a cross-sectional view of the structure of a TFT matrix substrate that forms an alignment control electrode on a pixel electrode.
Figure 109:
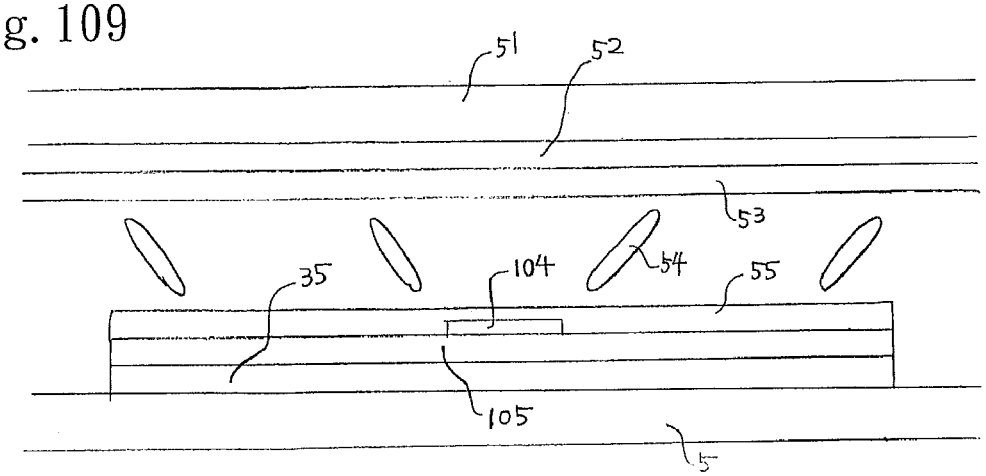
FIG. 109 is a cross-sectional view of the structure of a TFT matrix substrate that forms an alignment control electrode on a pixel electrode.
Figure 110:
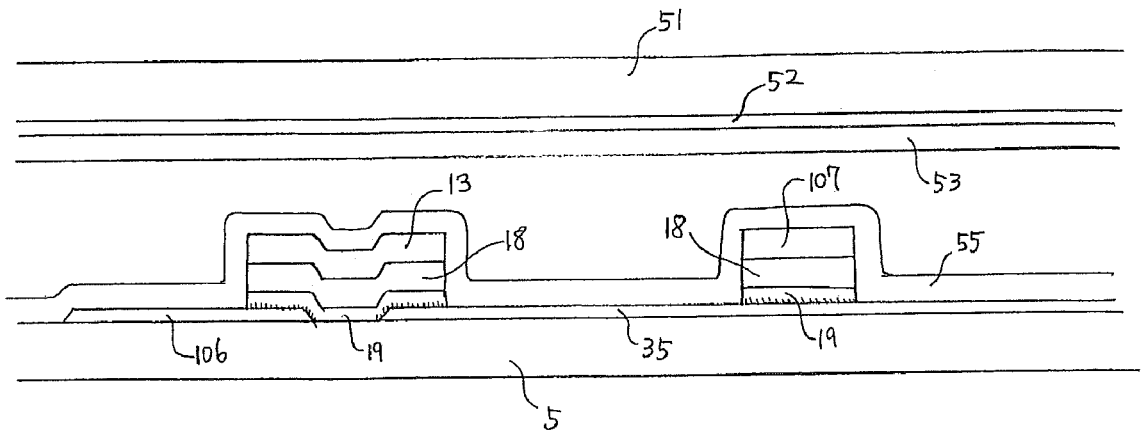
FIG. 110 is a cross-sectional view of the structure of a TFT matrix substrate that forms an alignment control electrode on a pixel electrode.
Figure 111:
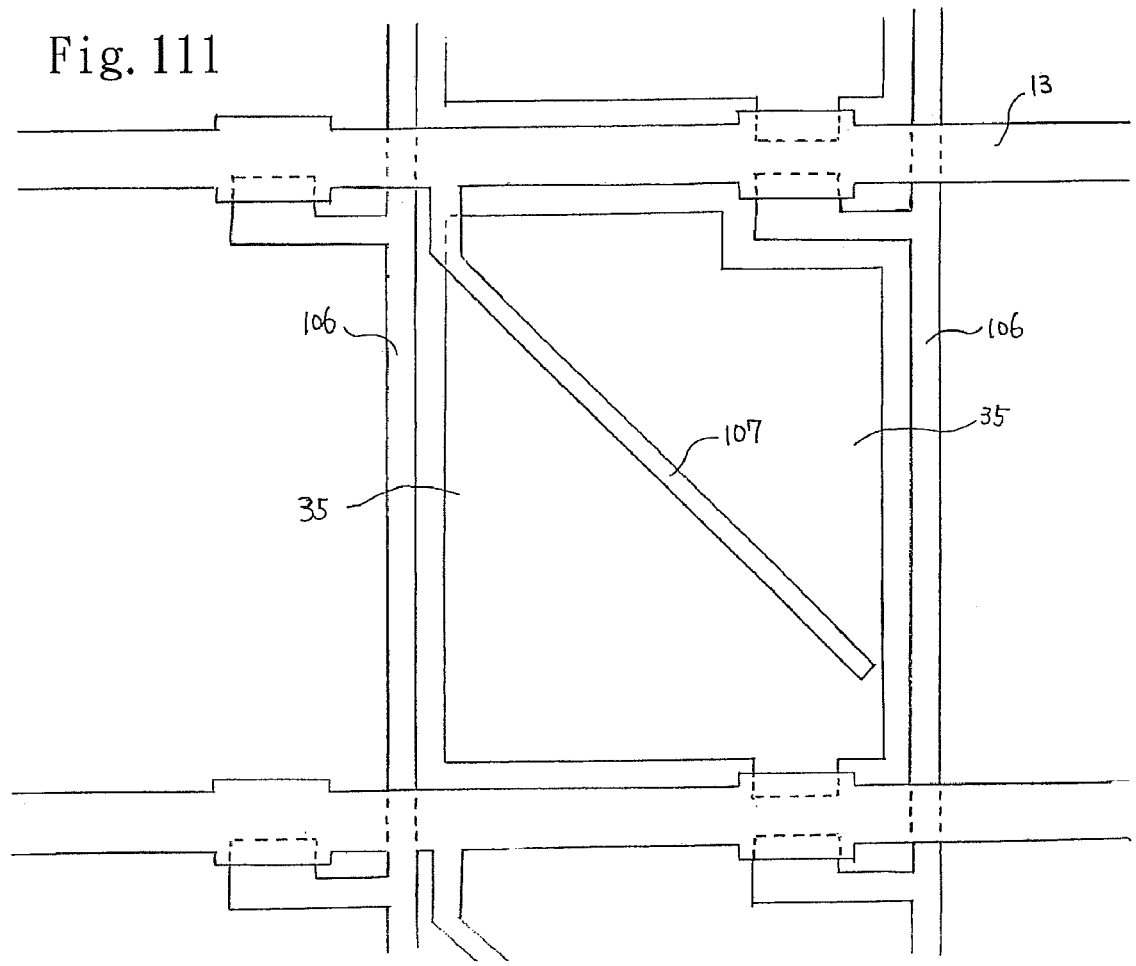
FIG. 111 is a planar view of the previous example as shown in FIG. 110 of which an alignment control electrode is formed on a pixel electrode and connected to a gate electrode.
Figures 118, 119:
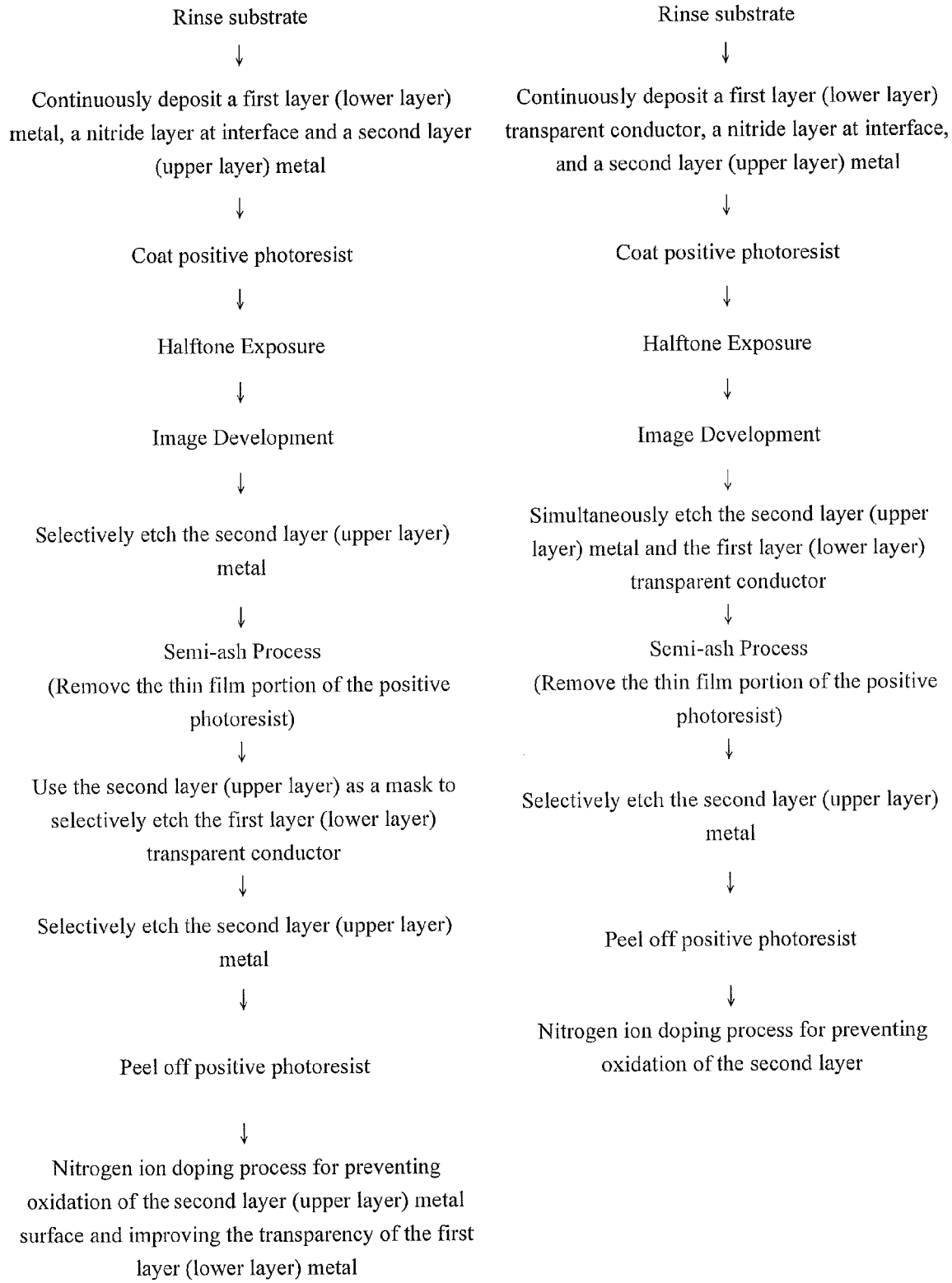
FIG. 118 illustrates a manufacturing flow that uses a halftone exposure method to form a pixel electrode in accordance with the present invention.
FIG. 119 illustrates a manufacturing flow that uses a halftone exposure method to form a pixel electrode in accordance with the present invention.

In the present invention as shown in FIGS. 15 and 17 uses Type B manufacturing process of FIG. 39 and three times of a photolithographic process for manufacturing the TFT substrate. In the first and second photolithographic processes, a halftone exposure method using a halftone mask is adopted to reduce one time of the photolithography. The present invention can manufacturing a TFT matrix substrate even by using Type B manufacturing process adopting a double exposure method of FIG. 78, Type B manufacturing process adopting a DMD of FIG. 83 or Type B manufacturing process adopting a DMD of FIG. 104, and three times of a photolithographic process. In the manufacturing process of the present invention, since the pixel electrode except the contact hole is covered completely by the gate insulating film, therefore the local cell reaction (or the Galvanic reaction) can be prevented, even if the source electrode or the drain electrode is made of any metal material. In the prior art as shown in FIGS. 245, 246, 107, 109 to 111, since the pixel electrode is not covered completely by the insulating film, therefore the local cell reaction cannot be prevented. Further, the prior art as shown in FIGS. 107 and 108 requires 5~6 times of the photolithographic process, and thus cannot lower the cost.

As shown in FIGS. 15 and 17, the alignment control electrode of the present invention is electrically coupled to the common electrode through the contact hole created on the gate insulating film. As shown in the cross-sectional views (in FIGS. 23 and 24), the alignment control electrode forms a capacitor by stacking the gate insulating film and the pixel electrode. Since the capacitor is used as a holdup capacitor (Cst), therefore Embodiment 22 does not require the holdup capacitor (Cst) forming electrode. Compared with Embodiment 22, this embodiment can produce a strong electric field between the alignment control electrode and the pixel electrode, and thus similar to the FFS mode similarly, it can achieve the fast response of liquid crystal molecules. As shown in the cross-sectional views of the present invention (in FIGS. 23 and 24), the transparent common electrode on a side of the color filter substrate is electrically coupled to the alignment control electrode on a side of the TFT substrate, and the prior art of FIGS. 245 and 246 does not indicate that the alignment control electrode and the transparent common electrode have the same electric potential. In the prior art of FIG. 245, an insulating film exists only in the region at the lower layer of the alignment control electrode, but not in other regions of the upper layer of the pixel electrode, so as to form a structure with the alignment film in direct contact with the pixel electrode. In this structure, the average electric potential of the pixel electrode is not equal to the average electric potential of the alignment control electrode, and DC current flows between the two electrodes, and the alignment film is electrolyzed, which may result ghosting easily. In the present invention, the pixel electrode except the contact hole is covered completely by the gate insulating film, and the alignment control electrode as shown in the cross-sectional views in FIGS. 23 and 24 is completely covered by the passivation film (P—SiNx). Even if the average electric potential of the pixel electrode is not equal to the average electric potential of the alignment control electrode, DC current will not flow to the two electrodes, and thus the electrolysis of the alignment film will not occur or the ghosting phenomenon will not happen.

Embodiment 24

Figure 18:
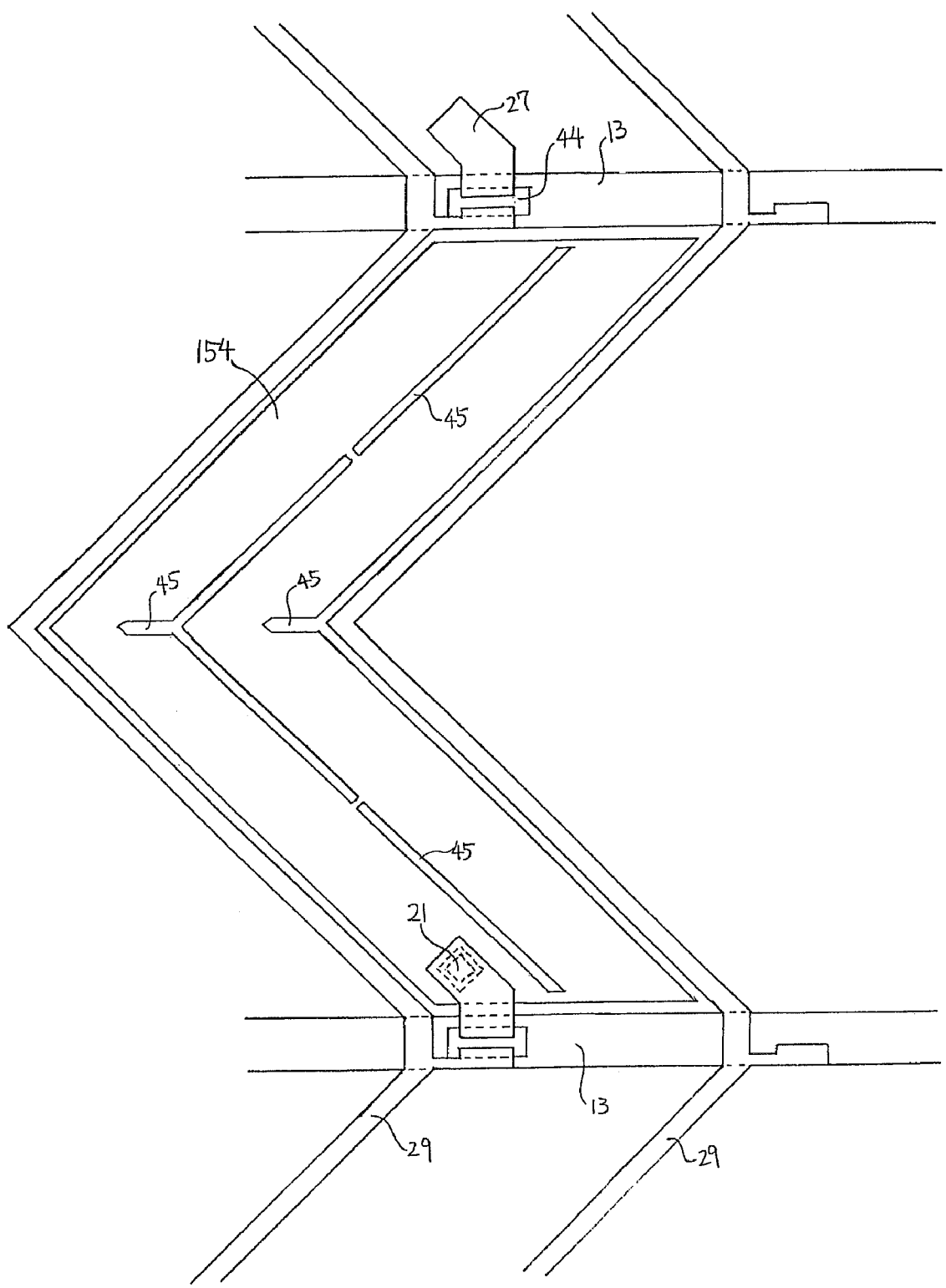
FIG. 18 is a planar view of a TFT matrix substrate that forms a slit used for a liquid crystal alignment control on a pixel electrode in accordance with the present invention.
Figure 22:
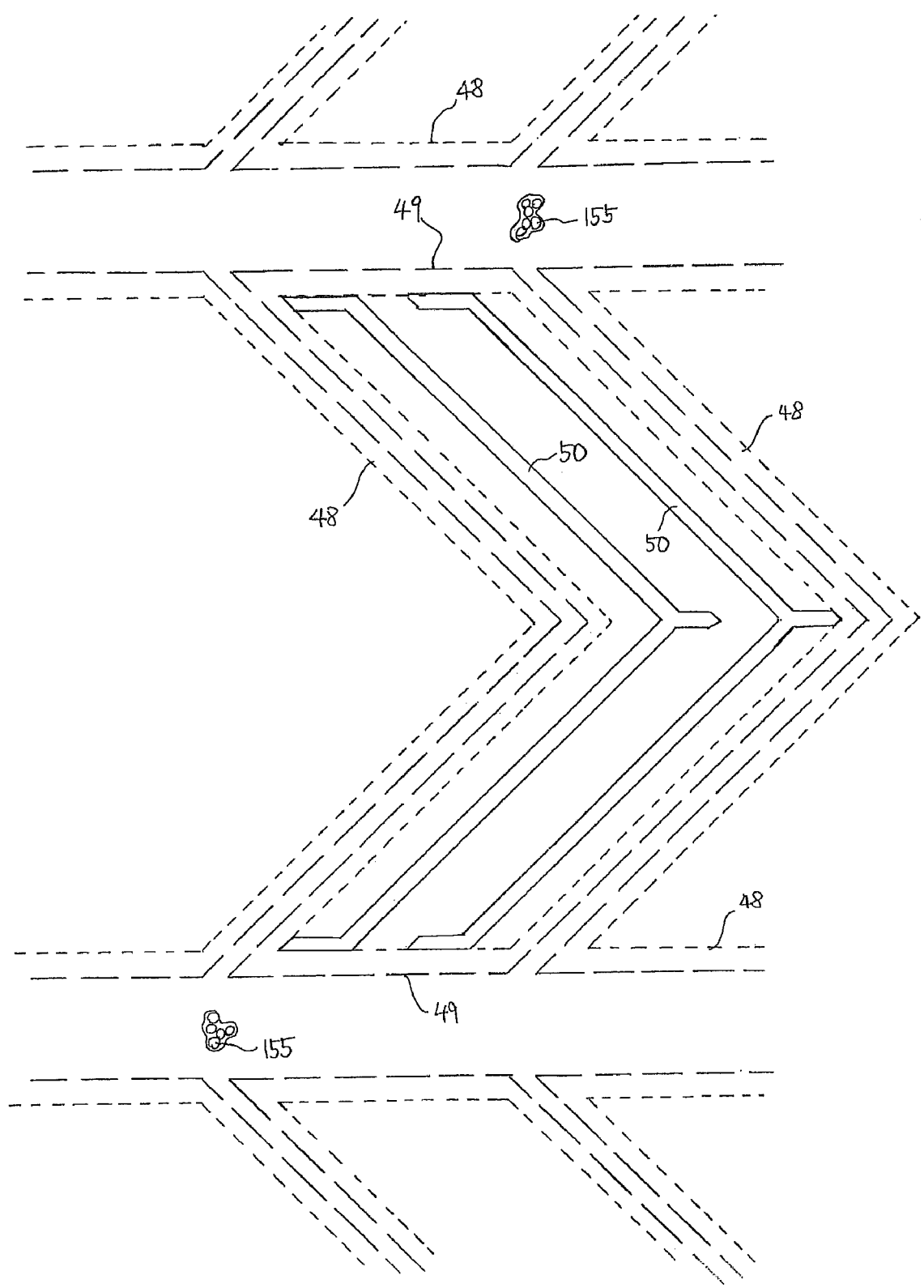
FIG. 22 is a planar view of a color filter substrate corresponding to the TFT matrix substrate as shown in FIG. 19 in accordance with the present invention.
Figure 102:
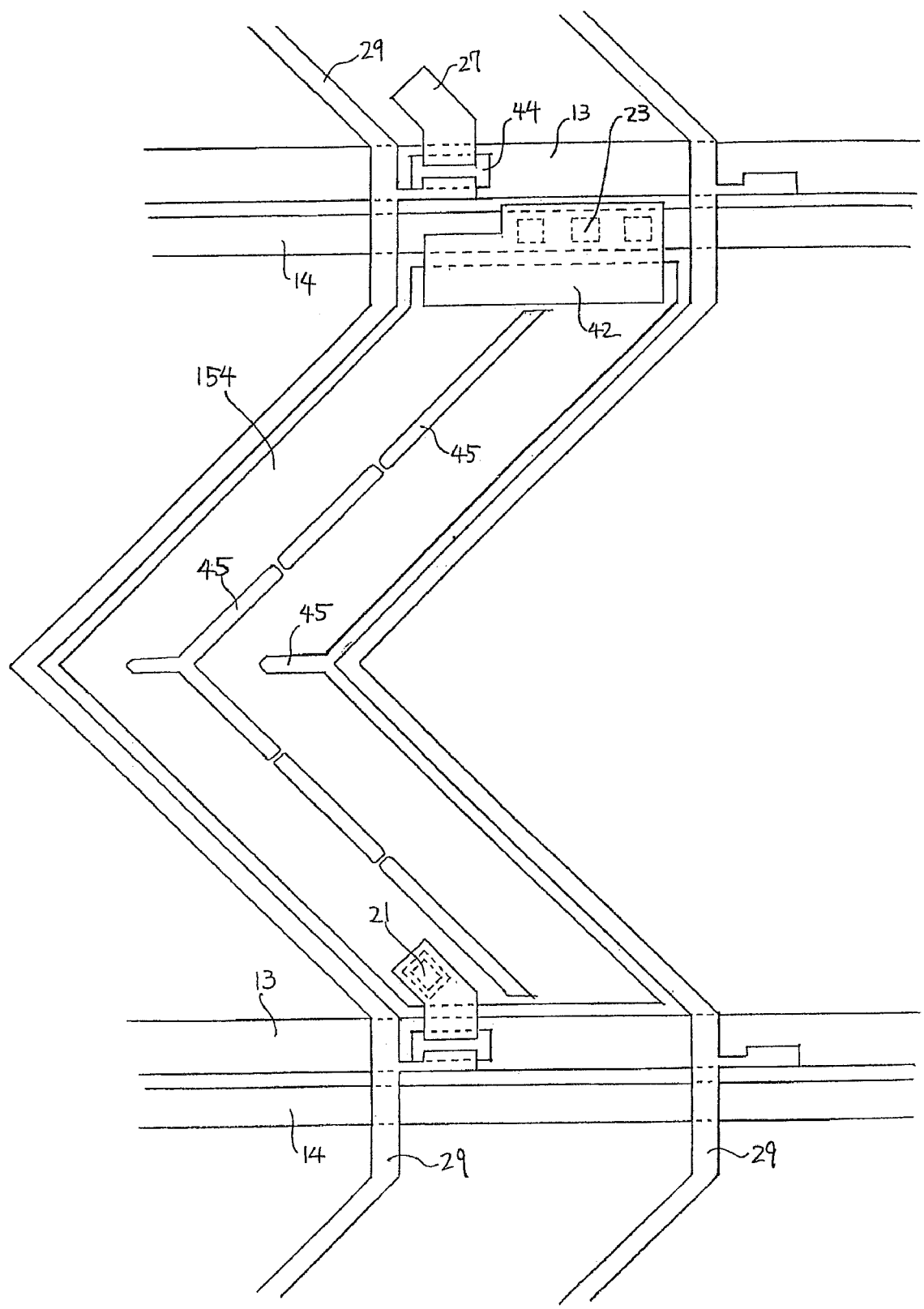
FIG. 102 is a planar view of a TFT matrix substrate that connects a holdup capacitor (Cst) forming electrode Cst to a common electrode in accordance with the present invention.

FIGS. 18, 102 and 242 show planar views of a MVA mode active matrix TFT substrate in accordance with Embodiment 24 of the present invention. The source electrode (video signal line) is bent to 90 degrees at a position proximate to the center of the pixel, and installed at an angle of ±45 degrees with respect to the gate electrode. The pixel electrode is also bent substantially in the same shape of the source electrode. One or more contact pads are disposed inside the pixel electrode and connected to the drain electrode of the thin film transistor component through the contact hole. Inside the pixel electrode, a slender alignment control slit for controlling the moving direction of the vertical alignment negative dielectric anisotropic liquid crystal molecules is formed substantially in the same shape of the source electrode, and bent to 90 degrees at a position proximate to the center of the pixel, and built at an angle of 45 degrees with respect to the gate electrode. FIG. 22 shows a color filter substrate corresponding to the TFT substrate. In FIG. 22, an alignment control protruding lump is formed on the color filter layer, and is bent to 90 degrees, similar to the BM corresponding to the source electrode, at a position proximate to the center of the pixel, and slenderly installed in the direction of ±45 degrees with respect to the BM of the gate electrode. FIG. 25 is a cross-sectional view of an LCD panel attached with the foregoing color filter substrate and the TFT substrate of FIGS. 18, 102 and 242. Alternatively, the alignment control protruding lump may not be used, but an alignment control slit, similar to the pixel electrode of the TFT substrate is installed on the common electrode of the color filter. FIG. 26 shows a cross-sectional view of an LCD panel attached with the color filter substrate an the TFT substrate of FIGS. 18, 102 and 242.

In FIG. 242, the a holdup capacitor forming electrode electrically coupled to the contact pad inside the pixel electrode through the contact hole and the common electrode form a capacitor by the gate insulating film. In FIG. 102, the holdup capacitor (Cst) forming electrode connected to the common electrode through the contact hole and the pixel electrode form a capacitor by the gate insulating film. In a large LCD TV, the pixel electrode and the common electrode on a side of the color filter form a larger pixel capacitor by the liquid crystals, and thus sometimes the holdup capacitor (Cst) forming electrode is not required as shown in FIG. 181. Since the pixel electrode of the present invention except the contact hole of the contact pad portion is covered completely by the gate insulating film, therefore no local cell reaction will occur, even if the pixel electrode is made of ITO or IZO, and the source electrode or the drain electrode is made of any aluminum series metal material. This portion of the invention, unlike the structure of the prior art, allows manufacturers to freely choose the materials.

In FIGS. 18, 102 and 242, Type A manufacturing process of FIG. 38 and three times of photolithographic process are used for manufacturing a TFT matrix substrate. In the first and second photolithographic processes, a halftone exposure method using a halftone mask is adopted to reduce one time of the photolithography. The present invention can manufacture the TFT matrix substrate, even by the Type A manufacturing process adopting a double exposure method of FIG. 77, Type A manufacturing process adopting a DMD of FIG. 82 or Type A manufacturing process adopting a DMD of FIG. 103.

Embodiment 25

Figure 19:
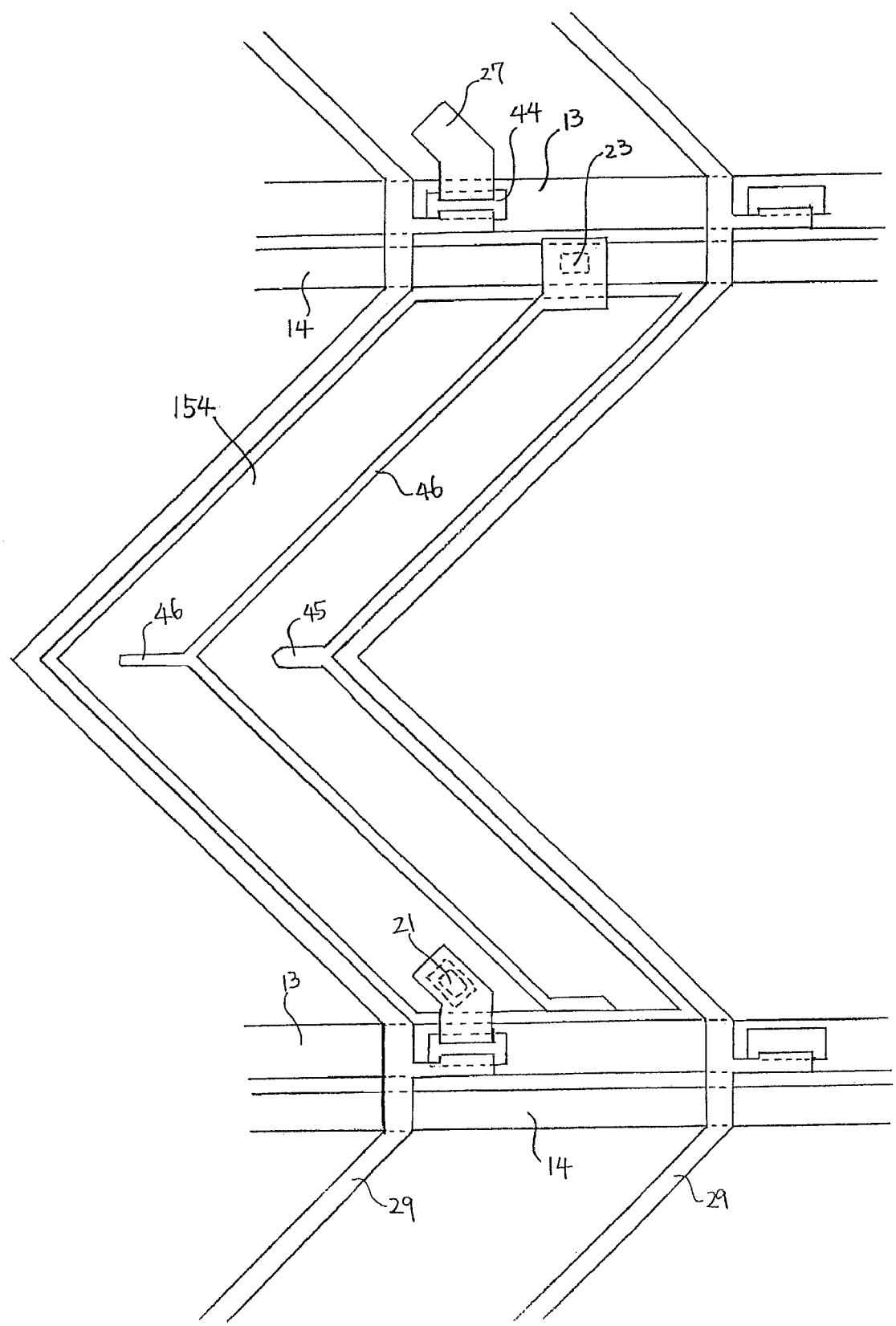
FIG. 19 is a planar view of a TFT matrix substrate that connects a liquid crystal alignment control electrode to a common electrode in accordance with the present invention.
Figure 53:
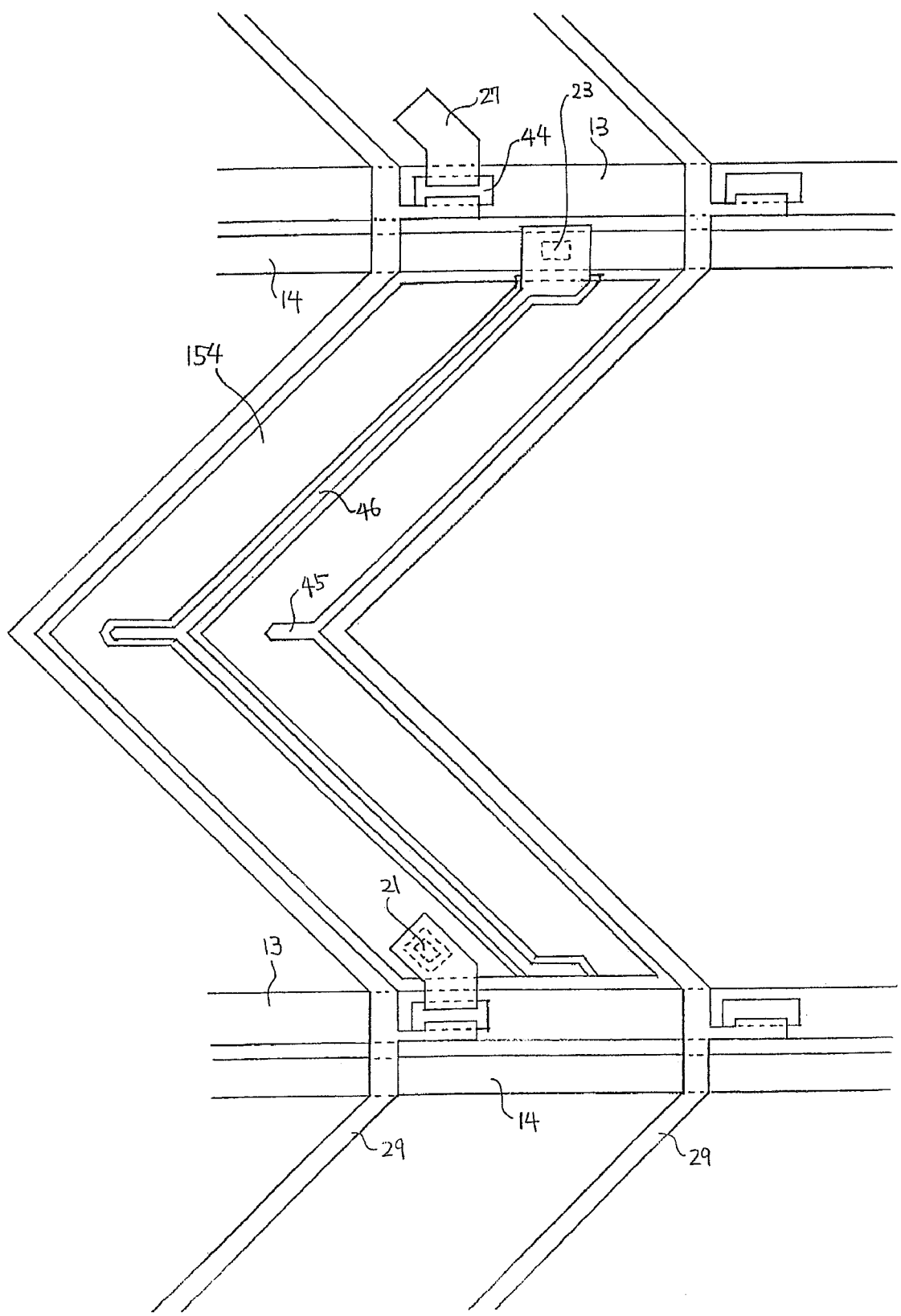
FIG. 53 is a planar view of a TFT matrix substrate that connects a liquid crystal alignment control electrode to a common electrode in accordance with the present invention.

FIGS. 19 and 53 are planar views of a MVA mode active matrix TFT substrate in accordance with Embodiment 25 of the present invention. The source electrode (video signal line) is bent to 90 degrees at a position proximate to the center of the pixel, and installed at an angle of ±45 degrees with respect to the gate electrode. The pixel electrode is substantially in the same shape of the source electrode, and bent to 90 degrees at a position proximate to the center of the pixel. One or more contact pads are disposed inside the pixel electrode, and connected to the drain electrode of the thin film transistor component through the contact hole. The pixel electrode except the contact hole is covered completely by the gate insulating film and disposed on the gate insulating film for controlling the moving direction of the vertical alignment negative dielectric anisotropic liquid crystal molecules, so as to form the alignment control electrode. The alignment control electrode of the present invention is also substantially in the same shape of the source electrode, and bent to 90 degrees at a position proximate to the center of the pixel, and installed at an angle of ±45 degrees with respect to the gate electrode. The alignment control electrode is connected to the common electrode through the contact hole on the gate insulating film. FIG. 22 shows a color filter substrate corresponding to the TFT substrate of FIGS. 19 and 53. An alignment control protruding lump of FIG. 22 is formed on the color filter layer, and the BM (light-shielding film) corresponding to the source electrode is similarly bent to 90 degrees at a position proximate to the center of the pixel, and installed slenderly upward in a direction of ±45 degrees with respect to the BM of the gate electrode. FIG. 23 is a cross-sectional view of an LCD panel attached with the foregoing color filter substrate and the TFT substrate of FIG. 19. Alternatively, the alignment control protruding lump is not be used, but an alignment control slit is installed on the common electrode of the color filter instead. FIG. 24 is a cross-sectional view of an LCD panel attached with the color filter substrate and the of TFT substrate of FIG. 19.

Figure 54:
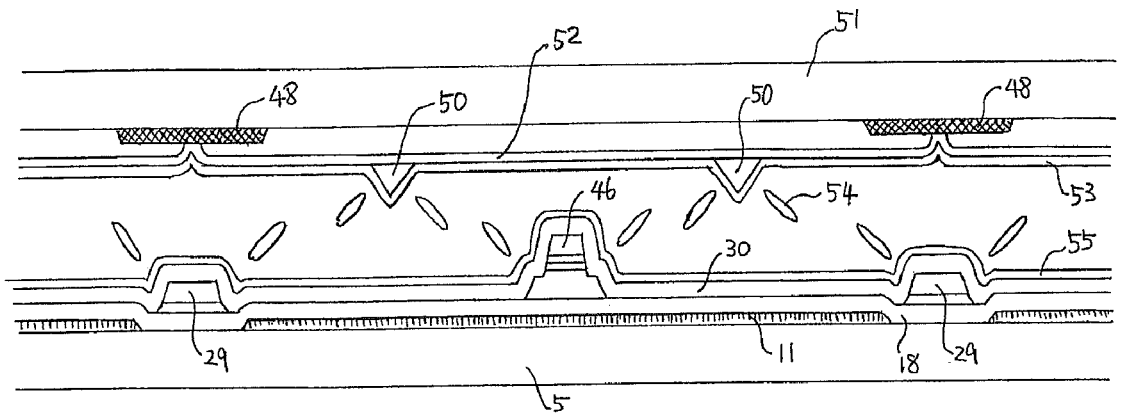
FIG. 54 is a cross-sectional view of a MVA mode LCD panel that uses a liquid crystal alignment control electrode and a liquid crystal alignment control protruding lump in accordance with the present invention.
Figure 55:
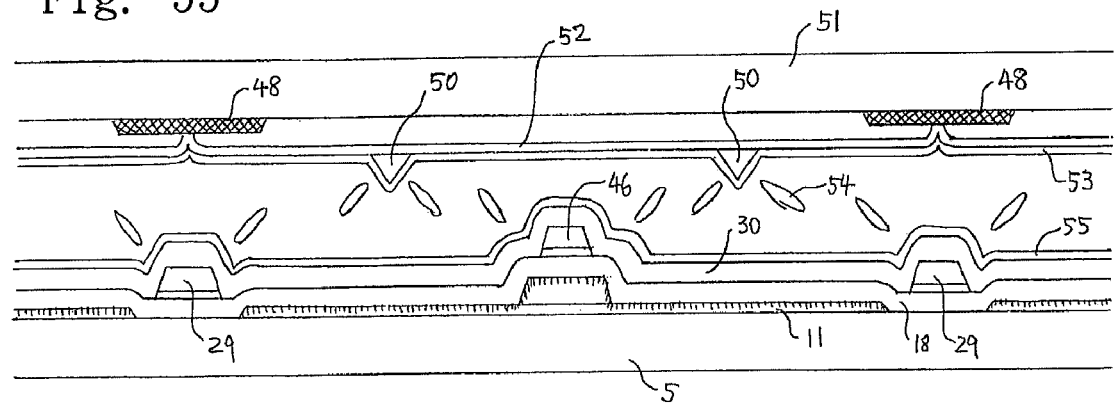
FIG. 55 is a cross-sectional view of a MVA mode LCD panel that uses a liquid crystal alignment control electrode and a liquid crystal alignment control protruding lump in accordance with the present invention.
Figure 56:
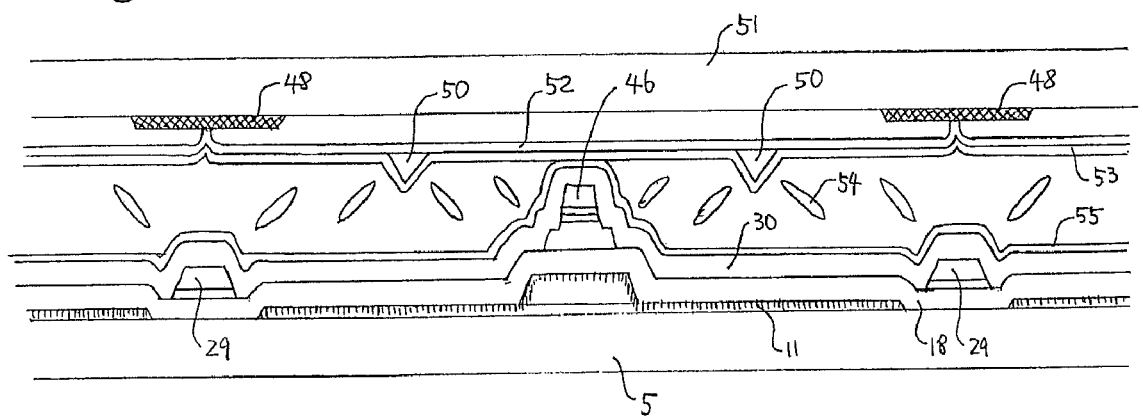
FIG. 56 is a cross-sectional view of a MVA mode LCD panel that uses a liquid crystal alignment control electrode and a liquid crystal alignment control protruding lump in accordance with the present invention.

FIGS. 54 to 56 are cross-sectional views of an LCD panel attached with the TFT substrate of FIG. 53 and the color filter substrate of FIG. 22. The lower layer of the alignment control electrode of FIG. 54 has a width slightly larger than the width of the alignment control electrode, and installed along the alignment control electrode and substantially in the same shape on the thin film semiconductor layer. In FIG. 55, the lower layer of the alignment control electrode having a width larger than the width of the alignment control electrode width is installed along the alignment control electrode and substantially in the same shape with the same metal layer of the contact pad. In FIG. 56, the lower layer of the alignment control electrode having a width slightly larger than the width of the alignment control electrode is installed along the alignment control electrode, and substantially in the same shape with two same metal layers: the thin film semiconductor layer and the contact pad. In FIGS. 54 to 56, the higher the alignment control electrode with respect to the height of the pixel electrode, the easier is the movement of the vertical alignment negative dielectric anisotropic liquid crystal molecules, and the faster is the response. In FIGS. 54 to 56, an alignment control protruding lump is disposed on a side of the color filter substrate, but the alignment control protruding lump can be substituted by an alignment control slit formed on the common electrode of the color filter substrate.

FIGS. 245, 246, and 107 to 111 show the prior arts of an alignment control electrode installed on the pixel electrode or common electrode through an insulator for controlling the moving direction of the vertical alignment negative dielectric anisotropic liquid crystal molecules. These prior arts are described in Japanese Patent Laid-Open Publication No. 07-230097, Japanese Patent Published Unexamined Application No. 11-109393, Japanese Patent Laid-Open Publication No. 2001-042347 in details, and Japanese Patent Laid-Open Publication No. 2001-042347 only provides cross-sectional views and without any planar views, and it does not discuss which direction are the negative dielectric anisotropic liquid crystal molecules inclined. As to the shape of the alignment control electrode, it is very important to the LCD panel. If the method of applying an electric potential to the alignment control electrode is not discussed, physical design cannot be performed. Japanese Patent Published Unexamined Application No. 07-230097 and Japanese Patent Published Unexamined Application No. 11-109393 provide planar views, and thus they can be used for comparing the difference with the present invention. Both Japanese Patent Published Unexamined Application No. 07-230097 and Japanese Patent Published Unexamined Application No. 11-109393 use an electric field distortion occurred at the periphery of the pixel electrode and an electric field distortion produced between the pixel electrode and the alignment control electrode to determine the inclined direction of the liquid crystal molecules. Both aforementioned patents install an alignment control electrode on a side of the TFT substrate, and at the common electrode of a substrate corresponding to a side of the TFT substrate and without installing an installed alignment control slit or alignment control protruding lump. This structure such as a TFT LCD panel of a very small pixel size for mobile phones can make use of the electric field distortion occurred at the periphery of the pixel electrode to achieve the purpose of moving the liquid crystal molecules upward, but if the pixel size is over 100 μm, then the aforementioned prior art electrode structure cannot be used anymore, because the moving speed of the liquid crystal molecules is very slow.

For large LCD TV panels, if the pixel electrode size is over 150 μm, as shown in FIGS. 23, 24, and 54 to 56 of the present invention, the TFT substrate of an alignment control electrode is formed. If the alignment control slit or alignment control protruding lump is not formed at the common electrode of the color filter substrate corresponding to the TFT substrate, then a fast response of liquid crystal molecules and a good animation display cannot be achieved.

In FIGS. 19 and 53, the pixel electrode that is bent to 90 degrees except the contact hole is covered completely by the gate insulating film, and thus no local cell reaction such as the Galvanic reaction will occur, even if the alignment control electrode is patterned. When dry etching is used for the manufacturing or patterning process, Galvanic reaction will not occur during the manufacturing process, even if the pixel electrode is exposed. However, when the positive photoresist is peeled off, Galvanic reaction may occur in the peeling liquid. In the present invention, the Galvanic reaction can still be prevented during the peeling process. In FIGS. 19 and 53, Type B manufacturing process of FIG. 39 and three times of photolithographic process can be used for manufacturing a TFT substrate in accordance with the present invention. In the first and second photolithographic processes, the halftone exposure method adopting a halftone mask can reduce the number of times of the photolithographic process. The TFT matrix substrate of the present invention can be manufactured even by using the Type B manufacturing process adopting a double exposure method of FIG. 78, the Type B manufacturing process adopting a DMD of FIG. 83 or the Type B manufacturing process adopting a DMD of FIG. 104.

In FIGS. 19 and 53, only one alignment control electrode is installed in the unit pixel, and it simply needs to increase the quantity of alignment control electrodes to two or three as the pixel size becomes larger. There are only two alignment control protruding lumps or alignment control slits on a side of the color filter substrate only in the unit pixel of FIG. 22. However, if two alignment control electrodes are installed, it requires three alignment control protruding lumps or alignment control slits. If the present invention installs a quantity of n alignment control electrodes in the unit pixel of the TFT substrate, then it requires (n+1) alignment control protruding lumps or alignment control slits in the unit pixel of the color filter substrate. If a plurality of alignment control electrodes are installed, the alignment control electrodes are preferably installed with a distance of 20~60 μm apart from each other. If the distance between alignment control electrodes is less than 20 μM, the light transmission rate will drop significantly. If the distance is larger than 60 μm, the movement of the liquid crystal molecules will be slow, even when the transmission rate is improved. Thus, it will cause problems to the animation display. Although the light transmission rate is important to the large LCD TV, a fast response of liquid crystal molecules is more important. Since the response speed of the liquid crystal molecules is indirectly proportional to the intensity of electric field, therefore an alignment control electrode having an electric field larger than that of the alignment control slit is applicable to the LCD TV. However, even if the alignment control electrode, as shown in the prior art of FIG. 245, makes use of the electric field distortion occurred at the periphery of the pixel electrode 35 and the electric field distortion of the pixel electrode of the alignment control electrode for controlling the liquid crystal molecules. In the case of FIG. 245, no alignment control protruding lump or alignment control slit is installed on the common electrode 14 corresponding to the pixel electrode 35, such that if the distance from an edge of the pixel electrode to the alignment control electrode is over 30 μm, the moving speed of the liquid crystal molecules drops drastically. Furthermore, the moving direction of the negative dielectric anisotropic liquid crystal molecules is not consistent as shown in FIG. 245, and thus an identification line will be produced between the alignment control electrode and an edge of the pixel electrode 35. In the identification line of the structure of FIG. 245 is not fixed, but keeps moving, and thus a stable condition cannot be achieved.

The occurrence of an identification line drastically reduces the light transmission rate and gives inconsistent screens. In the prior art of FIG. 246, the moving direction of the negative dielectric anisotropic liquid crystal molecules is inconsistent, and thus the aforementioned identification line will not occur. However, such structure cannot solve the problem of having a drastic drop of moving speed of the liquid crystal molecules when the size of the pixel electrode is over 100 μm. Furthermore, this structure must be formed on the alignment control electrode at the upper layer of the common electrode 14, and set to the same electric potential of the pixel electrode 35. Even if the principle is workable, the cost of the structure of FIG. 246 is very high, and cannot be used for mass production.

Finding a way of preventing an LCD panel to have an identification line or the occurrence of the identification line becomes an important subject to manufacturers. In FIGS. 19 and 53 of the present invention, an alignment control slit at the curved portion of the pixel electrode is bent to 90 degrees to prevent the occurrence of the identification line. The curved portion bent to 90 degrees on the alignment control electrode divides the alignment control electrode, with a length approximately equal to ¼ of the pixel electrode width protruded from the structure in the direction parallel to the gate electrode.

The structure with a curved portion bent to 90 degrees on the alignment control electrode that divides the alignment control electrode, with a length approximately equal to ¼ of the width of the pixel electrode protruded from the structure in the direction parallel to the gate electrode used on a side of the common electrode of the pixel electrode and an edge of the gate electrode.

To prevent the occurrence of the identification line, alignment control protruding lump on a side of the color filter substrate of the FIG. 22 similarly has a curved portion which is bent to 90 degrees and has a length of ¼ of the width of the pixel electrode width, such that the alignment control protruding lump is protruded to a direction parallel to the gate electrode. The alignment control protruding lump proximate to the BM and parallel to the gate electrode parallel as shown in FIG. 22 also has a length of ¼ of the width of the pixel electrode width, and is protruded in a direction parallel to the gate electrode.

Embodiment 26

FIGS. 188, 186, 190, 198 and 199 are planar views of a MVA mode active matrix TFT substrate in accordance with Embodiment 26 of the present invention, and the substrate is manufactured by a manufacturing process substantially the same as Embodiment 22 and adopts the design method of the same concept, and the only difference resides on that the distribution density of the alignment control slits in the pixel electrode is uneven, and there are two or more different densities. With the densely arranged alignment control slits, the response speed of the liquid crystal molecules can be improved, but the transmission rate is decreased. With the densely arranged alignment control slit, the threshold voltage for driving the liquid crystals can be reduced slightly. If the aforementioned threshold voltage is maintained at a certain specific level, the driving voltage for changing the brightness from a black level to a grey can be controlled to slow down the change, so as to suppress the occurrence of uneven display.

The source electrode (video signal line) of the present invention is linear and perpendicular to the gate electrode, and the BM of the color filter substrate and the color filter layer are also slenderly disposed. If such linear color filter layer is used,

Embodiment 27

FIGS. 187, 191 to 193 are planar views of a MVA mode active matrix TFT substrate in accordance with Embodiment 27 of the present invention, the substrate is manufactured by a manufacturing process substantially the same as Embodiment 23 and adopts the design method of the same concept. The only difference resides on that: the distribution density of the alignment control electrode formed on the upper layer of the gate insulating film that is covered onto the pixel electrode is uneven, and there are two or more densities. With the densely arranged alignment control electrode, the response speed of the liquid crystal molecules is improved, but the light transmission rate is dropped. The densely arranged alignment control electrode can slightly reduce the threshold voltage for driving the liquid crystals. If the aforementioned threshold voltage is maintained at a certain specific level, the driving voltage for driving the brightness from a black level to a grey can be controlled to slow down the change, so as to suppress the occurrence of uneven display. Compared with Embodiment 26 of the present invention, this embodiment can produce a strong electric field, and thus can achieve the fast response of the liquid crystal molecules.

Embodiment 28

Figures 87, 88:
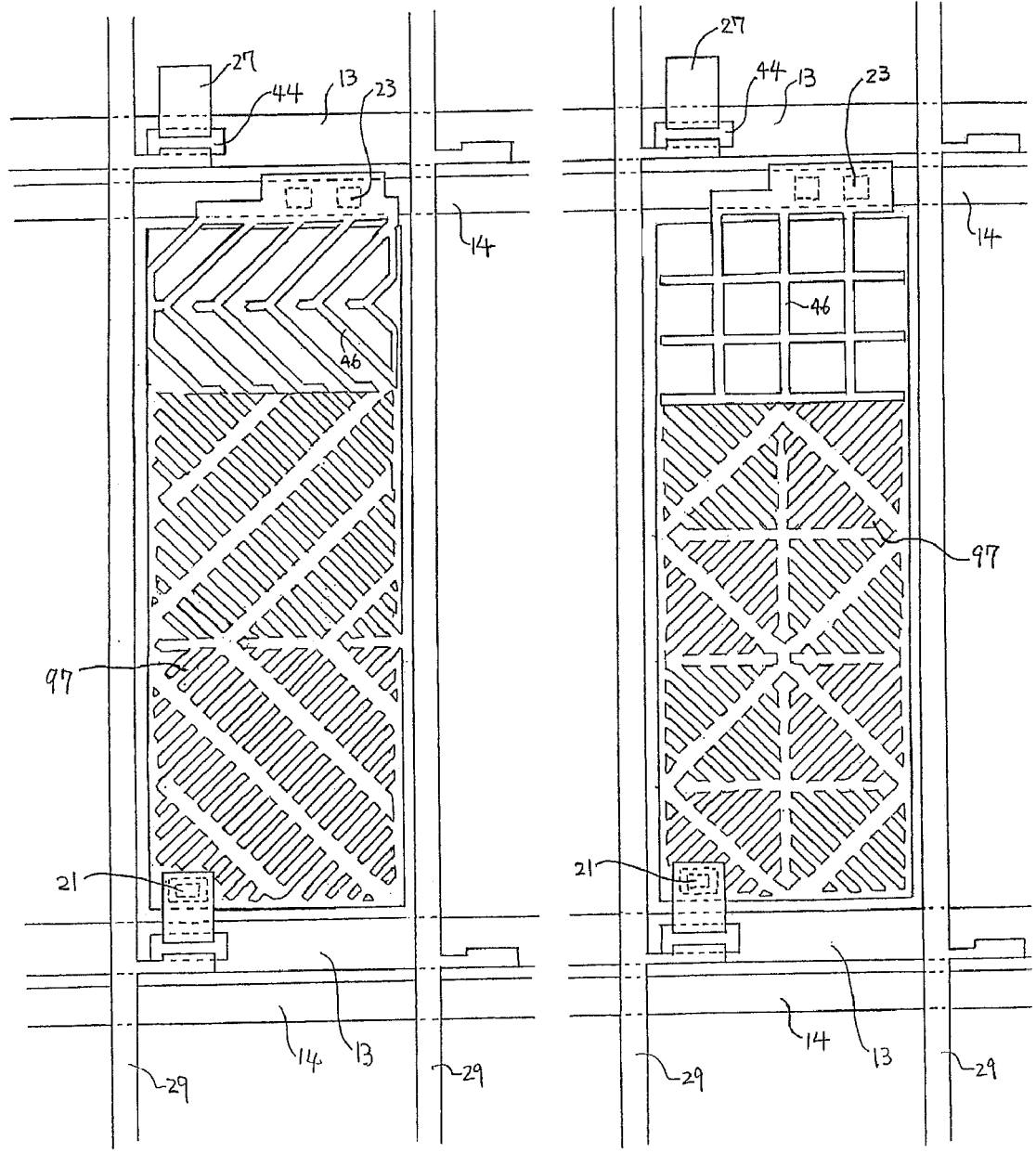
FIG. 87 is a planar view of a TFT matrix substrate of a pixel electrode adopts a slit that uses a liquid crystal alignment control electrode and a liquid crystal alignment control in accordance with the present invention.
FIG. 88 is a planar view of a TFT matrix substrate of a pixel electrode adopts a slit that uses a liquid crystal alignment control electrode and a liquid crystal alignment control in accordance with the present invention.
Figure 89:
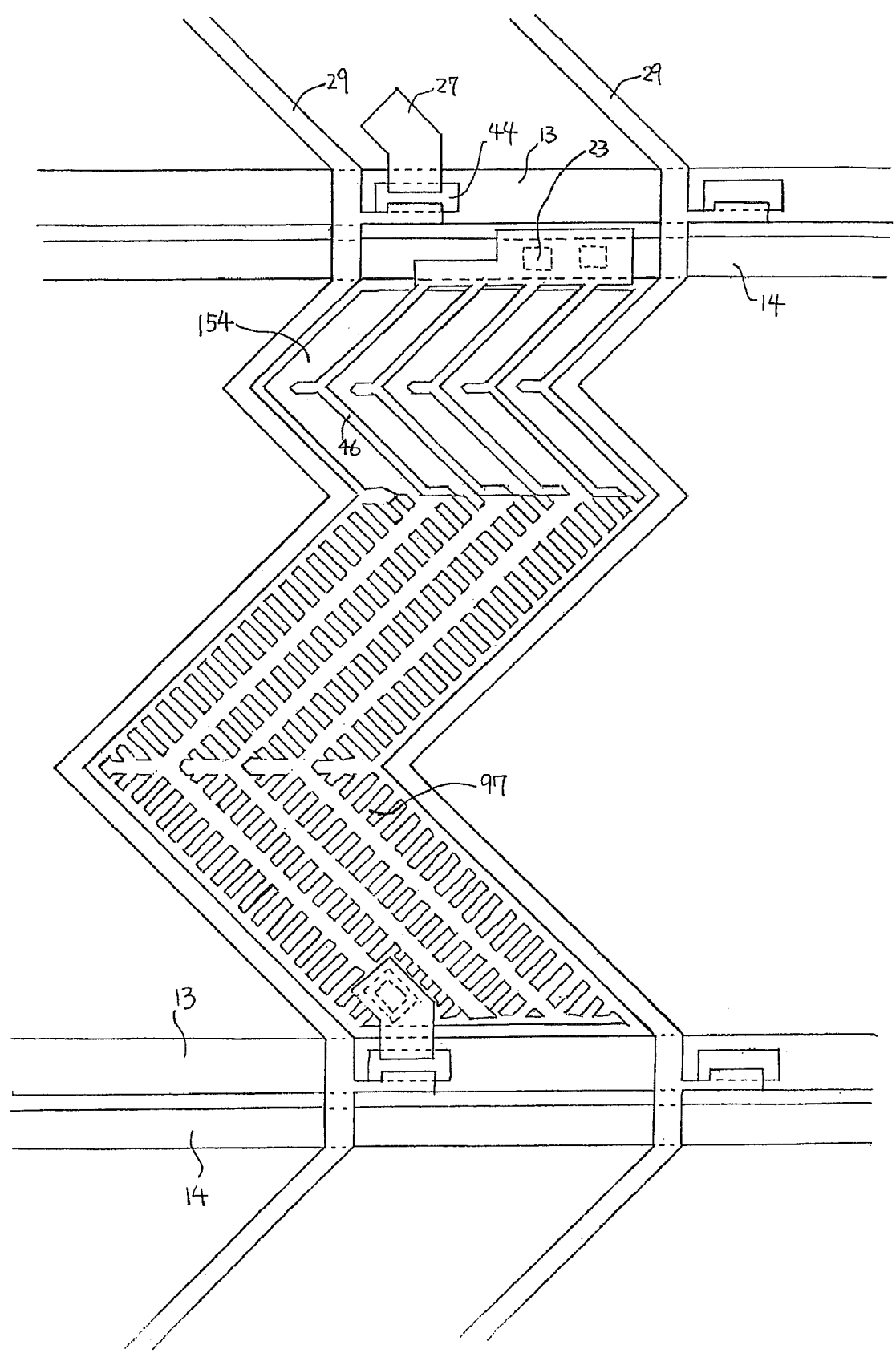
FIG. 89 is a planar view of a TFT matrix substrate of a pixel electrode adopts a slit that uses a liquid crystal alignment control electrode and a liquid crystal alignment control in accordance with the present invention.
Figure 90:
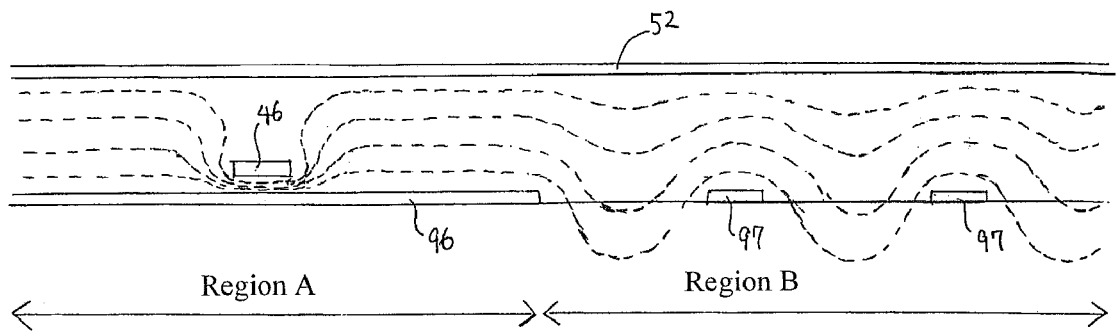
FIG. 90 is a schematic view of the distribution of equipotential lines in a portion of a liquid crystal cell that uses the TFT matrix substrate as shown in FIGS. 87, 88 and 89 for the manufacture.
Figure 91:
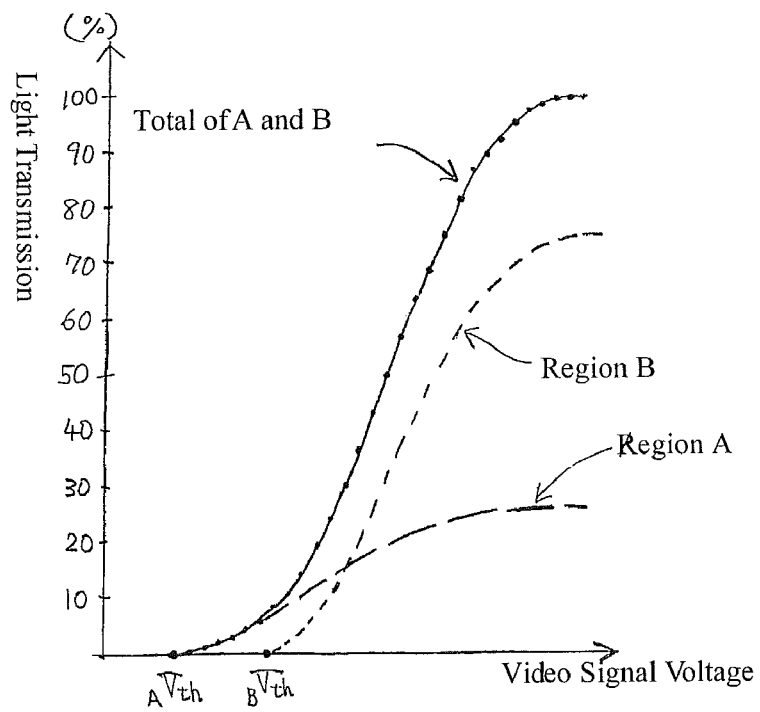
FIG. 91 shows the relation of applied voltage and brightness of the liquid crystal cell as shown in FIG. 90.

FIGS. 87, 88 and 189 are planar views of a MVA mode active matrix TFT substrate in accordance with Embodiment 28 of the present invention. The present invention is shown in FIG. 90 and characterized in that both alignment control electrode and alignment control slit are adopted in unit pixel for controlling the moving direction of negative dielectric anisotropic liquid crystal molecules. Since the intensity of electric field in Region A as shown in FIG. 90 is stronger than that in Region B, therefore the threshold voltage for driving liquid crystals in Region A is smaller than that in Region B. In FIGS. 87 88, and 189, the area of Region A is equal to ⅓ to ½ of the area of Region B as shown in FIG. 91, for controlling and slowing down the change of brightness from a black level to a grey, so as to suppress the occurrence of uneven display. Further, the γ property in the region changed from the black level to the gray level can be improved, and thus the viewing angle in the region changed from the black level to the gray level can be extended. Since the display of the region changed from the black level to the gray level can be performed in Region A with a strong electric field, therefore the response speed in the region changed from the black level to the gray level in the MVA mode can be improved.

FIG. 243 is a cross-sectional view of an LCD panel that stacks the TFT substrate with and the color filter substrate of the alignment control protruding lump in accordance with the present invention. FIG. 244 is a cross-sectional view of an LCD panel that stacks the TFT substrate with the color filter substrate of the alignment control slit in accordance with the present invention. The pixel electrode and alignment control electrode in Region A form a capacitor by the gate insulating film. Although the pixel electrode in Region B of FIGS. 87 and 88 is manufactured into a complicated slit, yet the shape determines the performance of controlling the moving direction of the liquid crystal molecules. The source electrode (video signal line) is linear and perpendicular to the gate electrode. If this structure is adopted, the BM (light-shielding film) of the source electrode corresponding to a side of the color filter substrate and the color filter layer are formed linearly, so that a planographic printing method or an ink-jet printing method can be used easily for the manufacture, and thus lowering the cost.

Embodiment 29

FIGS. 194, 213, 219, 220 and 225 are planar views of a MVA mode active matrix TFT substrate in accordance with Embodiment 29 of the present invention. The substrate can be manufactured by a manufacturing process substantially the same as Embodiment 24 and adopts the design method of the same concept. The difference of this embodiment from Embodiment 24 resides on that the distribution density of the alignment control slits in the pixel electrode is uneven, and there are two or more distribution densities. With the densely arranged alignment control slit, the response speed of the liquid crystal molecules is improved, but the light transmission rate is dropped. With the densely arranged alignment control slit, the threshold voltage for driving liquid crystals can be reduced slightly. If the aforementioned threshold voltage is maintained at a certain specific level, the driving voltage for driving the brightness from a black level to a grey can be controlled to slow down the change, so as to suppress the occurrence of uneven display.

In FIG. 194, the source electrode (video signal line) is bent to 90 degrees at a position proximate to the center of the pixel and installed with an angle of ±45 degrees with respect to the gate electrode. The pixel electrode and the alignment control slit formed inside the pixel electrode, similar to the source electrode, are bent to 90 degrees at a position proximate to the center of the pixel, and installed at an angel of ±45 degrees with respect to the gate electrode. FIG. 214 shows a color filter substrate corresponding to the TFT substrate. In FIG. 214, an alignment control protruding lump is used for controlling the moving direction of liquid crystal molecules, but an alignment control slit can be formed on the common electrode instead, and is characterized in that the alignment control slit formed inside the pixel electrode as shown in FIG. 194 and the alignment control protruding lump formed at the upper layer of the common electrode as shown in FIG. 214 have inconsistent distance. By designing an alignment control slit and an alignment control protruding lump such that the area of the region with a larger distance is equal to 2~3 times of the area of the region with a smaller distance of the alignment control slit and alignment control protruding lump, a good optical characteristic can be achieved.

In FIG. 220, the source electrode in the unit pixel is bent to 90 degrees for two times, and installed at an angel of ±45 degrees with respect to the gate electrode. The pixel electrode is bent substantially in the same shape of the source electrode. The distribution density of the alignment control slits in the pixel electrode is uneven, and is divided into two regions: a region with a high distribution density and a region with a low distribution density. The area of the region with a low distribution design is equal to 2~3 times of the area of the region with a high distribution density. In both of the foregoing two regions, the source electrode, the pixel electrode and the alignment control slit of each region are bent to 90 degrees at the halfly divided position. FIG. 224 shows a color filter substrate corresponding to the TFT substrate of FIG. 220. In FIG. 224, similar to FIG. 220, the distribution density of the alignment control protruding lumps is uneven, and there are two regions: a region with a high distribution density and a region with a low distribution density. Even if the alignment control protruding lump is substituted by the alignment control slit formed on the common electrode of the color filter substrate, the moving direction of liquid crystal molecules can be controlled.

In FIGS. 219 and 225, the source electrode in the unit pixel is bent to 90 degrees for three times and installed at an angel of ±45 degrees with respect to the gate electrode. The pixel electrode is bent substantially in the same shape of the source electrode. Substantially similar to FIG. 220, the alignment control slits in the pixel electrode have uneven distribution densities, and are divided into two regions: a region with a high distribution density and a region with a low distribution density. The area of the region with a low distribution density is designed to be equal to 2~3 times of the area of the region with a high distribution density. With this ratio of areas the best optical characteristic can be achieved. In the foregoing two regions, the source electrode, pixel electrode and the alignment control slit are bent to 90 degrees at three positions: the halfly divided position of each region and the periphery of the two regions. FIG. 215 shows a color filter substrate corresponding to the TFT substrate of FIG. 219. FIG. 215, similar to FIG. 219, the alignment control protruding lump has uneven distribution density and is divided into two regions: a region with a high distribution density and a region with a low distribution density. Even if the alignment control protruding lump is substituted, and an alignment control slit is formed on the common electrode of the color filter substrate instead, the moving direction of liquid crystal molecules can be controlled.

In FIG. 213, the regions with different distribution densities of the alignment control slit is cut off by the common electrode, and the cut off pixel electrode is electrically coupled through the a holdup capacitor forming electrode (Cst). The two pixel electrodes cut off by the common electrode form a contact pad coupled to the a holdup capacitor forming electrode (Cst), and coupled to the holdup capacitor (Cst) forming electrode through the contact hole created on the gate insulating film.

Embodiment 30

FIGS. 195, 221, 196 and 226 are planar views of a MVA mode active matrix TFT substrate in accordance with Embodiment 30 of the present invention, and the substrate is manufactured by a manufacturing process substantially the same as Embodiment 25, and adopts the design method of the same concept. The difference of this embodiment from Embodiment 25 resides on that the alignment control electrode formed on the upper layer of the gate insulating film that is covered onto the pixel electrode has an uneven distribution density, and there are two or more different distribution densities in the unit pixel. With the densely arranged alignment control electrodes, the response speed of the liquid crystal molecules is improved, but the light transmission rate is dropped. With the densely arranged alignment control electrodes, the threshold voltage for driving liquid crystals can be reduced slightly. If the aforementioned threshold voltage is maintained at a certain specific level, the driving voltage for driving the brightness from a black level to a grey can be controlled to slow down the change, so as to suppress the occurrence of uneven display.

In FIG. 185, the source electrode (video signal line) is bent to 90 degrees at a position proximate to the center of the pixel and installed at an angel of ±45 degrees with respect to the gate electrode. The pixel electrode and the alignment control electrode, similar to the source electrode, are bent to 90 degrees at a position proximate to the center of the pixel, and installed at an angel of ±45 degrees with respect to the gate electrode. FIG. 214 shows a color filter substrate corresponding to the TFT substrate. In FIG. 214, alignment control protruding lump is formed on the common electrode for controlling the moving direction of liquid crystal molecules, but the alignment control protruding lump can be substituted by an alignment control slit formed on the common electrode. This embodiment of the present invention is characterized in that when the TFT substrate of FIG. 195 and the color filter substrate of FIG. 214 are stacked, the distance between the alignment control electrode of FIG. 195 and the alignment control protruding lump of FIG. 214 is inconsistent. By designing the area of the region having a larger distance between the alignment control electrode and the alignment control protruding lump to be larger than 2~3 times of the area of the region having a smaller distance between the alignment control electrode and the alignment control protruding lump, a good optical characteristic can be achieved.

In FIG. 221, the source electrode in the unit pixel is bent to 90 degrees for two times and installed at an angel of ±45 degrees with respect to the gate electrode. The pixel electrode is bent substantially in the same shape of the source electrode. The alignment control electrode formed in the unit pixel region has an uneven distribution density, and is divided into two regions: a region with a high distribution density and a region with a low distribution density. The area of the region with a low distribution density is designed to be 2~3 times of the area of the region with a high distribution density. In the foregoing two regions, the source electrode, the pixel electrode and the alignment control electrode are bent to 90 degrees at the corresponding halfly divided position of each region. FIG. 224 shows a color filter substrate corresponding to the TFT substrate of FIG. 221. In FIG. 224, similar to FIG. 221, the alignment control protruding lump has an uneven distribution density and is divided into two regions: a region with a high distribution density and a region with a low distribution density. Even if the alignment control protruding lump is substituted by the alignment control slit formed on the common electrode of the color filter substrate, the moving direction of liquid crystal molecules can be controlled similarly. In FIG. 224, the width of the BM (light-shielding film) of the gate electrode corresponding to the common electrode on a side of the TFT substrate is greater than two times of the width of the curved BM corresponding to the source electrode, and an ink-jet coating method or a planographic printing method is used in the wide BM region ink-jet coating method for installing a ball spacer at a fixed point. If the liquid crystal cell gap is below 3 µm, the photo spacer formed by the foregoing photolithographic process has a small elastic deformation, and thus the problems of bubbles and non-uniform gravity occurs easily during the manufacturing process of dropping liquid crystals in vacuum for the attachment. If the ball spacer is used, the elastic deformation is up to two times of that of the photo spacer, and thus the foregoing problems will not occur, and the yield rate will be improved.

In FIGS. 196 and 226, the source electrode in the unit pixel is bent to 90 degrees for three times and installed at an angel of ±45 degrees with respect to the gate electrode. The pixel electrode is bent substantially in the same shape of the source electrode. Similar to FIG. 221, the alignment control electrode in the unit pixel region has an uneven distribution density and is divided into two regions: a region with a high distribution density and a region with a low distribution density. The area of the region with a low distribution density is designed to be 2~3 times of the area of the region with a high distribution density. The foregoing area ratio gives the best optical characteristic. In the foregoing two regions, the source electrode, the pixel electrode and the alignment control electrode are bent to 90 degrees at the halfly divided position of each region and three positions at the periphery of the two regions. FIG. 215 shows a color filter substrate corresponding to the TFT substrate of FIG. 196. FIG. 215, similar to FIG. 196, the alignment control protruding lump has an uneven distribution density and is divided into two regions: a region with a high distribution density and a region with a low distribution density. Even if the alignment control protruding lump is substituted by the alignment control slit formed on the common electrode of the color filter substrate, the moving direction of liquid crystal molecules can be controlled similarly.

The thickness of the alignment control electrode of the present invention is equal to or slightly greater than the liquid crystal cell gap, or slightly. The cell gap of the LCD TV determines a fast response, and preferably maintained below 3 μmor. Since the resolution of the projecting exposure device used for manufacturing the TFT substrate is 3~4 μm, therefore the thickness of the alignment control electrode should be designed within the capability of the projecting exposure device. In an alignment control slit used in Embodiment 29, it is necessary to have a liquid crystal cell gap approximately equal to two times of the width of the slit for the movement of liquid crystal molecules. Therefore, it is necessary to build an alignment control electrode having a thickness approximately equal to two times of the width. The alignment control electrode can be used to achieve a bright LCD panel. Since the alignment control electrode is used, a strong electric field can be produced, and a fast response of liquid crystal molecules can be achieved.

Embodiment 31

FIGS. 217, 218, 222 223, 197, 89 and 227 are planar views of a MVA mode active matrix substrate in accordance with Embodiment 31 of the present invention. In FIG. 90, the present invention is characterized in that both alignment control electrode and alignment control slit are used in a unit pixel for controlling the moving direction of negative dielectric anisotropic liquid crystal molecules. Since the electric field of Region A as shown in FIG. 90 is stronger than that of Region B, therefore the threshold voltage for driving liquid crystals in Region A is smaller than that of Region B. In FIGS. 217, 218, 222, 223, 197, 89 and 227, the area of Region A is equal to ⅓ to ½ of the area of Region B as shown in FIG. 91, the increase of brightness from the black level to the gray level can be slowed down, and the non-uniform display can be suppressed. Since the γ property for improving the change from black level to gray level in the region can be used in Region A with strong electric field for the display of a region from black level to gray level, therefore the response speed of the region from black level to gray level in the MVA mode can be improved.

Similar to Embodiment 28, the distribution density of alignment control slits formed inside the pixel electrode in accordance with the present invention and the distribution density of the alignment control electrode covered onto the gate insulating film of the pixel electrode are uneven in the unit pixel. The alignment control electrodes are arranged densely than the alignment control slits. With this structure, the difference between the threshold voltages for driving liquid crystals in Region A and Region B as shown in FIG. 90 becomes larger, and thus the viewing angle is extended, and the response speed is improved.

In FIGS. 217 and 218, the source electrode (video signal line) is bent to 90 degrees at a position proximate to the center of the pixel and installed at an angel of ±45 degrees with respect to the gate electrode. The pixel electrode, the alignment control slit and the alignment control electrode, similar to the source electrode, are bent to 90 degrees at positions proximate to the center of the pixel, and installed at an angel of ±45 degrees with respect to the gate electrode. FIG. 214 shows a color filter substrate corresponding to the TFT substrate as shown in FIGS. 217 and 218. In FIG. 214, an alignment control protruding lump is formed on the common electrode for controlling the moving direction of liquid crystal molecules, but the alignment control protruding lump it can be substituted by forming an alignment control slit on the common electrode instead.

In FIG. 214, the alignment control slit and the alignment control electrode as shown in FIGS. 217 and 218 have different distribution densities, and thus the distribution density of the alignment control protruding lumps is changed to cope with such condition. To prevent the occurrence of an identification line at the region bent to 90 degrees at the center of the pixel of the TFT substrate of FIGS. 217 and 218, a portion of the alignment control slit and alignment control electrode is divided and protruded in a direction parallel to the gate electrode parallel. In the color filter substrate of FIG. 214, a portion of the alignment control protruding lump is divided and protruded in a direction parallel to the gate electrode and protruded in a direction parallel to the corresponding BM (light-shielding film) of the gate electrode to prevent the occurrence of an identification line at the region bent to 90 degrees at the center of the pixel of the TFT substrate. Even if the alignment control protruding lump of the color filter substrate of FIG. 214 is substituted by the alignment control slit, similarly, it is necessary to divide the alignment control slit that is bent to 90 degrees from the center of the pixel and protruded in a direction parallel to the BM of the gate electrode to prevent the occurrence of the identification line. If the occurrence of the identification line or the moving of the identification line cannot be prevented, then the identification line will be fixed. As a result, the change of light transmission rate causes an uneven display, and the quality of the display drops.

In FIGS. 222 and 223 the source electrode in the unit pixel is bent to 90 degrees for two times and installed at an angel of ±45 degrees with respect to the gate electrode. The pixel electrode is formed substantially in the same shape of the source electrode. In the region of each unit pixel region, the distribution density of the alignment control electrode is higher than the distribution density of the alignment control slit, and the area of the alignment control slit is 2~3 times larger than the area of the alignment control electrode. In the foregoing two regions, the source electrode, the pixel electrode, the alignment control electrode and alignment control slit are bent to 90 degrees at a halfly divided position in each region. FIG. 224 shows a color filter substrate corresponding to the TFT substrate as shown in FIGS. 222 and 223. In FIG. 224, the alignment control protruding lump also has an uneven distribution density and is divided into two regions: a region with a high distribution density and a region with a low distribution density, and bent to 90 degrees at a position proximate to the center of each region. Even if the alignment control protruding lump is substituted by the alignment control slit formed on the common electrode of the color filter substrate, the moving direction of the liquid crystal molecules can be controlled similarly.

In FIGS. 197 and 227, the source electrode in the unit pixel is bent to 90 degrees for three times and installed at an angel of ±45 degrees with respect to the gate electrode. The pixel electrode is bent substantially in the same shape of the source electrode. Similarly, in the pixel region of FIGS. 222 and 223, the distribution density of the alignment control electrode is higher than the distribution density of the alignment control slit, and the area of the alignment control slit is 2~3 times larger than the area of the alignment control electrode. The foregoing area ratio can give the best optical characteristic. In the foregoing two regions, the source electrode, the pixel electrode, the alignment control electrode and the alignment control slit are bent to 90 degrees at three positions: the halfly divided position of each region and the periphery of two regions. FIG. 215 shows a color filter substrate corresponding to the TFT substrate of FIG. 197. In FIG. 215, the alignment control protruding lump also has an uneven distribution density, and is divided into a region with a high distribution density and a region with a low distribution density. Even if the alignment control protruding lump is substituted by the alignment control slit formed on the common electrode of the color filter substrate, the moving direction of liquid crystal molecules can be controlled similarly.

The alignment control slit, the alignment control electrode and the alignment control protruding lump are arranged with an interval of 20~40 μm apart from each other in the region with a high distribution density and scattery and parallelly arranged with an interval of 40~60 μm apart from each other in the region with a low distribution density. The width of the alignment control slit is approximately two times of the width of the liquid crystal cell gap. If the cell gap is 2 μm, a slit of 4~5 μm wide is needed. If the cell gap is 3 μm, then the slit is 6~8 μm wide. The width of the alignment control electrode should be equal to the liquid crystal cell gap. When the cell gap is 2 μm, the width of 3 μm of the electrode becomes the limit for the resolution of a projecting exposure device. If the cell gap is 3 μm, an electrode having a width of 3 μm is formed. The width of the alignment control protruding lump is determined by the inclined angle of the edge of the protruding lump. Since the inclined angle is preferably below 30 degrees, therefore a protruding lump of 8 μm wide is generally required.

To improve the light transmission rate, the alignment control slits are arranged scattery and parallelly with an interval of over 60 μm apart in the region with a low distribution density, and the moving speed of the liquid crystal molecules becomes slow and this arrangement is not applicable for an animation display.

FIGS. 243 and 244 are cross-sectional views of liquid crystal cells of the present invention. The pixel electrode and the alignment control electrode form a capacitor by the gate insulating film. Since the alignment control electrode is completely covered by the passivation film, therefore there will be no DC current flowing, even if there is a difference between the average electric potential of the pixel electrode and the average electric potential of the alignment control electrode. Since the alignment film is not in direct contact with the pixel electrode or the alignment control electrode, no electrolysis due to the DC current will occur, and thus the ghosting problem will not occur easily.

Embodiment 32

FIGS. 200 and 201 are planar views of a MVA mode active matrix TFT substrate in accordance with Embodiment 32 of the present invention. A unit pixel comprises: a gate electrode (a scan line); two pixel electrodes divided into two regions by the gate electrode; two drain electrodes of a thin film transistor component formed on a contact pad of two pixel electrodes; two electrically independent common electrodes corresponding to the spacer of the two pixel electrodes; and two electrodes that are formed by holdup capacitors (Cst) and connected the two common electrodes and the gate insulating film through the contact pad of the two pixel electrodes. The manufacturing process of FIGS. 38, 77, 82 and 103 is used to perform three times of photolithographic process to manufacture the TFT matrix substrate. FIG. 202 shows a color filter substrate corresponding to the FIG. 200, and FIG. 203 shows a color filter substrate corresponding to FIG. 201.

In FIGS. 200 and 201, the source electrode (video signal line) is linear, and intersected with the gate electrode in a right angle. On the two pixel electrodes, an alignment control slit for controlling the moving direction of the negative dielectric anisotropic liquid crystal molecules is formed. An alignment control protruding lump formed on the color filter substrate of FIGS. 202 and 203 can be used for substituting the alignment control slit to achieve the same effect.

FIG. 212 is a planar view of a whole LCD panel in accordance with Embodiment 32 of the present invention, and FIG. 210 is shows a circuit model diagram of a unit pixel. The unit pixel is divided into two pixel regions by a gate electrode, and the smaller pixel region is called the sub pixel (A), and the larger pixel region is called the sub pixel (B). The area of the pixel electrode of the sub pixel (B) is designed to be two to three times of the area of the pixel electrode of the sub pixel (A) for achieving the best optical characteristic. As shown in FIG. 211, the polarity of the signal waveform applied on each common electrode corresponding to the sub pixel (A) and the sub pixel (B) is different, and thus the driving waveform of the pixel electrode in the region of the sub pixel (A) and the driving waveform of the pixel electrode of the sub pixel (B) are different, and the threshold voltage for driving liquid crystals of the sub pixel (A) is smaller than the threshold voltage for driving liquid crystals of the sub pixel (B), so as to obtain the optical characteristic as shown in FIG. 91. This embodiment of the present invention adjusts the amplitude of the signal waveform applied to each common electrode, and the threshold voltage for driving the liquid crystals, and thus the TFT matrix substrate can be designed flexibly, and the best optical characteristic can be achieved easily. In FIGS. 200 and 201, the density of alignment control slits of the sub pixel (A) is larger than that of the sub pixel (B). Since the present invention can freely change the threshold voltage for driving the liquid crystal of each region by changing the amplitude of the signal waveform applied to the common electrode, and thus there will be no problem even if the density of the alignment control slits of the sub pixel (A) and the sub pixel (B) are different. The present invention can be applied to a 60-inch super large liquid crystal display device with a significant effect.

Embodiment 33

FIGS. 231 and 232 show planar views of a MVA mode active matrix TFT substrate in accordance with Embodiment 33 of the present invention. A unit pixel comprises a gate electrode (a scan line); two pixel electrodes divided into two regions by the gate electrode; two drain electrodes of a thin film transistor component formed on a contact pad of two pixel electrodes; two electrically independent common electrodes corresponding to the spacer of the two pixel electrodes; and two sets of alignment control electrodes formed on the gate insulating film covered onto the pixel electrode and connected to the two common electrodes through the contact hole on the gate insulating film. The manufacturing process as shown in FIGS. 39, 78 and 104 is used, and three times of photolithographic process is performed to manufacture the TFT matrix substrate. The two pixel electrodes and two sets of alignment control electrodes corresponding to each pixel electrode form two sets of capacitors through the gate insulating film.

FIG. 212 shows a circuit model of a whole LCD panel in accordance with Embodiment 33 of the present invention, and FIG. 210 shows a unit pixel. The unit pixel is divided into two pixel regions by a gate electrode, and the smaller pixel region is called the sub pixel (A), and the larger pixel region is called the sub pixel (B). The area of the pixel electrode of the sub pixel (B) is designed to be two to three times of the area of the pixel electrode of the sub pixel (A) for achieving the best optical characteristic. As shown in FIG. 211, the polarity of the signal waveform applied to each common electrode corresponding to the sub pixel (A) and the sub pixel (B) is different. Therefore the driving waveform of the pixel electrode in the region of the sub pixel (A) and the driving waveform of the pixel electrode in the region of the sub pixel (B) are different, and the threshold voltage for driving the liquid crystals of sub pixel (A) is smaller than the threshold voltage for driving the liquid crystals of sub pixel (B), so as to achieve the optical characteristic as shown in FIG. 91. To prevent the source electrode (video signal line) from being affected adversely by the signal waveform applied to the two common electrodes applied to the unit pixel and having different polarities and same signal amplitude. The quantity of gate electrodes (scan lines) is over 2000 for super high-precision LCD panels, or field order LCD panels. If the signal pulse width of the gate electrode is below 10 μs, delay and distortion of the signal waveform of the common electrode will occur. As long as the common electrode is separated into two common electrode groups as shown in FIG. 212, and each group is changed to those as shown in FIGS. 257 and 258 by a method of driving altogether, so that each common electrode is separated independently, and thus the method of driving each common electrode will serve the purpose.

In FIGS. 231 and 232, the source electrode (video signal line) is linear and intersected with the gate electrode at a right angle. Since this embodiment of the present invention can produce a strong electric field between the pixel electrode and the alignment control electrode, therefore vertical alignment negative dielectric anisotropic liquid crystal molecules can be moved in a high speed between the two regions of sub pixel (A) and sub pixel (B). If the source electrode is linear, both of the BM (light-shielding film) of the color filter and the R, G, B color filter layer corresponding to the source electrode are linear, and a low-cot ink-jet method or planographic printing method can be used for manufacturing a color filter substrate. Since the present invention is a structure installed proximate to two rows of common electrodes, therefore an ink-jet coating method or a planographic printing method is used for installing a ball spacer at a fixed point in a BM (light-shielding film) region of the color filter substrate corresponding to the two rows of common electrodes, so as to further lower the cost. A color filter substantially in the same shape of the color filter of FIGS. 202 and 203 can be used. In FIGS. 202 and 203, an alignment control protruding lump formed on a side of the color filter substrate can be substituted by an alignment control slit formed at a common electrode on a side of the color filter substrate to achieve the same effect.

Embodiment 34

FIGS. 204 and 205 are planar views of a MVA mode active matrix TFT substrate in accordance with Embodiment 34 of the present invention. A unit pixel comprises: a gate electrode (a scan line); two pixel electrodes divided into two regions by the gate electrode; two drain electrodes of a thin film transistor component connected to a contact pad formed on two pixel electrodes; two electrically independent common electrodes spatially corresponding to the two pixel electrodes; a holdup capacitor (Cst) forming electrode inside the contact pad of the pixel electrode and connected to the larger region of the two pixel electrodes through the common electrode and the gate insulating film corresponding to the pixel electrode of the larger region; and a set of alignment control electrode connected to the common electrode of the pixel electrode corresponding to the smaller region in the two pixel electrodes. The alignment control electrode and the pixel electrode of the smaller region are stacked to form a capacitor by the gate insulating film.

In the manufacturing process of FIGS. 38, 77, 82 and 103 and the manufacturing process of FIGS. 39, 38 and 104, the photolithographic process is carried out for three times to manufacture the TFT substrate of the present invention. In FIGS. 204 and 205, the source electrode (video signal line) is linear, and intersected with the gate electrode at a right angle. An alignment control slit for controlling the moving direction of negative dielectric anisotropic liquid crystal molecules two pixel electrodes is formed on the pixel electrode of the larger region.

FIGS. 212 and 258 are planar views of a whole LCD panel in accordance with Embodiment 34 of the present invention, and FIG. 210 shows a circuit model of a unit pixel. The smaller pixel region in the unit pixel is called the sub pixel (A), and the larger pixel region is called the sub pixel (B). The area of the pixel electrode of the sub pixel (B) is designed to be two to three times of the area of the pixel electrode of the sub pixel (A) for the best optical characteristic. As shown in FIGS. 211 and 257, the polarities of signal waveforms applied to each common electrode corresponding to the sub pixel (A) and the sub pixel (B) are different, and thus the driving waveform of the pixel electrode of the region of the sub pixel (A) is different from the driving waveform of the pixel electrode of the region of the sub pixel (B), and the threshold voltage for driving the liquid crystals of the sub pixel (A) is smaller than the threshold voltage for driving the liquid crystals of the sub pixel (B), so as to give the optical characteristic of FIG. 91. In the present invention, the amplitude of the signal waveform applied to each common electrode is adjusted, and the threshold voltage for driving the liquid crystals is adjusted freely, and thus the TFT matrix substrate can be designed flexibly to achieve the best optical characteristic. In a MVA mode display from a black level to a gray level, the response speed of the liquid crystal molecules tends to become slow easily. If the response speed of the region of the sub pixel (A) as shown in FIG. 91 is not improved, then a good animation display cannot be achieved. In Embodiment 34 of the present invention, a strong electric field can be produced between the pixel electrode and the alignment control electrode in the sub pixel (A) to achieve a structure with a fast response of the liquid crystal molecules.

Embodiment 35

FIGS. 228 and 260 are planar views of a MVA mode active matrix TFT substrate in accordance with Embodiment 35 of the present invention, the structure of this embodiment is substantially the same as that of Embodiment 32, and can be produced by the same manufacturing process. The difference resides on that: the source electrode (video signal line) and the pixel electrode are bent to 90 degrees at positions proximate to the center of the pixel electrode, and installed in the direction of ±45 degrees with respect to the gate electrode.

FIGS. 212 and 258 are planar views of a whole LCD panel, and the LCD panel is a structure that adopts a line inversion driving method. In dot inversion driving method, equivalent circuits inside the panel must be changed to the structure as shown in FIG. 259. In the formation of the structure inside the panel, the structure as shown in FIGS. 228 and 260 is connected perpendicular to the direction of the scan line. To prevent a horizontal cross talk), the dot inversion driving method is most effective. If the driving waveforms of FIGS. 211 and 257 are used for driving the LCD panel, the design of a holdup capacitor (Cst) forming electrode is needed for preventing a difference of virtual voltage of the pixel electrode as shown in FIGS. 228 and 260.

Embodiment 36

FIGS. 208, 209 and 261 are planar views of a MVA mode active matrix TFT substrate in accordance with Embodiment 36 of the present invention. The structure of this embodiment is substantially the same as that of Embodiment 33, and can be produced by the same manufacturing process. The difference resides on that: the source electrode (video signal line) and the pixel electrode are bent to 90 degrees at positions proximate to the center of the pixel electrode, and installed in a direction of ±45 degrees with respect to the gate electrode.

FIGS. 212 and 258 are planar views of a whole LCD panel, and the LCD panel is a structure that adopts a line inversion driving method. In dot inversion driving method, equivalent circuits inside the panel must be changed to the structure as shown in FIG. 259. In the formation of the structure inside the panel of FIG. 259, the structure as shown in FIGS. 229 and 261 is connected perpendicular to the direction of the scan line. To prevent horizontal a cross talk), the dot inversion driving method is most effective. If the driving waveforms of FIGS. 211 and 257 are used for driving the LCD panel, the capacitance of the capacitor formed by the pixel electrode and the alignment control electrode is optimized for preventing a difference of virtual voltage of the pixel electrode as shown in FIGS. 229 and 261.

FIG. 209 shows a color filter substrate corresponding to the TFT substrate of FIG. 208. The present invention is a structure having two rows of common electrodes, and thus an ink-jet method or a planographic printing method can be used for installing a ball spacer at a fixed point in the BM (light-shielding film) region of the color filter substrate corresponding to the two rows of common electrodes, so as to lower the cost. In FIG. 209, an alignment control protruding lump is formed on a side of the color filter substrate, but the same effect can be achieved, even if the alignment control protruding lump is substituted by an alignment control slit formed at the common electrode on a side of the color filter substrate.

Embodiment 37

FIGS. 206, 207, 230, and 262 are planar views of a MVA mode active matrix TFT substrate in accordance with Embodiment 36 of the present invention. The structure of this embodiment is substantially the same as that of Embodiment 34, and can be produced by the same manufacturing process. The difference resides on that: the source electrode (video signal line) and the pixel electrode are bent to 90 degrees at positions proximate to the center of the pixel electrode, and installed in a direction of ±45 degrees with respect to the gate electrode.

FIGS. 212 and 258 are planar views of a whole LCD panel, and the LCD panel is a structure that adopts a line inversion driving method. In dot inversion driving method, equivalent circuits inside the panel must be changed to the structure as shown in FIG. 259. In the formation of the structure inside the panel, the structure as shown in FIGS. 230 and 260 is connected perpendicular to the direction of the scan line. To prevent a horizontal cross talk), the dot inversion driving method is most effective. If the driving waveforms of FIGS. 211 and 257 are used for driving the LCD panel, it is necessary to optimize the capacitance Csa, Csb of the common electrodes of the sub pixel (A) and the sub pixel for preventing a difference of virtual voltage of the pixel electrode as shown in FIGS. 230 and 260.

FIG. 209 shows a color filter substrate corresponding to the TFT substrate of FIGS. 206 and 2078. The present invention is a structure having two rows of common electrodes, and thus an inkjet method or a planographic printing method can be used for installing a ball spacer at a fixed point in the BM (light-shielding film) region of the color filter substrate corresponding to the two rows of common electrodes, so as to lower the cost. In FIG. 209, an alignment control protruding lump is formed on a side of the color filter substrate, but the same effect can be achieved, even if the alignment control protruding lump is substituted by an alignment control slit formed at the common electrode on a side of the color filter substrate.

The structure an LCD panel having a unit pixel of Embodiments 32 to 37 and manufactured according to the equivalent circuit diagram of FIG. 259 is a HDTV display for carrying out a full spectrum of 120 frames per second, but an amorphous silicon TFT component can be used instead. The method of interpolating a black display in 60 frames of the 120 frames can improve the blurred image of an animation display in an LCD TV.

Embodiment 38

FIGS. 254 to 256 are planar views of a MVA mode active matrix TFT substrate in accordance with Embodiment 38 of the present invention. The unit pixel comprises: two gate electrodes (scan lines); two gate electrodes parallelly disposed at a common electrode away from the two gate electrodes; two pixel electrodes are cut into two regions by the common electrode; two drain electrodes of a thin film transistor component connected to a contact pad and of the two pixel electrodes; and an alignment control electrode connected to the common electrode through a contact hole formed on a gate insulating film. The substrate can be produced by the same manufacturing process of Embodiment 33.

The alignment control electrode of the sub pixel (A) and the sub pixel (B) connected to one common electrode and the pixel electrode form a capacitor through the gate insulating film of the pixel electrode that is cut into two. The two gate electrodes in the unit pixel are independent, and the driving signal waveform corresponding to sub pixel (A) and sub pixel (B) is applied. By adjusting the driving timing of the two gate electrodes, different image signals can be written from one source electrode into the sub pixel (A) and the sub pixel (B). In this Embodiment, both sub pixel (A) and sub pixel (B) use the alignment control electrode, or an alignment control slit formed in the pixel electrode as a substitute in the sub pixel at the larger region of the pixel electrode of the sub pixel B. The holdup capacitor (Cst) forming electrode is connected to the common electrode, as shown in FIGS. 100 and 101, both sub pixel (A) and sub pixel (B) are structures having a capacitor formed by the pixel electrode of the alignment control slit through the gate insulating film. Since the present invention applies the optical characteristic of FIG. 91 to a signal conversion method to adjust the image signal voltage applied to the source electrode on a side of the TFT substrate and decrease the threshold voltage of the sub pixel (A), therefore the densely arranged alignment control electrodes of FIGS. 254 to 256 is not required in the sub pixel (A), but the same design can be applied to the arrangement of the alignment control electrodes for both sub pixel (A) and sub pixel (B).

Embodiment 39

FIGS. 131 and 132 are planar views of a MVA mode active matrix TFT substrate in accordance with Embodiment 39 of the present invention. The source electrode (video signal line) is bent to 90 degrees at a position proximate to the center of the pixel and installed at an angel of ±45 degrees with respect to the gate electrode. The pixel electrode, similar to the source electrode, is bent to 90 degrees at a position proximate to the center of the pixel. One or more contact pads are disposed inside the pixel electrode and connected to the drain electrode of the thin film transistor component through the contact hole. The pixel electrode except the contact hole is covered completely by the gate insulating film, and disposed on the aforementioned gate insulating film for controlling the moving direction of vertical alignment negative dielectric anisotropic liquid crystal molecules, so as to form two types of alignment control electrodes: an alignment control electrode connected to the common electrode through the contact hole, and an alignment control electrode of the drain electrode of a thin film transistor component is connected to a gate electrode in front of a row, and these two types of alignment control electrodes, similar to the source electrode, are bent to 90 degrees at positions proximate to the center of the pixel, and installed at an angel of ±45 degrees with respect to the gate electrode. The pattern width of the alignment control electrode is determined by the liquid crystal cell gap. A pattern width equal to or slightly greater than the cell gap is acceptable. The cell gap for an LCD TV panel is maintained below 3 μm to cope with the required fast response of animation, and this value is substantially equal to the limit of the resolution of the projecting exposure device.

FIG. 135 shows a color filter substrate corresponding to the TFT substrate of FIGS. 131 and 132. No alignment control protruding lump or alignment control slit exists in the color filter of FIG. 135. An ink-jet coating method or a planographic printing method can be used for installing a ball space at a fixed point corresponding to the center of the gate electrode and the BM (light-shielding film) of the common electrode. FIG. 136 is a cross-sectional view of an LCD panel attached with the TFT substrate of FIGS. 131 and 132 and the color filter substrate of FIG. 135. The alignment control electrode of the drain electrode of a thin film transistor component connected to a gate electrode in front of a row plays the role of the alignment control protruding lump or alignment control slit of the foregoing MVA mode color filter substrate. Therefore, the color filter substrate used in the present invention is almost the same as the TN mode, and a substrate of a lower cost can be used.

The TFT substrate of this embodiment of the present invention can be produced by the same manufacturing process of Embodiment 25. The two types of alignment control electrodes are preferably arranged with an interval of 10~30 μm apart from each other. If the interval is below 10 μm, the light transmission rate will drop, and thus will unable to provide a bright display. For interval above 30 μm, the moving speed of the vertical alignment negative dielectric anisotropic liquid crystal molecules becomes significantly slow. The width of the alignment control protruding lump formed on the color filter substrate should be approximately 8 μm, and the width of the alignment control slit should be approximately 6 μm. The width of alignment control electrode of the present invention is approximately 3 μm. Compared with the conventional MVA mode LCD panel, the invention can provide a bright LCD panel and produce a strong electric field between the alignment control electrode and the pixel electrode to achieve a faster response than the conventional MVA mode LCD panel.

Embodiment 40

FIGS. 148 and 149 are planar views of an active matrix TFT substrate in accordance with Embodiment 40 of the present invention.

The source electrode (video signal line) is linear, and has one or more contact pads disposed on the pixel electrode and connected to the drain electrode of the thin film transistor component through the contact hole formed on the gate insulating film. The alignment control slit is formed on the pixel electrode for controlling the moving direction of vertical alignment negative dielectric anisotropic liquid crystal molecules, and the alignment control electrode is formed on the gate insulating film covered onto the pixel electrode for controlling the moving direction of vertical alignment negative dielectric anisotropic liquid crystal molecules, and the alignment control electrode is disposed on the gate electrode in front of a row and connected to the drain electrode of a thin film transistor component.

FIG. 263 shows a color filter substrate corresponding to FIGS. 148 and 149. No alignment control protruding lump or alignment control slit exists in the color filter of FIG. 263. An ink-jet coating method or a planographic printing method is used for installing a ball spacer at a fixed point corresponding to the center of the gate electrode and the BM (light-shielding film) of the common electrode. FIG. 137 is a cross-sectional view of an LCD panel attached with the of TFT substrate of FIGS. 148 and FIG. 149 and the color filter substrate of FIG. 263. The alignment control electrode of the drain electrode of a thin film transistor component connected to a gate electrode in front of a row plays the role of the alignment control protruding lump or alignment control slit of the conventional MVA mode color filter substrate. Therefore, the color filter substrate used in the present invention is almost the same as the TN mode, and a substrate of a lower cost can be used.

Embodiment 41

FIGS. 133 and FIG. 134 are planar views of a MVA mode active matrix TFT substrate in accordance with Embodiment 41 of the present invention. The source electrode (video signal line) is bent to 90 degrees at a position proximate to the center of the pixel, and installed at an angel of ±45 degrees with respect to the gate electrode. The pixel electrode, similar to the source electrode, is bent to 90 degrees at a position proximate to the center of the pixel. One or more contact pads are disposed inside the pixel electrode, and connected to the drain electrode of the thin film transistor component through the contact hole. The pixel electrode except the contact hole is covered completely by the gate insulating film. An alignment control electrode is formed on the aforementioned gate insulating film for controlling the moving direction of vertical alignment negative dielectric anisotropic liquid crystal molecules, and the aforementioned alignment control electrode is connected to the drain electrode of a thin film transistor component formed at a gate electrode in front of a row. An alignment control slit is formed inside the pixel electrode for controlling the moving direction of vertical alignment negative dielectric anisotropic liquid crystal molecules. Both of the alignment control electrode and the alignment control slit are disposed parallel to each other, similar to the source electrode, are bent to 90 degrees at positions proximate to the center of the pixel, and installed at an angel of ±45 degrees with respect to the gate electrode.

FIG. 135 shows a color filter substrate corresponding to the TFT substrate of FIGS. 133 and 134. No alignment control protruding lump or alignment control slit exists in the color filter of FIG. 135. An ink-jet coating method or a planographic printing method is used for installing a ball spacer at a fixed point corresponding to the center of the gate electrode and the BM (light-shielding film) of the common electrode. FIG. 137 shows a cross-sectional view of an LCD panel attached with the TFT substrate of FIGS. 133 and 134 and the color filter substrate of FIG. 135.

The alignment control electrode of the drain electrode of a thin film transistor component connected to a gate electrode in front of a row plays the role of the alignment control protruding lump or alignment control slit of the conventional MVA mode color filter substrate. Therefore, the color filter substrate used in the present invention is almost the same as the TN mode, and a substrate of a lower cost can be used.

Embodiment 42

FIG. 147 is a cross-sectional view of a MVA mode active matrix TFT substrate in accordance with Embodiment 42 of the present invention. The substrate is produced almost the same by Embodiment 39 of FIG. 131. The difference of this embodiment from those described in FIGS. 147 and 131 resides on that the source electrode of a thin film transistor component for driving an alignment control electrode formed at a gate electrode in front of a row is connected to the common electrode as shown in FIG. 131. In FIG. 147, the source electrode of the aforementioned thin film transistor component is connected into a row of video signal lines.

FIG. 135 shows a color filter substrate corresponding to the TFT substrate of FIG. 147. No alignment control protruding lump or alignment control slit exists in the color filter substrate of FIG. 135. FIG. 136 is a cross-sectional view of an LCD panel attached with the TFT substrate of FIG. 147 and the color filter substrate of FIG. 135. The alignment control electrode of the drain electrode of a thin film transistor component connected to a gate electrode in front of a row plays the role of the alignment control protruding lump or alignment control slit of the foregoing MVA mode color filter substrate. The drain electrode connected to the thin film transistor component of Embodiment 42 produces a strong electric field between the alignment control electrode and the pixel electrode, which is approximately two times of the electric field of Embodiment 39, and thus the electric field shown in FIG. 147 is more appropriate for the animation display for the region from black level to gray level than that of FIG. 131.

Embodiment 43

FIG. 150 and FIG. 151 are planar views of a MVA mode active matrix TFT substrate in accordance with Embodiment 43 of the present invention. In Embodiment 40, the source electrode of a thin film transistor component for driving an alignment control electrode is connected to the common electrode. In Embodiment 43, the source electrode for driving the thin film transistor component of an alignment control electrode is connected into a video signal line. Therefore, the common electrode is not necessary in Embodiment 43 of FIGS. 150 and 151. The alignment control electrode of the drain electrode of a thin film transistor component connected to a gate electrode in front of a row plays the role of the alignment control protruding lump or alignment control slit of the conventional MVA mode color filter substrate. Therefore, no alignment control protruding lump or alignment control slit exists on the color filter substrate corresponding to FIGS. 150 and 151. FIG. 137 is a cross-sectional view of an LCD panel of Embodiment 43.

Embodiment 44

FIG. 146 is a planar view of a MVA mode active matrix TFT substrate in accordance with Embodiment 44 of the present invention. In Embodiment 41, the source electrode for driving the thin film transistor component of the alignment control electrode is connected to the common electrode. In Embodiment 44, the source electrode for driving the thin film transistor component of the alignment control electrode is connected into a video signal line. Therefore, the common electrode is not necessary in Embodiment 44. The alignment control electrode of the drain electrode of the thin film transistor component for driving the alignment control electrode formed at the gate electrode in front of a row plays the role of the alignment control protruding lump or alignment control slit of the conventional MVA mode color filter substrate. Therefore, no alignment control protruding lump or alignment control slit exists, and thus no color filter substrate exists in FIG. 146. FIG. 137 is a cross-sectional view of an LCD panel of Embodiment 44.

In Embodiments 39 to 44, an alignment control slit or an alignment control electrode is formed on a side of the whole TFT substrate for controlling the moving direction of liquid crystal molecules. If a TFT substrate of an LCD panel that does not need a color filter substrate and use the field order driving method adopts the aforementioned Embodiment, and installs a BM (light-shielding film) and a ball space at a fixed point on a side of the TFT substrate, then the corresponding substrate will be a transparent electrode only, and it is not necessary to perform the liquid crystal cell manufacturing process to drop liquid crystals in vacuum and align the positions. In other words, the absolute size alignment is no longer needed for the super large size glass substrate, and the issue of poor alignment for the very high-precision LCD panel no longer exists anymore. Even for a very large size of glass substrate, the yield rate will not drop, and factories can produce the large glass substrate in mass production.

Embodiment 45

Figure 71:
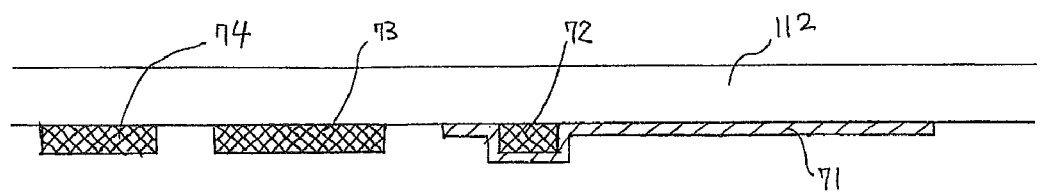
FIG. 71 is a cross-sectional view of a mask used for halftone exposure as shown in FIGS. 67 and 69.
Figure 124:
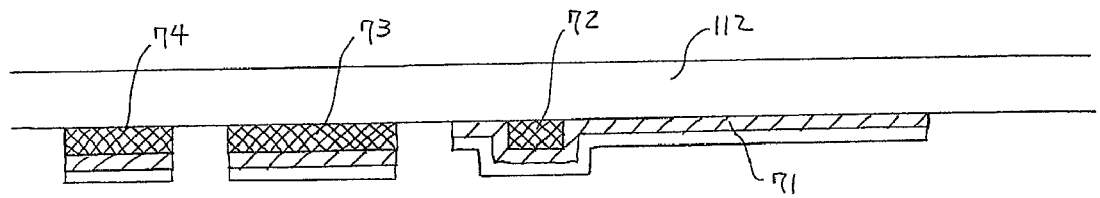
Figure 126:
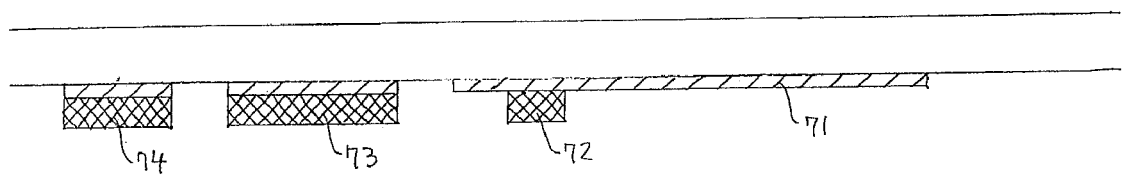

FIG. 140 and FIG. 141 are planar views of a TN mode active matrix TFT substrate adopting a halftone exposure mask for the manufacture in accordance with Embodiment 45 of the present invention. In FIG. 140, the manufacturing process of FIG. 38 is adopted for manufacturing the TN mode TFT substrate of FIG. 130, and the first photolithographic process adopts a mask used for a halftone exposure. In FIG. 249, the halftone exposure mask includes three regions: a full ultraviolet masked region, a semi ultraviolet masked region allowing 10~50% of ultraviolet to pass through, and a ultraviolet penetrating region. When the halftone exposure mask on the positive photoresist is used for exposure and development of an image, three regions: a region with thick positive photoresist, a region with thin positive photoresist and a region without positive photoresist are formed as shown in FIG. 249-2. In FIG. 140, the region corresponding to the gate electrode (scan line) is indicated by 73; the region corresponding to the common electrode is indicated by 74; the region corresponding to pixel electrode is indicated by 71; the region corresponding to a contact pad connected to a drain electrode is indicated by 72; and the region corresponding to a contact pad portion connected to a holdup capacitor (Cst) forming electrode is indicated by 119. Only the region 71 corresponding to the pixel electrode is a halfly penetrating region, FIGS. 71, 124 and 126 are cross-sectional view of the halftone exposure mask of FIG. 140. Chromium or molybdenum are used to form the completely ultraviolet masked region 72, 73, 74, 119, and titanium and zirconium or titanium nitride and zirconium nitride or high melting-point metal silicide are used to form the semi ultraviolet masked region 71 to achieve the required optical characteristic. In FIG. 124, silicon oxide film, silicon nitride film, titanium oxide or zirconium oxide film is covered onto a semi ultraviolet masked region for protecting the structure.

Figure 72:
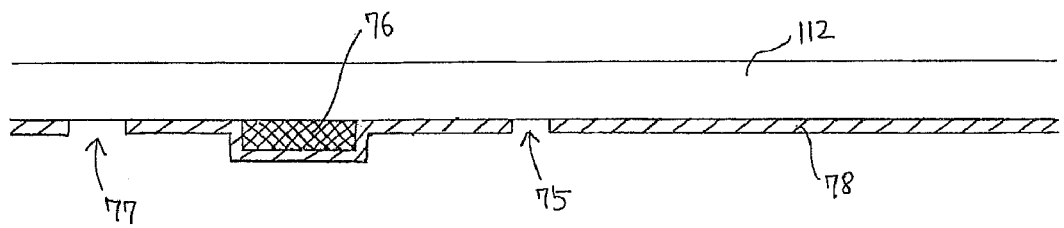
Figure 125:
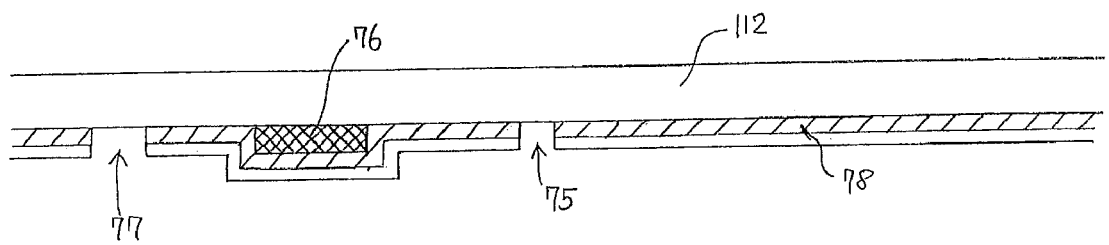
Figure 127:
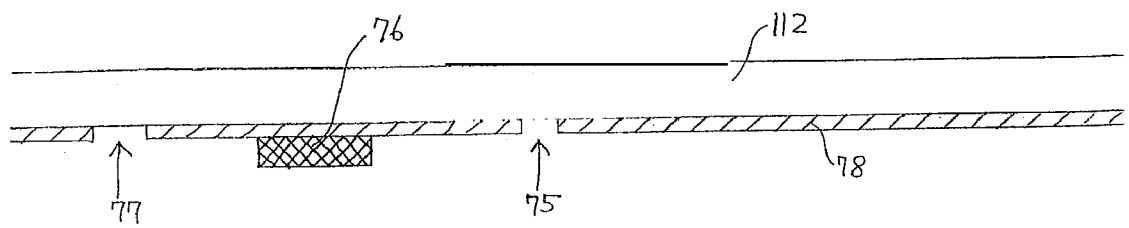

FIG. 141 shows a mask used in the manufacturing process of FIG. 38 adopting the TN mode TFT substrate of FIG. 130 for the manufacture, and the second photolithographic process adopting the halftone exposure method. The region corresponding to an island of a thin film semiconductor layer of a thin film transistor component is indicated by 76; the region corresponding to a contact hole of a contact pad inside a pixel electrode and connected to the drain electrode of a thin film transistor component is indicated by 75; and the region corresponding to a contact hole of a contact pad inside a pixel electrode and connected to a holdup capacitor (Cst) forming electrode is indicated by 120. The region corresponding to an island of a thin film semiconductor layer is the completely ultraviolet masked region; the regions corresponding to aforementioned two types of contact holes are the ultraviolet penetrating regions. All of the regions other than those mentioned above are semi ultraviolet masked regions. FIGS. 72, 125 and 127 are cross-sectional views of the halftone exposure mask of FIG. 141.

Embodiment 46

FIGS. 153 and 154 are planar views of a halftone exposure mask used for manufacturing the IPS mode active matrix TFT substrate in accordance with Embodiment 46 of the present invention. FIG. 153 shows a mask used in the first photolithographic process that adopts the halftone exposure method when the IPS mode TFT substrate of FIG. 152 is manufactured by the manufacturing process of FIG. 38. The region corresponding to a gate electrode (scan line) is indicated by 73; the region corresponding to a common electrode is indicated by 74; the region corresponding to a comb pixel electrode is indicated by 71; the region corresponding to a contact pad portion connected to a drain electrode is indicated by 72; the region corresponding to a contact pad portion connected to a holdup capacitor (Cst) forming electrode is indicated by 125; the region corresponding to a comb common electrode is indicated by 123; and the region corresponding to a common electrode for screening the video signal line is indicated by 124. In the IPS mode TFT substrate of FIG. 152, the source electrode (video signal line), the common electrode for screening the video signal line, the comb pixel electrode and the comb common electrode pixel proximate to the center are bent once. Similar to the halftone exposure mask of FIG. 153, the mask is formed in the region corresponding to each of the aforementioned electrodes, and the structure with a bending for one time at a position proximate to the center of the pixel is formed. The region 71 corresponding to the comb pixel electrode, the region 123 corresponding to the comb common electrode, and the region 124 corresponding to the common electrode for screening the video signal line are semi ultraviolet masked regions.

FIG. 154 shows a mask used in a second photolithographic process that adopts the halftone exposure method for manufacturing the IPS mode TFT substrate of FIG. 152 by the manufacturing process of FIG. 38. The region corresponding to an island of a thin film semiconductor layer of a thin film transistor component is indicated by 76; the region corresponding to a drain electrode connected to a thin film transistor component through a contact hole of a contact pad formed inside a comb pixel electrode is indicated by 75; and the region corresponding to a holdup capacitor (Cst) forming electrode formed in contact hole of a contact pad inside a comb pixel electrode is indicated by 126. The region corresponding to an island of the thin film semiconductor layer is a full ultraviolet masked region, and the regions corresponding to the aforementioned two types of contact holes are ultraviolet penetrating region. All of the regions other than those mentioned above are semi ultraviolet masked regions.

Embodiment 47

FIGS. 265 and 266 are planar views of halftone exposure mask used for manufacturing an IPS mode active matrix TFT substrate in accordance with Embodiment 47 of the present invention. FIG. 265 shows a mask used in the first photolithographic process that adopts the halftone exposure method for manufacturing the IPS mode TFT substrate of FIG. 264 by the manufacturing process of FIG. 38. The source electrode (video signal line) of FIG. 264 is linear, and disposed perpendicular to the gate electrode. In FIGS. 264 and 152, the present invention is characterized in that the first photolithographic process forms a gate electrode, a common electrode, a curved comb pixel electrode, a curved comb common electrode, a plurality of contact pads disposed in the curved comb pixel electrode, and a common electrode for screening the source electrode (video signal line). A full management of the first photolithographic process can achieve yield rate of almost 100%, and the second and third photolithographic process will be simpler, which simply use a pattern, and thus the high yield rate can be maintained. Even if defects are produce in the photolithographic process, rework and reuse of the substrate can be achieved easily. If the pattern of the positive photoresist is defective, the pattern of the positive photoresist can be corrected easily since the substrate is a just a metal layer on the glass substrate.

In the halftone exposure mask of FIG. 265, the regions respectively corresponding to the gate electrode, the common electrode and the plurality of contact pad portions disposed inside the curved comb pixel electrode are full ultraviolet masked regions, and the regions respectively corresponding to the curved comb pixel electrode, the curved comb common electrode and the common electrode for screening the source electrode are semi ultraviolet masked regions.

FIG. 266 shows a mask used in a second photolithographic process that adopts the halftone exposure method for manufacturing the IPS mode TFT substrate of FIG. 264 by the manufacturing process of FIG. 38. In FIG. 264, the lower layer of the source electrode (video signal line) as shown in FIGS. 161 and 162 forms a thin film semiconductor layer along the source electrode, and thus similar to Embodiment 46 of FIG. 154, the thin film semiconductor layer of the thin film transistor component is not formed into an island completely. The region corresponding to a thin film semiconductor layer is indicated by 76 and is a full ultraviolet masked region. The region corresponding to a contact hole of a contact pad inside a comb pixel electrode for connecting a drain electrode of a thin film transistor component is indicated by 75; and the region corresponding to a contact hole of a contact pad inside a comb pixel electrode for connecting a holdup capacitor (Cst) forming electrode is indicated by 126. The region corresponding to the two types of contact holes is a ultraviolet penetrating region. All regions other than those mentioned above are semi ultraviolet masked regions.

Embodiment 48

Figure 67:
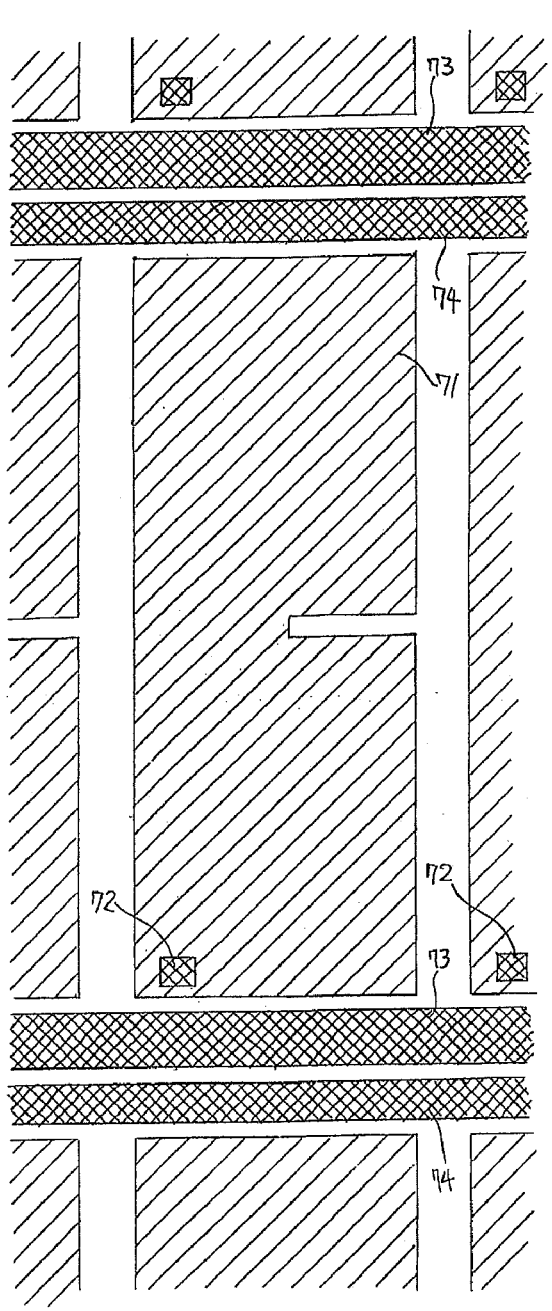
FIG. 67 is a planar view of a mask used for a first halftone exposure that adopts a MVA mode photolithographic process for three times as shown in FIG. 39 in accordance with the present invention.
Figure 68:
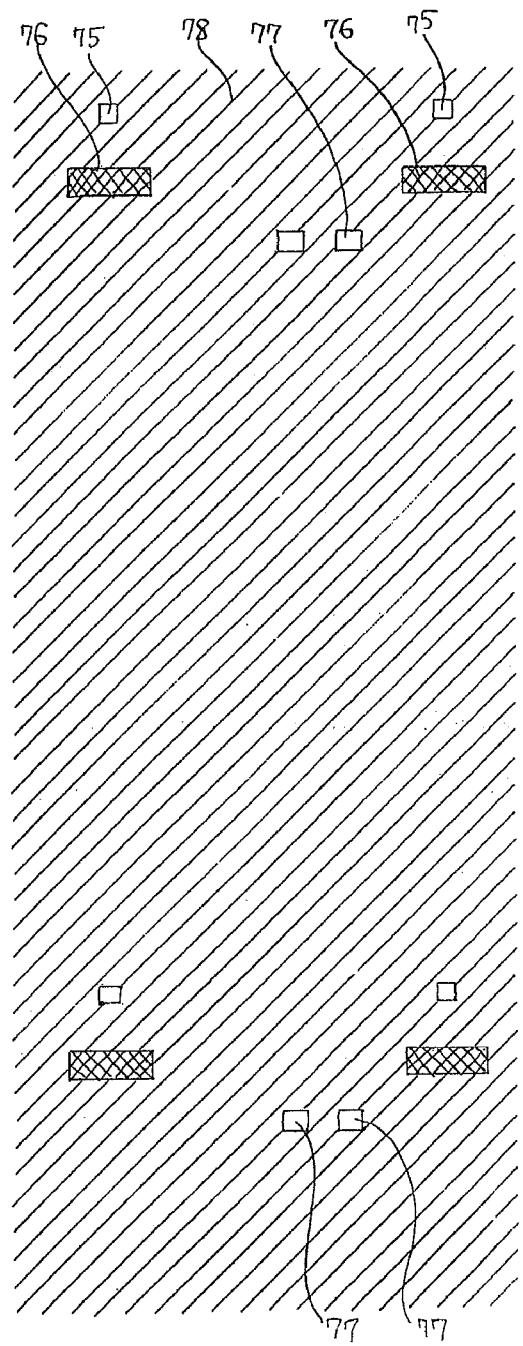
FIG. 68 is a planar view of a mask used for a second halftone exposure that adopts a MVA mode photolithographic process for three times as shown in FIG. 39 in accordance with the present invention.

FIGS. 67 and 68 are planar views of a halftone exposure mask used for manufacturing a MVA mode active matrix TFT substrate by the manufacturing process of FIG. 39 in accordance with Embodiment 48 of the present invention FIG. 67 shows a mask used in the first photolithographic process that adopts the halftone exposure method to manufacture the MVA TFT substrate of FIG. 15. This embodiment is characterized in that the halftone exposure mask of FIG. 67 is used according to the first photolithographic process of FIGS. 46 and 173 for forming a gate electrode, a common electrode, a pixel electrode and at least one contact pad disposed in the pixel electrode. In the MVA TFT substrate of FIG. 15, the source electrode (video signal line) is linear, and perpendicular to the gate electrode.

In FIG. 67, the region corresponding to the gate electrode (scan line) is indicated by 73; the region corresponding to the common electrode is indicated by 74; the region corresponding to the pixel electrode is indicated by 71; and the region corresponding to a contact pad portion connected to the drain electrode is indicated by 72. The regions respectively corresponding to the gate electrode, the common electrode, and the contact pad portion disposed inside the pixel electrode and connected to the drain electrode are full ultraviolet masked regions, and only the region corresponding to the pixel electrode is a semi ultraviolet masked region. FIGS. 71, 124 and 126 are cross-sectional views of the halftone exposure mask of FIG. 67.

FIG. 68 shows a mask used in a second photolithographic process that adopts the halftone exposure method for manufacturing the MVA TFT substrate of FIG. 15 by the manufacturing process of FIG. 39. The region corresponding to an island of a thin film semiconductor layer of a thin film transistor component is indicated by 76; the region corresponding a contact hole of a contact pad formed inside a pixel electrode for connecting a drain electrode of the thin film transistor component is indicated by 75; and the region corresponding to a contact hole portion for connecting an alignment control electrode and a common electrode is indicated by 77. The region corresponding to the island of the thin film semiconductor layer is a full ultraviolet masked region, and the region corresponding to aforementioned two types of contact holes is a ultraviolet penetrating region. The regions other than those mentioned above are semi ultraviolet masked regions. FIGS. 72, 125 and 127 are cross-sectional views of the halftone exposure mask of FIG. 68.

Embodiment 49

Figure 69:
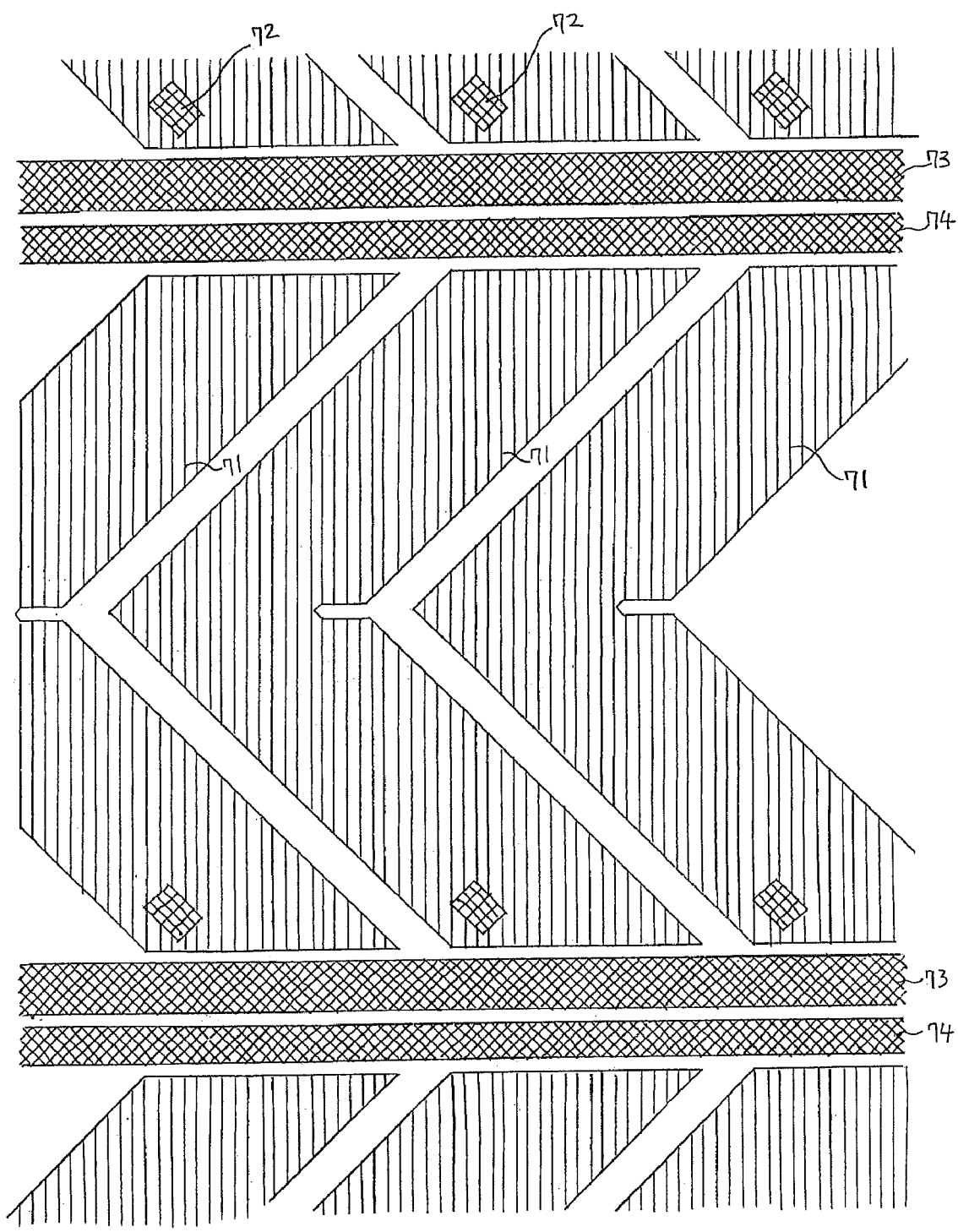
FIG. 69 is a planar view of a mask used for a first halftone exposure that adopts a MVA mode photolithographic process for three times as shown in FIG. 39 in accordance with the present invention.
Figure 70:
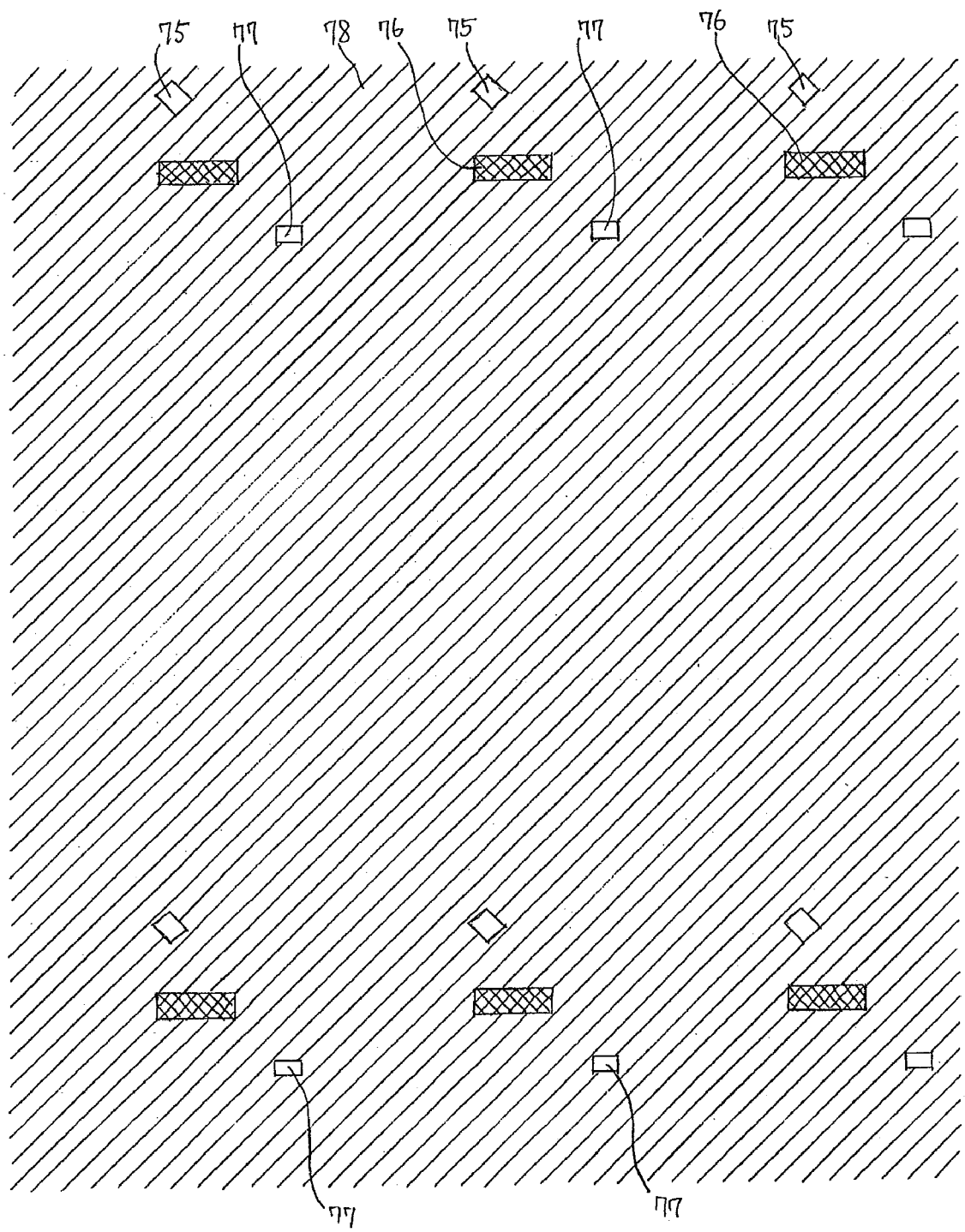
FIG. 70 is a planar view of a mask used for a second halftone exposure that adopts a MVA mode photolithographic process for three times as shown in FIG. 39 in accordance with the present invention.

FIG. 69 and FIG. 70 are planar views of halftone exposure mask used for manufacturing a MVA mode active matrix TFT substrate in accordance with Embodiment 49 of the present invention. FIG. 69 shows a mask used in a first photolithographic process that adopts the halftone exposure method for manufacturing the MVA TFT substrate of FIG. 19 by the manufacturing process of FIG. 39. This embodiment of the present invention is characterized in that the halftone exposure mask of FIG. 69 is used according to the first photolithographic process of FIGS. 46 and 173 to form a gate electrode, a common electrode, a pixel electrode and at least one contact pad disposed in the pixel electrode. In the MVA TFT substrate of FIG. 19, the source electrode (video signal line) is bent to 90 degrees at a position proximate to the center of the pixel, and installed in a direction of ±45 degrees with respect to the gate electrode. The pixel electrode, similar to the source electrode, is bent to 90 degrees at a position proximate to the center of the pixel, and installed in a direction of ±45 degrees with respect to the gate electrode. The alignment control electrode connected to the common electrode is formed substantially in the same shape of the source electrode, and bent to 90 degrees at a position proximate to the center of the pixel, and installed in a direction of ±45 degrees with respect to the gate electrode.

In FIG. 69, the region corresponding to the gate electrode (scan line) is indicated by 73; the region corresponding to the common electrode is indicated by 74; the region corresponding to the pixel electrode is indicated by 71; and the region corresponding to and the contact pad portion connected to the drain electrode is indicated by 72. The regions respectively corresponding to the gate electrode, the common electrode, the contact pad portion disposed inside the pixel electrode and connected to the drain electrode are full ultraviolet masked regions, and only the region corresponding to the pixel electrode is a semi ultraviolet masked region. FIGS. 71, 124 and 126 are cross-sectional views of the halftone exposure mask of FIG. 69.

FIG. 70 shows a mask used in a second photolithographic process that adopts the halftone exposure method for manufacturing the MVA TFT substrate of FIG. 19 by the manufacturing process of FIG. 39. This embodiment is characterized in that the halftone exposure mask of FIG. 70 is used according to the second photolithographic process of FIGS. 47 and 174 for forming an island (component separation) of a thin film transistor component of a thin film semiconductor layer and a contact hole for connecting a contact pad disposed inside a pixel electrode and a drain electrode of a thin film transistor component.

The region corresponding to an island on a thin film semiconductor layer of a thin film transistor component is indicated by 76; the region corresponding to a contact hole of a contact pad in a pixel electrode for connecting a drain electrode of the thin film transistor component is indicated by 75; and the region corresponding to a contact hole used for connecting an alignment control electrode and a common electrode is indicated by 77. Even if the region corresponding to the thin film semiconductor layer of the thin film transistor component as shown in Embodiment 47 of FIG. 266 is not used for forming an island or used for the connection, there will be no problem.

The region corresponding to an island of the thin film semiconductor layer is a full ultraviolet masked region, and the regions corresponding to the aforementioned two types of contact holes are ultraviolet penetrating regions. The regions other than those mentioned above are semi ultraviolet masked regions. FIGS. 72, 125 and 127 are cross-sectional views of the halftone exposure mask of FIG. 70.

Embodiment 50

FIGS. 142 to 145 are planar views of a mask used in a manufacturing process that adopts a halftone double exposure for manufacturing an TN mode active matrix TFT substrate in accordance with Embodiment 50 of the present invention. FIGS. 142 and 143 shows a general mask used in a first photolithographic process that adopts a halftone double exposure method to manufacture the TN mode TFT substrate of FIG. 130 by the manufacturing process of FIG. 77. In FIG. 250, the halftone double exposure method is divided into two parts that use different masks for the bottom-side semi exposure of three regions: a complete ultraviolet exposure region, a full ultraviolet masked region and a semi exposure region. After the image is developed, three regions: the region without positive photoresist, a region having a positive photoresist remained and maintained at a thickness of the coated film, and a region having a positive photoresist remained and maintained at a thickness equal to 1/10 to 1/3 of the film thickness.

The halftone double exposure method of the present invention is characterized in that two different general masks as shown in FIGS. 142 and 143 are used for adjusting the intensity of ultraviolet for the exposure, so as to obtain the same 3-D shape of the positive photoresist pattern of Embodiment 45 after the image is developed.

Figure 73:
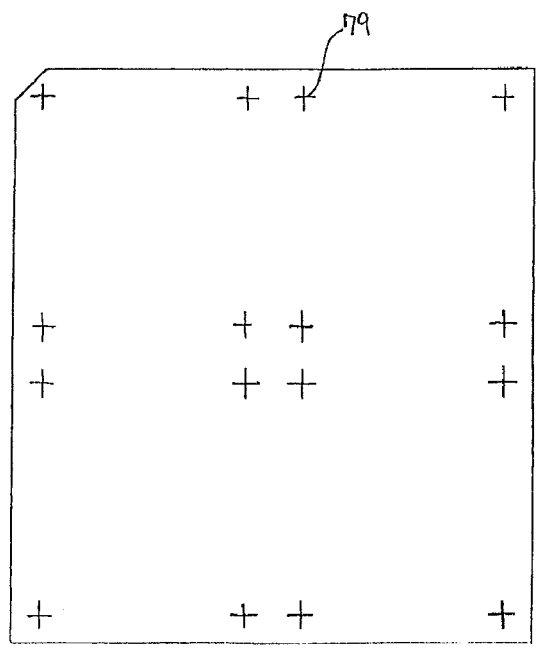
FIG. 73 is a planar view of a TFT glass substrate with an initial alignment mark before carrying out halftone double exposure method.
Figure 74:
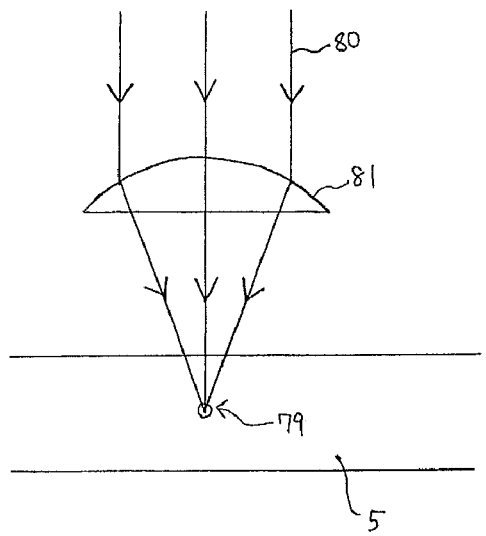
FIG. 74 is a schematic view of the principle of forming an initial alignment mark at a portion in a glass substrate by pulsed laser.

The present invention can also use an exposure device, and change two masks for the exposure, but the mass production adopted by factories usually use two exposure devices, and each exposure device installs two different masks for the exposure, and such arrangement needs not to adjust the alignment of the two masks. In FIG. 74, an alignment mark is formed inside the glass substrate by pulsed laser. FIG. 73 shows the substrate with an alignment mark.

Figure 75:
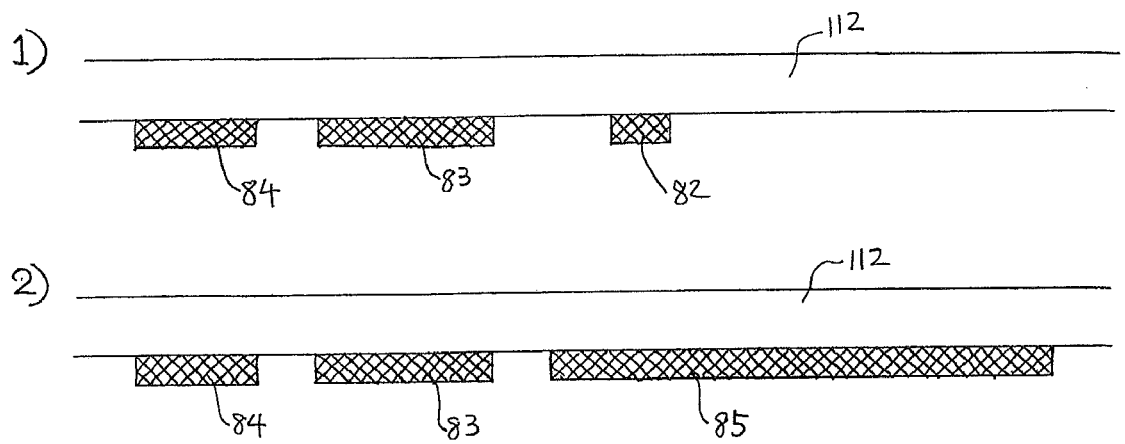
FIG. 75 is a cross-sectional view of a mask used for halftone double exposure as shown in FIGS. 92, 93, 96 and 97.

In FIGS. 142 and 143, the region corresponding to gate electrode is indicated by 83; the region corresponding to common electrode is indicated by 84; the region corresponding to pixel electrode is indicated by 85; and the region corresponding to a contact pad portion connected to a drain electrode is indicated by 82; the region corresponding to a contact pad portion connected to a holdup capacitor (Cst) forming electrode is indicated by 121. After the general mask of FIG. 142 is used for performing an incomplete exposure (halftone exposure), the general mask of FIG. 143 is used for performing a complete exposure. After the general mask of FIG. 143 is used for performing the complete exposure, the general mask of FIG. 142 performs an incomplete exposure (halftone exposure). FIGS. 75-1 and 75-2 are cross-sectional views of the mask of FIGS. 142 and 143.

In FIGS. 144 and 145, a general mask is used in a second photolithographic process that adopts a halftone double exposure method for manufacturing the TN mode TFT substrate of FIG. 130 by the manufacturing process of FIG. 77. The region corresponding a contact hole formed at a contact pad inside a pixel electrode for connecting a drain electrode of a thin film transistor component is indicated by 87; the region corresponding to a contact hole of a contact pad inside a pixel electrode for connecting a holdup capacitor (Cst) forming electrode is indicated by 122; and the region corresponding to an island of a thin film semiconductor layer of a thin film transistor component is indicated by 86.

Figure 76:
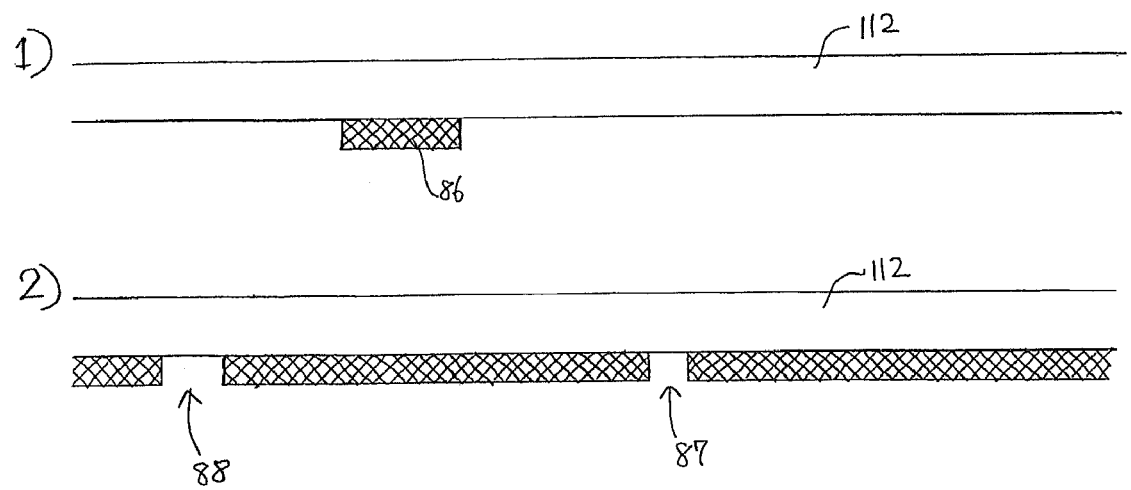
FIG. 76 is a cross-sectional view of a mask used for halftone double exposure as shown in FIGS. 94, 95, 98 and 99.

After the general mask of FIG. 144 is used for performing an incomplete exposure (halftone exposure), the general mask of FIG. 145 is used for performing a complete exposure. After general mask of FIG. 145 is used for performing a complete exposure, the general mask of FIG. 144 is used for performing an incomplete exposure (halftone exposure). FIGS. 76-1 and 76-2 are cross-sectional views of the mask of FIGS. 144 and 145.

Embodiment 51

FIGS. 155 to 158 are planar views of a mask that adopts a halftone double exposure manufacturing process for manufacturing an IPS mode active matrix TFT substrate in accordance with Embodiment 51 of the present invention. FIGS. 155 and 156 show the general mask used in a first photolithographic process that adopts a halftone double exposure method for manufacturing the IPS mode TFT substrate of FIG. 152 by the manufacturing process of FIG. 77. The halftone double exposure method of the present invention is characterized in that two different general masks as shown in FIGS. 155 and 156 are used for adjusting the intensity of ultraviolet for the exposure, so as to obtain the same 3-D shape of the positive photoresist pattern of Embodiment 46 after the image is developed. The present invention can also use an exposure device, and change two masks for the exposure, but the mass production adopted by factories usually use two exposure devices, and each exposure device installs two different masks for the exposure, and thus such arrangement needs not to adjust the alignment of the two masks. In FIG. 74, an alignment mark is formed inside the glass substrate by pulsed laser. FIG. 73 shows a substrate with an alignment mark.

In FIGS. 155 and 156, the region corresponding to a gate electrode is indicated by 83; the region corresponding to common electrode is indicated by 84; the region corresponding to comb pixel electrode is indicated by 85; the region corresponding to a contact pad portion connected to a drain electrode is indicated by 82; the region corresponding to a contact pad portion connected to a holdup capacitor (Cst) forming electrode is indicated by 127; the region corresponding to a curved comb common electrode is indicated by 177; and the region corresponding to a common electrode used for screening a video signal line is indicated by 128.

In the IPS mode TFT substrate of FIG. 152, the source electrode (video signal line), the common electrode for screening the video signal line, the comb pixel electrode and the comb common electrode are bent once at positions proximate to the center of the pixel, and thus the mask used for a halftone double exposure of FIG. 156 similarly forms a structure that is bent at a position proximate to the center of the pixel corresponding to the aforementioned mask of each electrode.

After the general mask of FIG. 155 is used for performing an incomplete exposure (halftone exposure), the general mask of FIG. 156 is used for performing a complete exposure. On the other hand, after the general mask of FIG. 156 is used for performing the complete exposure, the general mask of FIG. 155 is used for performing the incomplete exposure (halftone exposure). After the image is developed, the intensity of ultraviolet is adjusted for the incomplete exposure (halftone exposure), so that the film thickness of the positive photoresist corresponding to the regions of the common electrode for screening the video signal line, the comb pixel electrode and the comb common electrode is maintained to a thickness equal to 1/10 to 1/3 of the thickness of the coating film.

FIGS. 157 and 158 show a general mask used in a second photolithographic process that adopts a halftone double exposure method for manufacturing the IPS mode TFT substrate of FIG. 152 by the manufacturing process of FIG. 77. The halftone double exposure method of the present invention is characterized in that the two different general masks of FIGS. 157 and 158 are used to adjust the intensity of ultraviolet for exposure. After the image is developed, the positive photoresist pattern with the same 3-D shape of Embodiment 46 can be obtained. The region corresponding to an island of a thin film semiconductor layer of a thin film transistor component is indicated by 86: the region corresponding to a contact hole of a contact pad in a comb pixel electrode for connecting a drain electrode of the thin film transistor component is indicated by 129; and the region corresponding to a contact hole of a contact pad in a comb pixel electrode for connecting a holdup capacitor (Cst) forming electrode is indicated by 130. After the general mask of FIG. 157 is used for the incomplete exposure (halftone exposure), the general mask of FIG. 158 is used for the complete exposure. On the other hand, after the general mask of FIG. 158 is used for the complete exposure, the general mask of FIG. 157 is used for the incomplete exposure (halftone exposure). After the image is developed, the positive photoresist pattern with the same 3-D shape can be obtained.

Embodiment 52

FIGS. 267 to 270 are planar view of a mask used in a manufacturing process that adopts the halftone double exposure method for manufacturing an IPS mode active matrix TFT substrate in accordance with Embodiment 52 of the present invention. FIGS. 267 and 268 show a general mask used in a first photolithographic process that adopts the halftone double exposure method for manufacturing the IPS mode TFT substrate of FIG. 264 by the manufacturing process of FIG. 77. The halftone double exposure method of the present invention is characterized in that the two different general masks of FIGS. 267 and 268 are used for adjusting the intensity of ultraviolet for the exposure. After the image is developed, the positive photoresist pattern having the same 3-D shape with that of Embodiment 47 can be achieved. In FIGS. 267 and 268, the region corresponding to a gate electrode is indicated by 83; the region corresponding to a common electrode is indicated by 84; the region corresponding to a comb pixel electrode is indicated by 85; the region corresponding to a contact pad portion connected to a drain electrode is indicated by 82; a region corresponding to a contact pad portion connected to a holdup capacitor (Cst) forming electrode is indicated by 127; the region corresponding to a comb common electrode is indicated by 177; and the region corresponding to a common electrode for screening a video signal line is indicated by 128. In the IPS mode TFT substrate of FIG. 264, the source electrode (video signal line) is linear, and intersected perpendicular to the gate electrode.

After the general mask of FIG. 267 is used for the incomplete exposure (halftone exposure), the general mask of FIG. 268 is used for the complete exposure. On the other hand, after the general mask of FIG. 268 is used for the complete exposure, the general mask of FIG. 267 is used for the incomplete exposure (halftone exposure). After the image is developed, the intensity of ultraviolet is adjusted for the incomplete exposure (halftone exposure), so that the film thickness of the positive photoresist corresponding to the regions of the common electrode for screening the video signal line, the comb pixel electrode and the comb common electrode is maintained to a thickness equal to 1/10 to 1/3 of the thickness of the coating film.

FIGS. 269 and 270 shows a general mask used in a second photolithographic process that adopts the halftone double exposure method for manufacturing the IPS mode TFT substrate of FIG. 264 by the manufacturing process of FIG. 77. The halftone double exposure method of the present invention is characterized in that the two different general masks of FIGS. 269 and 270 are used for adjusting the intensity of ultraviolet for the exposure. After the image is developed, the positive photoresist pattern having the same 3-D shape of the pattern of Embodiment 47 can be obtained. In FIG. 264, an island is not formed on the thin film semiconductor layer of the thin film transistor component for the component separation, but both are connected towards the source electrode (video signal line). The region corresponding to the thin film semiconductor layer is indicated by 86; the region corresponding to a contact hole of a contact pad inside a comb pixel electrode for connecting a drain electrode of a thin film transistor component is indicated by 129; and the region corresponding to a contact hole of a contact pad inside a comb pixel electrode for connecting a holdup capacitor (Cst) forming electrode is indicated by 130. After the general mask of FIG. 269 is used for the incomplete exposure (halftone exposure), the general mask of FIG. 270 is used for the complete exposure. On the other hand, even if the general mask of FIG. 270 is used for the complete exposure, the general mask of FIG. 269 is used for the incomplete exposure (halftone exposure). After the image is developed, the positive photoresist pattern with the same 3-D shape can be obtained.

Embodiment 53

Figures 92, 93:
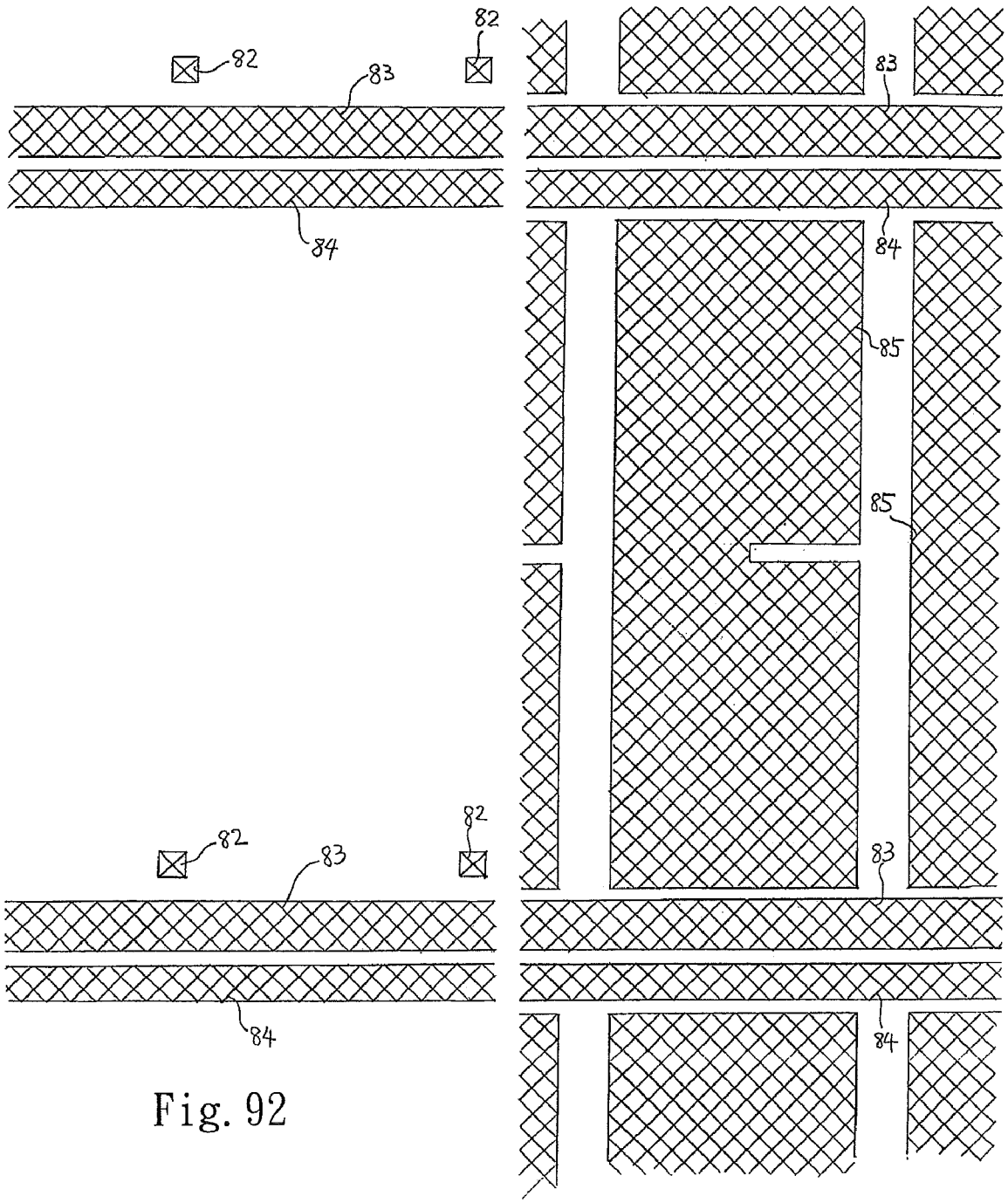
FIG. 92 is a planar view of a general mask used for Step (i) of a second halftone double exposure manufacturing process used for MVA mode as shown in FIG. 78 in accordance with the present invention.
FIG. 93 is a planar view of a general mask used for Step (ii) of a second halftone double exposure manufacturing process used for MVA mode as shown in FIG. 78 in accordance with the present invention.

FIGS. 92 to 95 are planar views of a mask used in a manufacturing process that adopts a halftone double exposure method for manufacturing a MVA mode active matrix TFT substrate in accordance with Embodiment 53 of the present invention. FIGS. 92 and 93 show the general mask used in the first photolithographic process that adopts the halftone double exposure method in the manufacturing process of FIG. 78 to manufacture the MVA TFT substrate of FIG. 15. This embodiment is characterized in that the two different general masks of FIGS. 92 and 93 are used for adjusting the intensity of ultraviolet for the exposure. After the image is developed, the positive photoresist pattern having the same 3-D shape of the pattern of Embodiment 48 can be obtained. The present invention can also use an exposure device and change two masks for the exposure, but the mass production adopted by factories usually use two exposure devices, and each exposure device installs two different masks for the exposure, and such arrangement needs not to adjust the alignment of the two masks. In FIG. 74, an alignment mark is formed inside the glass substrate by a pulsed laser, and FIG. 73 shows a substrate with an alignment mark.

In FIGS. 92 and 93, the region corresponding to a gate electrode is indicated by 83; the region corresponding to a common electrode is indicated by 84; the region corresponding to a pixel electrode is indicated by 85; and the region corresponding to a contact pad portion connected to a drain electrode is indicated by 82. After the general mask of FIG. 92 is used for the incomplete exposure (halftone exposure), the general mask of FIG. 93 is used for the complete exposure. On the other hand, after the general mask of FIG. 93 is used for the complete exposure, the general mask of FIG. 92 is used for the incomplete exposure (halftone exposure). FIGS. 75-1 and 75-2 are cross-sectional views of the masks of FIGS. 92 and 93.

FIGS. 94 and 95 show the general mask used in a second photolithographic process that adopts the halftone double exposure method for manufacturing the MVA TFT substrate of FIG. 15 by the manufacturing process of FIG. 78. The region corresponding to a contact hole of a contact pad in a pixel electrode for connecting a drain electrode of a thin film transistor component is indicated by 87; the region corresponding to a contact hole for connecting an alignment control electrode a and common electrode is indicated by 88; and the region corresponding to an island of a thin film semiconductor layer of a thin film transistor component is indicated by 86. After the general mask of FIG. 94 is used for the incomplete exposure (halftone exposure), the general mask of FIG. 95 is used for the complete exposure. On the other hand, after the general mask of FIG. 95 is used for the complete exposure, the general mask of FIG. 94 is used for the incomplete exposure (halftone exposure). After the image is developed, the positive photoresist pattern having the same 3-D shape can be obtained. FIGS. 76-1 and 76-2 are cross-sectional view of the marks of FIGS. 94 and 95.

Embodiment 54

Figure 97:
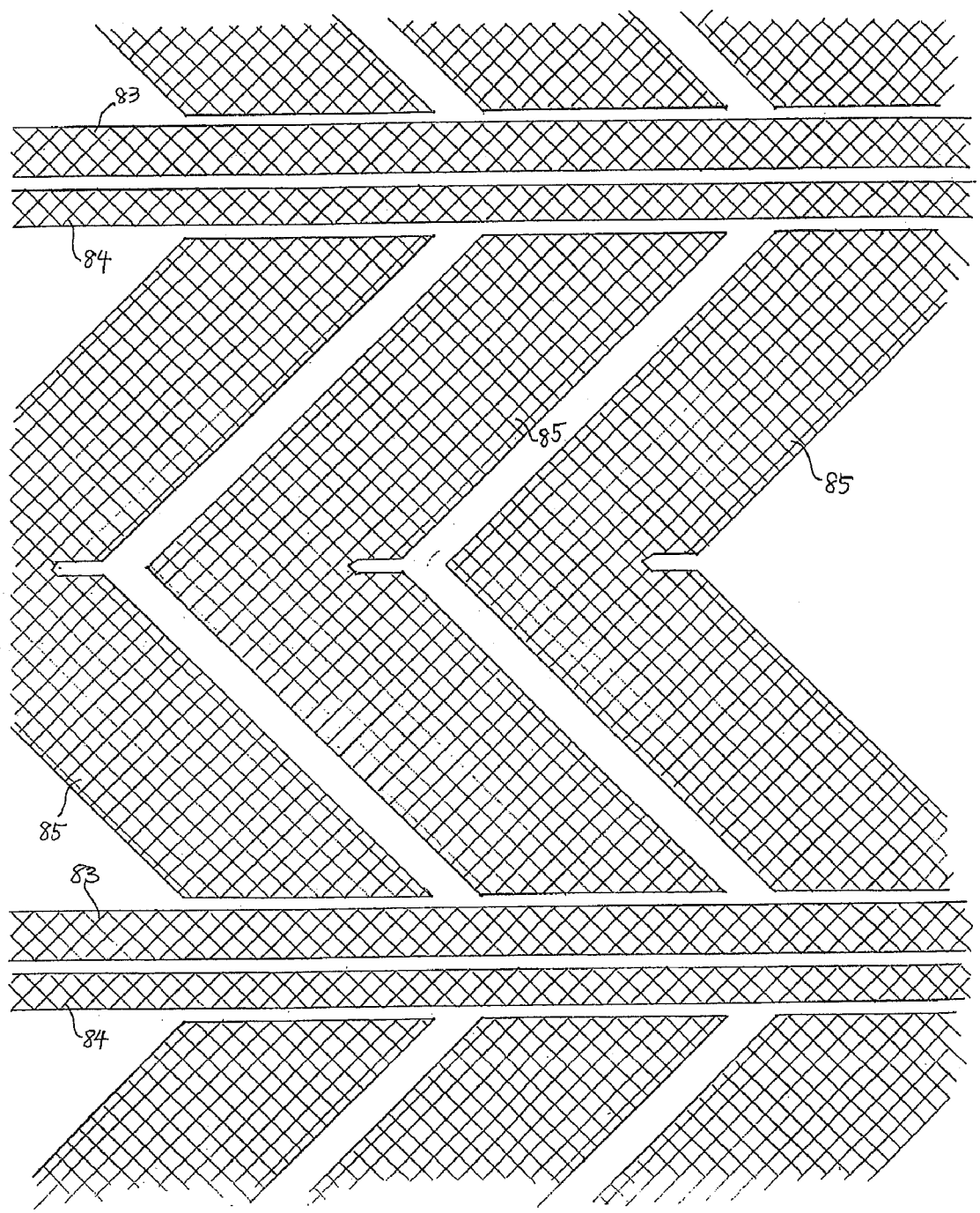
FIG. 97 is a planar view of a general mask used for Step (ii) of a second halftone double exposure manufacturing process used for MVA mode as shown in FIG. 78 in accordance with the present invention.

FIGS. 96 to 99 are planar views of a mask used in a manufacturing process that adopts the halftone double exposure method for manufacturing a MVA mode active matrix TFT substrate in accordance with Embodiment 54 of the present invention. FIGS. 96 and 97 show the general mask used in the first photolithographic process that adopts the halftone double exposure method for manufacturing the MVA TFT substrate of FIG. 19 by the manufacturing process of FIG. 78. By using the two different general masks of FIGS. 96 and 97 to adjust the intensity of ultraviolet for the exposure, the positive photoresist pattern in the same 3-D shape of the pattern of Embodiment 49 can be obtained after the image is developed. This embodiment is characterized in that the exposure method of the present invention is performed according to the first photolithographic process of FIGS. 46 and 173, while forming a gate electrode, a common electrode, a pixel electrode and at least one contact pad in the pixel electrode.

In FIGS. 96 and 97, the region corresponding to gate electrode is indicated by 83; the region corresponding to common electrode is indicated by 84; the region corresponding to pixel electrode is indicated by 85; and the region corresponding to a contact pad portion connected to a drain electrode is indicated by 82. After the general mask of FIG. 96 is used for the incomplete exposure (halftone exposure), the general mask of FIG. 97 is used for the complete exposure. On the other hand, after the general mask of FIG. 97 is used for the complete exposure, the general mask of FIG. 96 is used for the incomplete exposure (halftone exposure). After the image is developed, the positive photoresist pattern with the same 3-D shape can be obtained. The general mask of FIG. 97 may not be used for the complete exposure, but it is used for the incomplete exposure (halftone exposure) instead. As long as the condition of stacking the positive incomplete exposure region of the general mask of FIG. 96 with the incomplete exposure region area of the general mask of FIG. 97 for completely exposing the positive photoresist, there will be no problem.

Figure 98:
FIG. 98 is a planar view of a general mask used for Step (i) of a third halftone double exposure manufacturing process used for MVA mode as shown in FIG. 78 in accordance with the present invention.
Figure 99:
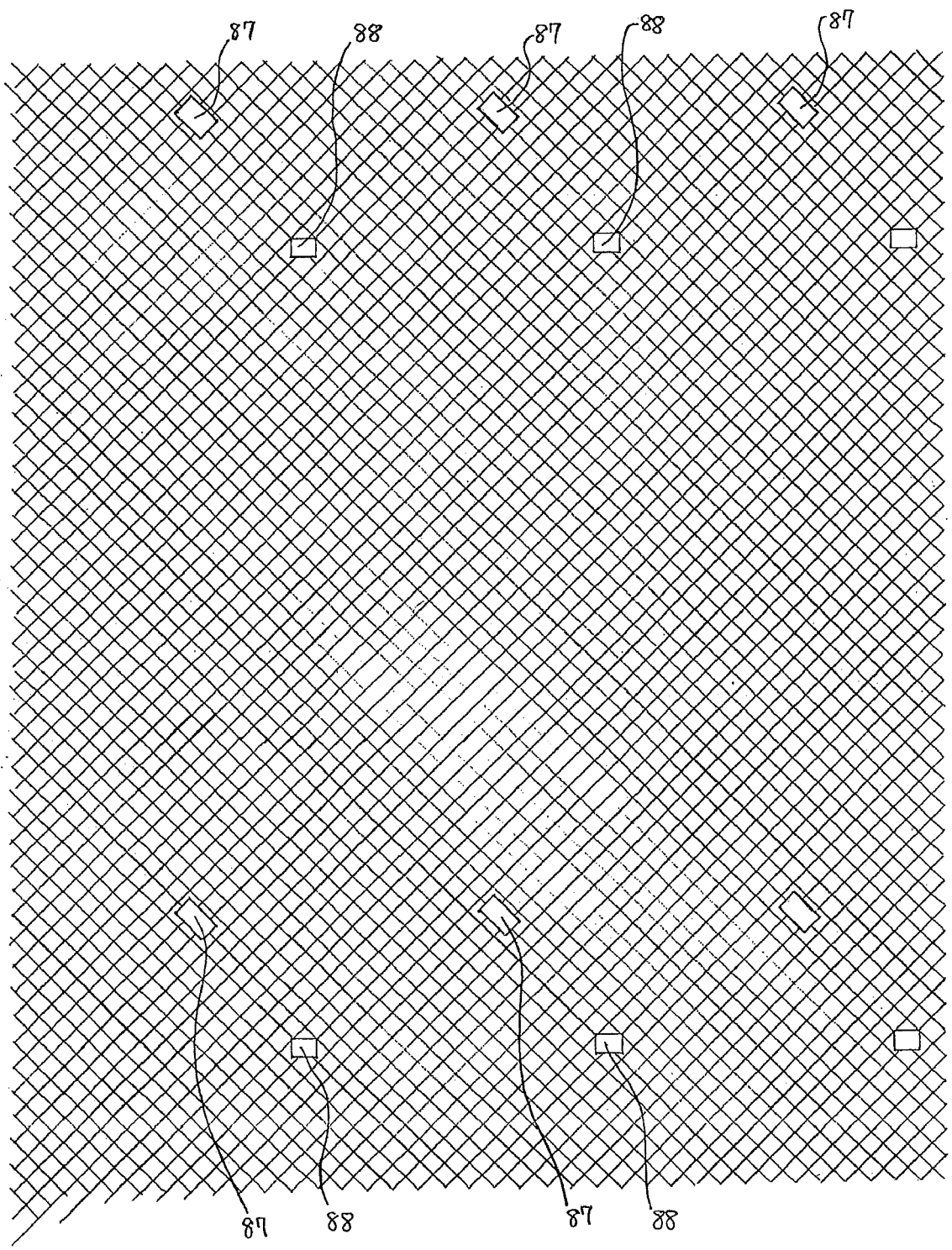
FIG. 99 is a planar view of a general mask used for Step (ii) of a third halftone double exposure manufacturing process used for MVA mode as shown in FIG. 78 in accordance with the present invention.

FIGS. 98 and 99 show the general mask used in the second photolithographic process that adopts the halftone double exposure method for manufacturing the MVA TFT substrate of FIG. 19 by the manufacturing process of FIG. 78.

This embodiment is characterized in that the general mask of FIGS. 98 and FIG. 99 is used for the manufacture according to the second photolithographic process of FIGS. 47 and 174, while forming an island (a component separation), a contact hole for connecting a thin film semiconductor layer of a thin film transistor component, and a contact pad in a pixel electrode for connecting a drain electrode of the thin film transistor component.

The region corresponding to an island of a thin film semiconductor of a thin film transistor component is indicated by 86; the region corresponding to contact hole formed in a contact pad of a pixel electrode for connecting a drain electrode of the thin film transistor component is indicated by 87; and the region corresponding to a contact hole for connecting an alignment control electrode and a common electrode is indicated by 88. Even Embodiment 47 of FIG. 266 is not used, the island corresponding to the thin film semiconductor layer of the thin film transistor component is formed and connected, and thus there will be no problem.

After the general mask of FIG. 98 is used for the incomplete exposure (halftone exposure), the general mask of FIG. 99 is used for the complete exposure. On the other hand, after the general mask of FIG. 99 is used for the complete exposure, the general mask of FIG. 98 is used for the incomplete exposure (halftone exposure). After the image is developed, the positive photoresist pattern with the same 3-D shape can be obtained. FIGS. 76-1 and 76-2 are cross-sectional views of the mask of FIGS. 98 and 99. The general mask of FIG. 99 may not be used for the complete exposure, and it is used for the incomplete exposure (halftone exposure). As long as the condition of stacking the positive incomplete exposure region of the general mask of FIG. 98 with the incomplete exposure region area of the general mask of FIG. 99, and performing two times of incomplete exposures for completely exposing the positive photoresist, there will be no problem.

Embodiment 55

FIGS. 82, 83, 103 and 104 are schematic views of a manufacturing flow of in accordance with Embodiment 55 of the present invention, wherein a DMD component direct writing halftone exposure device is used in the manufacturing process of TFT matrix substrate, and the DMD component integrates the semiconductor components produced by TI and optical components of an optical mirror. The DMD component direct writing exposure device as shown in FIG. 80 has been produced in the mass production of PDP. Since laser, ultraviolet, blue semiconductor laser, and LED light source are usually used in most projecting exposures, therefore the conventional exposure device having a very high-voltage mercury lamp can be miniaturized.

Figure 81:
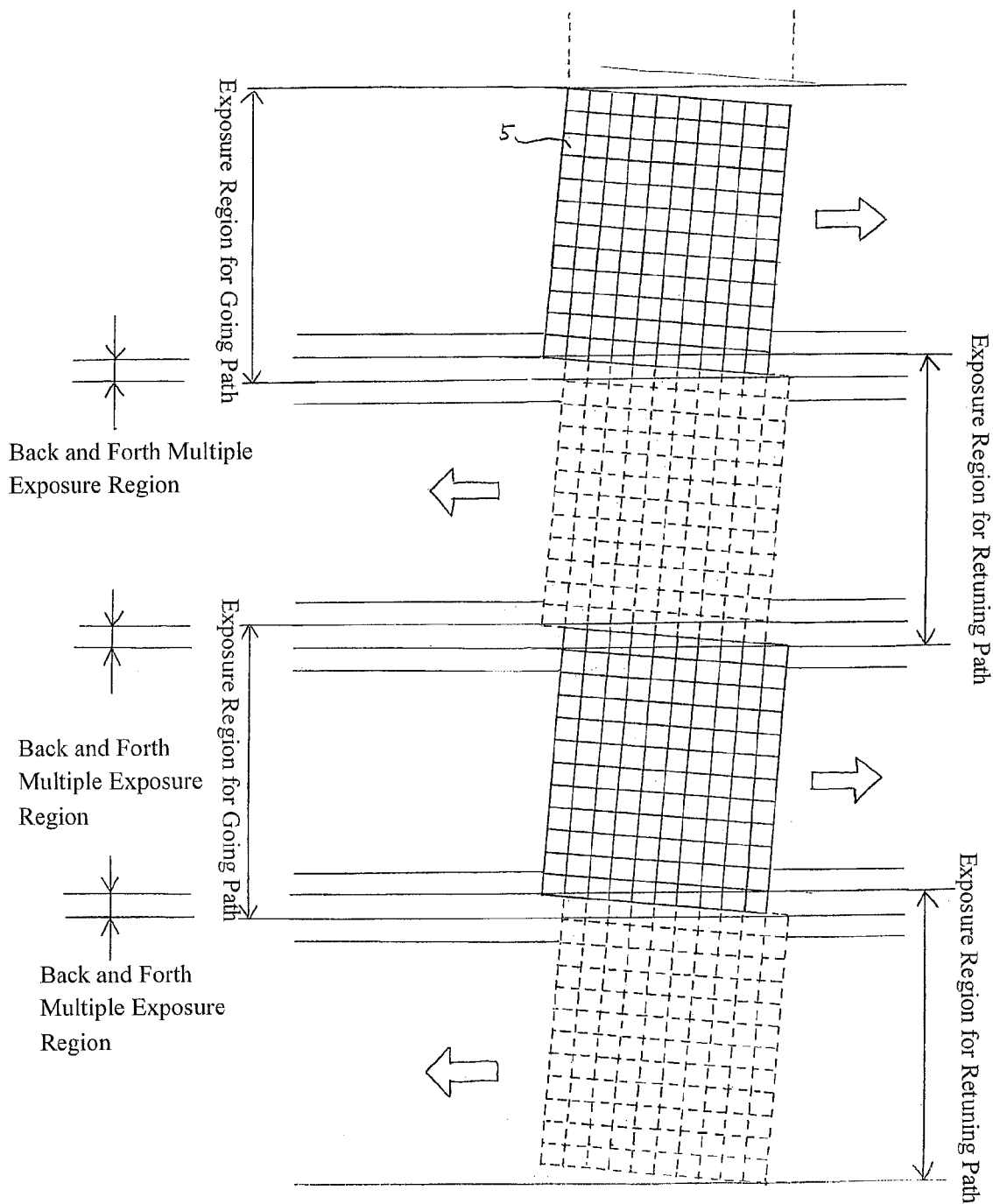
FIG. 81 is a planar view of the installation and stacking of DMD components when the DMD components are used repeatedly for multiple exposure in accordance with the present invention.

FIG. 81 shows a DMD component on a glass substrate coated with a positive photoresist. This embodiment exposes the glass substrate back and forth for a full exposure, but a one-way exposure (instead of the back and forth exposure) as shown in FIG. 81 will not cause any problem, as long as the multiple exposure areas of the DMD component and another DMD component are overlapped with each other.

If the mask is used, a titler is needed to write the title into the substrate. However, the titler for writing the title of the DMD component direct writing exposure device can be done by software, and thus it is not necessary to have a dedicated titler. The exposure conditions of the positive photoresist can be set by software for all area including the substrate. A number of times of the multiple exposure can be set to achieve the a slight reflection of the glass substrate along the DMD component scanning direction. In FIG. 250, two different masks are used for the performing the multiple exposure for two times, but several hundreds to a thousand times of multiple exposures can be performed easily by using the DMD component, and thus present invention is very suitable for the exposure device used in a halftone exposure process.

Only one device is used for rewriting the software data, and the halftone mask of FIGS. 67, 68, 69, 70, 140, 141, 153, 154, 265 and 266 is used for the exposure. Similarly, a 3-D positive photoresist pattern can be obtained easily. Since the absolute size adjustment simply requires rewriting the software data, therefore the problem of having a wrong size can be solved within a short time. Since it simply requires to increase the quantity of projection lenses for manufacturing a large substrate, therefore the line for manufacturing super large LCD TVs can be used for producing super high-precision panels for PC is the resolution is improved.

At present, the DMD component by TI is used, and equal quantity of projecting exposure lenses is used to achieve the 10 μm line and the positive photoresist pattern. Such resolution is sufficient for the exposure of the R, G, B color filter layer of the BM (light-shielding film) used for the color filter, the MVA mode alignment control protruding lump or alignment control slit. More particularly, when the BM is exposed by the exposure device of FIG. 80, the absolute size of the TFT matrix substrate can be adjusted and completed in a short time, and thus the present invention can be used for mass production.

Embodiment 56

FIGS. 122, 116, 117, 118 and FIG. 119 are schematic views of a manufacturing process that adopts a halftone exposure method for forming a gate electrode, a pixel electrode and a common electrode, and cross-sectional views of a two-layer gate electrode in accordance with Embodiment 56 of the present invention, when heterogeneous metal films are formed continuously by sputtering, metal layers with diffused atoms are formed on the heterogeneous metal joint interface. Since the etching speed in this region is very large, therefore an inverted conical shape may be formed easily by the wet etching pattern. To prevent the occurrence of the aforementioned situation, Embodiment 56 of the present invention as shown in FIGS. 116 to 119 forms a first layer metal or a transparent conductor film, and then forms an upper layer of a metal film, mixes 1~20% of nitrified gas (nitrogen, ammonia, hydrazine, and dydrazone) into the inert gas (rare gas: argon and krypton) for the spluttering to form a nitride film of 1~10 μm thick at the beginning stage of the film formation. After the desired thickness is achieved, the supply of nitrified gas is stopped, and only the inert gas is used for forming the upper layer metal film of the second layer. FIG. 122 is a cross-sectional view of forming a first layer on the interface region with doped nitrogen second layer (nitride layer) and the metal second layer. FIGS. 112 to 114 are schematic views of a manufacturing flow of the present invention.

If the glass substrate uses a low-cost sodium-calcium glass (or soda glass), the aluminum alloy may be corroded by the alkaline constituents. In Embodiment 56 of the present invention, if a very corrosive metal, oxide transparent conductor or nitride transparent conductor exists in the lower layer of aluminum alloy, the issue of corrosion does not exist even if no alkali-resisting protective layer is coated in advance, and thus the invention can lower the cost. Even if the manufacturing method of FIG. 1-15 is used for preventing the aluminum alloy or molybdenum metal from being corroded, but the aluminum alloy or molybdenum metal is formed into an inverted conical shape easily, if the interface area is not doped with nitrogen during the conventional manufacturing flow cross-sectional view of FIG. 84. As a result, the wire breaking of the source electrode (video signal line), and the breakdown voltage of the gate electrode and the source electrode are reduced, and short circuits due to static charges may occur easily, and the yield rate of mass production will be dropped. Referring to FIG. 84 for a cross-sectional view of a manufacturing flow, the gate insulating film on the pixel electrode is removed completely, and thus titanium, zirconium, titanium nitride or zirconium nitride cannot be used for the transparent conductor of the first layer (or lower layer) in the manufacturing process of FIG. 84. If the conventional manufacturing process of FIG. 84 is adopted and an aluminum alloy is used for the second layer metal, only ITO or IZO transparent conductor can be used. In such condition, the local cell reaction and abnormal etching may occur easily during the image development or wet etching, and thus the conventional manufacturing process cannot be used for mass production.

Embodiment 57

FIGS. 271, 120 and 121 show schematic views of a manufacturing flow of a manufacturing process of a TFT matrix substrate, and cross-sectional view of the manufacturing process that uses a single-layer aluminum alloy for the manufacture and uses a general exposure process to form a source electrode (video signal line), a drain electrode, a holdup capacitor forming electrode (Cst), an alignment control electrode and a comb common electrode in accordance with Embodiment 57 of the present invention. In FIG. 175, the source electrode and the drain electrode adopt a two-layer metal structure for the barrier. Although the aluminum alloy is applied to all regions, a single-layer structure of aluminum alloy should be used in the manufacturing process for the mass production of large glass substrates over 2 m to lower the cost and improve the throughput.

FIG. 48 is a schematic view of the manufacturing process of using a single-layer metal structure and it is necessary to use the manufacturing process of FIG. 174 to prevent the occurrence of a spike phenomenon on the n+amorphous silicon layer due to the diffusion of aluminum and the formation of an amorphous silicon island. In FIGS. 174 and 175, a barrier metal is formed on the n+amorphous silicon layer to prevent the spike phenomenon of the aforementioned aluminum alloy.

After the amorphous silicon island (semiconductor component separation) is formed by the manufacturing process of FIG. 47 in accordance with Embodiment 57 of the present invention, a method of forming the single-layer metal film of FIG. 48 is applied to the aluminum alloy to prevent the spike phenomenon occurred at the n+amorphous silicon layer due to the diffusion of aluminum. The characteristics of this embodiment are shown in the enlarged cross-sectional view of FIG. 123, and when the aluminum alloy film is formed, nitrogen atoms are doped to a thickness of 1~10 nm in the aluminum alloy at the beginning stage of film formation to form an n+amorphous silicon layer having an electric resistance of ohmic contact below 100 KΩ, and preferably below 10 KΩ to prevent the diffusion of aluminum atoms of the aluminum alloy. More specifically, FIG. 271 shows a manufacturing flow that forms an aluminum alloy film by sputtering, and at the beginning stage of film formation, the inert gas (including rare gas: argon and krypton) are mixed in 1~20% of nitrified gas (including nitrogen, ammonia, hydrazine and dydrazone) are sputtered on the aluminum alloy, and after the aluminum alloy is doped nitrogen atoms to the thickness of 1~10 nm, the nitrified gas is stopped, and only the inert gas is used in the manufacturing process for forming the aluminum alloy film by spluttering the inert gas, and this process is substantially the same as the manufacturing process of Embodiment 56. However, there is no problem with the contact resistance when nitrogen atoms are doped as that in Embodiment 56. If the contact resistance is over 1 MΩ in Embodiment 57 of the present invention, non-uniform display will occur, and thus it is necessary to suppress the contact resistance to a level below 100 KΩ. FIGS. 120 and 121 are cross-sectional views of using the manufacturing process of FIG. 271 to form a TFT matrix substrate having a source electrode, a drain electrode and an alignment control electrode or a holdup capacitor (Cst) forming electrode by a single-layer structure of aluminum alloy. By using the manufacturing process of FIG. 271 of the present invention, the single-layer structure of aluminum alloy of FIG. 48 can be used in the source electrode and the drain electrode. Together with the manufacturing process of FIG. 47, a TFT matrix manufacturing process with a minimum cost, a fast throughput and a good yield rate can be achieved.

Embodiment 58

Referring to FIGS. 272, 273 275 and 276 for section views of a manufacturing flow that uses a single-layer aluminum alloy for manufacturing a TFT matrix substrate, and a general exposure process for forming a source electrode (video signal line), a drain electrode, a holdup capacitor (Cst) forming electrode, an alignment control electrode and a comb common electrode in accordance with Embodiment 58 of the present invention. In FIG. 175, the source electrode and the drain electrode adopt a two-layer metal structure for the barrier. Although the aluminum alloy is applied to all regions, a single-layer structure of aluminum alloy should be used in the manufacturing process for the mass production of large glass substrates over 2 m to lower the cost and improve the throughput.

In Embodiment 58 of the present invention, the manufacturing process of FIG. 47 is used for forming an amorphous silicon island (semiconductor component separation), and then the method of forming a single-layer metal film of FIG. 48 adopts aluminum alloy for the manufacture, and it is necessary to prevent the occurrence of a spike phenomenon on the n+amorphous silicon layer due to the diffusion of aluminum. This embodiment, similar to the enlarged cross-sectional view of 274, nitrogen atoms are doped on the sidewalls of the n+amorphous silicon layer and non-doped amorphous silicon layer on the substrate having the aluminum alloy film, and the ohmic contact electric resistance of the aluminum alloy and the n+amorphous silicon layer is adjusted below 100 K$\Omega$, and preferably below 10 K$\Omega$. More specifically, FIGS. 272 and 273 show schematic views of a manufacturing flow, and after the manufacturing process for the thin film semiconductor component separation is completed, the mixed nitrified gas (nitrogen, ammonia, hydrazine, dydrazone) and the rare gas (helium, neon, argon) can be used. In a vacuum chamber, a plasma discharge is performed for nitriding the surface of the n+amorphous silicon and the sidewalls of the non-doped amorphous silicon layer (ia-Si layer) by plasma, or a method of accelerating nitrogen ions in the vacuum chamber for injecting the nitrogen atoms on the surface of the n+amorphous silicon and the sidewalls of the non-doped amorphous silicon layer is used to maintain the concentration of the nitrogen atoms doped on the surface of the n+amorphous silicon surface and the sidewalls of the non-doped amorphous silicon layer to $10^{19} \sim 10^{21}/cm^3$, so as to prevent the aluminum atom from being diffused from the aluminum alloy layer. If the too many nitrogen atoms are doped, then the electric resistance of the ohmic contact of the n+amorphous silicon layer and the aluminum alloy layer is up to 1 M$\Omega$, and thus causing a defective display. Therefore, it is preferably to adjust the quantity of doped nitrogen atoms to maintain the electric resistance of the ohmic contact below 100 K$\Omega$, and preferably below 10 K$\Omega$.

FIGS. 275 and 276 are cross-sectional views of a TFT matrix substrate that adopts the manufacturing process of FIGS. 272 and 273 to form an aluminum alloy single-layer structure having a source electrode, a drain electrode and an alignment control electrode or a holdup capacitor (Cst) forming electrode. In the aluminum alloy, 1~7 atm % nickel alloy is included. After the film is formed by sputtering, an annealing process at 200□is preformed until the resistance is reduced to 5 µ$\Omega$cm, so as to achieve the best aluminum alloy for making the single-layer structure of the source electrode and the drain electrode.

Embodiment 59

Referring to FIGS. 277 to 284 for schematic views of a manufacturing process that adopts four times of a photolithographic process and two times of a halftone exposure for manufacturing a matrix substrate in accordance with Embodiment 59 of the present invention. In the aforementioned eight schematic views, a passivation film is not partially formed, but the passivation film is formed on the whole substrate, and the last fourth photolithographic process is used to remove the passivation film that is covered on the terminal connected to a driving IC. Compared with the method of forming a partial passivation film, the invention needs one more time of the photolithographic process, but it is very difficult to form partial passivation films for several tens of TFT panels can be formed on a piece of glass substrate, passivation film. Therefore, the present invention adds a fourth photolithographic process to effectively improve the efficiency of using glass substrate.

What is claimed is:

1. A method of manufacturing a TN mode, a MVA mode or an IPS active matrix substrate of active matrix display apparatus, characterized in that the method uses a photolithographic process for four times for the manufacture and comprises the steps of:
   (1) using a halftone mask for a first halftone exposure to form a gate electrode, a pixel electrode, a common electrode and a contact pad in the pixel electrode;
   (2) using a halftone mask for a second halftone exposure to form a thin film semiconductor layer component separation and a contact hole;
   (3) using a general mask to form a source electrode, a drain electrode and a holdup capacitor forming electrode; and
   (4) using the general mask to form contact holes of a gate electrode terminal, a source electrode terminal and a common electrode terminal.

2. A method of manufacturing a MVA mode active matrix substrate of active matrix display apparatus, characterized in that the method uses a photolithographic process for four times for the manufacture and comprises the steps of:
   (1) using a halftone mask for a first halftone exposure to form a gate electrode, a pixel electrode, a common electrode and a contact pad in the pixel electrode;
   (2) using a halftone mask for a second halftone exposure to form a thin film semiconductor layer component separation and a contact hole;
   (3) using a general mask to form a source electrode, a drain electrode and an alignment control electrode; and
   (4) using a general mask to form contact holes of a gate electrode terminal, a source electrode terminal and a common electrode terminal.

3. A method of manufacturing a FFS active matrix substrate, which is a manufacturing method of an active matrix substrate of an active matrix display apparatus, characterized in that the method uses a photolithographic process for four times for the manufacture, and comprises the steps of:
   (1) using a halftone mask for a first halftone exposure to form a gate electrode, a pixel electrode, a common electrode and a contact pad in the pixel electrode;
   (2) using a halftone mask for a second halftone exposure to form a thin film semiconductor layer component separation and a contact hole;

(3) using a general mask to form a source electrode, a drain electrode and a comb common electrode; and (4) using a general mask to form contact holes of a gate electrode terminal, a source electrode terminal and a common electrode terminal.

4. A method of manufacturing a TN mode, a MVA mode or an IPS active matrix substrate, which is a manufacturing method of an active matrix substrate of an active matrix display apparatus, characterized in that the method uses a photolithographic process for three times for the manufacture, and comprises the steps of:

(1) using a halftone mask for a first halftone exposure to form a gate electrode, a pixel electrode, a common electrode and a contact pad in the pixel electrode;

(2) using a halftone mask for a second halftone exposure to form a thin film semiconductor layer component separation and a contact hole; and (3) using a general mask to form a source electrode, a drain electrode and a holdup capacitor forming electrode;

thereby, after an ohmic contact layer of a channel of a thin film transistor is dry etched, a mask deposition method is used for forming a silicon nitride film (which is not formed on a gate electrode terminal, a source electrode terminal or a common electrode terminal) by a P-CVD device.

5. A method for manufacturing a MVA mode active matrix substrate, which is a manufacturing method of an active matrix substrate of an active matrix display apparatus, characterized in that the method uses a photolithographic process for three times for the manufacture, and comprises the steps of:

(1) using a first halftone exposure method for producing a halftone mask to form a gate electrode, a pixel electrode, a common electrode and a contact pad in the pixel electrode;

(2) using a second halftone exposure method for producing a halftone mask to form a thin film semiconductor layer component separation and a contact hole; and (3) using a general mask to form a source electrode, a drain electrode and an alignment control electrode;

thereby, after an ohmic contact layer of a channel of a thin film transistor is dry etched, a mask deposition method is used to form a silicon nitride film (which is not formed on a gate electrode terminal, a source electrode terminal or a common electrode terminal) by a P-CVD device.

6. A method of manufacturing an active matrix substrate, characterized in that the method uses a photolithographic process for three times for the manufacture, and comprises the steps of:

(1) using a halftone mask for a first halftone exposure to form a gate electrode, a pixel electrode, a common electrode and a contact pad in the pixel electrode;

(2) using a halftone mask for a second halftone exposure to form a thin film semiconductor layer component separation and a contact hole; and (3) using a general mask to form a source electrode, a drain electrode and a comb common electrode;

thereby, after an ohmic contact layer of a channel of a thin film transistor is dry etched, a mask deposition method is used to form a silicon nitride film (which is not formed on a gate electrode terminal, a source electrode terminal or a common electrode terminal) by a P-CVD device.

7. A method of manufacturing a TN mode, a MVA mode or an IPS active matrix substrate, which is a manufacturing method of an active matrix substrate of an active matrix display apparatus, characterized in that a halftone double exposure method is used for two times and a photolithographic process is used for four times for the manufacture, and the method firstly forms an absolute standard alignment mark in a glass substrate by using pulsed laser and comprises the steps of:

(1) using a first halftone double exposure method (for an exposure of the absolute standard alignment mark) comprising the steps of:

a. using a general mask for a bottom-side semi exposure to form a gate electrode, a common electrode and a contact pad in a pixel electrode, and b. using a general mask for a general exposure for the pixel electrode, the gate electrode and the common electrode (such that the gate electrode, the pixel electrode, the common electrode and the contact pad in the pixel electrode can be formed by the multiple exposure as described in Steps a and b);

(2) using a second halftone double exposure method, comprising the steps of:

a. using a general mask for a bottom-side semi exposure of a thin film semiconductor component, and b. using a general mask for a general exposure of a contact hole (forming the component separation and the contact hole of the thin film semiconductor layer achieved by a multiple exposure as described in Steps a and b);

(3) using a general mask for a general exposure to form a source electrode, a drain electrode and a holdup capacitor forming electrode; and (4) using a general mask for a general exposure to form contact holes of a gate electrode terminal, a source electrode terminal and a common electrode terminal.

8. A method of manufacturing a MVA mode active matrix substrate, which is a manufacturing method of an active matrix substrate of an active matrix display apparatus, characterized in that a halftone double exposure method is used for two times in four times of a photolithographic process for the manufacture, and the method comprises the steps of:

firstly, using pulsed laser to form an absolute standard alignment mark in a portion of a glass substrate, (1) First halftone double exposure method (for aligning the absolute standard alignment mark for exposure):

a. using a general mask for a bottom-side semi exposure of a gate electrode, a common electrode and a contact pad in a pixel electrode, and b. using a general mask for a general exposure (achieved by a multiple exposure as described in Steps a and b to form the gate electrode, the pixel electrode, the common electrode and the contact pad in the pixel electrode) of the pixel electrode, the gate electrode and the common electrode; and (2) Second halftone double exposure method:

a. using a general mask for a bottom-side semi exposure of a thin film semiconductor component portion, and b. using a general mask for a general exposure (achieved by a multiple exposure as described in Steps a and b to form a component separation and a contact hole of the thin film semiconductor layer) of a contact hole;

(3) using a general mask for a general exposure to form a source electrode, a drain electrode and an alignment control electrode; and (4) using a general mask for a general exposure to form contact holes of a gate electrode terminal, a source electrode terminal and a common electrode terminal.

9. A method of manufacturing a FFS mode active matrix substrate, which is a manufacturing method of an active matrix substrate of an active matrix display apparatus, characterized in that a halftone double exposure method is used for two times for performing the four times of a photolithographic process for the manufacture, and the method comprises the steps of:

firstly, using pulsed laser to form an absolute standard alignment mark in a portion of a glass substrate, (1) First halftone double exposure method (for aligning the absolute standard alignment mark for exposure):
 a. using a general mask for a bottom-side semi exposure in a gate electrode, a common electrode and of a contact pad in a pixel electrode, and
 b. using a general mask for a general exposure of the pixel electrode, the gate electrode and the common electrode (achieved by a multiple exposure as described in Steps a and b to form the gate electrode, the pixel electrode, the common electrode and the contact pad in the pixel electrode); and (2) Second halftone double exposure method:
 a. using a general mask for a bottom-side semi exposure of a thin film semiconductor component portion, and
 b. using a general mask for a general exposure of a contact hole (achieved by a multiple exposure as described in Steps a and b to form a component separation and a contact hole of the thin film semiconductor layer);

(3) using a general mask for a general exposure method for the formation of a source electrode, a drain electrode and an alignment control electrode; and (4) using a general mask for a general exposure method for the formation of contact holes of a gate electrode terminal, a source electrode terminal and a common electrode terminal.

10. A method of manufacturing a TN mode, a MVA mode or an IPS active matrix substrate, which is a manufacturing method of an active matrix substrate of an active matrix display apparatus, characterized in that a halftone double exposure method is used for two times for performing the three times of a photolithographic process:

firstly, using pulsed laser to form an absolute standard alignment mark in a portion of a glass substrate, (1) First halftone double exposure method (for aligning the absolute standard alignment mark for exposure):
 a. using a general mask for a bottom-side semi exposure of a gate electrode, a common electrode and a contact pad in a pixel electrode, and
 b. using a general mask for a general exposure of the pixel electrode, the gate electrode and the common electrode (achieved by a multiple exposure as described in Steps a and b to form the gate electrode, the pixel electrode, the common electrode and the contact pad in the pixel electrode); and (2) Second halftone double exposure method:
 a. using a general mask for a bottom-side semi exposure of a thin film semiconductor component portion, and
 b. using a general mask for a general exposure (achieved by a multiple exposure as described in Steps a and b to form a component separation and a contact hole of the thin film semiconductor layer) for a contact hole;

(3) using a general mask in a general exposure method for forming a source electrode, a drain electrode and a holdup capacitor forming electrode, and adopting mask deposition method and using a P-CVD device to form a silicon nitride film (which is a film not formed on the gate electrode terminal, the source electrode terminal and the common electrode terminal) after dry etching an ohmic contact layer of a channel of the thin film transistor.

11. A method of manufacturing a MVA mode active matrix substrate, which is a manufacturing method of an active matrix substrate of an active matrix display apparatus, characterized in that a halftone double exposure method is used for two times for performing the three times of a photolithographic process:

firstly, using pulsed laser to form an absolute standard alignment mark in a portion of a glass substrate, (1) First halftone double exposure method (for aligning the absolute standard alignment mark for exposure):
 a. using a general mask for a bottom-side semi exposure of a gate electrode, a common electrode and a contact pad in a pixel electrode, and
 b. using a general mask for a general exposure of the pixel electrode, the gate electrode and the common electrode (achieved by a multiple exposure as described in Steps a and b to form contact holes in the gate electrode, pixel electrode, common electrode and pixel electrode).

(2) Second halftone double exposure method:
 a. using a general mask for a bottom-side semi exposure of a thin film semiconductor component portion, and
 b. using a general mask for a general exposure of a contact hole (achieved by a multiple exposure as described in Steps a and b to form a component separation and a contact hole of the thin film semiconductor layer); and (3) using a general mask for a general exposure to form a source electrode, a drain electrode and an alignment control electrode;

thereby, after an ohmic contact layer of a channel of a thin film transistor is dry etched, a mask deposition method is used for forming a silicon nitride film (which is not formed on a gate electrode terminal, a source electrode terminal or a common electrode terminal) by a P-CVD device.

12. A method of manufacturing a FFS mode active matrix substrate, which is a manufacturing method of an active matrix substrate of an active matrix display apparatus, characterized in that a halftone double exposure method is used for two times for performing the three times of a photolithographic process:

firstly, using pulsed laser to form an absolute standard alignment mark in a portion of a glass substrate, (1) First halftone double exposure method (for aligning the absolute standard alignment mark for exposure):
 a. using a general mask for a bottom-side semi exposure of a gate electrode, a common electrode and a contact pad in a pixel electrode, and
 b. using a general mask for a general exposure of a pixel electrode, a gate electrode and a common electrode (achieved by a multiple exposure as described in Steps a and b to form a gate electrode, a pixel electrode, a common electrode and the contact pad in the pixel electrode);

(2) Second halftone double exposure method:
 a. using a general mask for a bottom-side semi exposure of a thin film semiconductor component portion,
 b. using a general mask for a general exposure of a contact hole (achieved by a multiple exposure as described in Steps a and b to form a thin film semiconductor layer component separation and a contact hole); and (3) using a general mask for a general exposure to form a source electrode, a drain electrode and a comb common electrode;

thereby, after an ohmic contact layer of a channel of a thin film transistor is dry etched, a mask deposition method is used to form a silicon nitride film (which is not formed at a gate electrode terminal, a source electrode terminal and a common electrode terminal) by a P-CVD device.

13. A method of manufacturing a TN mode or a MVA mode active matrix substrate, which is a manufacturing method of an active matrix substrate of an active matrix display apparatus, characterized in that a DMD direct writing exposure device is used for two times for performing four times of a photolithographic process of a DMD halftone non-masking exposure, and the method comprises the steps of:
  (1) using the DMD halftone non-masking exposure method for a first time to form a gate electrode, a pixel electrode, a common electrode and a contact pad in a pixel electrode;
  (2) using the DMD halftone non-masking exposure method for a second time to form a thin film semiconductor layer component separation and a contact hole;
  (3) using a general mask exposure method or a general DMD non-masking exposure method to form a source electrode, a drain electrode and a holdup capacitor forming electrode; and
  (4) using a general mask exposure method or a general DMD non-masking exposure method to form contact holes of a gate electrode terminal, a source electrode terminal and a common electrode terminal.

14. A method of manufacturing a MVA mode active matrix substrate, which is a manufacturing method of an active matrix substrate of an active matrix display apparatus, characterized in that a DMD direct writing exposure device is used for two times for performing four times of a photolithographic process of a DMD halftone non-masking exposure, and the method comprises the steps of:
  (1) using the DMD halftone non-masking exposure method for a first time to form a gate electrode, a pixel electrode, a common electrode and a contact pad in the pixel electrode;
  (2) using the DMD halftone non-masking exposure method for a second time to form a thin film semiconductor layer component separation and a contact hole;
  (3) using a general mask exposure method or a general DMD non-masking exposure method to form a source electrode, a drain electrode and an alignment control electrode; and
  (4) using the general mask exposure method or the general DMD non-masking exposure method to form a gate electrode terminal, a source electrode terminal and a contact hole of a common electrode terminal.

15. A method of manufacturing a TN mode or a MVA mode active matrix substrate, which is a manufacturing method of an active matrix substrate of an active matrix display apparatus, characterized in that a DMD direct writing exposure device is used for two times for performing three times of a photolithographic process of a DMD halftone non-masking exposure, and the method comprises the steps of:
  (1) using the DMD halftone non-masking exposure method for a first time to form a gate electrode, a pixel electrode, a contact pad in a common electrode and the pixel electrode;
  (2) using the DMD halftone non-masking exposure method for the second time to form a thin film semiconductor a layer component separation and a contact hole; and
  (3) using a general mask exposure method or a general DMD non-masking exposure method to form a source electrode, a drain electrode and a holdup capacitor forming electrode;
  thereby, after an ohmic contact layer of a channel of a thin film transistor is dry etched, a mask deposition method is used for forming a silicon nitride film (which is not formed on a gate electrode terminal, a source electrode terminal or a common electrode terminal) by a P-CVD device.

16. A method of manufacturing a MVA mode active matrix substrate, which is a manufacturing method of an active matrix substrate of an active matrix display apparatus, characterized in that a DMD direct writing exposure device is used for two times for performing three times of a photolithographic process of a DMD halftone non-masking exposure, and the method comprises the steps of:
  (1) using the DMD halftone non-masking exposure method for a first time to form a gate electrode, a pixel electrode, a common electrode and a contact pad in the pixel electrode;
  (2) using the DMD halftone non-masking exposure method for a second time to form a thin film semiconductor layer component separation and a contact hole; and
  (3) using a general mask exposure method or a general DMD non-masking exposure method to form a source electrode, a drain electrode and an alignment control electrode;
  thereby, after an ohmic contact layer of a channel of a thin film transistor is dry etched, a mask deposition method is used for forming a silicon nitride film (which is not formed on a gate electrode terminal, a source electrode terminal or a common electrode terminal) by a P-CVD device.

17. The method of manufacturing an active matrix substrate as selected from one of claims 1 to 16, wherein the first photolithographic process adopts a method comprising the steps of:
  forming a titanium or zirconium metal or alloy film as a first layer (or lower layer) metal after a glass substrate is cleaned, performing a spluttering process to form a second layer (or upper layer) metal, using a halftone mask (which is a mask made by adjusting the exposure) for a halftone exposure method after the positive photoresist is coated, and using two types of general masks to perform a multiple exposure of a halftone double exposure for two times, or using a halftone non-masking exposure method of a DMD direct writing exposure component to develop an image, and the thickness of the positive photoresist corresponding to the gate electrode portion, the common electrode portion and the contact pad portion of the pixel electrode is maximized, and the thickness of a portion of the positive photoresist in the pixel electrode portion and a common electrode portion except a contact pad portion becomes thinner, and after the metal film without keeping the positive photoresist at the second layer (or upper layer) and the first layer (or lower layer) are etched and removed, an oxygen plasma process or an ozone gas process is performed to decompose and remove the remained area of the positive photoresist, and only the exposed second layer (or upper layer) metal is selectively etched and removed to expose the first layer (or lower layer) metal, and after the remaining area of the positive photoresist with the maximum thickness is peeled off, nitrogen ions are doped on the surfaces of the second layer (or upper layer) metal, the exposed first layer (or lower layer) metal in the gate electrode portion, the common electrode portion and the contact pad portion in the pixel electrode portion, and an anti-oxidation treatment is performed for the surfaces of a gate electrode, a common electrode and a contact pad in the pixel electrode portion, so as to improve the transmission rate of a visible light by changing the metal or alloy thin film of titanium or zirconium of the pixel electrode into titanium nitride or zirconium nitride.

18. The method of manufacturing an active matrix substrate as selected from one of claims 1 to 16, wherein the first photolithographic process adopts a method comprising the steps of:

forming an oxygen nitride film of a titanium or zirconium metal nitride, an alloy nitride, a metal oxide nitride or an alloy as a transparent conductor at the first layer (or lower layer) after a glass substrate is cleaned; performing a spluttering process to form a second layer (or upper layer) metal; using a halftone mask (which is a mask made by adjusting the exposure) for a halftone exposure method after the positive photoresist is coated; and using two types of general masks to perform a multiple exposure of a halftone double exposure for two times, or using a halftone non-masking exposure method of a DMD direct writing exposure component to develop an image, and the thickness of the positive photoresist corresponding to the gate electrode portion, the common electrode portion and the contact pad portion of the pixel electrode is maximized, and the thickness of the positive photoresist corresponding to the pixel electrode portion except the contact pad portion is maximized, and the thickness of a portion of the pixel electrode and the common electrode of the positive photoresist except the contact pad portion becomes thinner, and after the metal film without keeping the positive photoresist region at the second layer (or upper layer) and the transparent conductor at the first layer (or lower layer) are etched and removed, an oxygen plasma process or an ozone gas process is performed to decompose and remove the remained area of the positive photoresist, and only the exposed second layer (or upper layer) metal is selectively etched and removed to expose the first layer (or lower layer) metal, and after the remaining area of the positive photoresist with the maximum thickness is peeled off, nitrogen ions are doped on the surfaces of the second layer (or upper layer) metal of the gate electrode portion, the common electrode portion and the contact pad portion in the pixel electrode portion and an anti-oxidation treatment is performed for the surfaces of a gate electrode, a common electrode and a contact pad in the pixel electrode portion.

19. The method of manufacturing an active matrix substrate as selected from one of claims 1 to 16, wherein the first photolithographic process adopts a method comprising the steps of:

forming a metal oxide film of ITO or IZO as a transparent conductor at the first layer (or lower layer) after a glass substrate is cleaned, performing a spluttering process and an oxidation and reduction process to form a film of molybdenum, chromium, silver alloy, copper alloy having an electric potential less than ITO and IZO or an aluminum alloy containing 0.5~7.0 atom % of nickel, cobalt or iron as a metal film at the second layer (or upper layer), and after the positive photoresist is coated, using a halftone mask (which is a mask made by adjusting the exposure) for a halftone exposure method, and using two types of general masks for a halftone double exposure method to carry out a multiple exposure for two times or a halftone non-masking exposure method that uses a DMD direct writing exposure component to develop an image, and the thickness of the positive photoresist corresponding to the gate electrode portion, the common electrode portion and the contact pad portion of the pixel electrode is maximized, and the thickness of a portion of the pixel electrode portion and the common electrode of the positive photoresist except the contact pad portion becomes thinner, and after the metal film without keeping the positive photoresist at the second layer (or upper layer) and the transparent conductor at the first layer (or lower layer) are etched and removed, an oxygen plasma process or an ozone gas process is performed to decompose and remove the remained area of the positive photoresist, and only the exposed second layer (or upper layer) metal is selectively etched and removed to expose the transparent conductor of the first layer (or lower layer), and after the remaining area of the positive photoresist with the maximum thickness is peeled off, nitrogen ions are doped on the surfaces of the second layer (or upper layer) metal of the contact pad portion in the gate electrode portion, the common electrode portion and the contact pad portion in the pixel electrode portion, and an anti-oxidation treatment is performed for the surfaces of a gate electrode, a common electrode and a contact pad in the pixel electrode portion.

20. The method of manufacturing an active matrix substrate as selected from one of claims 1 to 16, wherein the first photolithographic process adopts a method comprising the steps of:

forming a titanium or zirconium metal or alloy film as a metal film on a first layer (or lower layer) after a glass substrate is cleaned, performing a spluttering process to form a metal film on a second layer (or upper layer), and after the positive photoresist is coated, using a halftone mask (which is a mask made by adjusting the exposure) for a halftone exposure method, using two types of general masks for performing a halftone double exposure method for a multiple exposure for two times, or using a halftone non-masking exposure method for a DMD direct writing exposure component to develop an image, and the thickness of the positive photoresist corresponding to the gate electrode portion, the common electrode portion and the contact pad portion of the pixel electrode is maximized, and the thickness of the positive photoresist of the pixel electrode portion and the common electrode portion except the contact pad portion becomes thinner, and after the metal film on a region of the second layer (or upper layer) without keeping the positive photoresist is selectively etched and removed, an oxygen plasma process or an ozone gas process is conducted to decompose and remove the remained region of the positive photoresist, and a patterned and exposed metal film on the second layer (or upper layer) is used as a mask, and after only the first layer (or lower layer) metal is selectively etched and removed and only the metal film on the second layer (or upper layer) is selectively etched and exposed to expose first layer (or lower layer) metal, the remained positive photoresist is peeled off, and nitrogen ions are doped on the surfaces of a second layer (or upper layer) metal of the gate electrode portion, the common electrode portion and the contact pad portion in the pixel electrode, and a first layer (or lower layer) metal of the exposed pixel electrode portion, and an anti-oxidation treatment is performed for the surfaces of a gate electrode, a common electrode and a contact pad in the pixel electrode portion, so as to improve the transmission rate of a visible light by changing the metal or alloy thin film of titanium or zirconium of the pixel electrode into titanium nitride or zirconium nitride.

21. The method of manufacturing an active matrix substrate as selected from one of claims 1 to 16, wherein the first photolithographic process adopts a method comprising the steps of:

forming a titanium or zirconium metal or alloy film as a transparent conductor on a first layer (or lower layer) after a glass substrate is cleaned, performing a spluttering process to form a metal film on a second layer (or upper layer), and after the positive photoresist is coated, using a halftone mask (which is a mask made by adjusting the exposure) for a halftone exposure method, and using two types of general masks for a halftone double exposure method for two times of a multiple exposure or using a halftone double exposure method of a DMD direct writing exposure component to develop an image, and the thickness of the corresponding gate electrode portion, the common electrode portion and the contact pad portion of the pixel electrode is maximized, and the thickness of a portion of the positive photoresist of a pixel electrode portion and a common electrode except the contact pad portion becomes thinner, and after only the metal film of the second layer (or upper layer) in the area without keeping the positive photoresist is selectively etched and removed, an oxygen plasma process or an ozone gas process is conducted to decompose and remove the remained area of the positive photoresist, and the patterned and exposed metal film of the second layer (or upper layer) metal is used as a mask, and only the transparent conductor on the first layer (or lower layer) is selectively etched and removed, and then after only the selectively etched and exposed metal film on the second layer (or upper layer) is removed to expose the transparent conductor on the first layer (or lower layer), the remained positive photoresist is peeled off, and nitrogen ions are doped on the surfaces of a second layer (or upper layer) metal of the gate electrode portion, the common electrode portion and the contact pad portion in the pixel electrode, and an anti-oxidation treatment is performed for the surfaces of a gate electrode, a common electrode and a contact pad portion in the pixel electrode portion.

22. The method of manufacturing an active matrix substrate as selected from one of claims 1 to 16, wherein the first photolithographic process adopts a method comprising the steps of:

forming an ITO or IZO metal oxide film as the transparent conductor on the first layer (or lower layer) after a glass substrate is cleaned, performing a spluttering process and an oxidation and reduction process to form a film of molybdenum, chromium, silver alloy, copper alloy having an electric potential less than ITO and IZO or an aluminum alloy containing 0.5~7.0 atom % of nickel, cobalt or iron as a metal film at the second layer (or upper layer), and after the positive photoresist is coated, using a halftone mask (which is a mask made by adjusting the exposure) for a halftone exposure method, and using two types of general masks for a halftone double exposure method that carries out a multiple exposure for two times or a halftone non-masking exposure method that uses a DMD direct writing exposure component to develop an image, and the thickness of the positive photoresist corresponding to the gate electrode portion, the common electrode portion and the contact pad portion of the pixel electrode is maximized, and the thickness of the positive photoresist of the pixel electrode portion and the common electrode portion except the contact pad portion becomes thinner, and after the metal film on an area of the second layer (or upper layer) without keeping the positive photoresist is selectively etched and removed, an oxygen plasma process or an ozone gas process is conducted to decompose and remove the remained area of the positive photoresist, and the patterned and exposed metal film of the second layer (or upper layer) is used as a mask, and only the transparent conductor on the first layer (or lower layer) is selectively etched and removed, and the metal film of the second layer (or upper layer) is selectively etched and exposed, such that after the transparent conductor on the first layer (or lower layer) is exposed, the remained positive photoresist is peeled off, and nitrogen ions are doped on the surface of a second layer (or upper layer) metal of the gate electrode portion, the common electrode portion and the contact pad portion in the pixel electrode to perform an anti-oxidation treatment for the surfaces of to a gate electrode surface, a common electrode and a contact pad portion in the pixel electrode portion.

23. The method of manufacturing an active matrix substrate as selected from one of claims 1 to 16, wherein the first photolithographic process adopts a method comprising the steps of:

forming a titanium or zirconium metal or alloy film as a metal film of a first layer (or lower layer) after a glass substrate is cleaned, forming an aluminum or aluminum alloy or copper, copper alloy, silver or silver alloy film as a metal film of a second layer (or middle layer), and further forming a molybdenum or chromium film as a metal film on a third layer (or upper layer), and after the positive photoresist is coated, using a halftone mask (which is a mask made by adjusting the exposure) for a halftone exposure method, and using two types of general masks for a halftone double exposure method that carries out a multiple exposure for two times or a halftone non-masking exposure method that uses a DMD direct writing exposure component to develop an image, and the thickness of the positive photoresist corresponding to the gate electrode portion, the common electrode portion and the contact pad portion of the pixel electrode is maximized, and the thickness of a portion of the positive photoresist corresponding to the pixel electrode portion and the common electrode except the contact pad portion becomes thinner, and after a metal film of molybdenum or chromium on the third layer (or upper layer) in the area without keeping the positive photoresist, and a metal film of aluminum, aluminum alloy, copper, copper alloy, silver or silver alloy on the second layer (or middle layer), and after a metal film on the first layer (or lower layer) are etched and removed, an oxygen plasma process or an ozone gas process is conducted to decompose and remove the remained area of the positive photoresist, and the third metal layer (or upper layer) and the second metal layer (or middle layer) selectively etched and removed to expose the first layer (or lower layer) metal, and after the remained area of the positive photoresist with the maximum thickness is peeled off, nitrogen ions are doped on the surface of a first layer (or lower layer) metal of the exposed pixel electrode portion to change it into titanium nitride or zirconium nitride, so as to improve the transmission rate of visible light.

24. The method of manufacturing an active matrix substrate as selected from one of claims 1 to 16, wherein the first photolithographic process adopts a method comprising the steps of:

forming an oxygen nitride film of a titanium or zirconium metal nitride, an alloy nitride, a metal oxygen nitride or alloy as the transparent conductor of the first layer (or lower layer) or an alloy film of a transparent conductor on a first layer (or lower layer) after a glass substrate is cleaned, forming an aluminum or aluminum alloy or copper, copper alloy, silver or silver alloy film as a metal film of the second layer (or middle layer) metal, further forming a molybdenum or chromium film as a third layer (or upper layer) metal, and after the positive photoresist is coated, using a halftone mask (which is a mask made by adjusting the exposure) for a halftone exposure, using two types of general masks to carry out the halftone double exposure method for a multiple exposure, or using a halftone non-masking exposure method of a DMD direct writing exposure component to develop an image, and the thickness of the positive photoresist corresponding to the gate electrode portion, the common electrode portion and the contact pad portion of the pixel electrode is maximized, and the thickness of the pixel electrode portion and the common electrode except the contact pad portion becomes thinner, and then after a portion of the positive photoresist in an area without keeping the positive photoresist of a molybdenum or chromium metal film of the third layer (or upper layer), an aluminum, aluminum alloy, copper, copper alloy, silver or silver alloy metal film of the second layer (or middle layer), and a titanium nitride, zirconium nitride, oxygen titanium nitride or oxygen zirconium nitride transparent conductor of the first layer (or lower layer) are etched and removed, an oxygen plasma process or an ozone gas process is conducted to decompose and remove the remained area of the positive photoresist, and the third metal layer (or upper layer) and the second metal layer (or middle layer) are selectively etched and removed to expose the first layer (or lower layer) of transparent conductor, and finally the remained positive photoresist with the maximum thickness is peeled off.

25. The method of manufacturing an active matrix substrate as selected from one of claims 1 to 16, wherein the first photolithographic process adopts a method comprising the steps of:

forming an ITO or IZO metal oxide film as the transparent conductor on the first layer (or lower layer) after a glass substrate is cleaned, performing a spluttering process and an oxidation and reduction process to form a film of molybdenum, chromium, silver alloy, copper alloy having an electric potential less than ITO and IZO or an aluminum alloy containing 0.5~7.0 atom % of nickel, cobalt or iron as a metal film at the second layer (or upper layer), and after the positive photoresist is coated, using a halftone mask (which is a mask made by adjusting the exposure) for a halftone exposure method, and using two types of general masks for a halftone double exposure method that carries out a multiple exposure for two times or a halftone non-masking exposure method that uses a DMD direct writing exposure component to develop an image, and further forming a molybdenum or chromium film as a metal film on the third layer (or upper layer), and the thickness of the positive photoresist corresponding to the gate electrode portion, common electrode portion and the contact pad portion of the pixel electrode is maximized, and the thickness of the pixel electrode portion and the common electrode except the contact pad portion becomes thinner, and then after a portion of the positive photoresist in an area without keeping positive photoresist region of a molybdenum or chromium metal film of the third layer (or upper layer), an aluminum, aluminum alloy, copper, copper alloy, silver or silver alloy metal film of the second layer (or middle layer), and an ITO or IZO transparent conductor of the first layer (or lower layer) are etched and removed, an oxygen plasma process or an ozone gas process is conducted to decompose and remove the remained area of the positive photoresist, and the third metal layer (or upper layer) and the second metal layer (or middle layer) are selectively etched and removed to expose the transparent conductor on the first layer (or lower layer), and finally the remained positive photoresist with the maximum thickness is peeled off.

26. The method of manufacturing an active matrix substrate as selected from one of claims 1 to 16, wherein the first photolithographic process adopts a method comprising the steps of:

forming a titanium or zirconium metal or alloy film as a first layer (or lower layer) metal after a glass substrate is cleaned, forming an aluminum or aluminum alloy or copper, copper alloy, silver or silver alloy film as a metal film of the second layer (or middle layer), and further forming a molybdenum or chromium film as the third layer (or upper layer), and after the positive photoresist is coated, using a halftone mask (which is a mask made by adjusting the exposure) for a halftone exposure method, and using two types of general masks to carry out a halftone double exposure method for a multiple exposure for two times or using a halftone non-masking exposure method of a DMD direct writing exposure component to develop an image, and the thickness of the positive photoresist corresponding to the gate electrode portion, common electrode portion and the contact pad portion of the pixel electrode is maximized, and the thickness of a portion of the positive photoresist corresponding to the pixel electrode portion and the common electrode except the contact pad portion becomes thinner, and after an area of an aluminum, aluminum alloy, copper, copper alloy, silver or silver alloy metal film of the third layer (or upper layer) without keeping the positive photoresist region and a molybdenum or chromium metal film of the second layer (or middle layer) metal are etched and removed, an oxygen plasma process or an ozone gas process is conducted to decompose and remove the remained area of the positive photoresist, and the patterned and exposed the third layer (or upper layer) metal and the second layer (or middle layer) metal are used as masks, and the first layer (or lower layer) metal is selectively etched and exposed, and after only the third metal layer (or upper layer) and the second metal layer (or middle layer) are selectively etched and removed to expose the first layer (or lower layer) metal, the remained positive photoresist is peeled off, so as to improve the transmission rate of visible light by doping nitrogen ions on the metal film at the exposed pixel electrode portion on the surface of the first layer (or lower layer) to change it into titanium nitride or zirconium nitride.

27. The method of manufacturing an active matrix substrate as selected from one of claims 1 to 16, wherein the first photolithographic process uses the method comprising the steps of:

forming a titanium or zirconium metal nitride, an alloy nitride metal oxygen nitride or alloy oxygen nitride film as a transparent conductor of the first layer (or lower layer) metal after a glass substrate is cleaned, forming an aluminum or aluminum alloy or copper, copper alloy, silver or silver alloy film as a metal film of the second layer (or middle layer), and further forming a molybdenum or chromium film as the third layer (or upper layer), and after the positive photoresist is coated, using a halftone mask (which is a mask made by adjusting the exposure) for a halftone exposure method, and using two types of general masks to carry out a halftone double exposure method for a multiple exposure for two times or a halftone non-masking exposure method adopting a DMD direct writing exposure component to develop an image, and the thickness of the positive photoresist corresponding to the gate electrode portion, common electrode portion and the contact pad portion of the pixel electrode is maximized, and the thickness of a portion of the positive photoresist corresponding to the pixel electrode portion and the common electrode except the contact pad portion becomes thinner, and after an area of an aluminum, aluminum alloy, copper, copper alloy, silver or silver alloy metal film of the third layer (or upper layer) without keeping the positive photoresist region and an aluminum, aluminum alloy, copper, copper alloy, silver or silver alloy metal film of the second layer (or middle layer) metal are etched and removed, an oxygen plasma process or an ozone gas process is conducted to decompose and remove the remained area of the positive photoresist, and the patterned and exposed the third layer (or upper layer) metal and the second layer (or middle layer) are used as masks, and the transparent conductor on the first layer (or lower layer) is selectively etched and exposed, and only the metal films of the third metal layer (or upper layer) and the second layer (or middle layer) are selectively etched and removed, such that after the transparent conductor on the first layer (or lower layer) is exposed, the remained positive photoresist is peeled off.

28. The method of manufacturing an active matrix substrate as selected from one of claims 1 to 16, wherein the first photolithographic process uses the method comprising the steps of:

forming an ITO or IZO metal oxide film as the transparent conductor on the first layer (or lower layer) after a glass substrate is cleaned, performing a spluttering process to form a film of molybdenum, chromium, silver alloy, copper alloy having an electric potential less than ITO and IZO or an aluminum alloy containing 0.5~7.0 atom % of nickel, cobalt or iron as a metal film at the second layer (or upper layer), and after the positive photoresist is coated, using a halftone mask (which is a mask made by adjusting the exposure) for a halftone exposure method, and using two types of general masks for a halftone double exposure method that carries out a multiple exposure for two times or a halftone non-masking exposure method that uses a DMD direct writing exposure component to develop an image, and further forming a molybdenum or chromium film as a metal film on the third layer (or upper layer), and the thickness of the positive photoresist corresponding to the gate electrode portion, common electrode portion and the contact pad portion of the pixel electrode is maximized, and the thickness of the pixel electrode portion and the common electrode except the contact pad portion becomes thinner, and then a portion of the positive photoresist in an area without keeping positive photoresist region of a molybdenum or chromium metal film of the third layer (or upper layer), an aluminum, aluminum alloy, copper, copper alloy, silver or silver alloy metal film of the second layer (or middle layer), and an ITO or IZO transparent conductor of the first layer (or lower layer) are etched and removed, an oxygen plasma process or an ozone gas process is conducted to decompose and remove the remained area of the positive photoresist, and the patterned and exposed third layer (or upper layer) metal is selectively etched and removed, and the metal film of the second layer (or middle layer) is used as a mask, and the transparent conductor on the first layer (or lower layer) is selectively etched and exposed, and only the metal films on the third layer (or upper layer) and the second metal layer (or middle layer) are selectively etched and removed, such that after the transparent conductor on the first layer (or lower layer) is exposed, the remained positive photoresist is peeled off.

29. The manufacturing method as recited in claim 17, wherein the titanium or zirconium or alloy film of the first layer (or lower layer) metal has a thickness range of 5~25 nm, and after the first layer (or lower layer) metal is formed, a sputtering process is used for forming a metal film of the second layer, and the spluttering process adopts an inert gas such as argon or krypton mixed with 1~20% of at least one type of nitrified gas such as nitrogen, ammonia, hydrazine, dydrazone for an electric discharge, and after nitrogen atoms are doped in the metal film on the second layer to form a metal film with a thickness of 1~10 nm on the second layer, the mixing of nitrified gas is stopped, and only the inert gas argon or krypton is used for the film formation by spluttering, such that the interface of the first layer (or lower layer) metal and the second layer metal having an area proximate to the interface has an etching rate smaller than the area without being doped by nitrogen atoms on the second layer metal area for carrying out a conical etching manufacture.

30. The manufacturing method as recited in claim 18, wherein the thin film transparent conductor of the first layer (or lower layer) has a film thickness with a range of 10~100 nm, and after a film of the first layer (or lower layer) of the thin film transparent conductor is formed, a sputtering method is used for forming a metal film of the second layer, and firstly, at lease one type of nitrified gas mixed with 1~20% of nitrogen, ammonia, hydrazine or dydrazone in an inert gas argon or krypton used for spluttering is discharged, and nitrogen atoms are doped on the metal film of the second layer to form a second-layer metal film with a thickness of 1~10 nm, and then the mixing of nitrified gas is stopped, and only the inert gas argon or krypton is used for spluttering to form the film, and prevent the oxygen atoms contained in the first layer (or lower layer) transparent conductor from diffusing and moving to the second layer metal, so that the etching rate at an interface of the first layer (or lower layer) transparent conductor and the second layer metal in an area proximate to the interface is smaller than the etching rate of the second layer metal for carrying out a conical etching manufacture.

31. The manufacturing method as recited in claim 17, wherein the film thickness of the first layer (or lower layer) metal made of titanium, zirconium or their alloy is in a range of 5~25 nm, and after the positive photoresist is peeled off, nitrogen ions are doped on the substrate at the acceleration energy of 1~20 KeV, such that the contact resistance of the pixel contact pad portion is below 100 KΩ.

32. The manufacturing method as recited in claim 18, wherein the film thickness of the first layer (or lower layer) transparent conductor is in a range of 10~100 nm, and after the positive photoresist is peeled off, nitrogen ions are doped on the substrate at the acceleration energy of 0.5~10 KeV, such that the contact resistance of the pixel contact pad portion is below 100 KΩ.

33. The method of manufacturing an active matrix substrate as selected from one of claims 1 to 16, wherein the second photolithographic process uses the following method:

after the first photolithographic process is finished, a gate insulating film is formed on the entire surface of the substrate, and then a film of non-doped thin film semiconductor layer and a doped ohmic contact thin film semiconductor layer are formed, and a positive photoresist is coated, and then a halftone exposure method adopting a halftone mask (which is a mask made by adjusting the exposure), or a halftone double exposure method using two types of general masks is used to carry out a multiple exposure for two times, or a halftone non-masking exposure method adopting a DMD direct writing exposure component is used to develop images, and the thickness of the positive photoresist in the region of forming the thin film transistor component is maximized, and the positive photoresists at the gate electrode terminal, the source electrode terminal or the common electrode terminal, and the contact hole of the contact pad portion of the electrostatic protection circuit portion or the contact pad portion formed at the pixel electrode are removed completely, and the thickness of the positive photoresist in a region other than those described above is adjusted to be uniformly thin and such thin uniform thickness is maintained, and after the positive photoresist of the thin film semiconductor layer and the gate insulating film except the contact hole portion are etched and removed completely, an oxygen plasma process or an ozone gas process is used to decompose and remove the thin positive photoresist, and the positive photoresist with a uniform film thickness is remained in the halftone exposure region, and after the process, the positive photoresist at the thin film transistor component region still remains, and the film thickness of the positive photoresist in the halftone exposure region and the film thickness of the positive photoresist in the unexposed thin film transistor component region are adjusted, and after the photoresist in the halftone exposure region is decomposed and removed, only the thin film semiconductor layer is selectively etched and removed to expose the gate insulating film, and the whole region of the gate electrode, the common electrode and the pixel electrode except the portion for forming the contact hole are covered completely by the gate insulating film, and the thin film semiconductor layer of the thin film transistor component portion is patterned, and then the positive photoresist remained on the thin film semiconductor layer of the thin film transistor component portion is peeled off.

34. The method of manufacturing an active matrix substrate as selected from one of claims 1 to 16, wherein the second photolithographic process uses the following method: after the first photolithographic process is finished, a gate insulating film is formed on the entire surface of the substrate, and then films of non-doped thin film semiconductor layer and doped ohmic contact thin film semiconductor layer are formed to produce an oxidation-resisting barrier metal film, and then a positive photoresist is coated, and a halftone exposure method adopting a halftone mask (which is a mask made by adjusting the exposure), or a halftone double exposure method adopting two types of general masks is used to carry out a multiple exposure for two times, or a halftone non-masking exposure method adopting a DMD direct writing exposure component is used to develop images, and the thickness of the positive photoresist in the region of the thin film transistor component is maximized, and the positive photoresist at the gate electrode terminal, the source electrode terminal or the common electrode terminal, and the electrostatic protection circuit or a portion of the contact hole formed on the contact pad portion of the pixel electrode is removed completely, and the thickness of the positive photoresist in a region other than those described above is adjusted to be uniformly thin and such thin uniform thickness is maintained, and after the oxidation-resisting barrier metal, the thin film semiconductor layer and the gate insulating film of the contact hole portion with a completely removed positive photoresist are removed, an oxygen plasma process or an ozone gas process is used to decompose and remove the thin positive photoresist, and the positive photoresist with a uniform film thickness is remained in the halftone exposure region, and after the processing, the positive photoresist of the film transistor component region still remains, and the film thickness of the positive photoresist at the halftone exposure region and the film thickness of the positive photoresist at the unexposed region of the thin film transistor component region are adjusted in advance, and after the photoresist in the halftone exposure region is decomposed and removed, only the oxidation-resisting barrier metal and the thin film semiconductor layer formed at the lower layer are selectively etched and removed to expose the gate insulating film, and the status of the whole area of the gate electrode, the common electrode and the pixel electrode except the contact hole being covered completely by the gate insulating film is maintained, and the oxidation-resisting barrier metal and the thin film semiconductor layer of the thin film transistor component portion are patterned, and then the positive photoresist remained on the thin film semiconductor layer of the thin film transistor component portion is peeled off.

35. The method of manufacturing an active matrix substrate as selected from one of claims 1 to 16, wherein the second photolithographic process uses the following method: after the first photolithographic process is finished, a gate insulating film is formed on the entire surface of the substrate, and then a film of non-doped thin film semiconductor layer and a doped ohmic contact thin film semiconductor layer is formed, and a positive photoresist is coated, and a halftone exposure method adopting a halftone mask (which is a mask made by adjusting the exposure), or a halftone double exposure method adopting two types of general masks is used to carry out a multiple exposure for two times, or a halftone non-masking exposure method adopting a DMD direct writing exposure component is used to develop images, and the thickness of the positive photoresist in the region of the thin film transistor component is maximized, and the positive photoresists at the gate electrode terminal, the source electrode terminal or the common electrode terminal, and the electrostatic protection circuit or a portion of the contact hole formed on the contact pad portion of the pixel electrode are removed completely, and the thickness of the positive photoresist in a region other than those described above is adjusted to be uniformly thin, and such uniformly thin thickness is maintained, and after the thin film semiconductor layer of the contact hole portion of the positive photoresist is etched and removed completely, the gate insulating film of the contact hole portion is halfly etched, and only a small amount of the gate insulating film is remained, and then an oxygen plasma process or an ozone gas process is used to decompose and remove the thin positive photoresist, and the positive photoresist with a uniform film thickness is remained in the halftone exposure region, and after the process, the positive photoresist of the film transistor component region still remains, and the film thickness of the positive photoresist at the halftone exposure region and the film thickness of the positive photoresist at the unexposed region of the thin film transistor component region are adjusted in advance, and after the photoresist in the halftone exposure region is decomposed and removed, the thin film semiconductor layer is etched and exposed, and the small amount of the gate insulating film remained in the region of the contact hole portion is etched, and the small amount of gate insulating film remained in the region of the contact hole portion is adjusted and etched completely sooner than the exposed thin film semiconductor layer, and after the gate insulating film remained in the region of the contact hole portion is etched and removed completely, the etching conditions are changed, and only the thin film semiconductor layer is selectively etched and exposed to avoid damages to the gate insulating film in the halftone exposure region, and the gate insulating film is exposed, and thus the status of the whole area of the gate electrode, common electrode and pixel electrode except the contact hole portion being covered and included completely by the gate insulating film is maintained, and the thin film semiconductor layer of the thin film transistor component portion is patterned, and then the positive photoresist remained on the thin film semiconductor layer of the thin film transistor component portion is peeled off.

36. The method of manufacturing an active matrix substrate as selected from one of claims 1 to 16, wherein the second photolithographic process uses the following method: after the first photolithographic process is finished, a gate insulating film is formed on the entire surface of the substrate, and then films of non-doped thin film semiconductor layer and doped ohmic contact thin film semiconductor layer are formed to produce an oxidation-resisting barrier metal film, and then a positive photoresist is coated, and a halftone exposure method adopting a halftone mask (which is a mask made by adjusting the exposure), or a halftone double exposure method adopting two types of general masks is used to carry out a multiple exposure for two times, or a halftone non-masking exposure method adopting a DMD direct writing exposure component is used to develop images, and the thickness of the positive photoresist in the region of the thin film transistor component is maximized, and the positive photoresist at the gate electrode terminal, the source electrode terminal or the common electrode terminal, and the electrostatic protection circuit or a portion of the contact hole formed on the contact pad portion of the pixel electrode are removed completely, and the thickness of the positive photoresist in a region other than those described above is adjusted to be uniformly thin and such thin uniform thickness is maintained, and after the oxidation-resisting barrier metal and the thin film semiconductor layer in the contact hole portion having a completely removed positive photoresist are etched and removed completely, and the gate insulating film of the contact hole portion is halfly etched, and only a small amount of gate insulating film is remained, and then an oxygen plasma process or an ozone gas process is used to decompose and remove the thin positive photoresist, and the positive photoresist with a uniform film thickness is remained in the halftone exposure region, and after the process, the positive photoresist of the film transistor component region still remains, and the film thickness of the positive photoresist at the halftone exposure region and the film thickness of the positive photoresist at the unexposed region of the thin film transistor component region are adjusted in advance, and after the photoresist in the halftone exposure region is decomposed and removed, the oxidation-resisting barrier metal is etched and exposed, and formed on a thin film semiconductor layer on a metal lower layer of the oxidation-resisting barrier, and the small amount of the gate insulating film remained in the region of the contact hole portion is etched, and the small amount of gate insulating film remained in the region of the contact hole portion is adjusted and etched completely sooner than the thin film semiconductor layer in the halftone exposure region, and after the gate insulating film remained in the region of the contact hole portion is etched and removed completely, the etching conditions are changed, and only the thin film semiconductor layer is selectively etched and exposed to avoid damages to the gate insulating film in the halftone exposure region, and the gate insulating film is exposed, and thus the status of the whole region of the gate electrode, the common electrode and the pixel electrode except the contact hole portion being covered and included completely by the gate insulating film is maintained, and the oxidation-resisting barrier metal and the thin film semiconductor layer of the thin film transistor component portion are patterned, and then the positive photoresist remained on the metal film of the oxidation-resisting barrier of the thin film transistor component portion is peeled off.

37. The method of manufacturing an active matrix substrate as selected from one of claims 1 to 16, wherein the second photolithographic process uses the following method: after the first photolithographic process is finished, a gate insulating film is formed on the entire surface of the substrate, and then films of non-doped thin film semiconductor layer and doped ohmic contact thin film semiconductor layer are formed, and a positive photoresist is coated: a halftone exposure method adopting a halftone mask (which is a mask made by adjusting the exposure), or a halftone double exposure method adopting two types of general masks is used to carry out a multiple exposure for two times, or a halftone non-masking exposure method adopting a DMD direct writing exposure component is used to develop images, and the thickness of the positive photoresist in the region of the thin film transistor component is maximized, and the positive photoresists at the gate electrode terminal, the source electrode terminal or the common electrode terminal, and the electrostatic protection circuit or a portion of the contact hole formed on the contact pad portion of the pixel electrode is removed completely, and the thickness of the positive photoresist in a region other than those described above is adjusted to be uniformly thin and such thin uniform thickness is maintained, and after the positive photoresists of the thin film semiconductor layer and the gate insulating film of the contact hole portion are etched and removed completely, an oxygen plasma process or an ozone gas process is used to decompose and remove the thin positive photoresist, and the positive photoresist with a uniform film thickness is remained in the halftone exposure region, and after the process, the positive photoresist of the film transistor component region still remains, and the film thickness of the positive photoresists at the halftone exposure region and the film thickness of the positive photoresist at the unexposed region of the thin film transistor component portion are adjusted in advance, and after the photoresist in the halftone exposure region is decomposed and removed, only the thin film semiconductor layer is selectively etched and removed to expose the gate insulating film, and the status of the whole region of the gate electrode, the common electrode and the pixel electrode except the contact hole being covered completely by the gate insulating film is maintained, and the thin film semiconductor layer of the thin film transistor component portion is patterned, and then the ion doping method is used to project nitrogen ions obliquely onto the substrate, or a nitrified gas is used for a plasma processing of the substrate, and the sidewalls of the thin film semiconductor layer in the thin film transistor component portion are nitrified, and finally the remained positive photoresist is peeled off.

38. The method of manufacturing an active matrix substrate as selected from one of claims 1 to 16, wherein the second photolithographic process uses the following method: after the first photolithographic process is finished, a gate insulating film is formed on the entire surface of the substrate, and then films of non-doped thin film semiconductor layer and doped ohmic contact thin film semiconductor layer are formed to produce an oxidation-resisting barrier metal film, and then a positive photoresist is coated, and a halftone exposure method adopting a halftone mask (which is a mask made by adjusting the exposure), or a halftone double exposure method adopting two types of general masks is used to carry out a multiple exposure for two times, or a halftone non-masking exposure method adopting a DMD direct writing exposure component is used to develop images, and the thickness of the positive photoresist in the region of the thin film transistor component is maximized, and the positive photoresists at the gate electrode terminal, the source electrode terminal or the common electrode terminal, and the electrostatic protection circuit or a portion of the contact hole formed on the contact pad portion of the pixel electrode are removed completely, and the thickness of the positive photoresist in a region other than those described above is adjusted to be uniformly thin and such thin uniform thickness is maintained, and after the positive photoresists of the oxidation-resisting barrier metal, the thin film semiconductor layer and the gate insulating film of the contact hole portion are etched and removed, an oxygen plasma process or an ozone gas process is used to decompose and remove the thin positive photoresist, and the positive photoresist with a uniform film thickness is remained in the halftone exposure region, and after the process, the positive photoresist of the film transistor component region still remains, and the film thickness of the positive photoresist at the halftone exposure region and the film thickness of the positive photoresist at the unexposed region of the thin film transistor component region are adjusted in advance, and after the photoresist in the halftone exposure region is decomposed and removed, only the oxidation-resisting barrier metal and the thin film semiconductor layer formed on its lower layer are selectively etched and removed to expose the gate insulating film, and the status of the whole region of the gate electrode, the common electrode and the pixel electrode except the contact hole being covered completely by the gate insulating film is maintained, and the oxidation-resisting barrier metal and the thin film semiconductor layer of the thin film transistor component portion are patterned, and then an ion doping method is used to project nitrogen ions obliquely onto the substrate, or a nitrified gas is used for a plasma processing of the substrate, and the sidewalls of the thin film semiconductor layer in the thin film transistor component portion are nitrified, and finally the remained positive photoresist is peeled off.

39. The method of manufacturing an active matrix substrate as selected from one of claims 1 to 16, wherein the second photolithographic process uses the following method: after the first photolithographic process is finished, a gate insulating film is formed on the entire surface of the substrate, and then films of a non-doped thin film semiconductor layer and a doped ohmic contact thin film semiconductor layer are formed, and a positive photoresist is coated, and a halftone exposure method adopting a halftone mask (which is a mask made by adjusting the exposure), or a halftone double exposure method adopting two types of general masks is used to carry out a multiple exposure for two times, or a halftone non-masking exposure method adopting a DMD direct writing exposure component is used to develop images, and the thickness of the positive photoresist in the region of the thin film transistor component is maximized, and the positive photoresist at the gate electrode terminal, the source electrode terminal or the common electrode terminal, and the electrostatic protection circuit or a portion of the contact hole formed on the contact pad portion of the pixel electrode is removed completely, and the thickness of the positive photoresist in a region other than those described above is adjusted to be uniformly thin, and such uniformly thin thickness is maintained, and after the thin film semiconductor layer of the contact hole portion of the positive photoresist is etched and removed completely, the gate insulating film of the contact hole portion is halfly etched, and only a small amount of the gate insulating film is remained, and then an oxygen plasma process or an ozone gas process is used to decompose and remove the thin positive photoresist, and the positive photoresist with a uniform film thickness is remained in the halftone exposure region, and after the process, the positive photoresist of the film transistor component region still remains, and the film thickness of the positive photoresist at the halftone exposure region and the film thickness of the positive photoresist at the unexposed region of the thin film transistor component region are adjusted in advance, and after the photoresist in the halftone exposure region is decomposed and removed, the thin film semiconductor layer is etched and exposed, and the small amount of the gate insulating film remained in the region of the contact hole portion is etched, and the small amount of gate insulating film remained in the region of the contact hole portion is adjusted and etched completely sooner than the exposed thin film semiconductor layer, and after the gate insulating film remained in the region of the contact hole portion is etched and removed completely, the etching conditions are changed, and only the thin film semiconductor layer is selectively etched and exposed to avoid damages to the gate insulating film in the halftone exposure region, and the gate insulating film is exposed, and thus the status of the whole region of the gate electrode, common electrode and pixel electrode covered and included completely by the gate insulating film except the contact hole portion is maintained, and the thin film semiconductor layer of the thin film transistor component portion is patterned, and then the ion doping method is used to project nitrogen ions obliquely onto the substrate, or a nitrified gas is used for a plasma processing of the substrate, and the sidewalls of the thin film semiconductor layer in the thin film transistor component portion are nitrified, and finally the remained positive photoresist is peeled off.

40. The method of manufacturing an active matrix substrate as selected from one of claims 1 to 16, wherein the second photolithographic process uses the following method: after the first photolithographic process is finished, a gate insulating film is formed on the entire surface of the substrate, and then films of non-doped thin film semiconductor layer and doped ohmic contact thin film semiconductor layer are formed to produce an oxidation-resisting barrier metal film, and then a positive photoresist is coated, and a halftone exposure method adopting a halftone mask (which is a mask made by adjusting the exposure), or a halftone double exposure method adopting two types of general masks to carry out a multiple exposure for two times, or a halftone non-masking exposure method adopting a DMD direct writing exposure component is used to develop images, and the thickness of the positive photoresist in the region of the thin film transistor component is maximized, and the positive photoresist at the gate electrode terminal, the source electrode terminal or the common electrode terminal, and the electrostatic protection circuit or a portion of the contact hole formed on the contact pad portion of the pixel electrode is removed completely, and the thickness of the positive photoresist in a region other than those described above is adjusted to be uniformly thin and such thin uniform thickness is maintained, and after the oxidation-resisting barrier metal and the thin film semiconductor layer in the contact hole portion of the positive photoresist are etched and removed completely, the gate insulating film of the contact hole portion is halfly etched, and only a small amount of the gate insulating film is remained, and then an oxygen plasma process or an ozone gas process is used to decompose and remove the thin positive photoresist, and the positive photoresist with a uniform film thickness is remained in the halftone exposure region, and after the process, the positive photoresist of the film transistor component region still remains, and the film thickness of the positive photoresist at the halftone exposure region and the film thickness of the positive photoresist at the unexposed region of the thin film transistor component region are adjusted in advance, and after the photoresist in the halftone exposure region is decomposed and removed, the oxidation-resisting barrier metal is etched and exposed and formed on a thin film semiconductor layer on a metal lower layer of the oxidation-resisting barrier, and the small amount of the gate insulating film remained in the region of the contact hole portion is etched, and the small amount of gate insulating film remained in the region of the contact hole portion is adjusted and etched completely sooner than the thin film semiconductor layer in the halftone exposure region, and after the gate insulating film remained in the region of the contact hole portion is etched and removed completely, the etching conditions are changed, and only the thin film semiconductor layer is selectively etched and exposed to avoid damages to the gate insulating film in the halftone exposure region, and the gate insulating film is exposed, and thus the status of the whole region of the gate electrode, common electrode and pixel electrode except the contact hole being covered and included completely by the gate insulating film portion is maintained, and the oxidation-resisting barrier metal and the thin film semiconductor layer of the thin film transistor component portion are patterned, and then the ion doping method is used to project nitrogen ions obliquely onto the substrate, or a nitrified gas is used for a plasma processing of the substrate, and the sidewalls of the thin film semiconductor layer in the thin film transistor component portion are nitrified, and finally the remained positive photoresist is peeled off.

41. The method of manufacturing an active matrix substrate as recited in claim 34, wherein the metal material of the oxidation-resisting barrier uses a high melting-point metal including molybdenum, titanium and zirconium that can be etched by a fluorine-series dry etching gas, and a sputtering process to form a film thickness of 1 nm~50 nm.

42. The method of manufacturing an active matrix substrate as recited in claim 35, wherein the thickness of the gate insulating film remained at the contact hole portion is in a range of 5 nm to 200 nm after the gate insulating film of the contact hole portion is halfly etched.

43. The method of manufacturing an active matrix substrate as recited in claim 37, wherein when the ion doping method is used for nitrifying the sidewalls of the thin film semiconductor layer of the thin film transistor component portion, the projection angle of the nitrogen ion is in a range of 5 degrees~60 degrees measured from the horizontal direction of the substrate, and the acceleration energy of nitrogen ions is set to a range of 1 KeV~10 KeV.

44. An active matrix substrate, produced by using a manufacturing method of the active matrix substrate as recited in one claim selected from claims 1 to 16.

45. An active matrix display apparatus, being an active matrix substrate produced by using a manufacturing method of the active matrix substrate as recited in one claim selected from claims 1 to 16.

46. An active matrix substrate, produced by a manufacturing method as recited in a from one of claims 1 to 16, characterized in that at least one contact pad made of the same metal material of the gate electrode is formed in a pixel electrode portion except the thin film pixel electrode produced in the first photolithographic process, and passed through the contact hole produced in the second photolithographic process, and a third photolithographic process is used for electrically coupling the contact pad with the drain electrode of the thin film transistor component, and the pixel electrode except the contact hole is covered completely by the gate insulating film.

47. An active matrix substrate, produced by a manufacturing method as recited in one of claims 1, 4, 7, 10, 13 or 15, characterized in that a first photolithographic process is used for forming a gate electrode, a common electrode parallel and proximate to the gate electrode, a pixel electrode, at least two contact pads made of the same metal material of the gate electrode in the pixel electrode except the thin film pixel electrode on the same layer, and at least one of the two or more contact pads are electrically coupled to a drain electrode of the thin film transistor component produced in a third photolithographic process through the contact hole produced in the second photolithographic process, and at least one remaining contact pad is electrically coupled to a holdup capacitor (Cst) forming electrode produced in the third photolithographic process through the contact hole, and the holdup capacitor (Cst) forming electrode and the common electrode are stacked through the gate insulating film to form a capacitor, and the pixel electrode except the contact hole is covered completely by the gate insulating film.

48. An active matrix substrate, produced by a manufacturing method as recited in one of claims 2, 5, 8, 11, 14 or 16, characterized in that a first photolithographic process is used for forming a gate electrode, a common electrode parallel and proximate to the gate electrode, a pixel electrode and at least one contact pad made of the same metal material of the gate electrode and disposed in the pixel electrode portion except the thin film pixel electrode on the same layer, and after a second photolithographic process is used for forming one or more contact holes at positions corresponding to the common electrode and the contact pad respectively, and a third photolithographic process is used for forming a drain electrode of the thin film transistor component, an alignment control electrode for controlling the alignment direction of liquid crystal molecules, and the drain electrode is electrically coupled to the contact pad through the contact hole, and the alignment control electrode is electrically coupled to the common electrode through the contact hole, and the thin film pixel electrode is stacked with through the gate insulating film to form a capacitor, and the pixel electrode except the contact hole is covered completely by the gate insulating film.

49. An active matrix substrate, produced by a manufacturing method as recited in one of claims 1, 4, 7, 10, 13 or 15, characterized in that a first photolithographic process is used for extending the gate electrode, the pixel electrode of the comb, the two or more contact pads in the comb pixel electrode portion, the common electrode parallel and proximate to the gate electrode, both left and right sides of the common electrode proximate to the source electrode and parallelly extended to a source signal screening electrode, and the comb common electrode parallelly extended from the common electrode to comb pixel electrode and simultaneously formed on the same layer, the contact hole formed by going through a second photolithographic process, at least one of the two or more contact pads in the comb pixel electrode portion and third photolithographic process, the drain electrode electrically coupled to the thin film transistor component, the remaining one or more contact pads and the electrode electrically coupled to holdup capacitor (Cst) produced by the third photolithographic process, and the common electrode formed by the holdup capacitor (Cst) to form an electrode parallel and proximate to the gate electrode, and stacked by the gate insulating film, to form a capacitor, a comb pixel electrode, a comb common electrode and a source signal screening electrode, which are covered completely by the gate insulating film except the contact hole.

50. An active matrix substrate, produced by a manufacturing method as recited in one of claims 1, 4, 7, 10, 13 or 15, characterized in that a first photolithographic process is used for forming a gate electrode, a common electrode parallel and proximate to the gate electrode, a pixel electrode, and at least one contact pad made of the same metal material of the gate electrode and disposed in the pixel electrode portion except the thin film pixel electrode on the same layer, and after a second photolithographic process is used for forming one or more contact holes at positions corresponding to the common electrode and the contact pad respectively, a third photolithographic process is used for forming a drain electrode of the thin film transistor component and a holdup capacitor (Cst) forming electrode holdup capacitor (Cst), and the drain electrode is electrically coupled to the contact pad through the contact hole, and the holdup capacitor (Cst) forming electrode is electrically coupled to the common electrode through the contact hole, and the holdup capacitor (Cst) forming electrode and the thin film pixel electrode are stacked through the gate insulating film to form a capacitor, and the pixel electrode except the contact hole is covered completely by the gate insulating film.

51. An active matrix substrate, produced by a manufacturing method as recited in one of claims 1, 4, 7, 10, 13 or 15, characterized in that a first photolithographic process is used for forming a gate electrode, a common electrode, a pixel electrode divided into two regions by the common electrode, two or more contact pads formed inside the divided pixel electrode and proximate to the thin film transistor component that drives the pixels, and at least one contact pad inside another divided pixel electrode, and a second photolithographic process is used for forming a contact hole corresponding to the position of the contact pad, and a third photolithographic process is used for forming a drain electrode of the thin film transistor component and a holdup capacitor (Cst) forming electrode holdup capacitor (Cst), and the drain electrode is electrically coupled to a contact pad proximate to the pixel electrode through the contact hole, and the holdup capacitor (Cst) forming electrode and the contact pad inside the divided pixel electrode formed inside two different pixel areas of the common electrode are electrically coupled through the contact hole, and a holdup capacitor (Cst) forming electrode is stacked with the commode electrode through the gate insulating film to form a capacitor, and the pixel electrode except the contact hole is covered completely by the gate insulating film.

52. An active matrix substrate, produced by a manufacturing method as recited in one of claims 1, 4, 7, 10, 13 or 15, characterized in that a first photolithographic process is used for forming two electrically independent common electrodes, a gate electrode, a pixel electrode divided into two regions by the gate electrode, two or more contact pads formed separately inside the pixel electrode divided into two regions in a basic unit pixel, and a second photolithographic process is used for forming a contact hole corresponding to the position of the contact pad, and a third photolithographic process is used for forming two drain electrodes of each pixel electrode corresponding to the two regions divided by the gate electrode, a holdup capacitor (Cst) forming electrode two holdup capacitor (Cst) and corresponding to each pixel electrode, and the two drain electrodes and the contact pad inside the two pixel electrodes divided by the gate electrode, and the contact pad proximate to the gate electrode are electrically coupled through the contact hole, and the electrode formed by two holdup capacitor (Cst) and the remaining contact pad formed inside the divided pixel electrode are electrically coupled through the contact hole, and the electrode formed by two holdup capacitor (Cst) is stacked with the two common electrodes respectively through the gate insulating film to form an independent capacitor, and the pixel electrode divided into two regions except the contact hole is covered completely by the gate insulating film.

53. An active matrix substrate, produced by a manufacturing method as recited in one of claims 2, 5, 8, 11, 14 or 16, characterized in that a first photolithographic process is used for forming two electrically independent common electrodes, a gate electrode, a pixel electrode divided into two regions by the gate electrode, and one or more contact pads inside the pixel electrode divided into two regions and proximate to the gate electrode in a basic unit pixel, and a second photolithographic process is used for forming contact holes at positions corresponding to the contact pad and the two common electrodes, and a third photolithographic process is used for forming two drain electrodes of the thin film transistor component corresponding to each pixel of the two divided regions, and two sets of alignment control electrodes for controlling alignment direction of liquid crystal molecules corresponding to two pixel electrodes respectively, and the two drain electrodes are electrically coupled to the contact pad inside the two divided pixel electrodes through the contact hole, and the two sets of alignment control electrodes and the two common electrodes are independently and electrically coupled through the contact hole, and stacked with the pixel electrode divided into two regions through the gate insulating film by the two sets of alignment control electrodes to form each independent capacitor, and the pixel electrode except the contact hole is covered completely by the gate insulating film.

54. An active matrix substrate, produced by a manufacturing method as recited in one of claims 1, 2, 4, 5, 7, 8, 10, 11, 13, 14, 15 or 16, characterized in that a first photolithographic process is used for forming two electrically independent common electrodes, a gate electrode, a pixel electrode divided into two regions by the gate electrode, two or more contact pads at one of the pixel electrodes divided in the two regions, and at least one contact pad in the other remaining pixel electrode in a basic unit pixel, and a second photolithographic process is used for forming contact holes at the contact pads, and the common electrode installed at a latter pixel electrode with one contact pad, and a third photolithographic process is used for forming two drain electrodes, a holdup capacitor (Cst) forming electrode holdup capacitor (Cst), and a set of alignment control electrodes for controlling the alignment direction of liquid crystal molecules corresponding to the thin film transistor component of each divided pixel electrode, and the two drain electrodes and the contact pad formed inside the divided two pixel electrodes are electrically coupled through each contact hole, and the common electrode having a contact hole and disposed in the one set of alignment control electrode and the two common electrodes are electrically coupled through the contact hole, and the holdup capacitor (Cst) forming electrode and the contact pad of the pixel electrode having at least two or more contact pads and proximate to the common electrode are electrically coupled through the contact hole, and the set of alignment control electrode is stacked with the pixel electrode having at least one contact pad through the gate insulating film to form a capacitor, and the holdup capacitor (Cst) forming electrode is stacked with another pixel electrode having at least two contact pads through the gate insulating film to form a capacitor, and the pixel electrode except the contact hole is covered completely by the gate insulating film.

55. An active matrix substrate, produced by a manufacturing method as recited in one of claims 1, 4, 7, 10, 13 or 15, characterized in that a first photolithographic process is used for forming a gate electrode, a comb pixel electrode, one or more contact pads inside the pixel electrode, a common electrode parallel and proximate to the gate electrode, a source signal screening electrode extended parallelly from the source electrode and proximate to both left and right sides of the common electrode, a comb common electrode of the comb pixel electrode extended parallelly from the common electrode extended on the same layer, and after a second photolithographic process is used for forming one or more contact holes at positions corresponding to the common electrode and the contact pad respectively, and a third photolithographic process is used for forming a drain electrode of the thin film transistor component and a holdup capacitor (Cst) forming electrode holdup capacitor (Cst), and the drain electrode is electrically coupled to the contact pad through the contact hole, and the holdup capacitor (Cst) forming electrode and the common electrode parallel and proximate to the gate electrode are electrically coupled through the contact hole, and the holdup capacitor (Cst) forming electrode and the comb pixel electrode are stacked through the gate insulating film to form a capacitor, and the comb pixel electrode, the comb common electrode and the source signal screening electrode except the contact hole are covered completely by the gate insulating film.

56. An active matrix substrate, produced by a manufacturing method as recited in one of claims 3, 6, 9 or 12, characterized in that a first photolithographic process is used for forming a gate electrode, a common electrode parallel and proximate to the gate electrode, a Betta shaped pixel electrode, and at least one contact pad made of the same material of the gate electrode disposed in the Betta shaped pixel electrode portion except the transparent pixel electrode on the same layer, and after a second photolithographic process is used for forming one or more contact holes at positions corresponding to the common electrode and the contact pad respectively, a third photolithographic process is used for forming a drain electrode and a comb common electrode of the thin film transistor component, and the drain electrode is electrically coupled to the contact pad through the contact hole, and the comb common electrode is electrically coupled to the common electrode through the contact hole and parallel and proximate to the gate electrode, and the comb common electrode and the Betta shaped pixel electrode are stacked through the gate insulating film to form a capacitor, and the Betta shaped pixel electrode except the contact hole is covered completely by the gate insulating film.

57. An active matrix substrate, produced by a manufacturing method as recited in one of claims 1, 4, 7, 10, 13 or 15, characterized in that a first photolithographic process is used for forming a linear gate electrode, a pixel electrode, a contact pad inside the pixel electrode, a plurality of slits periodically formed inside the pixel electrode for controlling the alignment direction of liquid crystal molecules, and the plurality of slits are extended linearly upward in the direction of ±45 degrees with respect to the gate electrode, and bent to an angle of 90 degrees at a position proximate to the center of the pixel electrode, and the pixel electrode produced by a second photolithographic process except the contact hole contact pad portion is completely covered by the gate insulating film, and a linear source electrode (video signal electrode) produced by a third photolithographic process is installed perpendicular to the gate electrode through the gate insulating film.

58. An active matrix substrate, produced by a manufacturing method as recited in one of claims 1, 4, 7, 10, 13 or 15, characterized in that a first photolithographic process is used for forming a linear gate electrode, a pixel electrode, a contact pad inside the pixel electrode, a plurality of slits in a matrix shape inside the pixel electrode for controlling the alignment direction of liquid crystal molecules, and the matrix slit slenderly extends the linear gate electrode in a parallel or a perpendicular direction, and the pixel electrode produced by a second photolithographic process except the contact hole of the contact pad portion is completely covered by the gate insulating film, and a linear source electrode (video signal electrode) produced by a third photolithographic process is installed perpendicular to the gate electrode through the gate insulating film.

59. An active matrix substrate, produced by a manufacturing method as recited in one of claims 2, 5, 8, 11, 14 or 16, characterized in that a first photolithographic process is used for forming a linear gate electrode, a common electrode, a pixel electrode, and a contact pad inside the pixel electrode, and the pixel electrode produced by a second photolithographic process except the contact hole of the contact pad portion is completely covered by the gate insulating film, and a third photolithographic process is used for forming a slender alignment control electrode for controlling the alignment direction of liquid crystal molecules and a linear source electrode, and the alignment control electrode is extended linearly upward in the direction of ±45 degrees with respect to the gate electrode and bent to an angle of 90 degrees at a position proximate to the center of the pixel electrode, and the alignment control electrode is electrically coupled to the common electrode through the contact hole, and the linear source electrode is installed perpendicular to the gate electrode through the gate insulating film.

60. An active matrix substrate, produced by a manufacturing method as recited in one of claims 2, 5, 8, 11, 14 or 16, characterized in that a first photolithographic process is used for forming a linear gate electrode, a common electrode, a pixel electrode, and a contact pad inside the pixel electrode, and the pixel electrode produced by a second photolithographic process except the contact hole of the contact pad portion is completely covered by the gate insulating film, and a third photolithographic process is used for forming a slender alignment control electrode for controlling the alignment direction of liquid crystal molecules and a linear source electrode (video signal electrode), and the alignment control electrode extend the linear gate electrode slenderly in a parallel direction or a perpendicular direction to constitute the shape of a matrix, and the alignment control electrode is electrically coupled to the common electrode through the contact hole, and the linear source electrode is installed perpendicular to the gate electrode through the gate insulating film.

61. An active matrix substrate, produced by a manufacturing method as recited in one of claims 1, 2, 4, 5, 7, 8, 10, 11, 13, 14, 15 or 16, characterized in that a first photolithographic process is used for forming a gate electrode, a common electrode, a pixel electrode, at least one contact pad inside the pixel electrode, and a plurality of slits occupying ⅔ to ⅘ of the area of the pixel electrode for controlling the alignment direction of liquid crystal molecules in a basic unit pixel, and the plurality of slits are extended linearly upward in the direction of ±45 degrees with respect to the gate electrode and bent into a shape with an angle of 90 degrees or a matrix shape at a position proximate to the center of a pixel region having the slits for extending the gate electrode slenderly in a parallel direction or a perpendicular direction, and a second photolithographic process is used for forming one or more contact holes on the common electrode and the contact pad respectively, and the pixel electrode except the contact hole is completely covered by the gate insulating film, and a third photolithographic process is used for forming a linear source electrode perpendicular to the gate electrode, and an alignment control electrode formed at a region without a slit and occupying ⅕ to ⅓ of the area of the pixel electrode for controlling the alignment direction of liquid crystal molecules, and the alignment control electrode is electrically coupled to the common electrode through the contact hole, and extended linearly upward in the direction of ±45 degrees with respect to the gate electrode, and bent to a shape with an angle of 90 degrees or a matrix shape at a position proximate to the center of the pixel region having the alignment control electrode, and the gate electrode is extended slenderly in a parallel direction or a perpendicular direction, and the threshold voltage for driving the liquid crystal in the pixel electrode portion having the alignment control electrode is less than that of the pixel region having the slits.

62. An active matrix substrate, produced by a manufacturing method as recited in one of claims 1, 4, 7, 10, 13 or 15, characterized in that a first photolithographic process is used for forming a linear gate electrode, a pixel electrode, a contact pad inside the pixel electrode, and a plurality of slits formed periodically inside the pixel electrode for controlling the alignment direction of liquid crystal molecules, and the plurality of slits are extended linearly upward in the direction of ±45 degrees with respect to the gate electrode, and bent to an angle of 90 degrees at a position proximate to the center of the pixel electrode, and the pixel electrode is similarly extended linearly upward in the direction of ±45 degrees with respect to the gate electrode, and bent to an angle of 90 degrees at a position proximate to the center of the pixel electrode, and the pixel electrode produced by a second photolithographic process except the contact hole of the contact pad portion is completely covered by the gate insulating film, and a source electrode (video signal electrode) produced by a third photolithographic process is also extended linearly upward in the direction of ±45 degrees with respect to the gate electrode, and the pixel electrode and the slits of the pixel electrode are similarly bent to an angle of 90 degrees at positions proximate to the center of the pixel electrode.

63. An active matrix substrate, produced by a manufacturing method as recited in one of claims 2, 5, 8, 11, 14 or 16, characterized in that a first photolithographic process is used for forming a linear gate electrode, a common electrode, a pixel electrode, a contact pad inside the pixel electrode, and the pixel electrode is extended linearly upward in the direction of +/−45 degrees with respect to the gate electrode and bent to an angle of 90 degrees at a position proximate to the center of the pixel electrode, and contact holes formed at the common electrode portion and the contact pad portion by the second photolithographic process except the contact hole of the pixel electrode are completely covered by the gate insulating film, and a third photolithographic process is used for forming a slender alignment control electrode for controlling the alignment direction of liquid crystal molecules, and a source electrode (video signal electrode), and the alignment control electrode is extended linearly upward in the direction of ±45 degrees with respect to the gate electrode and bent to an angle of 90 degrees at a position proximate to the center of the pixel electrode, and the alignment control electrode is electrically coupled to the common electrode through the contact hole, and stacked with the pixel electrode through the gate insulating film to form a capacitor, and the source electrode is also extended linearly upward in the direction of +/−45 degrees with respect to the gate electrode, and similarly the pixel electrode and the alignment control electrode are bent at positions proximate to the center of the pixel electrode.

64. An active matrix substrate, produced by a manufacturing method as recited in one of claims 1, 2, 4, 5, 7, 8, 10, 11, 13, 14, 15 or 16, characterized in that a first photolithographic process is used for forming a linear one gate electrode, a common electrode, a pixel electrode, at least one contact pad inside the pixel electrode, a plurality of slits occupying ⅔ to ⅘ of the area of the pixel electrode for controlling the alignment direction of liquid crystal in a basic unit pixel, and the plurality of slits are extended linearly upward in the direction of +/−45 degrees with respect to the gate electrode, and bent to an angle of 90 degrees at a position proximate to the center of the pixel electrode, and the pixel electrode is similarly extended linearly upward in the direction of +/−45 degree with respect to the gate electrode, and bent to an angle of 90 degrees at a position proximate to the center of the pixel electrode, and one or more contact holes are formed on the common electrode and the contact pad by a second photolithographic process respectively, and the pixel electrode except the contact hole is completely covered by the gate insulating film, and a third photolithographic process is used for forming a source electrode (video signal electrode), and an alignment control electrode in a region without a slit and occupying ⅕ to ⅓ of the area of the pixel electrode for controlling the alignment direction of liquid crystal molecules, and the alignment control electrode is electrically coupled to the common electrode through the contact hole, and extended linearly upward in the direction of +/−45 degrees with respect to the gate electrode, and bent to an angle of 90 degrees at a position proximate to the center of the pixel region, and the alignment control electrode is stacked with the pixel electrode through the gate insulating film to form a capacitor, and the source electrode is also extended linearly upward in the direction of +/−45 degrees with respect to the gate electrode, and bent to an angle of 90 degrees at a position proximate to the center of the pixel electrode, similar to the pixel electrode, the slits at the pixel electrode and the alignment control electrode, and the threshold voltage of an alignment control electrode in a region occupying ⅕ to ⅓ of the area of the pixel electrode for driving the liquid crystal is less than the remaining region occupying ⅔ to ⅘ of the area of the pixel electrode and having the slits.

65. An active matrix substrate, produced by a manufacturing method as recited in one of claims 1, 4, 7, 10, 13 or 15, characterized in that a first photolithographic process is used for forming a linear gate electrode, a common electrode, a pixel electrode, and at least one or more contact pads inside the pixel electrode in a basic unit pixel, and the pixel electrode is divided into two regions, and the plurality of slits occupying ⅔ to ⅘ of the area of the pixel electrode for controlling the alignment direction of liquid crystal molecules are extended linearly upward in the direction of +/−45 degrees with respect to the gate electrode, and the slits are scatterly and parallelly arranged with an interval of 40~60 μm apart from each other, and the pixel electrode and the plurality of slits are bent to 90 degrees at positions proximate to the center of the scatterly arranged region, and a plurality of slits are disposed in the region of the remaining ⅕ to ⅓ of the area of the pixel electrode for controlling the alignment direction of liquid crystal molecules, and extended linearly upward in the direction of +/−45 degrees with respect to the gate electrode, and the slits are densely and parallelly arranged with an interval of 20~40 μm apart from each other, and the pixel electrode and the plurality of slits are bent to 90 degrees at positions proximate to the center of the densely arranged region, and a pixel electrode produced by a second photolithographic process except the contact hole of the contact pad portion is completely covered by the gate insulating film, and a source electrode (video signal electrode) produced by a third photolithographic process and also extended linearly upward in the direction of +/−45 degrees with respect to the gate electrode, and bent to 90 degrees, similar to the pixel electrode and the slit, for at least two times at two positions: a position proximate to the center of the pixel region of the scatterly arranged slit, and a position proximate to the center of the pixel region of the densely arranged slit.

66. An active matrix substrate, produced by a manufacturing method as recited in one of claims 2, 5, 8, 11, 14 or 16, characterized in that a first photolithographic process is used for forming a linear gate electrode, a common electrode, a pixel electrode, at least one contact pad inside the pixel electrode in a basic unit pixel, and the pixel electrode produced by a second photolithographic process except the contact hole of the contact pad portion is completely covered by the gate insulating film, and a third photolithographic process is used for forming a source electrode (video signal electrode), and a plurality of slender alignment control electrodes for controlling the alignment direction of liquid crystal molecules, and the alignment control electrode occupying ⅔ to ⅘ of the area of the pixel electrode is extended linearly upward in the direction of +/−45 degrees with respect to the gate electrode, and the alignment control electrodes are scattered and parallelly arranged with an interval of 40~60 μm apart from each other and at positions proximate to the center of the scatterly arranged region, and both of the pixel electrode and the plurality of slender alignment control electrodes are bent to 90 degrees, and a plurality of alignment control electrodes in a region occupying ⅕ to ⅓ of the area of the pixel electrode are extended linearly upward in a direction of +/−45 degrees with respect to the gate electrode, and the alignment control electrodes are densely and parallelly arranged with an interval of 20~40 μm apart from each other, and bent at positions proximate to the center of the densely arranged region, and both of the pixel electrode and the plurality of slender alignment control electrodes are bent to 90 degrees, and the source electrode, similar to the pixel electrode and the slender alignment control electrode, are scatterly arranged at two positions: a position of the alignment control electrode proximate to the center of the pixel region, and a position of the densely arranged alignment control electrode proximate to the center of the pixel region, and bent to 90 degrees for at least two times, and connected to the periphery of a region of the alignment control electrode that connects two pixel regions, and electrically coupled to the common electrode through the contact hole, and stacked with the pixel electrode through the gate insulating film to form a capacitor.

67. An active matrix substrate, produced by a manufacturing method as recited in one of claims 1, 2, 4, 5, 7, 8, 10, 11, 13, 14, 15 or 16, characterized in that a first photolithographic process is used for forming a linear gate electrode, a common electrode, a pixel electrode, and at least one contact pad inside the pixel electrode in a basic unit pixel, and a second photolithographic process is used for forming contact holes at the common electrode portion and the contact pad portion, and the pixel electrode except the contact hole of the contact pad portion is completely covered by the gate insulating film, and a third photolithographic process is used for forming a source electrode (video signal electrode) and a plurality of slender alignment control electrodes for controlling the alignment direction of liquid crystal molecules, and alignment control electrode is electrically coupled to the common electrode through the contact hole, and the pixel electrode divided into two regions occupying ⅔ to ⅘ of the area of the pixel electrode, and the plurality of slits for controlling the alignment direction of liquid crystal molecules are extended linearly upward in the direction of +/−45 degrees with respect to the gate electrode, and the slits are scattered and parallelly arranged with an interval of 40~60 μm apart from each other and proximate to the center of the region, and both of the pixel electrode and the plurality of slits are bent to 90 degrees, and a plurality of alignment control electrodes in a region occupying ⅕ to ⅓ of the area of the pixel electrode are extended linearly upward in the direction of +/−45 degrees with respect to the gate electrode, and the alignment control electrodes are densely and parallelly arranged with an interval of 20~40 μm apart from each other and proximate to the center of the region, and both of the pixel electrode and the plurality of slender alignment control electrodes are bent to 90 degrees, and the source electrode, similar to the pixel electrode, the slit and the slender alignment control electrode, is bent to 90 degrees for at least two times at two positions: a position of the scatterly arranged slit proximate to the center of the pixel region, and a position of the densely arranged alignment control electrode proximate to the center of the pixel region, and a region of the densely and parallelly arranged alignment control electrode occupies ⅕ to ⅓ of the area of the pixel electrode, and the threshold voltage for driving the liquid crystal is smaller than that of a region of the scattered and parallelly arranged slit occupying ⅔ to ⅘ of the area of the pixel electrode.

68. An active matrix substrate, produced by a manufacturing method as recited in one of claims 1, 4, 7, 10, 13 or 15, characterized in that a first photolithographic process is used for forming a gate electrode and two common electrodes, and two pixel electrodes in a basic unit pixel, and the two pixel electrodes are divided into two regions: a large region and a small region by the gate electrode, and at least two or more contact pads are formed inside the two divided regions, which sums up to 4 or more contact pads, and the larger pixel electrode has an area approximately equal to two to four times of the area of the smaller pixel electrode area, and the plurality of slits of the larger pixel electrode for controlling the alignment direction of liquid crystal molecules are extended linearly upward in the direction of +/−45 degrees with respect to the gate electrode, and the slits are scatterly and parallelly arranged with an interval of 40~60 μm apart from each other, and the slit proximate to the center of the pixel electrode is bent to an angle of 90 degrees, and the plurality of slits of the smaller pixel electrode for controlling the alignment direction of liquid crystal molecules are extended linearly upward in the direction of +/−45 degrees with respect to the gate electrode, and the slits are densely and parallelly arranged with an interval of 20~40 μm apart from each other, and the smaller slit proximate to the center of the pixel electrode is bent to an angle of 90 degrees, and a second photolithographic process is used for forming a contact hole in the contact pad portion, and the larger and smaller pixel electrodes except the contact hole are completely covered by the gate insulating film, and a third photolithographic process is used for forming a linear source electrode (video signal electrode) perpendicular to the gate electrode, two drain electrodes corresponding to each larger pixel electrode and each smaller pixel electrode, and a holdup capacitor (Cst) forming electrode two holdup capacitor (Cst) in a basic unit pixel, and the two drain electrodes are electrically and respectively coupled to the larger and smaller pixel electrodes through the contact hole, and the electrode formed by two holdup capacitor (Cst) are electrically and respectively coupled to the larger and smaller pixel electrodes through the contact hole, and stacked with two corresponding common electrodes through the gate insulating film to form two independent capacitors.

69. An active matrix substrate, produced by a manufacturing method as recited in one of claims 2, 5, 8, 11, 14 or 16, characterized in that a first photolithographic process is used for in a basic unit pixel forming one gate electrode, two common electrodes, two pixel electrodes divided into two larger and smaller regions by the gate electrode, and at least one contact pad formed inside each of the two divided pixel electrodes, and the area of the larger pixel electrode is approximately equal to two to four times of the area of the smaller pixel electrode, and a second photolithographic process is used for forming contact holes at a contact pad portion inside the larger and smaller pixel electrodes, and two common electrodes portions corresponding to the larger and smaller pixel electrodes, and the larger and smaller pixel electrodes except the contact hole, are completely covered by the gate insulating film, and a third photolithographic process is used for forming a linear source electrode (video signal electrode) perpendicular to the gate electrode, two drain electrodes corresponding to the larger and smaller pixel electrodes, and the slender alignment control electrode corresponding to the larger and smaller pixel electrodes for controlling the alignment direction of liquid crystal molecules in a basic unit pixel, and the two drain electrodes and the contact pad of the larger and smaller pixel electrodes are electrically coupled through the contact hole, and the larger pixel electrode and the alignment control electrode are extended linearly upward in the direction of +/−45 degrees with respect to the gate electrode, and a plurality of alignment control electrodes are scatterly and parallelly arranged with an interval of 40~60 μm apart from each other, and proximate to the center of the larger pixel electrode, and the slender alignment control electrode is bent to an angle of 90 degrees, and the smaller pixel electrode and the alignment control electrode are extended linearly upward in the direction of +/−45 degrees with respect to the gate electrode, and a plurality of alignment control electrodes are densely and parallelly arranged with an interval of 20~40 μm apart from each other, and proximate to the center of the smaller pixel electrode, and the slender alignment control electrode is bent to an angle of 90 degrees, and the two common electrodes corresponding to each alignment control electrode arranged in the region of the larger and smaller pixel electrodes are electrically coupled through the contact hole, and stacked with the larger and smaller pixel electrodes through the gate insulating film to form two independent capacitors.

70. An active matrix substrate, produced by a manufacturing method as recited in one of claims 1, 2, 4, 5, 7, 8, 10, 11, 13, 14, 15 or 16, characterized in that a first photolithographic process is used for forming a gate electrode, two common electrodes, two pixel electrodes divided into two larger and smaller regions by the gate electrode, two or more contact pads on the larger pixel electrode, and at least one or more contact pads on the smaller pixel electrode in a basic unit pixel, and the area of the larger pixel electrode is approximately equal to two to four times of the area of the smaller pixel electrode, and a plurality of slits are formed in the larger pixel electrode for controlling the alignment direction of liquid crystal molecules, and the plurality of slits are extended linearly upward in the direction of +/−45 degrees with respect to the gate electrode, and scatterly and parallelly arranged with an interval of 40~60 μm apart from each other and proximate to the center of the pixel electrode, and the plurality of slits are bent to an angle of 90 degrees, and a second photolithographic process is used for forming a contact pad portion inside the larger and smaller pixel electrodes and a contact hole on a common electrode corresponding to the smaller pixel electrode, and the larger and smaller pixel electrodes except the contact hole are completely covered by the gate insulating film, and a third photolithographic process is used for forming a linear source electrode (video signal electrode) perpendicular to the gate electrode, two drain electrodes corresponding to the larger and smaller pixel electrodes, a holdup capacitor (Cst) forming electrode corresponding to the larger pixel electrode, and a slender alignment control electrode corresponding to smaller pixel electrode for controlling the alignment direction of liquid crystal molecules in a basic unit pixel, and the two drain electrodes electrically coupled to a contact pad formed at the larger and smaller pixel electrodes through the contact hole, and the smaller pixel electrode and the alignment control electrode are extended linearly upward in the direction of +/−45 degrees with respect to the gate electrode, and a plurality of alignment control electrodes are densely and parallelly arranged with an interval of 20~40 μm apart from each other, and bent to an angle of 90 degrees at positions proximate to the center of the smaller pixel electrode, and the alignment control electrode and a common electrode corresponding to the smaller pixel electrode are electrically coupled through the contact hole, and stacked with the smaller pixel electrode through the gate insulating film to form a capacitor, and the holdup capacitor (Cst) forming electrode is electrically coupled to the large pixel electrode through the contact hole, and stacked with a common electrode corresponding to the large pixel electrode through the gate insulating film to form a capacitor, and the threshold voltage for driving liquid crystal in the smaller pixel electrode portion of the densely and parallelly arranged alignment control electrode is smaller than that of the larger pixel electrode portion of the scattered and parallelly arranged alignment direction slit.

71. An active matrix substrate, produced by a manufacturing method as recited in one of claims 1, 4, 7, 10, 13 or 15, characterized in that a first photolithographic process is used for forming a gate electrode, two common electrodes, two pixel electrodes divided into larger and smaller regions by the gate electrode, and two or more contact pads inside each divided pixel electrode in a basic unit pixel, and the area of the larger pixel electrode is approximately equal to two to four times of the area of the smaller pixel electrode, and the plurality of slits of the larger pixel electrode for controlling the alignment direction of liquid crystal molecules are extended linearly upward in the direction of +/−45 degrees with respect to the gate electrode, and the slits are scatterly and parallelly arranged with an interval of 40~60 μm apart from each other, and proximate to the center of the larger pixel electrode, and the plurality of slits of the larger pixel electrode bends it to an angle of 90 degrees, and the plurality of slits of the smaller pixel electrode for controlling the alignment direction of liquid crystal molecules are also extended linearly upward in the direction of +/−45 degrees with respect to the gate electrode, and the slits are densely and parallelly arranged with an interval of 20~40 μm apart from each other, and proximate to the center of the smaller pixel electrode, and the plurality of slits of the smaller pixel electrode bend it to an angle of 90 degrees, and a second photolithographic process is used for forming contact holes inside the contact pad portion of the larger and smaller pixel electrodes, and the larger and smaller pixel electrodes except the contact holes are completely covered by the gate insulating film, and a third photolithographic process is used for forming a source electrode (video signal electrode), two drain electrodes corresponding to each larger pixel electrode and each smaller pixel electrode, and a holdup capacitor (Cst) forming electrode two holdup capacitor (Cst) in a basic unit pixel, and the source electrode is extended linearly upward in the direction of +/−45 degrees with respect to the gate electrode, and similarly, the larger and smaller pixel electrodes and the slit are bent to 90 degrees for at least two times at two positions: a position proximate to the center of the larger pixel electrode and a position proximate to the center of the smaller pixel region, and the two drain electrodes are electrically and respectively coupled to the larger and smaller pixel electrodes through the contact hole, and a holdup capacitor (Cst) forming electrode 2 Cst (holdup capacitors) are respectively and electrically coupled to the larger and smaller pixel electrodes through the contact hole, and stacked with two common electrodes corresponding to each electrode formed by Cst through the gate insulating film to form two independent capacitors.

72. An active matrix substrate, produced by a manufacturing method as recited in one of claims 2, 5, 8, 11, 14 or 16, characterized in that a first photolithographic process is used for forming a gate electrode, two common electrodes, two pixel electrodes divided into larger and smaller regions by the gate electrode, and at least one contact pad formed in each divided pixel electrode portion in a basic unit pixel, and the area of the larger pixel electrode is approximately equal to two to four times of the area of the smaller pixel electrode, and each of the larger and smaller pixel electrodes proximate to the center of the pixel electrode is bent to an angle of 90 degrees and the gate electrode is bent to an angle of +/−45 degrees, and a second photolithographic process is used for forming contact holes on the contact pad portion inside the larger and smaller pixel electrodes and two common electrode portions corresponding to the larger and smaller pixel electrodes, and the larger and smaller pixel electrodes except the contact hole are completely covered by the gate insulating film, and a third photolithographic process is used for forming a source electrode (video signal electrode), two drain electrodes corresponding to the larger and smaller pixel electrodes, a slender alignment control electrode corresponding to the larger and smaller pixel electrodes for controlling the alignment direction of liquid crystal molecules, two drain electrodes, and a contact pad at the larger and smaller pixel electrodes in a basic unit pixel, and the larger pixel electrode portion and the alignment control electrode are electrically coupled through the contact hole, and extended linearly upward in the direction of +/−45 degrees with respect to the gate electrode, and a plurality of alignment control electrodes are scatterly and parallelly arranged with an interval of 40~60 μm apart from each other and proximate to the center of the pixel electrode, and similarly, the slender alignment control electrode and the larger pixel electrode are bent to an angle of 90 degrees, and the smaller pixel electrode and the alignment control electrode are extended linearly upward in the direction of +/−45 degrees with respect to the gate electrode, and a plurality of alignment control electrodes are densely and parallelly arranged with an interval of 20~40 μm apart from each other, and proximate to the center of the pixel electrode, and the slender alignment control electrode and the smaller pixel electrode are similarly bent to an angle of 90 degrees, and each alignment control electrode arranged in the region of the larger and smaller pixel electrodes and the two common electrodes corresponding to the larger and smaller pixel electrodes are electrically coupled through the contact hole, and stacked with the larger and smaller pixel electrodes through the gate insulating film to form two independent capacitors, and the source electrode is extended linearly upward in the direction of +/−45 degrees, and similarly, the slender alignment control electrode is bent to 90 degrees for at least two times at two positions: a position proximate of the center of the larger pixel electrode, and a position proximate to the center of the smaller pixel electrode.

73. An active matrix substrate, produced by a manufacturing method as recited in one of claims 1, 2, 4, 5, 7, 8, 10, 11, 13, 14, 15 or 16, characterized in that a first photolithographic process is used for forming a gate electrode, two common electrodes, two pixel electrodes divided into larger and smaller regions by the gate electrode, two or more contact pads on the larger pixel electrode, and at least one contact pad on the smaller pixel electrode in a basic unit pixel, and the area of the larger pixel electrode is approximately equal to of two to four times the area of the smaller pixel electrode portion, and a plurality of slits in the larger pixel electrode for controlling the alignment direction of liquid crystal molecules, and the plurality of slits are extended linearly upward in the direction of +/−45 degrees with respect to the gate electrode, and scatterly and parallelly arranged with an interval of 40~60 μm apart from each other, and the larger and smaller pixel electrodes are bent to an angle of 90 degrees at positions proximate to the center of the pixel electrode, and a second photolithographic process is used for forming contact holes on a contact pad portion inside the larger and smaller pixel electrodes and a common electrode corresponding to smaller pixel electrode, and the larger and smaller pixel electrodes except the contact holes, are completely covered by the gate insulating film, and a third photolithographic process is used for forming a source electrode (video signal electrode), two drain electrodes corresponding to the larger and smaller pixel electrodes, a holdup capacitor (Cst) forming electrode corresponding to the larger pixel electrode, and a slender alignment control electrode corresponding to the smaller pixel electrode for controlling the alignment direction of liquid crystal molecules in a basic unit pixel, and the two drain electrodes are electrically coupled to the contact pad of the larger and smaller pixel electrodes through the contact hole, and the smaller pixel electrode portion and the alignment control electrode are extended linearly upward in the direction of +/−45 degrees with respect to the gate electrode, and the plurality of alignment control electrodes are densely and parallelly arranged with an interval of 20~40 μm apart from each other, and bent to an angle of 90 degrees at a position proximate to the center of the smaller pixel electrode, and the alignment control electrode and a common electrode corresponding to the smaller pixel electrode are electrically coupled through the contact hole, and stacked with the smaller pixel electrode through the gate insulating film to form a capacitor, and the holdup capacitor (Cst) forming electrode is electrically coupled to the large pixel electrode through the contact hole, and stacked with one common electrode corresponding to the large pixel electrode through the gate insulating film to form a capacitor, and the source electrode is extended linearly upward in the direction of +/−45 degrees with respect to the gate electrode at two positions: a position proximate to the center of the larger pixel electrode and a position proximate to the center of the smaller pixel electrode, and bent to an angle of 90 degrees in the unit pixel for at least two times, and the threshold voltage for driving liquid crystal in the smaller pixel electrode portion of the densely and parallelly arranged alignment control electrode is smaller than that of the larger pixel electrode portion of the scattered and parallelly arranged slender alignment direction slit.

74. An active matrix substrate, produced by a manufacturing method as recited in one of claims 1, 4, 7, 10, 13 or 15, characterized in that a first photolithographic process is used for forming a gate electrode, a comb pixel electrode, at least two contact pads inside the comb pixel electrode, a common electrode parallel and proximate to the gate electrode, a source signal screening electrode parallelly extended from the common electrode and proximate to both left and right sides of the source electrode (video signal electrode), and a comb common electrode divided from the common electrode and parallelly extended from the comb common electrode of the comb pixel electrode in a basic unit pixel simultaneously on the same layer, and the electrode width of the comb pixel electrode and comb common electrode is 2~6 μm, and the electrode distance of the two electrodes is 6~18 μm, and the electrode width of the source signal screening electrode is increased to 10~20 μm, and the comb pixel electrode, the comb common electrode and the source signal screening electrode are extended linearly upward in the direction from +/−60 degrees to +/−90 degrees with respect with the gate electrode and bent to an angle from 120 degrees to 180 degrees for at least one time in the unit pixel, and a second photolithographic process is used for forming a contact hole on the contact pad portion inside the comb pixel electrode, and the comb pixel electrode, the comb common electrode and the source signal screening electrode except the contact holes are completely covered by the gate insulating film, and a third photolithographic process is used for forming a source electrode (video signal electrode), a drain electrode, and a holdup capacitor (Cst) forming electrode in a basic unit pixel, and the source electrode is extended slenderly upward in the direction from +/−60 degrees to +/−69 degrees with respect to the gate electrode and bent to an angle from 120 degrees to 180 degrees for at least one time in the unit pixel, and the drain electrode and the holdup capacitor (Cst) forming electrode are electrically coupled to the comb pixel electrode through the contact hole, and the holdup capacitor (Cst) forming electrode is stacked with the common electrode through the gate insulating film to form a capacitor.

75. An active matrix substrate, produced by a manufacturing method as recited in one of claims 3, 6, 9 or 12, characterized in that a first photolithographic process is used for forming a gate electrode, a common electrode parallel and proximate to the gate electrode, a Betta shaped pixel electrode, and at least one contact pad inside the Betta shaped pixel electrode in a basic unit pixel simultaneously formed on the same layer, and the Betta shaped pixel electrode is extended slenderly upward in the direction from +/−60 degrees to +/−90 degrees with respect to the gate electrode and bent to an angle from 120 degrees to 180 degrees for at least one time in the unit pixel, and a second photolithographic process is used for forming one or more contact holes at positions corresponding to the common electrode and the contact pad, and the Betta shaped pixel electrode except the contact hole is completely covered by the gate insulating film, and a third photolithographic process is used for forming a source electrode (video signal electrode), a drain electrode, and a comb common electrode in a basic unit pixel, and the source electrode and the comb common electrode are extended slenderly upward in the direction from +/−60 degrees to +/−69 degrees with respect to the gate electrode, and bent to an angle from 120 degrees to 180 degrees for at least one time in the unit pixel, and the drain electrode is electrically coupled to the Betta shaped pixel electrode through the contact hole, and the comb common electrode is electrically coupled to the common electrode through the contact hole, and stacked with the gate insulating film through the Betta shaped pixel electrode to form a capacitor.

76. An active matrix substrate, having an alignment control electrode as recited in claim 48, characterized in that the lower layer of the alignment control electrode for controlling the alignment direction of liquid crystal molecules, the thin film semiconductor layer, and the alignment control electrode are sealed and formed substantially in the same shape by a second photolithographic process, and the alignment control electrode is completely covered by the passivation film in the display pixel region.

77. An active matrix substrate, having an alignment control electrode as recited in claim 48, characterized in that the lower layer of the alignment control electrode for controlling the alignment direction of liquid crystal molecules is formed with the gate insulating film and the same metal material of the gate electrode and substantially in the same shape of the alignment control electrode during a first photolithographic process, and the alignment control electrode is completely covered by a passivation film in the display pixel region.

78. An active matrix substrate, having an alignment control electrode as recited in claim 48, characterized in that the lower layer of the alignment control electrode for controlling the alignment direction of the liquid crystal molecules and the thin film semiconductor layer are sealed substantially in the same shape and formed by a second photolithographic process, and the gate insulating film, the same metal material of the gate electrode, and the alignment control electrode area formed substantially with the same shape, or a shape with a width of several microns by a first photolithographic process, and the alignment control electrode is completely covered by the passivation film in the display pixel region.

79. An active matrix display apparatus, being produced by an active matrix substrate as recited in a claim selected from claim 46.

80. An active matrix LCD apparatus, being produced by using a photolithographic process as recited in one of one of claims 4, 5, 6, 10, 11, 12, 15 or 16 for three times, characterized in that the passivation film and the liquid crystal alignment film are maintained in a vacuum and formed by the same plasma CVD device, and the film formation area of the passivation film is larger than the film formation area of the liquid crystal alignment film by an area of the mean seal region.

81. An active matrix LCD apparatus, produced by using a photolithographic process as recited in one of claims 4, 5, 10, 11, 15 or 16 for three times, characterized in that the passivation film uses a plasma silicon nitride film (P—SiNx), and a liquid crystal alignment film uses a plasma polymer film adopting a gas of hexamethyl disiloxane (HMDSO), hexaproply disiloxane (HPDSO), hexamethyl disilazane or hexapropyl disilazane or a mixed gas of two or more of the above as raw material, and the two types of films are maintained in vacuum and formed continuously by the same plasma CVD device, and the silicon nitride film (P—SiNx) is larger than the plasma polymerization alignment film by the area of a mean seal region.

82. An active matrix LCD apparatus, produced by using a photolithographic process as recited in one of claims 4, 6, 10 or 12 for three times, characterized in that passivation film uses a plasma silicon nitride film (P—SiNx), and the liquid crystal alignment film uses a diamond-like carbon film (DLC), and the two types of films are maintained in vacuum and formed by the same plasma CVD device, and the silicon nitride film (P—SiNx) is larger than the DLC alignment film by the area of a mean seal region.

83. An active matrix LCD apparatus, produced by using a photolithographic process as recited in one of claims 4, 6, 10 or 12 for three times, characterized in that passivation film uses a plasma silicon nitride film (P—SiNx), and the liquid crystal alignment film uses a diamond-like carbon film (DLC), and the two types of films are maintained in vacuum and formed continuously by the same plasma CVD device and the silicon nitride film (P—SiNx) is larger than the DLC alignment film by an area of a mean seal region, and after the two types of films are formed and maintained in a vacuum, the surface of the DLC alignment film are aligned and processed in an ion alignment treatment chamber.

84. An active matrix LCD apparatus, produced by using a photolithographic process as recited in one of claims 4, 5, 10, 11, 15 or 16 for three times, characterized in that the passivation film is a silicon nitride film, and a liquid crystal alignment film is made by using Unidyne (DAIKIN industrial fluoride series coating material), and the passivation film (P—SiNx) is larger than the liquid crystal alignment film (Unidyne) by the area of a main seal region.

85. An active matrix LCD apparatus, produced by using a photolithographic process as recited in one of claims 4, 6, 10 or 12 for three times, characterized in that the passivation film is a silicon nitride film (P—SiNx), and a liquid crystal alignment film made a ladder structured or a cage structured (Cage Structure—T8, T10, T12) Silsesquioxan, and the passivation film (P—SiNx) is larger than the liquid crystal alignment film (Silsesquioxan) by an area of a main seal region.

86. An active matrix LCD apparatus, produced by using the photolithographic process as recited in one of claims 4, 6, 10 or 12 for 3 times, characterized in that the passivation film is a silicon nitride film (P—SiNx), and a liquid crystal alignment film is made of bisallylnadiimide, and the passivation film (P—SiNx) is larger than the liquid crystal alignment film (bisallylnadiimide) by the area of a main seal region.

87. An active matrix LCD apparatus, produced by using the photolithographic process as recited in one of claims 4, 6, 10 or 12 for 3 times, characterized in that the passivation film is a silicon nitride film (P—SiNx), and a liquid crystal alignment film is made of a polyidmide composed of bicycle(2,2,2)octane tetracarboxylic acid, and the passivation film (P—SiNx) is larger than the liquid crystal alignment film by the area of a main seal region.

88. An active matrix LCD apparatus, produced by a manufacturing method as recited one of claims 1 to 16, characterized in that the gate electrode terminal, the source electrode terminal and the common electrode terminal are used for forming each electrode terminal produced by the first photolithographic process and each electrode terminal produced by the third photolithographic process, and a two-layer structure is connected through a contact hole produced by the second photolithographic process, and the total film thickness of different types of electrodes, the gate insulating film and the passivation film formed on the active matrix glass substrate in a main seal region is equal to all of the four sides of the perimeter of a display screen.

89. A color filter substrate used for an IPS mode or FFS mode horizontal electric field LCD apparatus, characterized in that after a thin film of titanium or zirconium with a film thickness of 5~10 nm is formed on the backside of a color filter layer, an ion shower doping apparatus is used to project nitrogen ions to form TiNx or ZrNx, or uses a metal target of titanium or zirconium to mix nitrogen gas into argon gas for carrying out a splutering process, and after the TiNx or ZrNx film with a film thickness of 5~10 nm is formed, a BM (light-shielding film) is coated onto the surface of the color filter layer to form an n-type photoresist, and a non-masking direct writing exposure method of a DMD component is used for the exposure to form a BM pattern bent to an angle from 120 degrees to 180 degrees for at least one time and corresponding to the BM pattern of a source electrode in a unit pixel, and after an ink-jet coating method or a planographic printing method is used to form a (R, G, B) color filter layer, a silicon planarization film is coated and cured, and then the ink-jet coating method or the planographic printing method is used to install a ball spacer at a fixed point proximate to the center of a BM (light-shielding film) parallelly arranged in a region proximate to the gate electrode and the common electrode.

90. A color filter substrate used for a MVA mode vertical alignment LCD apparatus, characterized in that a BM (light-shielding film) is coated to form a negative photoresist, and a non-masking direct writing exposure method adopting a DMD component is used for an exposure to form a BM pattern corresponding to a source electrode in the unit pixel and bent with an angle of 90 degrees for at least one time to substantially the same shape of the source electrode, and after a (R, G, B) n-type dyed photoresist color filter is formed, the non-masking direct writing exposure method adopting the DMD component is used for an exposure to form a color filter layer in the unit pixel and bent to an angle of 90 degrees for at least one time, similar to the BM (light-shielding film), and after a transparent electroconductive film is formed on the entire surface of the substrate, an n-type silicon photoresist is coated, and the non-masking direct writing exposure method of the DMD component is used for an exposure to form an alignment controlled protruding lump for controlling the alignment direction of liquid crystal molecules, and an ink-jet coating method or a planographic printing method is used to install a ball spacer at a fixed point proximate to the center of a BM (light-shielding film) parallelly arranged in a region proximate to the gate electrode and the common electrode.

91. A color filter substrate used for a MVA mode vertical alignment LCD apparatus, characterized in that a BM (light-shielding film) is coated to form a negative photoresist, and a non-masking direct writing exposure method adopting a DMD component is used for an exposure to form a BM pattern in the unit pixel and bent to an angle of 90 degrees for at least two times, and the source electrode is formed and bent substantially in the same shape of the source electrode, and after a (R, G, B) n-type photoresist color filter is coated, and the non-masking direct writing exposure method of the DMD component is used for an exposure to form the bent color filer layer in the unit pixel and the BM (light-shielding film) similarly and bent to an angle of 90 degrees for at least two times, and after a transparent electroconductive film is formed on the entire surface of the substrate, an n-type silicon photoresist is coated, and after the non-masking direct writing exposure method adopting the DMD component is used for an exposure to form an alignment controlled protruding lump for controlling the alignment direction of liquid crystal molecules, an ink-jet coating method or a planographic printing method is used to install a ball spacer at a fixed point proximate to the center of a BM (light-shielding film) proximate and parallel to a region of two common electrodes corresponding to a unit pixel.

92. A color filter substrate used for a MVA mode vertical alignment LCD apparatus, characterized in that a BM (light-shielding film) is coated to form a negative photoresist, and a non-masking direct writing exposure method adopting a DMD component is used for an exposure, and linearly forming a BM pattern corresponding to a source electrode, and after an ink-jet coating method or a planographic printing method is used to form a (R, G, B) color filter layer, a transparent electroconductive film is formed on a whole surface of a substrate, and then an n-type silicon photoresist is coated, and the non-masking direct writing exposure method of the DMD component is used for an exposure, such that after an alignment controlled protruding lump for controlling the alignment direction of liquid crystal molecules is formed, and the ink-jet coating method or the planographic printing method is used for installing a ball spacer at a fixed point proximate to a center of the BM (light-shielding film) proximate and parallel to a region of two common electrodes corresponding to a gate electrode.

93. A color filter substrate used in a MVA mode vertical alignment LCD apparatus, characterized in that a BM (light-shielding film) is coated to form a negative photoresist, and a non-masking direct writing exposure method adopting a DMD component is used for an exposure to linearly form the BM pattern corresponding to a source electrode, and after an ink-jet coating method or a planographic printing method is used to form a (R, G, B) color filter layer, a transparent electroconductive film is formed on the whole surface of a substrate, and then an n-type silicon photoresist is coated, and the non-masking direct writing exposure method adopting the DMD component is used for an exposure, such that after an alignment controlled protruding lump for the alignment direction of liquid crystal molecules is formed and controlled, and the ink-jet coating method or the planographic printing method is used for installing a ball spacer at a fixed point proximate to the center of the BM (light-shielding film) proximate and parallel to a region of two common electrodes corresponding to a unit pixel.

94. A horizontal electric field LCD apparatus, characterized in that the as recited in claim 74 and the color filter substrate as recited in claim 89 are used, such that when the liquid crystal cell is assembled, a plasma CVD method is used for forming an alignment film of a ball spacer installed at a fixed point.

95. A MVA mode vertical alignment LCD apparatus, characterized in that the active matrix substrate as recited in claim 63, and the color filter substrate are used, such that when the liquid crystal cell is assembled, a plasma CVD method is used for forming an alignment film of a ball spacer at a fixed point.

96. A MVA mode vertical alignment LCD apparatus, characterized in that the active matrix substrate as recited in claim 71, and the color filter substrate are used, such that when the liquid crystal cell is assembled, a plasma CVD method is used for forming an alignment film of a ball spacer at a fixed point.

97. A MVA mode vertical alignment LCD apparatus, characterized in that the active matrix substrate as recited in claim 59, and the color filter substrate are used, such that when the liquid crystal cell is assembled, a plasma CVD method is used for forming an alignment film of a ball spacer at a fixed point.

98. A MVA mode vertical alignment LCD apparatus, characterized in that the active matrix substrate as recited in claim 68, and the color filter substrate are used, such that when the liquid crystal cell is assembled, a plasma CVD method is used for forming an alignment film of a ball spacer at a fixed point.

99. A mask used for halftone exposure, using the first photolithographic process as recited in one of claims 1, 2, 3, 4, 5 or 6 is characterized in that a piece of mask is comprised of three regions: a complete UV photo interrupt region, an UV light semi-transmitting region and an UV light transmitting region, wherein a region corresponding to the gate electrode portion and the common electrode portion is formed by the UV photo interrupt region, and a region corresponding to the pixel electrode portion is formed by the UV light transmitting region, and an area corresponding to the contact pad portion in the pixel electrode portion is formed by a complete photo interrupt region, and one or more regions corresponding to the contact pad portion exist in the region corresponding to a basic unit pixel electrode portion.

100. A mask used for halftone exposure, using the second photolithographic process as recited in one of claims 1, 2, 3, 4, 5 or 6 is characterized in that a piece of mask is comprised of three regions: a complete UV photo interrupt region, an UV light semi-transmitting region and an UV light transmitting region, wherein a region corresponding to the thin film semiconductor of the thin film transistor component is formed by the complete UV photo interrupt region, and a region corresponding to the contact hole portion in the pixel electrode is formed by the UV light transmitting region, and one or more regions corresponding to the contact hole portion exist in the region corresponding to a basic unit pixel electrode.

101. A mask used for halftone exposure, using the second photolithographic process as recited in one of claims 1, 2, 3, 4, 5 or 6 is characterized in that a piece of mask is comprised of three regions: a complete UV photo interrupt region, an UV light semi-transmitting region and an UV light transmitting region, wherein a region corresponding to the thin film semiconductor portion of the thin film transistor component is formed by the complete UV photo interrupt region, and a region corresponding to the contact hole portion in the pixel electrode portion and an area corresponding to the contact hole portion of the common electrode portion are formed by the UV light transmitting region, and one or more regions corresponding to the contact hole portion exist in the region corresponding to a basic unit pixel electrode portion and a basic unit common electrode portion.

102. An active matrix substrate, being manufactured by two masks used for a halftone exposure as recited in claim 99.

103. An active matrix substrate, being manufactured by two masks used for a halftone exposure as recited in claim 101.

104. An active matrix display apparatus, being manufactured by two masks used for a halftone exposure as recited in claim 99.

105. An active matrix display apparatus, being manufactured by two masks used for a halftone exposure as recited in claim 101.

106. The method of manufacturing an active matrix substrate as selected from one of claims 1 to 16, wherein the third photolithographic process for forming a source electrode, a drain electrode, a holdup capacitor (Cst) forming electrode holdup capacitor (Cst), an alignment control electrode and a comb common electrode uses the following method:

after the second photolithographic process is completed, a sputtering process is used for forming a source electrode, a drain electrode, a holdup capacitor (Cst) forming electrode holdup capacitor (Cst), an alignment control electrode and a comb common electrode by a single-layer metal of aluminum alloy, and an inert gas (or a rare gas such as argon and krypton) is used for the spluttering process at an early stage of film formation, and the inert gas is mixed with 1~20% of nitrified gas (such as nitrogen, ammonia, hydrazine and dydrazone), and an n+a-silicon layer of the source electrode portion and the drain electrode portion of the thin film transistor component in contact with an interface of the lower layer form a nitrogen-containing aluminum alloy film, such that after the contact resistance falls below 100 KΩ and preferably below 10 KΩ, the mixing of nitrified gas is stopped, and only the inert gas (or rare gas such as argon and krypton) is used for forming an aluminum alloy layer, and then a positive photoresist is coated, and a general mask is used for a general exposure to develop an image, and after the aluminum alloy is etched, the positive photoresist is peeled off.

107. The method of manufacturing an active matrix substrate as selected from one of claims 1 to 16, wherein the third photolithographic process for forming a source electrode, a drain electrode, a holdup capacitor (Cst) forming electrode holdup capacitor (Cst), an alignment control electrode and a comb common electrode uses the following method:

after the second photolithographic process is completed, a nitrified gas (such as nitrogen, ammonia, hydrazine and dydrazone) is mixed directly with hydrogen or an inert gas (or a rare gas such as helium, neon, argon, krypton and xenon) to form a mixed gas for performing a component separation (island) for an n+a-silicon surface of the thin film semiconductor layer and a plasma nitriding to a sidewall of the thin film semiconductor layer, and then a spluttering process is used for forming a single-layer aluminum alloy film, such that when nitrogen is doped onto a surface of the thin film semiconductor by plasma, the contact resistance of an n+a-silicon layer of the source electrode portion and the drain electrode portion of the thin film transistor component falls below 100 K$\Omega$ and preferably below 10 K$\Omega$;

after a sputtering process is used to form a single-layer aluminum alloy film, a positive photoresist is coated, and a general mask is used for a general exposure to develop an image, and after the aluminum alloy is etched, the positive photoresist is peeled off.

108. The method of manufacturing an active matrix substrate as selected from one of claims 1 to 16, wherein the third photolithographic process used for forming a source electrode, a drain electrode, a holdup capacitor (Cst) forming electrode holdup capacitor (Cst), an alignment control electrode and a comb common electrode uses the following method:

after the second photolithographic process is completed, an ion doping method adopting accelerated nitrogen ions to perform a surface nitrification for an n+a-silicon surface of a component separation (island) thin film semiconductor layer and a sidewall of the thin film semiconductor layer, and after a spluttering process is used to form a single-layer aluminum alloy film, nitrogen is doped on the surface of the thin film semiconductor layer, such that the contact resistance of an n+a-silicon layer of the source electrode portion and the drain electrode portion of the thin film transistor component falls below 100 K$\Omega$, and preferably below 10 K$\Omega$, and after a sputtering process is used to form a single-layer aluminum alloy film, a positive photoresist is coated, and a general mask is used for a general exposure to develop an image, and after the aluminum alloy is etched, the positive photoresist is peeled off.

109. An active matrix LCD apparatus, being manufactured by the manufacturing method as recited in claim 106.

110. An active matrix LCD apparatus, being manufactured by the manufacturing method as recited in claim 107.

111. An active matrix LCD apparatus, being manufactured by the manufacturing method as recited in claim 108.

\* \* \* \* \*